US011462695B2

(12) United States Patent
Heo et al.

(10) Patent No.: US 11,462,695 B2
(45) Date of Patent: *Oct. 4, 2022

(54) ORGANIC LIGHT EMITTING ELEMENT

(71) Applicant: LG CHEM, LTD., Seoul (KR)

(72) Inventors: Dong Uk Heo, Daejeon (KR); Dong Hoon Lee, Daejeon (KR); Jungoh Huh, Daejeon (KR); Boonjae Jang, Daejeon (KR); Yongbum Cha, Daejeon (KR); Miyeon Han, Daejeon (KR); Junghoon Yang, Daejeon (KR); Heekyung Yun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 432 days.

This patent is subject to a terminal disclaimer.

(21) Appl. No.: 16/495,087

(22) PCT Filed: Jun. 29, 2018

(86) PCT No.: PCT/KR2018/007423

§ 371 (c)(1),
(2) Date: Sep. 17, 2019

(87) PCT Pub. No.: WO2019/004787

PCT Pub. Date: Jan. 3, 2019

(65) Prior Publication Data

US 2020/0035930 A1 Jan. 30, 2020

(30) Foreign Application Priority Data

Jun. 30, 2017 (KR) ........................ 10-2017-0083566

(51) Int. Cl.
*H01L 51/00* (2006.01)
*H01L 51/50* (2006.01)

(52) U.S. Cl.
CPC ...... *H01L 51/0073* (2013.01); *H01L 51/0052* (2013.01); *H01L 51/0067* (2013.01); *H01L 51/0069* (2013.01); *H01L 51/5004* (2013.01); *H01L 51/5012* (2013.01); *H01L 51/5072* (2013.01); *H01L 51/5092* (2013.01)

(58) Field of Classification Search
CPC ............. H01L 51/0073; H01L 51/0052; H01L 51/0067; H01L 51/0069; H01L 51/5004; H01L 51/5012; H01L 51/5072; H01L 51/5092; H01L 51/508; H01L 2251/552; H01L 51/0054; H01L 51/0072; H01L 51/0074; H01L 51/5016; C09K 11/06; C09K 2211/1088
USPC .......................................................... 428/690
See application file for complete search history.

(56) References Cited

U.S. PATENT DOCUMENTS 9,722,187 B2 * 8/2017 Jeong .................. C07D 405/04
11,094,889 B2 * 8/2021 Heo ........................ H01L 51/50
11,152,576 B2 * 10/2021 Heo .................... H01L 51/0074
2005/0280008 A1 * 12/2005 Ricks .................. H01L 51/5036 257/79
2011/0084259 A1 * 4/2011 Lee ..................... H01L 51/5048 438/45
2015/0318501 A1 * 11/2015 Watanabe ............. C07F 7/0816 556/404
2016/0072077 A1 * 3/2016 Ito ....................... H01L 51/0058 252/500

(Continued)

FOREIGN PATENT DOCUMENTS

CN 102786508 11/2012
CN 106083825 11/2016

(Continued)

OTHER PUBLICATIONS

International Search Report for PCT/KR2018/007423, dated Sep. 21, 2018. (Year: 2018).*

(Continued)

*Primary Examiner* — Douglas J McGinty
(74) *Attorney, Agent, or Firm* — Dentons US LLP

(57) ABSTRACT

Provided is an organic light emitting device including an anode; a cathode; and a light emitting layer provided between the anode and cathode, wherein an electron control layer provided between the light emitting layer and the cathode and including a compound of Chemical Formula 1:

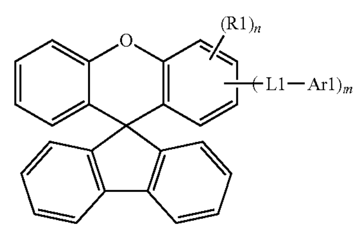

is included, and the light emitting layer includes a compound of Chemical Formula 3:

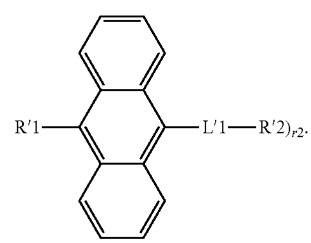

18 Claims, 11 Drawing Sheets

(56) References Cited

U.S. PATENT DOCUMENTS

| | | | | |
|---|---|---|---|---|
| 2016/0093814 | A1* | 3/2016 | Hwang | C09K 11/025 546/4 |
| 2016/0118599 | A1 | 4/2016 | Jeong et al. | |
| 2018/0287069 | A1 | 10/2018 | Cha et al. | |
| 2020/0058874 | A1* | 2/2020 | Kim | H01L 51/008 |
| 2021/0217967 | A1* | 7/2021 | Huh | H01L 51/0073 |
| 2021/0280792 | A1* | 9/2021 | Yoon | H01L 51/008 |
| 2021/0296589 | A1* | 9/2021 | Song | C07D 307/91 |
| 2021/0408386 | A1* | 12/2021 | Song | H01L 51/0073 |

FOREIGN PATENT DOCUMENTS

| | | |
|---|---|---|
| JP | 2003-096072 | 4/2003 |
| KR | 10-2015-0106501 | 9/2015 |
| KR | 10-1593368 | 2/2016 |
| KR | 10-2016-0047670 | 5/2016 |
| KR | 10-2016-0079514 | 7/2016 |
| KR | 10-2017-0067644 | 6/2017 |

OTHER PUBLICATIONS

CAS reg. No. 2106881-00-7, Aug. 2, 2017. (Year: 2017).*
CAS reg. No. 1026768-26-2, Jun. 9, 2008. (Year: 2008).*

* cited by examiner

【FIG. 1】
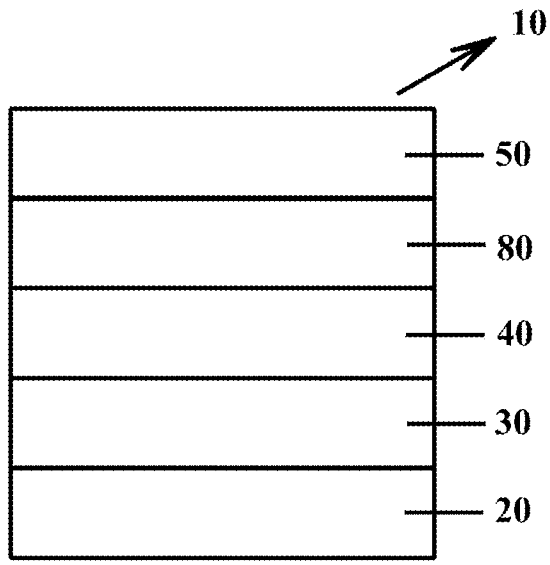
【FIG. 2】
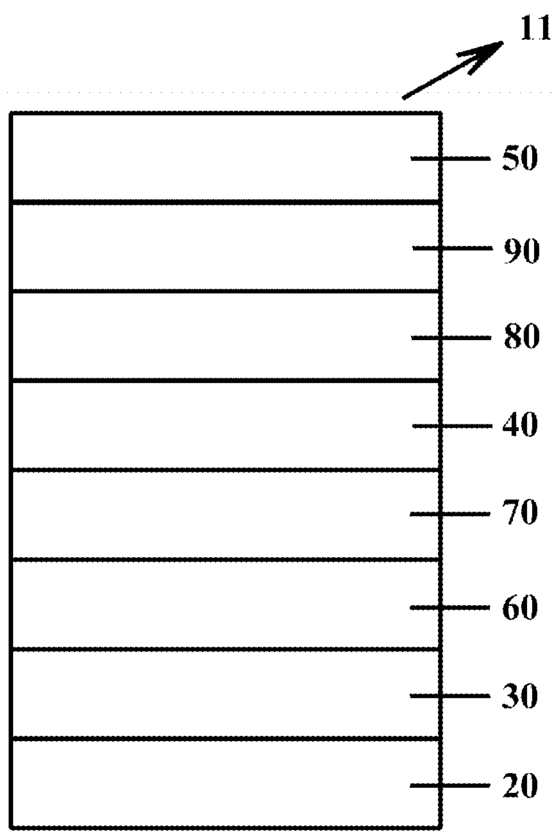

【FIG. 3】
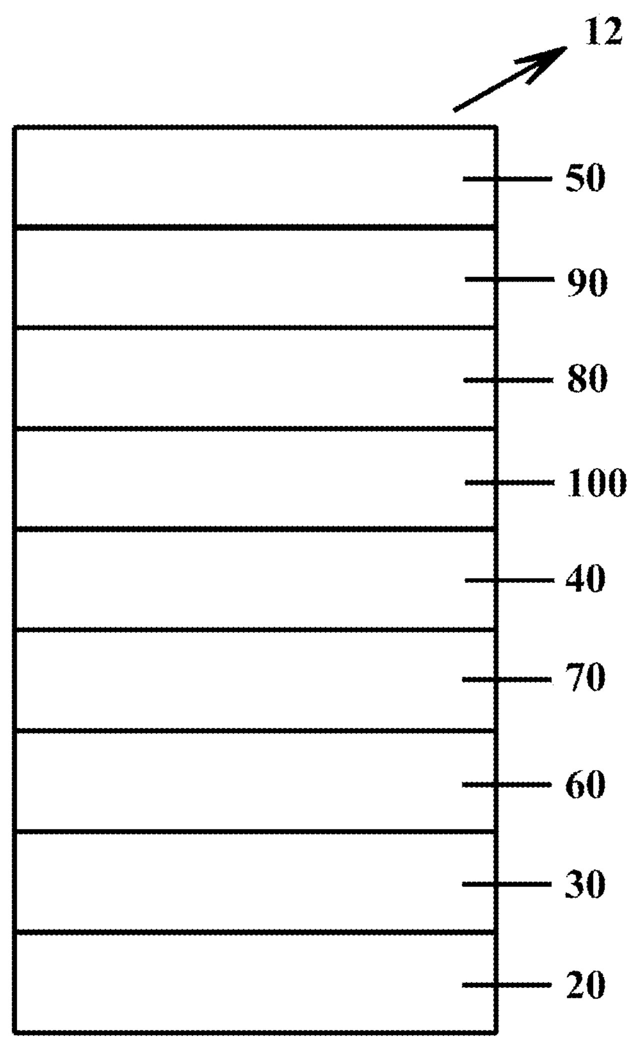

【FIG. 4】
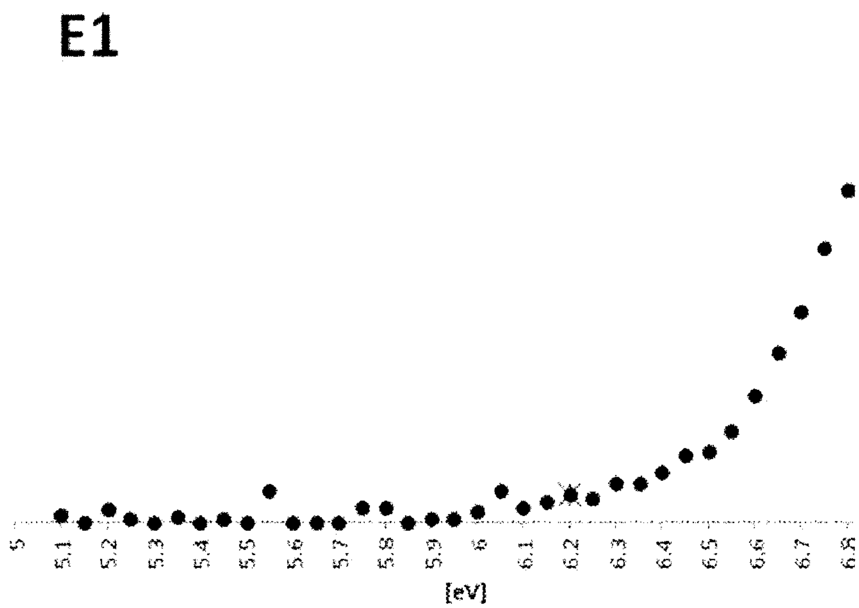
【FIG. 5】
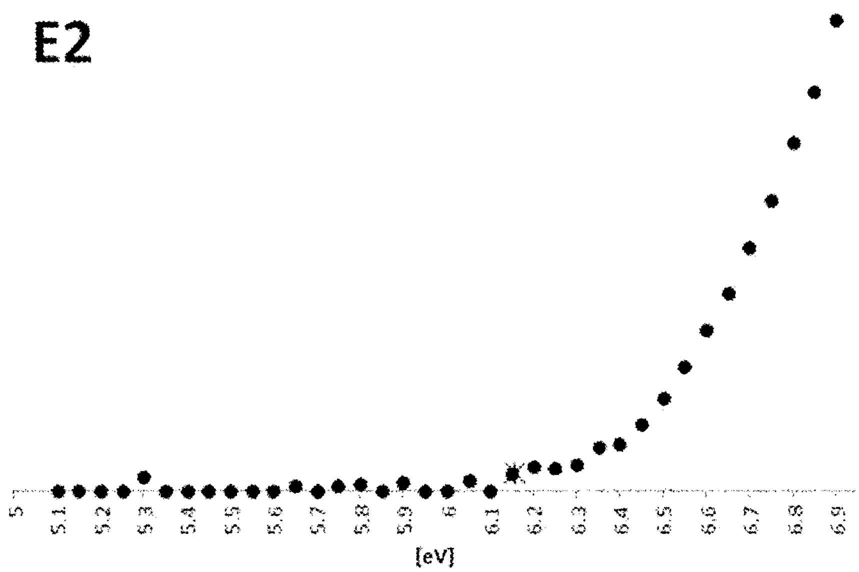

【FIG. 6】
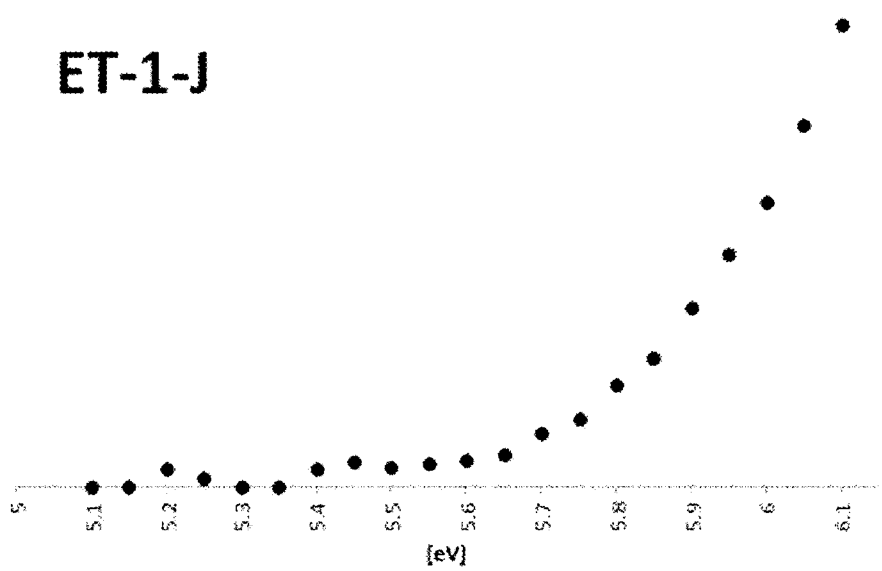
【FIG. 7】
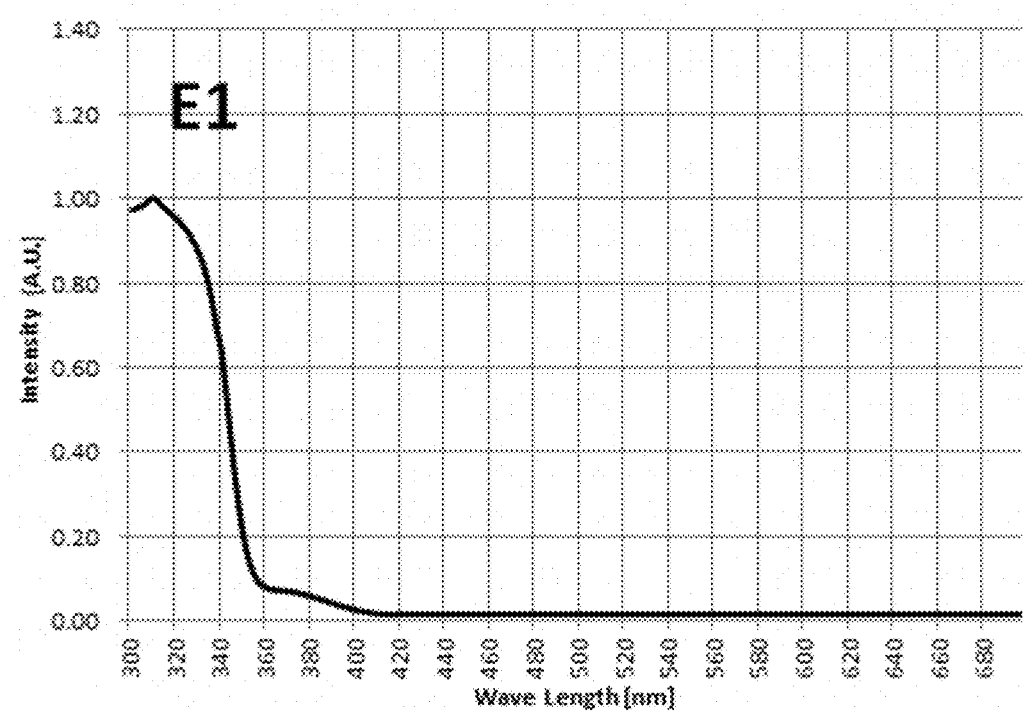

【FIG. 8】
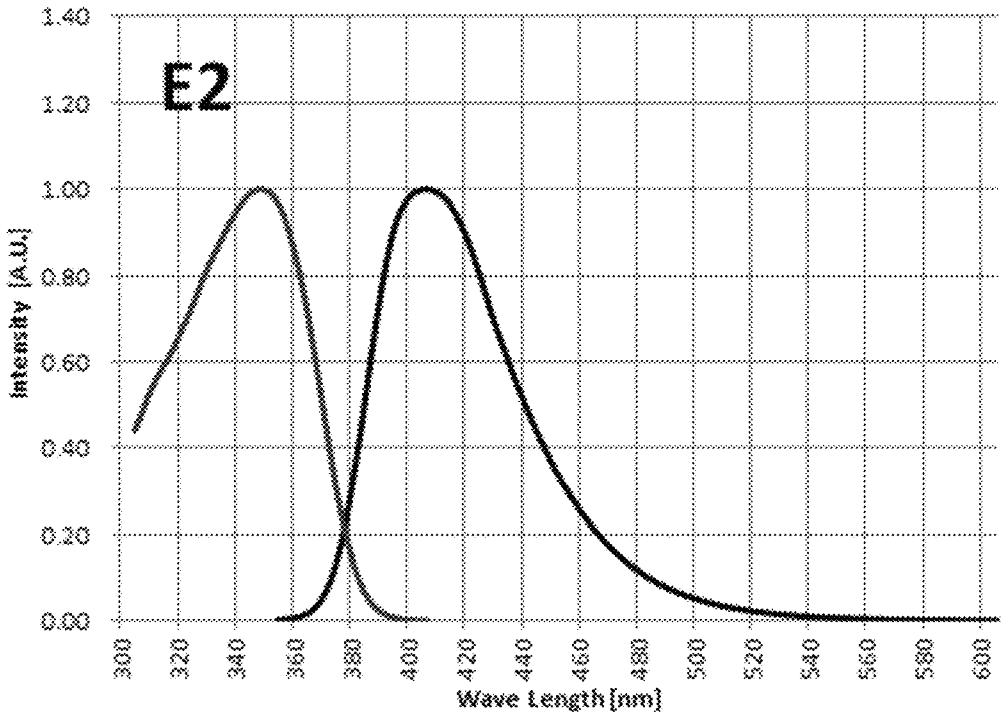
【FIG. 9】
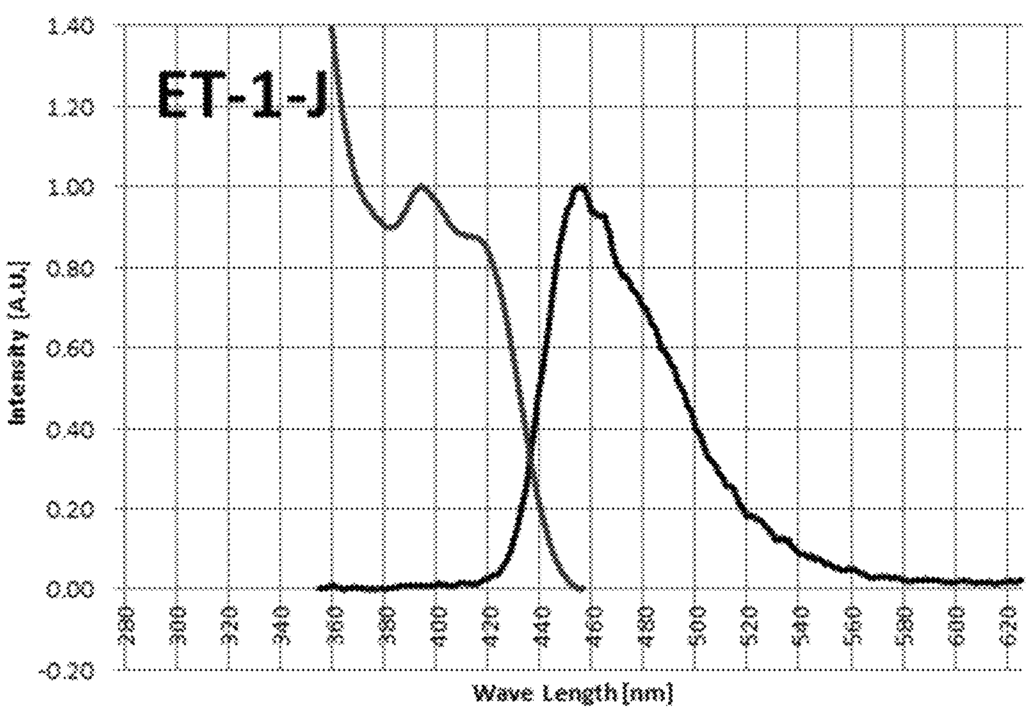

【FIG. 10】
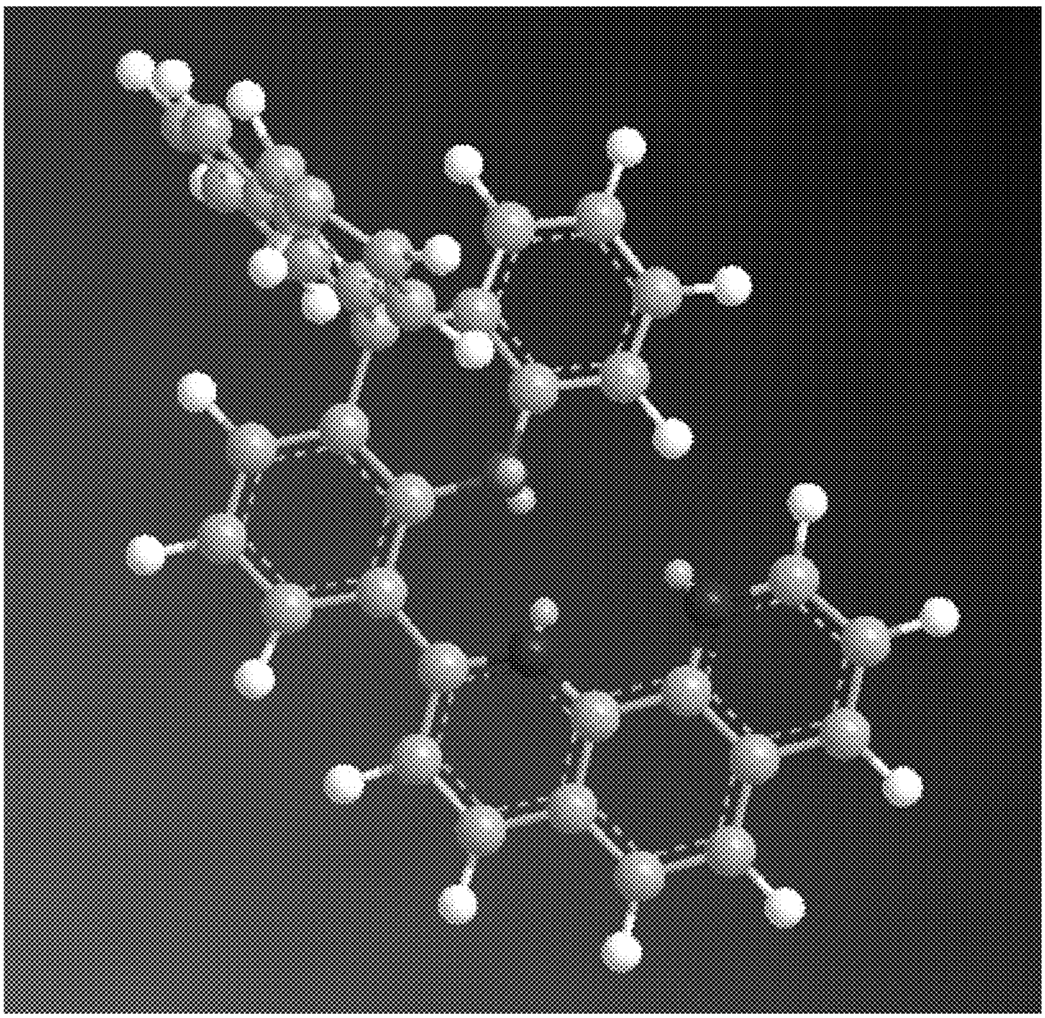

【FIG. 11】
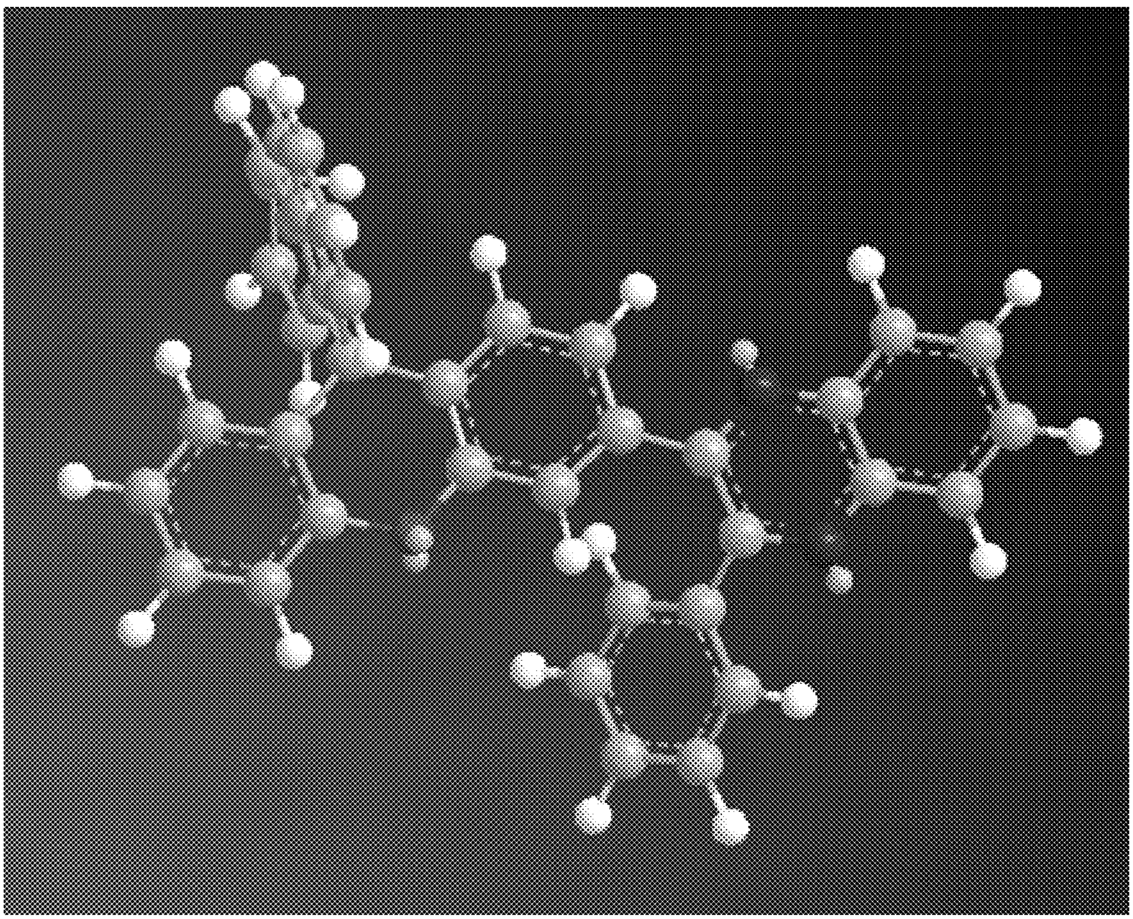

【FIG. 12】
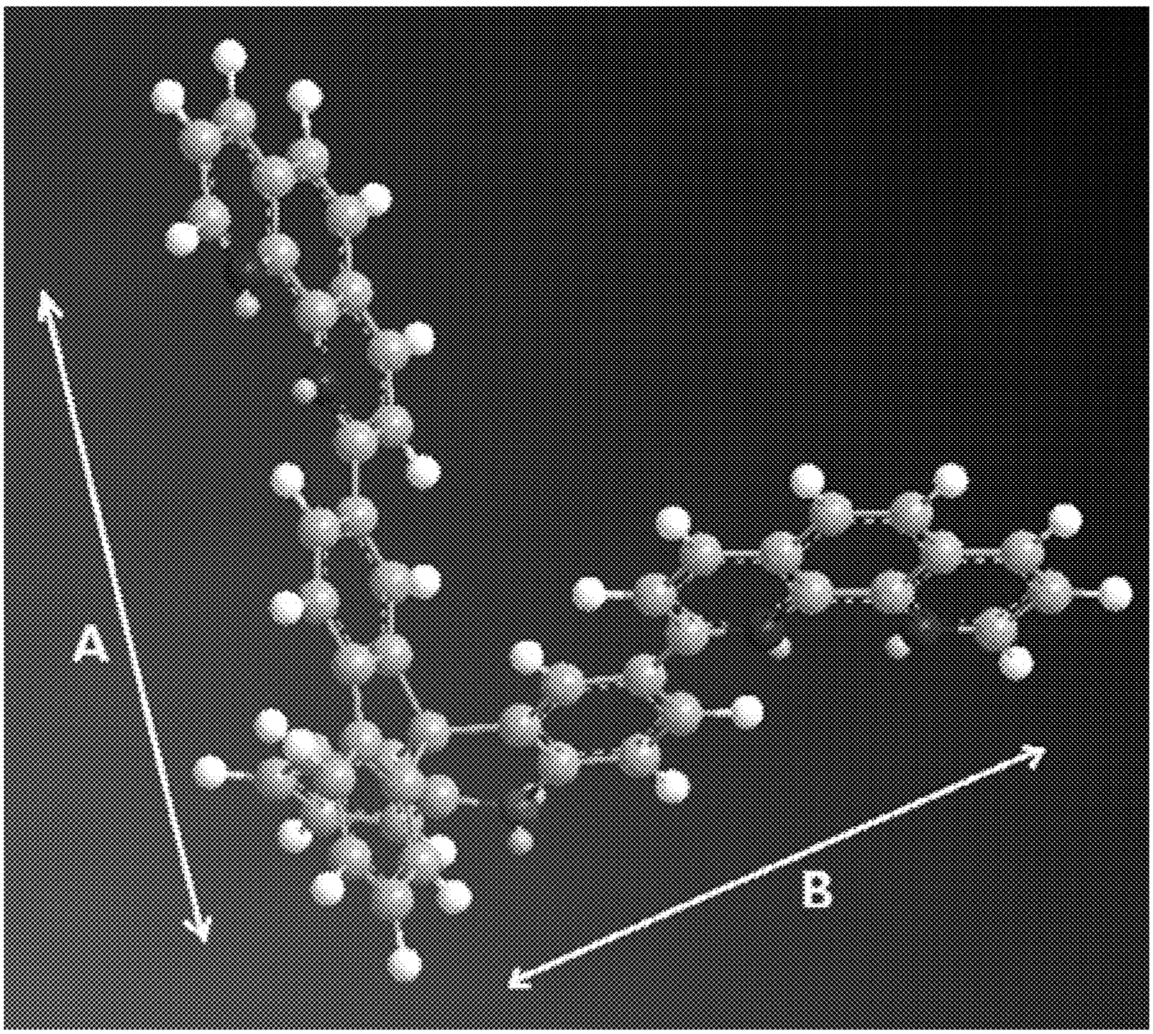

【FIG. 13】
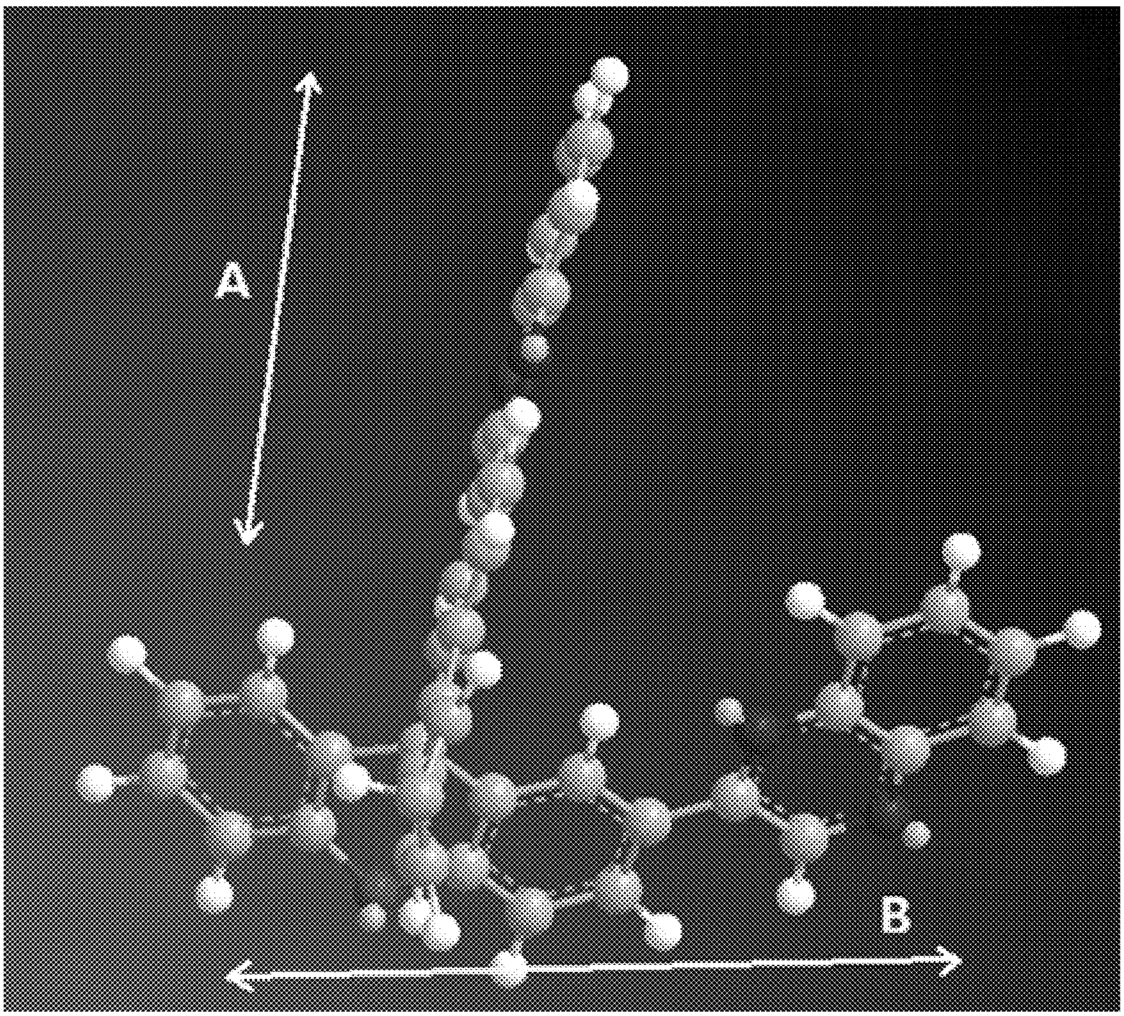

【FIG. 14】
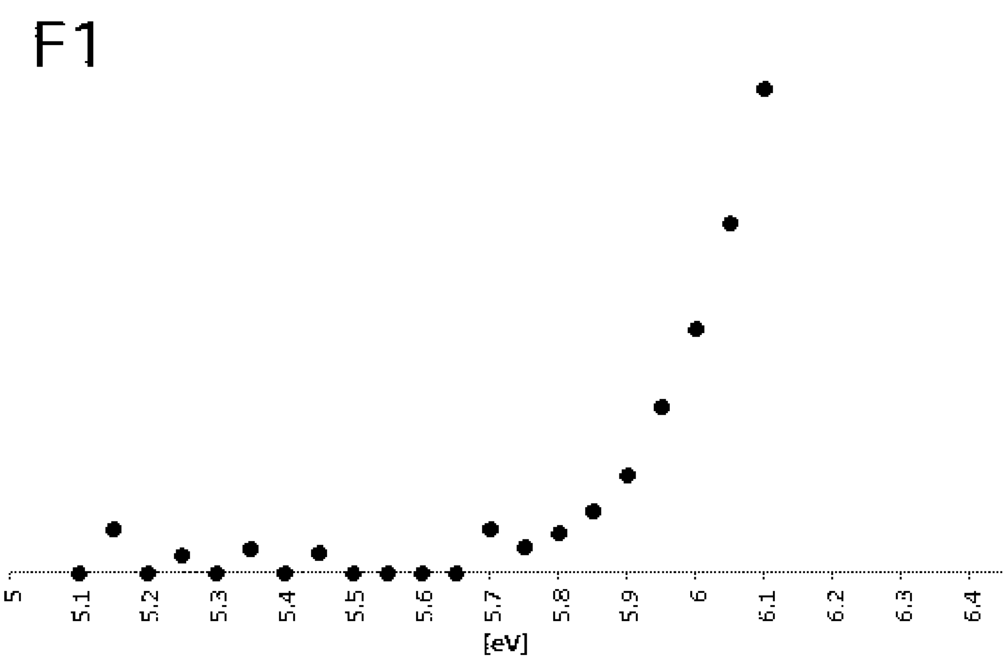
【FIG. 15】
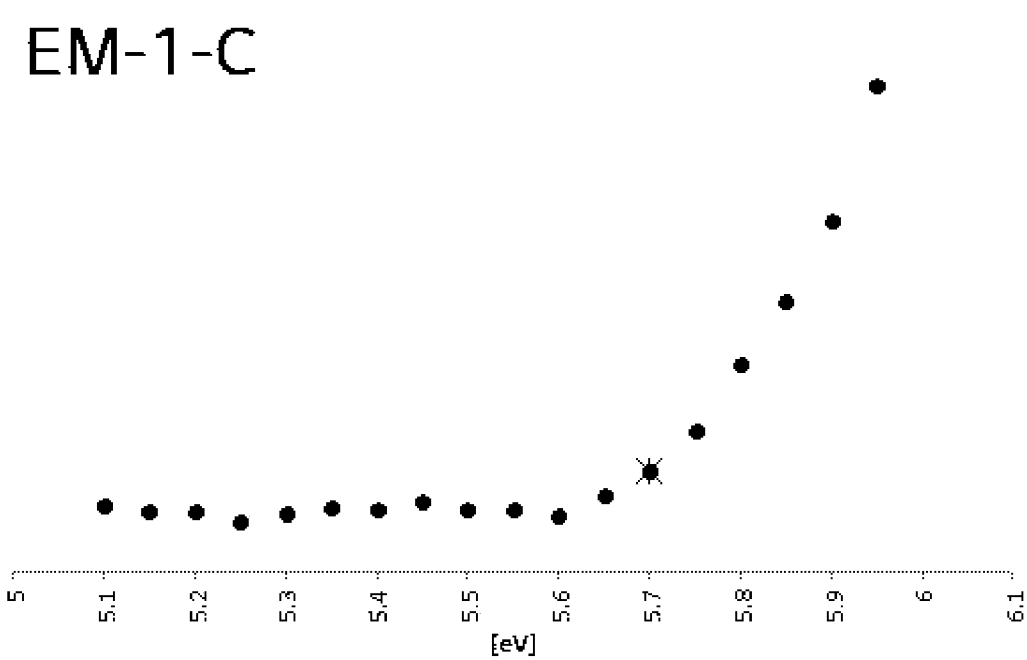

【FIG. 16】
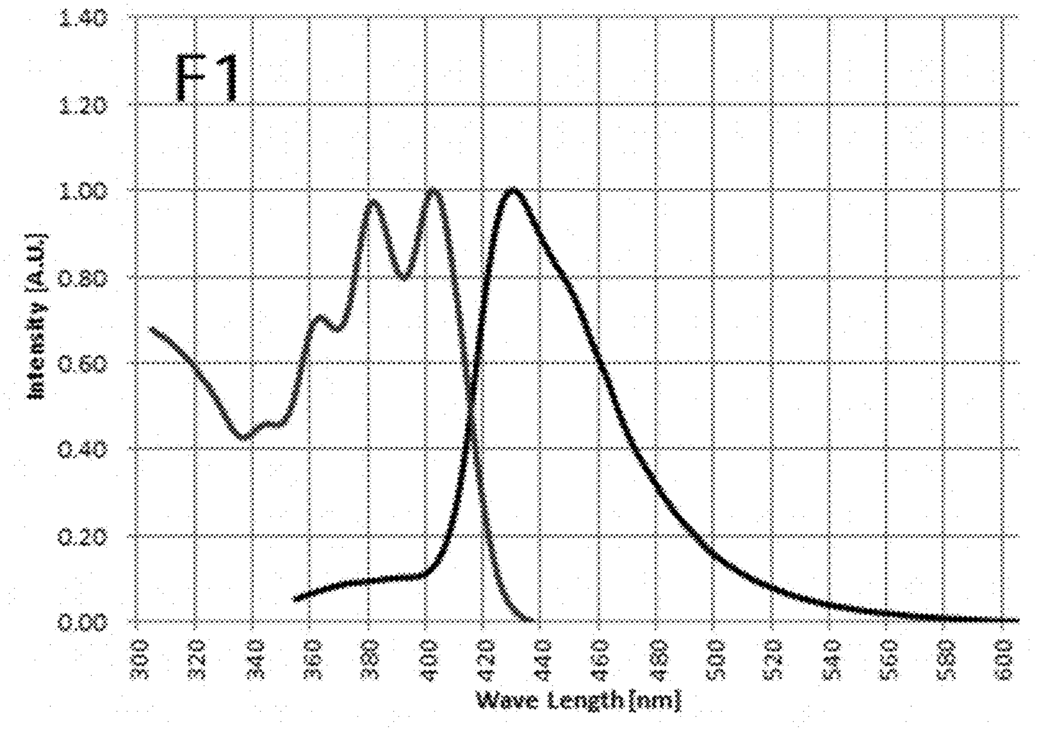
【FIG. 17】
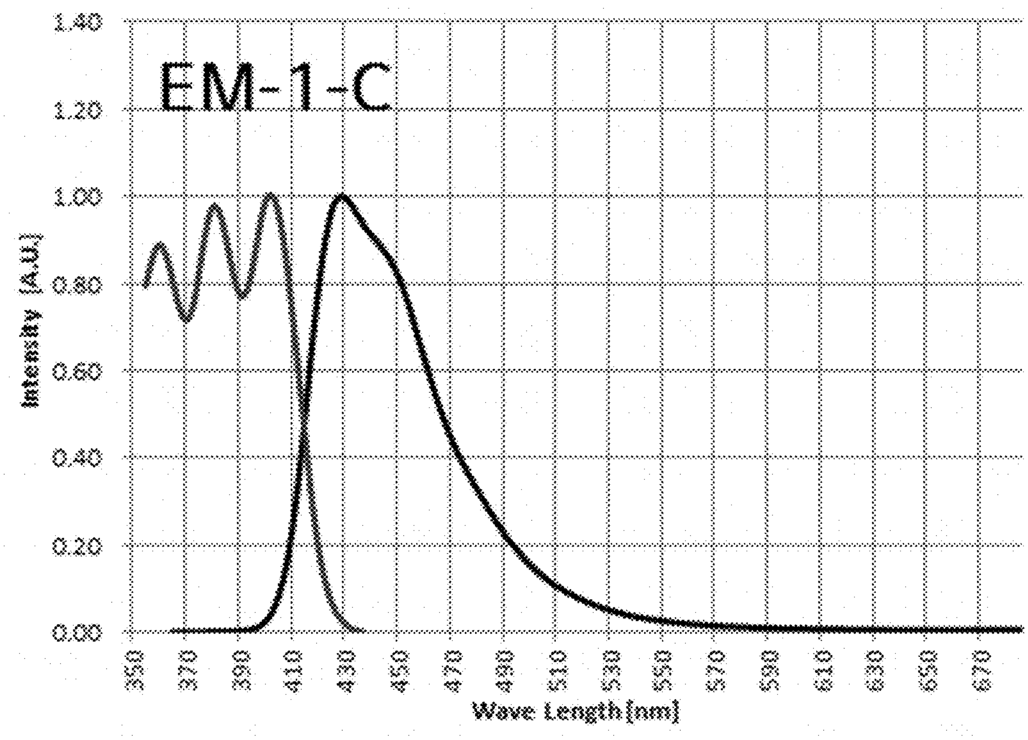

ORGANIC LIGHT EMITTING ELEMENT

CROSS-REFERENCE TO RELATED APPLICATIONS

The present specification is a National Stage Application of International Application No. PCT/KR2018/007423 filed on Jun. 29, 2018, which claims priority to and the benefits of Korean Patent Application No. 10-2017-0083566, filed with the Korean Intellectual Property Office on Jun. 30, 2017, the entire contents of which are incorporated herein by reference.

TECHNICAL FIELD

The present specification relates to an organic light emitting device.

BACKGROUND

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, can be foiled with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

Disclosure

Technical Problem

The present specification is directed to providing an organic light emitting device.

Technical Solution

One embodiment of the present specification provides an organic light emitting device including an anode; a cathode; and a light emitting layer provided between the anode and the cathode, wherein an organic material layer provided between the light emitting layer and the cathode and including a compound of the following Chemical Formula 1 is included, and the light emitting layer includes a compound of the following Chemical Formula 3.

[Chemical Formula 1]

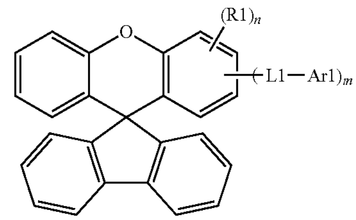

In Chemical Formula 1:

R1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

L1 is a direct bond, a substituted or unsubstituted arylene group, or a substituted or unsubstituted heteroarylene group;

Ar1 is hydrogen, deuterium a nitrile group a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group a substituted or unsubstituted silyl group, a substituted or unsubstituted boron group a substituted or unsubstituted amine group, a substituted or unsubstituted arylphosphine group, a substituted or unsubstituted phosphine oxide group, a substituted or unsubstituted aryl group, a substituted or unsubstituted monocyclic heterocyclic group, a substituted or unsubstituted tricyclic or higher heterocyclic group a substituted or unsubstituted bicyclic heterocyclic group including two or more nitrogens, a substituted or unsubstituted isoquinolyl group, a structure of the following Chemical Formula 2, or the following Chemical Formula 13, m is an integer of 1 to 4, n is an integer of 0 to 3, and $1 \leq n+m \leq 4$, and when m and n are each an integer of 2 or greater, structures in the two or more parentheses are the same as or different from each other:

[Chemical Formula 2]

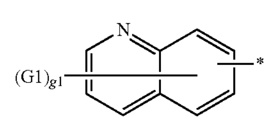

wherein in Chemical Formula 2:

G1 is hydrogen, deuterium, a nitrile group, a nitro group, a hydroxyl group, a carbonyl group; an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

g1 is an integer of 1 to 6, and when g1 is 2 or greater, the G1s are the same as or different from each other; and

* is a site bonding to L1 of Chemical Formula 1;

[Chemical Formula 13]

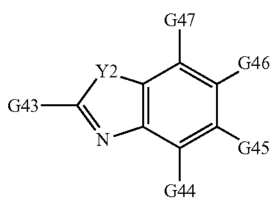

wherein:

Y2 is O, S, NQ4, or CQ5Q6;

any one of G43 to G47 is a site bonding to L1 of Chemical Formula 1; and the rest of G43 to G47 other than the site bonding to L1 of Chemical Formula 1, and Q4 to Q6 are the same as or different from each other, and each independently is hydrogen, deuterium a nitrile group a nitro group a hydroxyl group a carbonyl group, an ester group, an imide group an amide group, a substituted or unsubstituted alkyl group, a substituted or unsubstituted cycloalkyl group, a substituted or unsubstituted alkoxy group, a substituted or unsubstituted aryloxy group a substituted or unsubstituted alkylthioxy group, a substituted or unsubstituted arylthioxy group a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

[Chemical Formula 3]

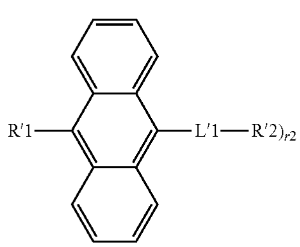

wherein in Chemical Formula 3:

at least one of R'1, R'2 and L'1 is a naphthyl group or a divalent naphthyl group;

R' 1 and R'2 are the same as or different from each other, and each independently is a substituted or unsubstituted aryl group;

L'1 is a substituted or unsubstituted arylene group; and r2 is an integer of 1 to 3, and when r2 is 2 or greater, the R'2s are the same as or different from each other.

Advantageous Effects

An organic light emitting device according to one embodiment of the present specification is capable of enhancing efficiency, obtaining a low driving voltage and/or enhancing lifetime properties.

DESCRIPTION OF DRAWINGS

FIG. 1 is a diagram illustrating an organic light emitting device (10) according to one embodiment of the present specification.

FIG. 2 is a diagram illustrating an organic light emitting device (11) according to another embodiment of the present specification.

FIG. 3 is a diagram illustrating an organic light emitting device (12) according to another embodiment of the present specification.

FIG. 4 is a diagram showing a HOMO energy level measured for Compound E1 of Preparation Example 1-1 according to one embodiment of the present specification using an optoelectronic spectrometer.

FIG. 5 is a diagram showing a HOMO energy level measured for Compound E2 of Preparation Example 1-2 according to one embodiment of the present specification using an optoelectronic spectrometer.

FIG. 6 is a diagram showing a HOMO energy level measured for Compound [ET-1-J] using an optoelectronic spectrometer.

FIG. 7 is a diagram showing a LUMO energy level calculated as a wavelength value measured for Compound E1 of Preparation Example 1-1 according to one embodiment of the present specification through photoluminescence (PL).

FIG. 8 is a diagram showing a LUMO energy level calculated as a wavelength value measured for Compound E2 of Preparation Example 1-2 according to one embodiment of the present specification through photoluminescence (PL).

FIG. 9 is a diagram showing a LUMO energy level calculated as a wavelength value measured for Compound [ET-1-J] through photoluminescence (PL).

FIG. 10 is a diagram showing a molecular 3D structure for Compound E9 of Preparation Example 1-9 according to one embodiment of the present specification using Chem 3D Pro.

FIG. 11 is a diagram showing a molecular 3D structure for Compound E18 of Preparation Example 1-18 according to one embodiment of the present specification using Chem 3D Pro.

FIG. 12 is a diagram showing a molecular 3D structure for Compound [ET-1-E] using Chem 3D Pro.

FIG. 13 is a diagram showing a molecular 3D structure for Compound [ET-1-I] using Chem 3D Pro.

FIG. 14 is a diagram showing a HOMO energy level measured for Compound F1 of Preparation Example 2-1 according to one embodiment of the present specification using an optoelectronic spectrometer.

FIG. 15 is a diagram showing a HOMO energy level measured for Compound [EM-1-C] using an optoelectronic spectrometer.

FIG. 16 is a diagram showing a LUMO energy level calculated as a wavelength value measured for Compound F1 of Preparation Example 2-1 according to one embodiment of the present specification through photoluminescence (PL).

FIG. 17 is a diagram showing a LUMO energy level calculated as a wavelength value measured for Compound [EM-1-C] through photoluminescence (PL).

REFERENCE NUMERAL

10, 11, 12: Organic Light Emitting Device
20: Substrate
30: Anode
40: Light Emitting Layer
50: Cathode
60: Hole Injection Layer
70: Hole Transfer Layer
80: Electron Transfer Layer
90: Electron Injection Layer
100: Electron Control Layer Mode for Disclosure Hereinafter, the present specification will be described in more detail.

One embodiment of the present specification provides an organic light emitting device including an anode; a cathode; and a light emitting layer provided between the anode and the cathode, wherein an organic material layer provided between the light emitting layer and the cathode and including a compound of Chemical Formula 1 is included, and the light emitting layer includes a compound of Chemical Formula 3.

According to one embodiment of the present specification, the compound of Chemical Formula 1 has a HOMO energy level of 6.0 eV or greater. According to one embodiment of the present specification, the compound of Chemical Formula 1 has a HOMO energy level of greater than or equal to 6.0 eV and less than or equal to 7.0 eV.

When having a deep HOMO energy level like the compound of Chemical Formula 1 according to one embodiment of the present specification, holes can be effectively blocked from the light emitting layer providing high light emission efficiency, and a device with long lifetime can be provided by enhancing device stability.

According to one embodiment of the present specification, the light emitting layer includes a host and a dopant, and a difference between the HOMO energy level of the host and the HOMO energy level of the compound of Chemical Formula 1 is 0.2 eV or greater. When a HOMO energy level difference between the host material of the light emitting layer and the compound of Chemical Formula 1 is 0.2 eV or greater as above, holes can be more effectively blocked from the light emitting layer, and an organic light emitting device with high light emission efficiency and long lifetime can be provided.

According to one embodiment of the present specification, the organic material layer including the compound of Chemical Formula 1 is provided adjoining the light emitting layer. This can effectively block holes by having a deeper HOMO energy level compared to the host compound of the light emitting layer.

As in one embodiment of the present specification, an organic light emitting device emitting blue fluorescence normally uses an anthracene derivative of Chemical Formula 3 as the host material, and in this case, a HOMO energy level of less than 6 eV is obtained. Accordingly, a role of hole blocking can be simultaneously performed with electron migration when providing the organic material layer including the compound of Chemical Formula 1 between the cathode and the light emitting layer.

Accordingly, the HOMO energy level ($H_E$) of the compound of Chemical Formula 1 and the HOMO energy level ($H_H$) of the compound of Chemical Formula 3 satisfy the following Equation 1.

$$H_E - H_H > 0.2 \text{ eV} \quad \text{Equation 1:}$$

An organic light emitting device according to one embodiment of the present specification can enhance driving voltage, efficiency and/or lifetime properties by controlling materials included in an electron control layer and a light emitting layer, and thereby adjusting an energy level between each layer.

According to one embodiment of the present specification, the compound of Chemical Formula 1 is capable of enhancing efficiency, obtaining a low driving voltage and enhancing lifetime properties in an organic light emitting device by being included in an electron control layer as a non-linear structure. In addition, in the structure of the compound of Chemical Formula 1, molecular dipole moment can be designed close to nonpolar by a substituent Ar1 having an electron deficient-structured substituent, and therefore, an amorphous layer can be formed when manufacturing an organic light emitting device including the compound of Chemical Formula 1 in an electron control layer. Accordingly, the organic light emitting device according to one embodiment of the present specification is capable of enhancing efficiency, obtaining a low driving voltage and enhancing lifetime properties.

Particularly, the compound of Chemical Formula 1 has substituents in just one benzene in the spiro fluorene xanthene (core structure), and, particularly when n=0 and m=1, has a three-dimensionally horizontal structure as well as having the above-described electronic properties, and therefore, electron mobility is strengthened when forming an organic material layer using such a material. On the other hand, when two or more benzene rings are substituted in the core structure of Chemical Formula 1, the horizontal structure as above cannot be obtained, and therefore, electron mobility is low compared to the compound of the present disclosure.

In the present specification, the “energy level” means a size of energy. Accordingly. the energy level is interpreted to mean an absolute value of the corresponding energy value. For example, the energy level being deep means an absolute value increasing in a negative direction from a vacuum level.

In the present specification, a highest occupied molecular orbital (HOMO) means a molecular orbital present in a region with highest energy in a region where electrons are capable of participating in bonding, a lowest unoccupied molecular orbital (LUMO) means a molecular orbital present in a region with lowest energy in an electron antibonding region, and a HOMO energy level means a distance from a vacuum level to the HOMO. In addition, a LUMO energy level means a distance from a vacuum level to the LUNO.

In the present specification, a bandgap means a difference between HOMO and LUMO energy levels, that is, a HOMO-LUMO gap.

According to one embodiment of the present specification, the compound of Chemical Formula 1 can have a HOMO energy level of 6.0 eV or greater.

According to one embodiment of the present specification, the compound of Chemical Formula 1 can have a triplet energy level of 2.5 eV or greater.

According to one embodiment of the present specification, the compound of Chemical Formula 1 can have a bandgap of 3.0 eV or greater.

When using the compound of Chemical Formula 1 satisfying the above-mentioned range in the electron control layer, high electron mobility is obtained, and when used in an organic light emitting device, properties of low driving voltage, high efficiency and long lifetime are obtained.

According to one embodiment of the present specification, the compound of Chemical Formula 3 can have a HOMO energy level of 5.8 eV or greater.

According to one embodiment of the present specification, the compound of Chemical Formula 3 has a bandgap of 2.9 eV or greater in the organic light emitting device.

When using the compound of Chemical Formula 3 satisfying the above-mentioned range in the light emitting layer, the LUMO energy level is formed to be 2.8 eV or higher leading to an effect of decreasing an energy barrier with the electron control layer, and when used in an organic light emitting device, properties of low driving voltage, high efficiency and long lifetime are obtained.

In addition, according to one embodiment of the present specification, the LUMO energy level ($L_E$) of the compound of Chemical Formula 1 and the LUMO energy level ($L_H$) of the compound of Chemical Formula 3 satisfy the following Equation 2.

$$-0.3\text{ eV}<L_E-L_H<0.3\text{ eV} \qquad \text{Equation 2:}$$

When satisfying Equation 2, properties of low driving voltage, high efficiency and long lifetime are obtained when used in an organic light emitting device due to an effect of decreasing an energy barrier between the electron control layer and the light emitting layer.

According to one embodiment of the present specification, the triplet energy ($T_E$) of the compound of Chemical Formula 1 and the triplet energy ($T_H$) of the compound of Chemical Formula 3 satisfy the following Equation 3.

$$T_E-T_H>0.5\text{ eV} \qquad \text{Equation 3:}$$

When satisfying Equation 3, enhancement in the light emission efficiency due to triplet-triplet fusion (TTF) can be expected in a fluorescent organic light emitting device.

In the present specification, the HOMO energy level can be measured using an optoelectronic spectrometer (manufactured by RIKEN KEIKI Co., Ltd.: AC3) under the atmosphere, and the LUMO energy level can be calculated as a wavelength value measured through photoluminescence (PL).

In the present specification, the triplet energy can be calculated with a TD-DFT calculation method using Gaussian 09.

In the present specification, a description of a certain part "including" certain constituents means capable of further including other constituents, and does not exclude other constituents unless particularly stated to the contrary.

In the present specification, a description of a certain member being placed "on" another member includes not only a case of the one member adjoining the another member but a case of still another member being present between the two members.

Examples of substituents in the present specification are described below, however, the substituents are not limited thereto.

The term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents can be the same as or different from each other.

The term "substituted or unsubstituted" in the present specification means being substituted with one, two or more substituents selected from the group consisting of deuterium, a halogen group, a nitrile group, a nitro group, an imide group, an amide group, a carbonyl group, an ester group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted aryl sulfoxy group, a substituted or unsubstituted alkenyl group, a substituted or unsubstituted silyl group, a substituted or unsubstituted boron group a substituted or unsubstituted amine group, a substituted or unsubstituted arylphosphine group, a substituted or unsubstituted phosphine oxide group, a substituted or unsubstituted aryl group, and a substituted or unsubstituted heterocyclic group, or being substituted with a substituent linking two or more substituents among the substituents illustrated above, or having no substituents. For example, "a substituent linking two or more substituents" can include a biphenyl group. In other words, a biphenyl group can be an aryl group, or interpreted as a substituent linking two phenyl groups.

In the present specification, examples of the halogen group can include fluorine, chlorine, bromine or iodine.

In the present specification, the number of carbon atoms of the imide group is not particularly limited, but is preferably from 1 to 30. Specifically, compounds having structures as below can be included, but the imide group is not limited thereto:

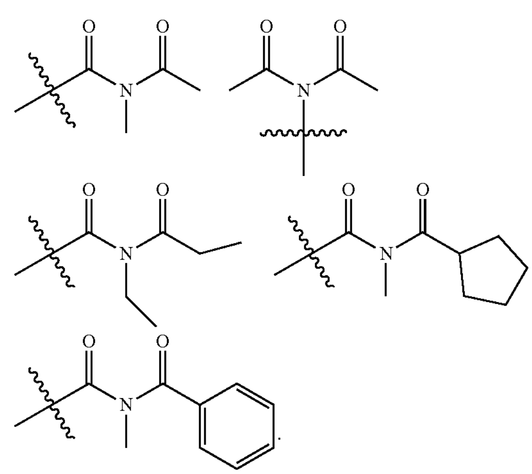

In the present specification, in the amide group, the nitrogen of the amide group can be substituted with a linear, branched or cyclic alkyl group having 1 to 30 carbon atoms or an aryl group having 6 to 30 carbon atoms. Specifically, compounds having the following structural formulae can be included, but the amide group is not limited thereto:

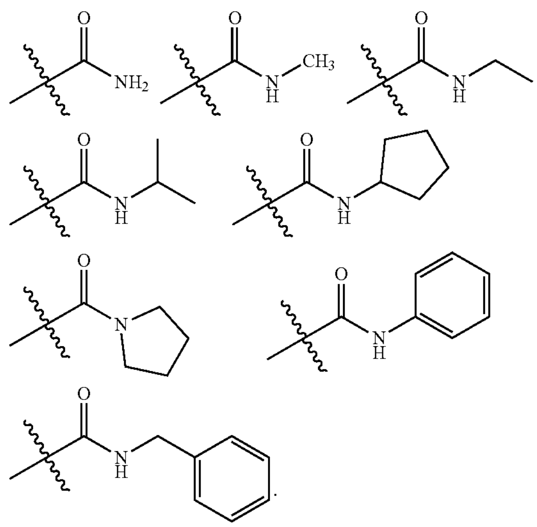

In the present specification, the number of carbon atoms of the carbonyl group is not particularly limited, but is preferably from 1 to 30. Specifically, compounds having structures as below can be included, but the carbonyl group is not limited thereto:

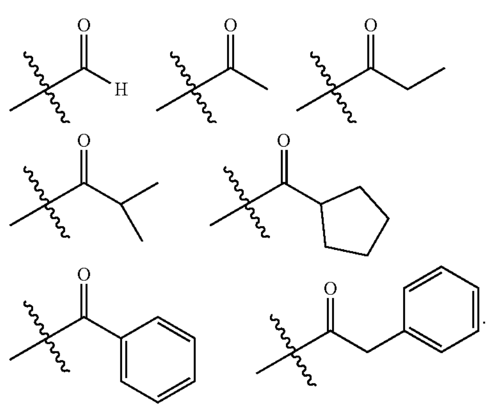

In the present specification, in the ester group, the oxygen of the ester group can be substituted with a linear, branched or cyclic alkyl group having 1 to 25 carbon atoms or an aryl group having 6 to 30 carbon atoms. Specifically, compounds having the following structural formulae can be included, however, the ester group is not limited thereto:

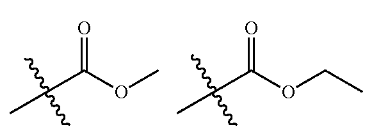

-continued

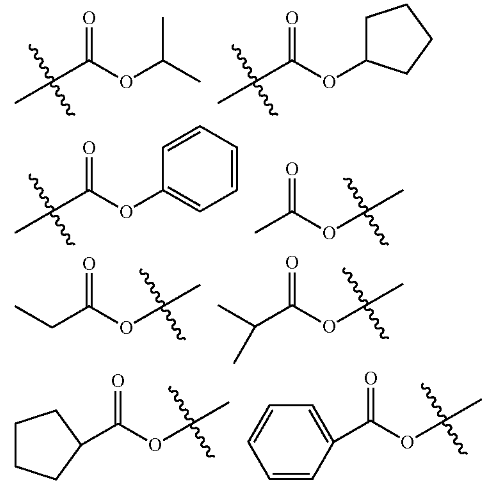

In the present specification, the alkyl group can be linear or branched, and although not particularly limited thereto, the number of carbon atoms is preferably from 1 to 30. Specifically, the number of carbon atoms is preferably from 1 to 20. More specifically, the number of carbon atoms is preferably from 1 to 10. Specific examples thereof can include a methyl group, an ethyl group, a propyl group, an n-propyl group, an isopropyl group, a butyl group, an n-butyl group, an isobutyl group, a tert-butyl group, a sec-butyl group, a 1-methylbutyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cycloheptylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethylpropyl group, a 1,1-dimethylpropyl group, an isohexyl group, a 2-methylpentyl group, a 4-methylhexyl group, a 5-methylhexyl group and the like, but are not limited thereto.

In the present specification, the cycloalkyl group is not particularly limited, but preferably has 3 to 30 carbon atoms and more preferably has 3 to 20 carbon atoms. Specific examples thereof can include a cyclopropyl group a cyclobutyl group, a cyclopentyl group, a 3-methylcyclopentyl group, a 2,3-dimethylcyclopentyl group, a cyclohexyl group, a 3-methylcyclohexyl group, a 4-methyl cyclohexyl group, a 2,3-dimethylcyclohexyl group, a 3,4,5-trim ethyl cyclohexyl group, a 4-tert-butylcyclohexyl group, a cycloheptyl group, a cyclooctyl group and the like, but are not limited thereto.

In the present specification, the alkoxy group can be linear, branched or cyclic. The number of carbon atoms of the alkoxy group is not particularly limited, but is preferably from 1 to 30. Specifically, the number of carbon atoms is preferably 1 to 20. More specifically, the number of carbon atoms is preferably 1 to 10. Specific examples thereof can include a methoxy group, an ethoxy group, an n-propoxy group, an isopropoxy group, an i-propyloxy group, an n-butoxy group, an isobutoxy group, a tert-butoxy group, a sec-butoxy group, an n-pentyloxy group, a neopentyloxy group, an isopentyloxy group, an n-hexyloxy group a 3,3-dimethylbutyloxy group, an 2-ethylbutyloxy group, an n-octyloxy group, an n-nonyloxy group, an n-decyloxy group a benzyloxy group a p-methylbenzyloxy group and the like, but are not limited thereto.

In the present specification, the amine group can be selected from the group consisting of —$NH_2$, an alkylamine group an N-alkylarylamine group, an arylamine group, an N-arylheteroarylamine group, an N-alkylheteroarylamine group and a heteroarylamine group, and although not particularly limited thereto, the number of carbon atoms is preferably from 1 to 30. Specific examples of the amine group can include a methylamine group a dimethylamine group, an ethylamine group a diethylamine group a phenylamine group a naphthylamine group, a biphenylamine group, an anthracenylamine group, a 9-methylanthracenylamine group, a diphenylamine group, an N-phenylnaphthylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenylphenanthrenylamine group, an N-biphenylphenanthrenylamine group an N-phenylfluorenylamine group, an N-phenylterphenylamine group, an N-phenanthrenylfluorenylamine group, an N-biphenylfluorenylamine group and the like, but are not limited thereto.

In the present specification, the N-alkylarylamine group means an amine group in which N of the amine group is substituted with an alkyl group and an aryl group.

In the present specification, the N-arylheteroarylamine group means an amine group in which N of the amine group is substituted with an aryl group and a heteroaryl group.

In the present specification, the N-alkylheteroarylamine group means an amine group in which N of the amine group is substituted with an alkyl group and a heteroaryl group.

In the present specification, the alkyl group in the alkylamine group, the N-arylalkylamine group, the alkylthioxy group, the alkylsulfoxy group and the N-alkylheteroarylamine group is the same as the examples of the alkyl group described above. Specifically, the alkylthioxy group can include a methylthioxy group an ethylthioxy group, a tert-butylthioxy group, a hexylthioxy group, an octylthioxy group and the like, and the alkylsulfoxy group can include mesyl, an ethylsulfoxy group, a propylsulfoxy group, a butylsulfoxy group and the like, however, the alkylthoixy group and the alkylsulfoxy group are not limited thereto.

In the present specification, the alkenyl group can be linear or branched, and although not particularly limited thereto, the number of carbon atoms is preferably from 2 to 30. Specific examples thereof can include a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group a stilbenyl group, a styrenyl group and the like, but are not limited thereto.

In the present specification, the silyl group can be of a chemical formula of —SiRaRbRc, and Ra, Rb and Rc can each be hydrogen, a substituted or unsubstituted alkyl group or a substituted or unsubstituted aryl group. Specific examples of the silyl group can include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the boron group can be —$BR_{100}R_{101}$, and $R_{100}$ and $R_{101}$ are the same as or different from each other, and can be each independently selected from the group consisting of hydrogen, deuterium, a halogen group, a nitrile group, a substituted or unsubstituted monocyclic or polycyclic cycloalkyl group having 3 to 30 carbon atoms, a substituted or unsubstituted linear or branched alkyl group having 1 to 30 carbon atoms, a substituted or unsubstituted monocyclic or polycyclic aryl group having 6 to 30 carbon atom, and a substituted or unsubstituted monocyclic or polycyclic heteroaryl group having 2 to 30 carbon atoms.

In the present specification, specific examples of the phosphine oxide group can include a diphenylphosphine oxide group, a dinaphthylphosphine oxide group and the like, but are not limited thereto.

In the present specification, the aryl group is not particularly limited, but preferably has 6 to 30 carbon atoms, and more preferably has 6 to 20 carbon atoms. The aryl group can be monocyclic or polycyclic.

When the aryl group is a monocyclic aryl group, the number of carbon atoms is not particularly limited, but is preferably from 6 to 30. Specific examples of the monocyclic aryl group can include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group can include a naphthyl group, an anthracenyl group, a phenanthryl group, a triphenyl group, a pyrenyl group, a phenalenyl group, a perylenyl group, a chrysenyl group, a fluorenyl group and the like, but are not limited thereto.

In the present specification, the fluorenyl group can be substituted, and adjacent groups can bond to each other to form a ring.

When the fluorenyl group is substituted,

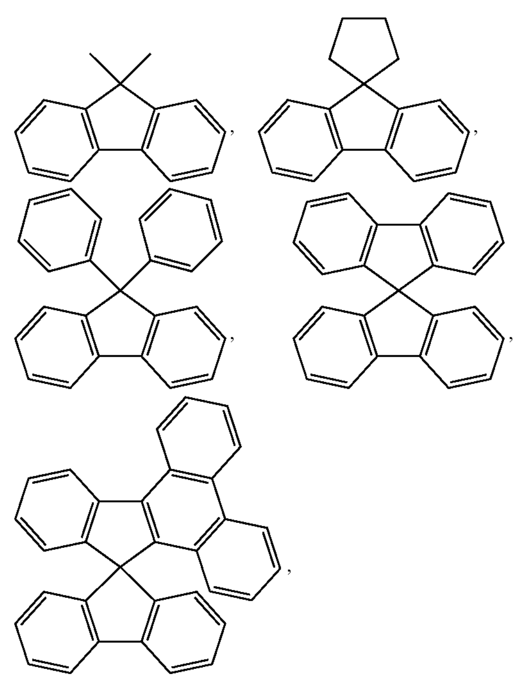

-continued

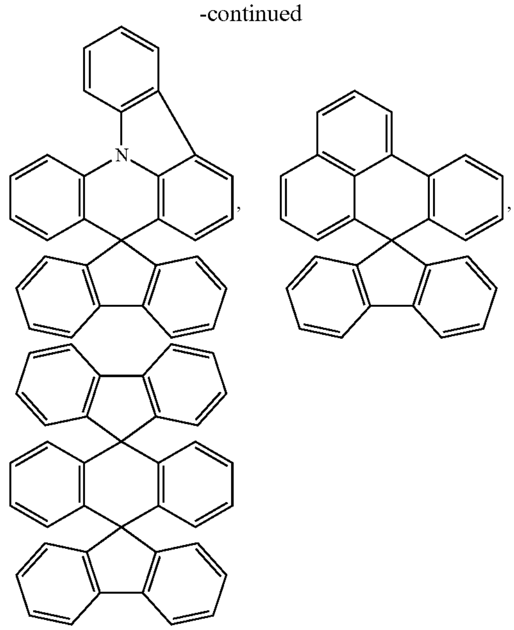

and the like can be included. However, the compound is not limited thereto.

In the present specification, an "adjacent" group can mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring can be interpreted as groups "adjacent" to each other.

In the present specification, the aryl group in the aryloxy group, the arylthioxy group, the arylsulfoxy group, the N-arylalkylamine group, the N-arylheteroarylamine group and the arylphosphine group is the same as the examples of the aryl group described above. Specific examples of the aryloxy group can include a phenoxy group, a p-tolyloxy group an m-tolyloxy group, a 3,5-dimethylphenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group a 9-anthryloxy group, a 1-phenanthryloxy group, a 3-phenanthryloxy group a 9-phenanthryloxy group and the like. Specific examples of the arylthioxy group can include a phenylthioxy group, a 2-methylphenylthioxy group, a 4-tert-butylphenylthioxy group and the like, and specific examples of the arylsulfoxy group can include a benzenesulfoxy group, a p-toluenesulfoxy group and the like. However, the aryloxy group, the arylthioxy group and the arylsulfoxy group are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group can be a monocyclic aryl group or a polycyclic aryl group. The arylamine group including two or more aryl groups can include monocyclic aryl groups, polycyclic aryl groups, or both monocyclic aryl groups and polycyclic aryl groups. For example, the aryl group in the arylamine group can be selected from among the examples of the aryl group described above.

In the present specification, the heteroaryl group is a group including one or more atoms that are not carbon, that is, heteroatoms, and specifically, the heteroatom can include one or more atoms selected from the group consisting of O, N, Se, S and the like. The number of carbon atoms is not particularly limited, but is preferably from 2 to 30 and more preferably from 2 to 20, and the heteroaryl group can be monocyclic or polycyclic. Examples of the heteroaryl group can include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group an isoxazolyl group, a thiadiazolyl group, a phenothiazinyl group, a dibenzofuranyl group and the like, but are not limited thereto.

In the present specification, examples of the heteroarylamine group include a substituted or unsubstituted monoheteroarylamine group, a substituted or unsubstituted diheteroarylamine group, or a substituted or unsubstituted triheteroarylamine group. The heteroarylamine group including two or more heteroaryl groups can include monocyclic heteroaryl groups, polycyclic heteroaryl groups, or both monocyclic heteroaryl groups and polycyclic heteroaryl groups. For example, the heteroaryl group in the heteroarylamine group can be selected from among the examples of the heteroaryl group described above.

In the present specification, examples of the heteroaryl group in the N-arylheteroarylamine group and the N-alkylheteroarylamine group are the same as the examples of the heteroaryl group described above.

In the present specification, the arylene group means an aryl group having two bonding sites, that is, a divalent group. Descriptions on the aryl group provided above can be applied thereto except for each being a divalent group.

In the present specification, the heteroarylene group means a heteroaryl group having two bonding sites, that is, a divalent group. Descriptions on the heteroaryl group provided above can be applied thereto except for each being a divalent group.

In the present specification, the heterocyclic group can be monocyclic or polycyclic, can be aromatic, aliphatic or a fused ring of aromatic and aliphatic, and can be selected from among the examples of the heteroaryl group. Examples of the heterocyclic group in addition thereto can include a hydroacridyl group (for example,

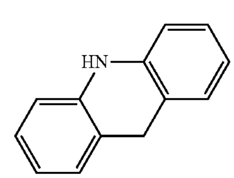

)

and a sulfonyl group-including heterocyclic structure such as

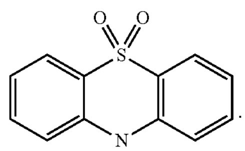

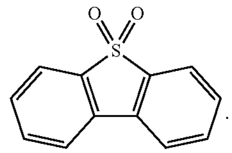

In the present specification, the "ring" in the substituted or unsubstituted ring formed by adjacent groups bonding to each other means a substituted or unsubstituted hydrocarbon ring, or a substituted or unsubstituted heteroring.

In the present specification, the hydrocarbon ring can be aromatic, aliphatic or a fused ring of aromatic and aliphatic, and can be selected from among the examples of the cycloalkyl group or the aryl group except for those that are not monovalent.

In the present specification, the aromatic ring can be monocyclic or polycyclic, and can be selected from among the examples of the aryl group except for those that are not monovalent.

In the present specification, the heteroring includes one or more atoms that are not carbon, that is, heteroatoms, and specifically, the heteroatom can include one or more atoms selected from the group consisting of O, N, Se, S and the like. The heteroring can be monocyclic or polycyclic, aromatic, aliphatic or a fused ring of aromatic and aliphatic, and can be selected from among the examples of the heteroaryl group or the heterocyclic group except for those that are not monovalent.

According to one embodiment of the present specification, in Chemical Formula 1, L1 is a direct bond, an arylene group, or a heteroarylene group.

According to one embodiment of the present specification, in Chemical Formula 1, L1 is a direct bond, a substituted or unsubstituted phenylene group, a substituted or unsubstituted biphenylylene group a substituted or unsubstituted naphthylene group, a substituted or unsubstituted terphenylylene group, a substituted or unsubstituted quaterphenylene group, a substituted or unsubstituted anthracenylene group, a substituted or unsubstituted phenanthrenylene group, a substituted or unsubstituted triphenylenylene group, a substituted or unsubstituted pyrenylene group, a substituted or unsubstituted fluorenylene group, a substituted or unsubstituted spiro cyclopentane fluorenylene group, a substituted or unsubstituted dibenzofuranylene group, a substituted or unsubstituted divalent dibenzothiophene group, a substituted or unsubstituted carbazolene group, a substituted or unsubstituted pyridylene group, a substituted or unsubstituted pyrimidylene group, a substituted or unsubstituted divalent furan group or a substituted or unsubstituted divalent thiophene group.

According to one embodiment of the present specification, in Chemical Formula 1, L1 is a direct bond, a phenylene group a biphenylylene group a naphthylene group a terphenylylene group, a pyrimidylene group a divalent furan group, or a divalent thiophene group.

According to one embodiment of the present specification, in Chemical Formula 1, L1 can be a direct bond, or of the following structural formulae.

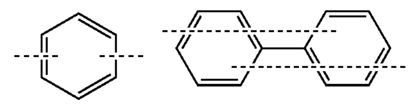

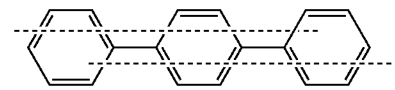

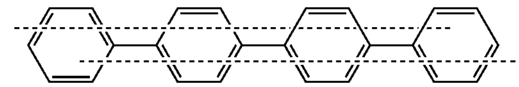

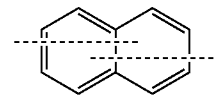

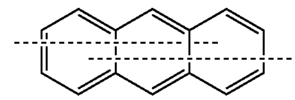

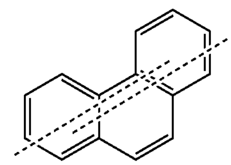

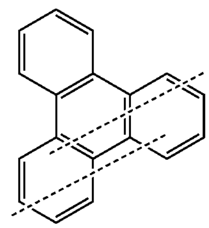

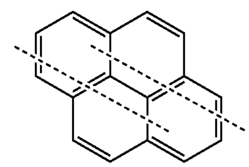

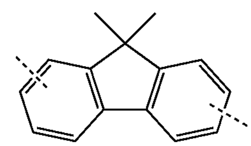

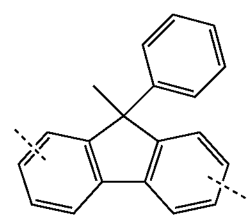

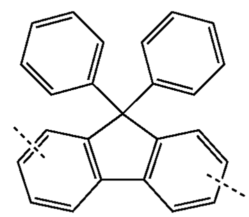

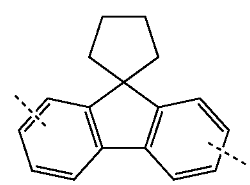

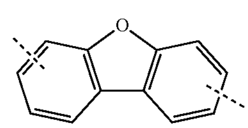

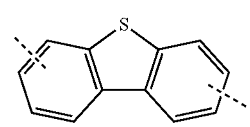

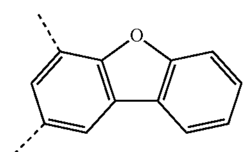

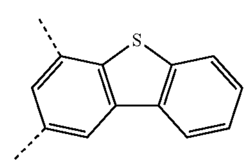

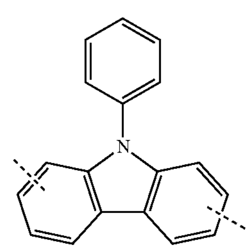

-continued

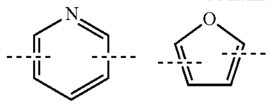

In the structures, - - - - - is a site bonding to a main chain.

According to one embodiment of the present specification, in Chemical Formula 1, Ar1 is a nitrile group, a substituted or unsubstituted alkyl group, a substituted or unsubstituted cycloalkyl group a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted amine group, a substituted or unsubstituted arylphosphine group, a substituted or unsubstituted phosphine oxide group, a substituted or unsubstituted aryl group a substituted or unsubstituted monocyclic heterocyclic group, a substituted or unsubstituted tricyclic or higher heterocyclic group, a substituted or unsubstituted dicyclic heterocyclic group including two or more nitrogens, a substituted or unsubstituted isoquinolyl group, or a structure of any one selected from among Chemical Formulae 2 and 6 to 15.

According to one embodiment of the present specification, in Chemical Formula 1, Ar1 is a nitrile group, a substituted or unsubstituted alkoxy group, a substituted or unsubstituted phosphine oxide group, a substituted or unsubstituted silyl group, a substituted or unsubstituted aryl group, a substituted or unsubstituted monocyclic heterocyclic group a substituted or unsubstituted tricyclic or higher heterocyclic group, a substituted or unsubstituted dicyclic heterocyclic group including two or more nitrogens, a substituted or unsubstituted isoquinolyl group, or a structure of any one selected from among Chemical Formula 2 and the following Chemical Formulae 6 to 15.

According to one embodiment of the present specification, in Chemical Formula 1, Ar1 is a nitrile group, a substituted or unsubstituted alkoxy group, a substituted or unsubstituted phosphine oxide group, a substituted or unsubstituted aryl group, or a structure of any one selected from among Chemical Formulae 2 and 6 to 15.

According to one embodiment of the present specification, in Chemical Formula 1, Ar1 is a nitrile group, an alkoxy group unsubstituted or substituted with a halogen group a phosphine oxide group unsubstituted or substituted with an aryl group an aryl group unsubstituted or substituted with a nitrile group, or a structure of any one selected from among Chemical Formula 2 and the following Chemical Formulae 6 to 15.

According to one embodiment of the present specification, in Chemical Formula 1, Ar1 is a nitrile group, a methoxy group substituted with a fluoro group, a phosphine oxide group unsubstituted or substituted with a phenyl group, a terphenyl group or a naphthyl group, a phenyl group unsubstituted or substituted with a nitrile group, a terphenyl group unsubstituted or substituted with a nitrile group, or a structure of any one selected from among Chemical Formula 2 and the following Chemical Formulae 6 to 15.

According to one embodiment of the present specification, in Chemical Formula 1, Ar1 can be of the following Chemical Formula 1a.

[Chemical Formula 1a]

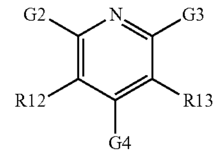

In Chemical Formula 1a, any one of G2 to G4, R12 and R13 is a site bonding to L1 of Chemical Formula 1, and the rest are the same as or different from each other, and each independently is hydrogen, deuterium a nitrile group a nitro group a hydroxyl group a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group a substituted or unsubstituted alkylthioxy group, a substituted or unsubstituted arylthioxy group a substituted or unsubstituted alkyl sulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group.

According to one embodiment of the present specification, in Chemical Formula 1, Ar1 is of any one selected from among Chemical Formula 2 and the following Chemical Formulae 6 to 15.

[Chemical Formula 6]

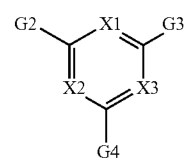

[Chemical Formula 7]

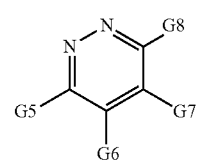

[Chemical Formula 8]

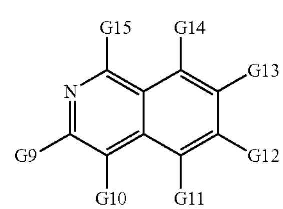

[Chemical Formula 9]

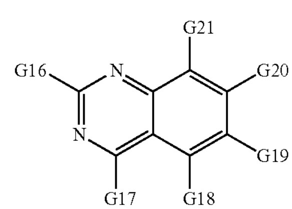

-continued

[Chemical Formula 10]

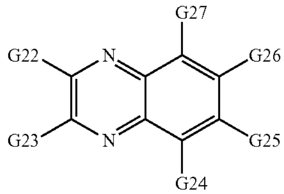

[Chemical Formula 11]

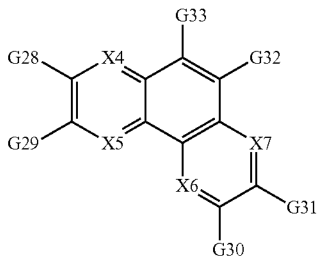

[Chemical Formula 12]

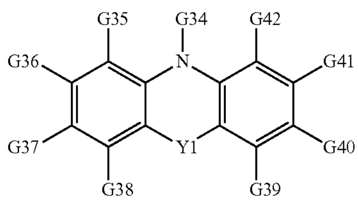

[Chemical Formula 13]

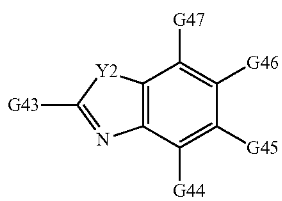

[Chemical Formula 14]

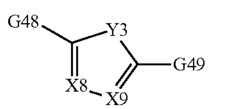

[Chemical Formula 15]

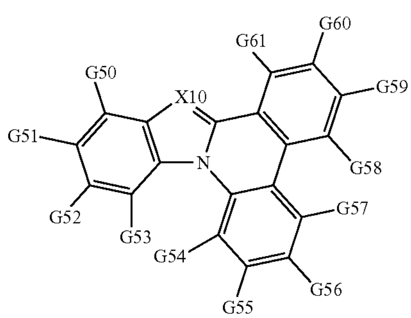

In Chemical Formulae 6 to 15,

X1 is N or CR11, X2 is N or CR12, X3 is N or CR13, X4 is N or CR14, X5 is N or CR15, X6 is N or CR16, X7 is N or CR17, X8 is N or CR18, X9 is N or CR19, and X10 is N or CR20, at least two of X1 to X3 are N, and at least one of X4 to X7 is N, Y1 is O, S, NQ1, or CQ2Q3, Y2 is O, S, NQ4, or CQ5Q6, and Y3 is O, S, or NQ7;

any one of G2 to G4 and R11 to R13, any one of G5 to G8, any one of G9 to G15, any one of G16 to G21, any one of G22 to G27, any one of G28 to G33 and R14 to R17, any one of G34 to G42, any one of G43 to G47, any one of G48, G49, R18 and R19, and any one of G50 to G61 are a site bonding to L1 of Chemical Formula 1; and the rest of G2 to G61 and R11 to R19 other than the site bonding to L1 of Chemical Formula 1, R20 and Q1 to Q7 are the same as or different from each other, and each independently is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted aryl sulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group.

According to another embodiment of the present specification, in Chemical Formula 2, G1 is hydrogen, or an aryl group.

According to another embodiment of the present specification, in Chemical Formula 2, G1 is hydrogen, or a phenyl group.

According to another embodiment of the present specification, Chemical Formula 2 is any one selected from among the following Chemical Formulae 2-1 to 2-4.

[Chemical Formula 2-1]

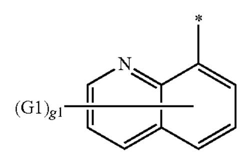

[Chemical Formula 2-2]

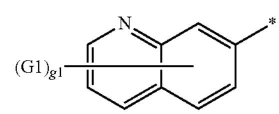

[Chemical Formula 2-3]

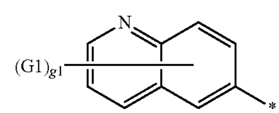

[Chemical Formula 2-4]

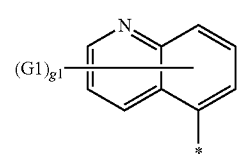

In Chemical Formulae 2-1 to 2-4, G1 and g1 have the same definitions as in Chemical Formula 2, and * is a site bonding to L1 of Chemical Formula 1.

According to another embodiment of the present specification, in Chemical Formula 6, any one of G2 to G4 and R11 to R13 is a site bonding to L1 of Chemical Formula 1, and the rest are the same as or different from each other, and each independently is hydrogen, a substituted or unsubstituted aryl group, or a substituted or unsubstituted heteroaryl group.

According to another embodiment of the present specification, in Chemical Formula 6, any one of G2 to G4 and R11 to R13 is a site bonding to L1 of Chemical Formula 1, and the rest are the same as or different from each other, and each independently is hydrogen, an aryl group unsubstituted or substituted with a nitrile group, an aryl group, a heterocyclic group substituted with an alkyl group, or a heterocyclic group unsubstituted or substituted with an aryl group, or a heteroaryl group.

According to another embodiment of the present specification, in Chemical Formula 6, any one of G2 to G4 and R11 to R13 is a site bonding to L1 of Chemical Formula 1, and the rest the same as or different from each other, and each independently is hydrogen, a phenyl group unsubstituted or substituted with an aryl group, a heterocyclic group substituted with an alkyl group, or a heterocyclic group unsubstituted or substituted with an aryl group, a biphenyl group unsubstituted or substituted with a nitrile group or a heterocyclic group, a terphenyl group, a naphthyl group unsubstituted or substituted with an aryl group or a heteroaryl group a fluorenyl group unsubstituted or substituted with an alkyl group a triphenylenyl group, a phenanthrenyl group, a phenalenyl group, a pyridyl group, a dibenzofuranyl group, or a dibenzothiophene group.

According to another embodiment of the present specification, in Chemical Formula 6, any one of G2 to G4 and R11 to R13 is a site bonding to L1 of Chemical Formula 1, and the rest are the same as or different from each other, and each independently is hydrogen, a phenyl group unsubstituted or substituted with a phenyl group, a terphenyl group, a carbazolyl group, a quinolyl group, a phenoxazinyl group, a phenothiazinyl group, a triphenylenyl group, a fluoranthenyl group, a pyridyl group, a dibenzothiophene group, a dibenzofuranyl group, a benzocarbazolyl group, a dihydrophenazinyl group substituted with a phenyl group, or a dihydroacridine group substituted with a methyl group, a nitrile group a biphenyl group unsubstituted or substituted with a carbazolyl group, a terphenyl group, a naphthyl group unsubstituted or substituted with a phenyl group, a pyridyl group or a dibenzofuranyl group, a fluorenyl group unsubstituted or substituted with a methyl group, a triphenylenyl group, a phenanthrenyl group, a phenalenyl group, a pyridyl group, a dibenzofuranyl group, or a dibenzothiophene group.

According to another embodiment of the present specification, Chemical Formula 6 can be Chemical Formula 6a or 6b

[Chemical Formula 6a]

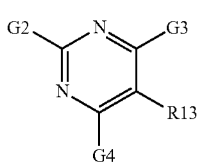

[Chemical Formula 6b]

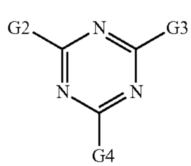

In Chemical Formulae 6a and 6b, G2 to G4 and R13 have the same definitions as in Chemical Formula 6.

According to one embodiment of the present specification, when at least two of X1 to X3 are N in Chemical Formula 6, a role of an electron control layer is smoothly performed with deep HOMO energy of 6.1 eV or greater, and since electron mobility is high, a device with low driving voltage, high efficiency and long lifetime can be obtained when used in an organic light emitting device. Specifically, when Ar1 is Chemical Formula 6a or Chemical Formula 6b, the above-mentioned effects are maximized.

Particularly, a triazine group where Ar1 is Chemical Formula 6b has deep HOMO energy of 6.1 eV or greater, and therefore, a role of an electron control layer is smoothly performed, and since electron mobility is high, properties of low driving voltage, high efficiency and long lifetime are obtained when used in an organic light emitting device.

According to another embodiment of the present specification, in Chemical Formula 7, any one of G5 to G8 is a site bonding to L1 of Chemical Formula 1, and the rest are the same as or different from each other, and each independently is hydrogen or a substituted or unsubstituted aryl group.

According to another embodiment of the present specification, in Chemical Formula 7, any one of G5 to G8 is a site bonding to L1 of Chemical Formula 1, and the rest are the same as or different from each other, and each independently is hydrogen or an aryl group.

According to another embodiment of the present specification, in Chemical Formula 7, any one of G5 to G8 is a site bonding to L1 of Chemical Formula 1, and the rest are the same as or different from each other, and each independently is hydrogen, a phenyl group, or a naphthyl group.

According to another embodiment of the present specification, in Chemical Formula 8, any one of G9 to G15 is a site bonding to L1 of Chemical Formula 1, and the rest are the same as or different from each other, and each independently is hydrogen or a substituted or unsubstituted aryl group.

According to another embodiment of the present specification, in Chemical Formula 8, any one of G9 to G15 is a site bonding to L1 of Chemical Formula 1, and the rest are the same as or different from each other, and each independently is hydrogen or an aryl group.

According to another embodiment of the present specification, in Chemical Formula 8, any one of G9 to G15 is a site bonding to L1 of Chemical Formula 1, and the rest are the same as or different from each other, and each independently is hydrogen or a phenyl group.

According to another embodiment of the present specification, in Chemical Formula 9, any one of G16 to G21 is a site bonding to L1 of Chemical Formula 1, and the rest are the same as or different from each other, and each independently is hydrogen or a substituted or unsubstituted aryl group.

According to another embodiment of the present specification, in Chemical Formula 9, any one of G16 to G21 is a site bonding to L1 of Chemical Formula 1, and the rest are the same as or different from each other, and each independently is hydrogen or an aryl group.

According to another embodiment of the present specification, in Chemical Formula 9, any one of G16 to G21 is a site bonding to L1 of Chemical Formula 1, and the rest are the same as or different from each other, and each independently is hydrogen, a phenyl group, a biphenyl group, or a naphthyl group.

According to another embodiment of the present specification, in Chemical Formula 10, any one of G22 to G27 is a site bonding to L1 of Chemical Formula 1, and the rest are the same as or different from each other, and each independently is hydrogen or an aryl group.

According to another embodiment of the present specification, in Chemical Formula 10, any one of G22 to G27 is a site bonding to L1 of Chemical Formula 1, and the rest are the same as or different from each other, and each independently is hydrogen or a phenyl group.

According to another embodiment of the present specification, in Chemical Formula 11, any one of G28 to G33 and R14 to R17 is a site bonding to L1 of Chemical Formula 1, and the rest are the same as or different from each other, and each independently is hydrogen. According to another embodiment of the present specification, Chemical Formula 11 is any one selected from among the following Chemical Formulae 11-1 to 11-8:

[Chemical Formula 11-1]

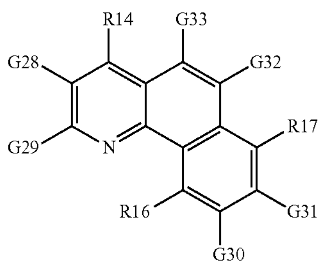

[Chemical Formula 11-2]

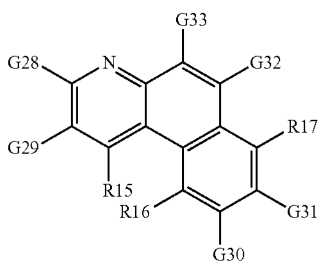

[Chemical Formula 11-3]

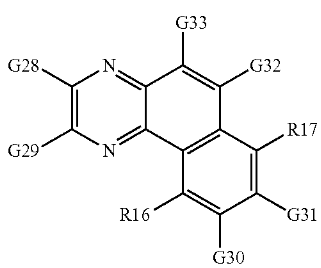

[Chemical Formula 11-4]

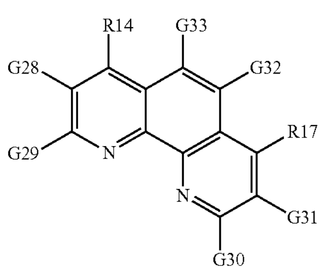

-continued

[Chemical Formula 11-5]

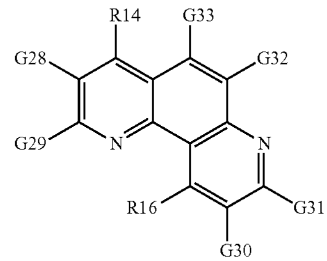

[Chemical Formula 11-6]

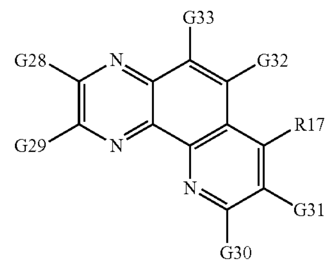

[Chemical Formula 11-7]

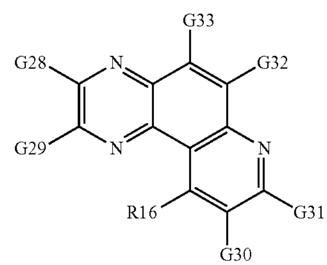

[Chemical Formula 11-8]

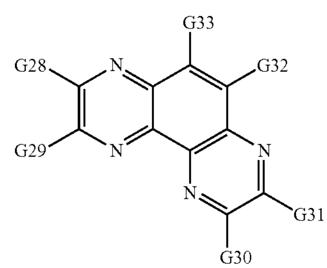

In Chemical Formulae 11-1 to 11-8, G28 to G33 and R14 to R17 have the same definitions as in Chemical Formula 11.

According to another embodiment of the present specification, in Chemical Formula 12, any one of G34 to G42 and R14 to R17 is a site bonding to L1 of Chemical Formula 1, and the rest and Q1 to Q3 are the same as or different from each other, and each independently is hydrogen.

According to another embodiment of the present specification, in Chemical Formula 13, any one of G43 to G47 is a site bonding to L1 of Chemical Formula 1, and the rest and Q4 to Q6 are the same as or different from each other, and each independently is hydrogen, a substituted or unsubstituted alkyl group, or a substituted or unsubstituted aryl group.

According to another embodiment of the present specification, in Chemical Formula 13, any one of G43 to G47 is a site bonding to L1 of Chemical Formula 1, and the rest and Q4 to Q6 are the same as or different from each other, and each independently is hydrogen, an alkyl group, or an aryl group.

According to another embodiment of the present specification, in Chemical Formula 13, any one of G43 to G47 is a site bonding to L1 of Chemical Formula 1, and the rest and Q4 to Q6 are the same as or different from each other, and each independently is hydrogen, a methyl group, or a phenyl group.

According to another embodiment of the present specification, when Y2 is NQ4 in Chemical Formula 13, G43 and Q4 bond to each other to foam a substituted or unsubstituted ring.

According to another embodiment of the present specification, when Y2 is NQ4 in Chemical Formula 13, G43 and Q4 bond to each other to foam a substituted or unsubstituted heteroring.

According to another embodiment of the present specification, when Y2 is NQ4 in Chemical Formula 13, G43 and Q4 bond to each other to foam a benzoisoquinol ring.

According to another embodiment of the present specification, Chemical Formula 13 is any one selected from among the following Chemical Formulae 13-1 to 13-4.

[Chemical Formula 13-1]

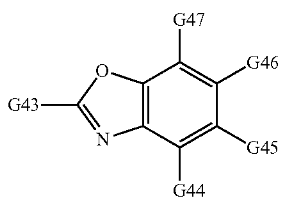

[Chemical Formula 13-2]

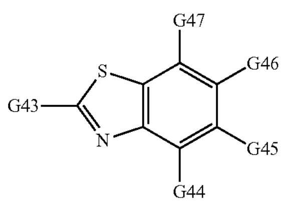

[Chemical Formula 13-3]

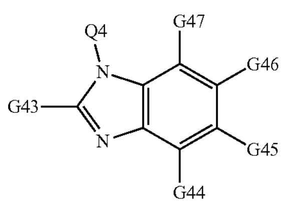

[Chemical Formula 13-4]

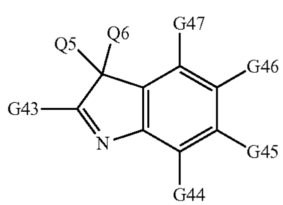

In Chemical Formulae 13-1 to 13-4, any one of G43 to G47 is a site bonding to L1 of Chemical Formula 1, and the rest and Q4 to Q6 are the same as or different from each other, and each independently is hydrogen, deuterium, a nitrile group a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkyl sulfoxy group a substituted or unsubstituted aryl sulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group a substituted or unsubstituted aryl group, or a substituted or unsubstituted heteroaryl group.

According to another embodiment of the present specification, in Chemical Formula 14, any one of G48, G49, R18 and R19 is a site bonding to L1 of Chemical Formula 1, and the rest and Q7 are the same as or different from each other, and each independently is hydrogen or a substituted or unsubstituted aryl group.

According to another embodiment of the present specification, in Chemical Formula 14, any one of G48, G49, R18 and R19 is a site bonding to L1 of Chemical Formula 1, and the rest and Q7 are the same as or different from each other, and each independently is hydrogen or an aryl group.

According to another embodiment of the present specification, in Chemical Formula 14, any one of G48, G49, R18 and R19 is a site bonding to L1 of Chemical Formula 1, and the rest and Q7 are the same as or different from each other, and each independently is hydrogen or a phenyl group.

According to another embodiment of the present specification, Chemical Formula 14 is any one selected from among the following Chemical Formulae 14-1 to 14-9.

[Chemical Formula 14-1]

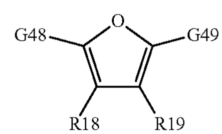

[Chemical Formula 14-2]

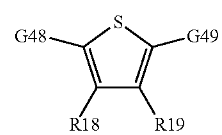

[Chemical Formula 14-3]

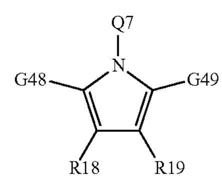

[Chemical Formula 14-4]

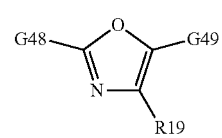

[Chemical Formula 14-5]

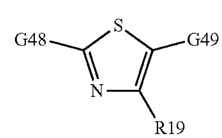

[Chemical Formula 14-6]

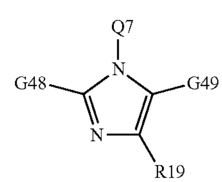

[Chemical Formula 14-7]

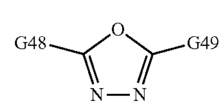

-continued

[Chemical Formula 14-8]

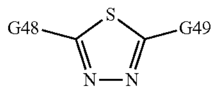

[Chemical Formula 14-9]

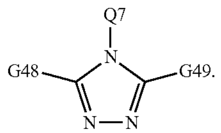

In Chemical Formulae 14-1 to 14-9:

G48, G49, R18, R19 and Q7 have the same definitions as in Chemical Formula 14.

According to one embodiment of the present specification, in Chemical Formula 15, the rest of G50 to G61 other than the site bonding to Chemical Formula 1, and R20 are the same as or different from each other, and each independently is hydrogen, a substituted or unsubstituted aryl group, or a substituted or unsubstituted heteroaryl group.

According to one embodiment of the present specification, in Chemical Formula 15, the rest of G50 to G61 other than the site bonding to Chemical Formula 1, and R20 are the same as or different from each other, and each independently is hydrogen or a substituted or unsubstituted aryl group.

According to one embodiment of the present specification, in Chemical Formula 15, the rest of G50 to G61 other than the site bonding to Chemical Formula 1, and R20 are the same as or different from each other, and each independently is hydrogen or a phenyl group.

According to one embodiment of the present specification, in Chemical Formula 15, the rest of G50 to G61 other than the site bonding to Chemical Formula 1, and R20 are the same as or different from each other, and each independently is hydrogen.

According to one embodiment of the present specification, m is 1.

According to one embodiment of the present specification, Chemical Formula 1 is any one selected from among the following Chemical Formulae 1-1 to 1-4:

[Chemical Formula 1-1]

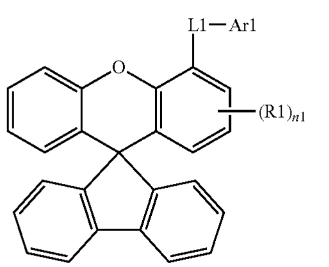

[Chemical Formula 1-2]

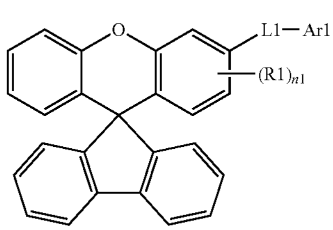

-continued

[Chemical Formula 1-3]

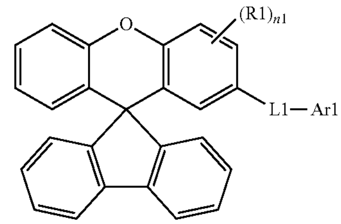

[Chemical Formula 1-4]

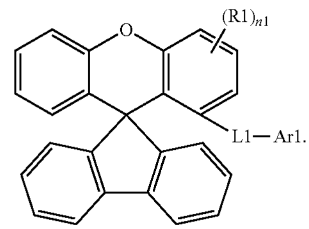

In Chemical Formulae 1-1 to 1-4,

L1, Ar1, R1 and n have the same definitions as in Chemical Formula 1.

According to one embodiment of the present specification, R1 is hydrogen.

Generally, electron mobility of a compound varies depending on orientation in a molecular 3D structure, and electron mobility is strengthened in a more horizontal structure. The compound of Chemical Formula 1 substituted with one -L1-Ar1 according to one embodiment of the present specification has an advantage of increasing electron mobility with a stronger tendency toward a horizontal structure of the molecule compared to the compound substituted with two -L1-Arls. Accordingly, when using the heterocyclic compound of Chemical Formula 1 in an organic light emitting device, effects of low driving voltage, high efficiency and long lifetime are obtained. (Refer to APPLIED PHYSICS LETTERS 95, 243303 (2009))

According to FIG. 10 and FIG. 11 presenting 3D structures of Compounds E9 and E18 according to one embodiment of the present specification, it can be identified that the molecules of the compounds have a horizontal structure, and according to FIG. 12 and FIG. 13 presenting 3D structures of Compounds ET-1-E and ET-1-I used as compounds of comparative examples of the present specification, it can be identified that the A axis and the B axis are almost perpendicular to each other in each compound, and the molecules are very out of a horizontal structure. As a result, it can be seen that Compounds E9 and E18 according to one embodiment of the present specification have a horizontal structure compared to Compounds ET-1-E and ET-1-I due to a difference in orientation in the molecular 3D structure, and as a result, excellent effects are obtained in terms of driving voltage, efficiency and lifetime when using the compound of Chemical Formula 1 in an organic light emitting device.

According to one embodiment of the present specification, Chemical Formula 1 can be any one compound selected from among the following compounds:

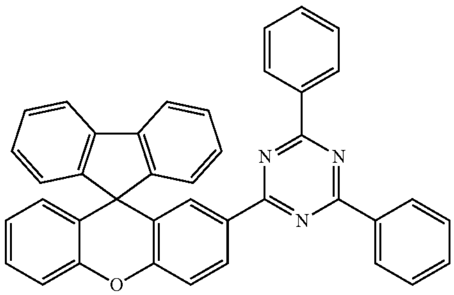
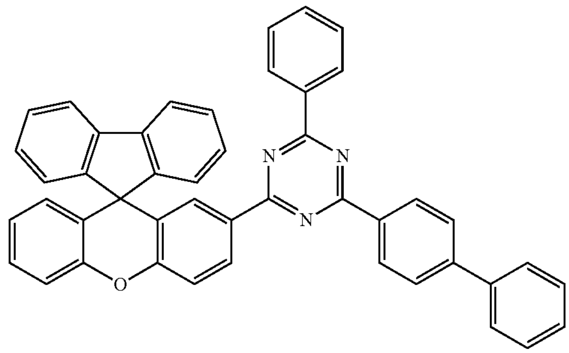
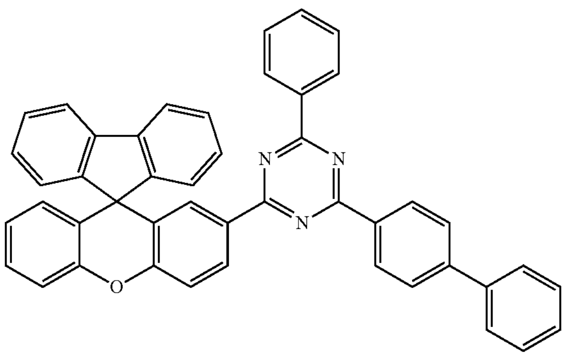
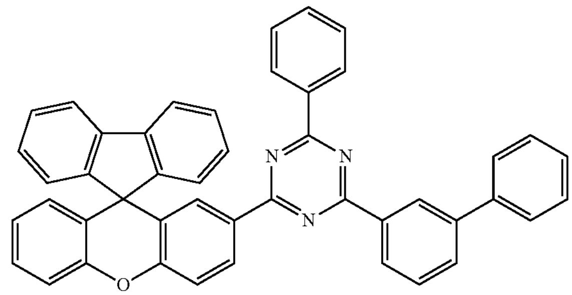
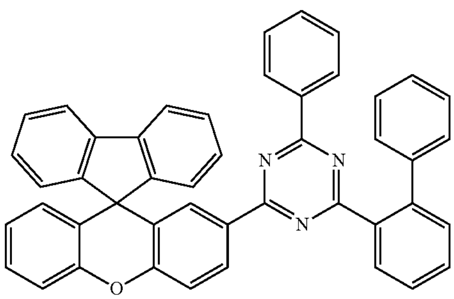
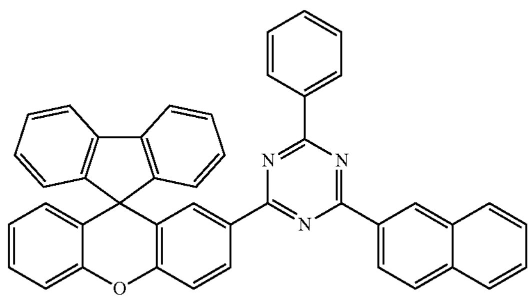
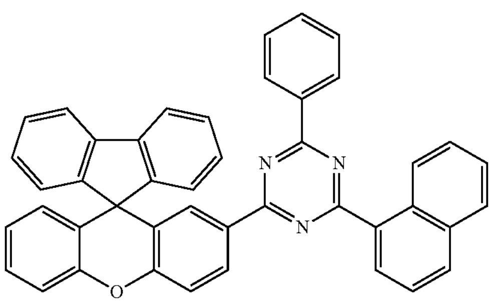
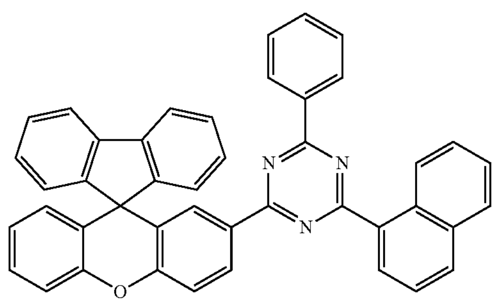
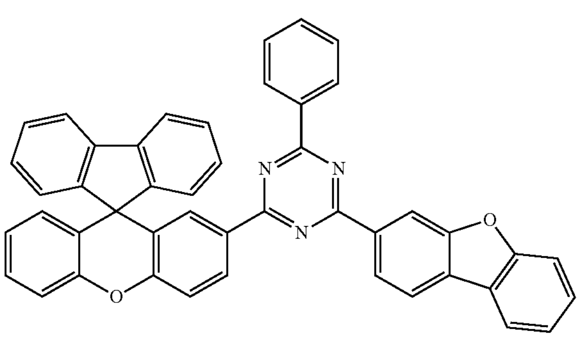
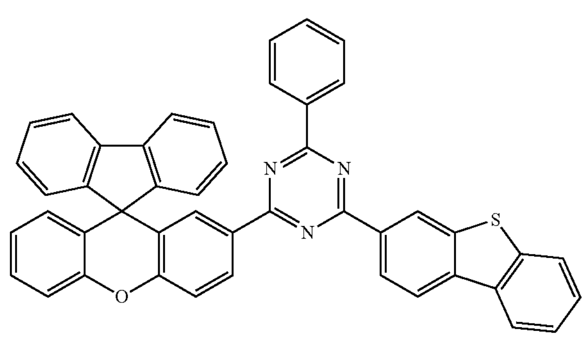

-continued
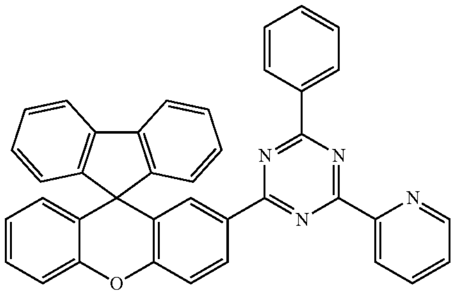
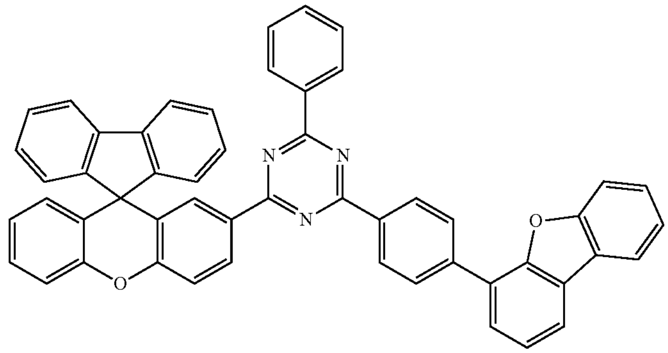
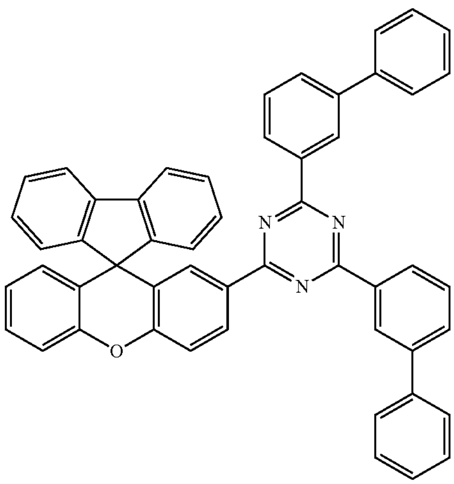
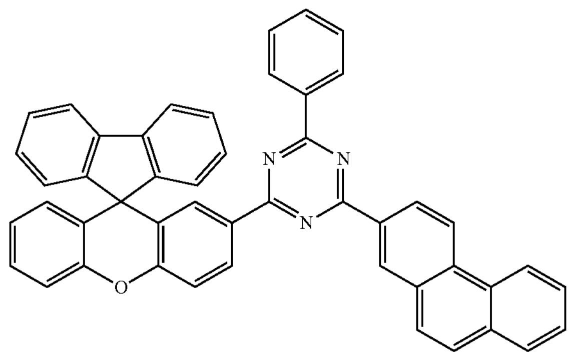
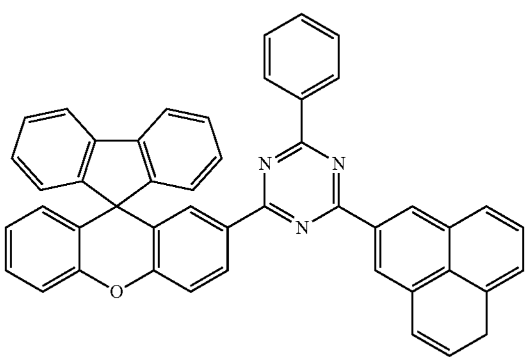
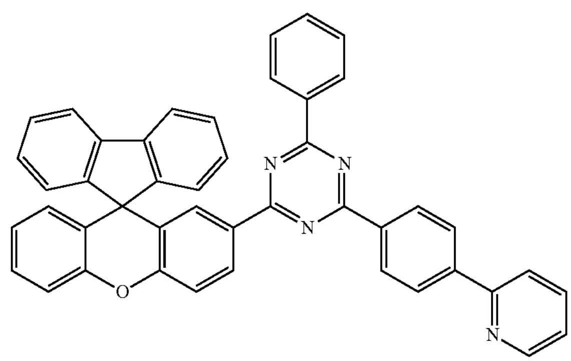
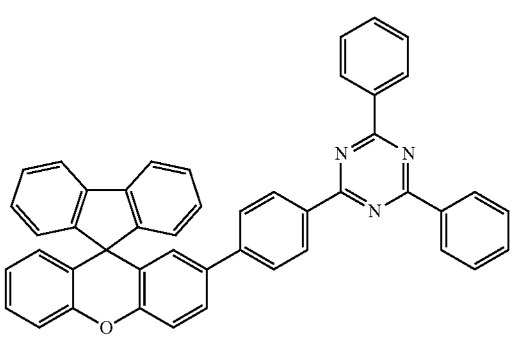
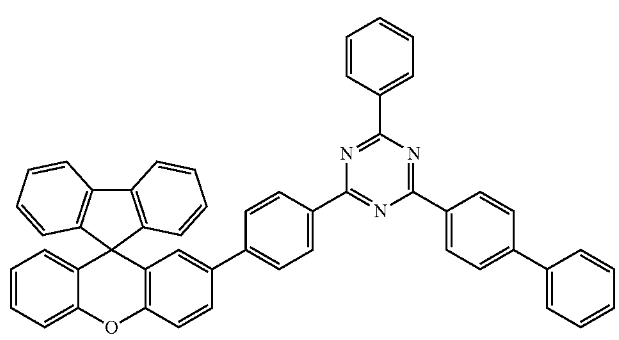

-continued
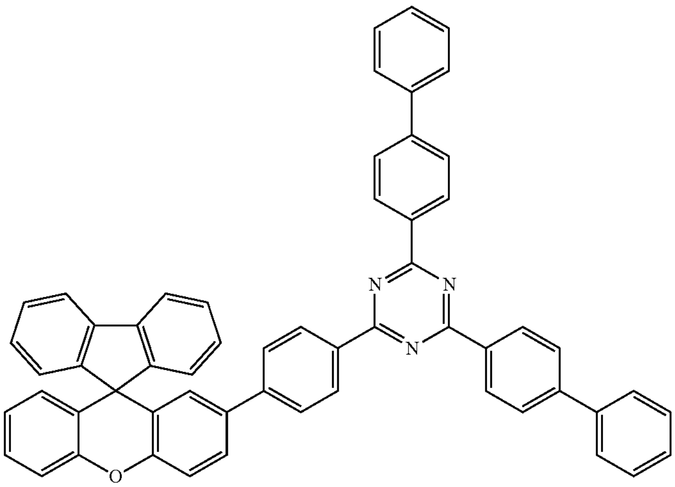
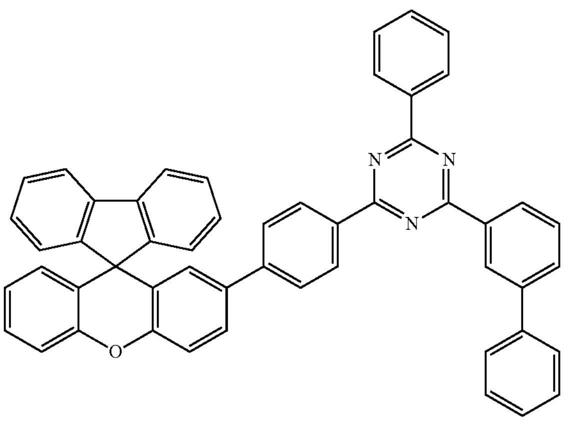
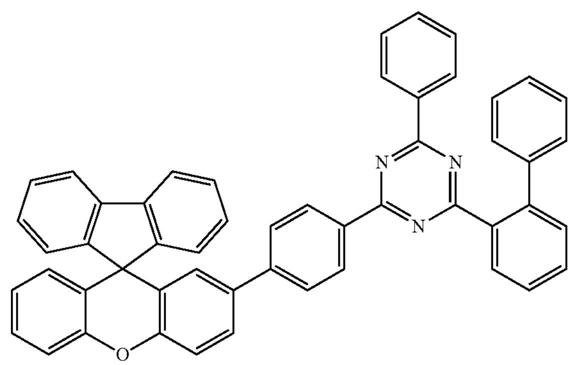
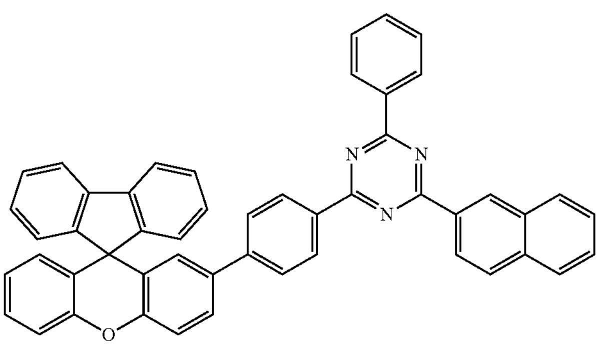
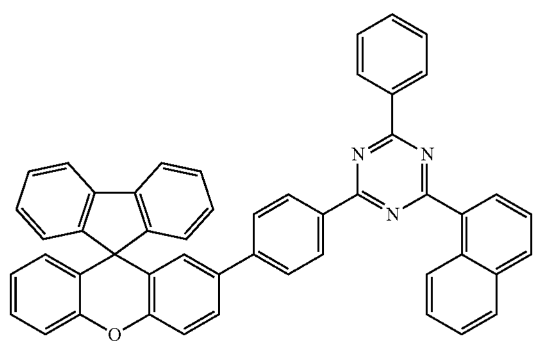
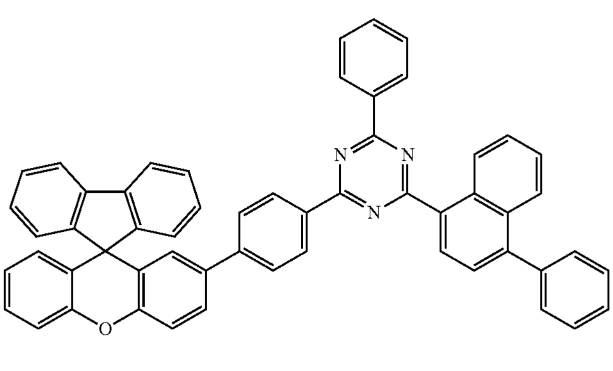
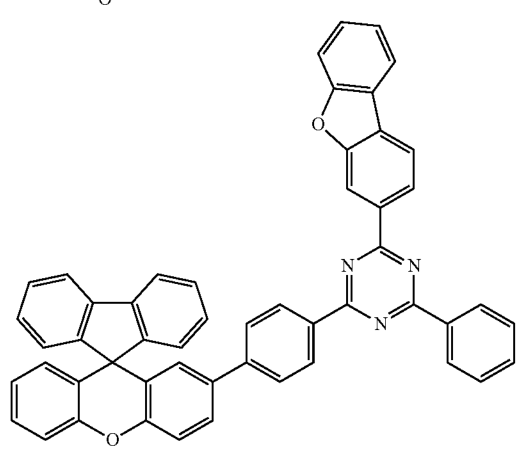

-continued
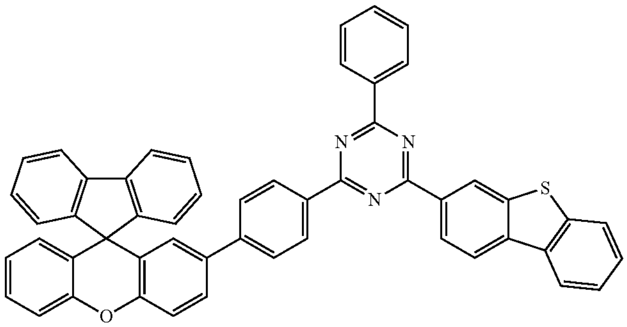
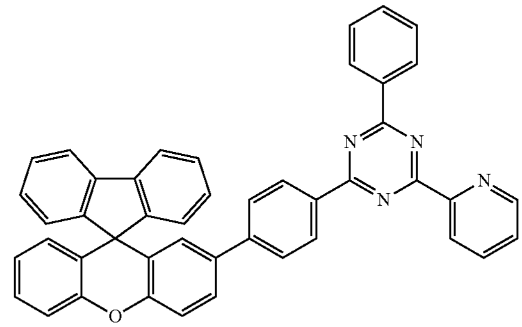
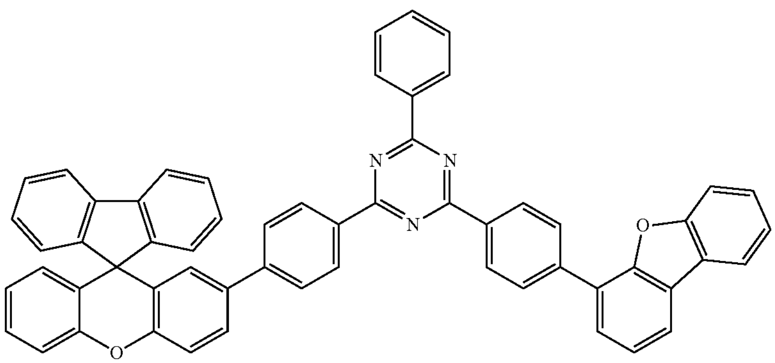
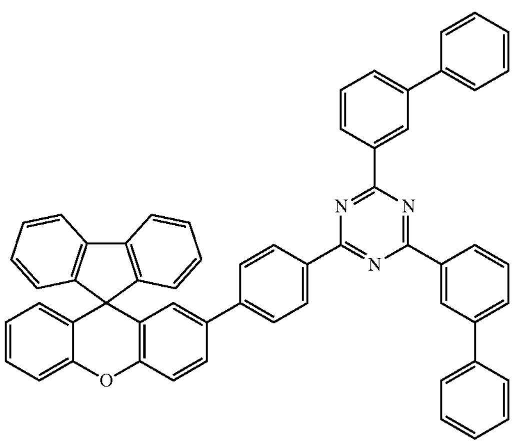
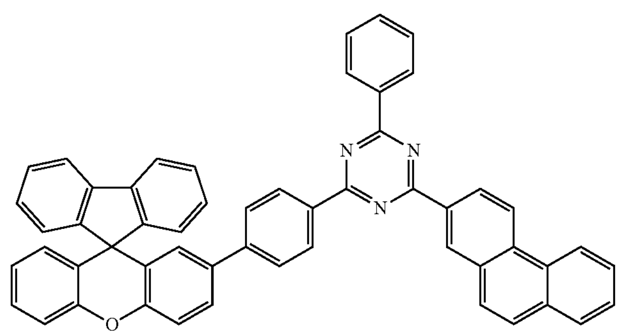
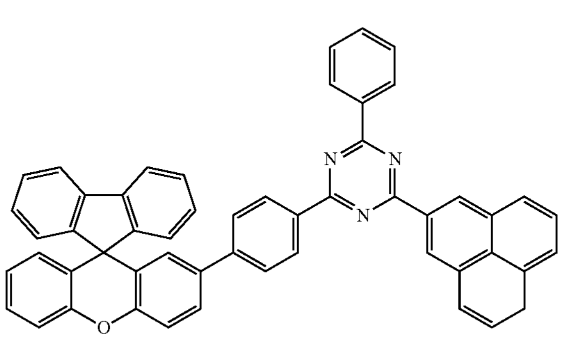
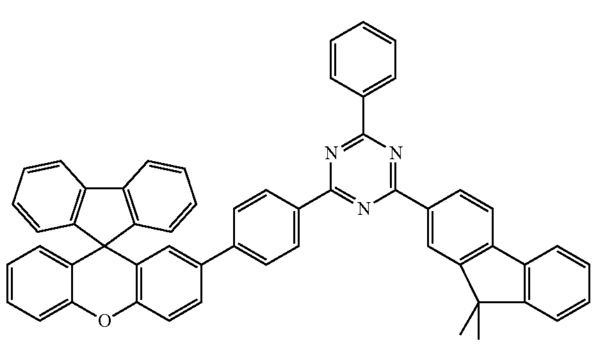

-continued
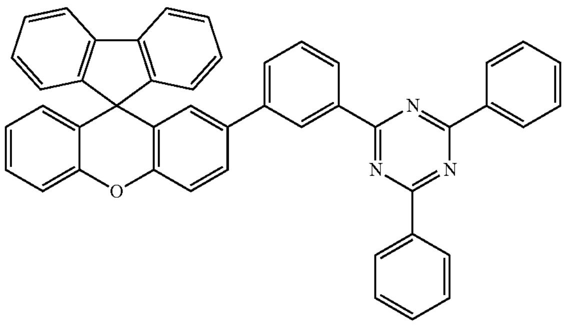
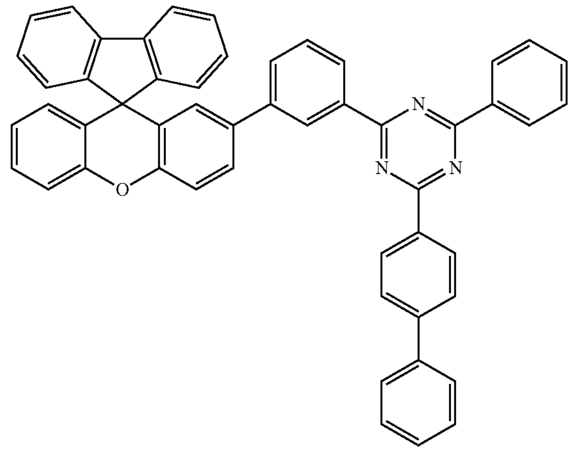
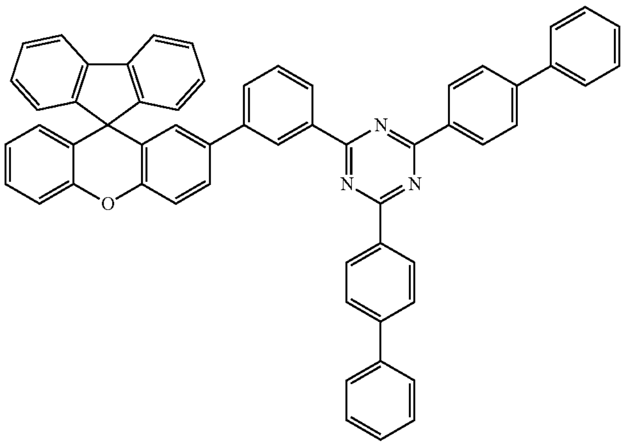
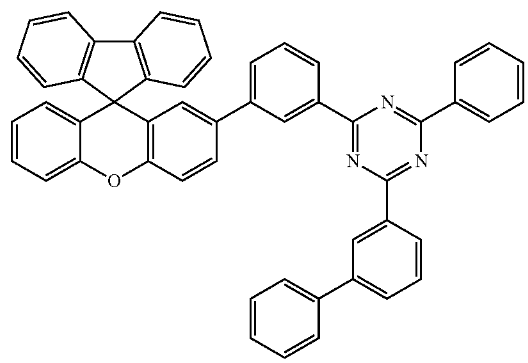
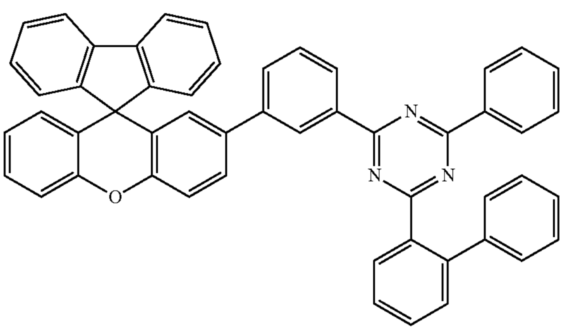
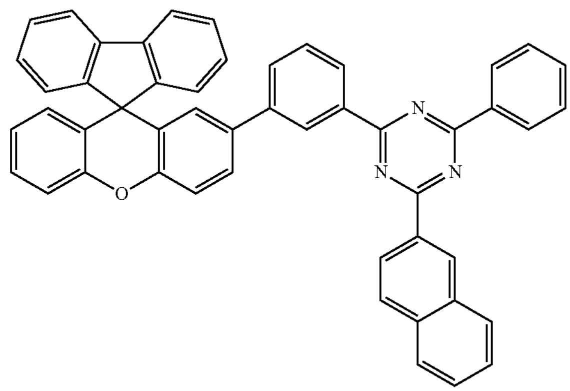
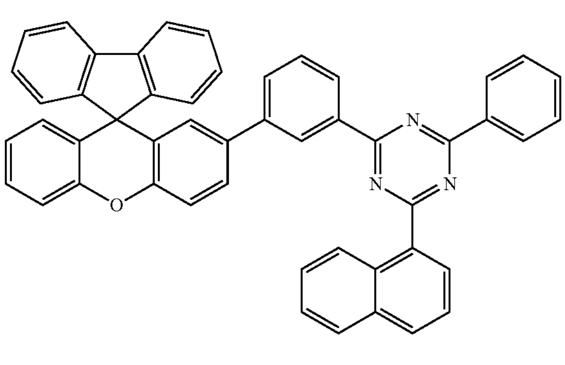
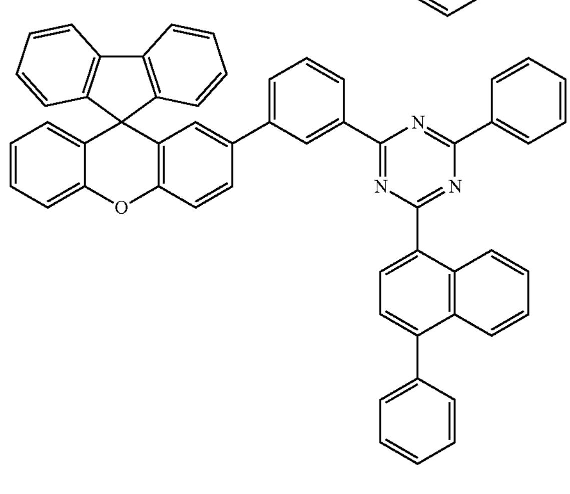

-continued
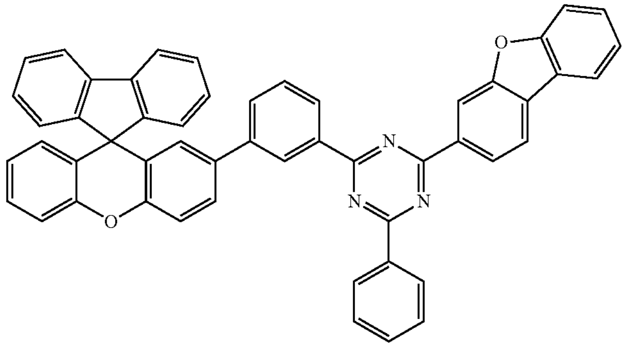
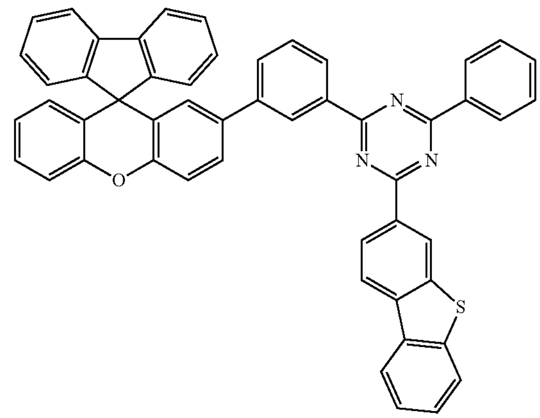
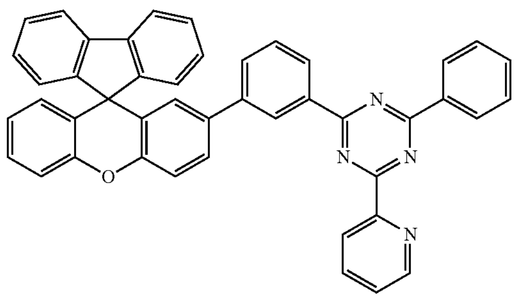
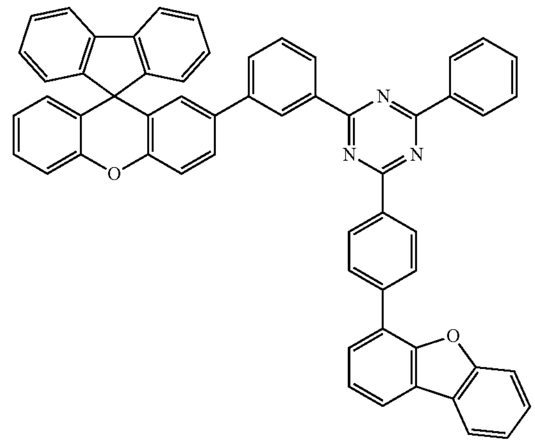
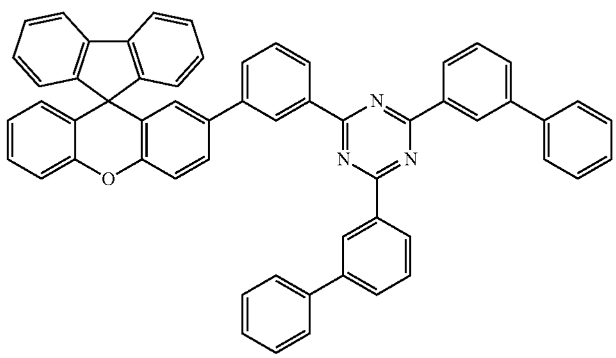
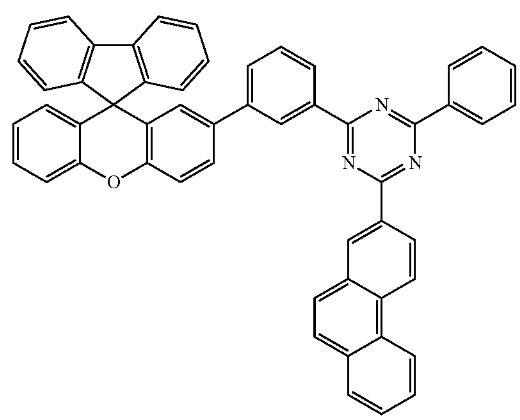
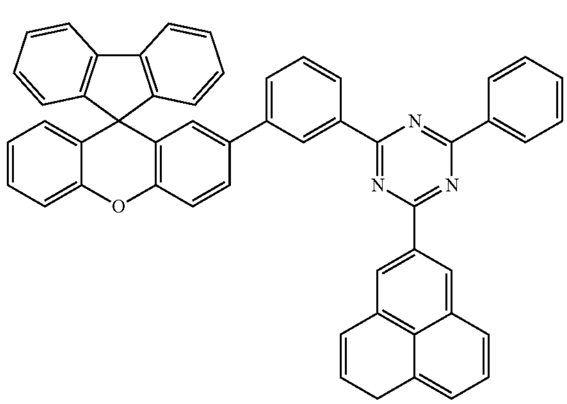

-continued
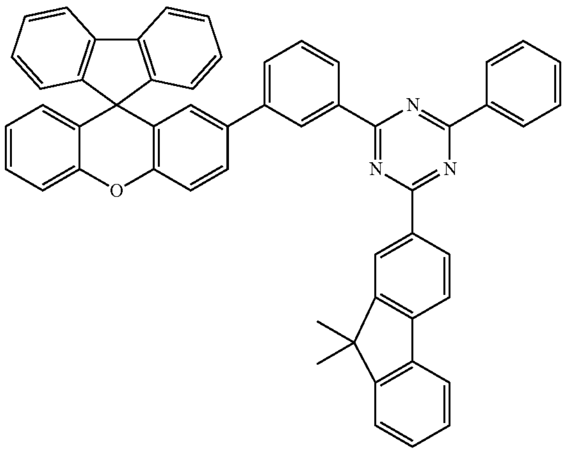
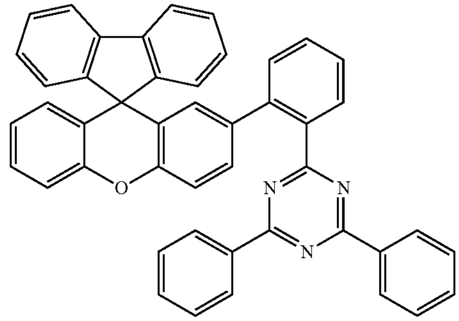
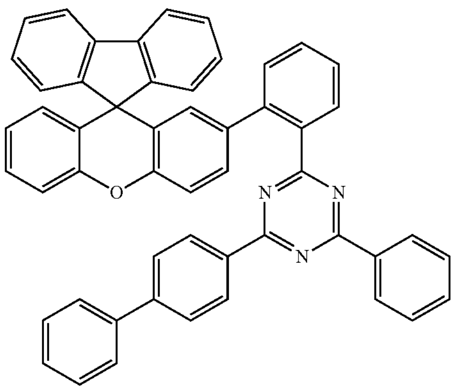
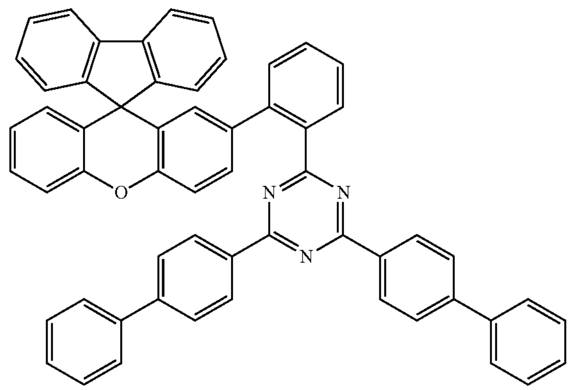
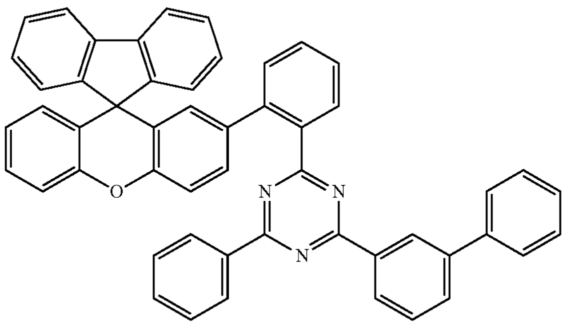
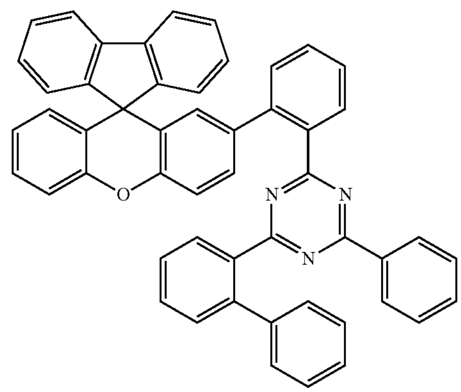
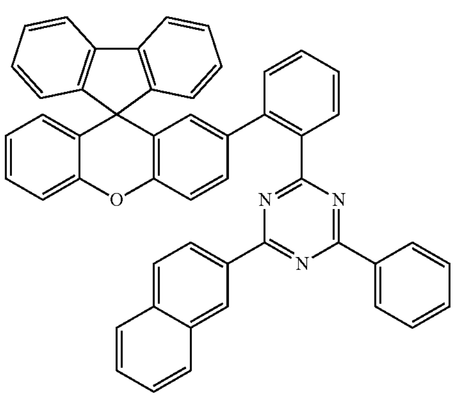
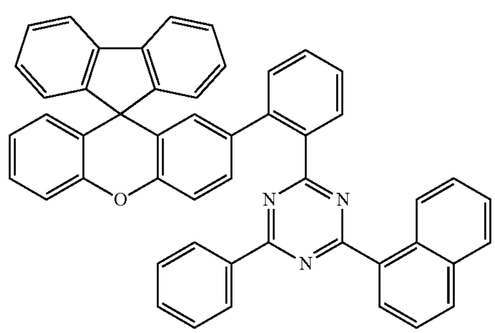

-continued
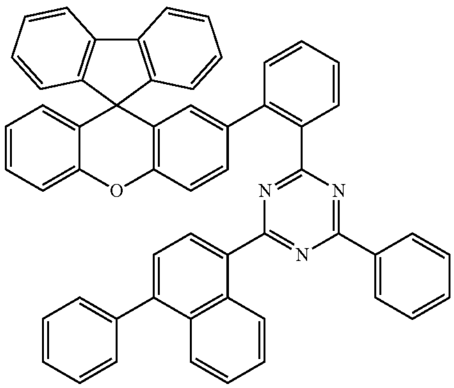
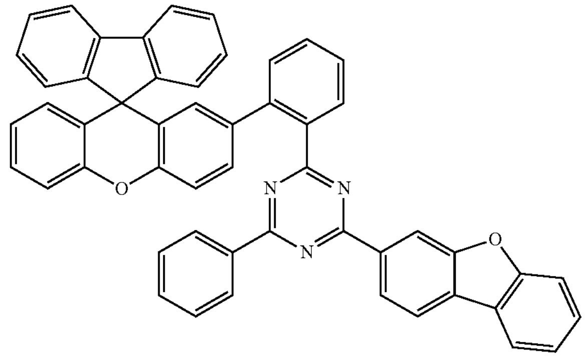
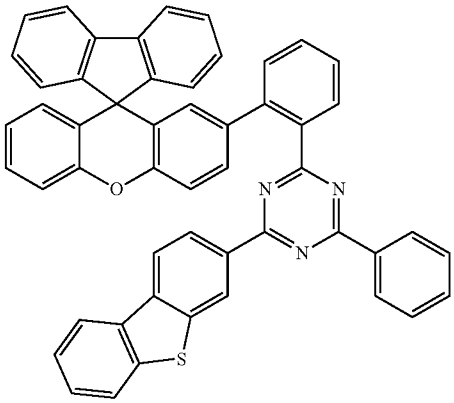
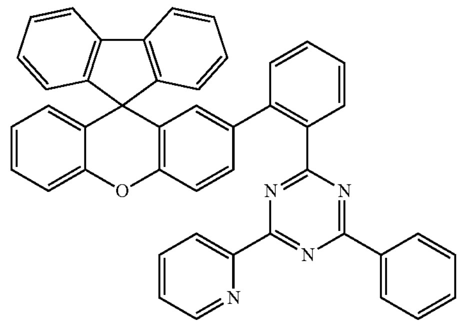
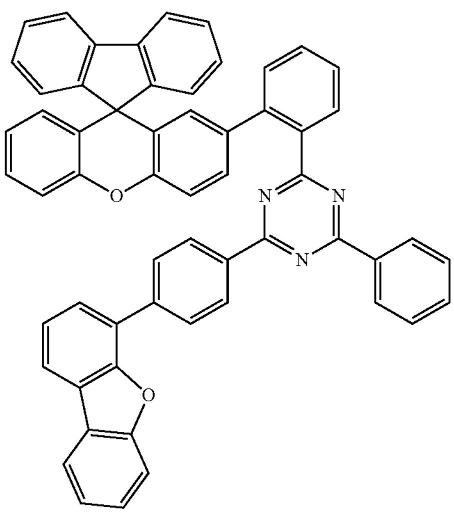
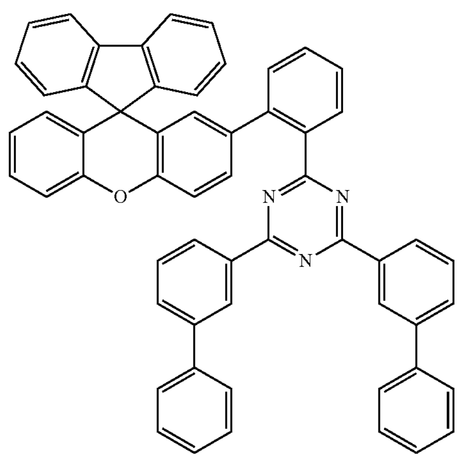
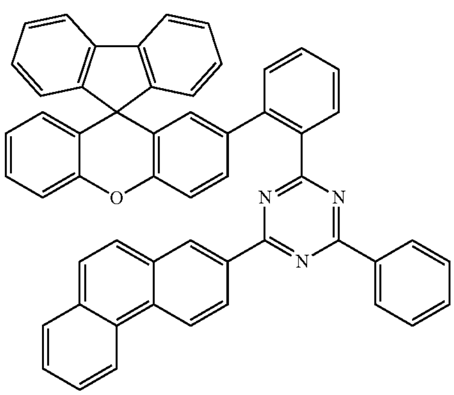
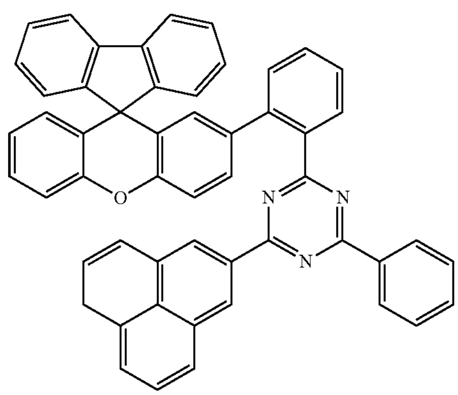

-continued
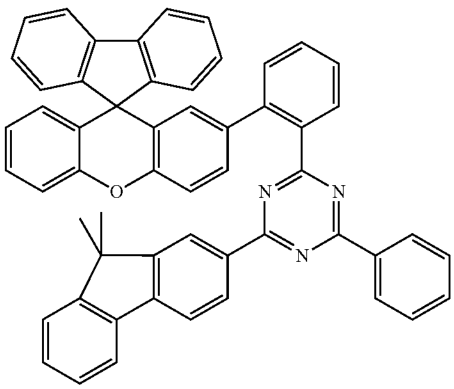
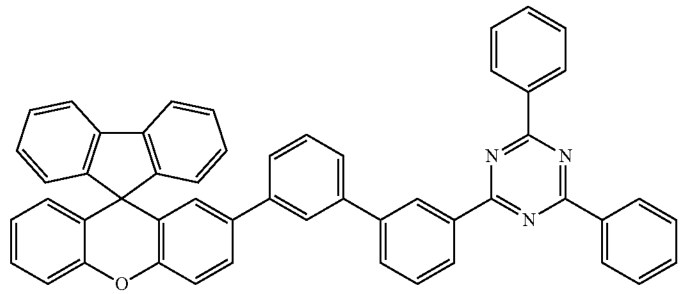
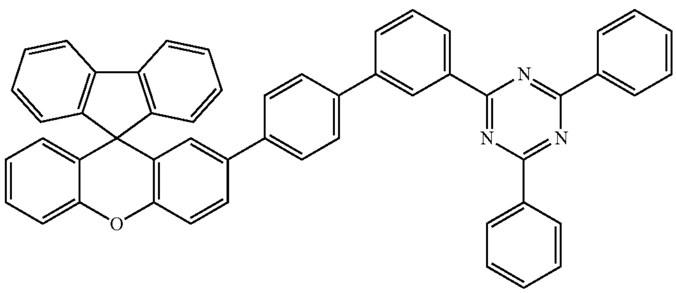
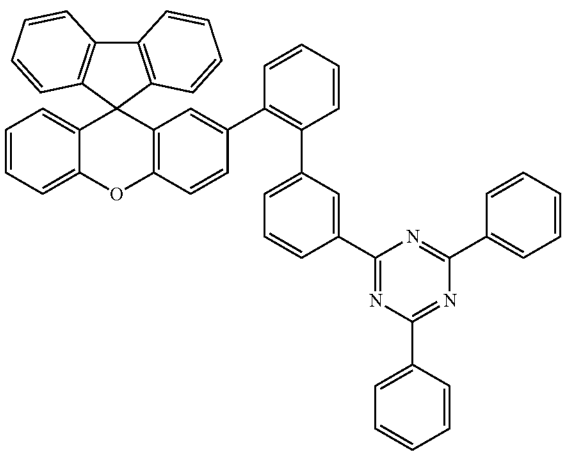
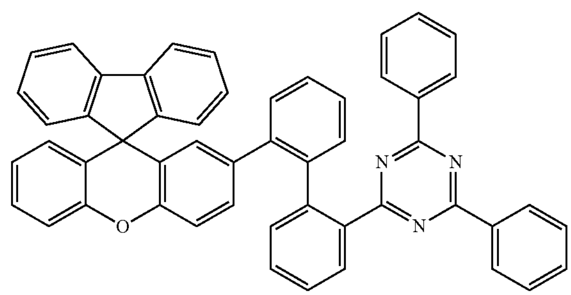
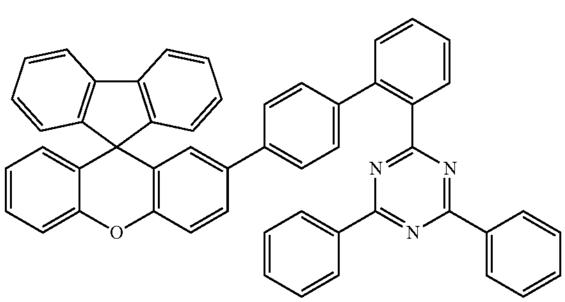
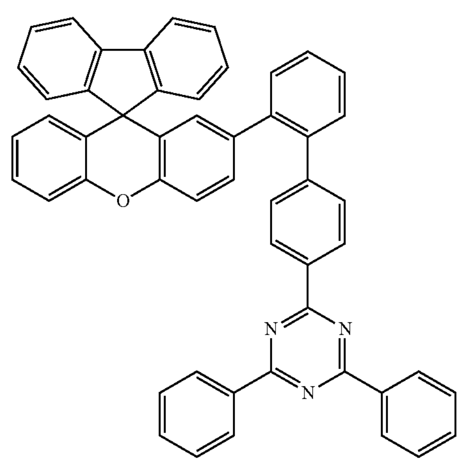

-continued
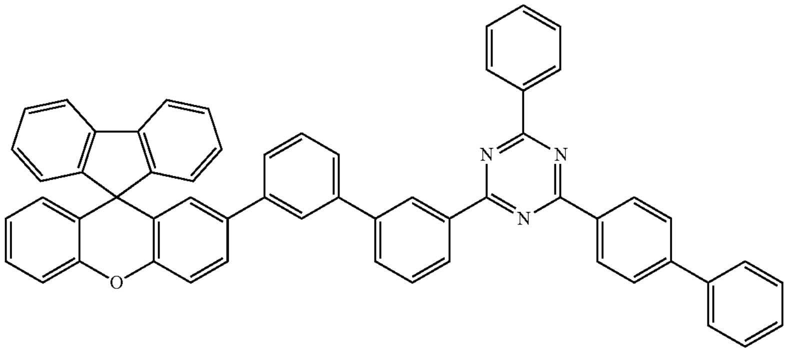
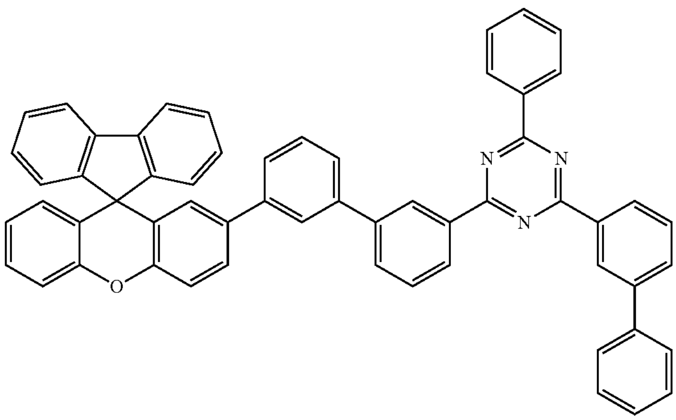
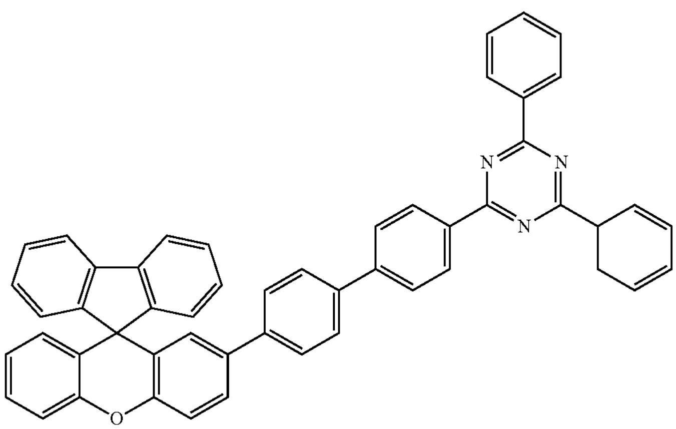
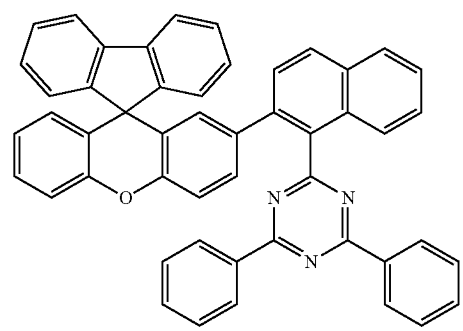
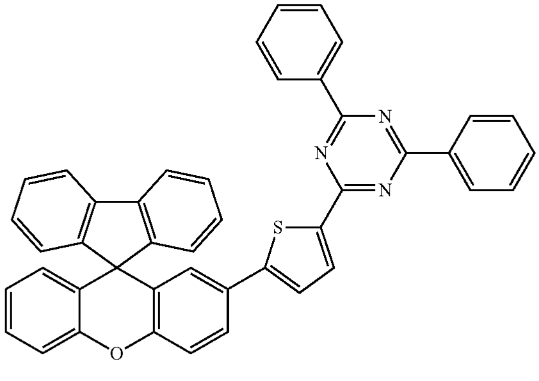
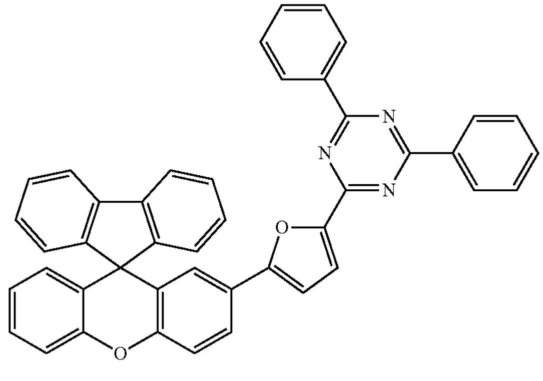

-continued
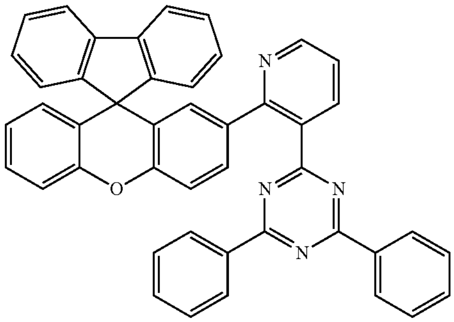
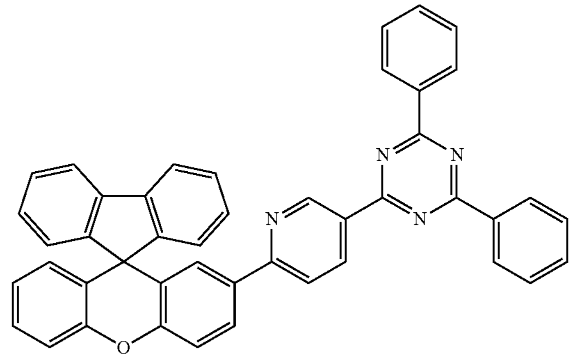
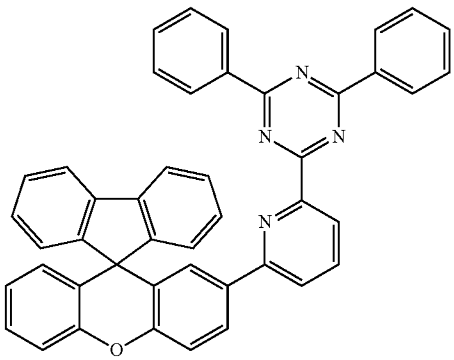
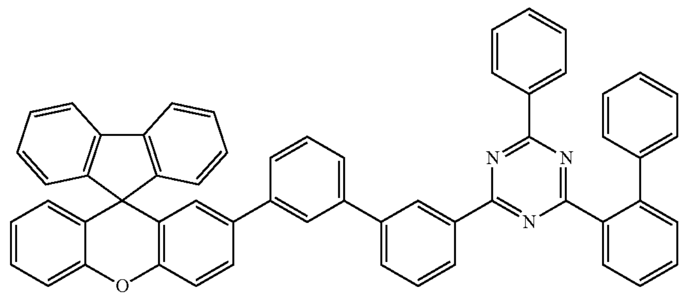
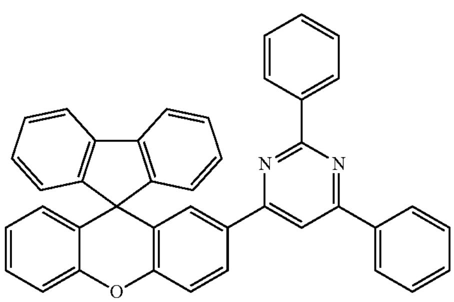
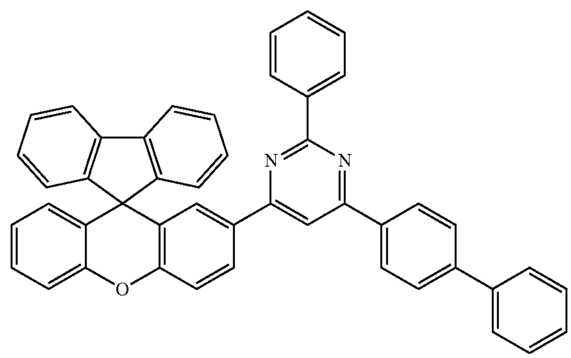
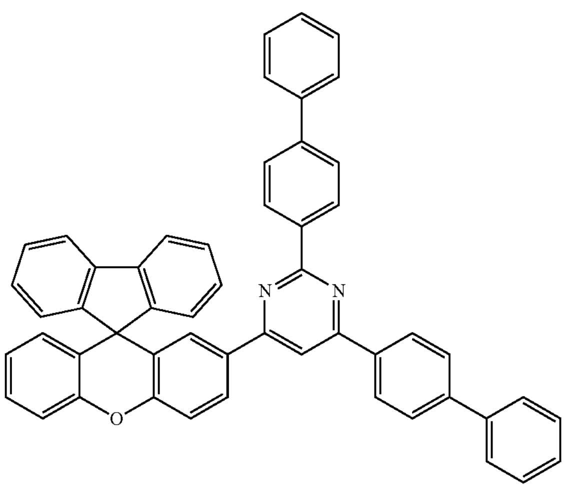
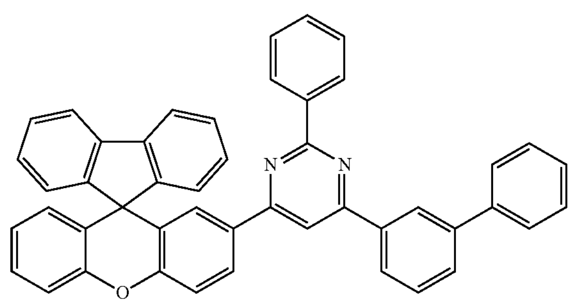

-continued
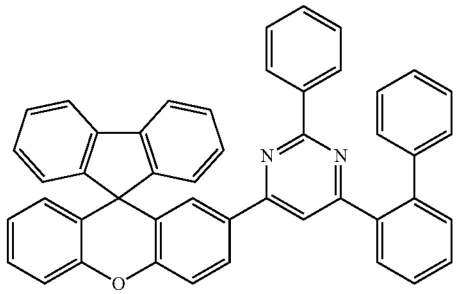
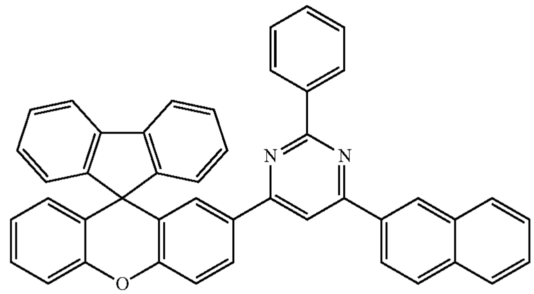
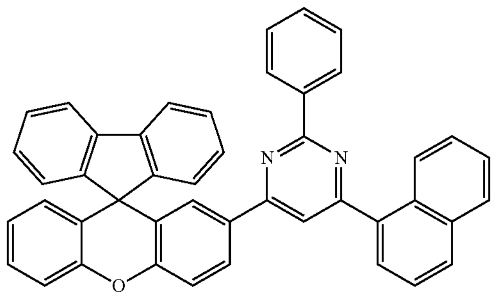
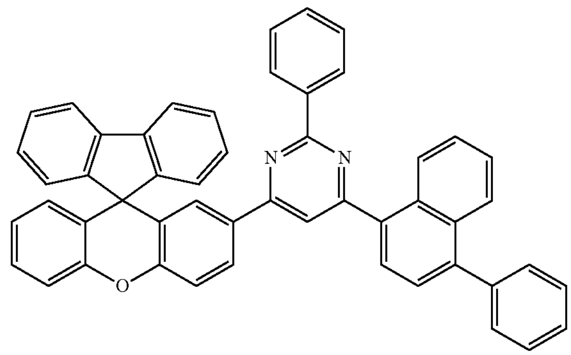
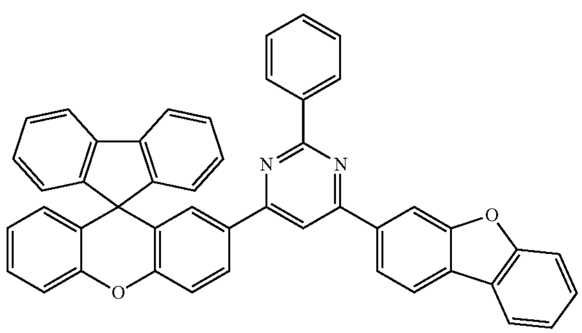
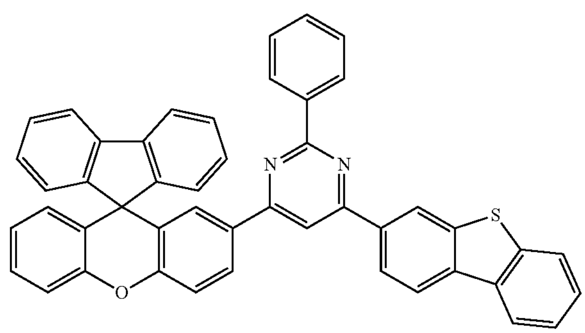
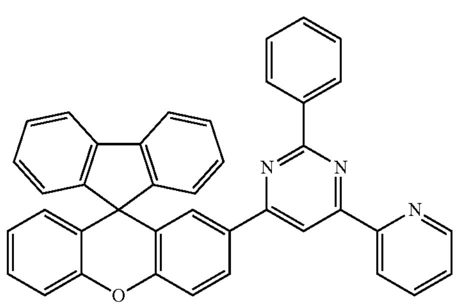
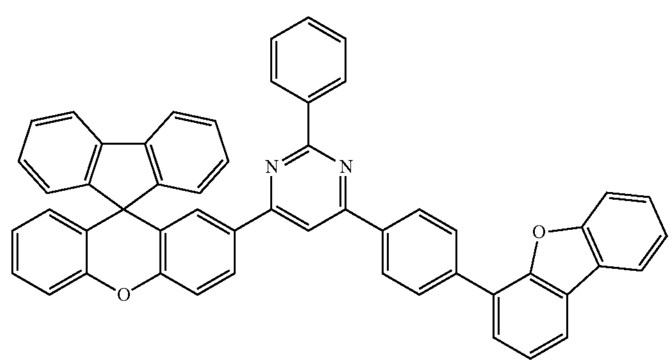

-continued
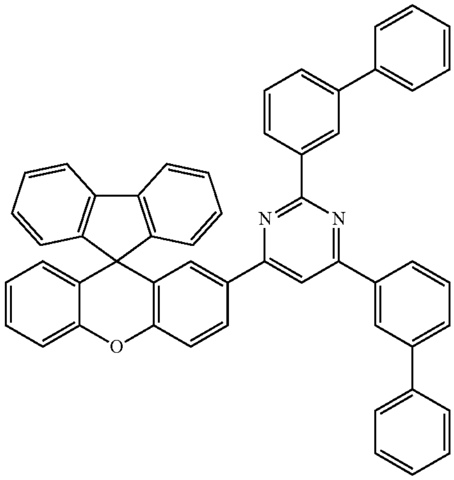
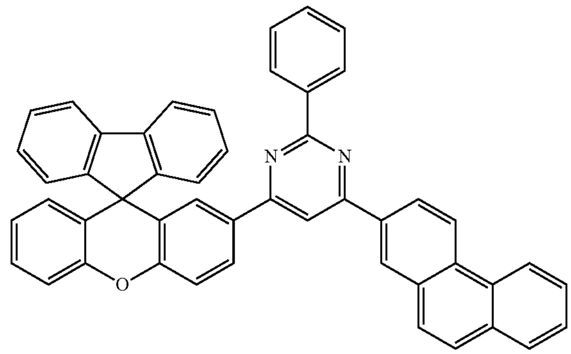
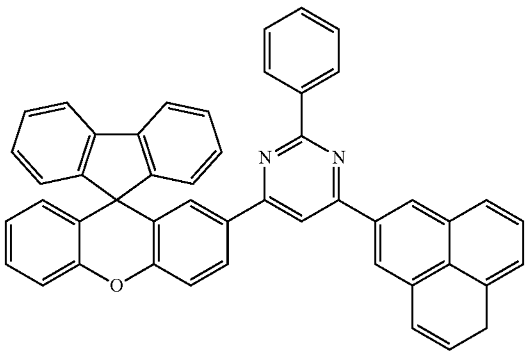
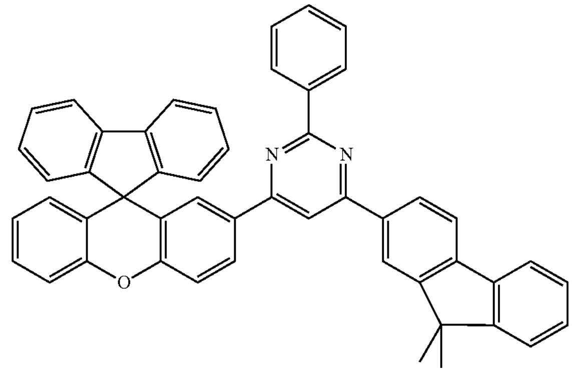
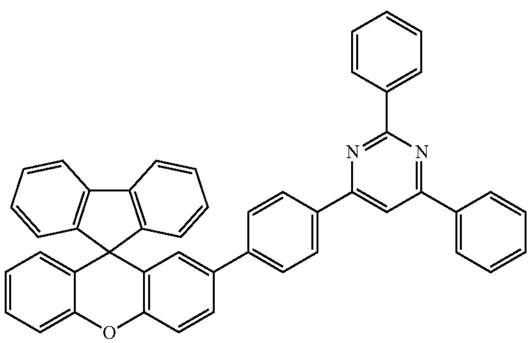
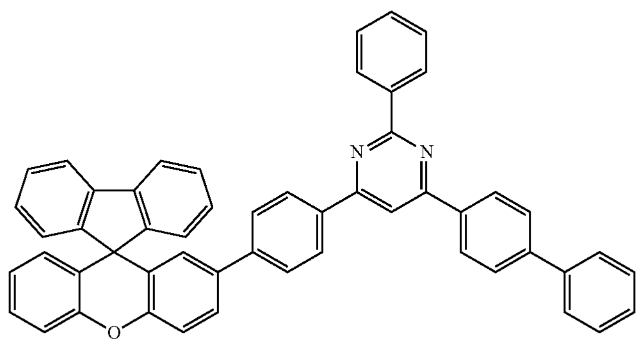
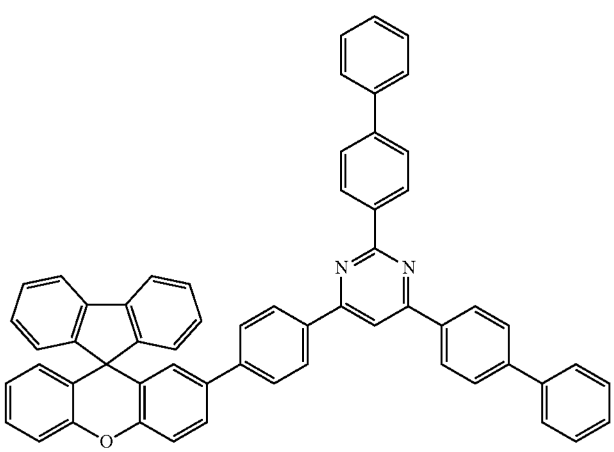
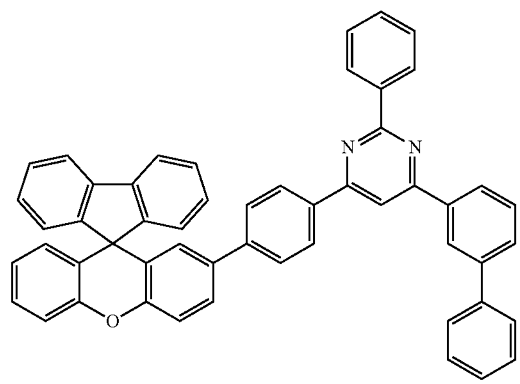

-continued
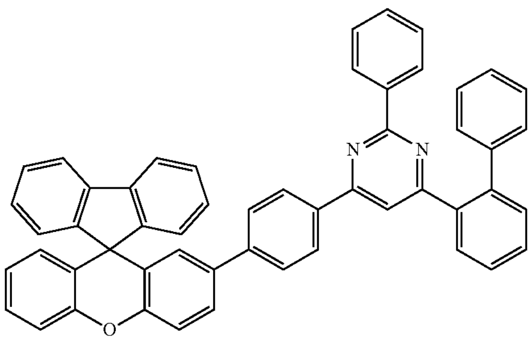
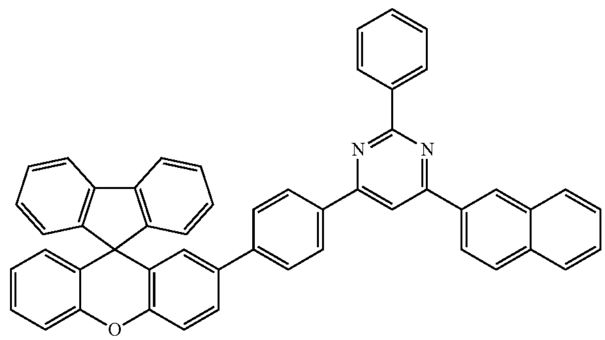
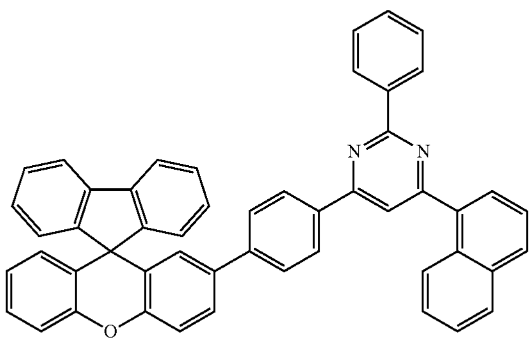
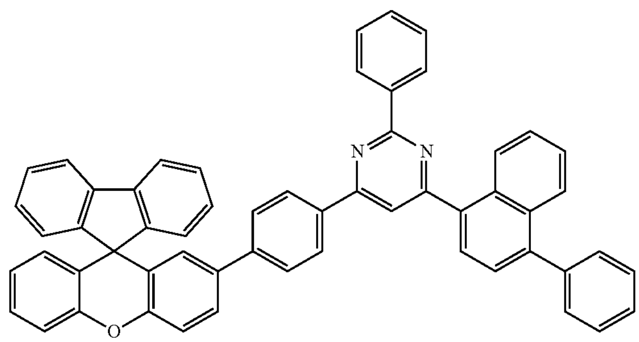
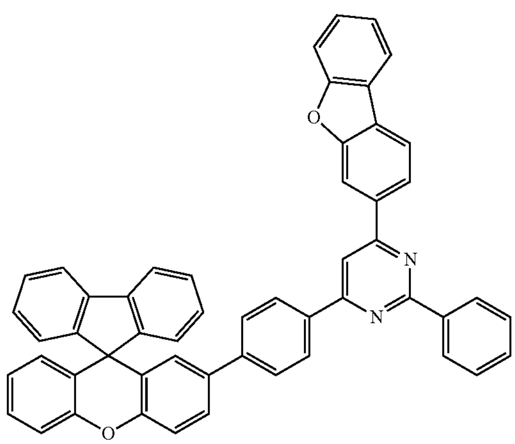
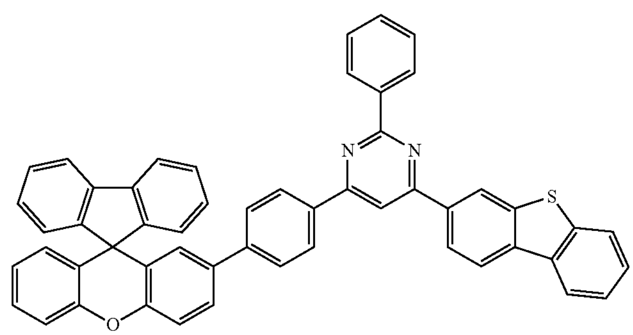
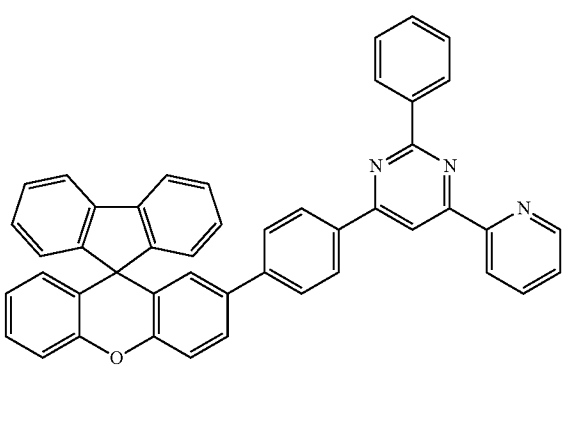

-continued
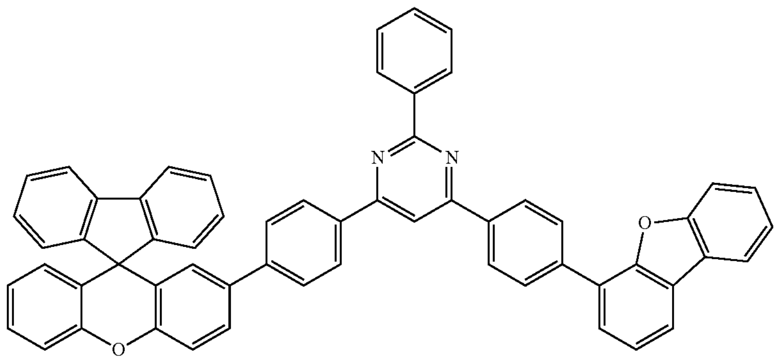
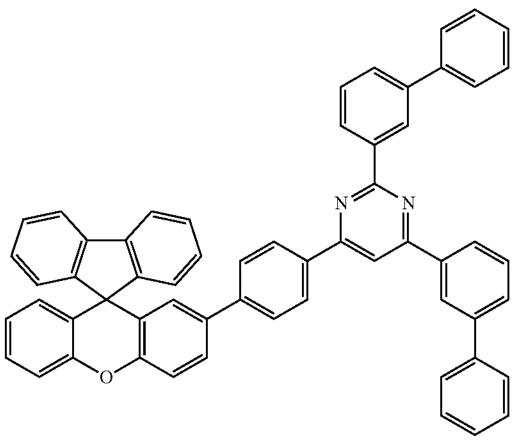
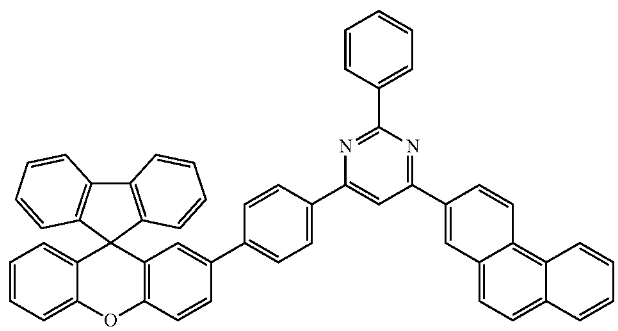
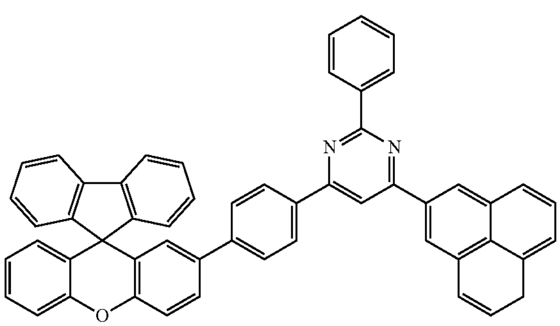
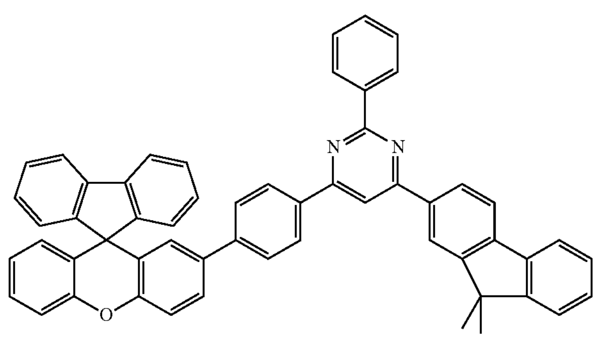
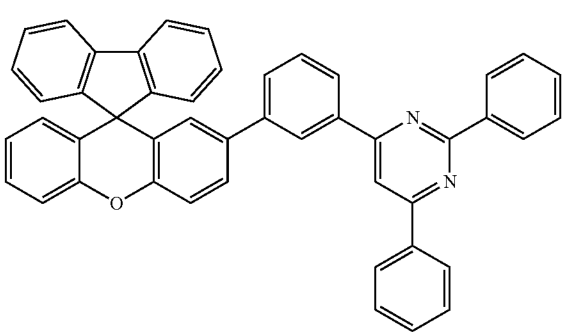
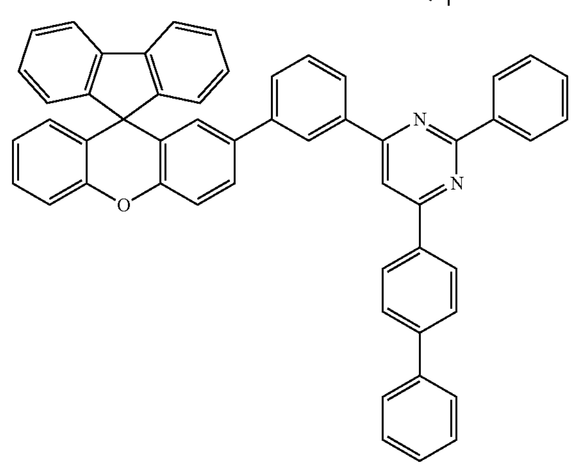

-continued
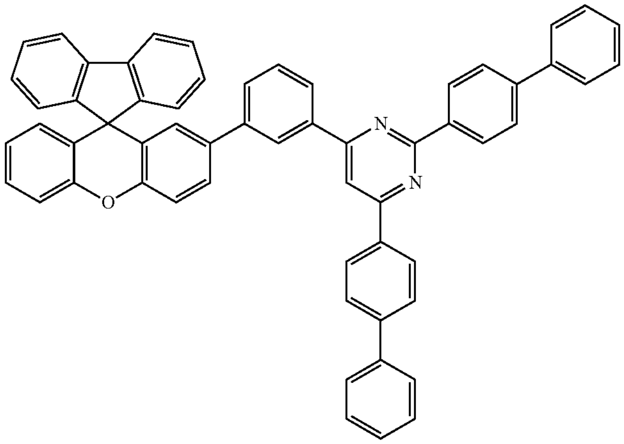
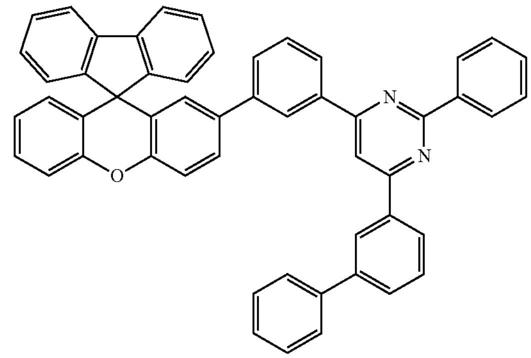
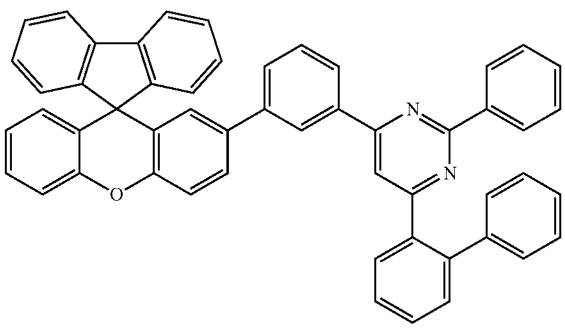
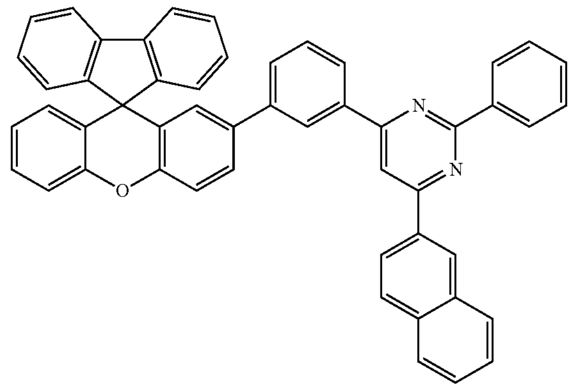
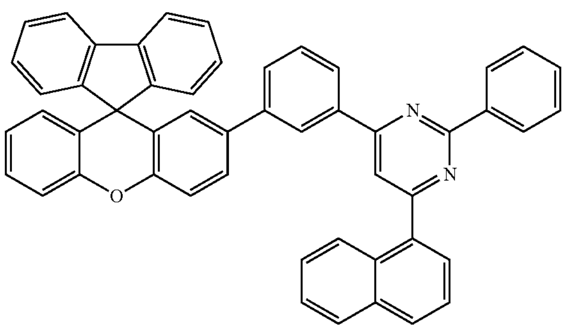
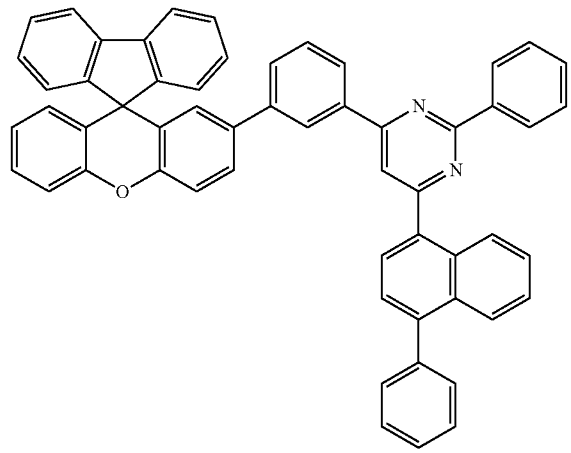
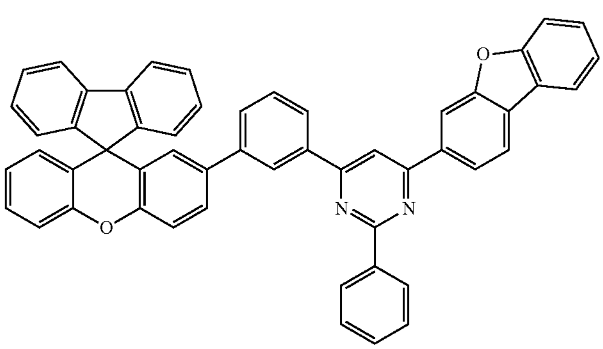
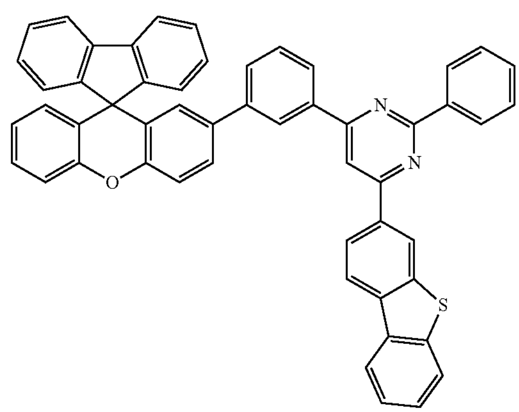

-continued
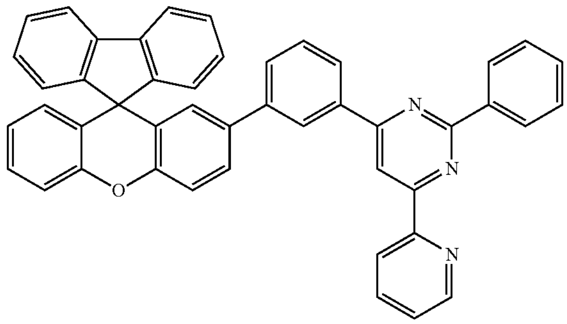
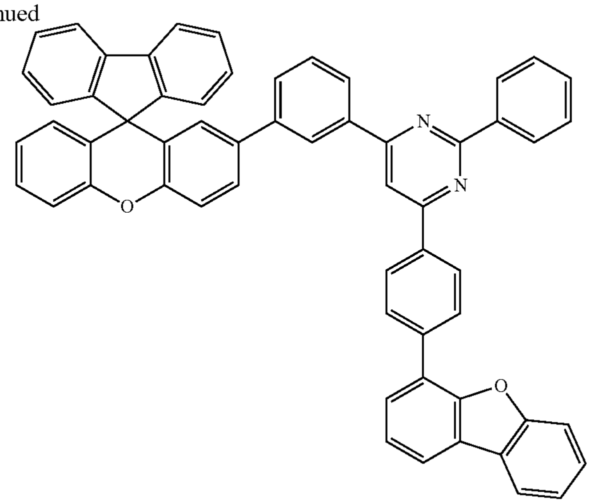
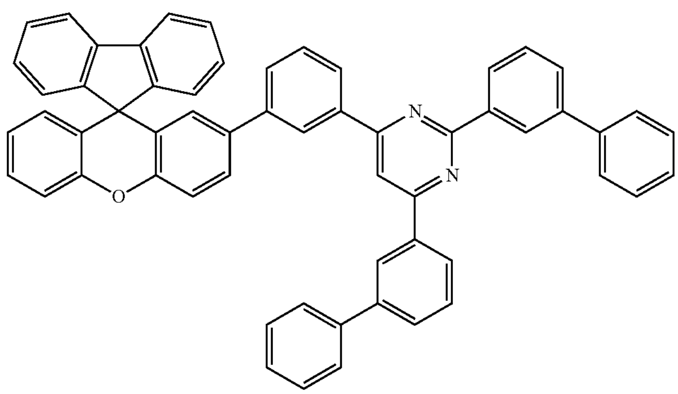
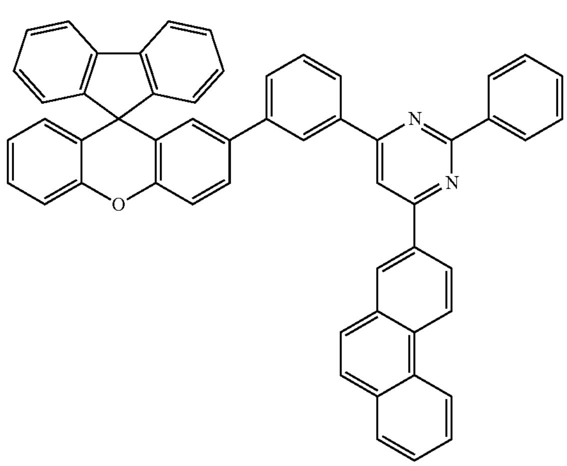
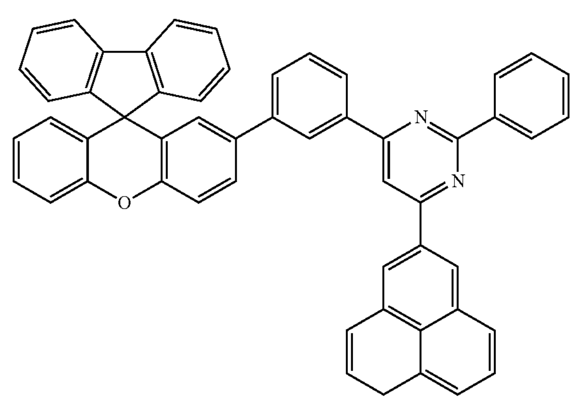

-continued
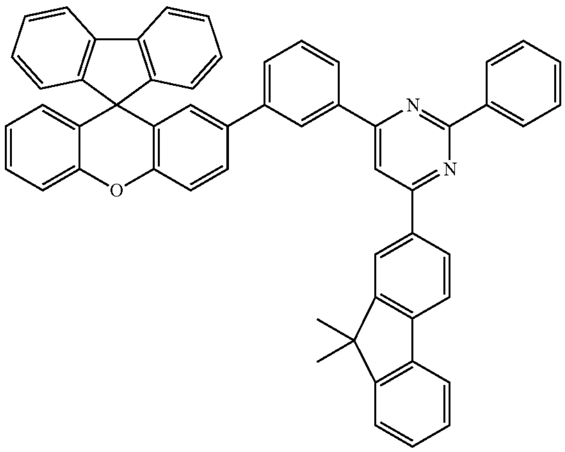
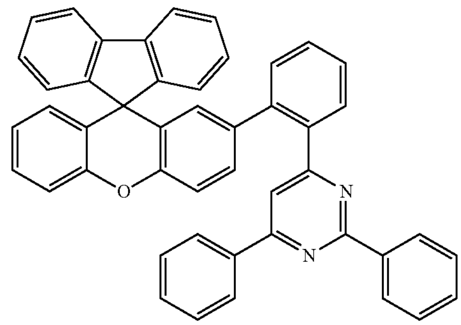
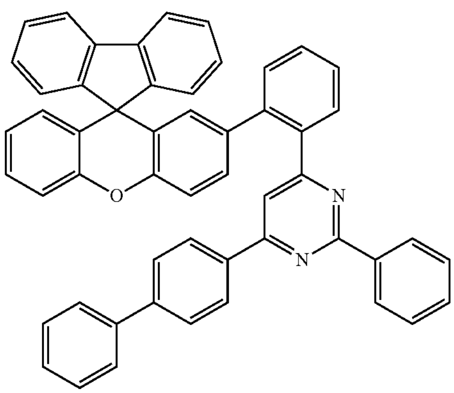
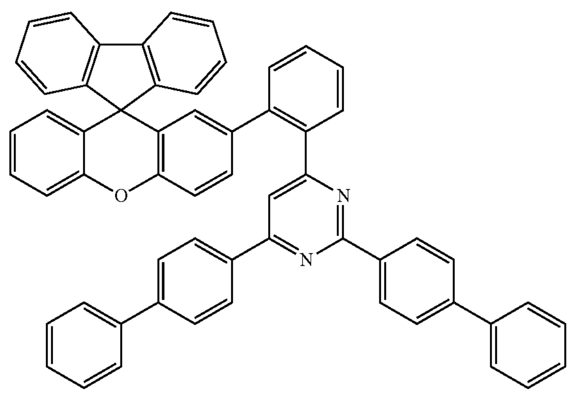
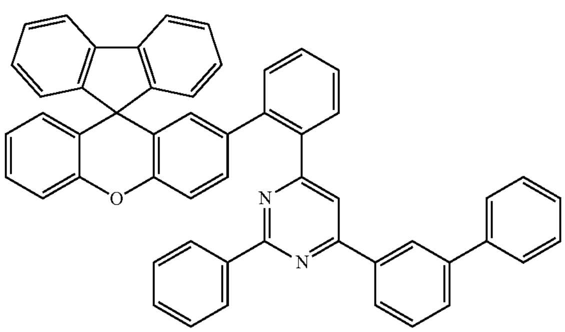
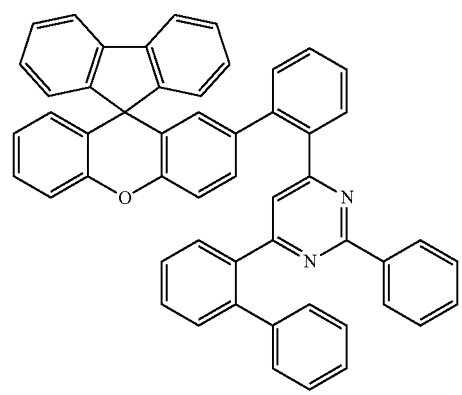
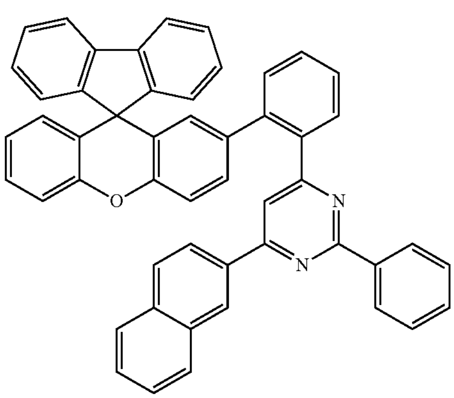
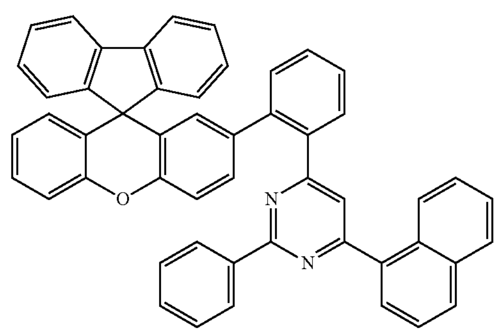

-continued
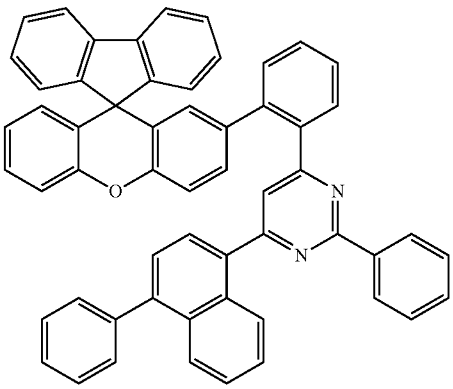
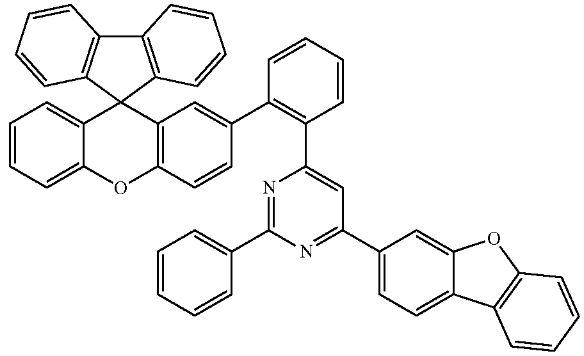
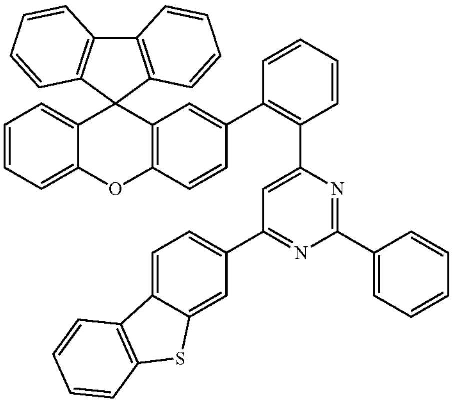
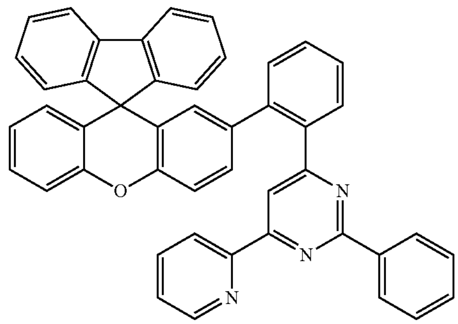
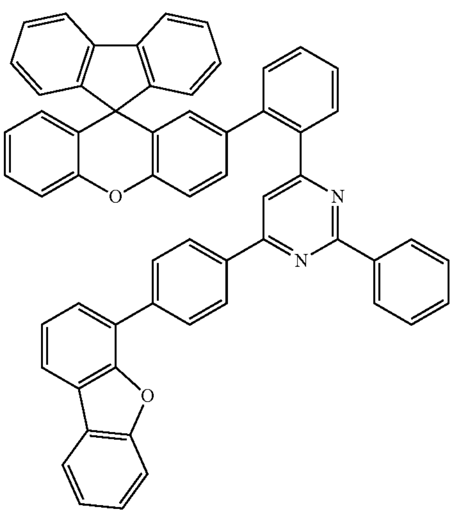
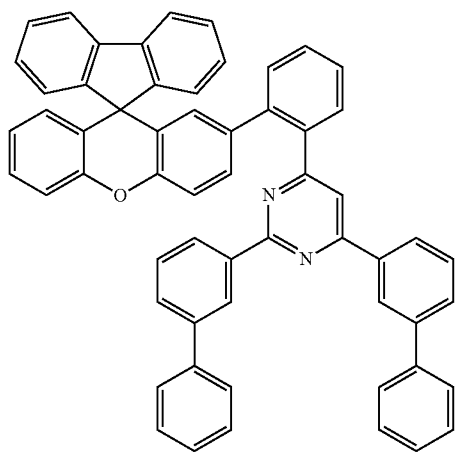
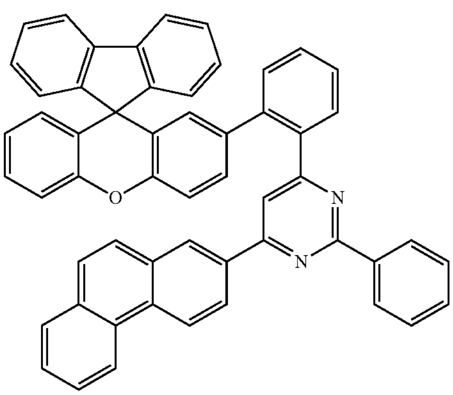
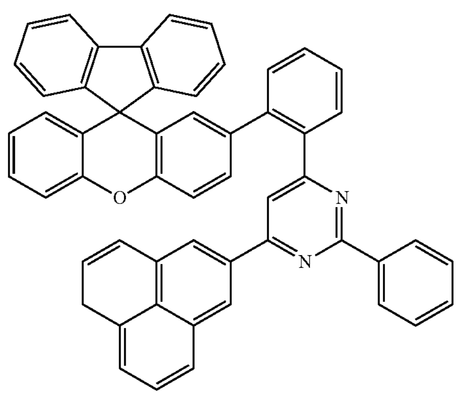

-continued
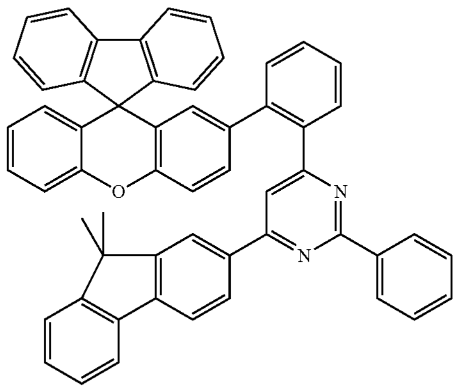
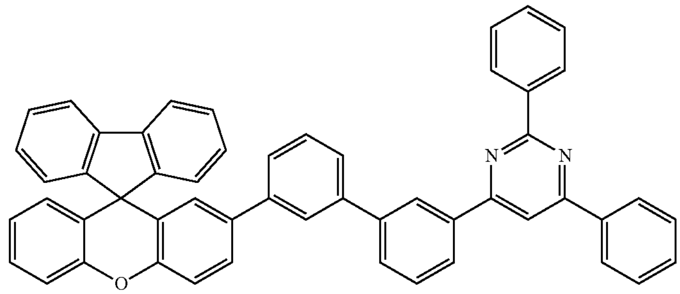
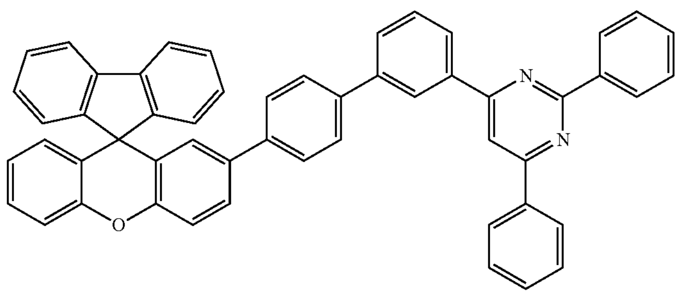
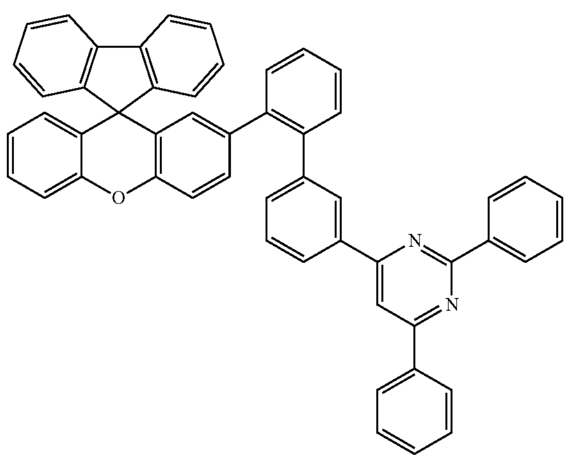
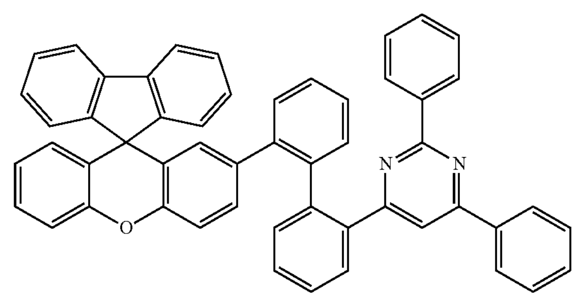
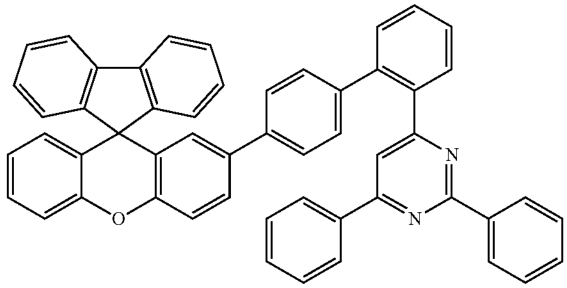
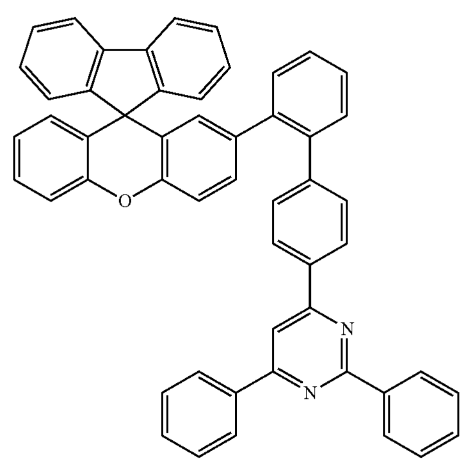

-continued
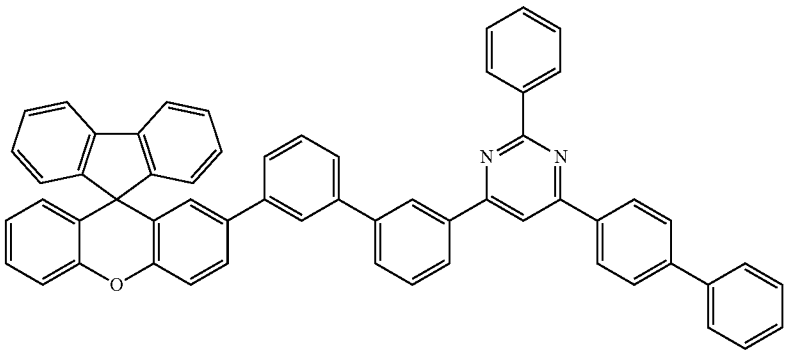
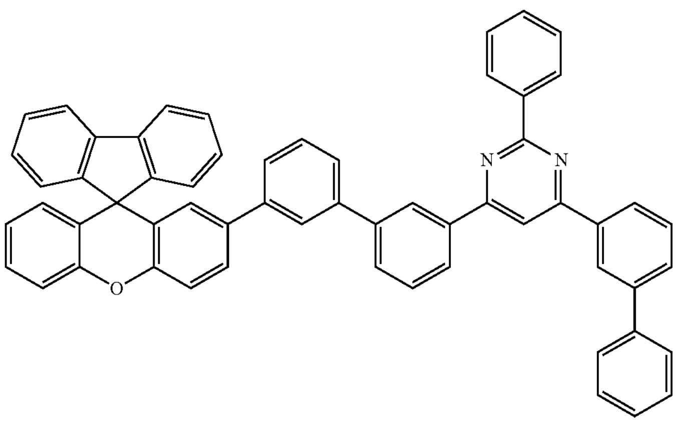
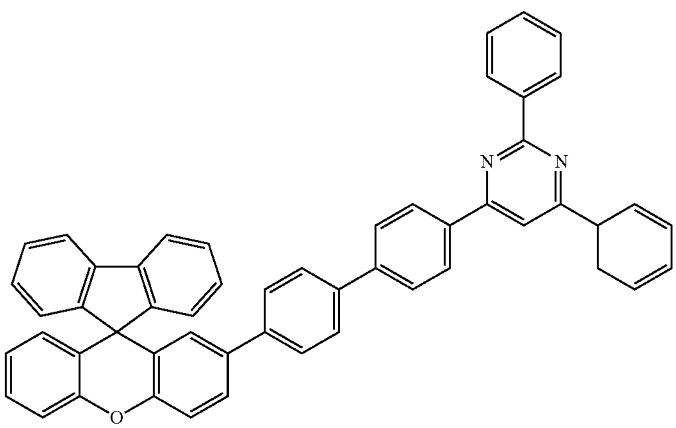
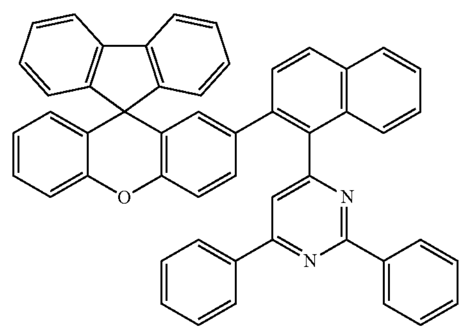
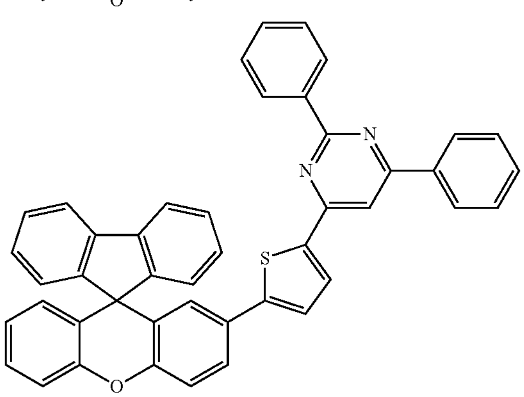
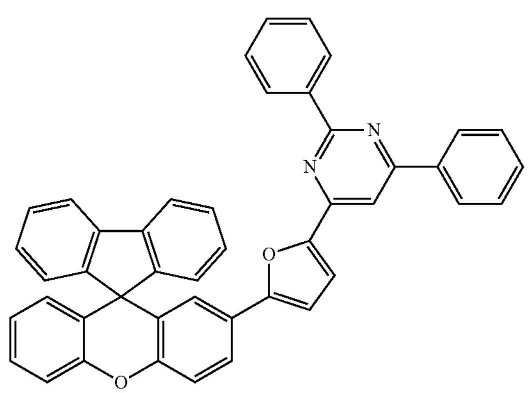

-continued
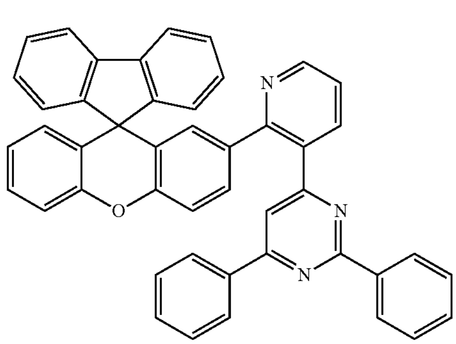
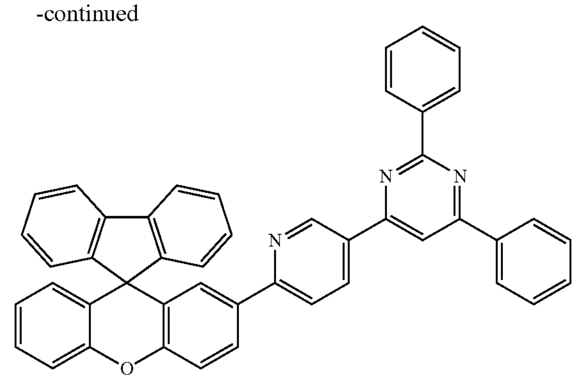
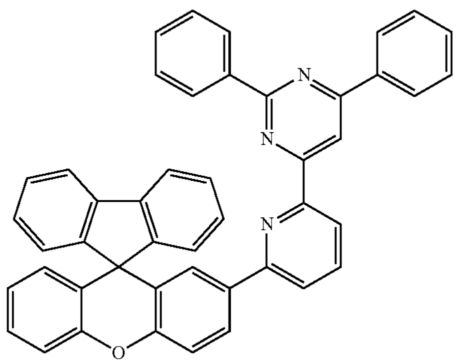
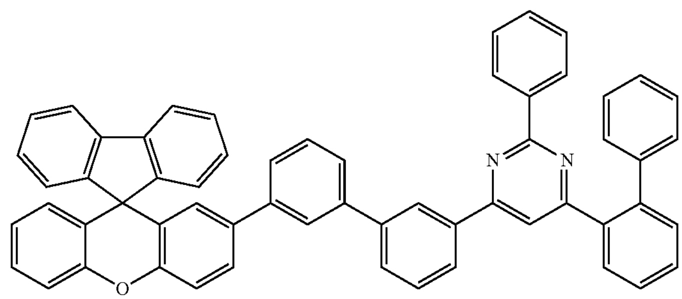
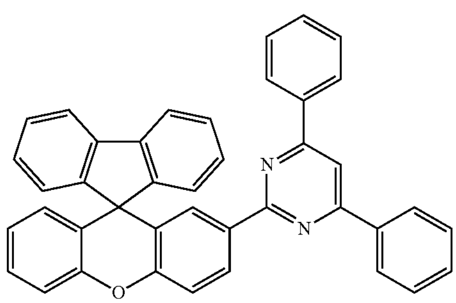
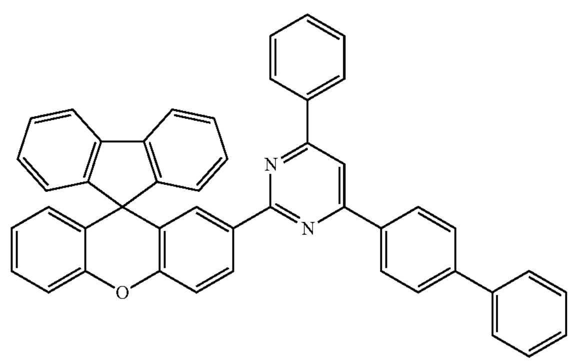
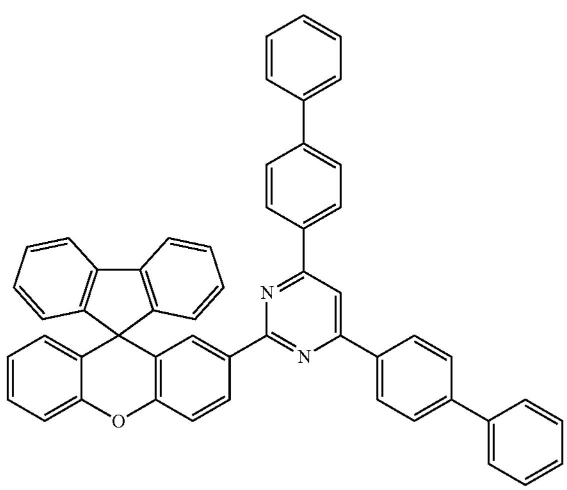
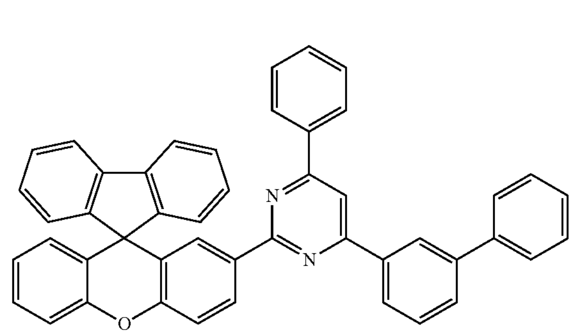

-continued
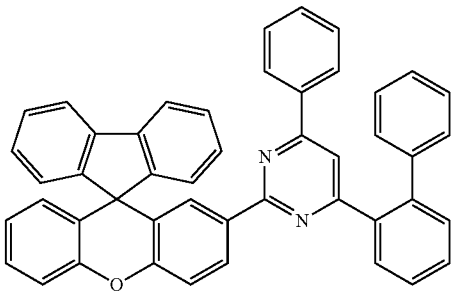
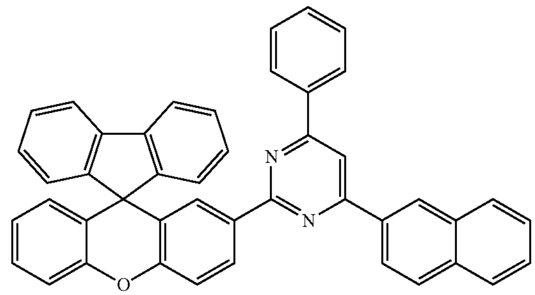
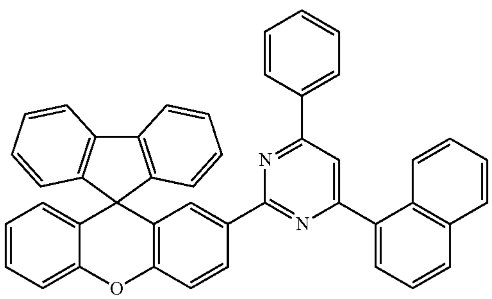
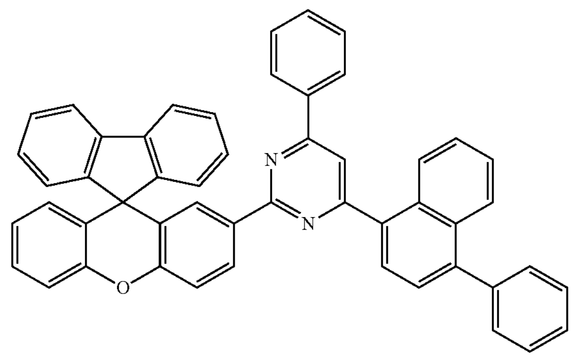
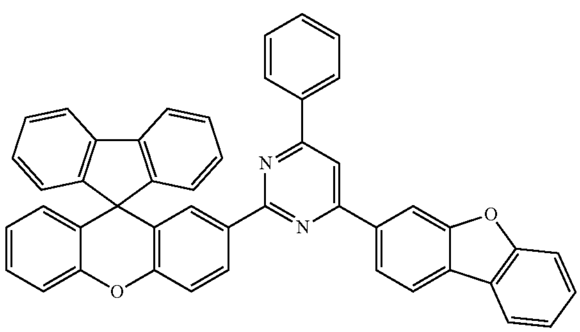
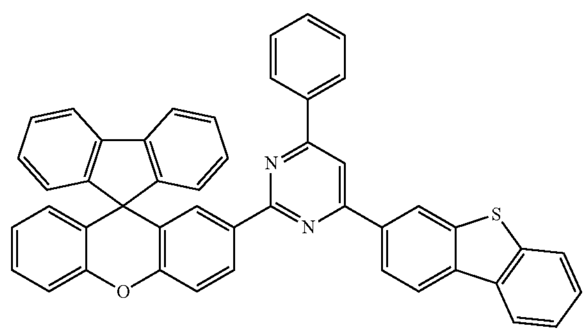
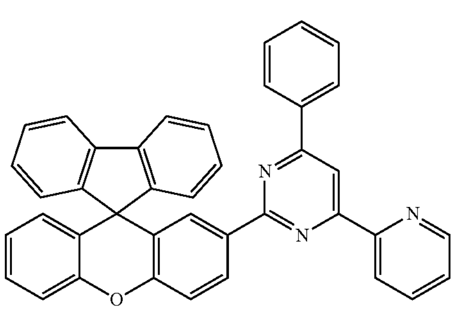
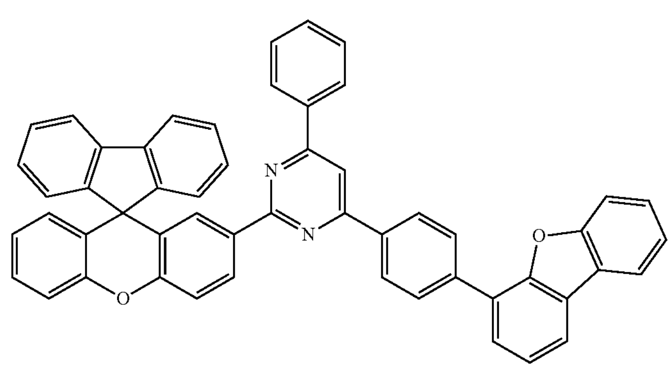

-continued
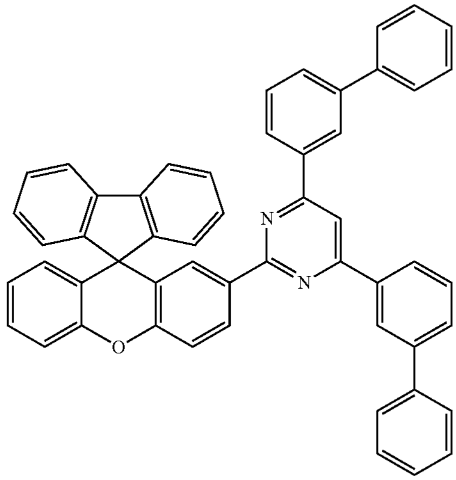
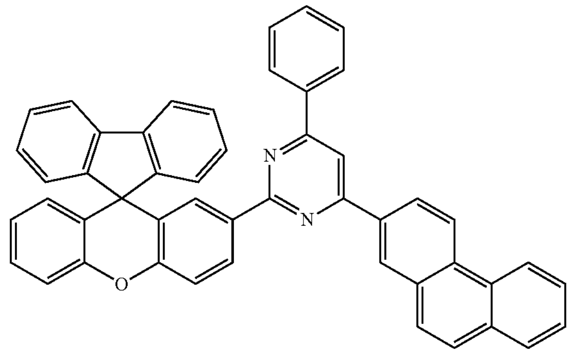
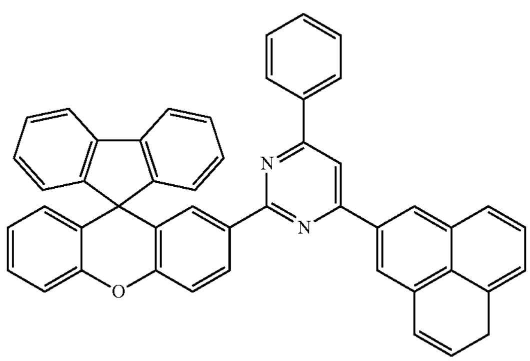
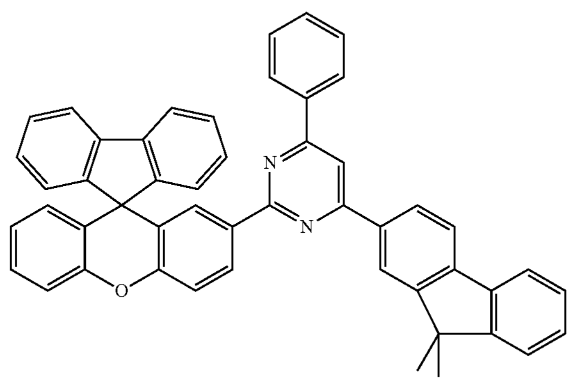
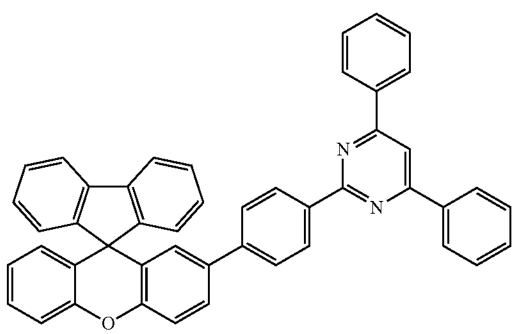
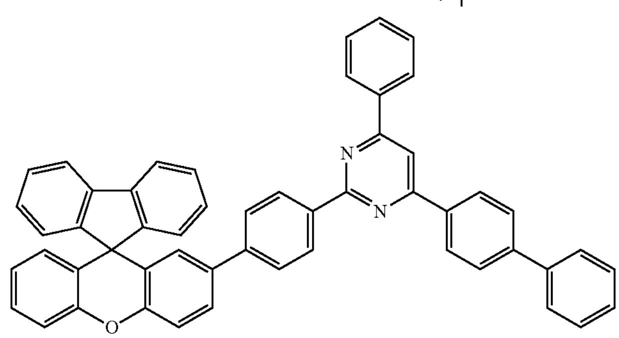
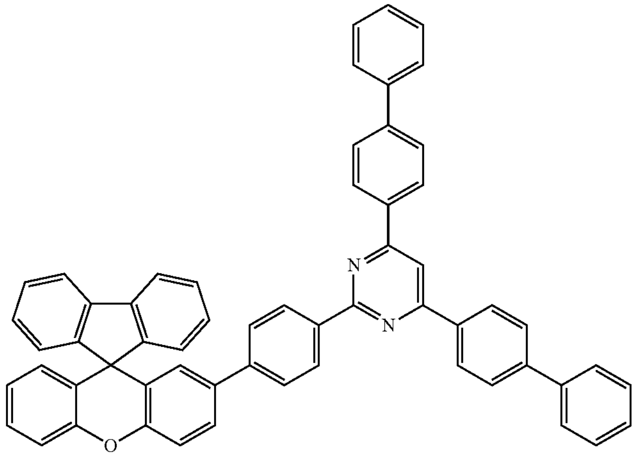
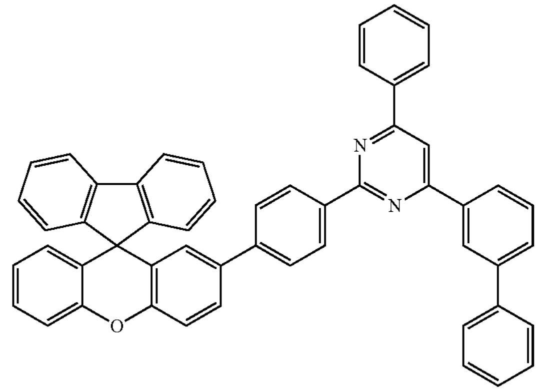

-continued
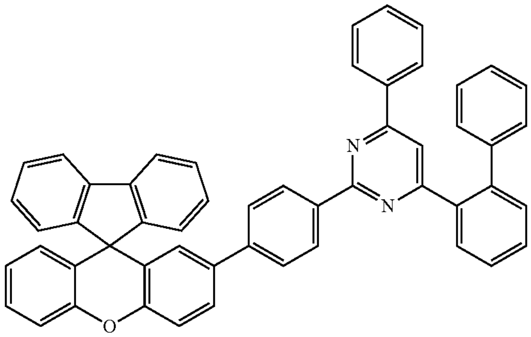
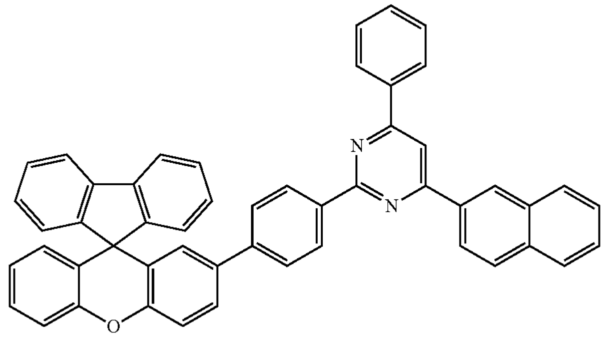
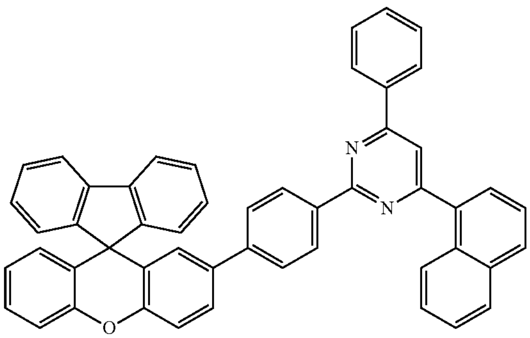
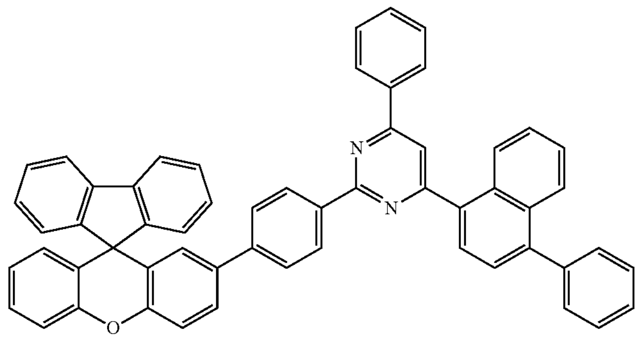
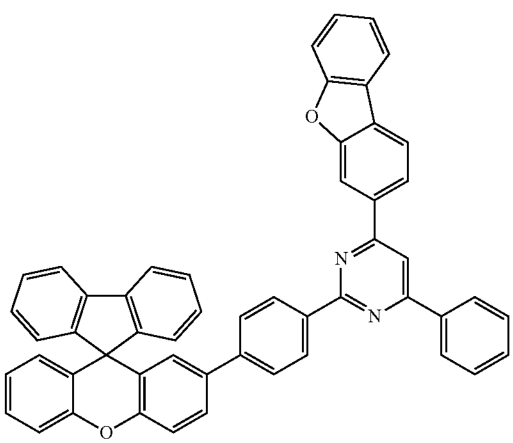
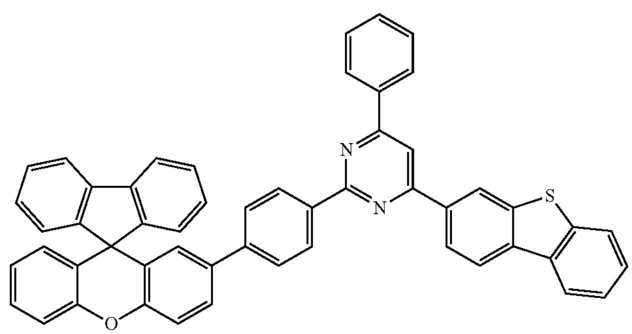
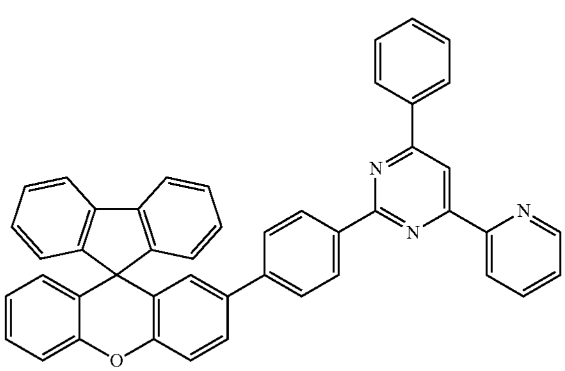

-continued
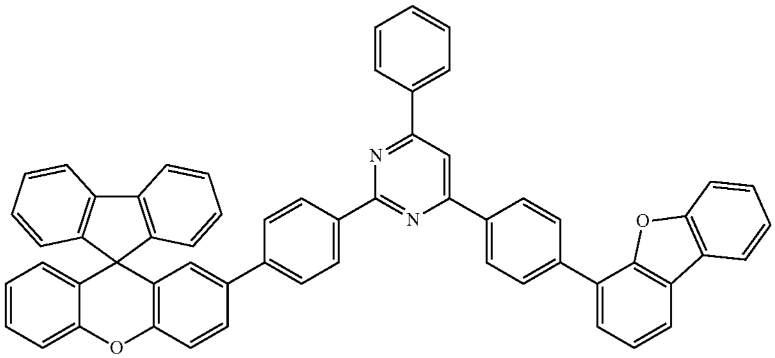
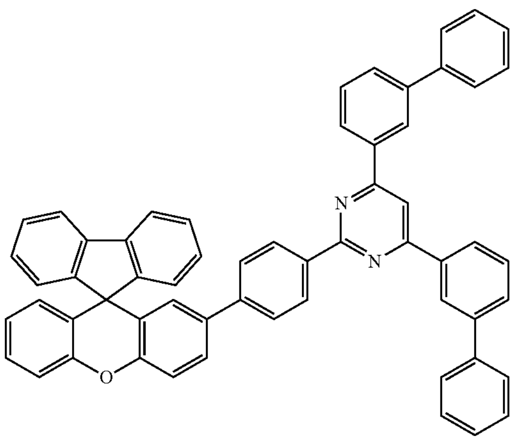
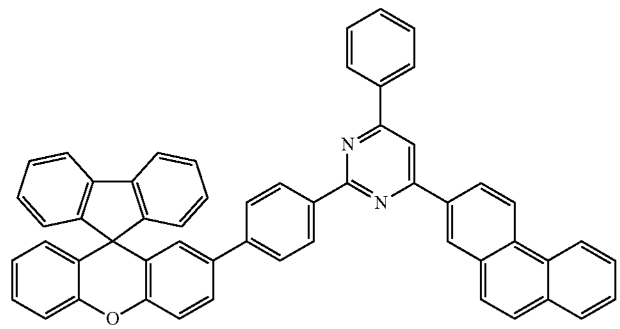
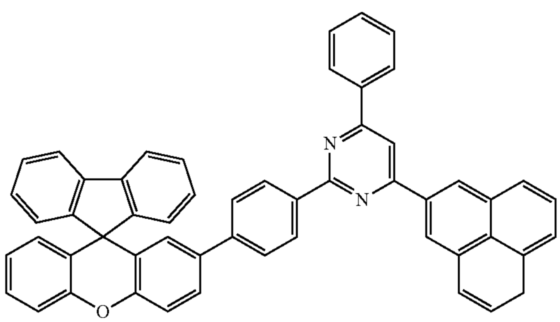
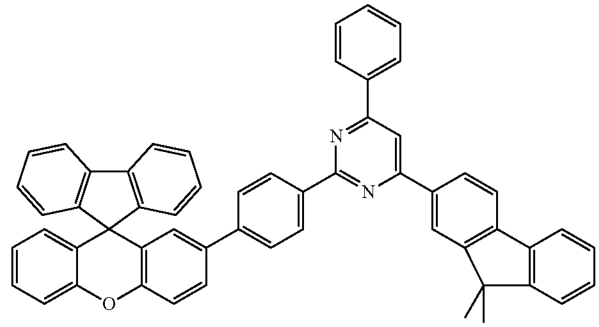
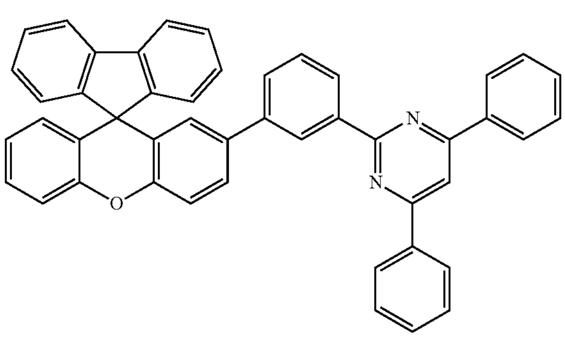
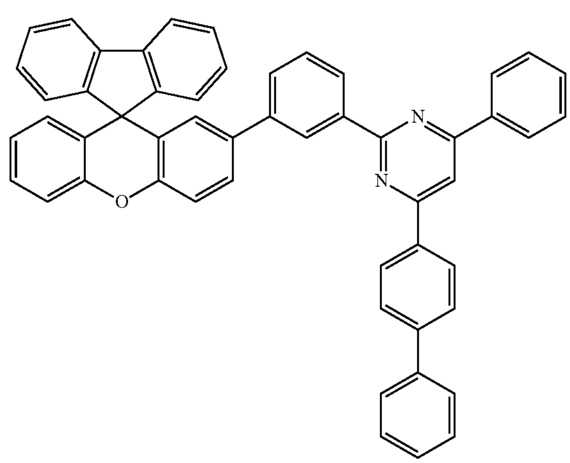

-continued
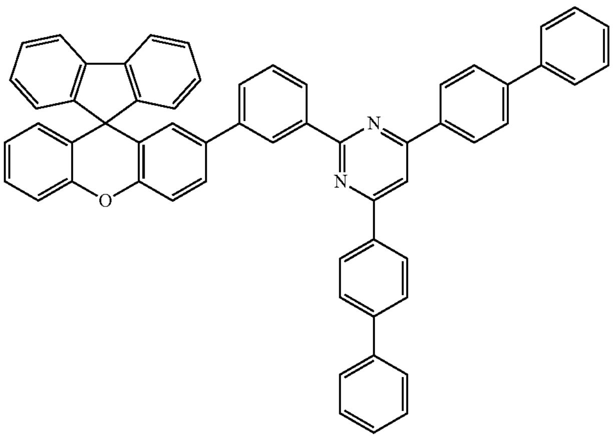
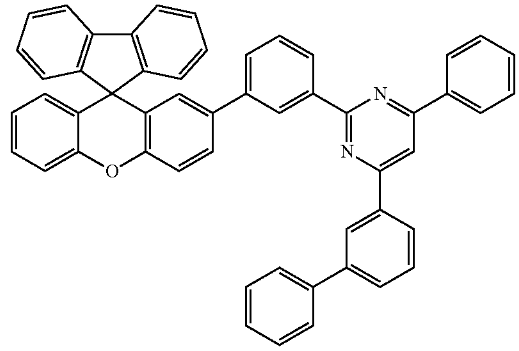
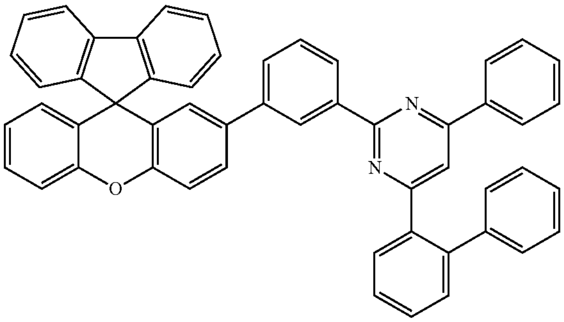
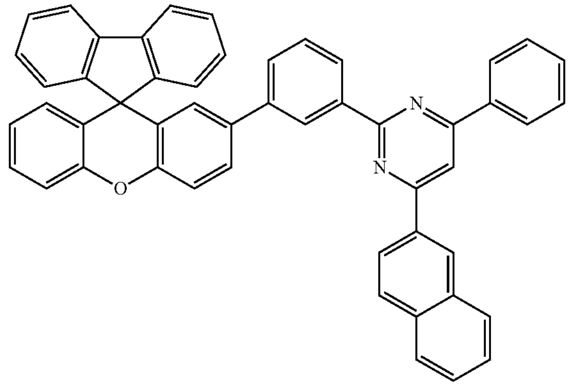
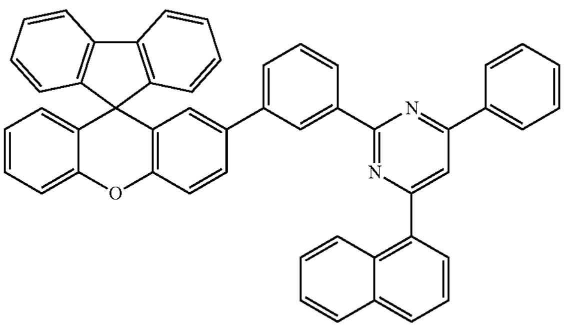
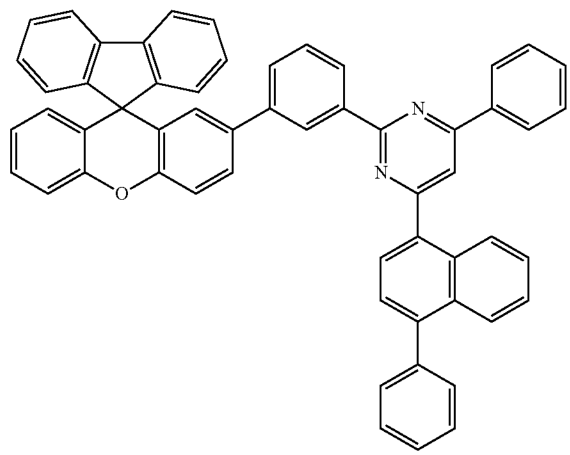
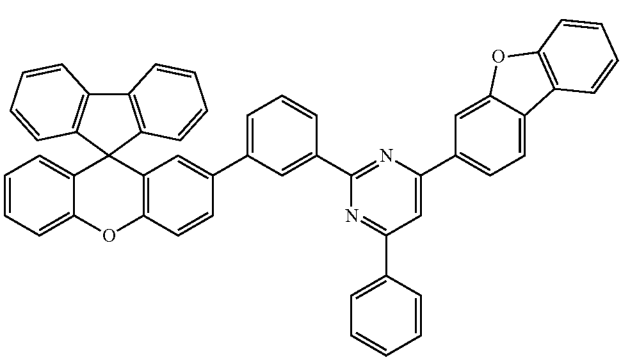
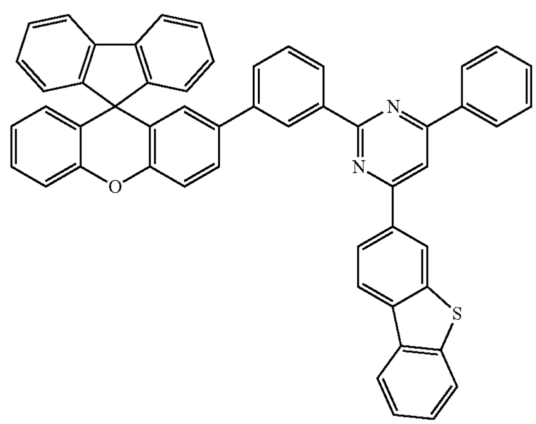

-continued
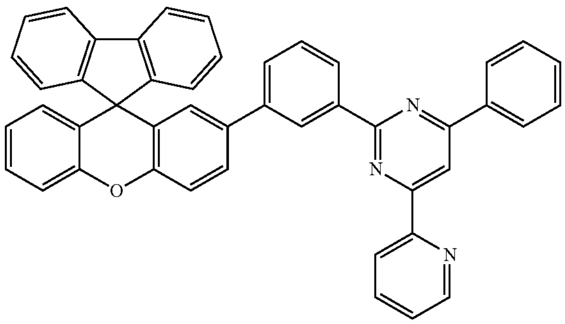
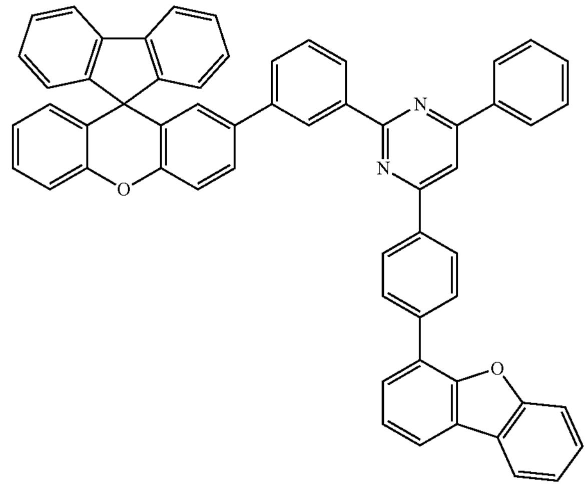
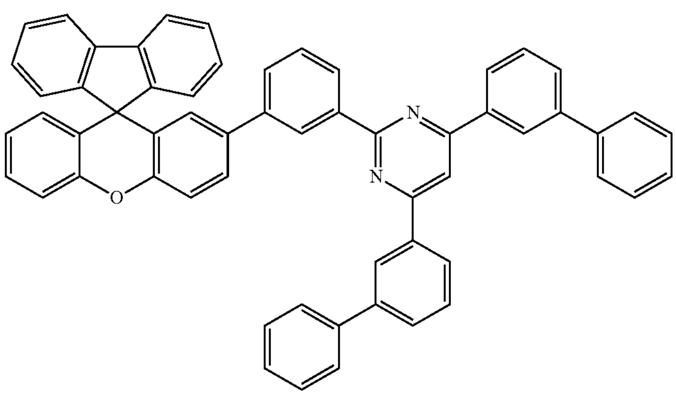
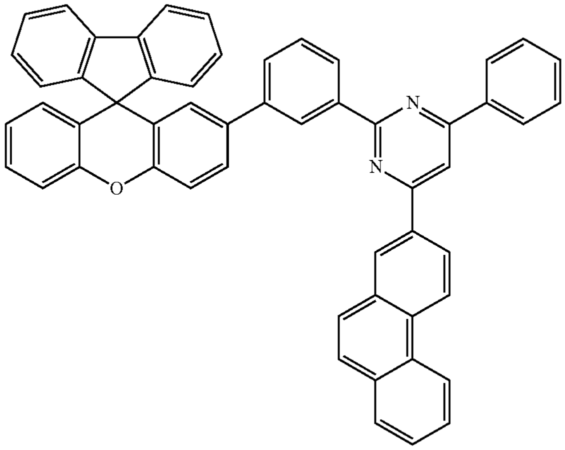
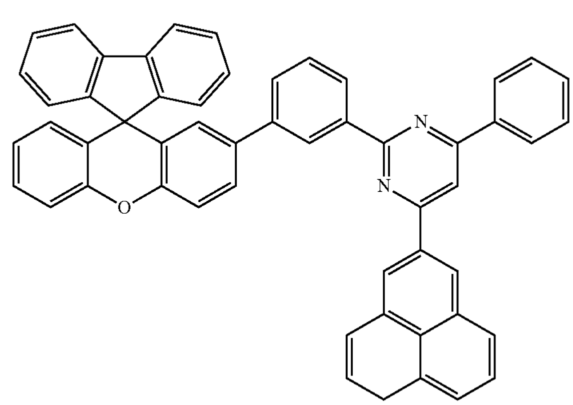

-continued
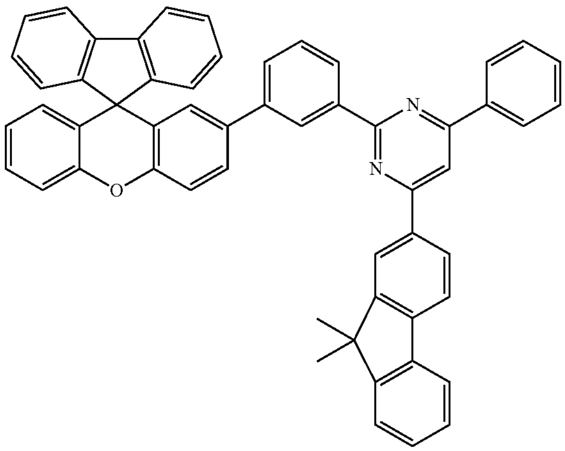
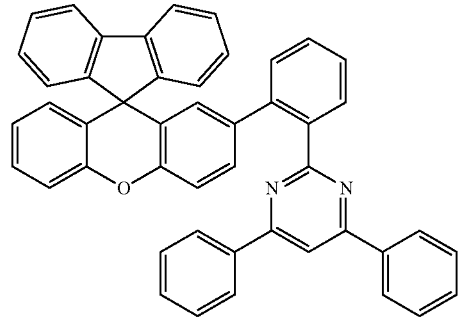
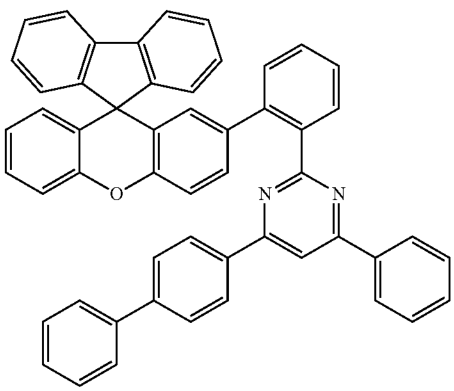
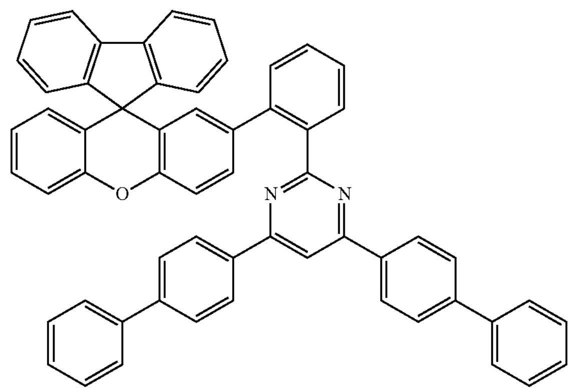
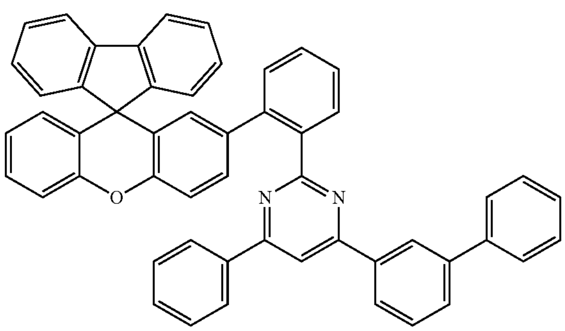
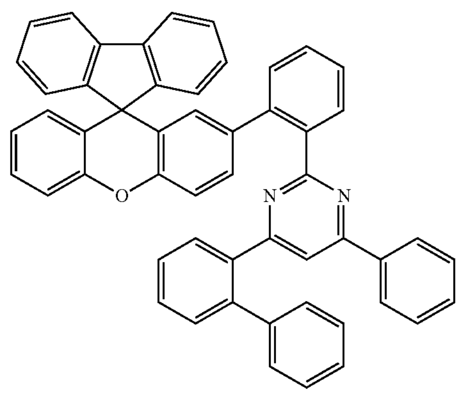
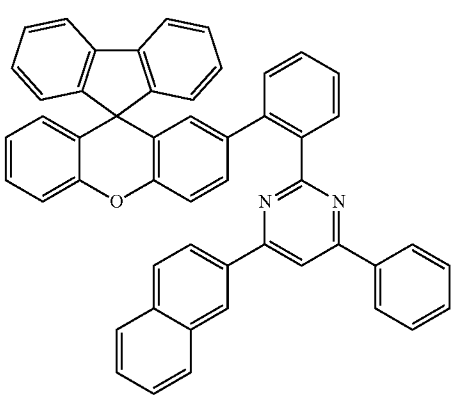
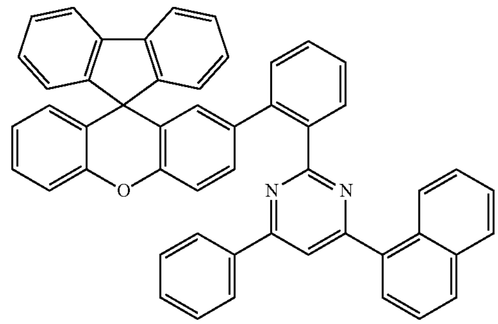

-continued
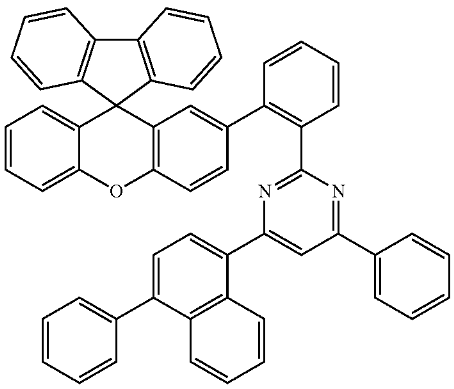
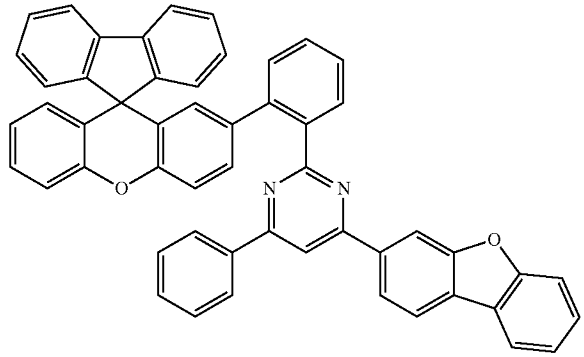
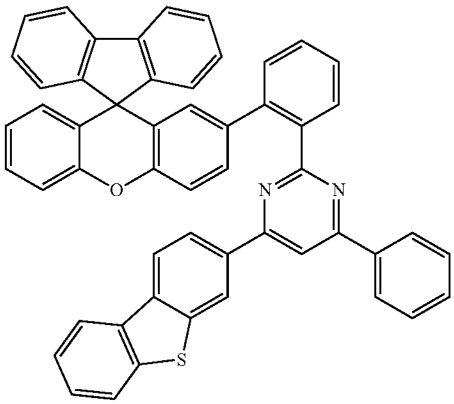
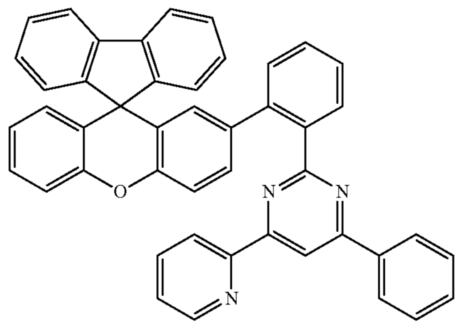
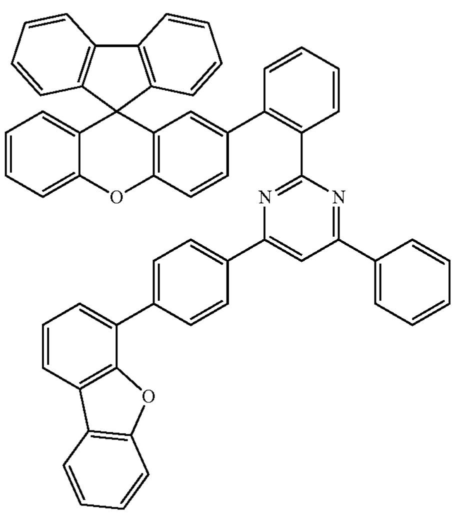
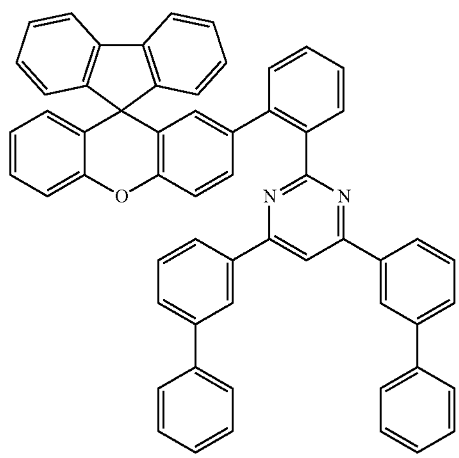
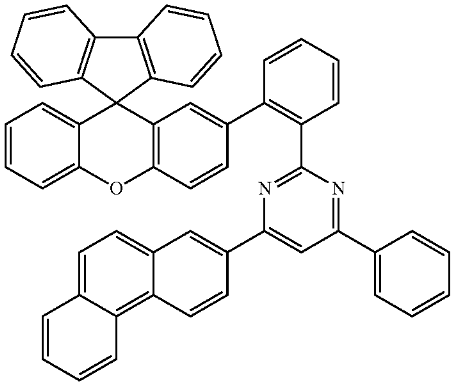
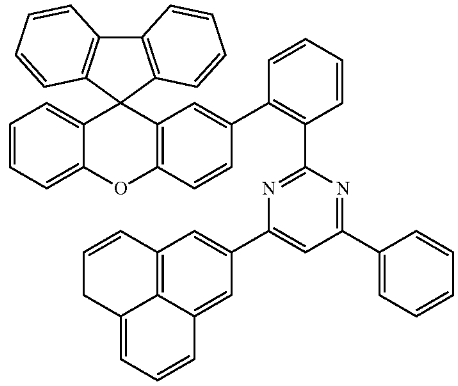

-continued
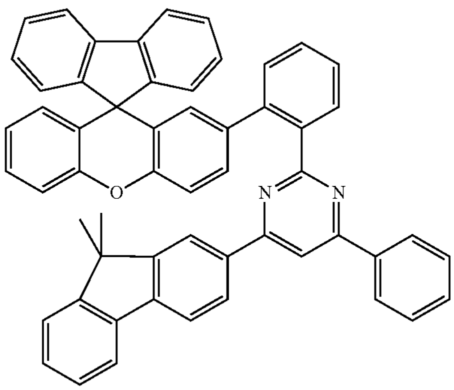
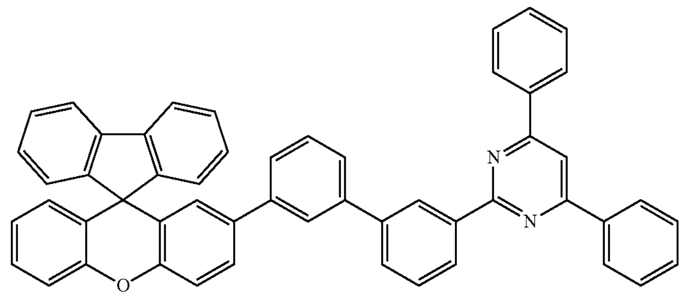
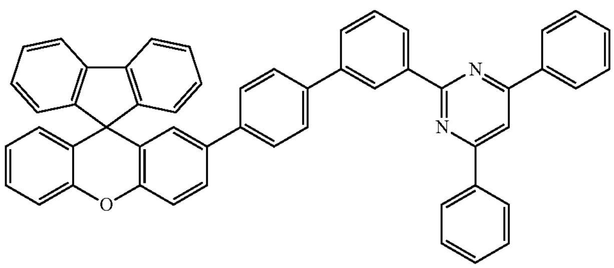
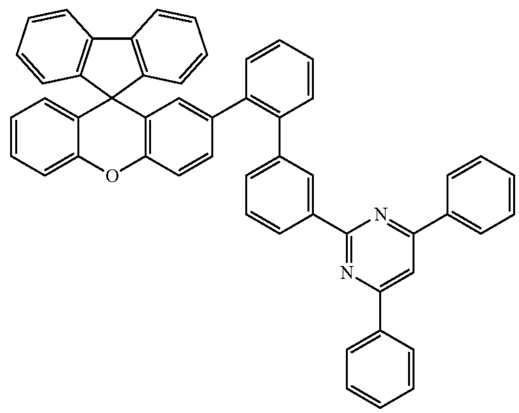
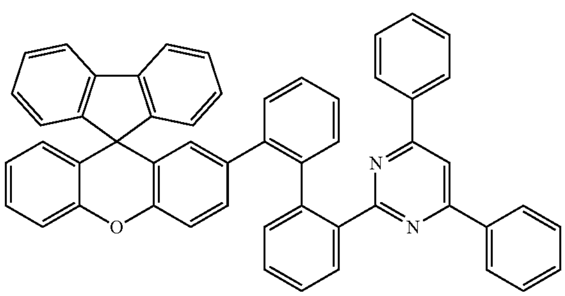
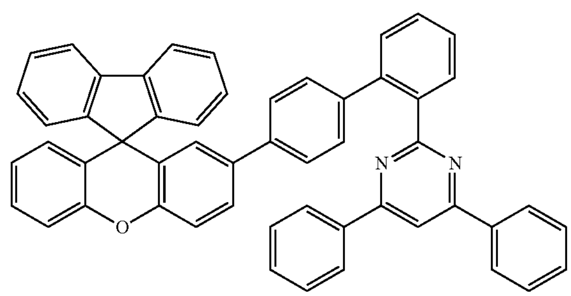
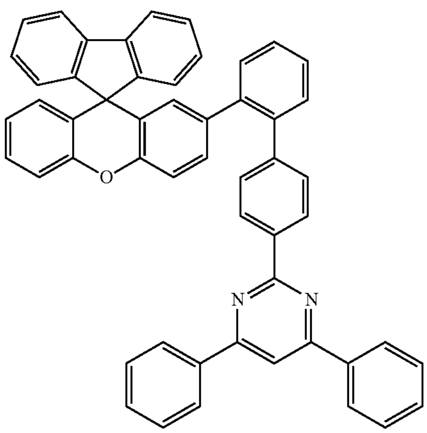 [SMILES: c1ccc(-c2cc(-c3ccccc3)nc(-c3ccc(-c4ccccc4-c4ccc5c(c4)C4(c6ccccc6O5)c5ccccc5-c5ccccc54)cc3)n2)cc1]

-continued
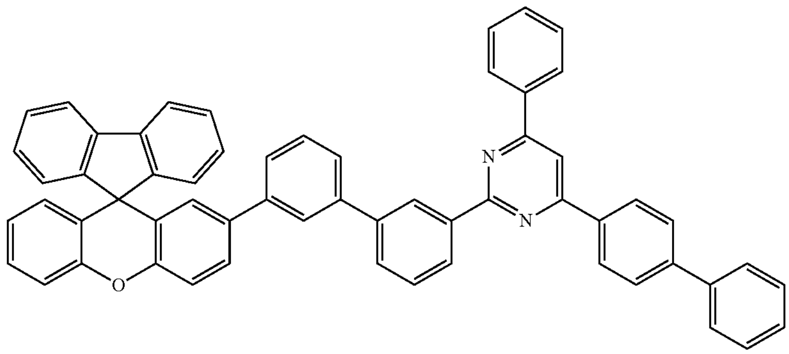
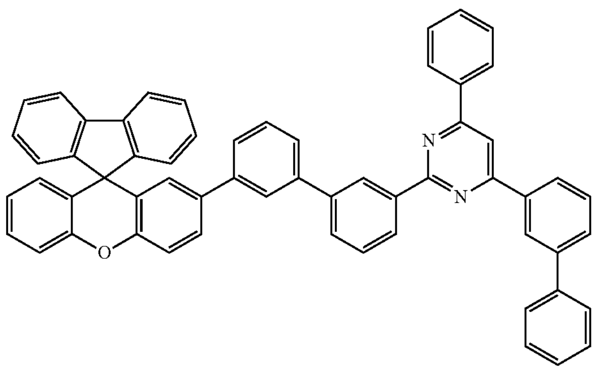
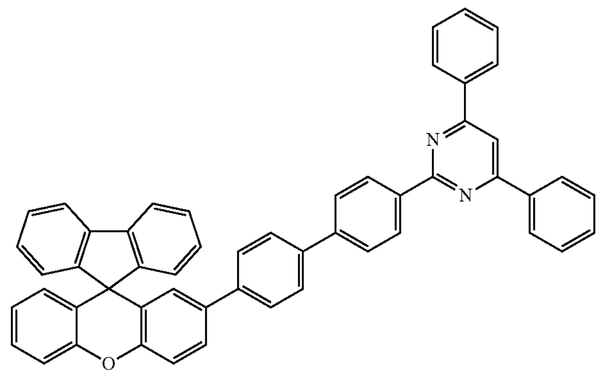
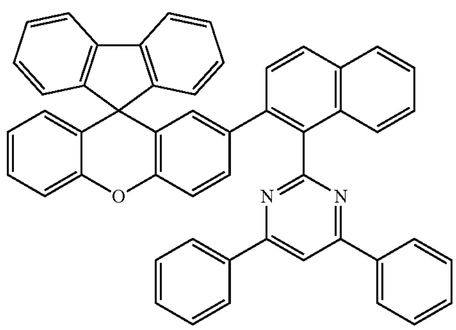
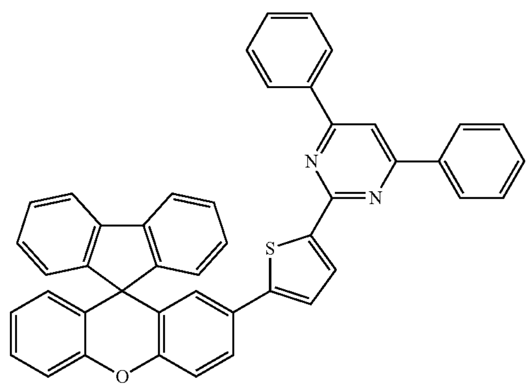
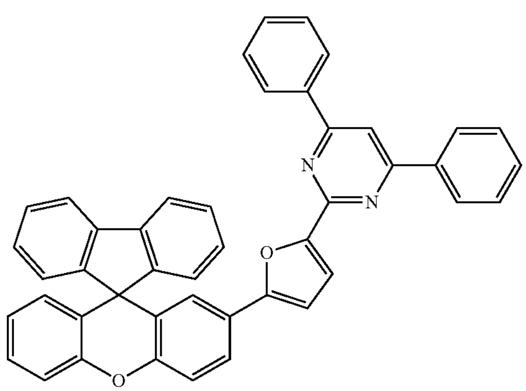
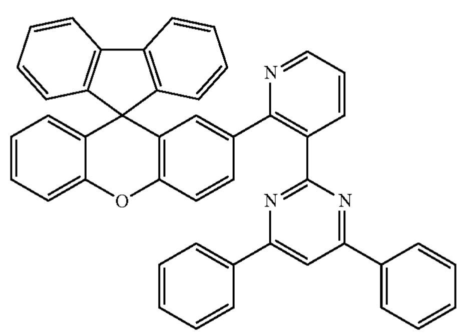

-continued
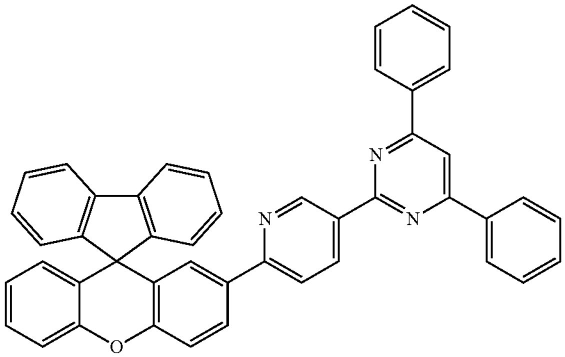
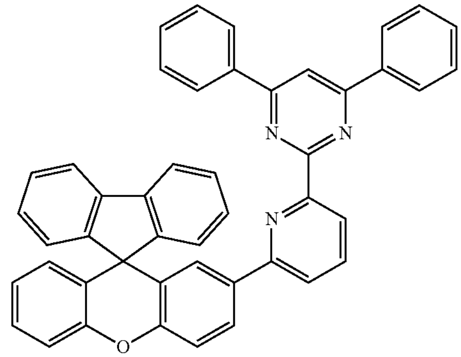
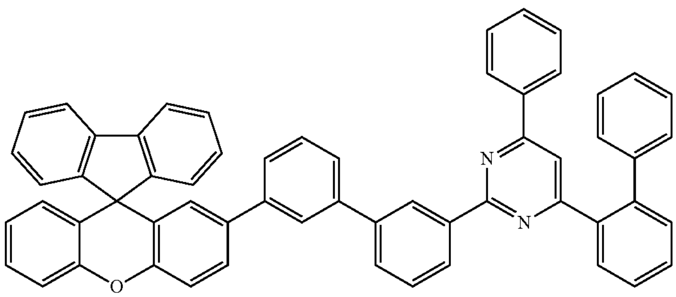
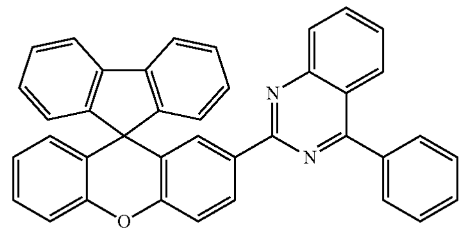
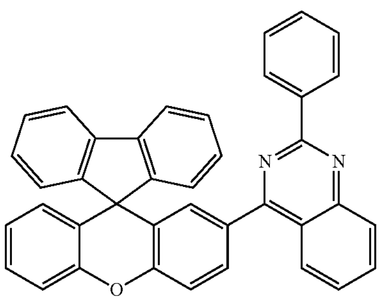
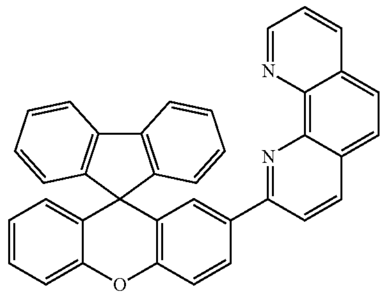
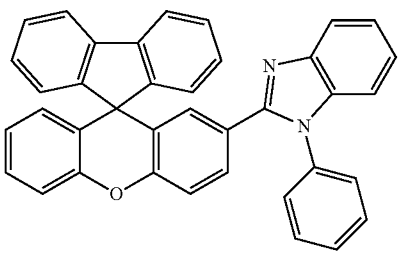
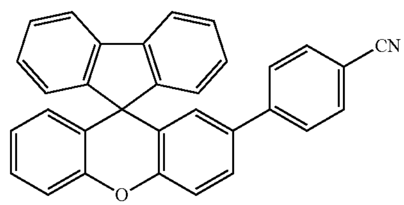
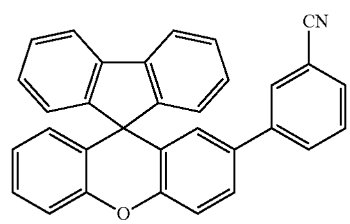
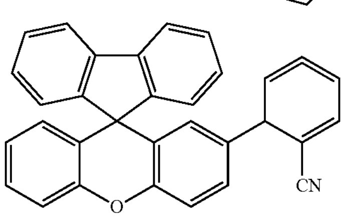
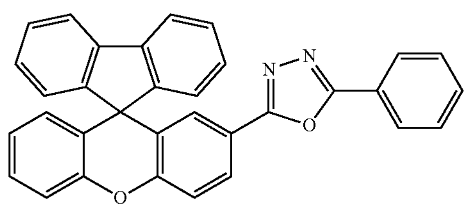
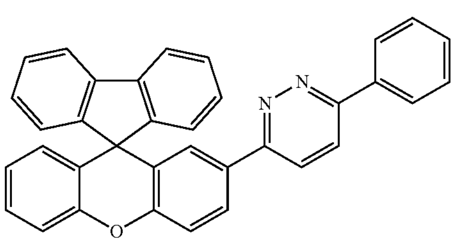
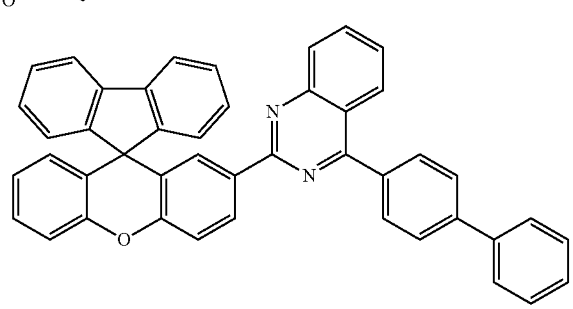

-continued
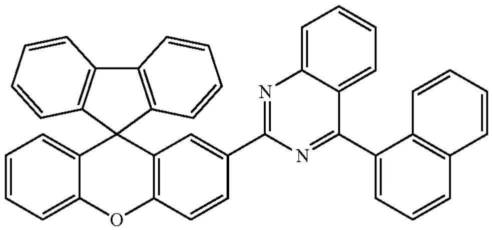
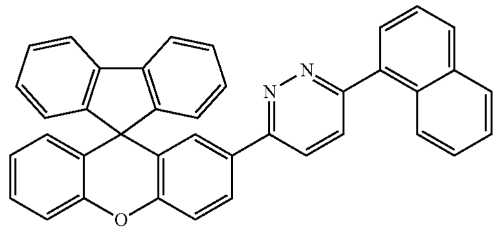
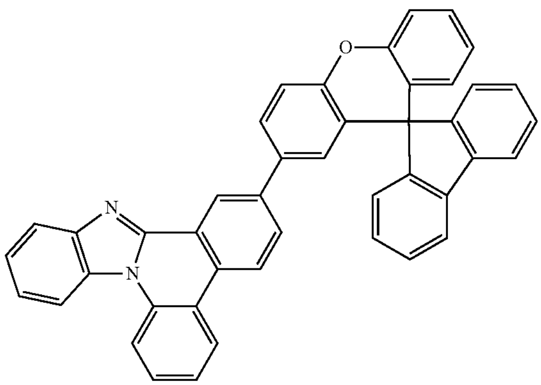
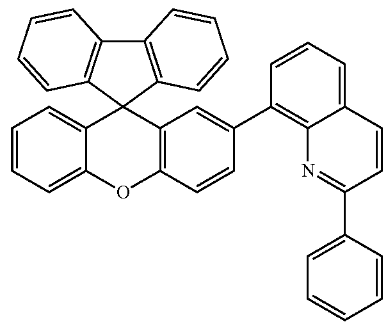
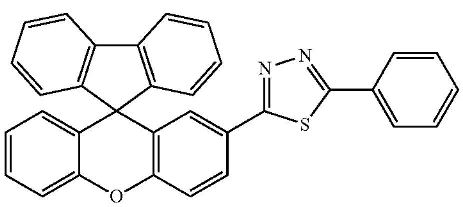
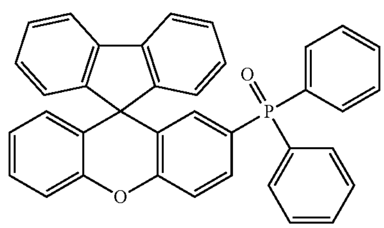
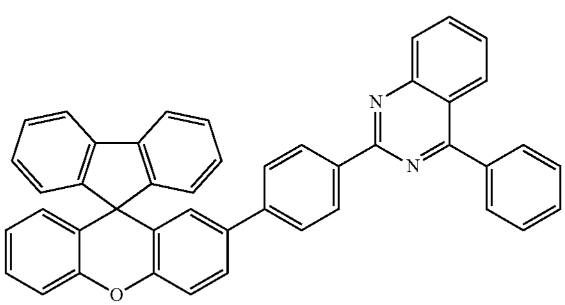
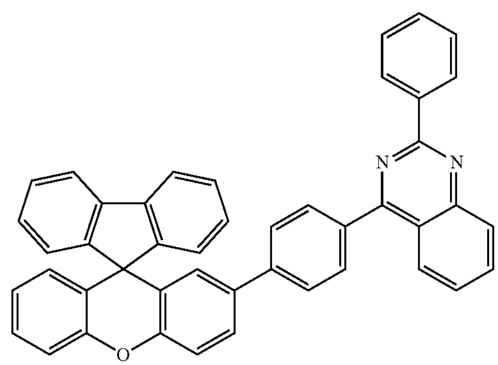
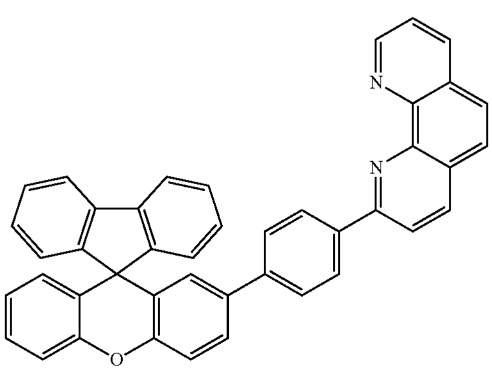
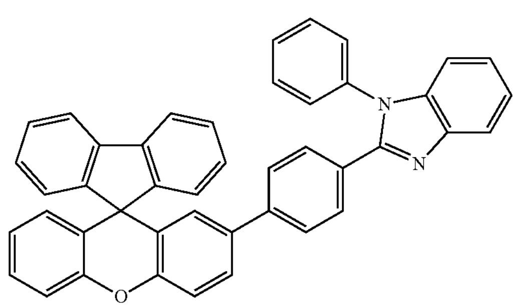

-continued
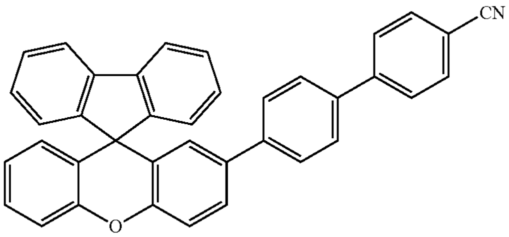
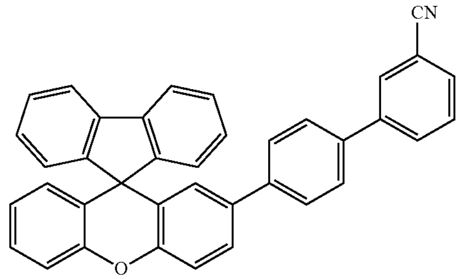
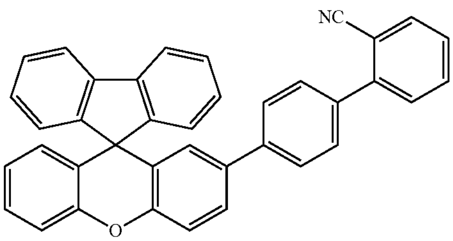
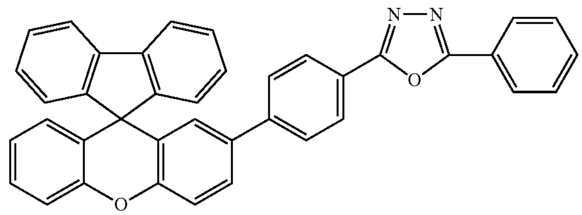
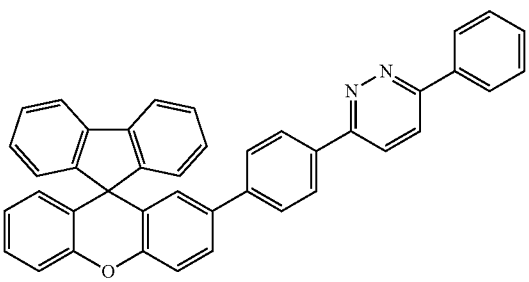
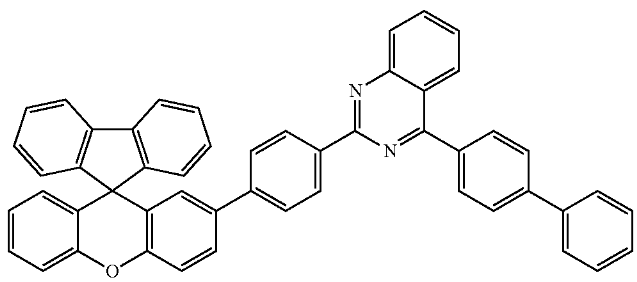
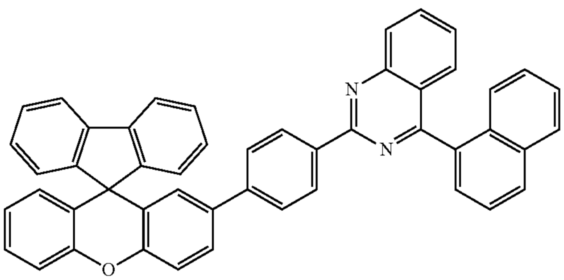
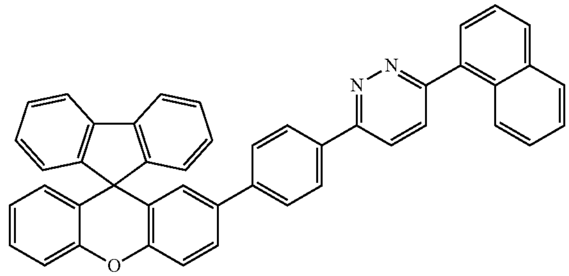
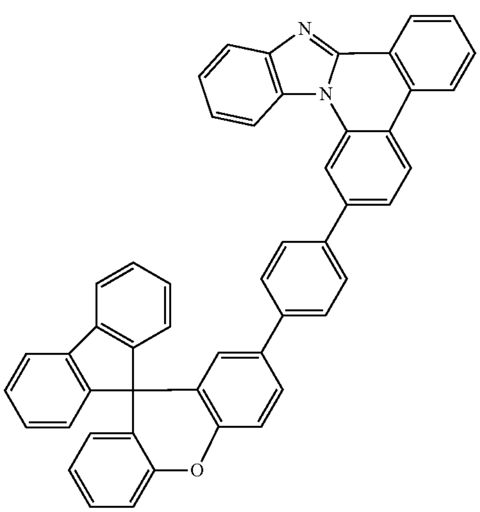
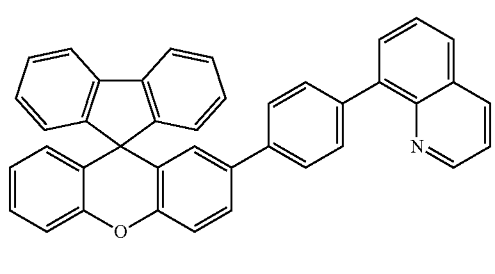

-continued
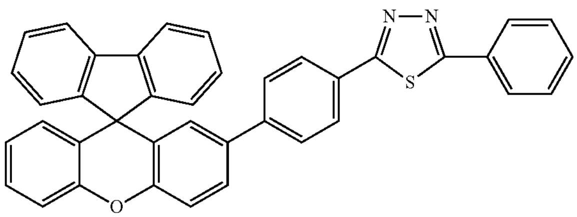
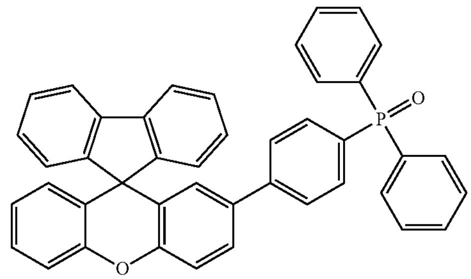
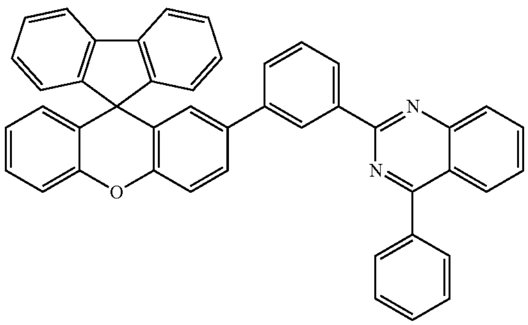
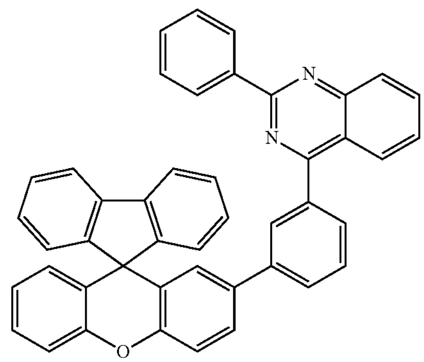
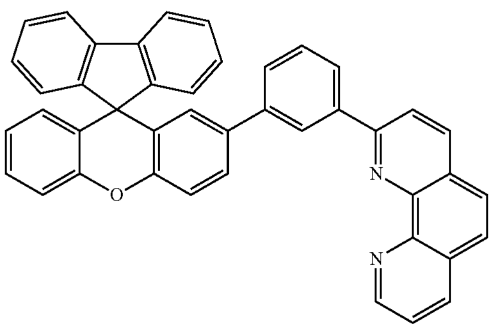
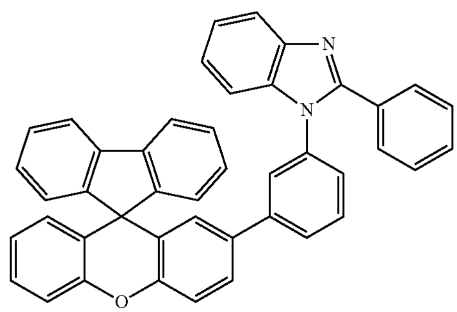
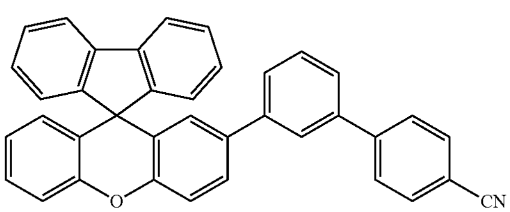
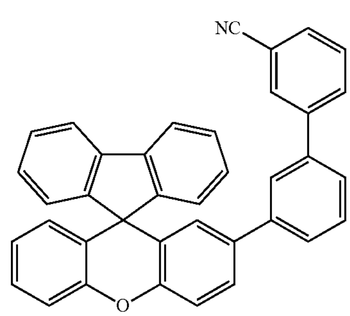
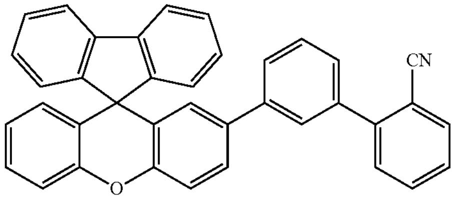
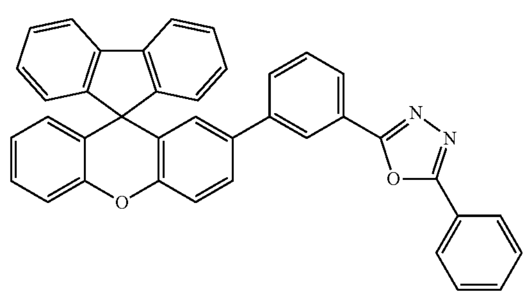

-continued
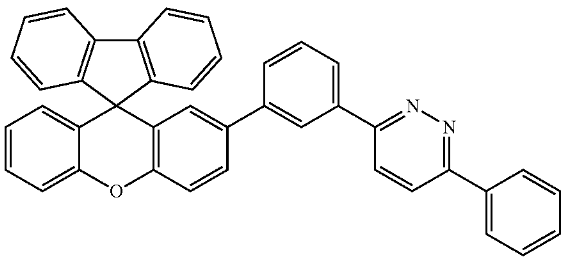
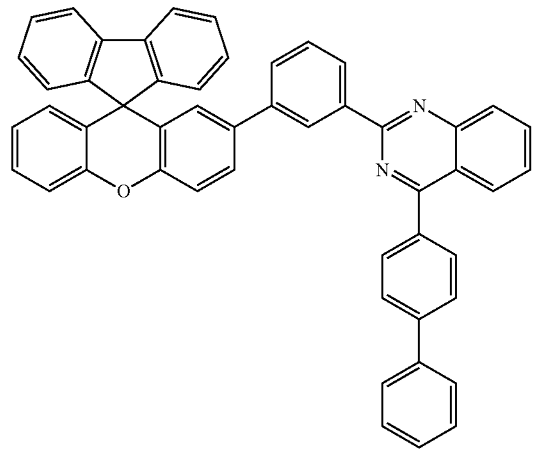
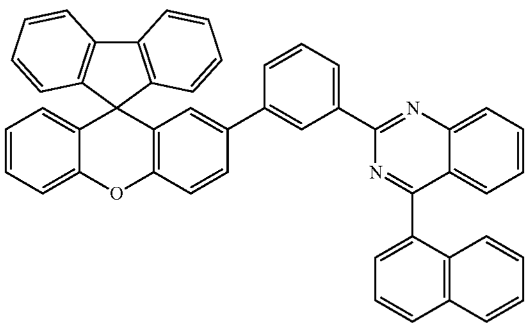
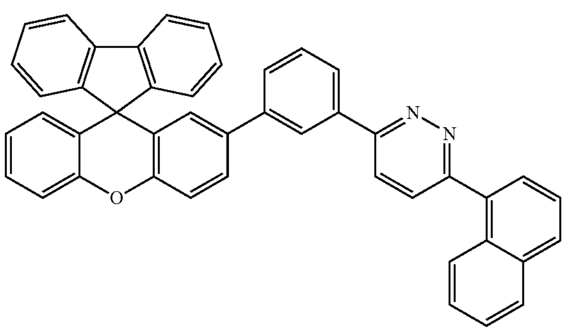
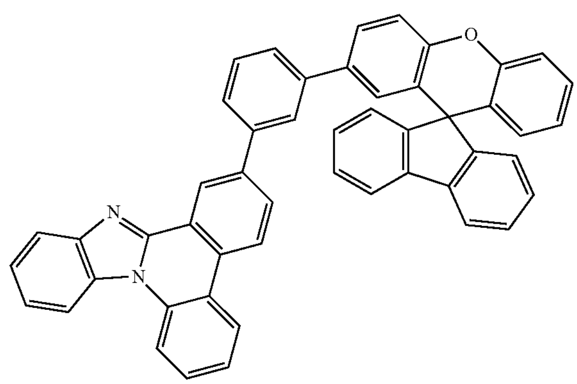
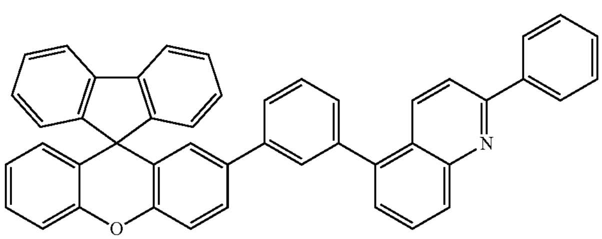
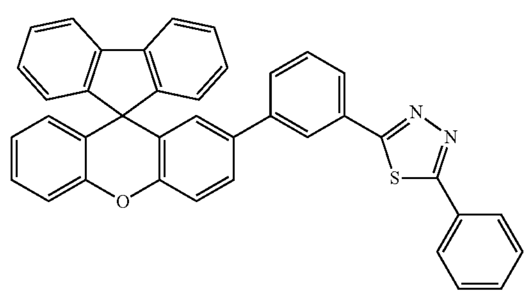

-continued
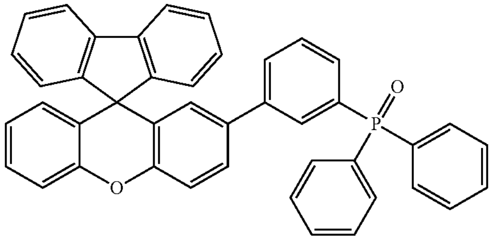
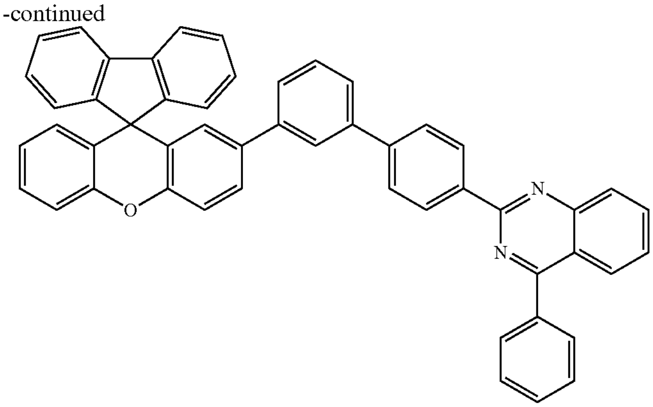
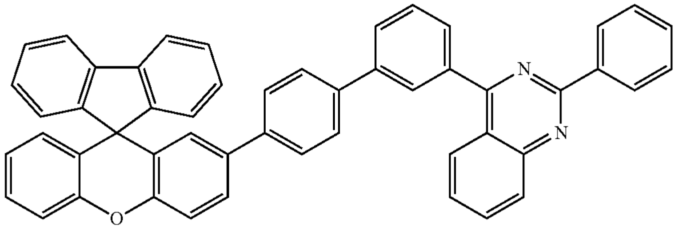
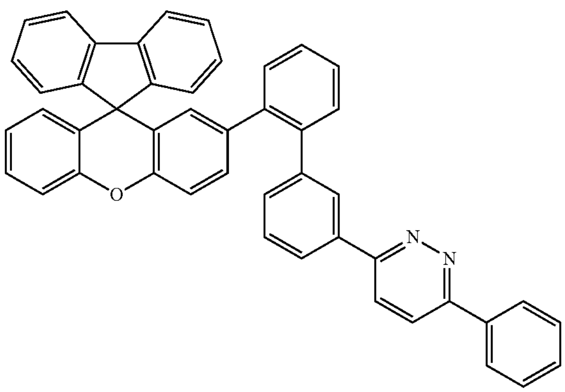
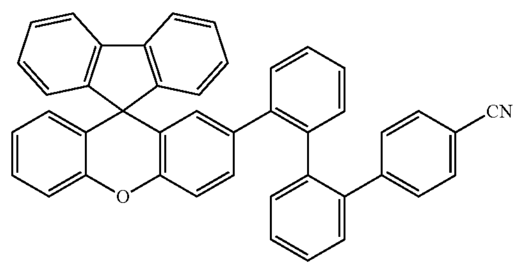
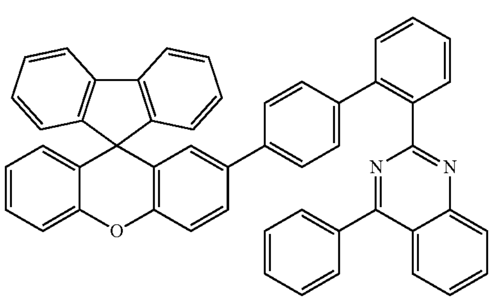
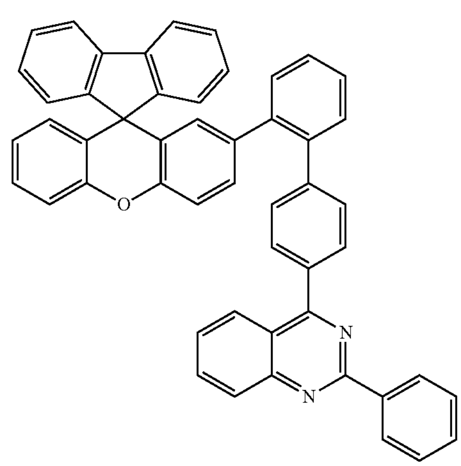

-continued
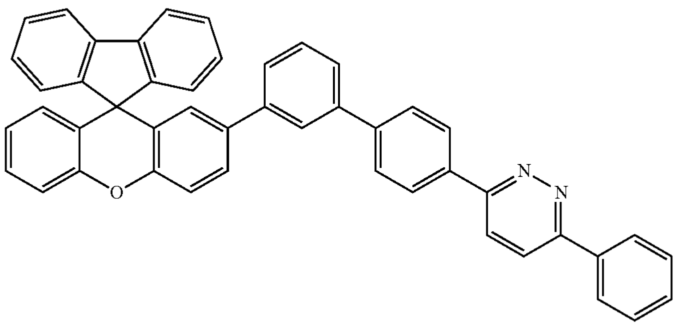
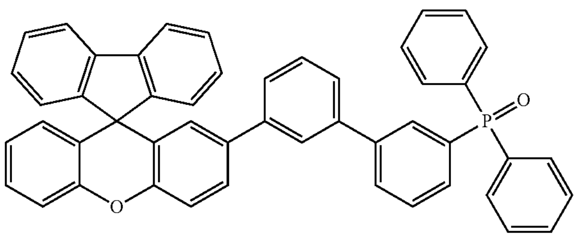
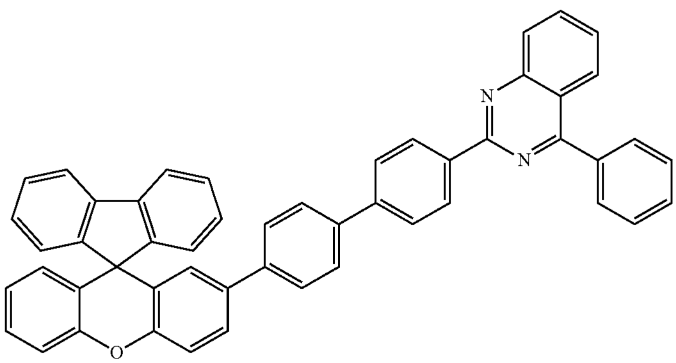
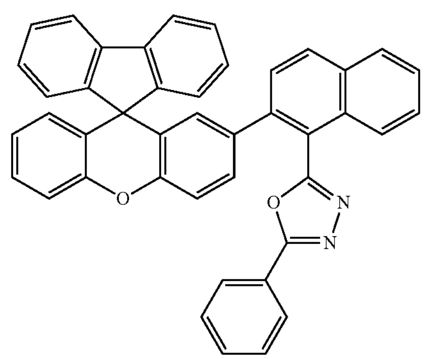
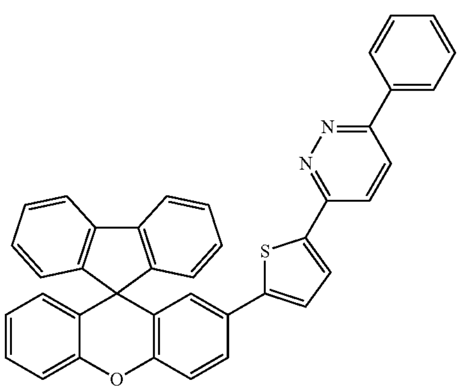
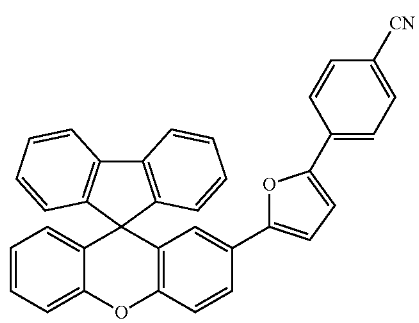
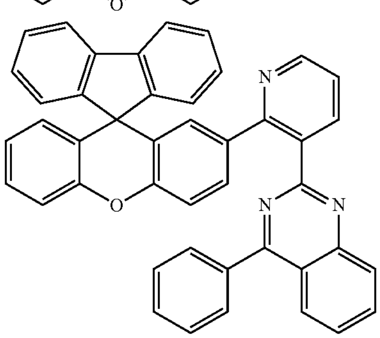
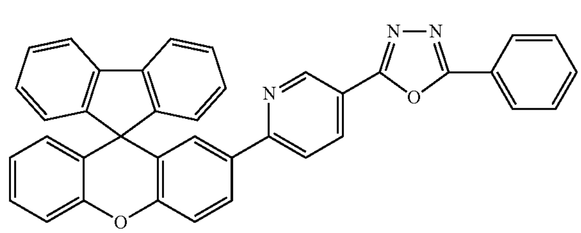

-continued
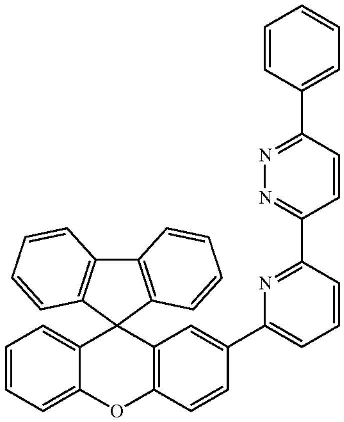
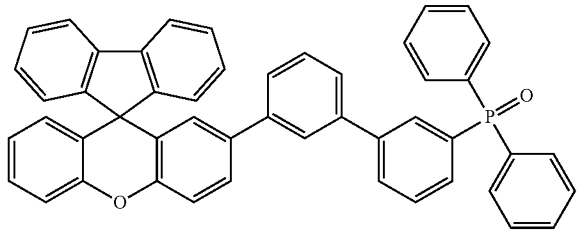
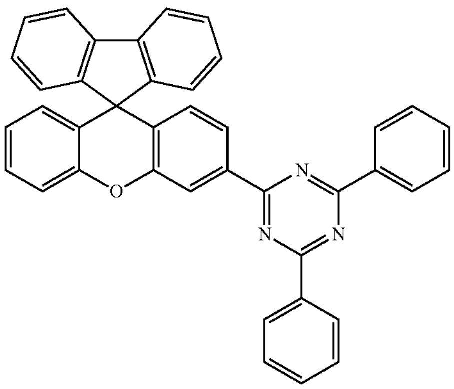
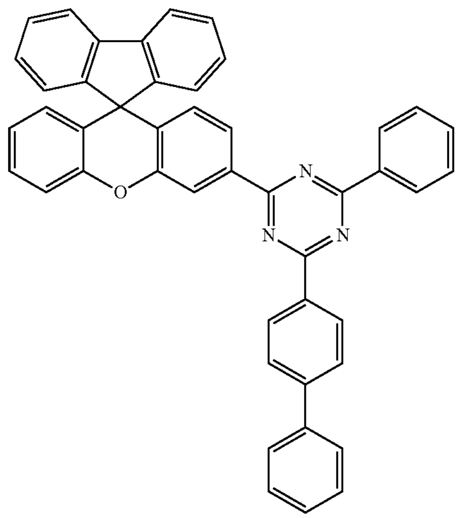
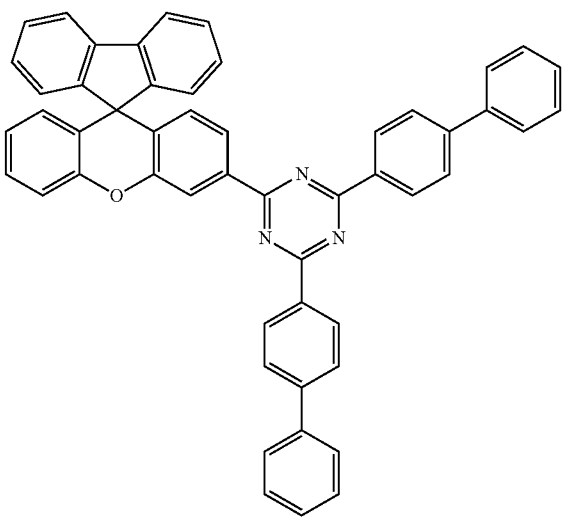
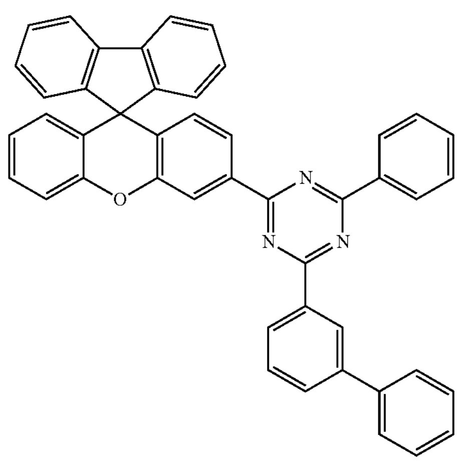

-continued
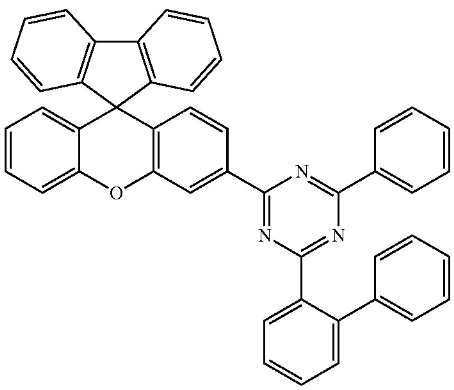
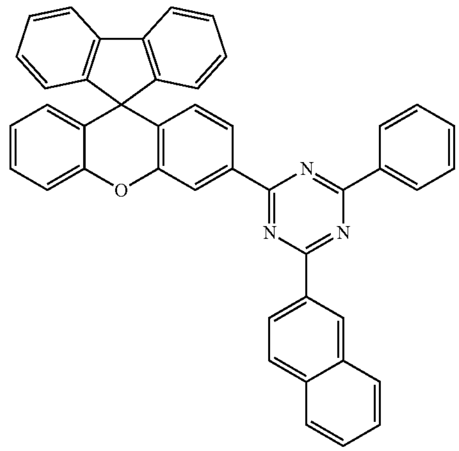
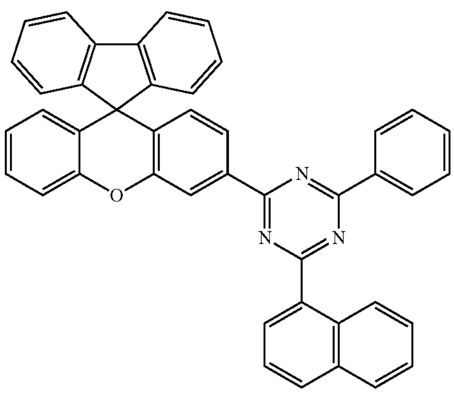
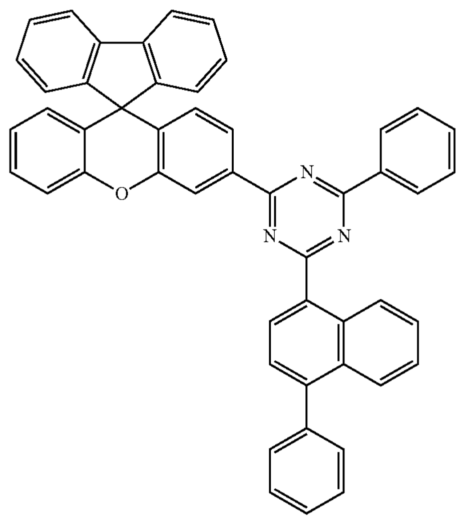
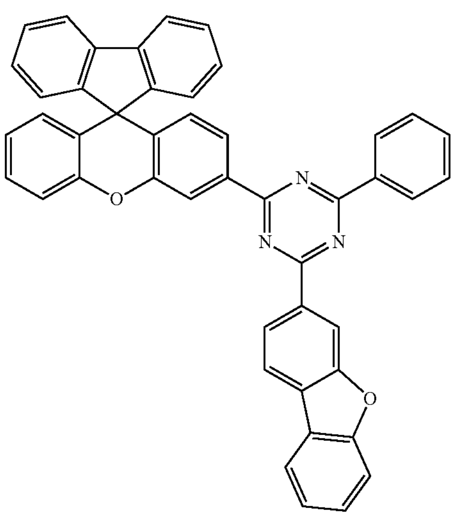
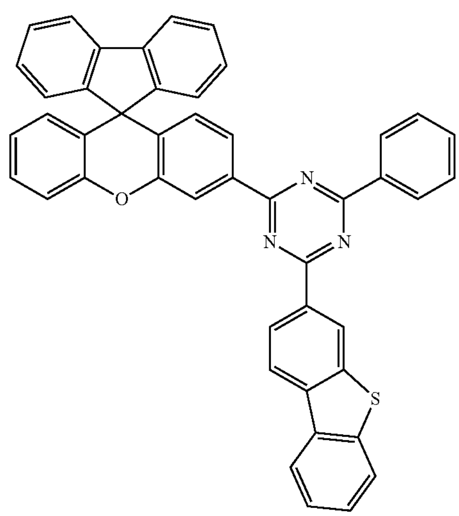

-continued
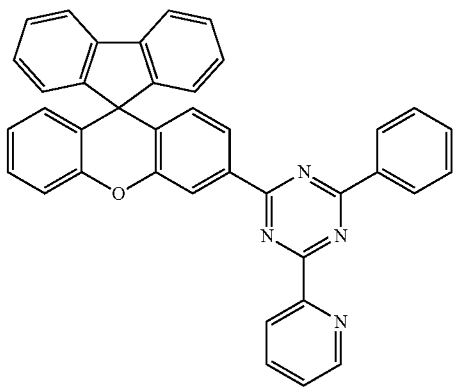
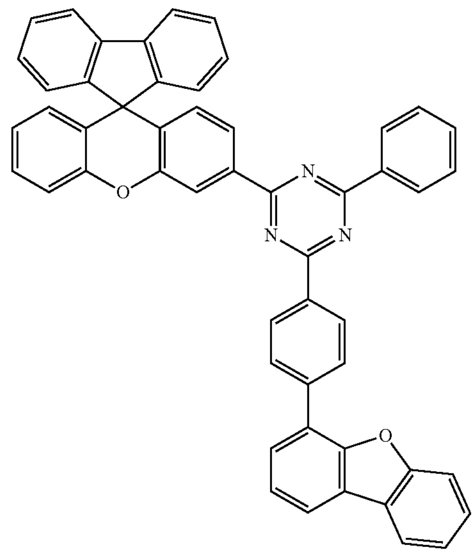
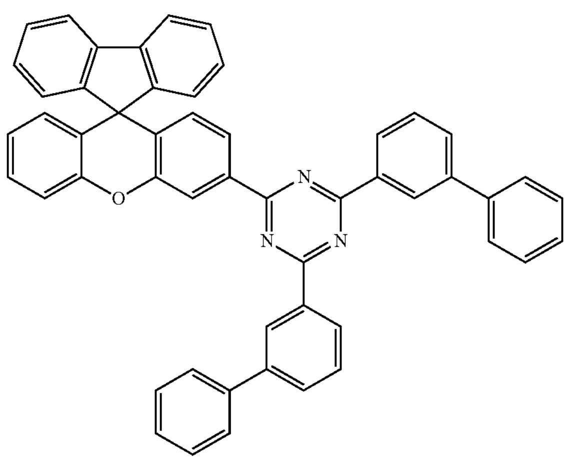
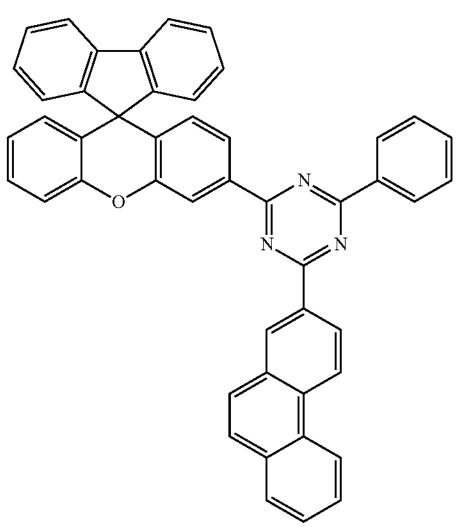
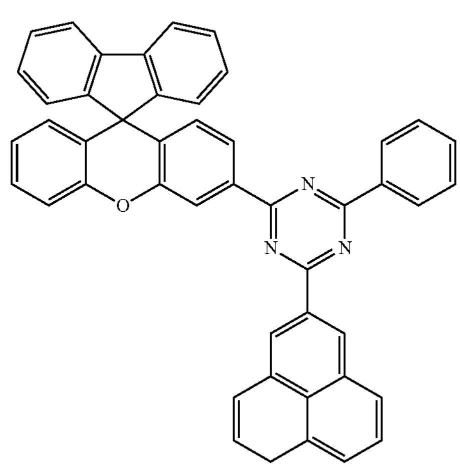

-continued
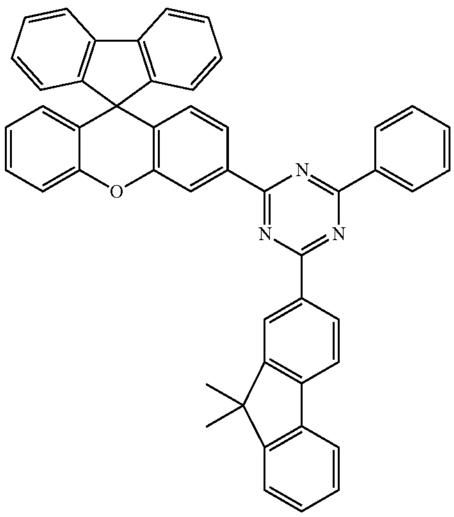
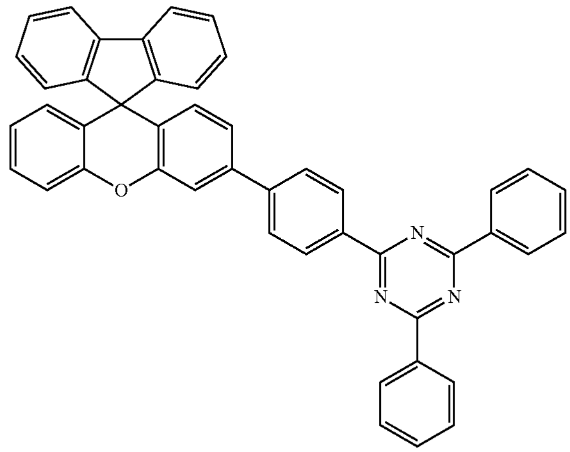
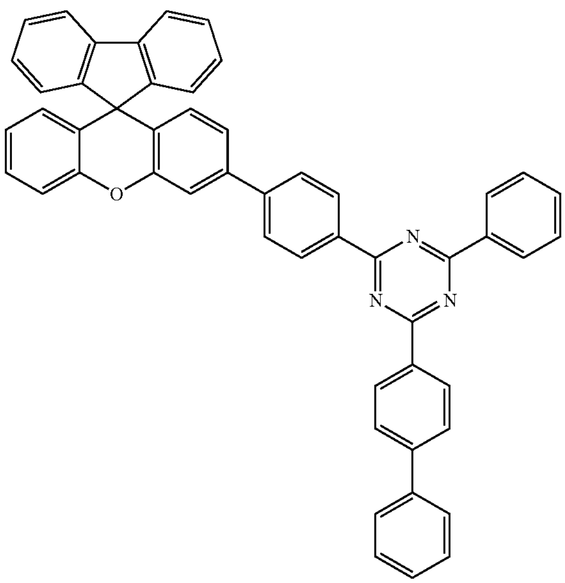
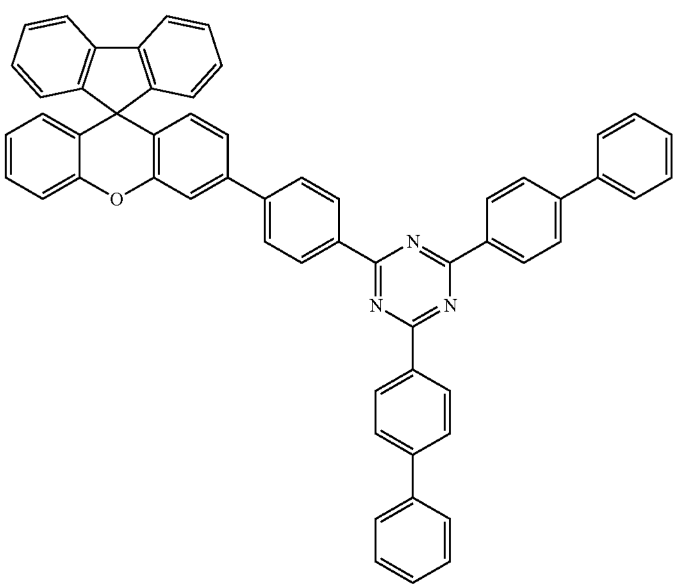

-continued
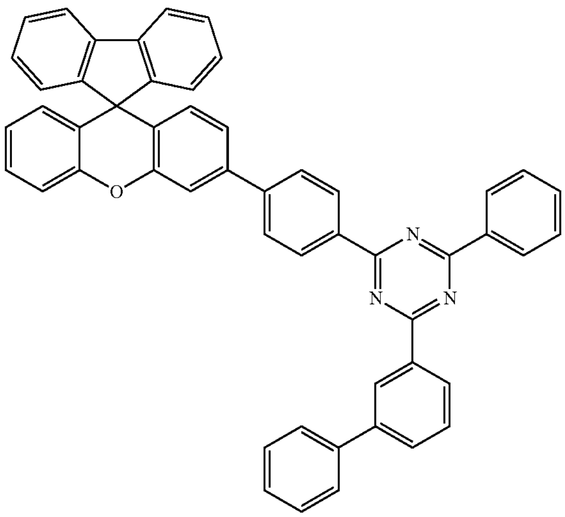
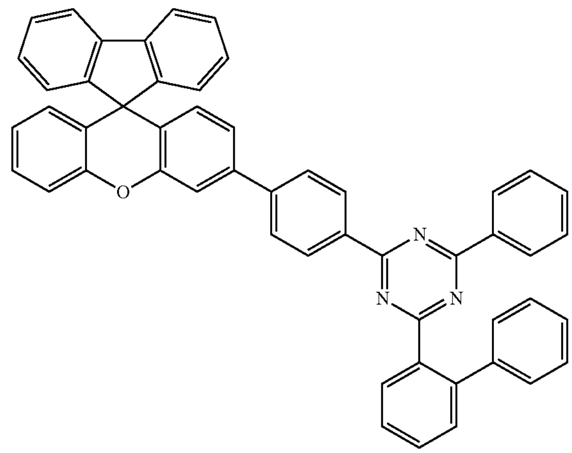
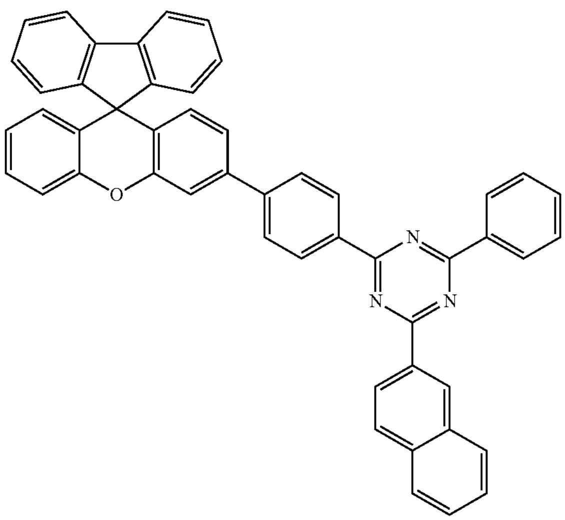
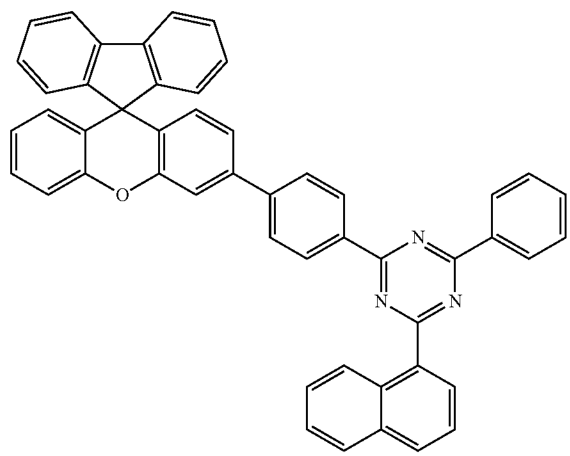
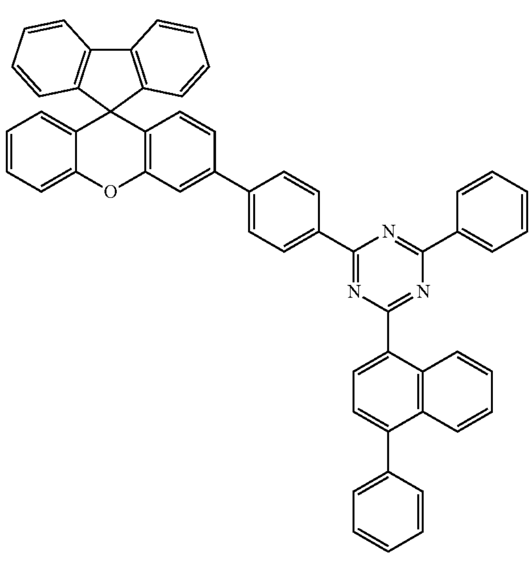
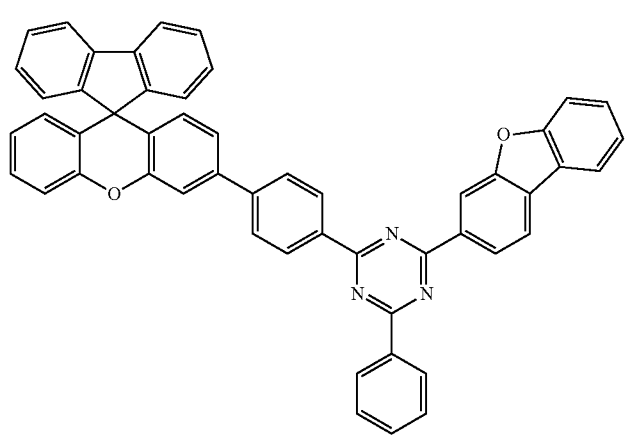

-continued
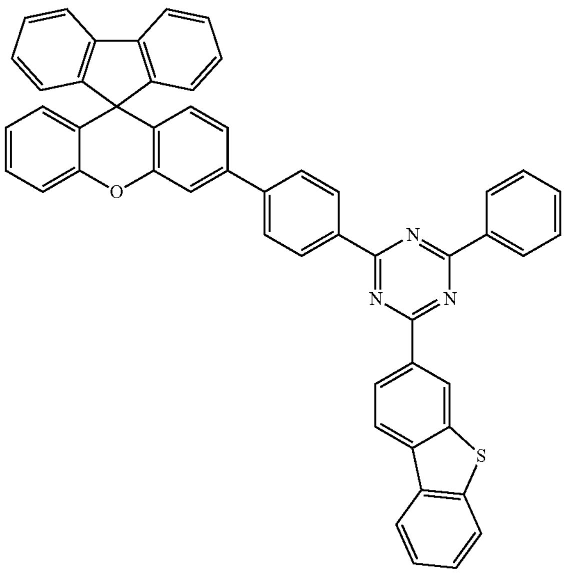
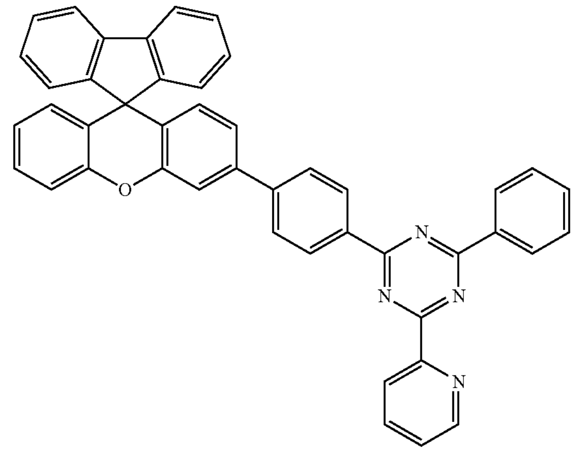
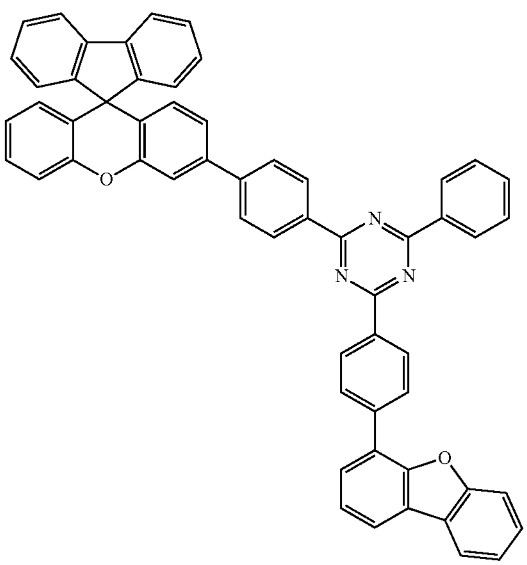
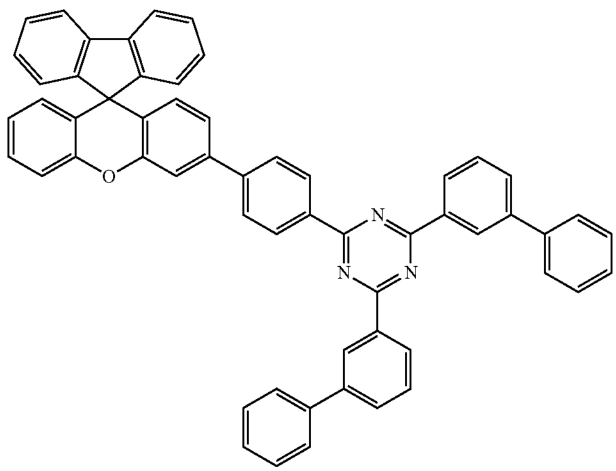
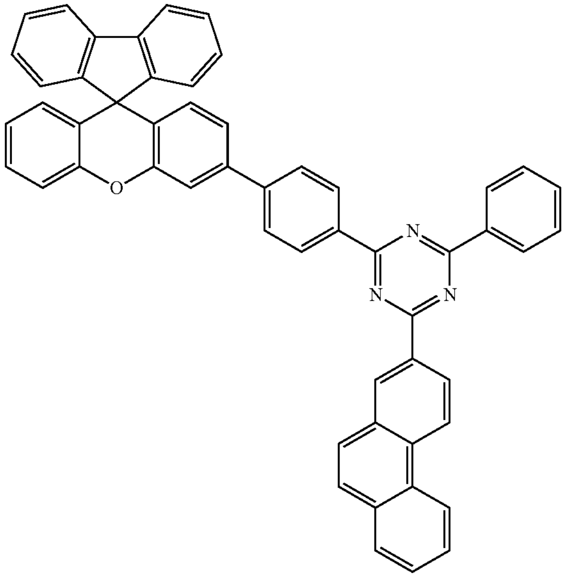
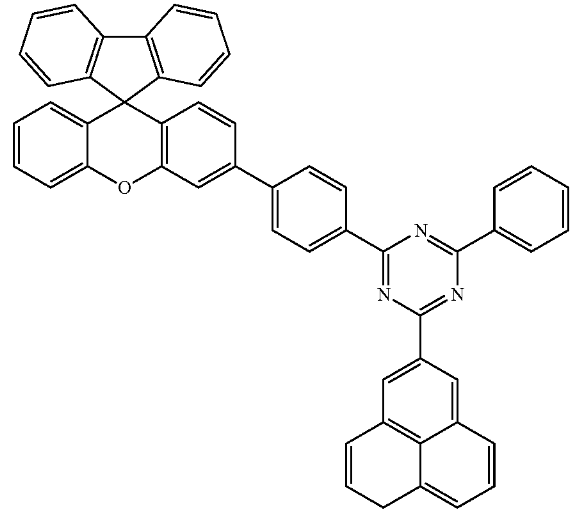

-continued
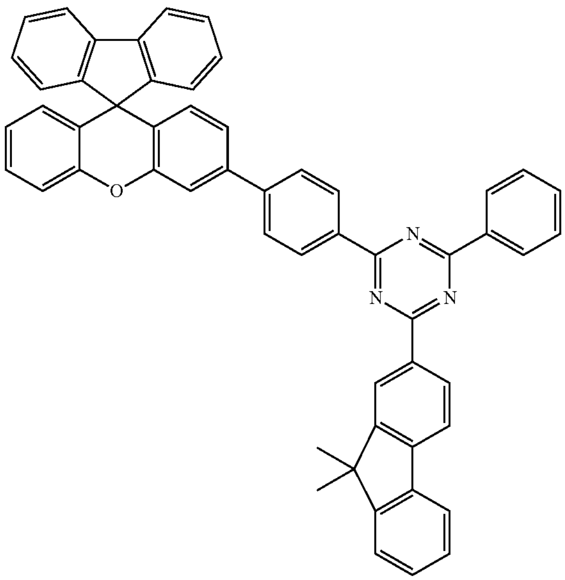
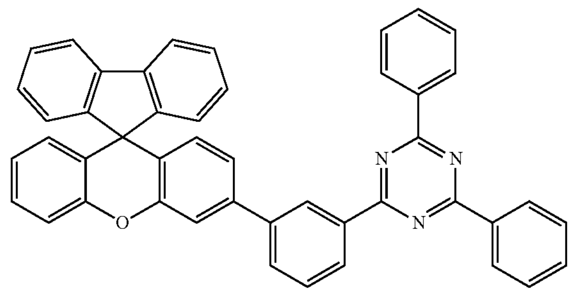
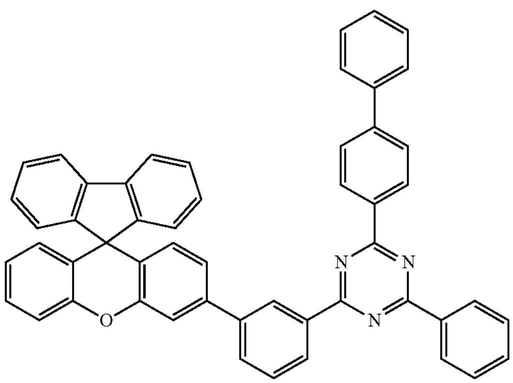
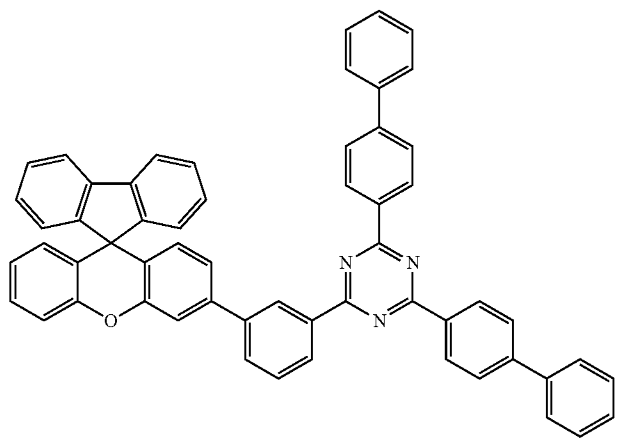
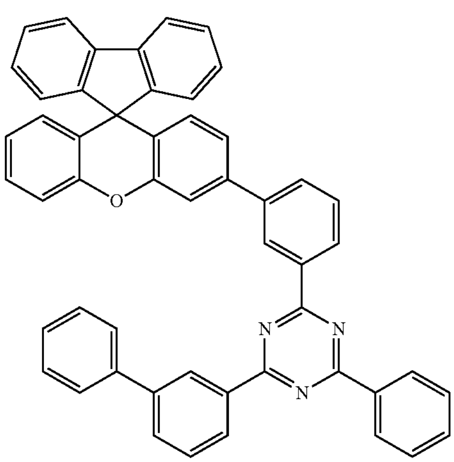
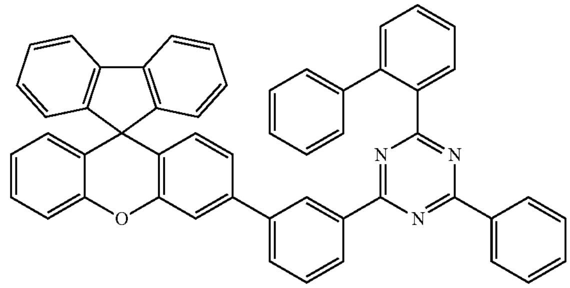

-continued
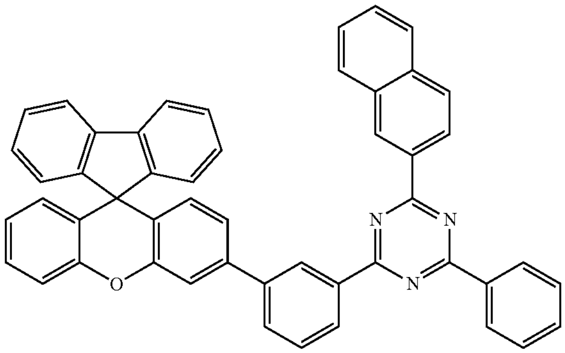
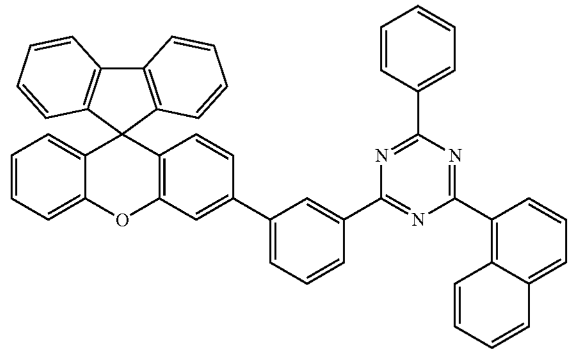
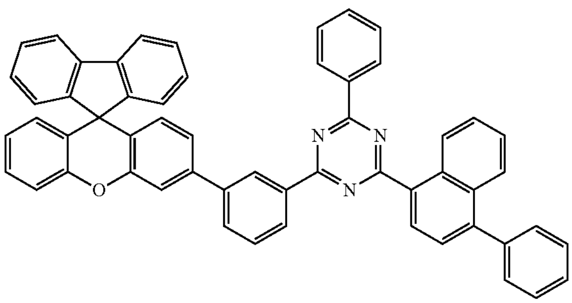
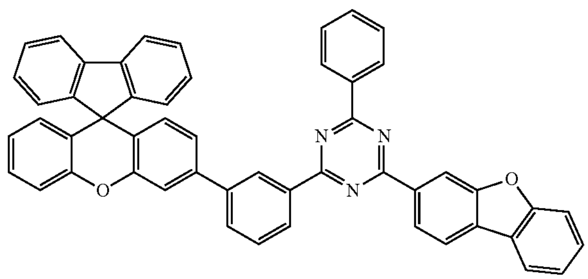
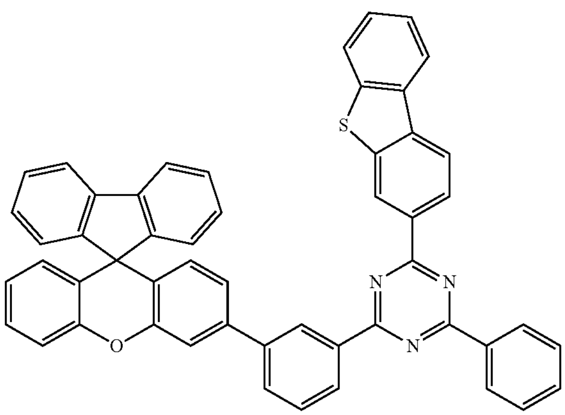
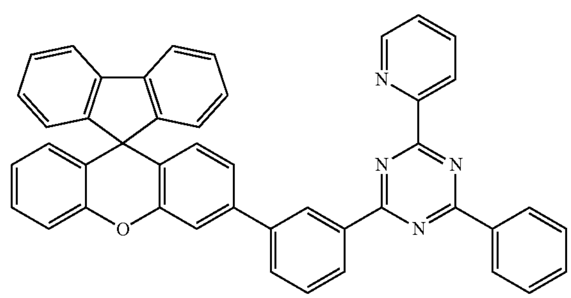
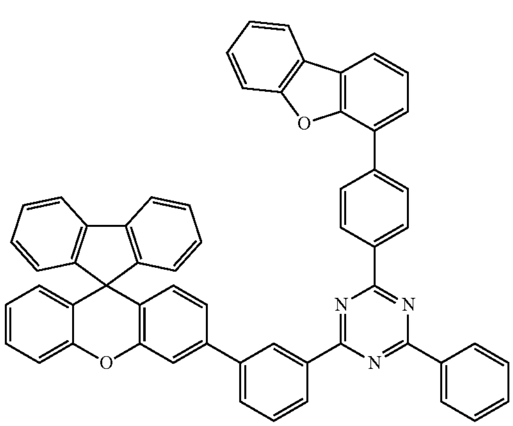
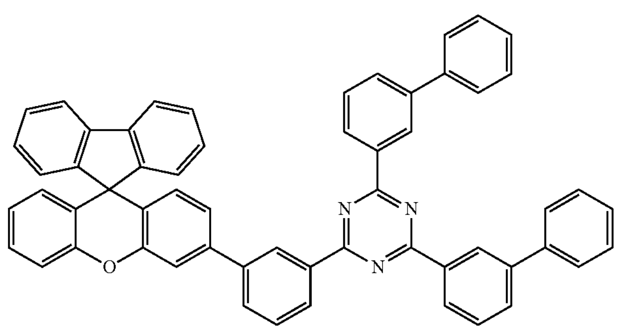

-continued
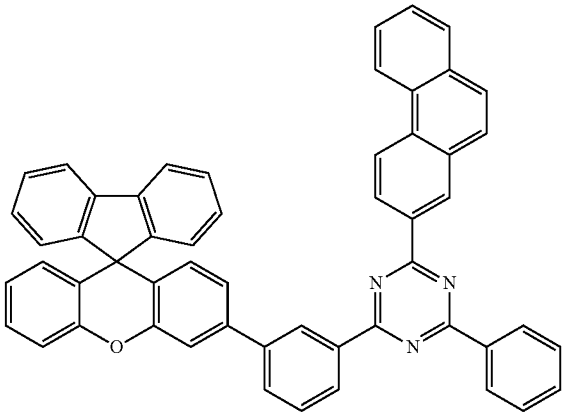
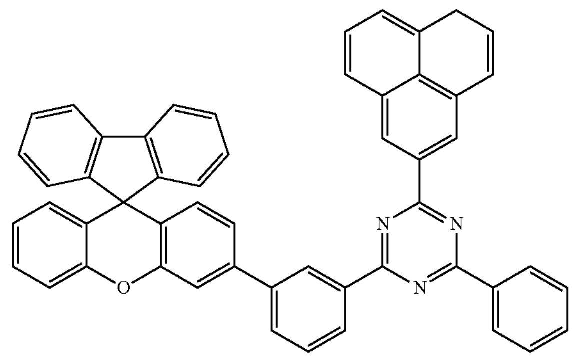
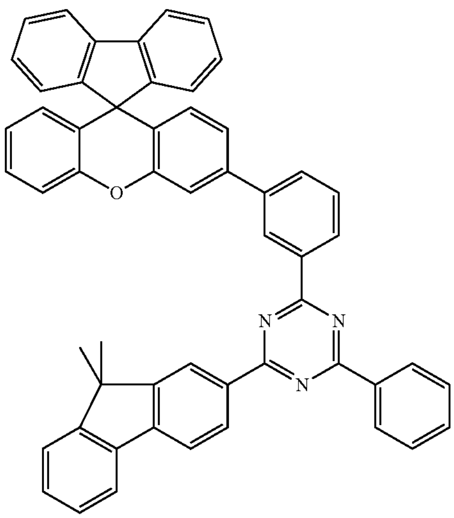
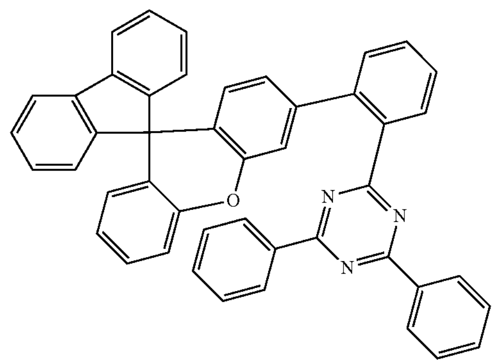
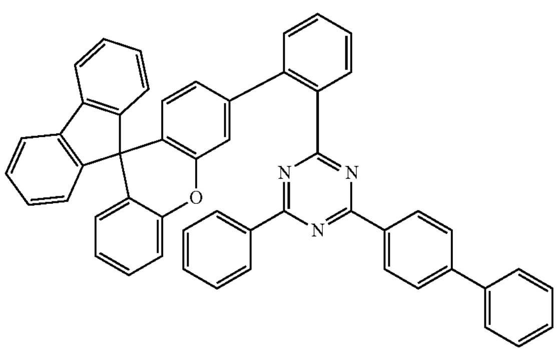
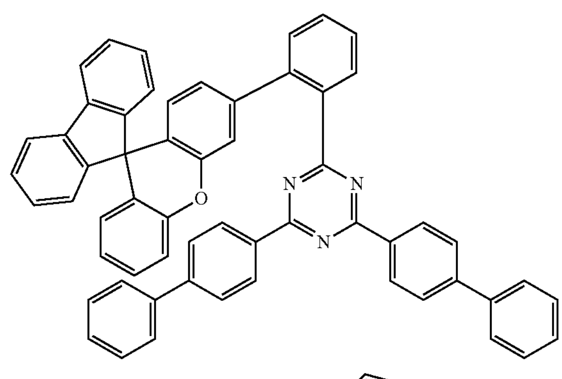
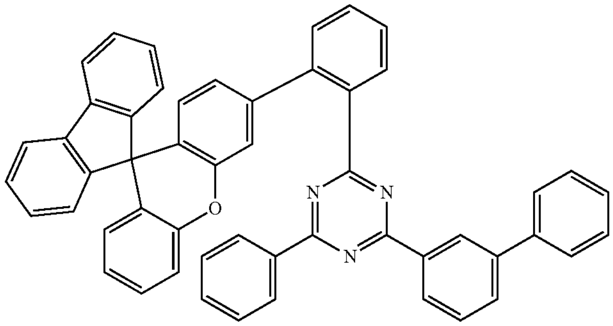
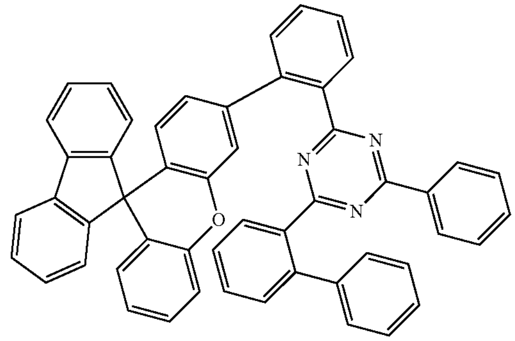

-continued
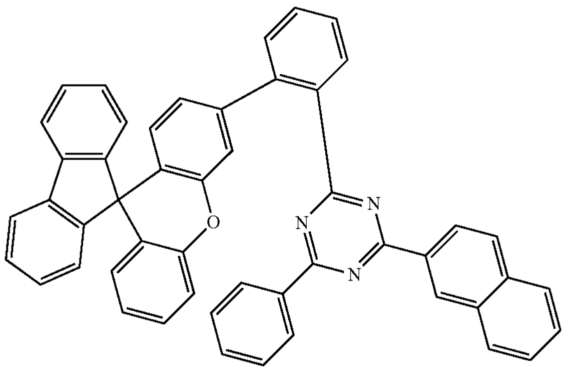
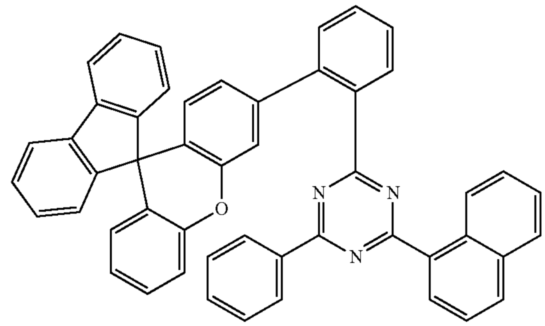
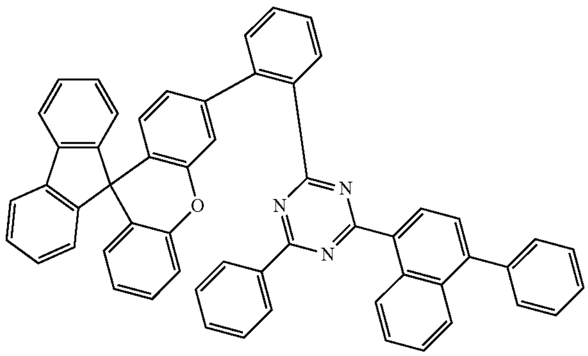
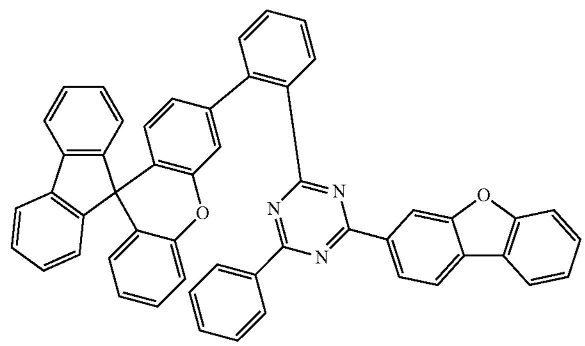
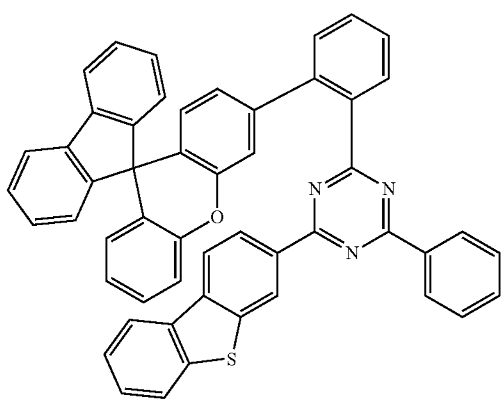
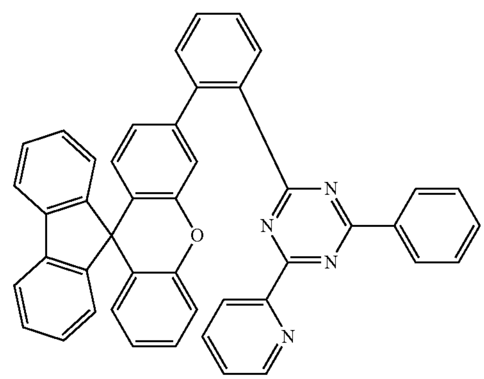
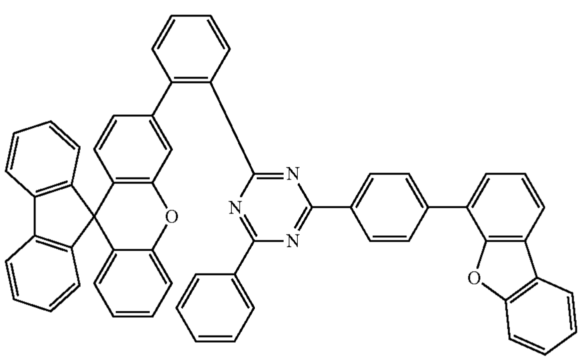
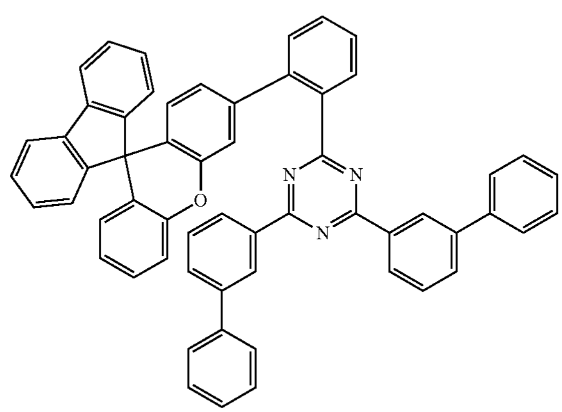

-continued
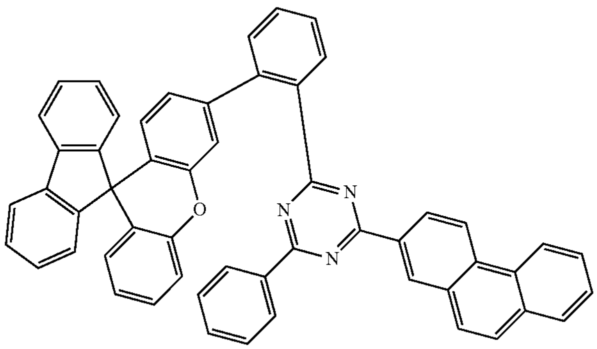
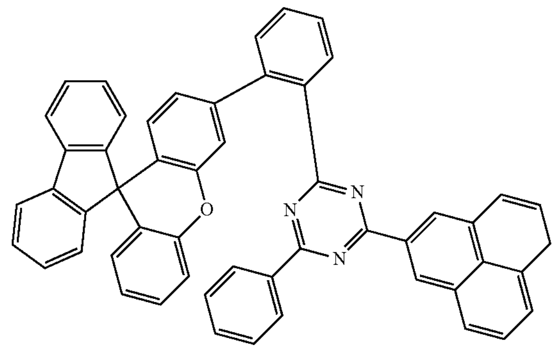
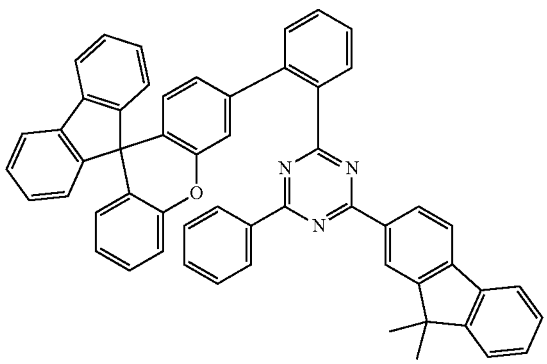
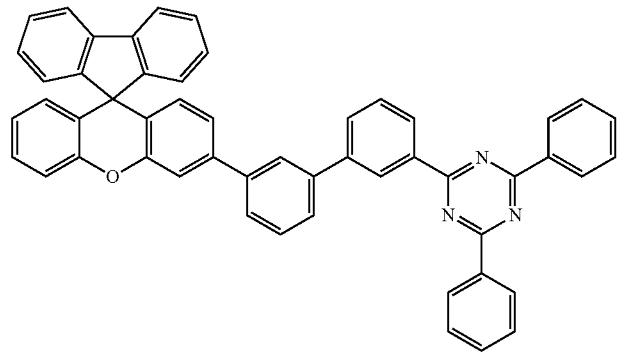
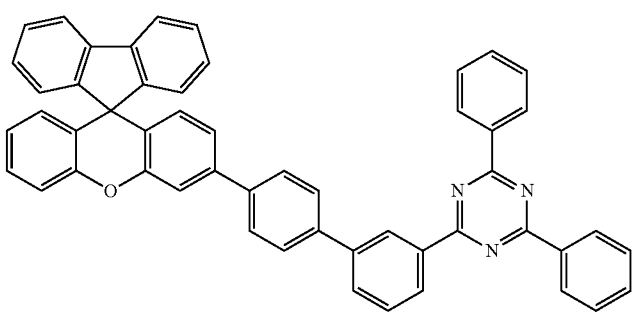
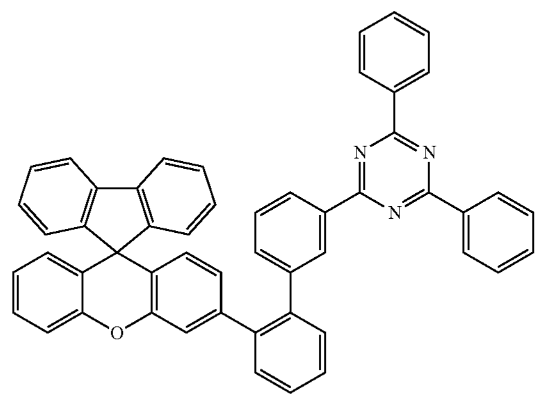
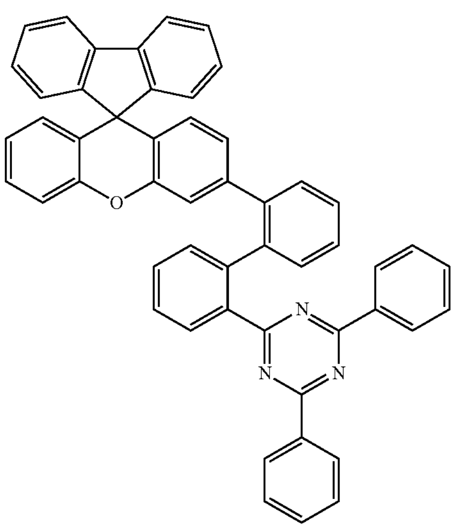
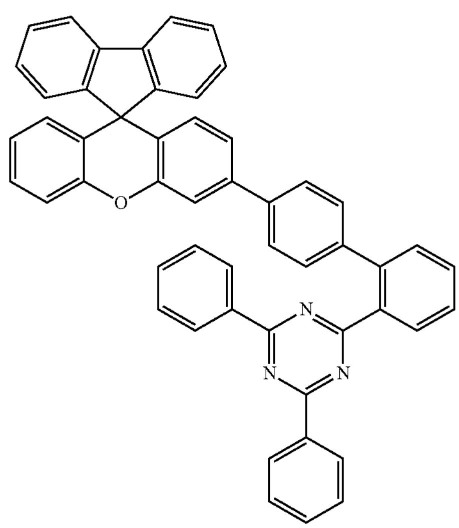

-continued
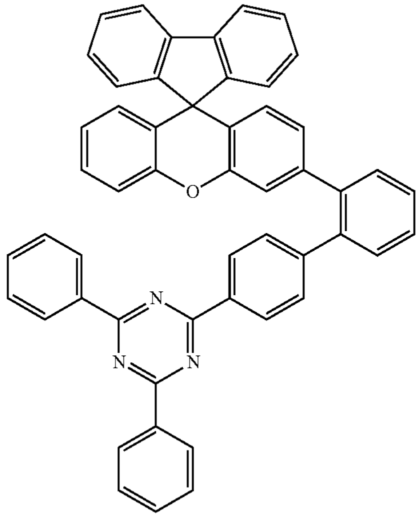
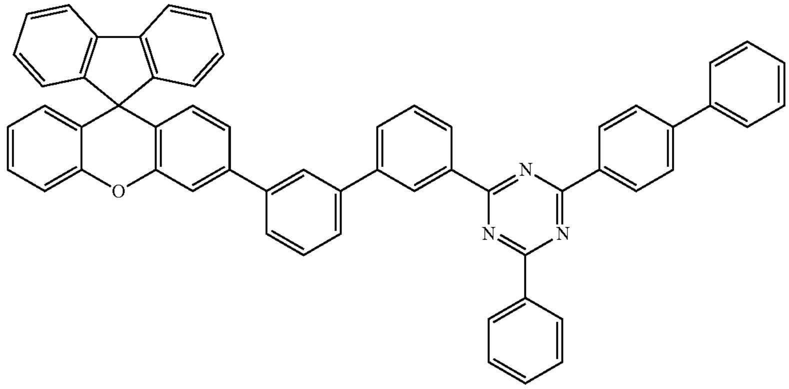
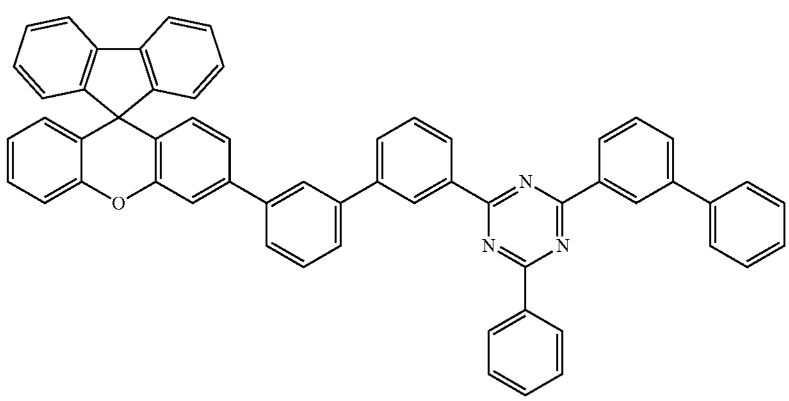

-continued
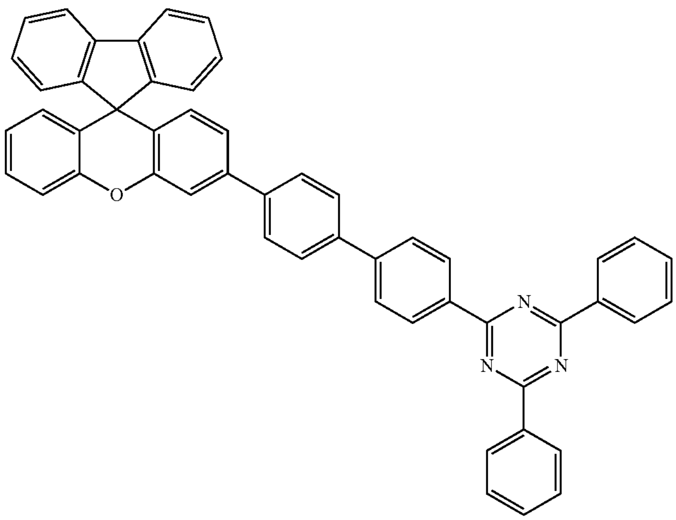
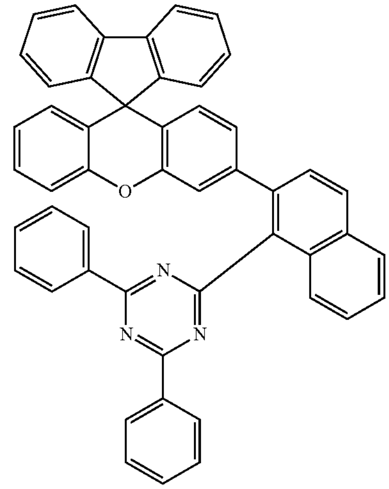
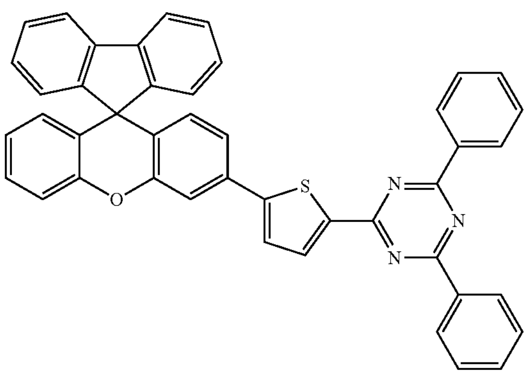
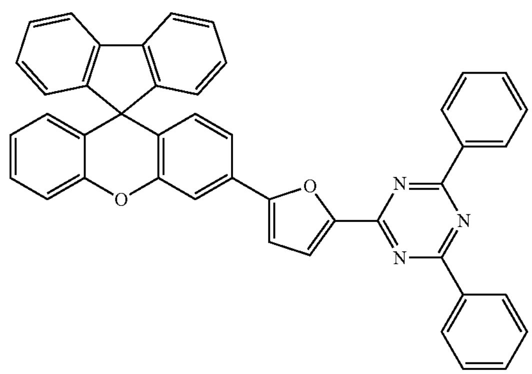
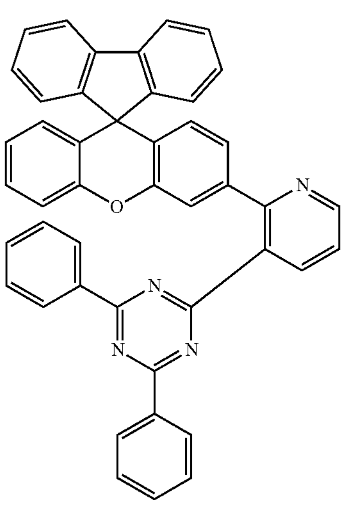
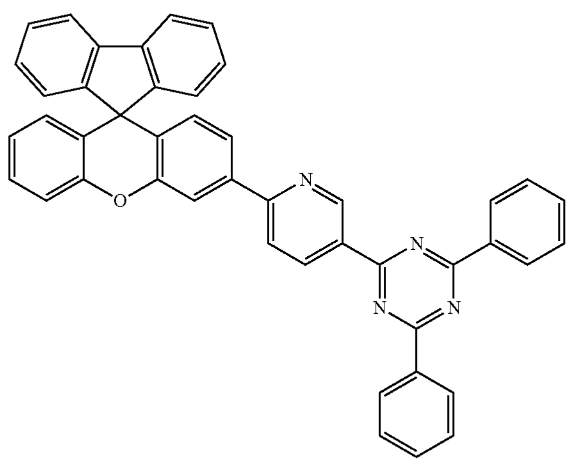

-continued
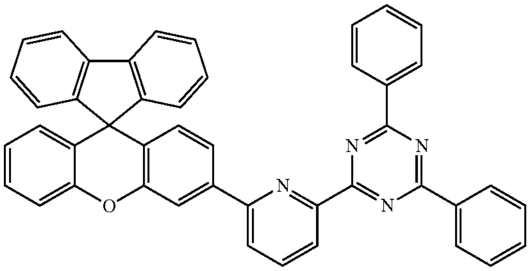
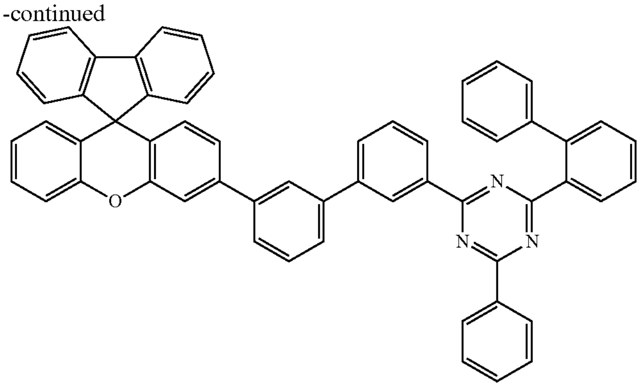
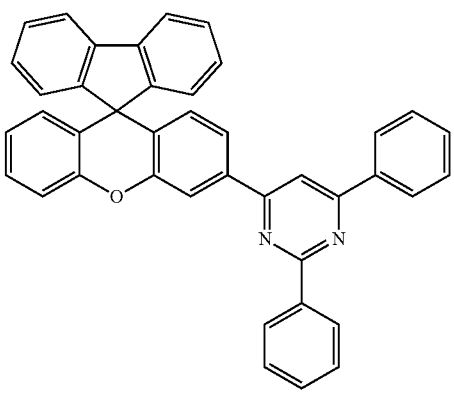
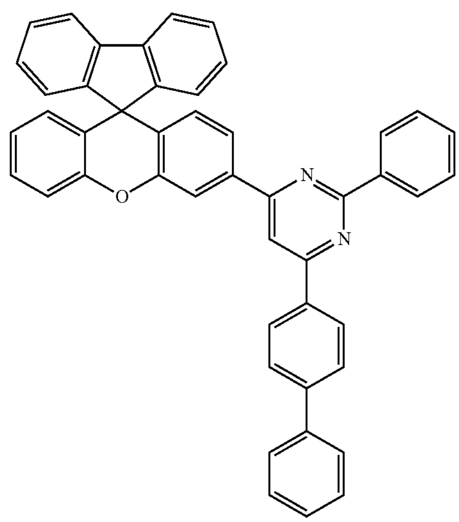
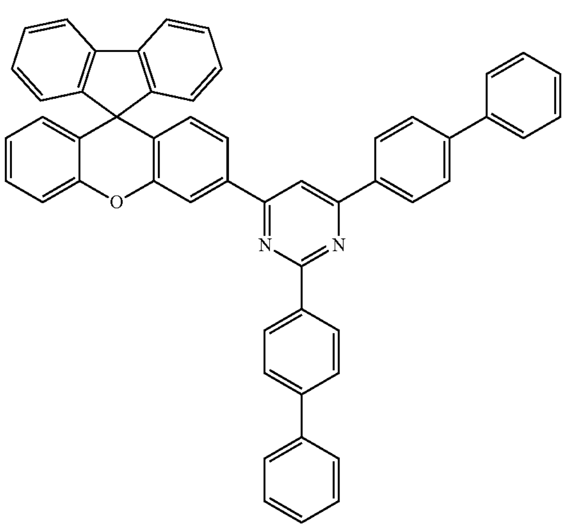
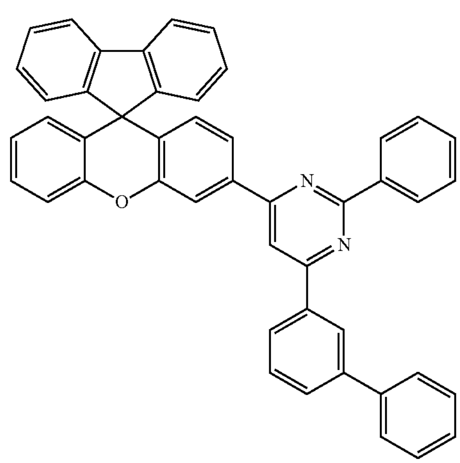

-continued
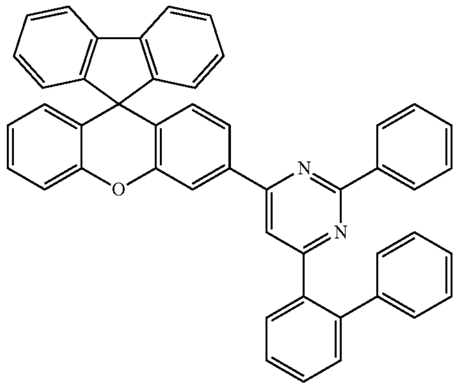
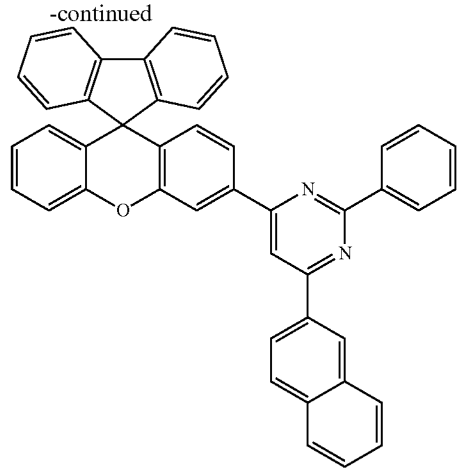
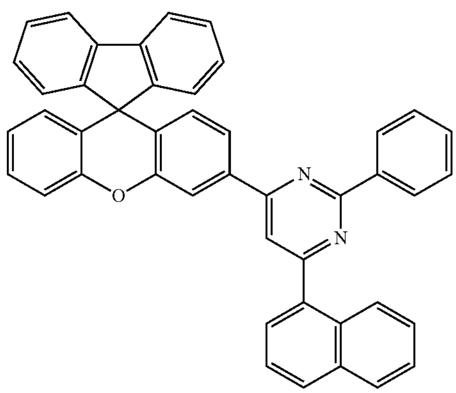
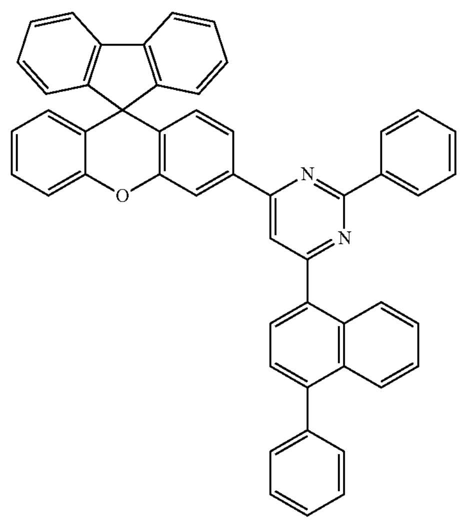
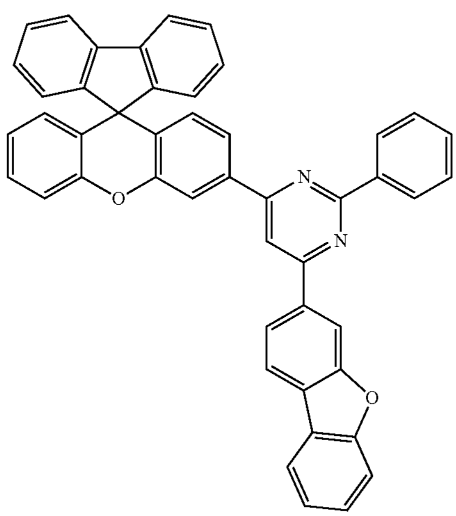
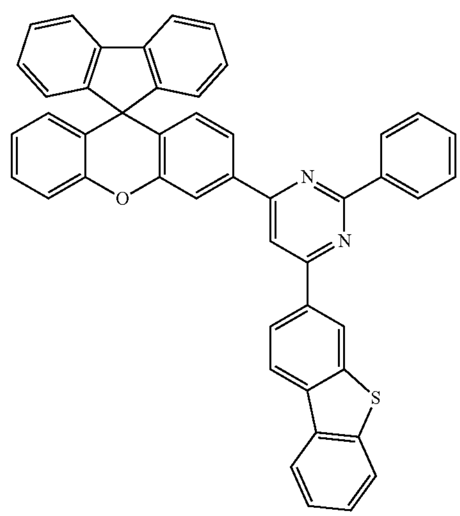

-continued
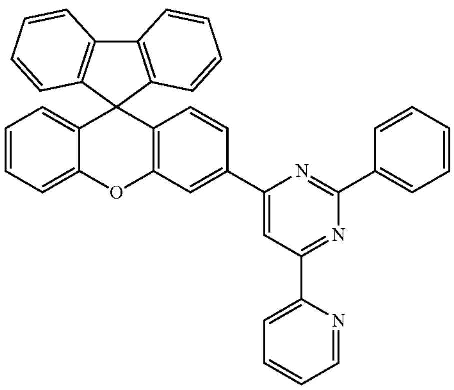
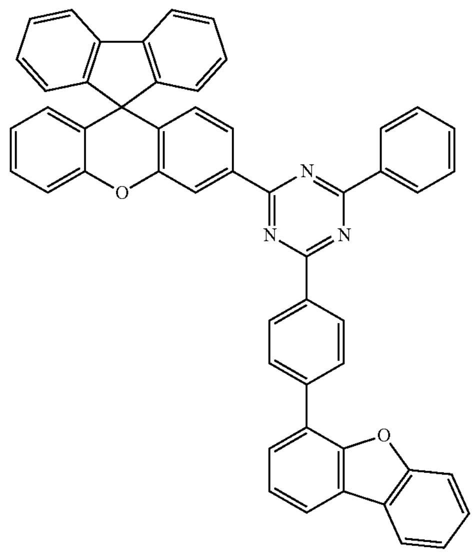
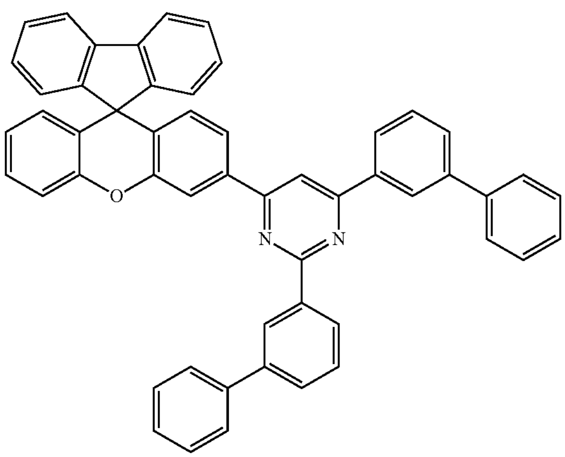
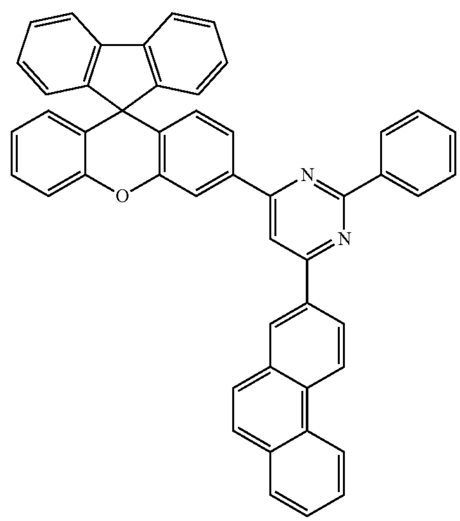
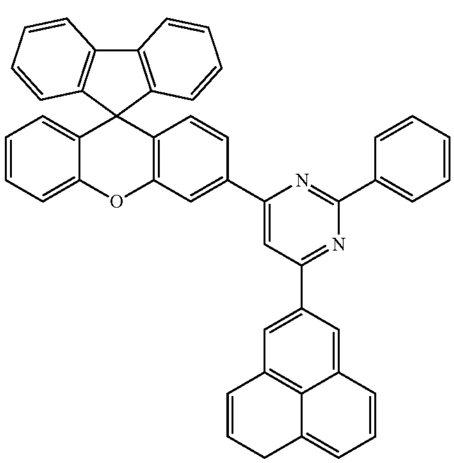
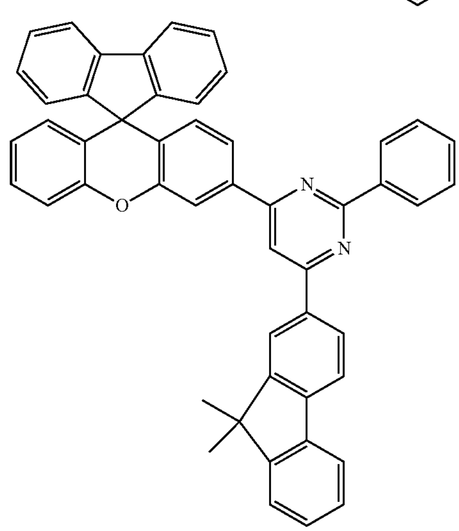

-continued
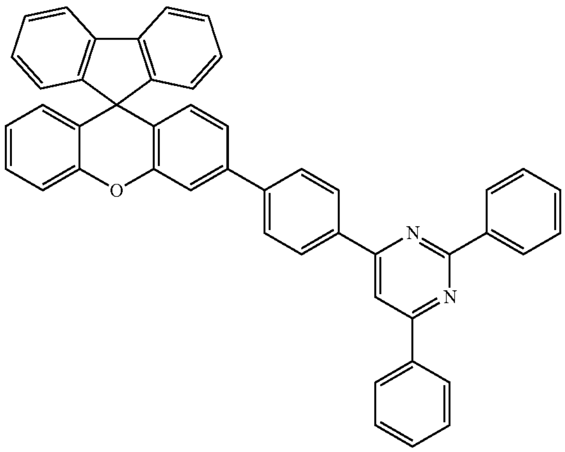
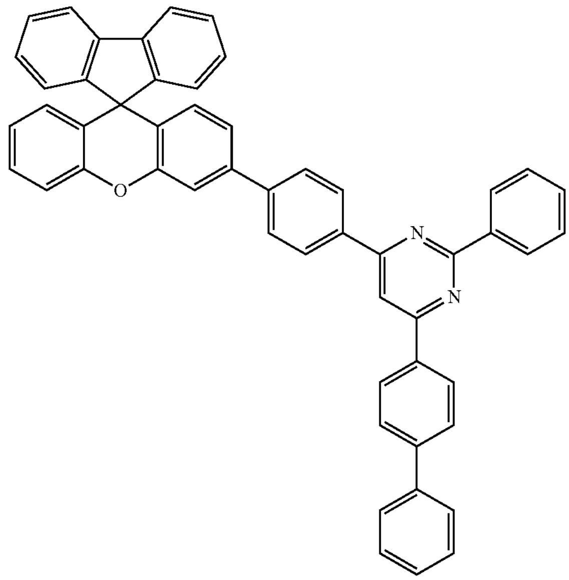
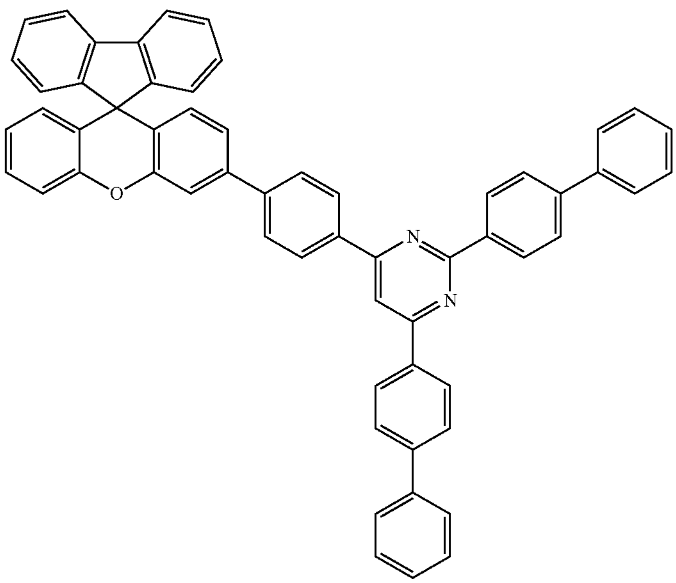
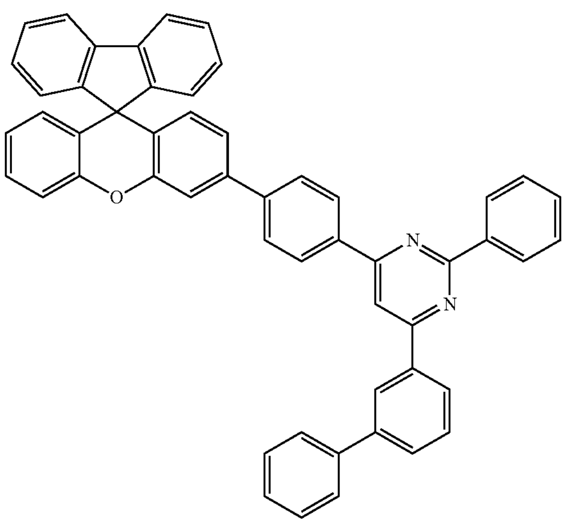
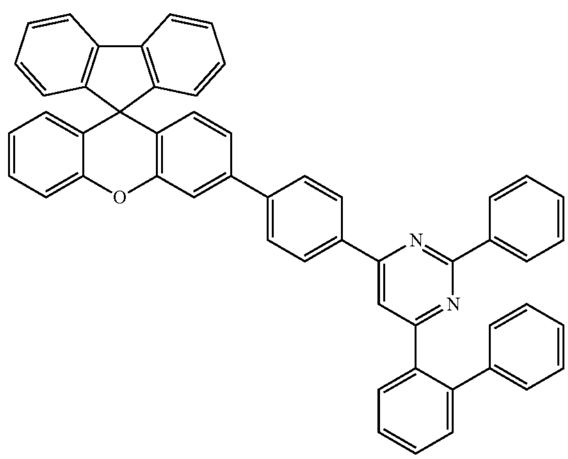

-continued
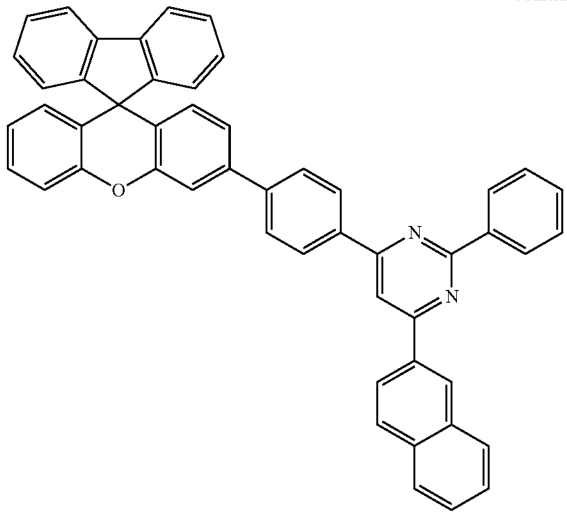
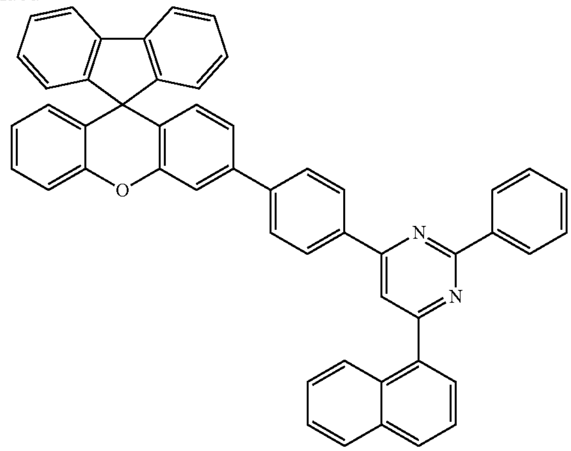
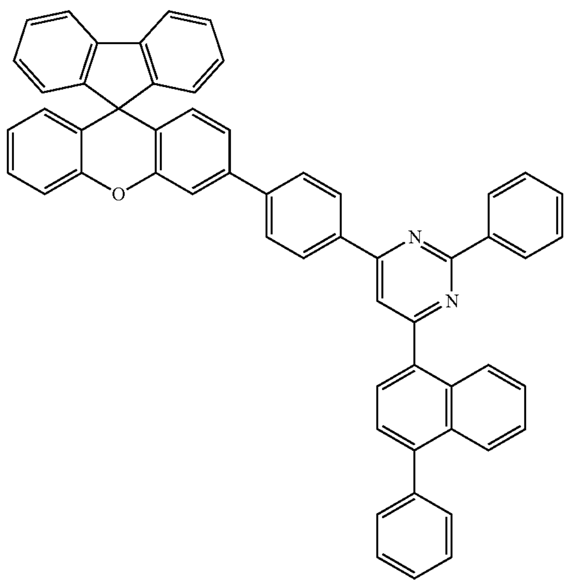
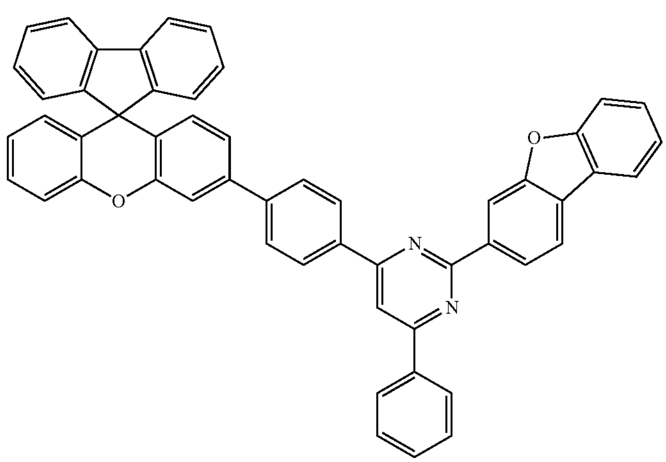

-continued
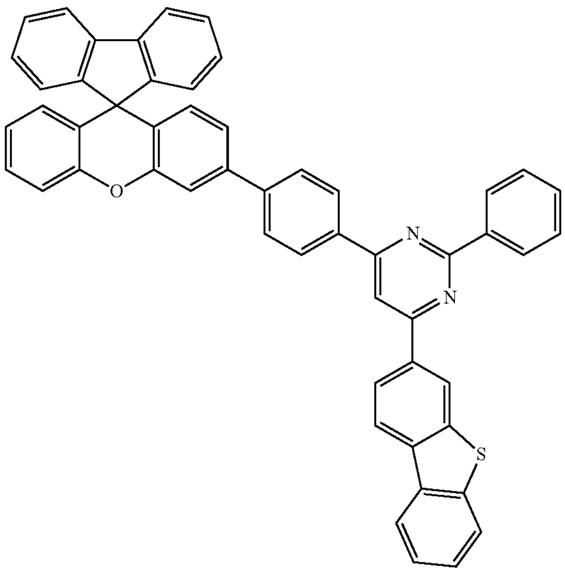
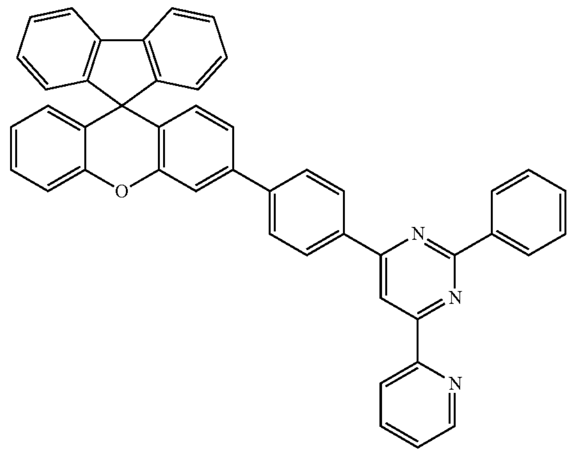
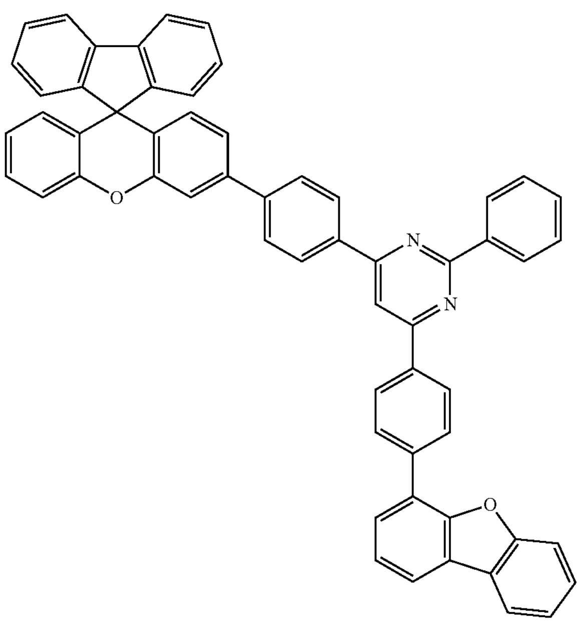
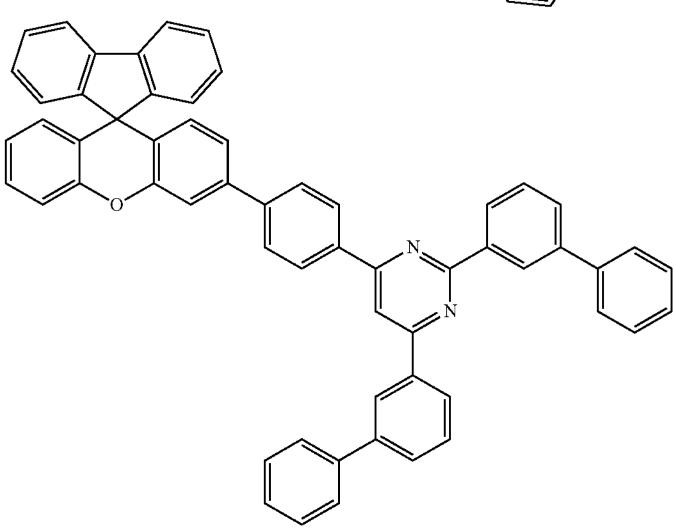

-continued
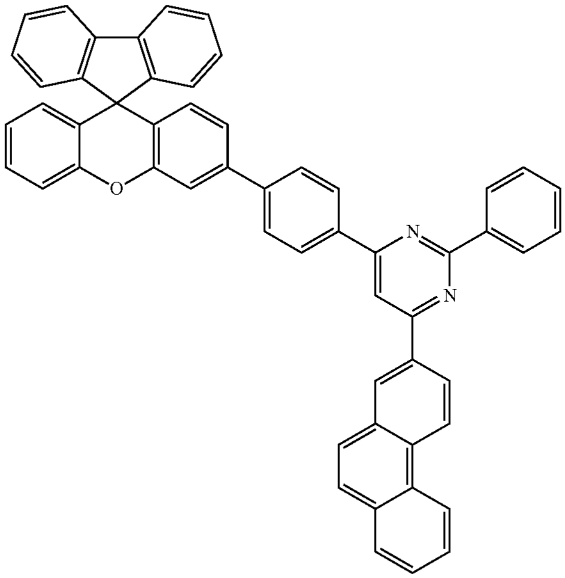
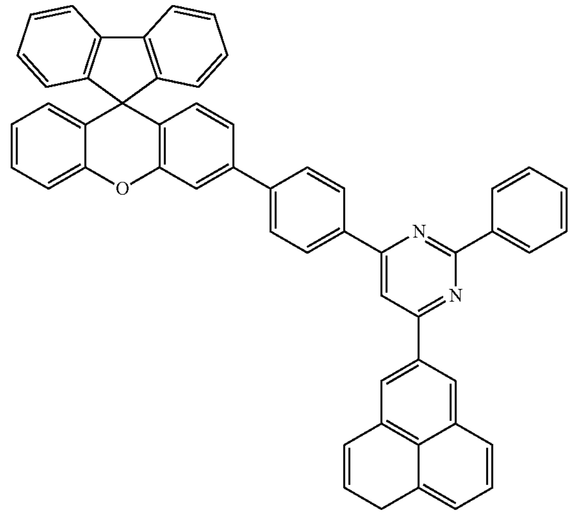
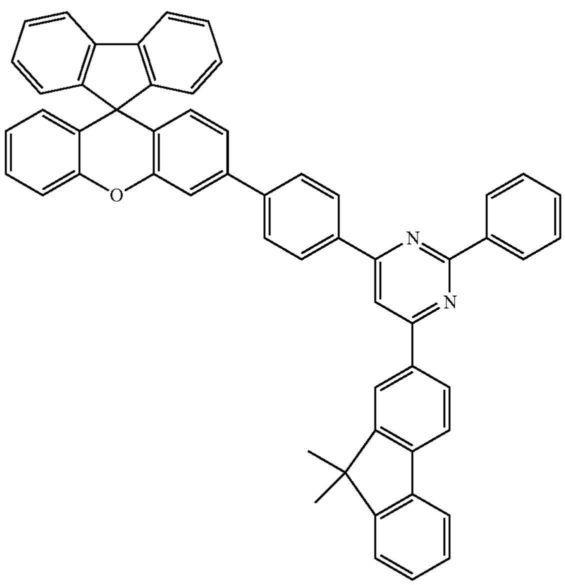
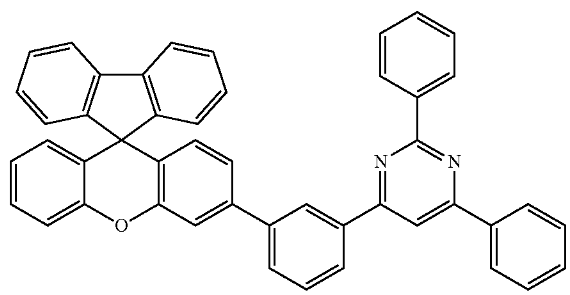
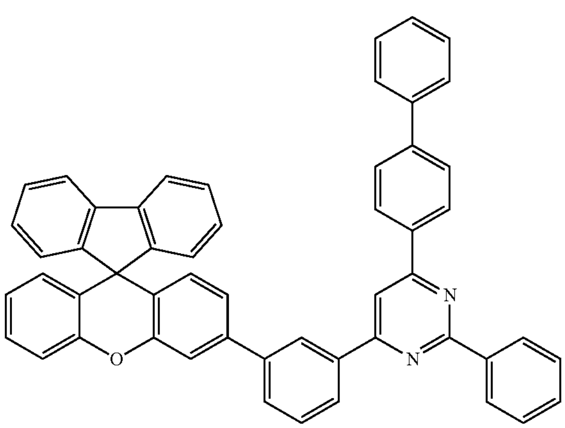

-continued
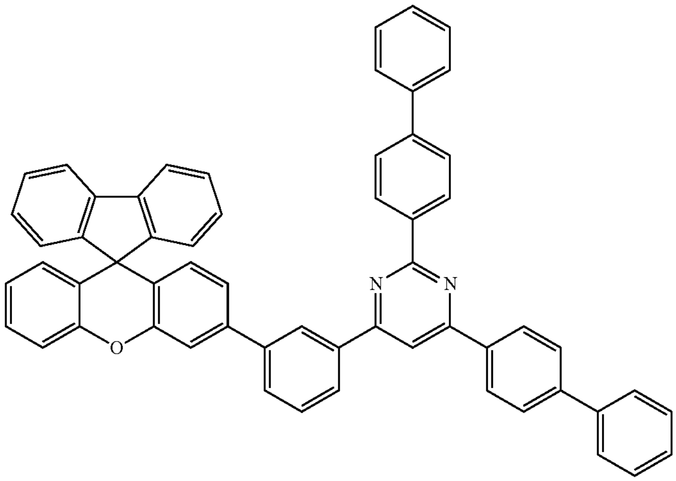
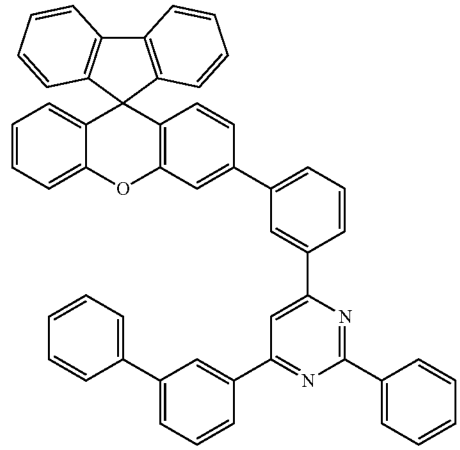
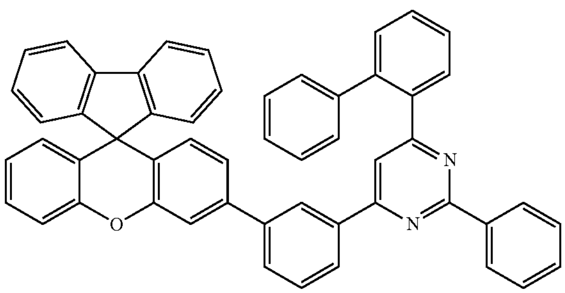
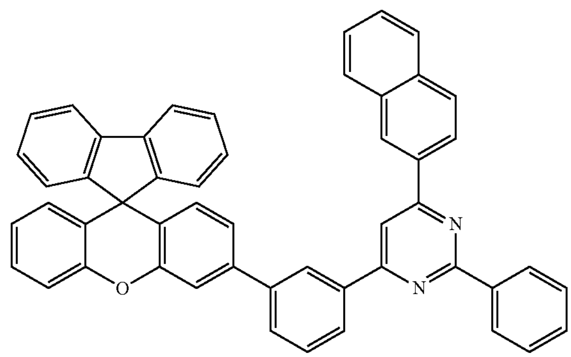
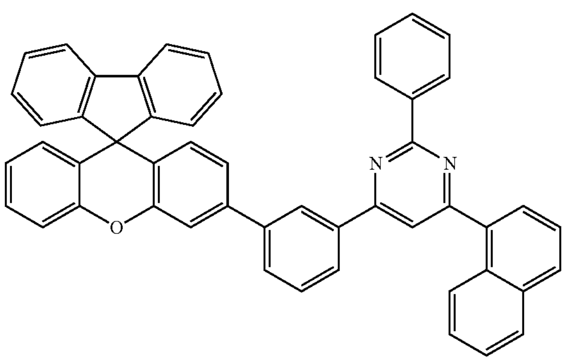
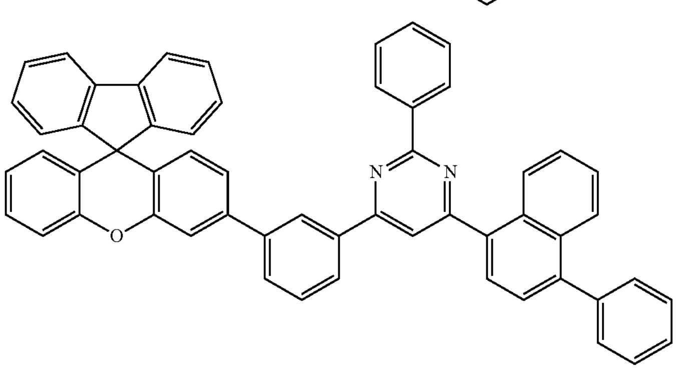

-continued
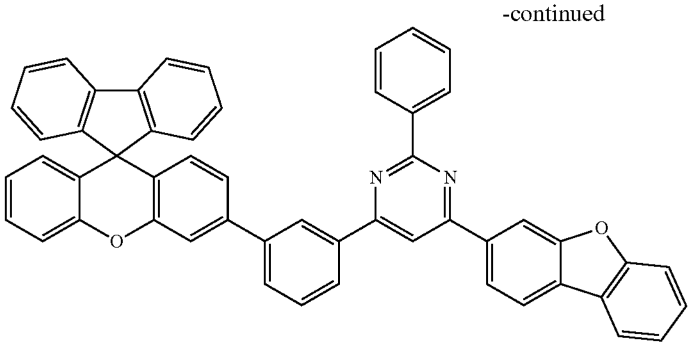
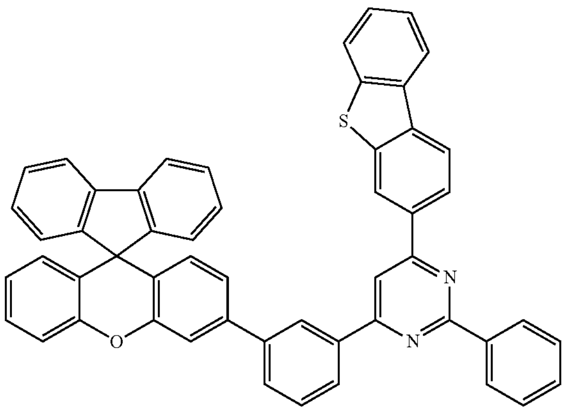
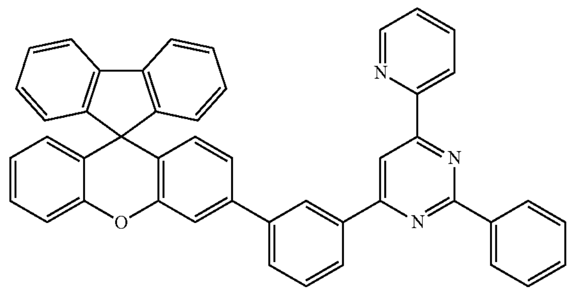
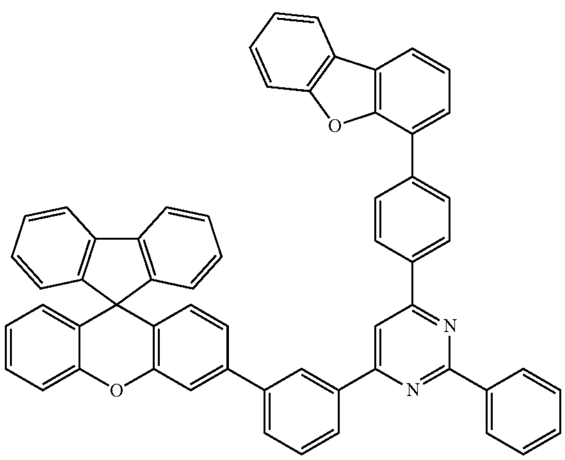
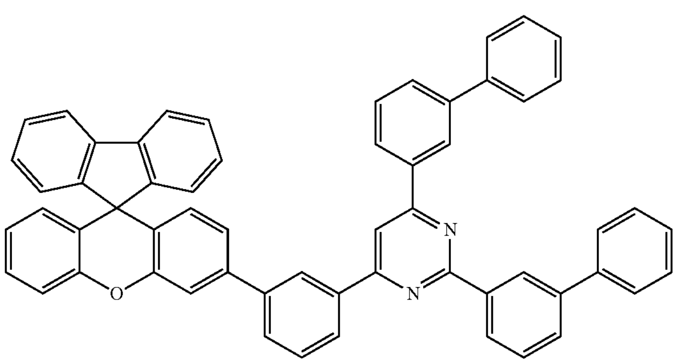

-continued
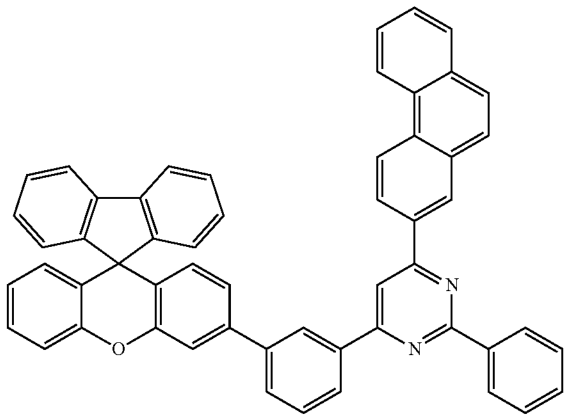
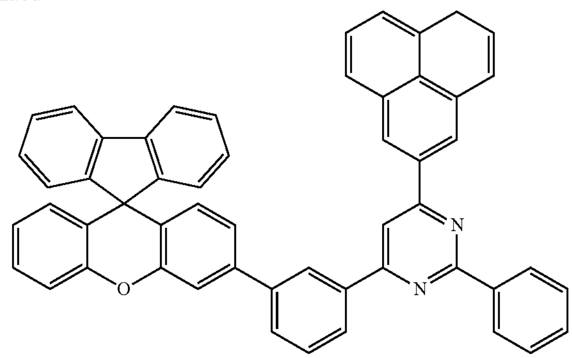
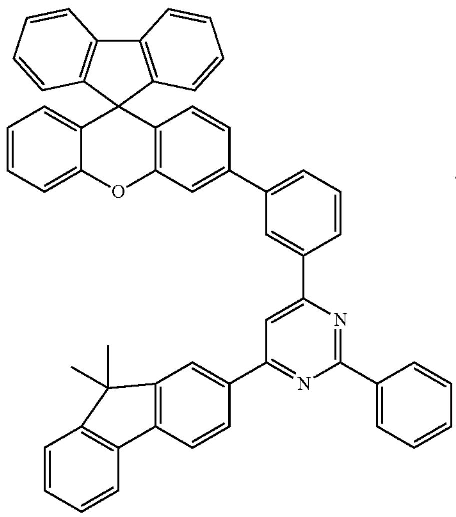
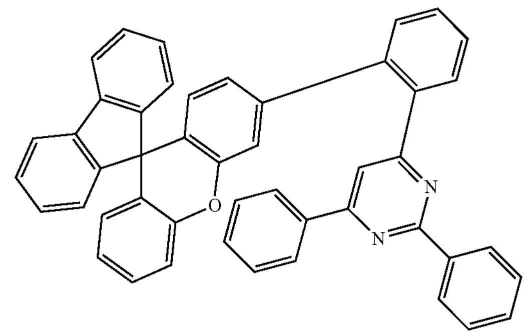
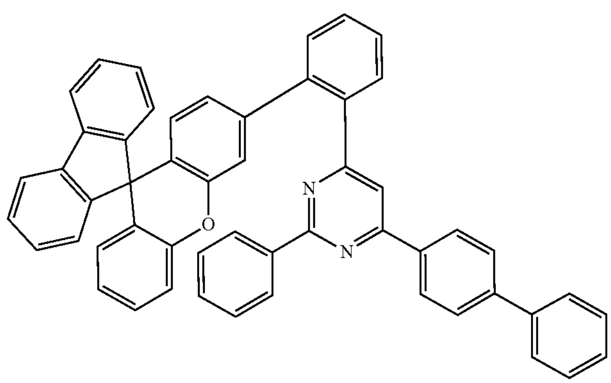
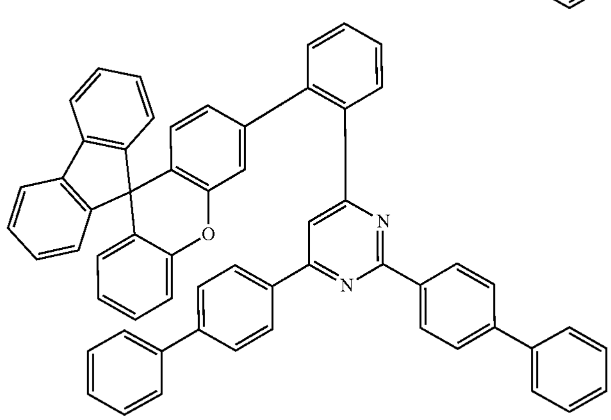

-continued
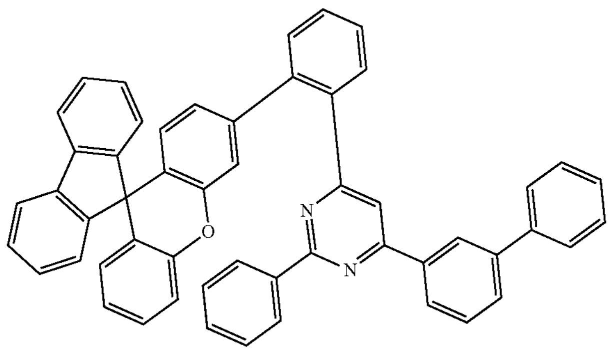
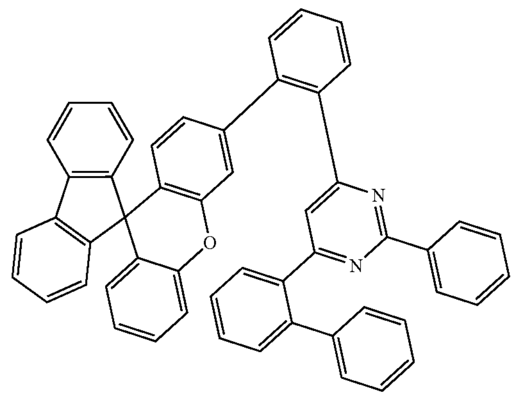
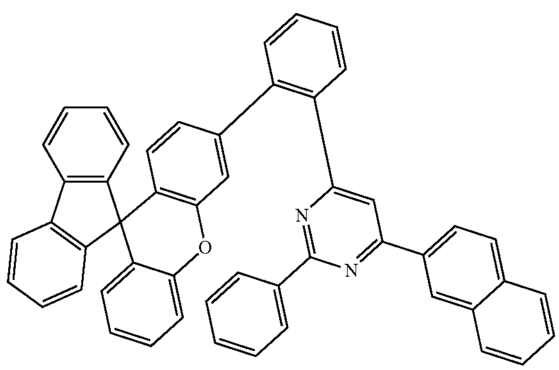
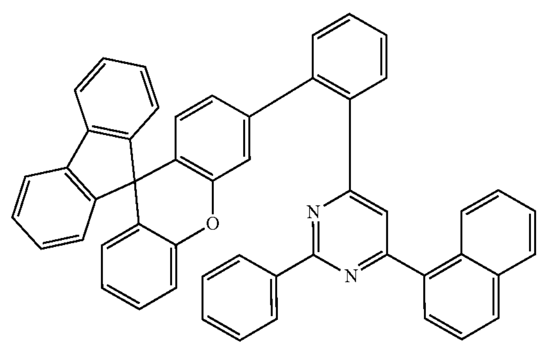
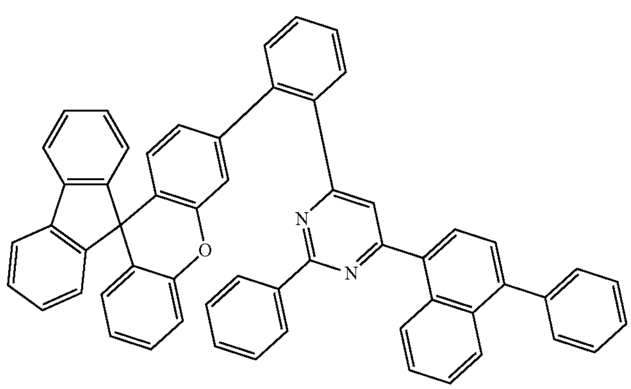
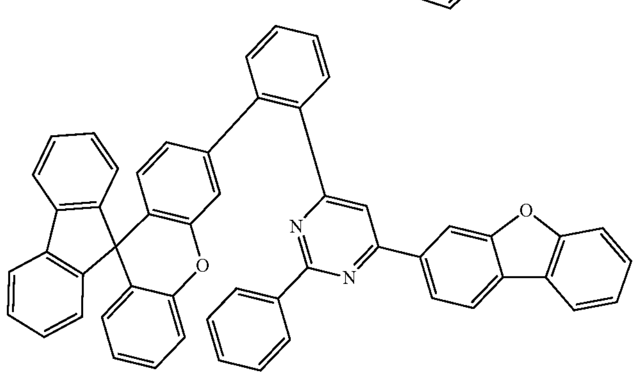
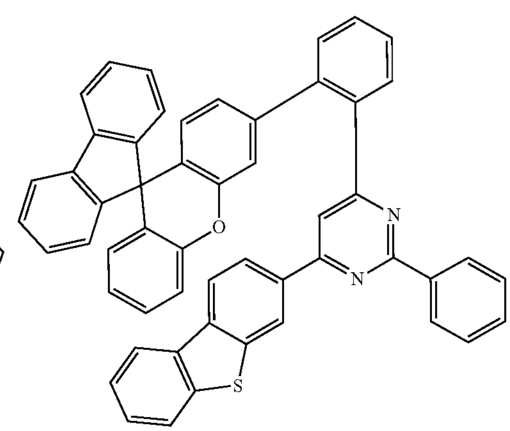

-continued
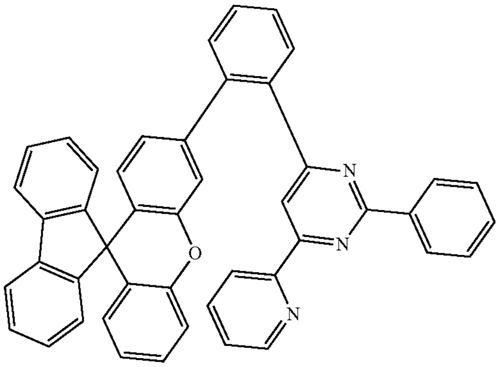
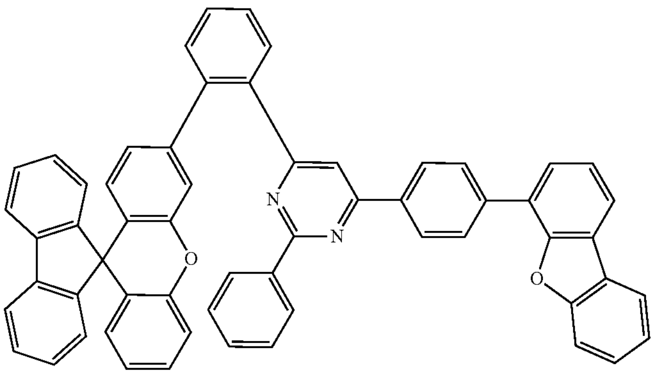
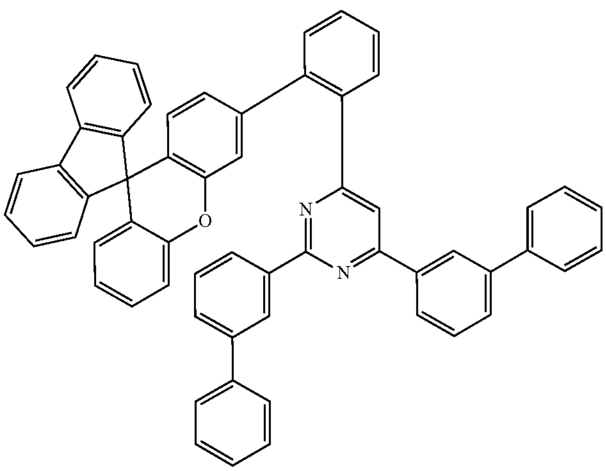
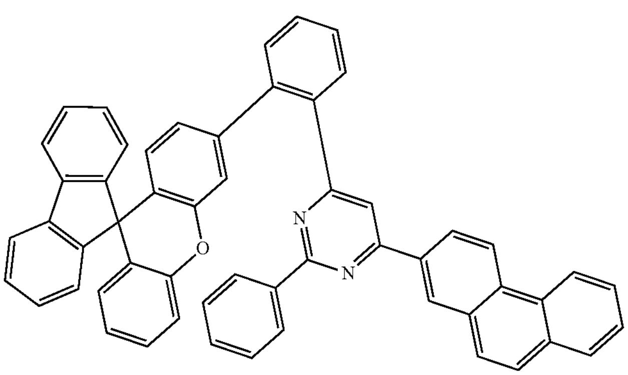

-continued
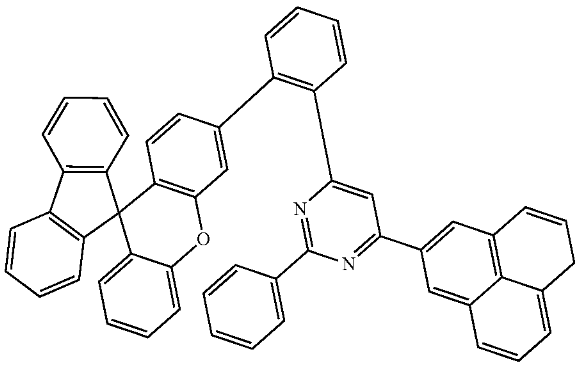
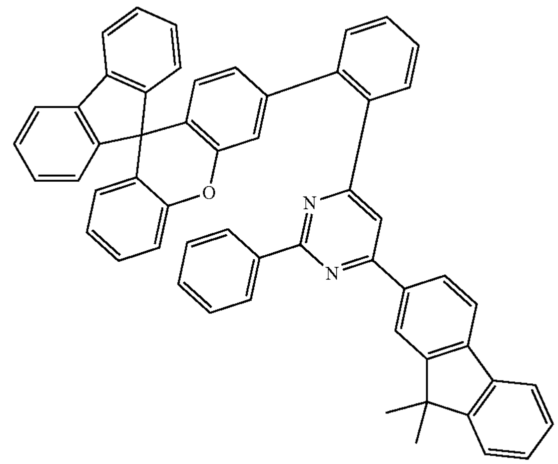
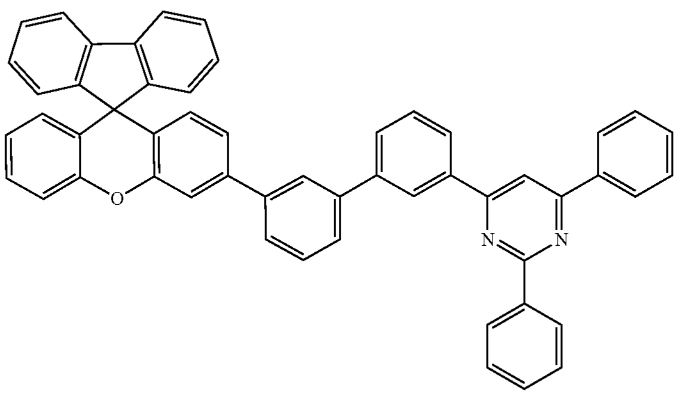
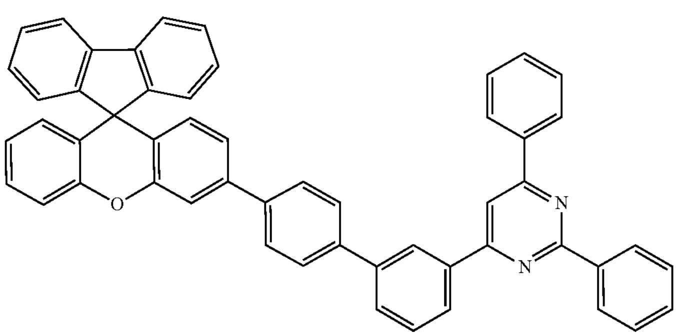
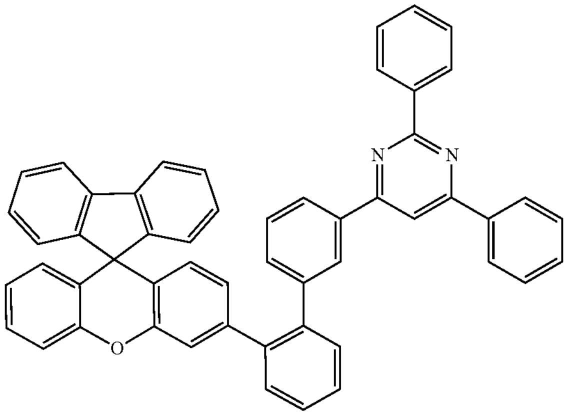
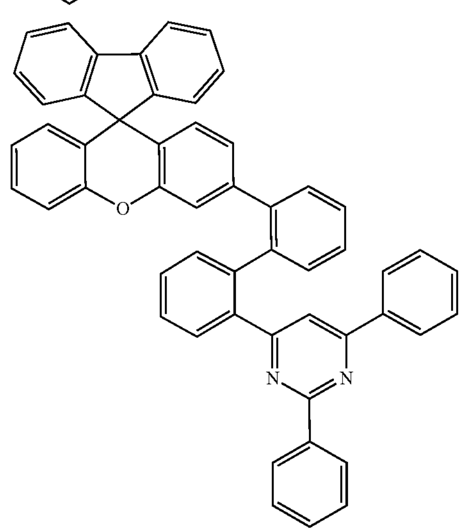

-continued
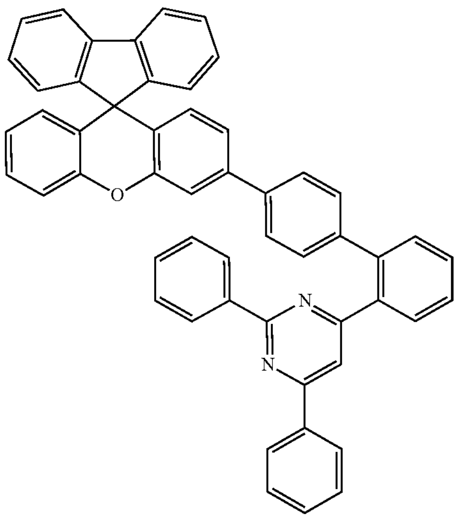
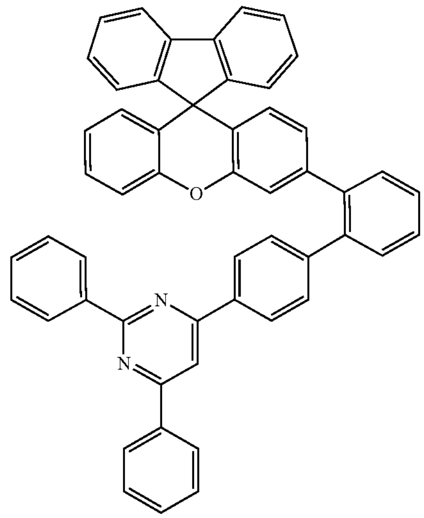
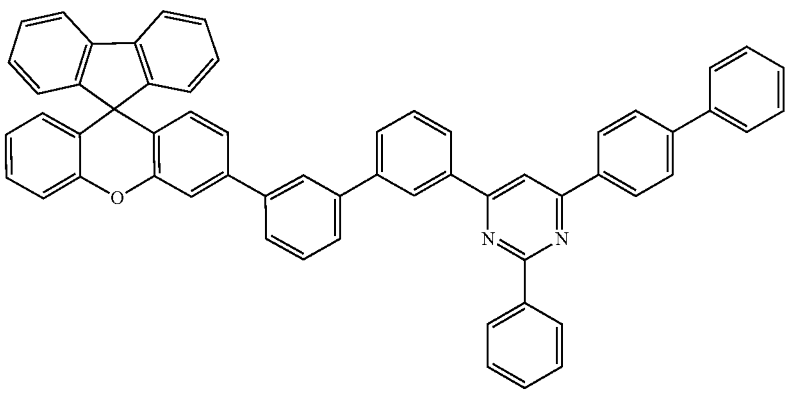
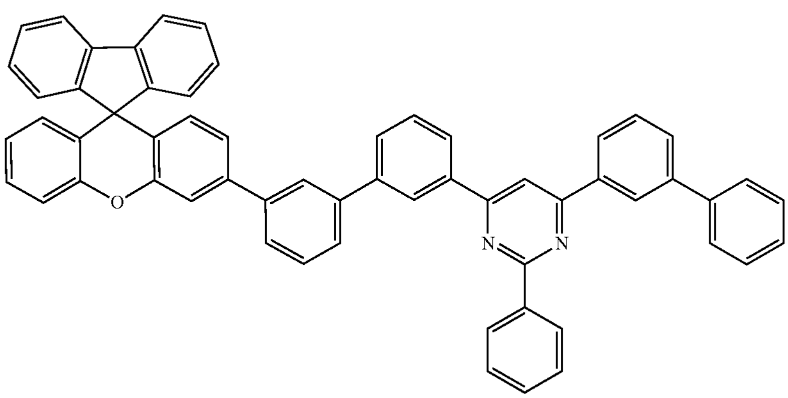

-continued
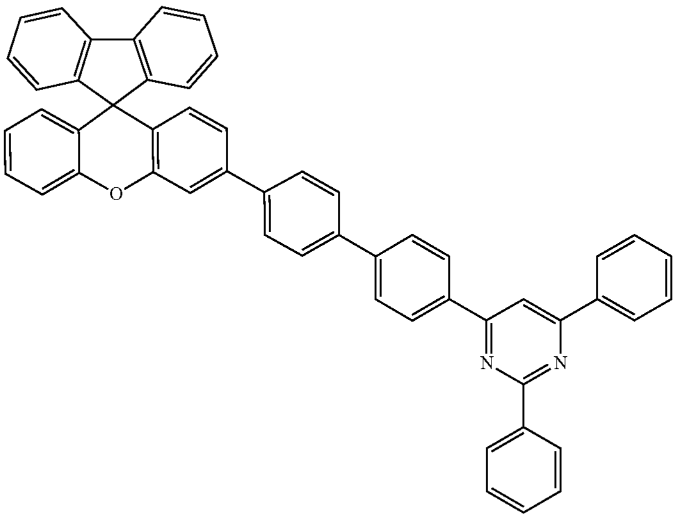
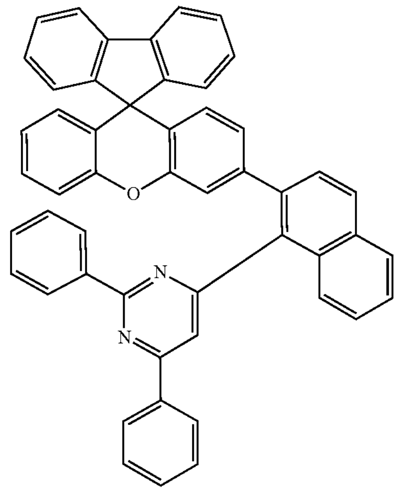
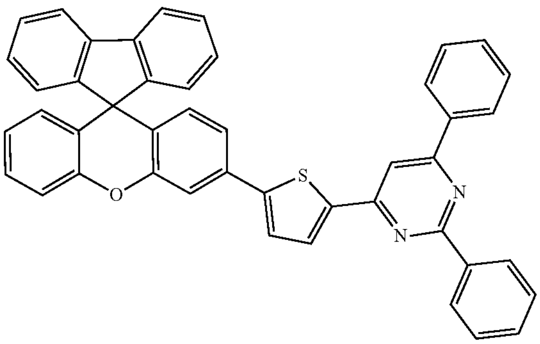
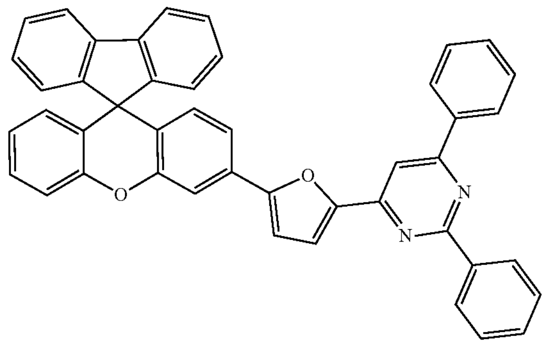
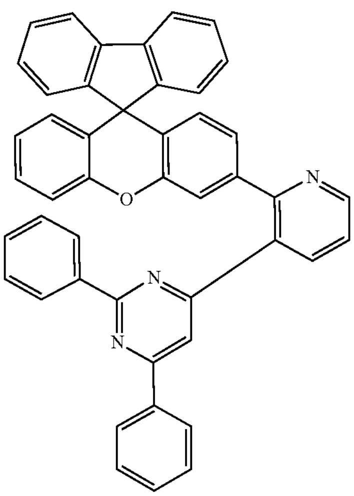
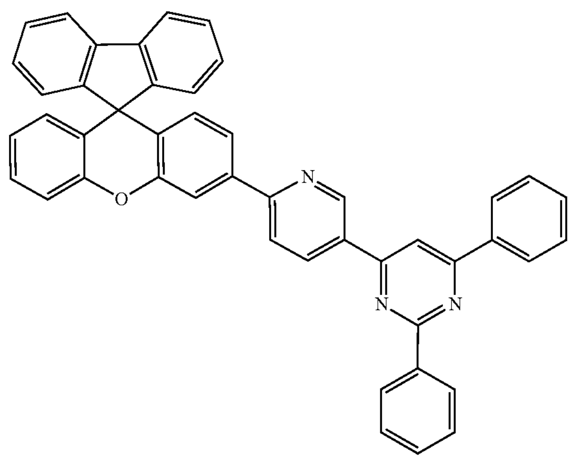
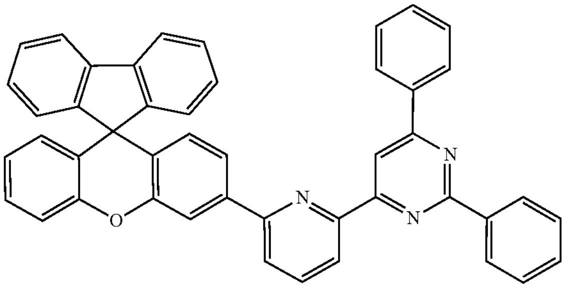

-continued
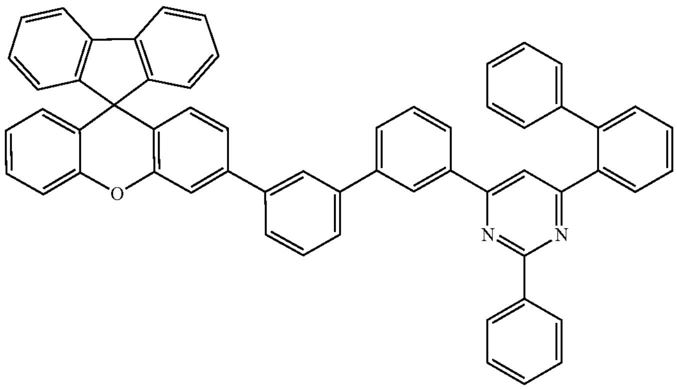
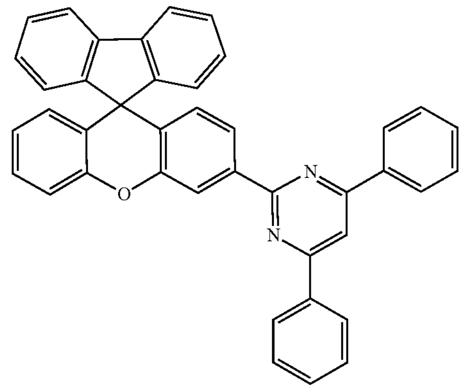
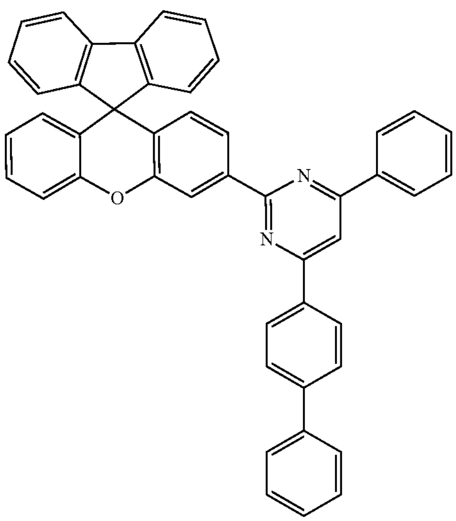
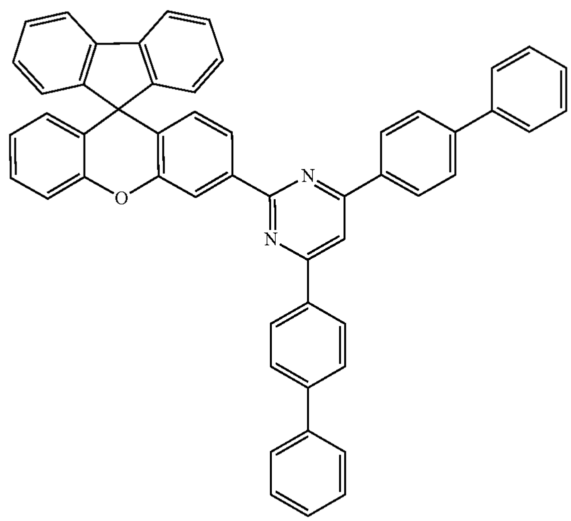
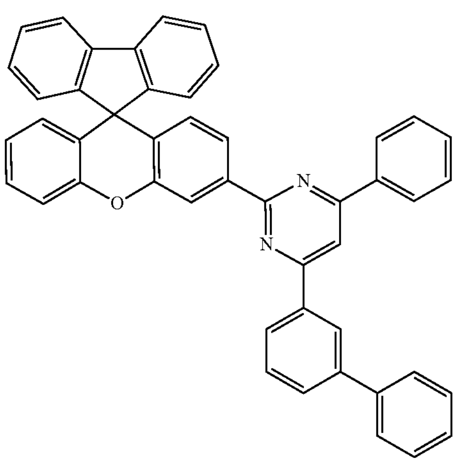
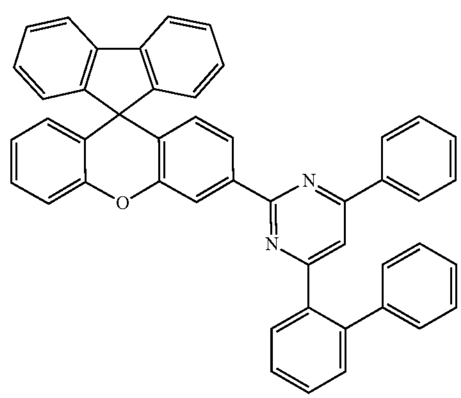

-continued
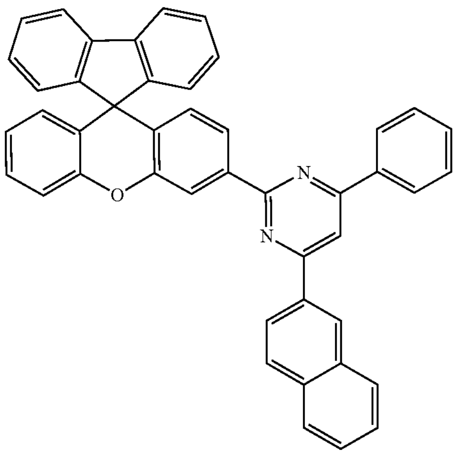
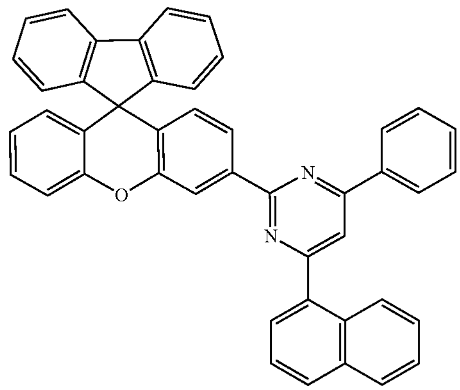
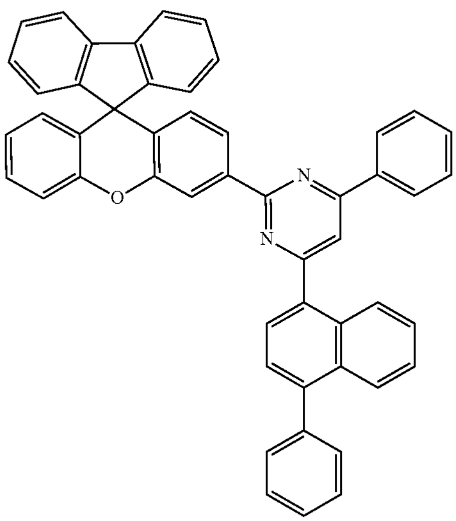
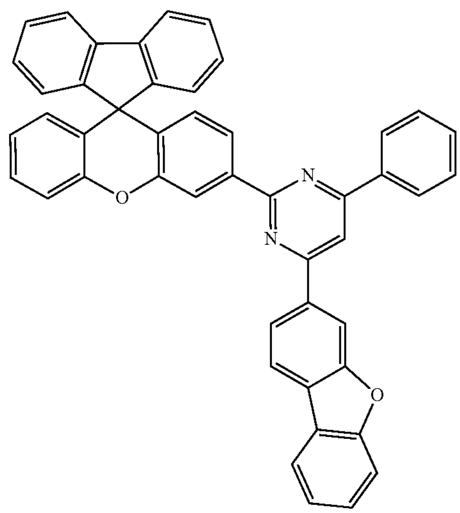
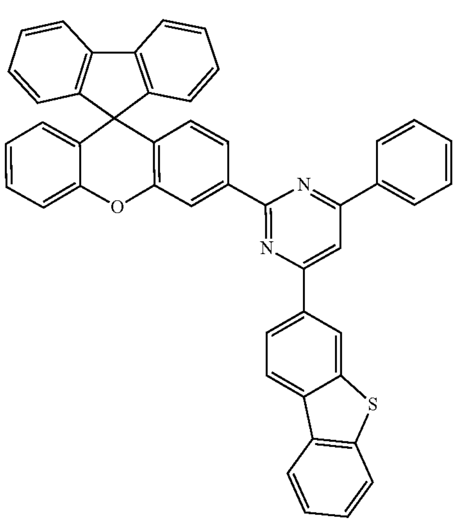
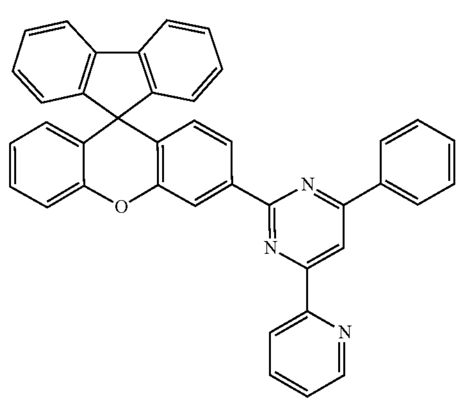

-continued
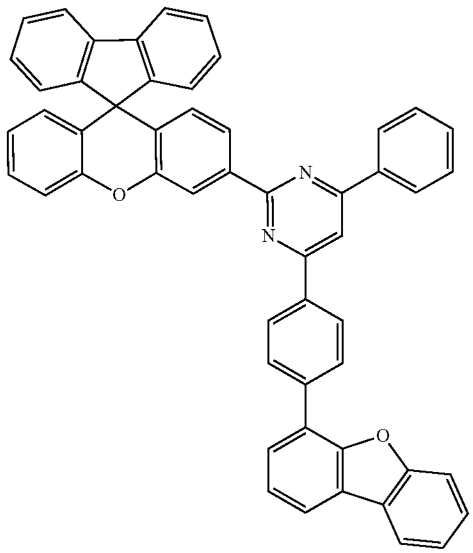
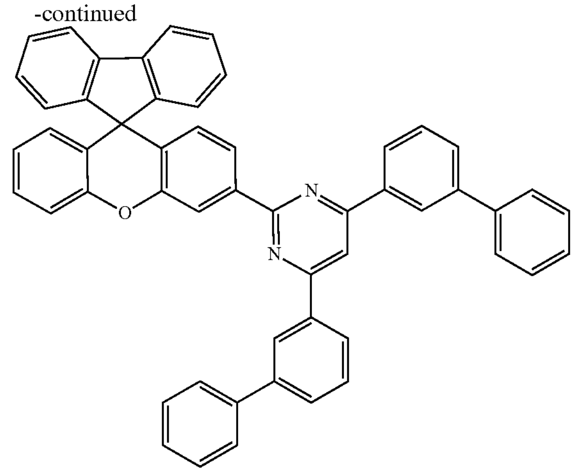
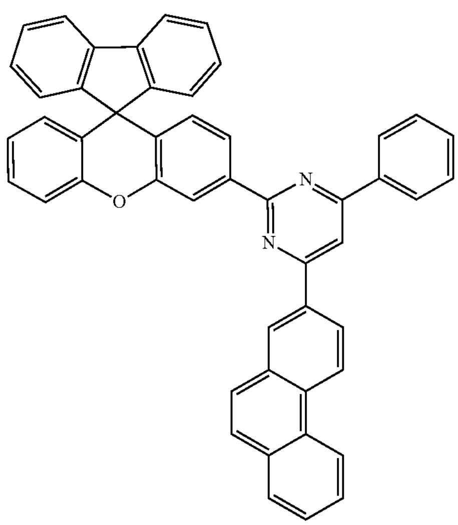
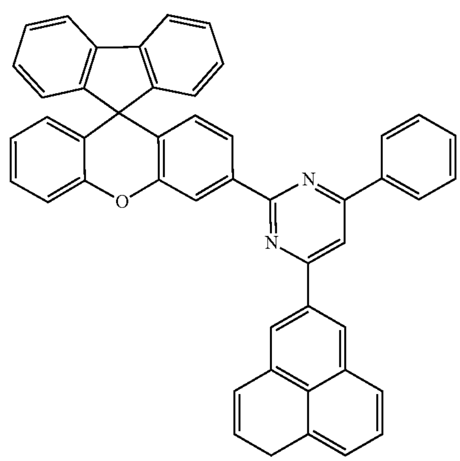
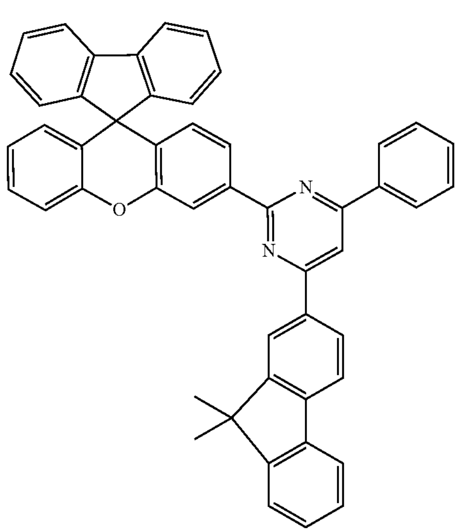
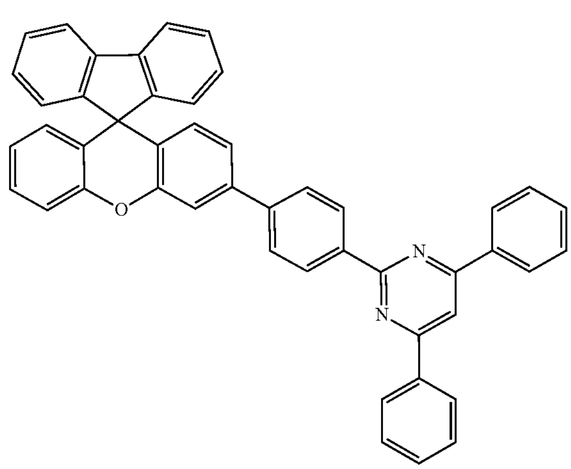

-continued
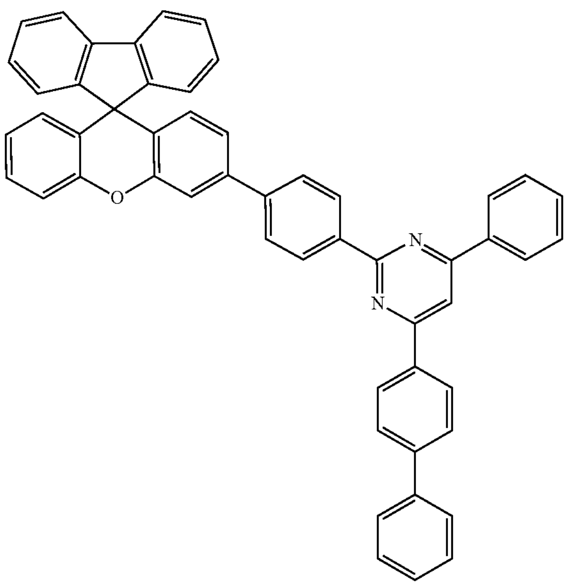
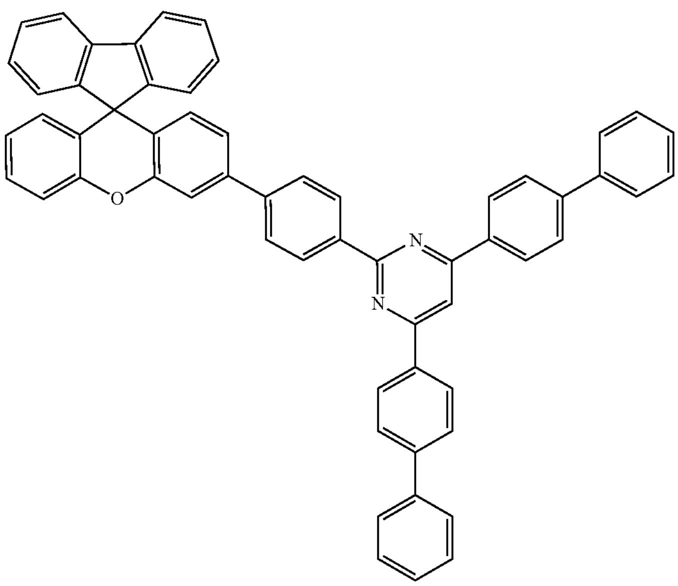
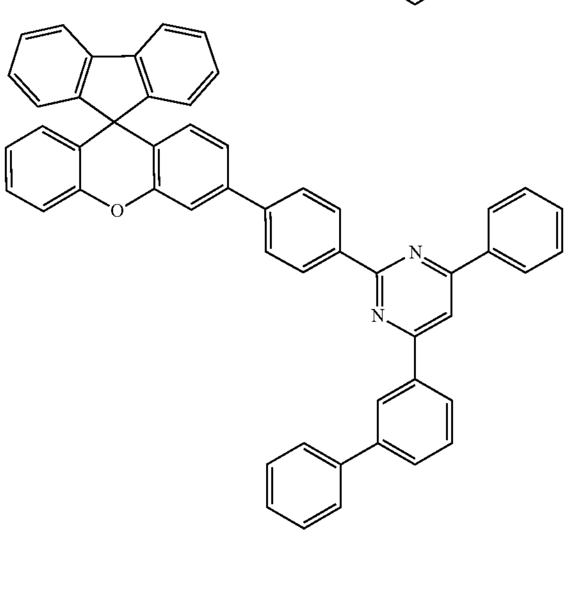
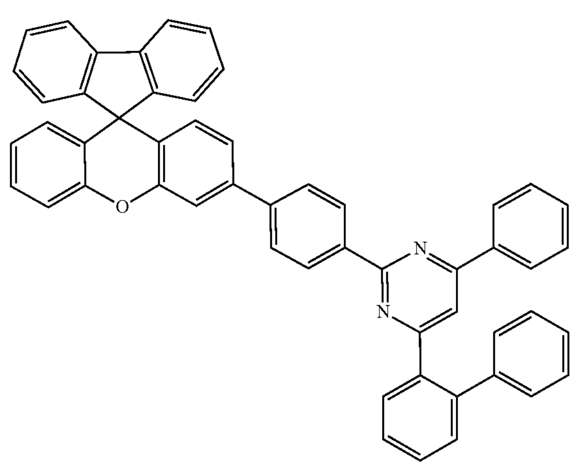

-continued
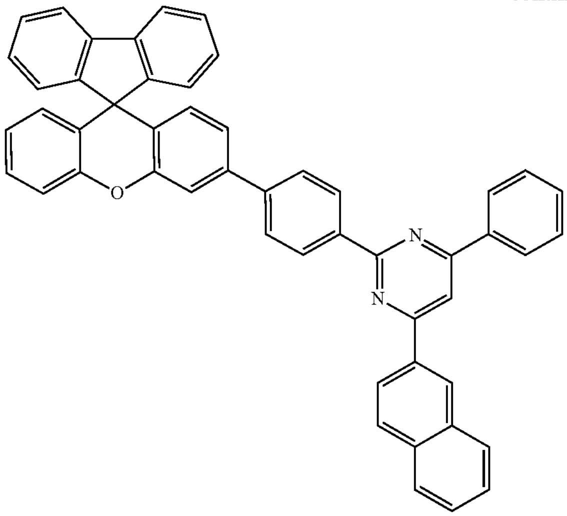
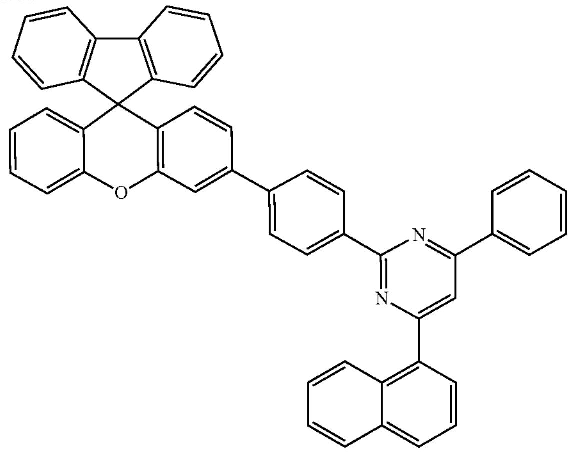
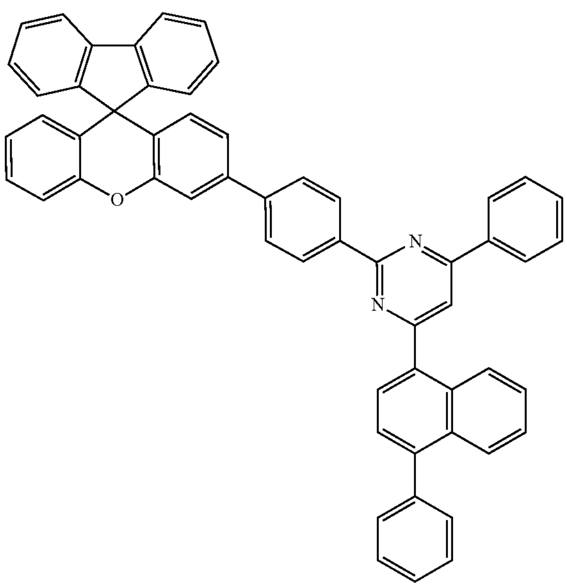
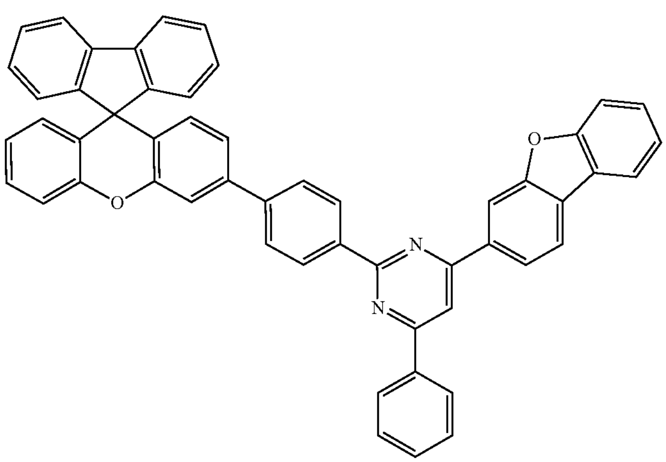

-continued
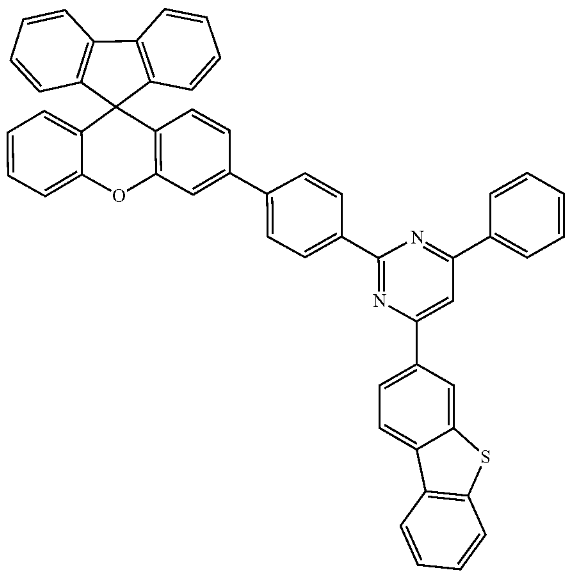
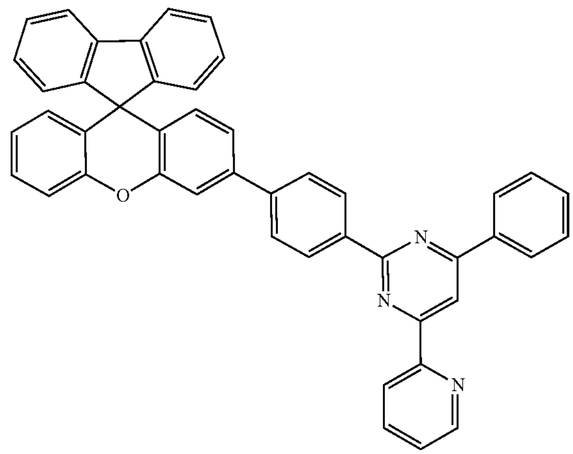
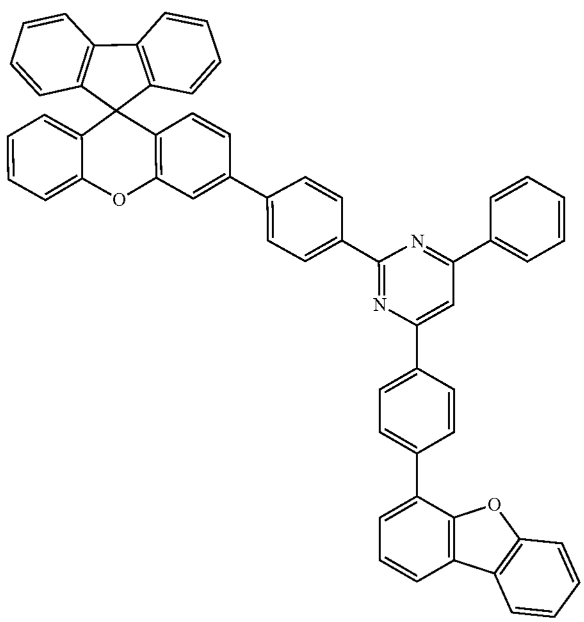
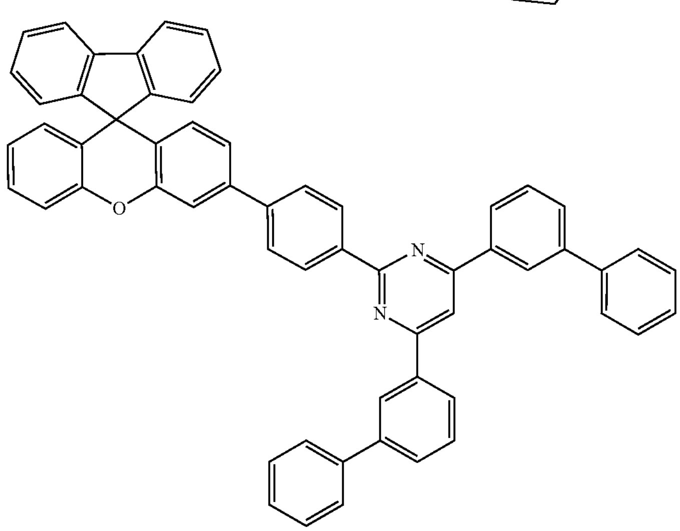

-continued
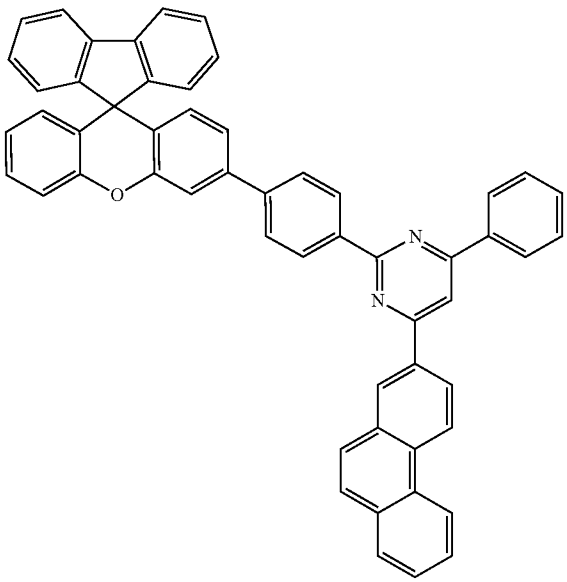
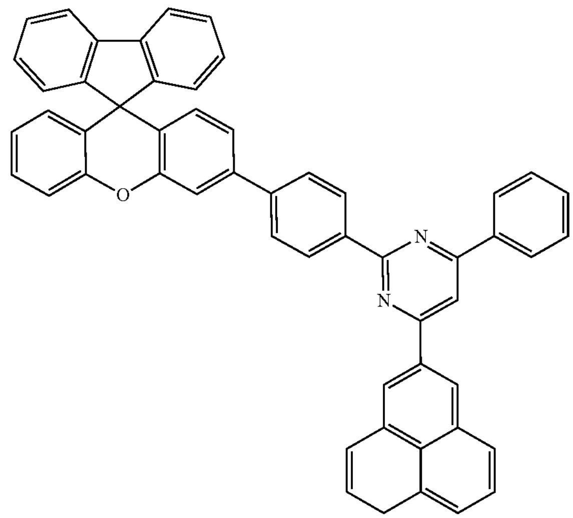
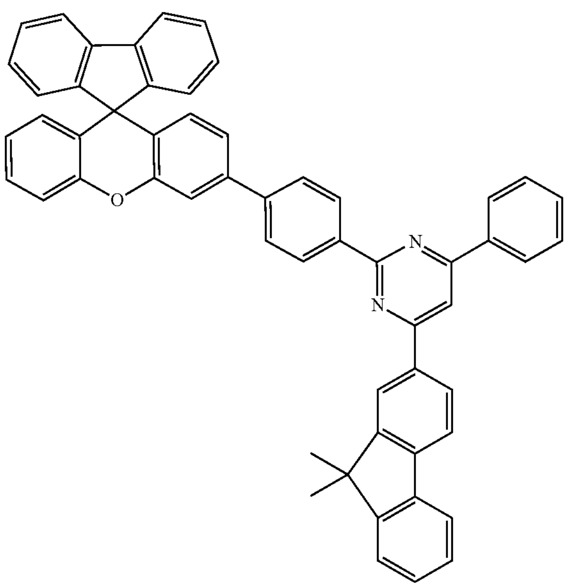
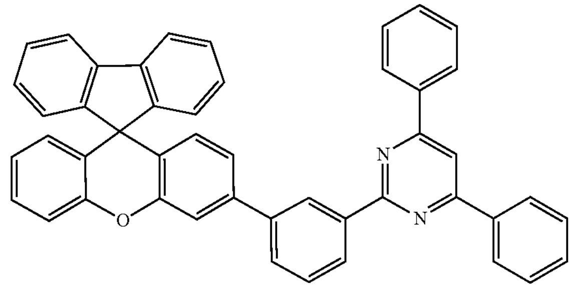
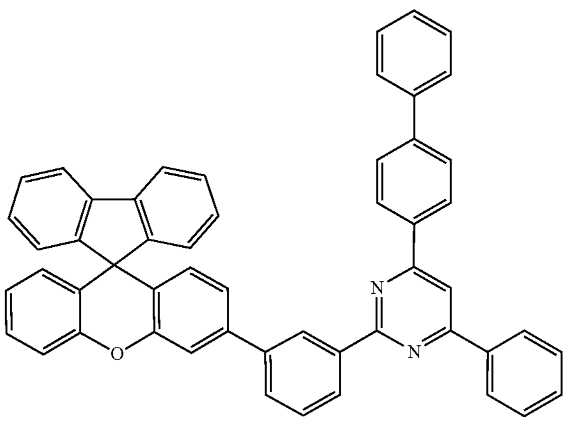

-continued
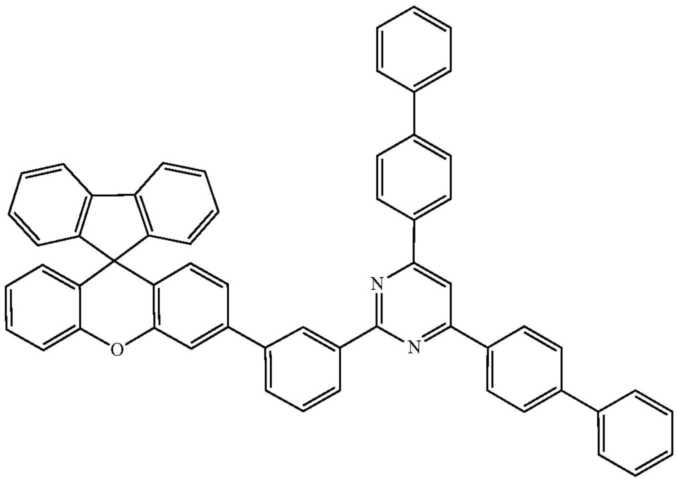
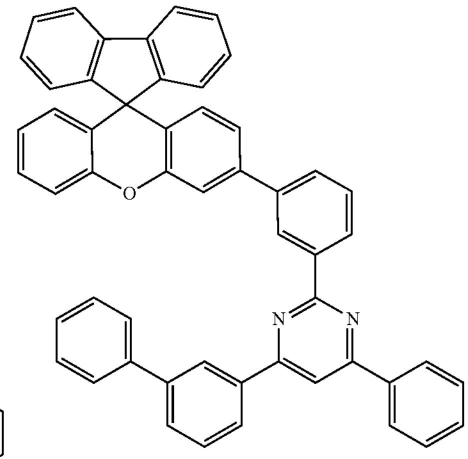
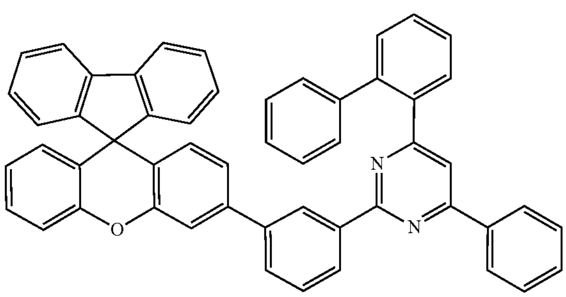
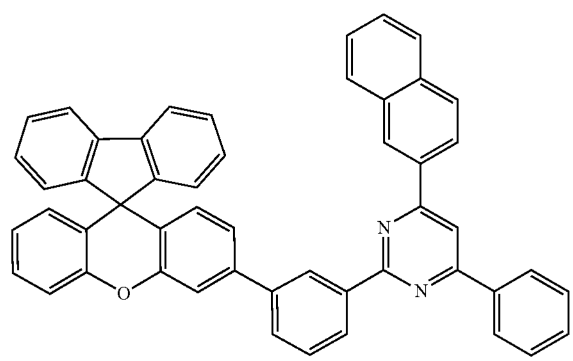
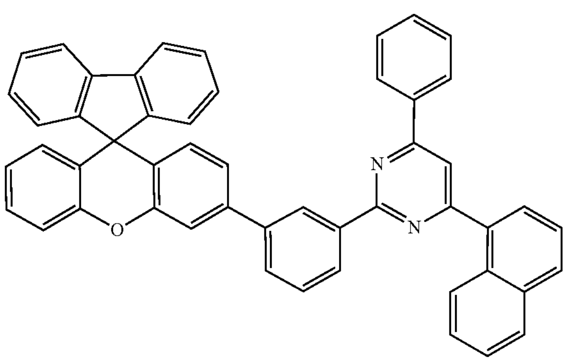
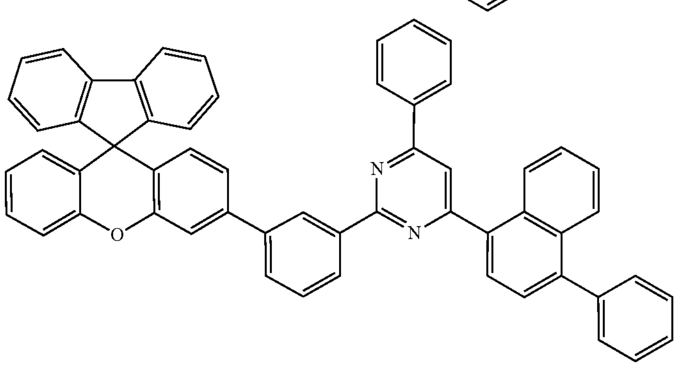

-continued
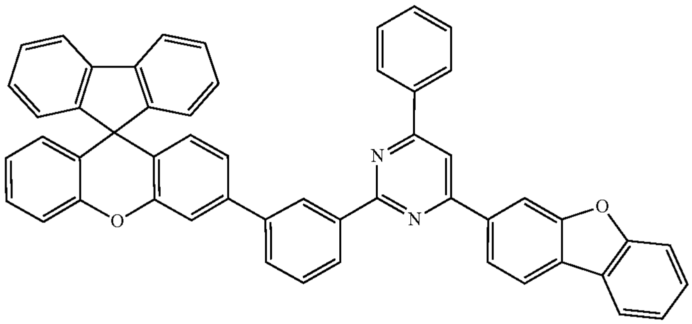
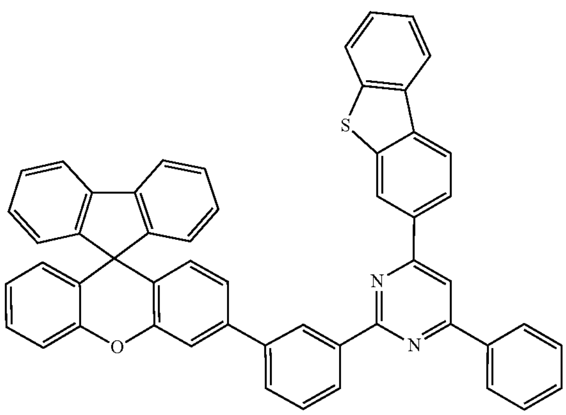
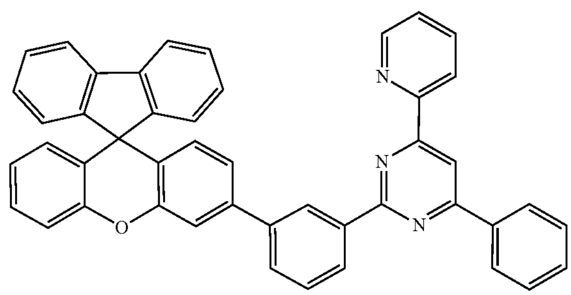
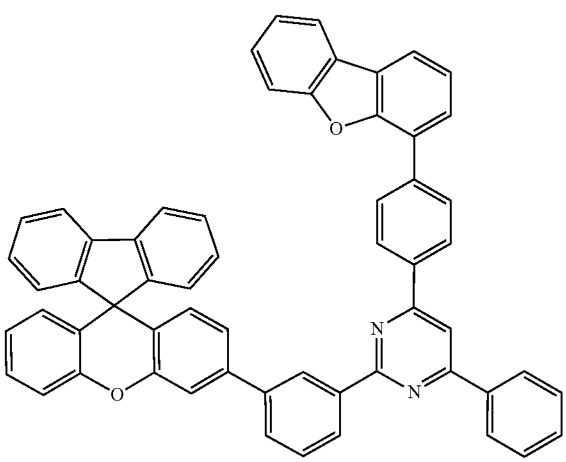
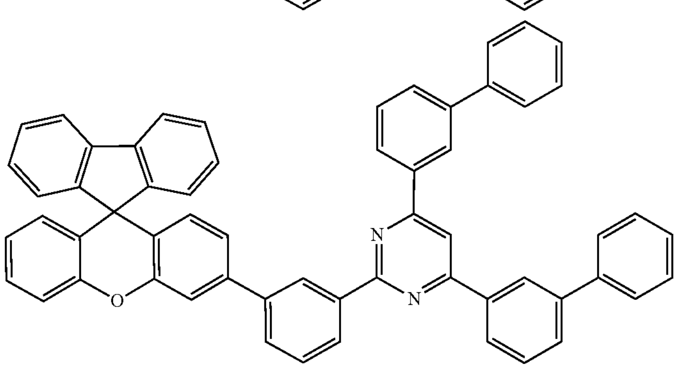

-continued
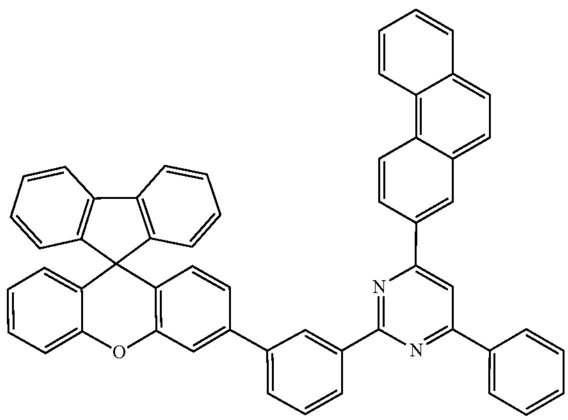
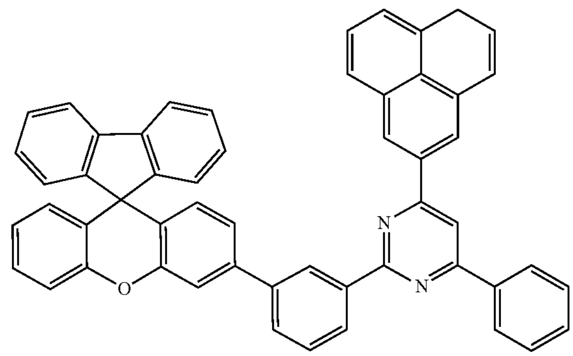
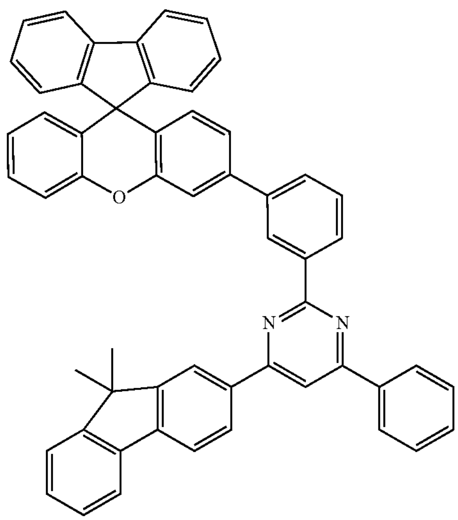
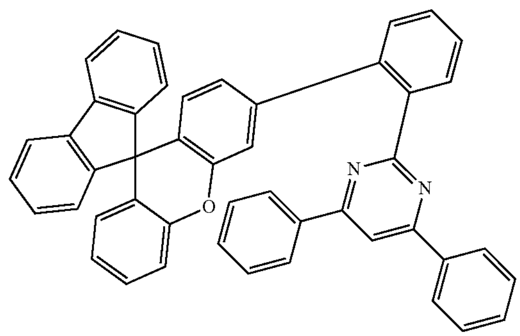
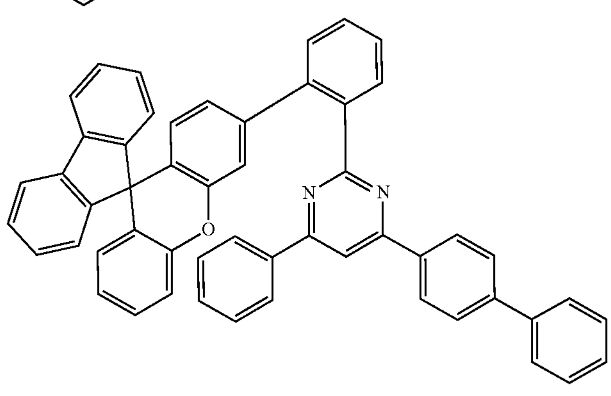
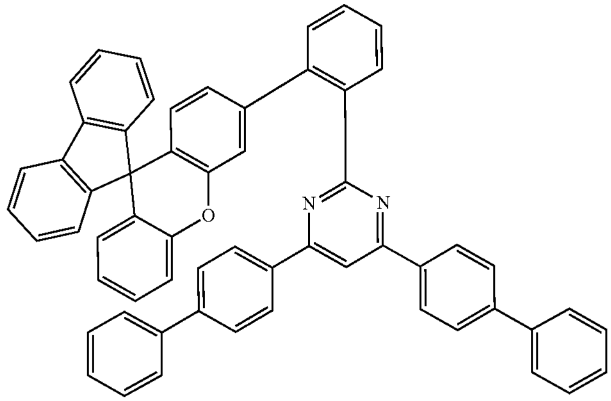

-continued
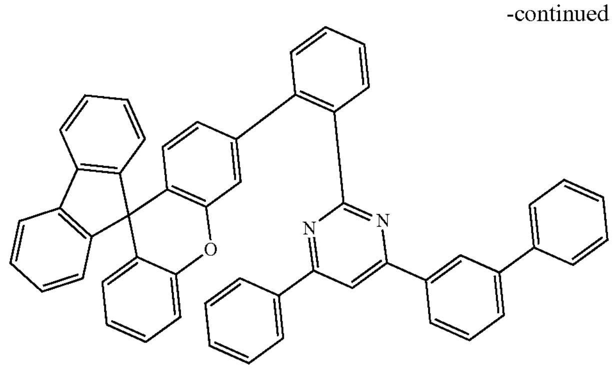
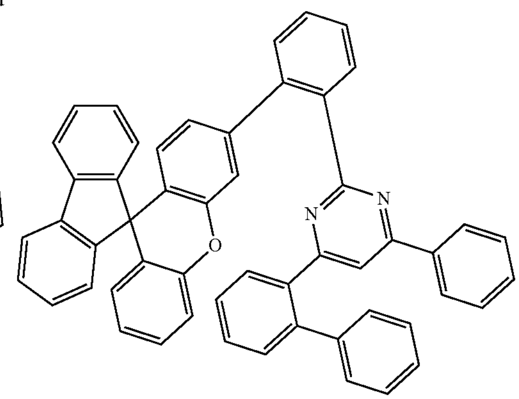
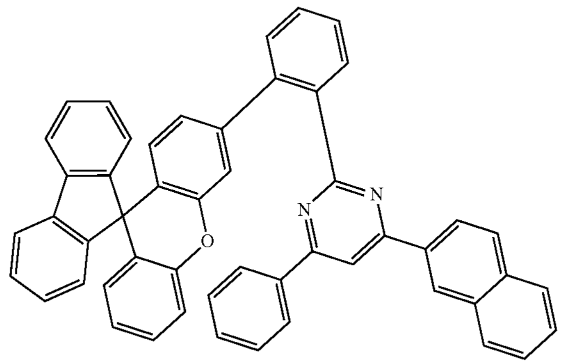
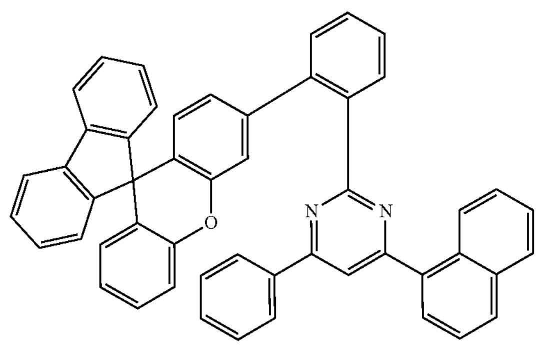
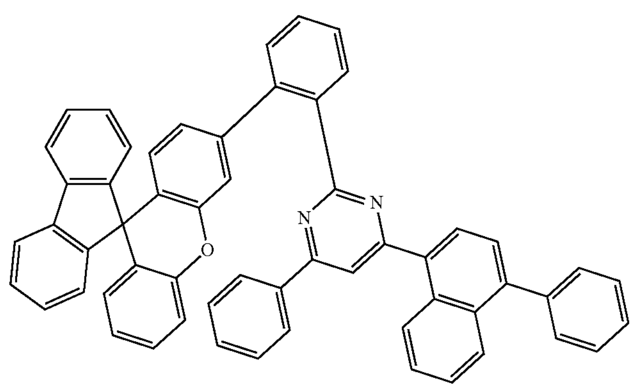
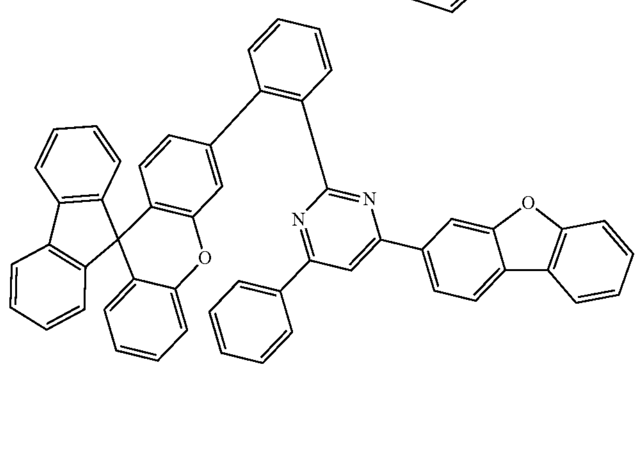
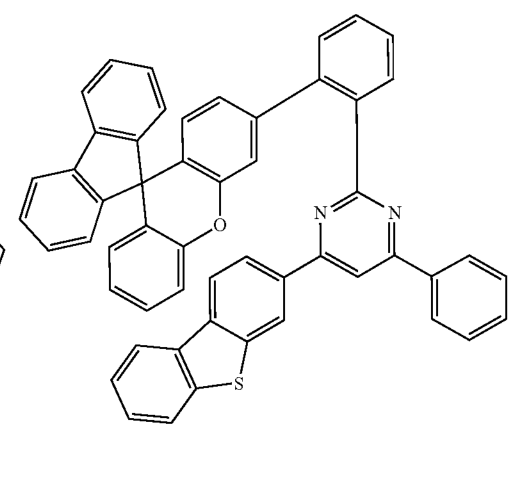

-continued
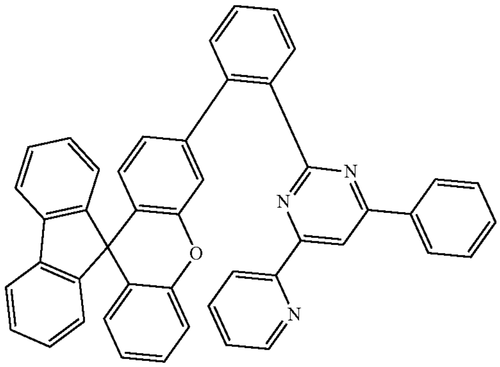
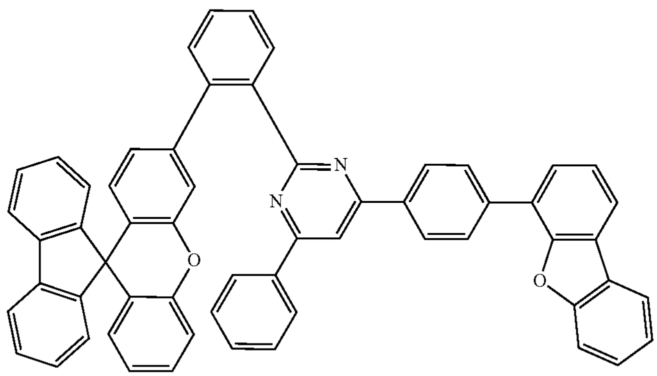
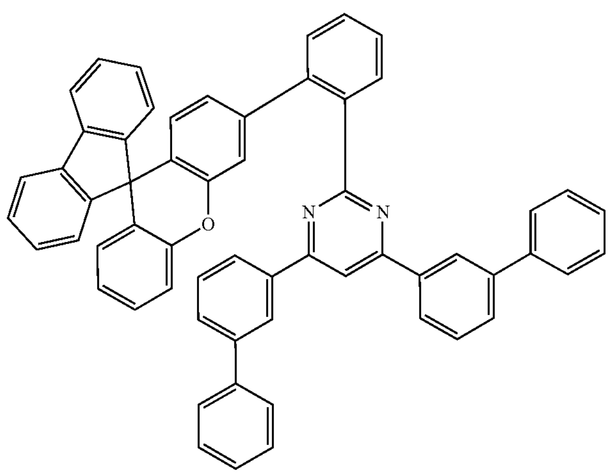
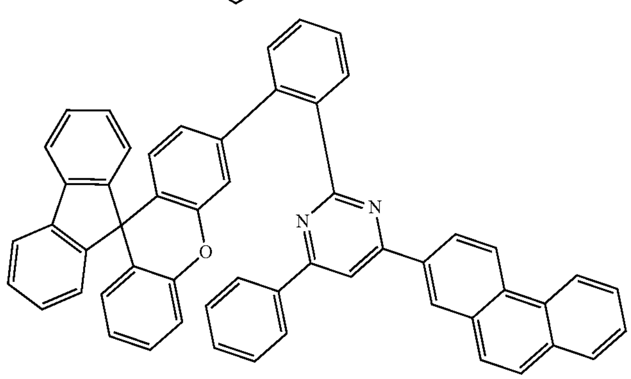

-continued
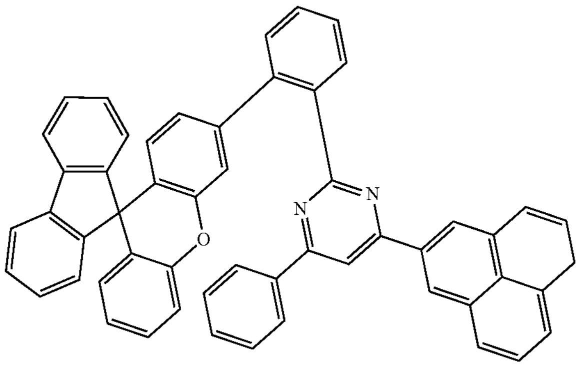
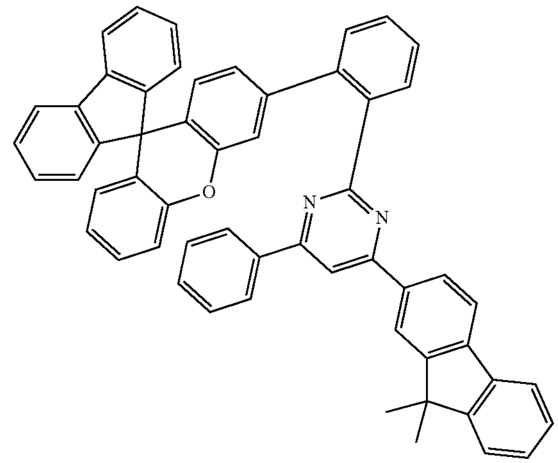
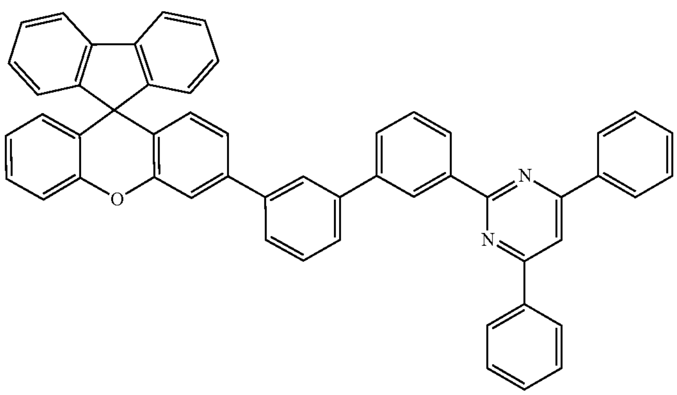
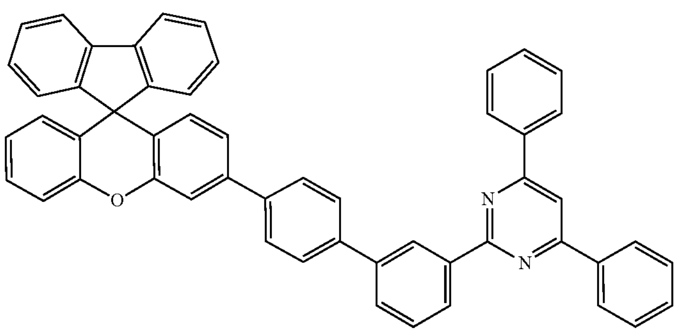
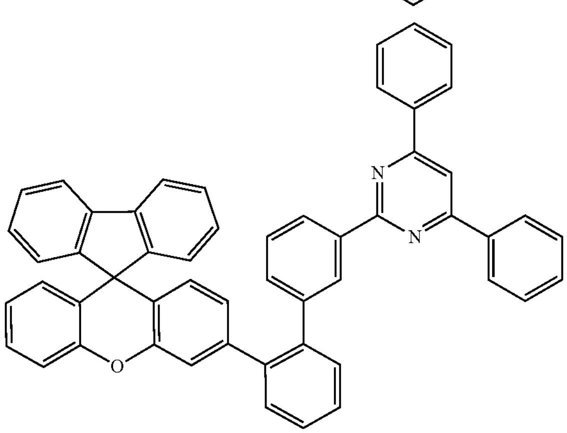
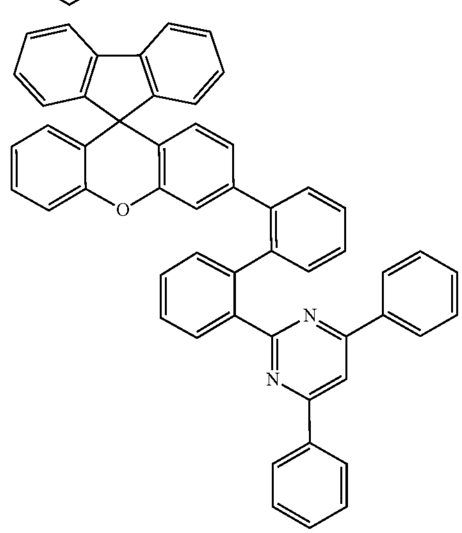

-continued
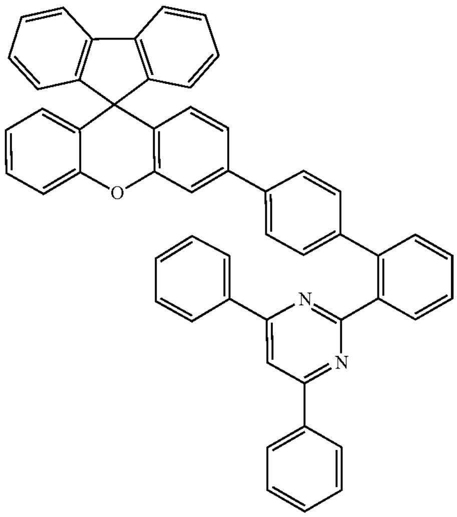
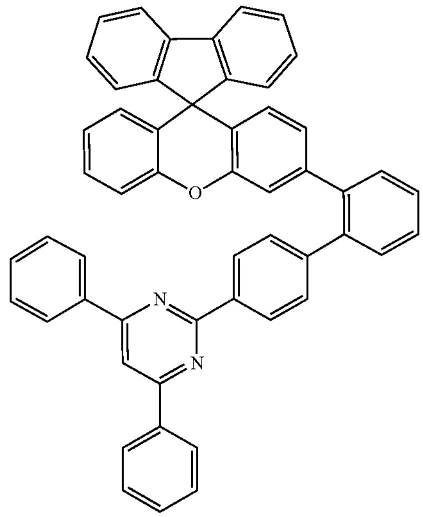
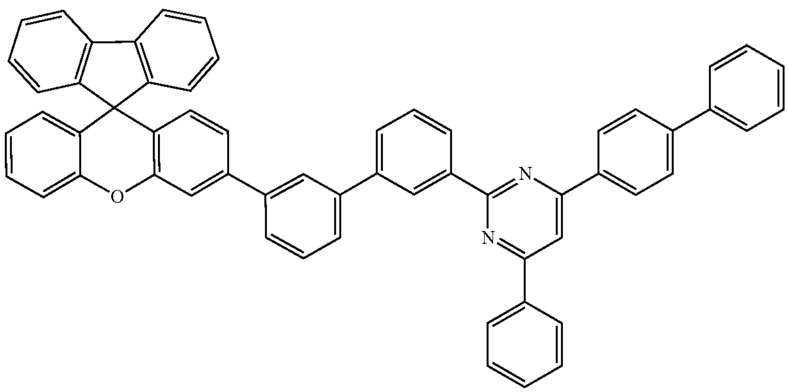
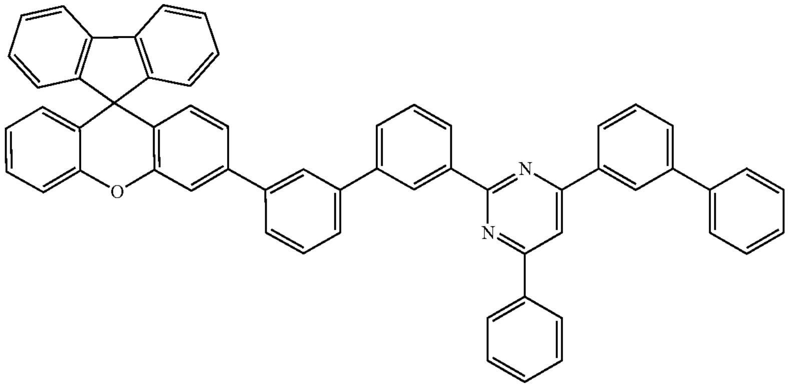

-continued
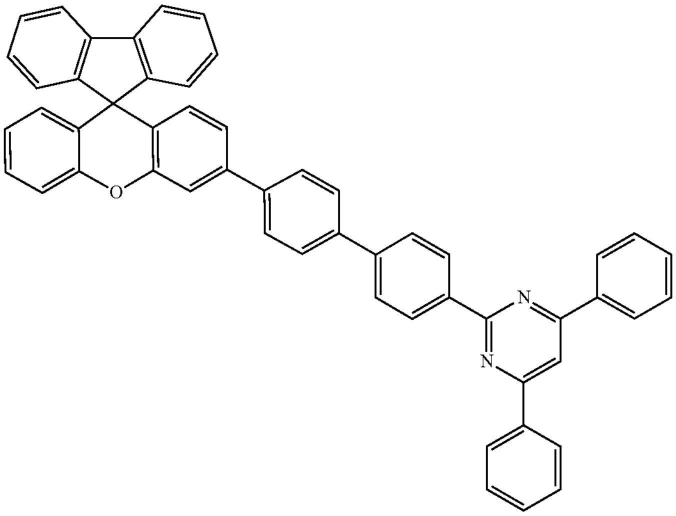
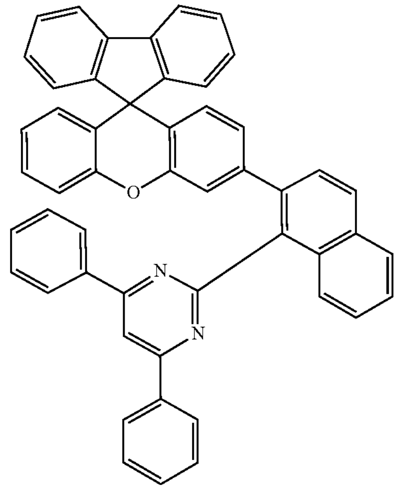
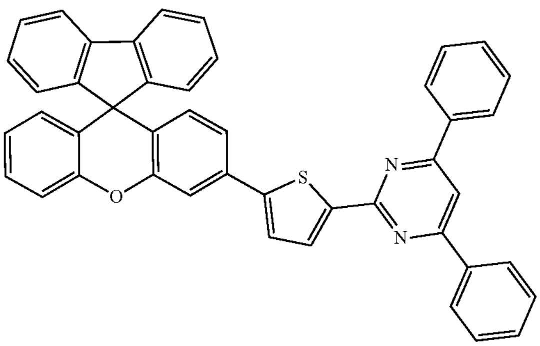
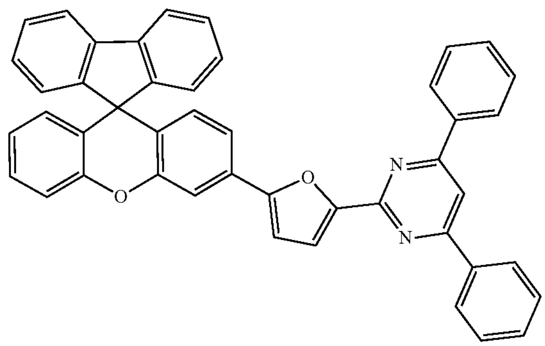
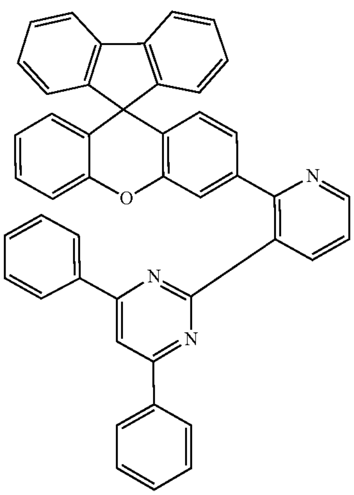
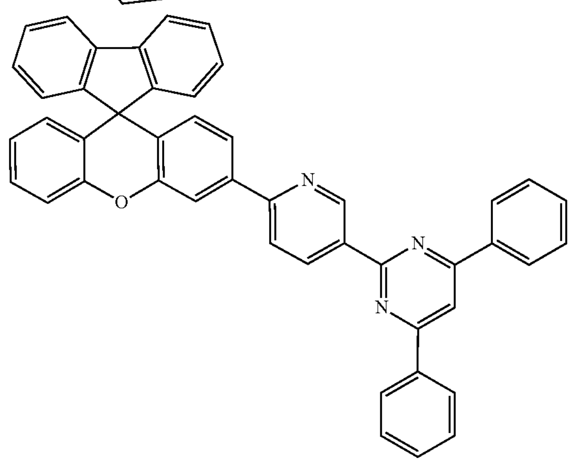
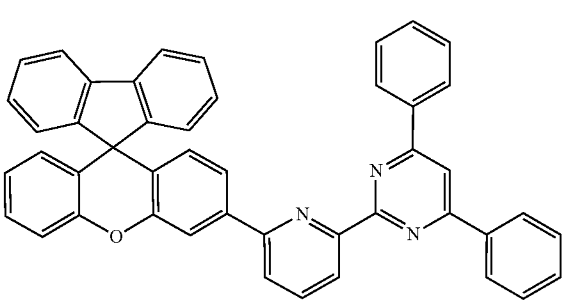

-continued
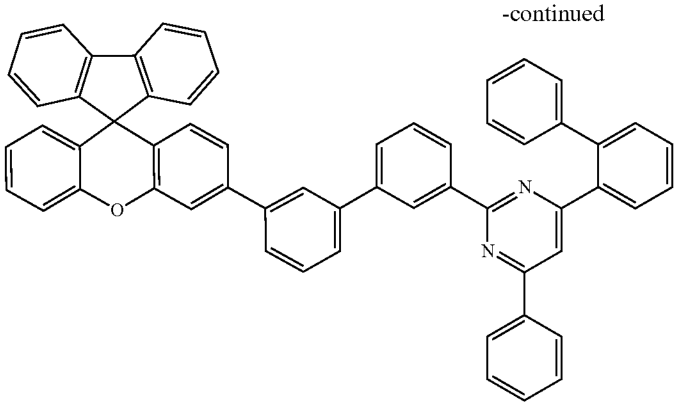
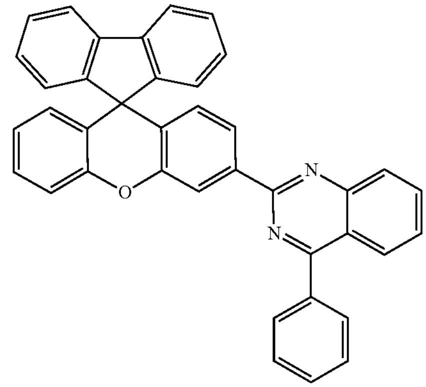
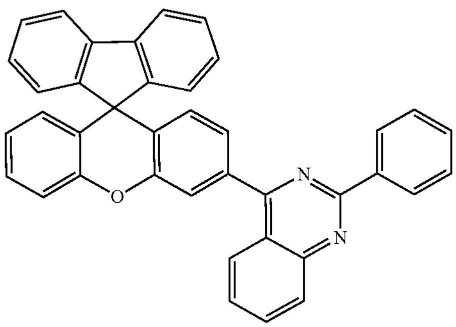
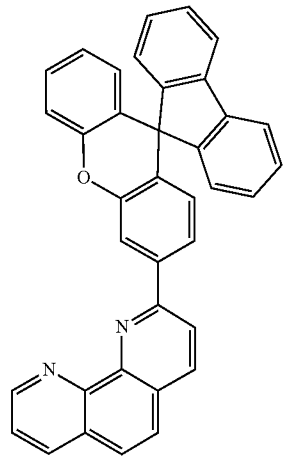
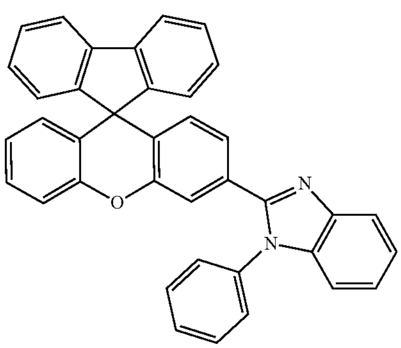
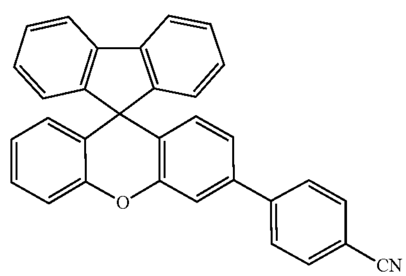
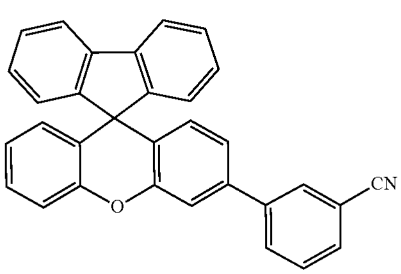
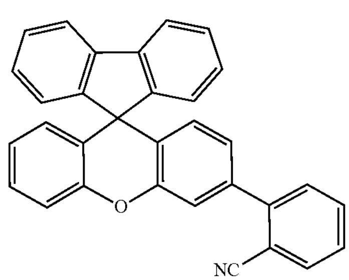

-continued
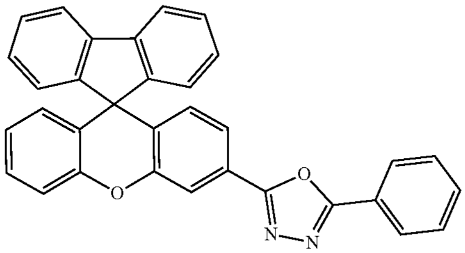
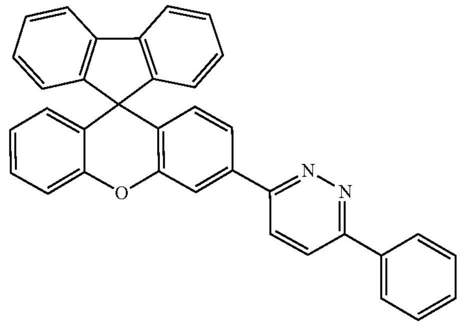
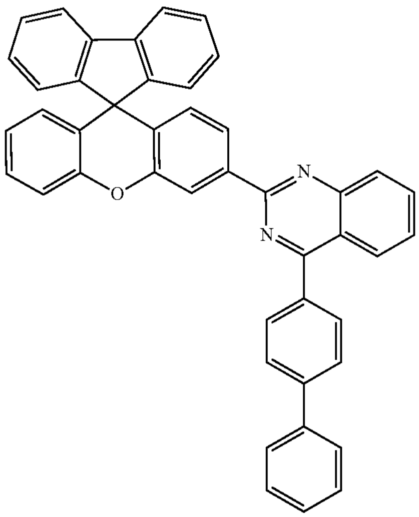
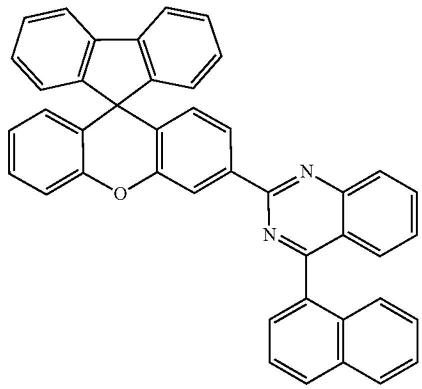
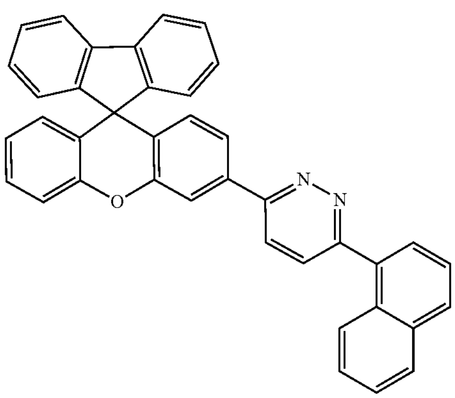
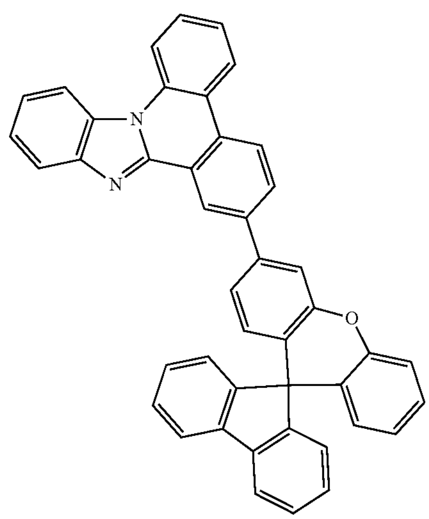

-continued
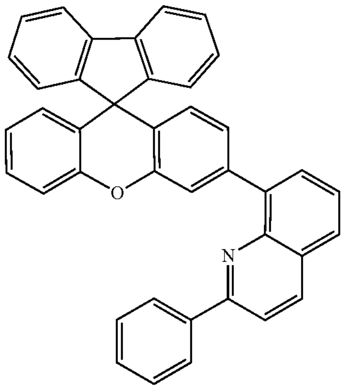
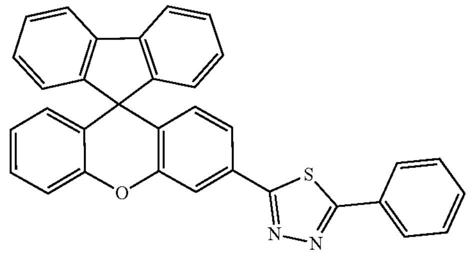
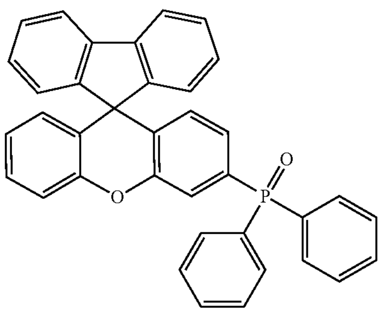
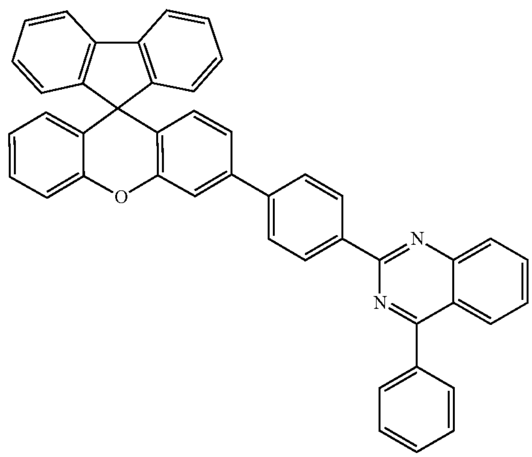
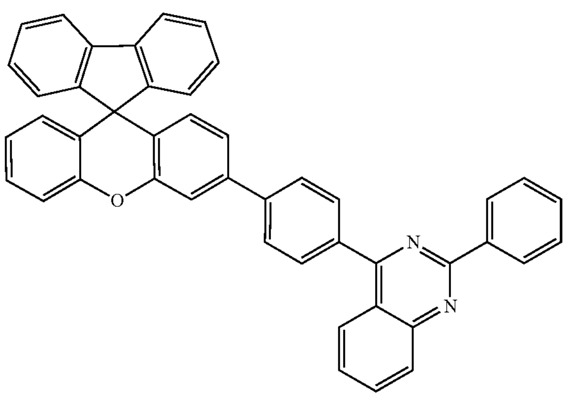
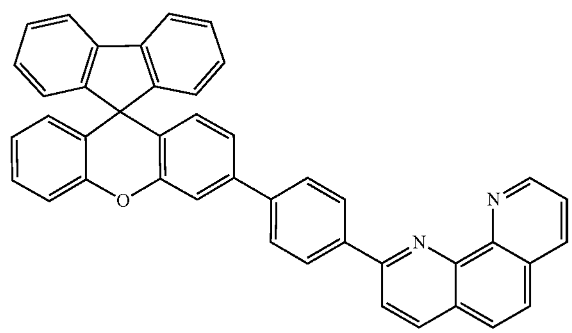
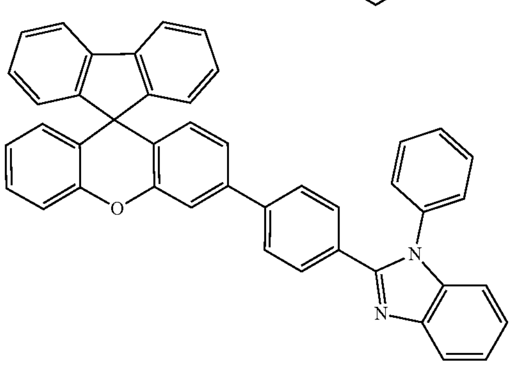
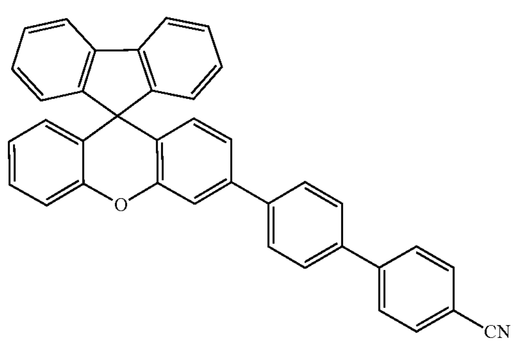

-continued
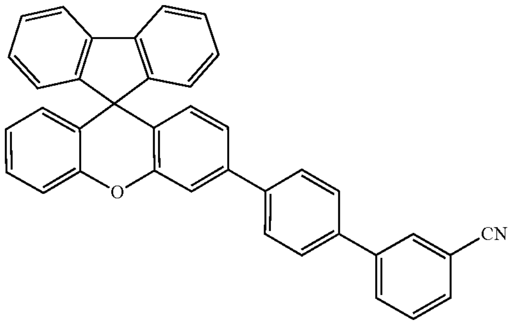
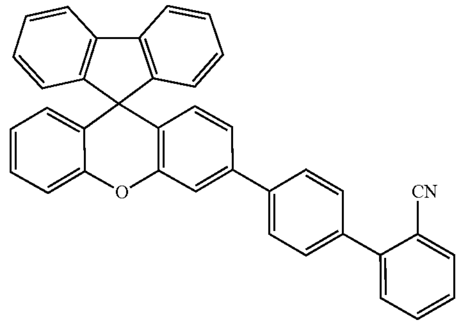
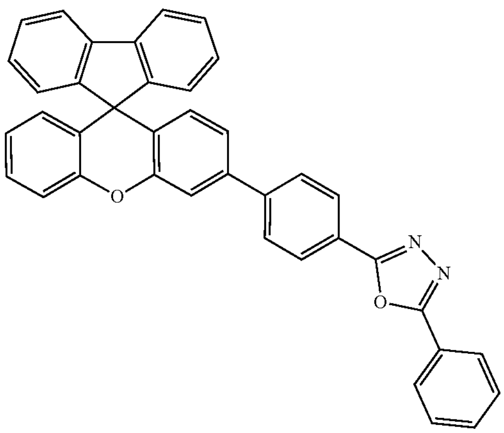
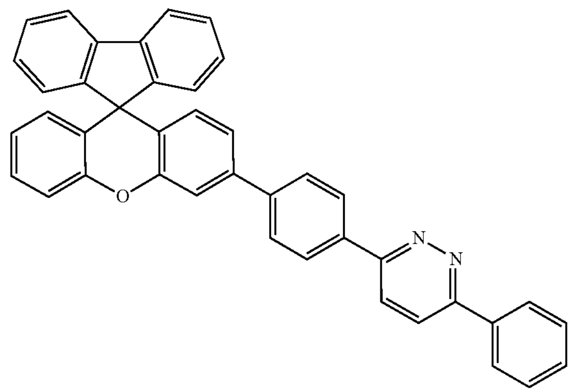
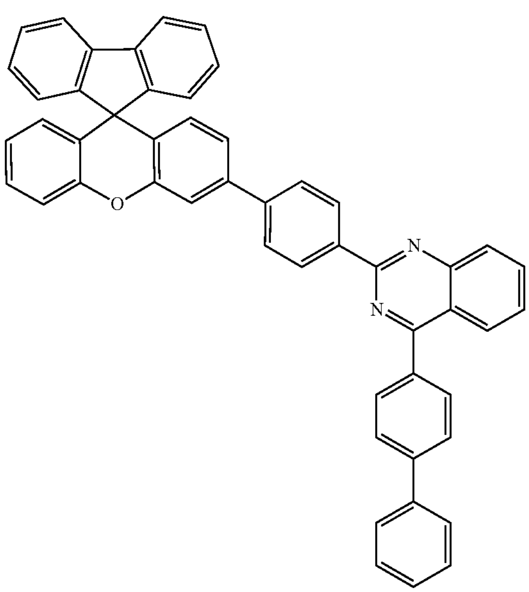
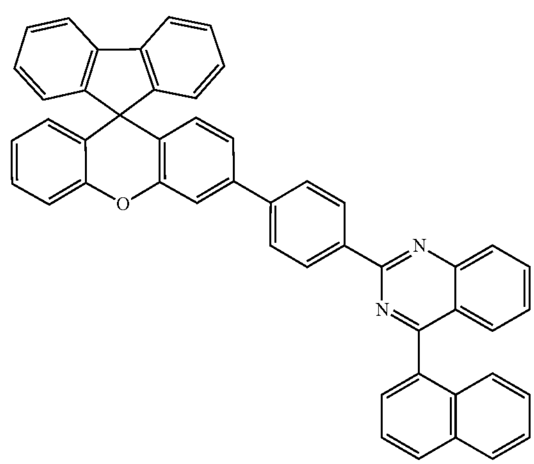

-continued
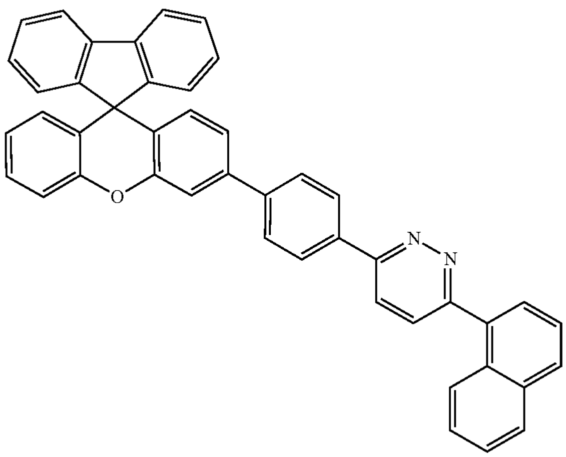
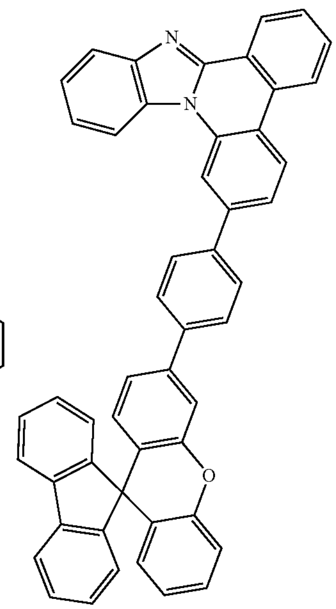
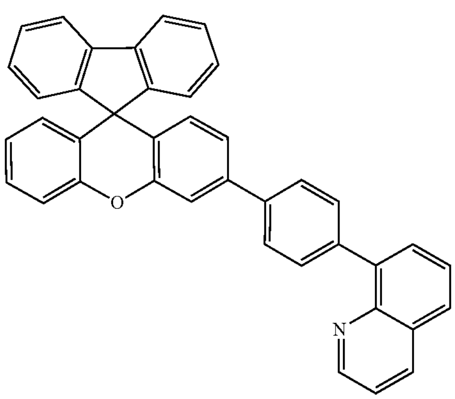
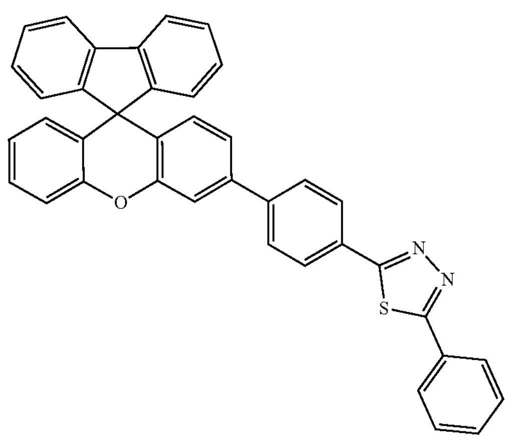
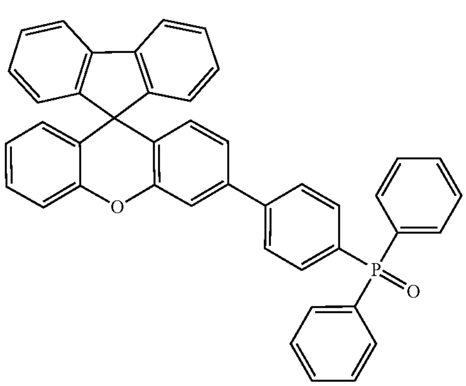
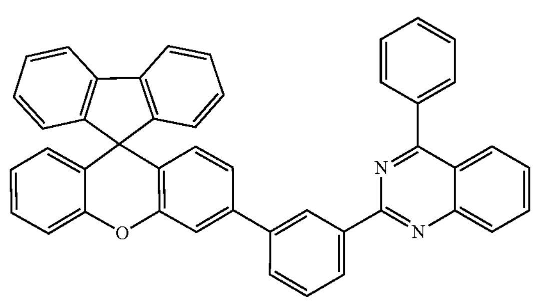

-continued
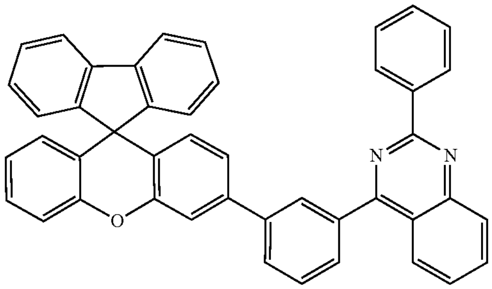
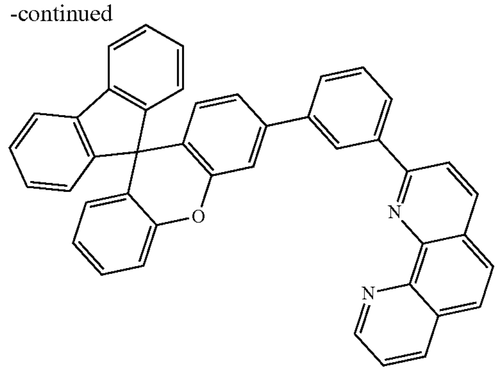
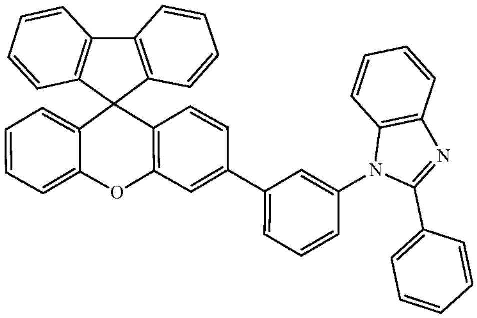
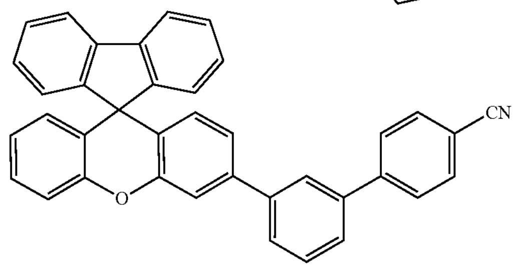
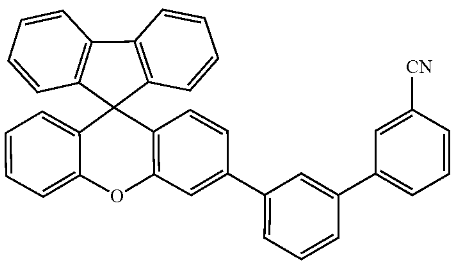
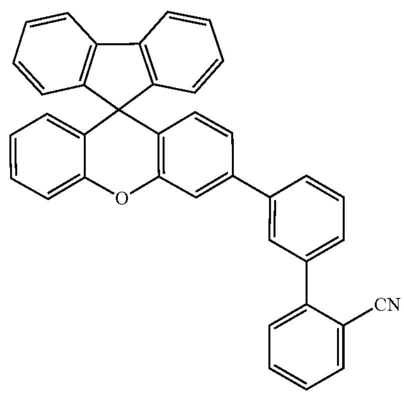
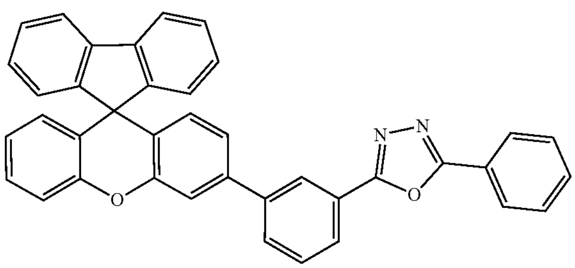
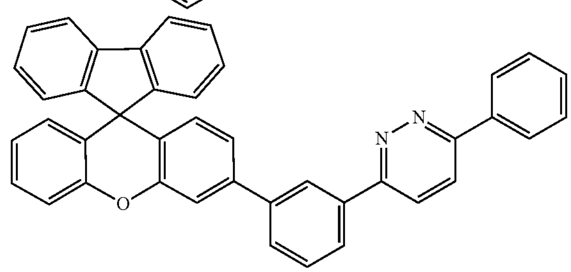
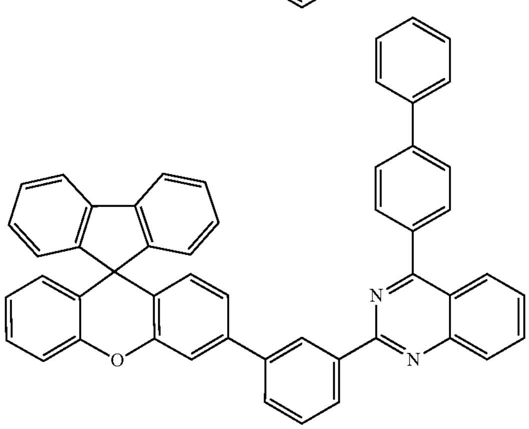
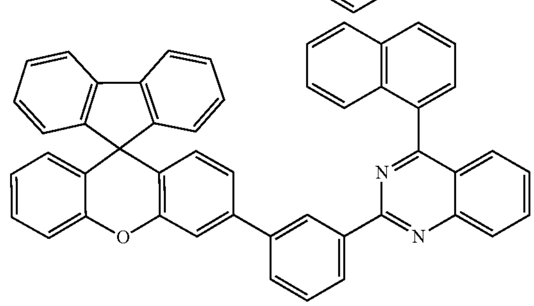

-continued
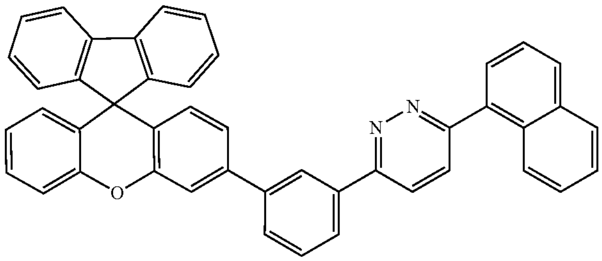
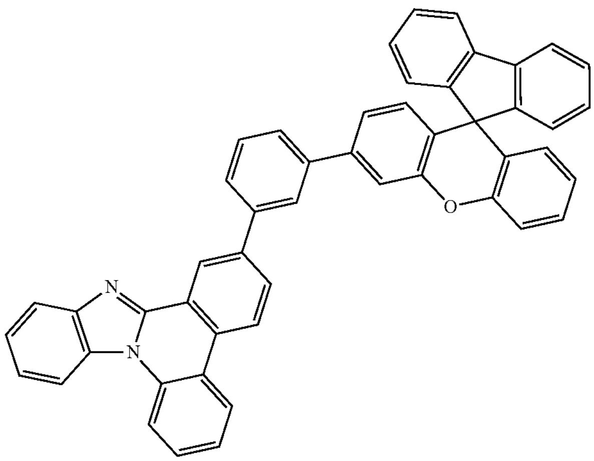
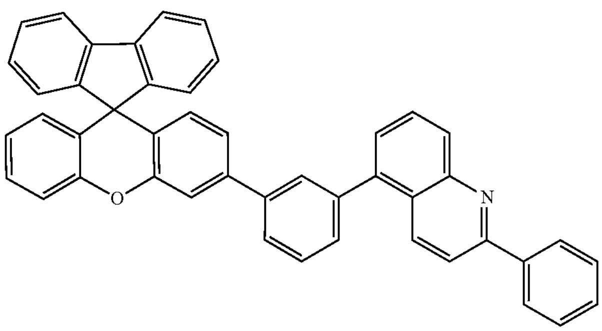
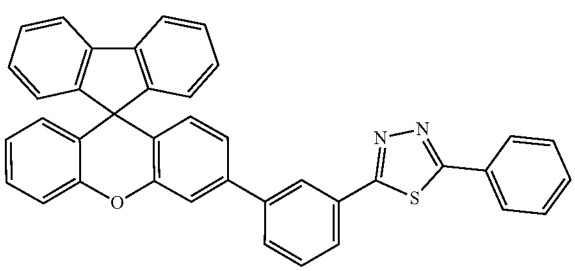
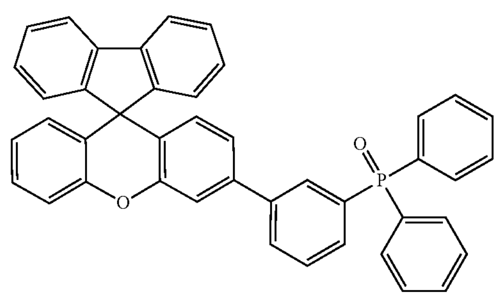
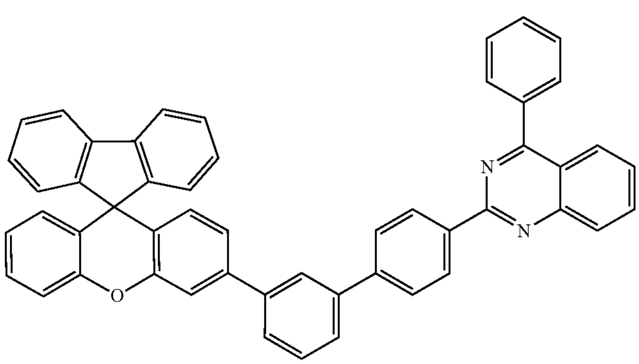

-continued
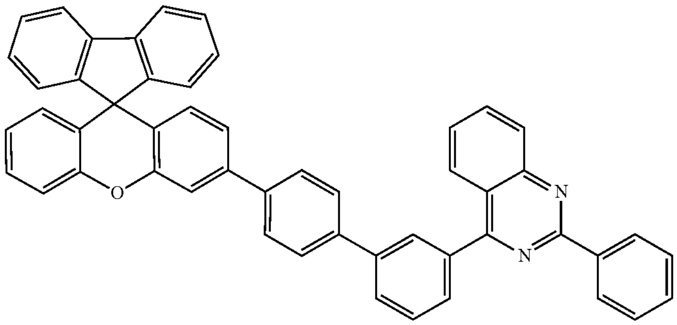
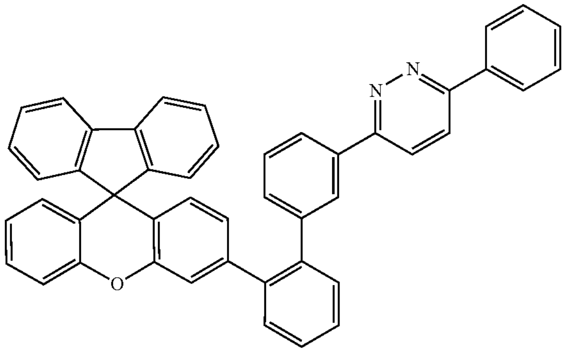
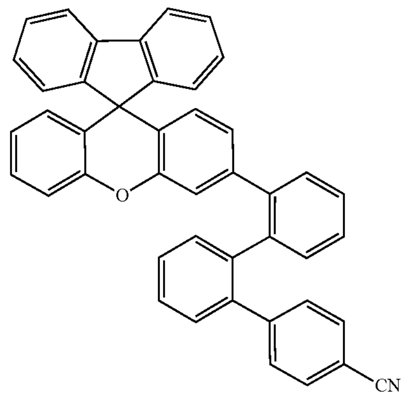
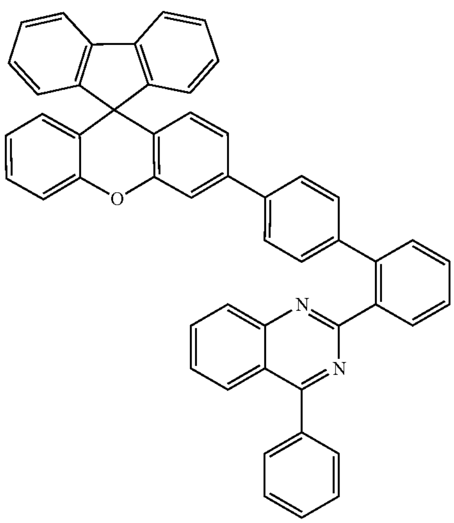
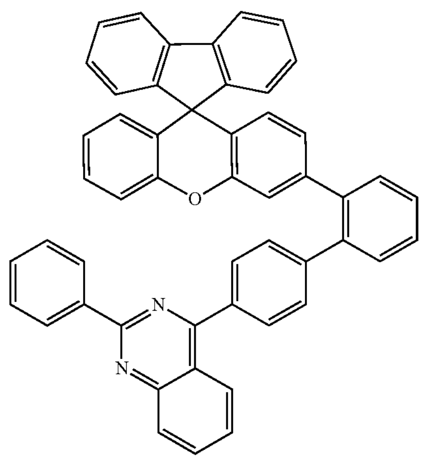
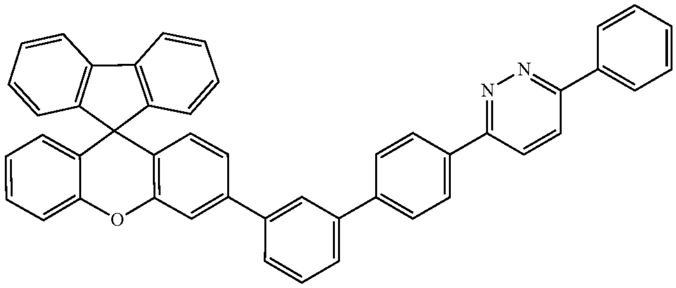

-continued
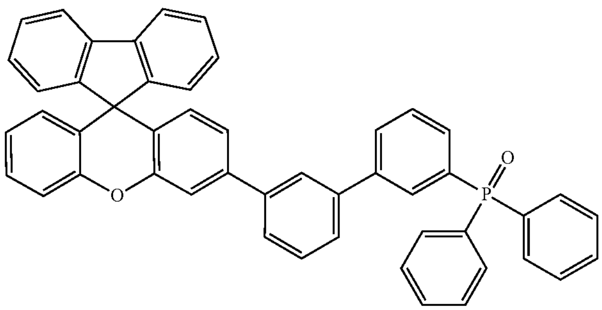
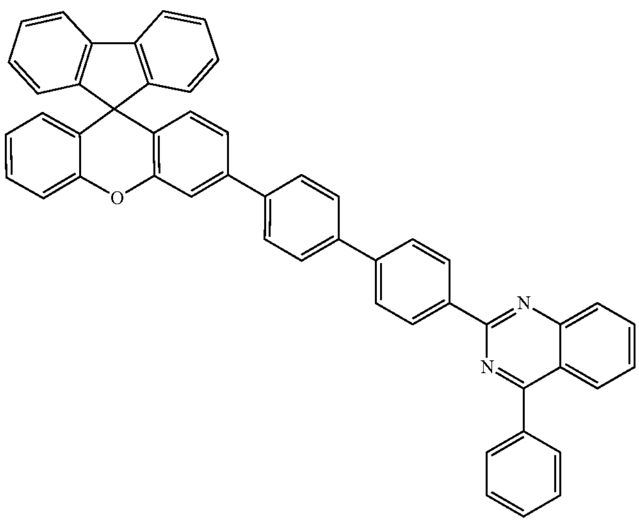
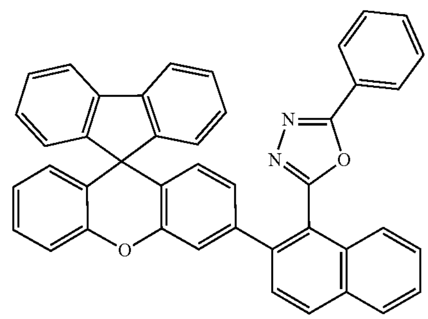
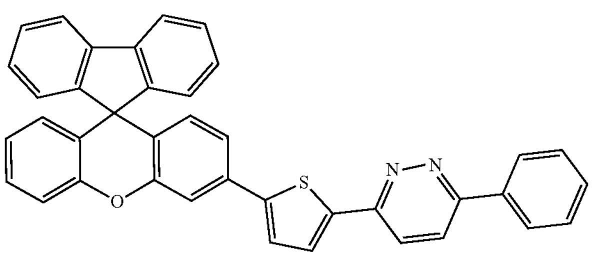
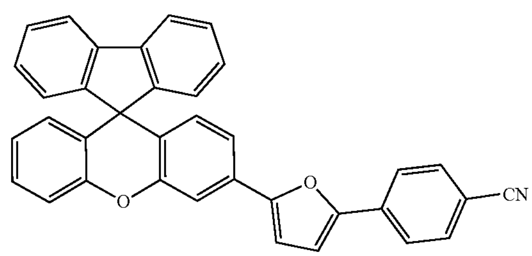
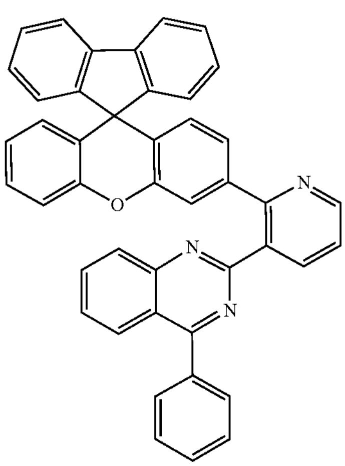
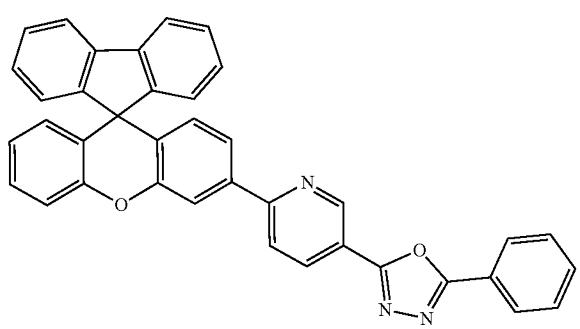

-continued
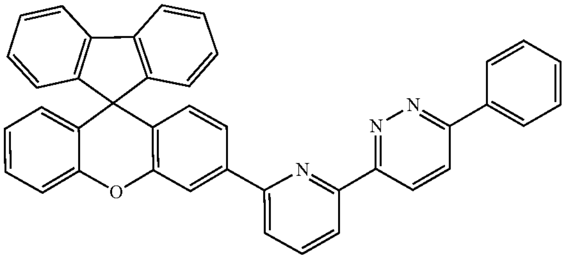
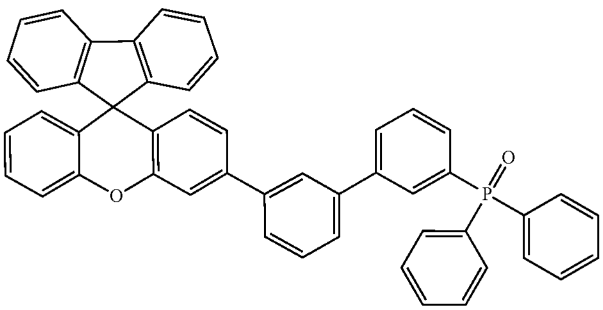
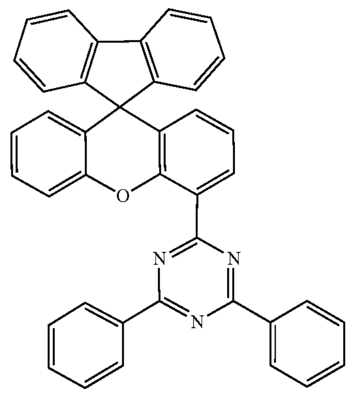
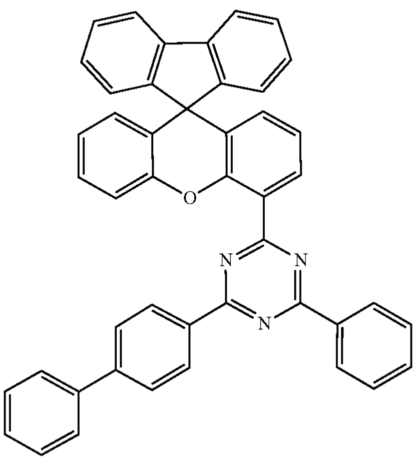
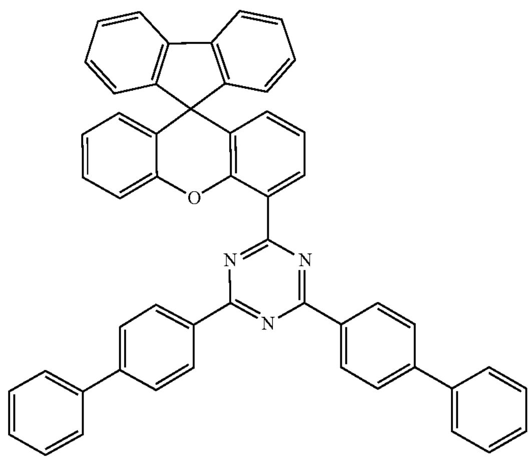
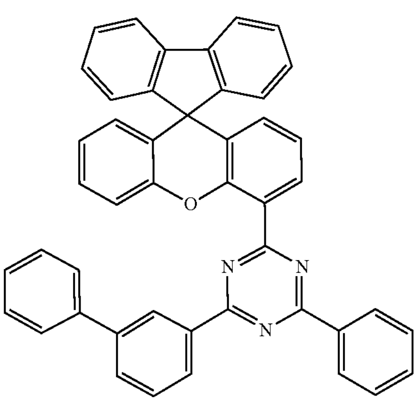
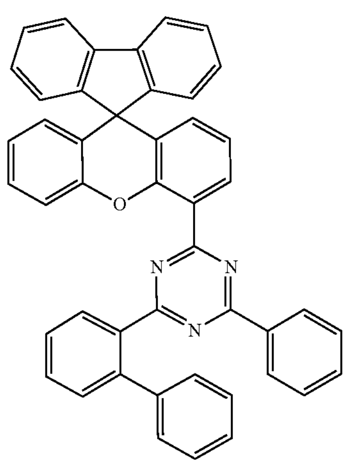
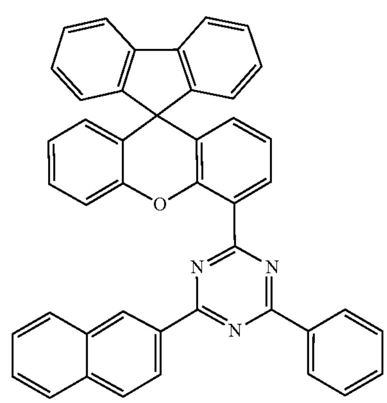

-continued
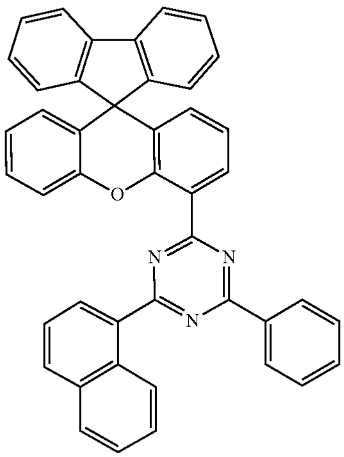
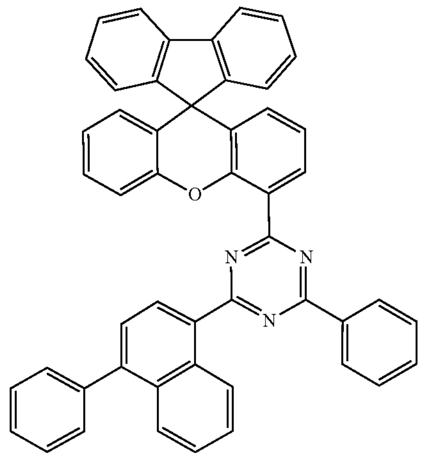
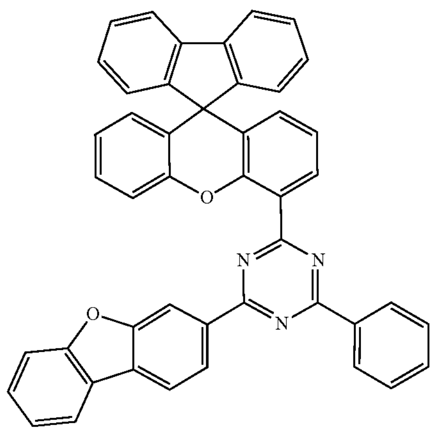
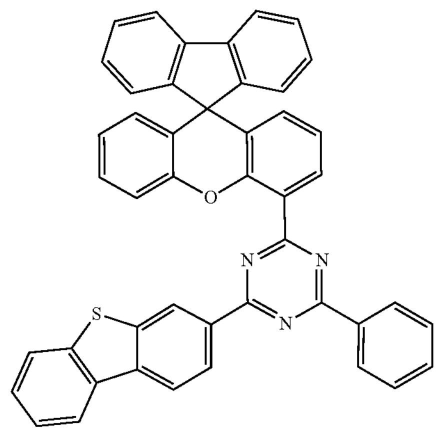
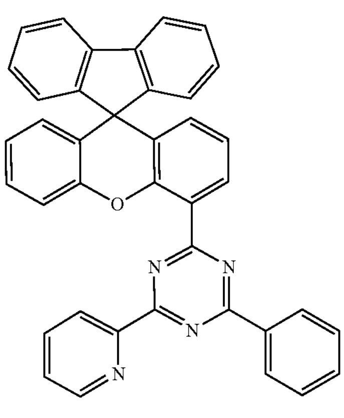
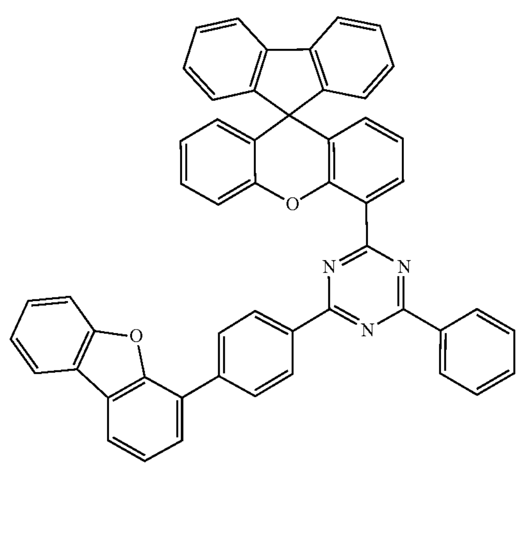

-continued
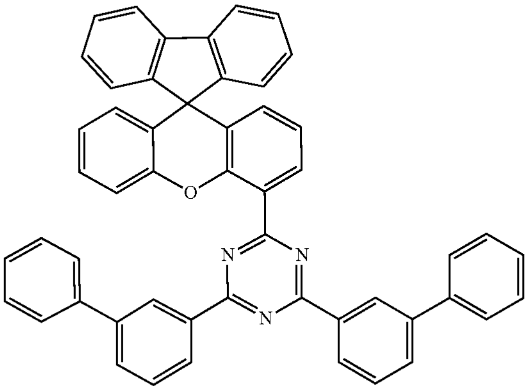
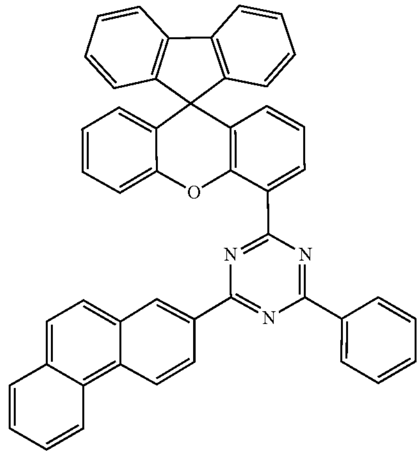
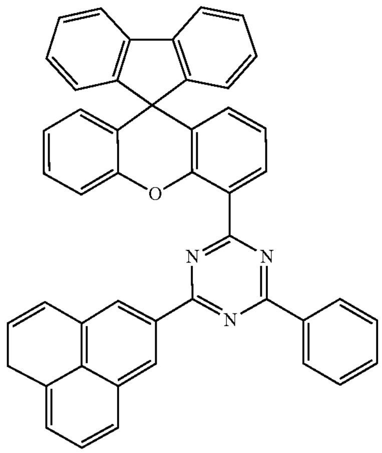
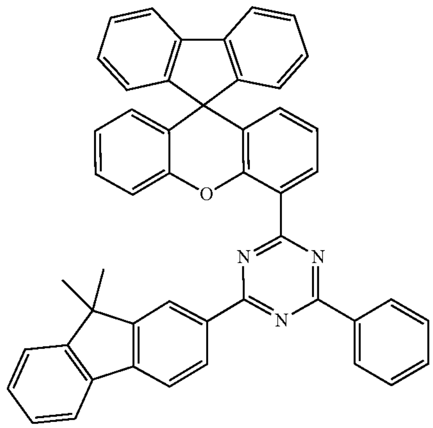
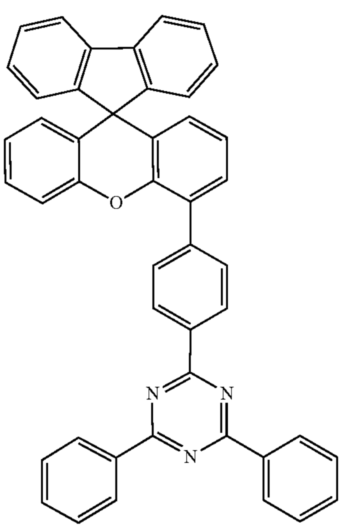
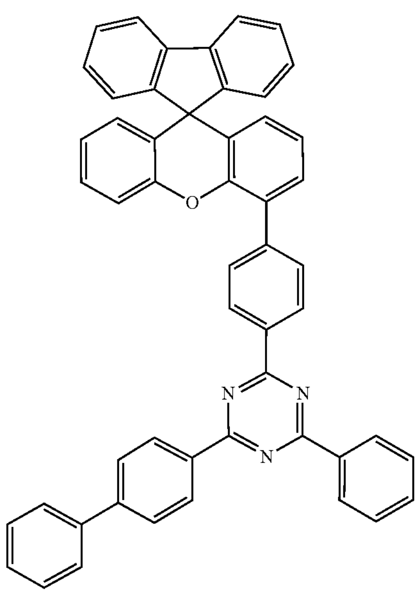

-continued
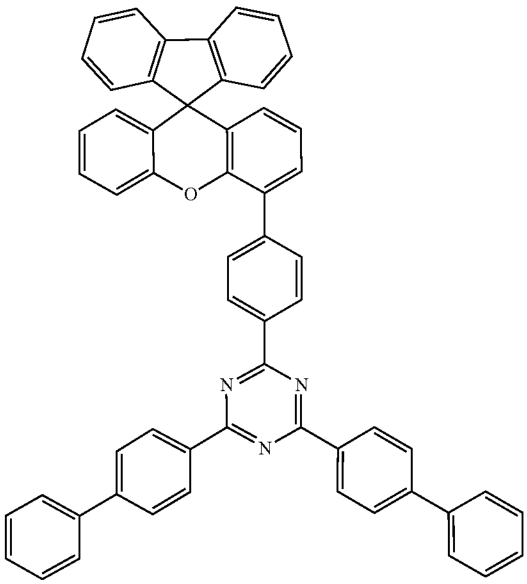
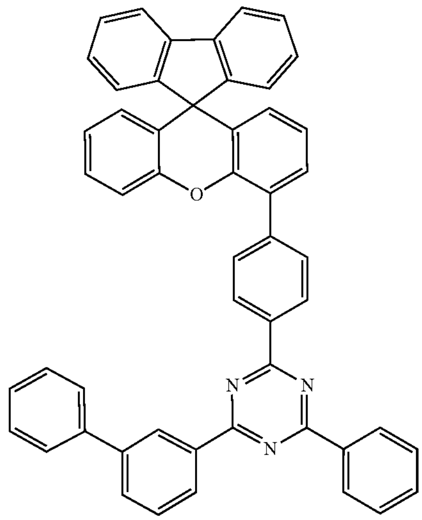
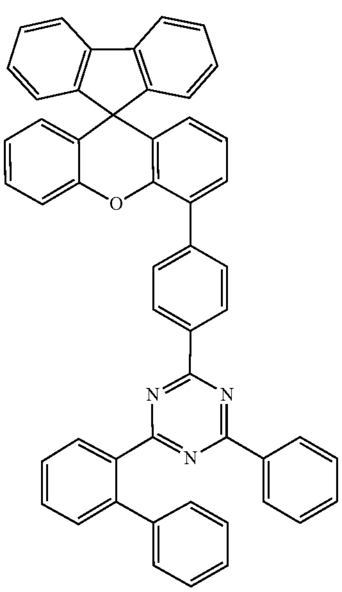
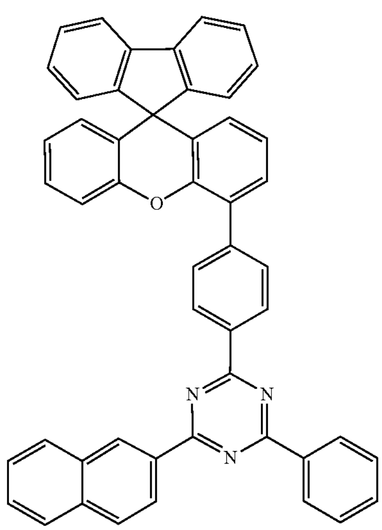
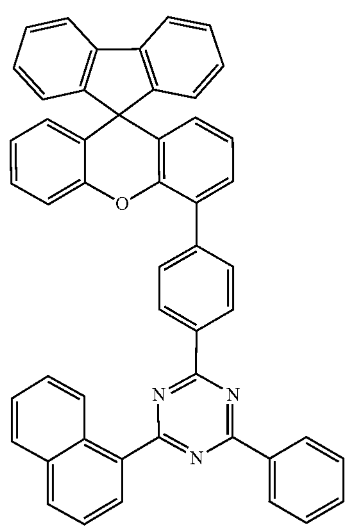

-continued
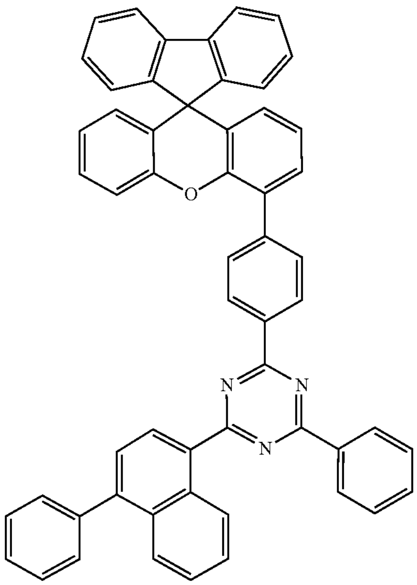
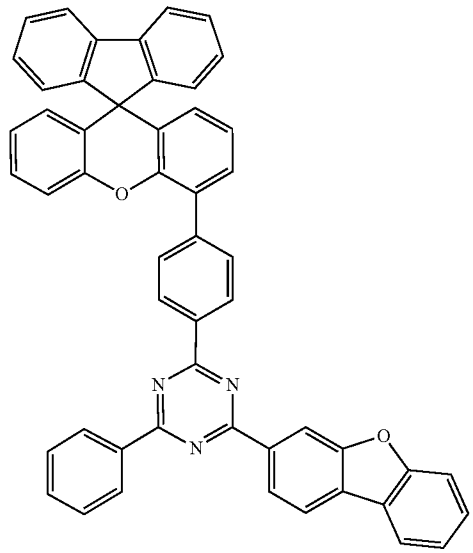
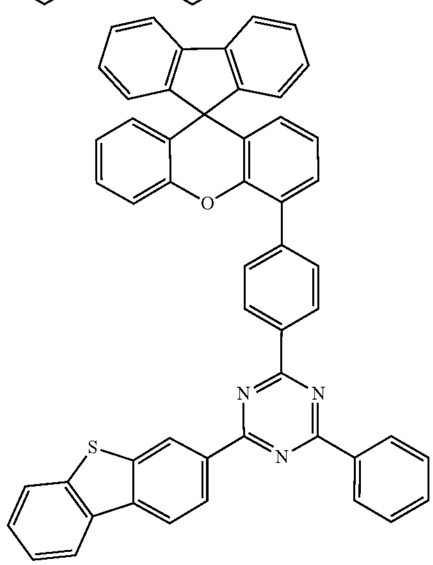
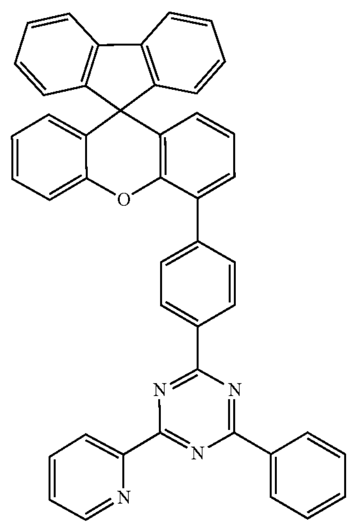
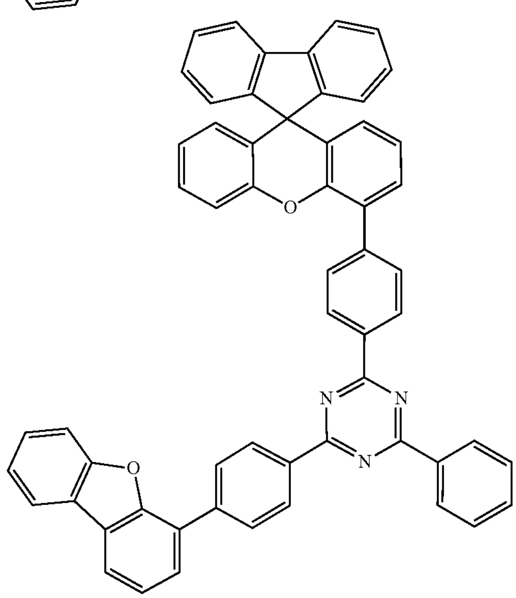
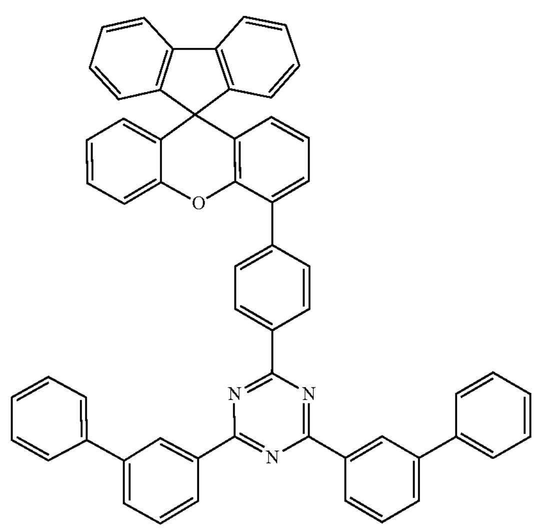

-continued
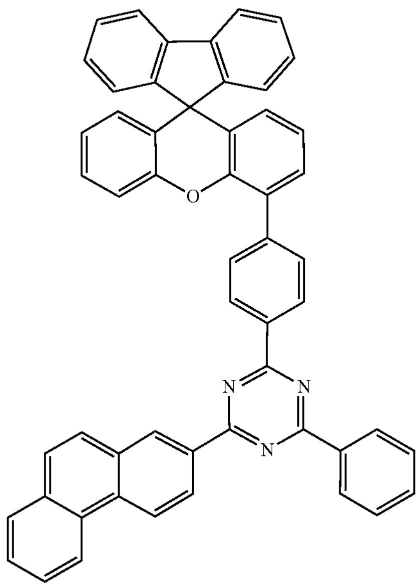
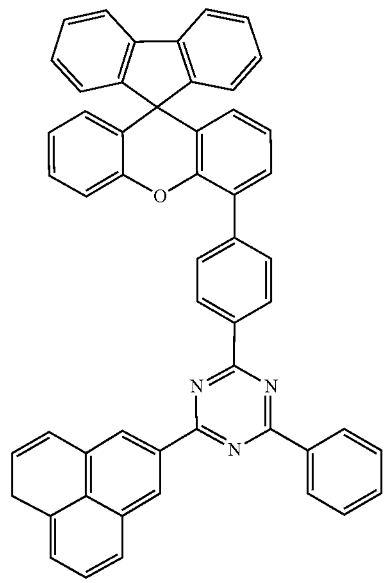
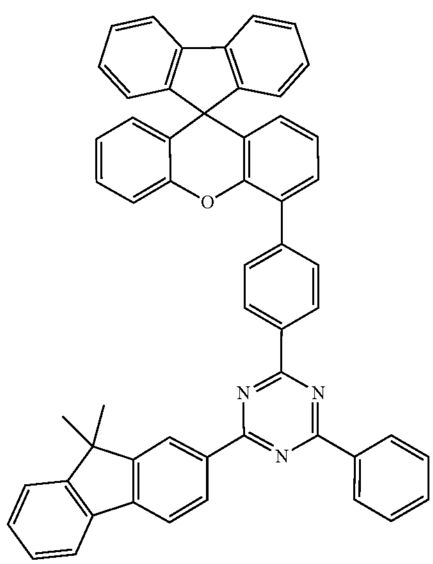
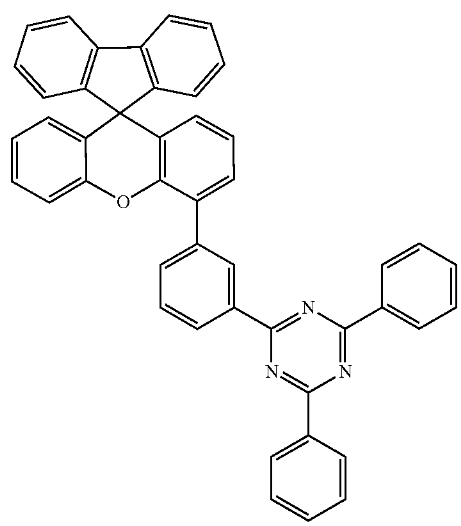

-continued
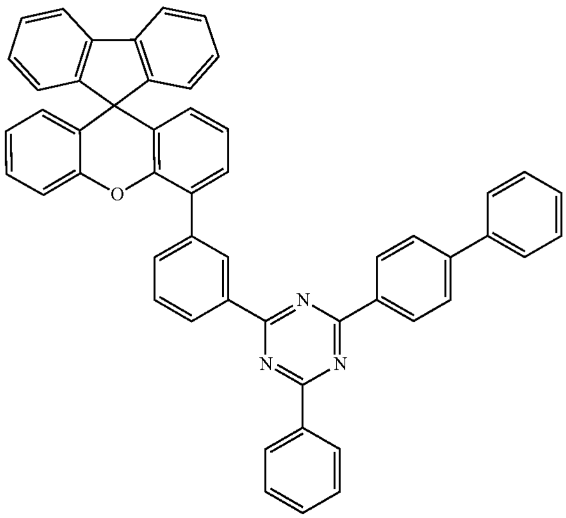
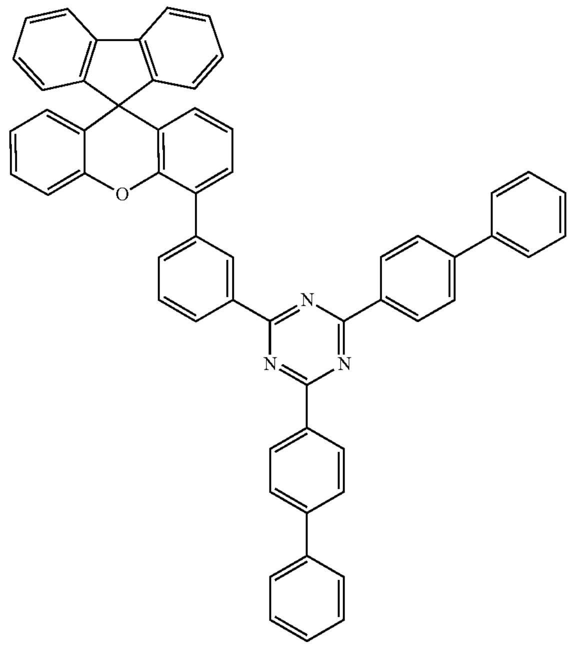
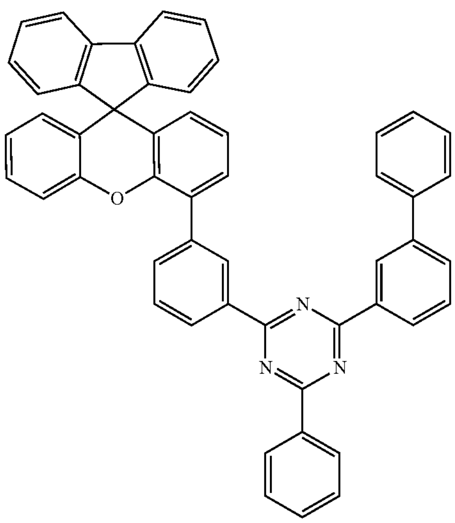
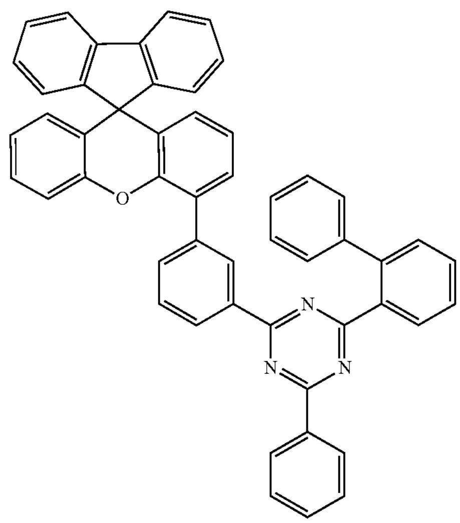
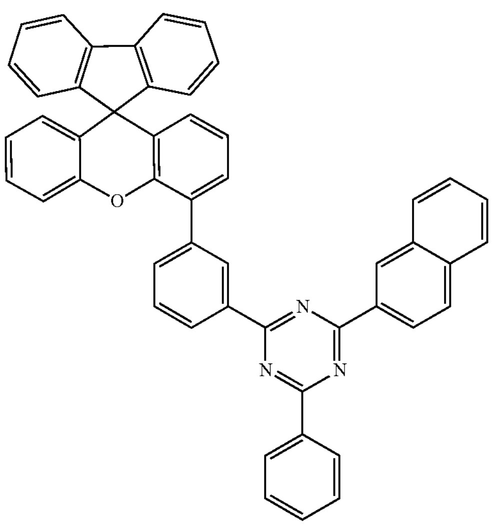
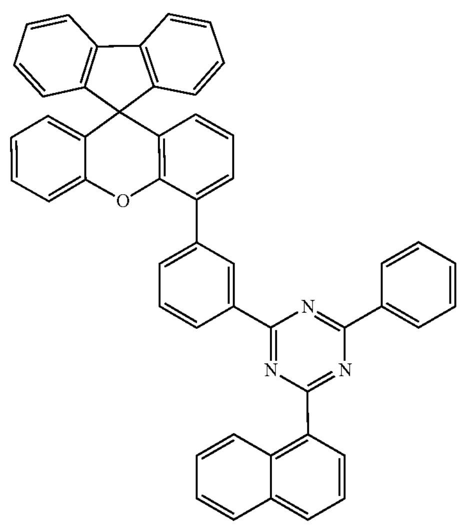

-continued
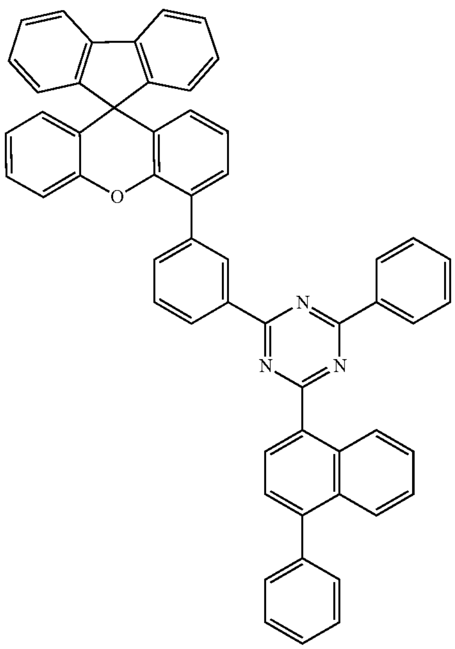
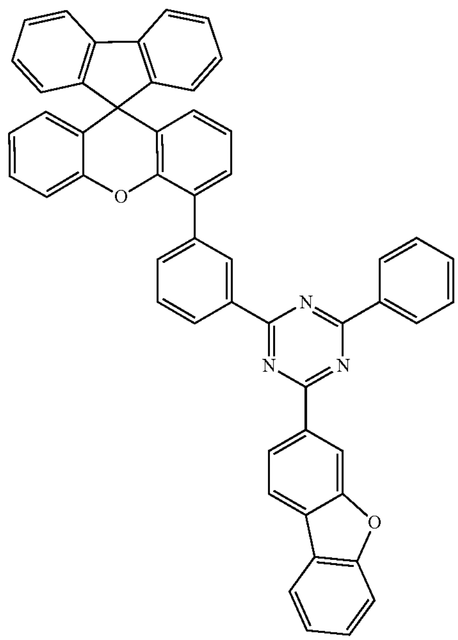
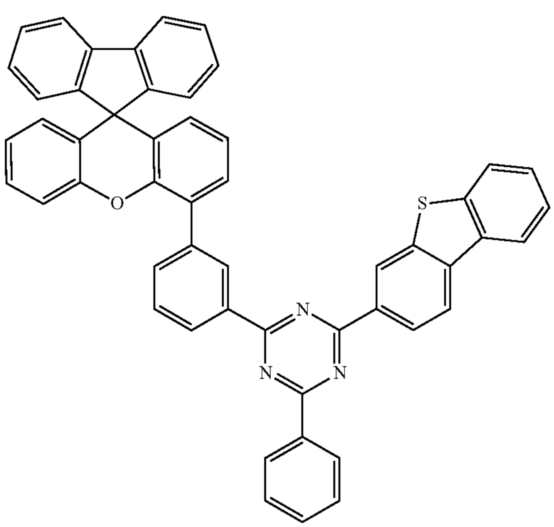
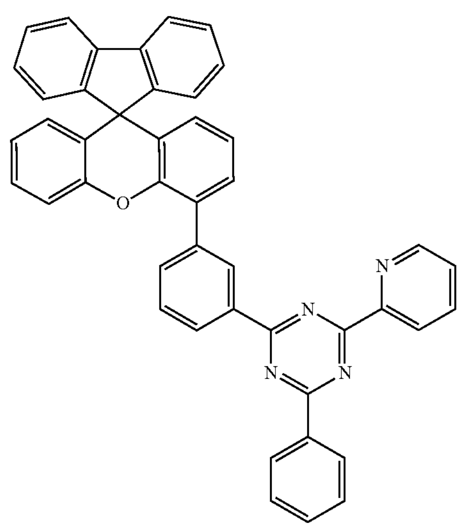

-continued
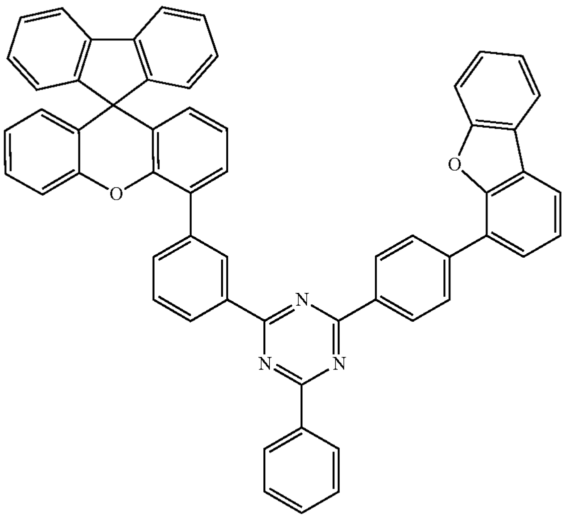
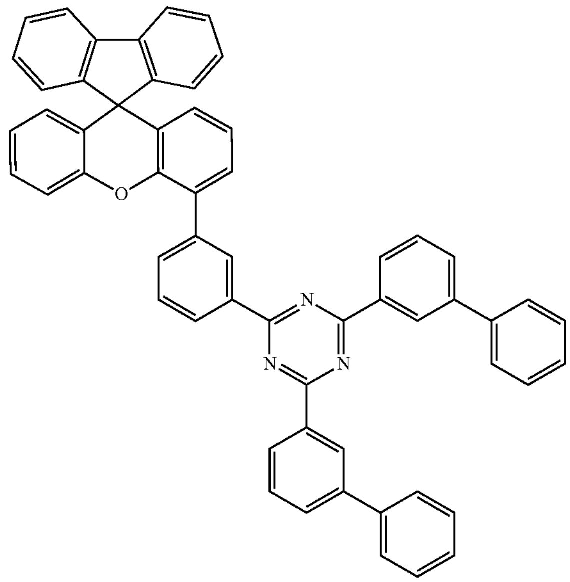
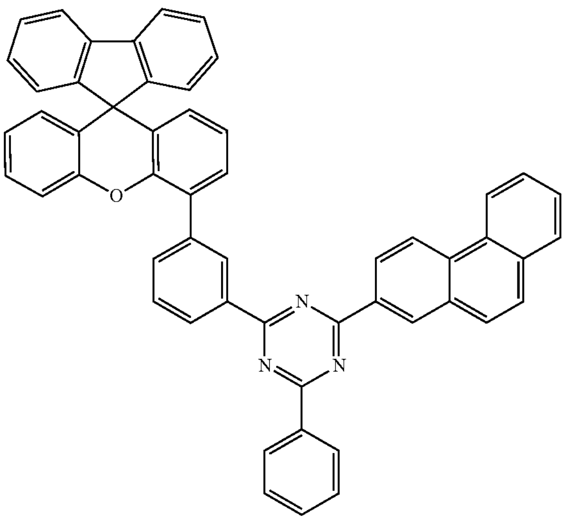
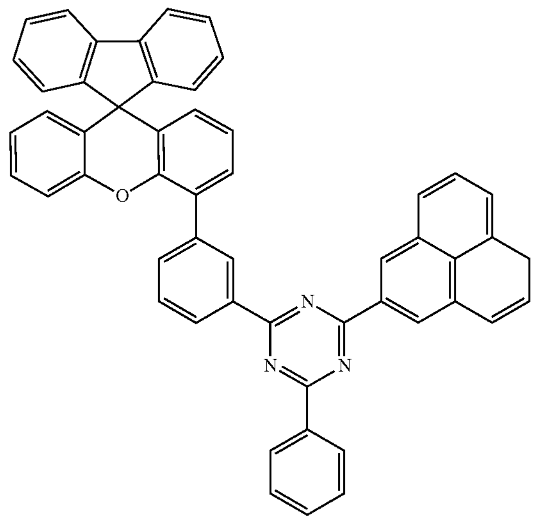
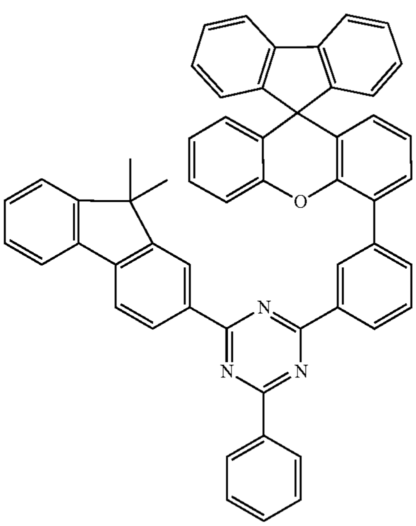
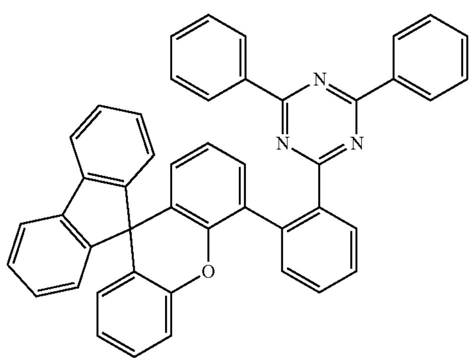

-continued
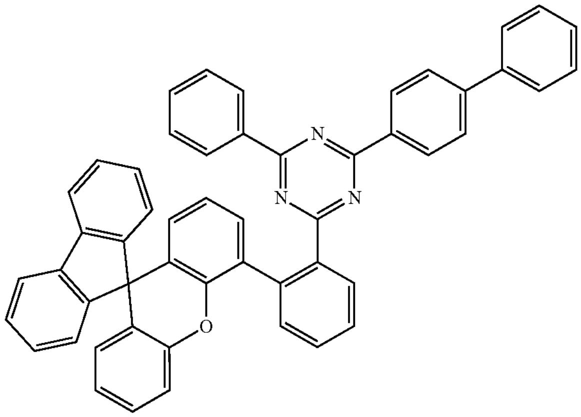
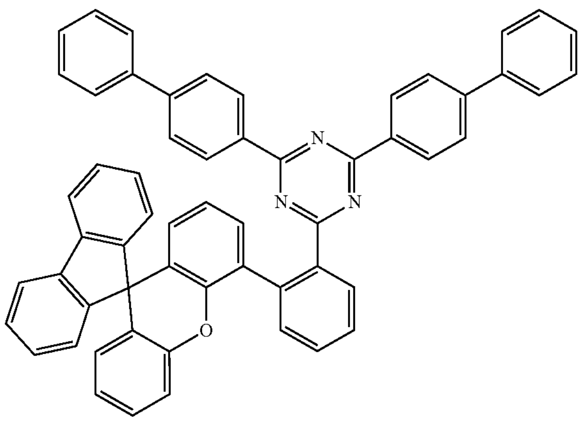
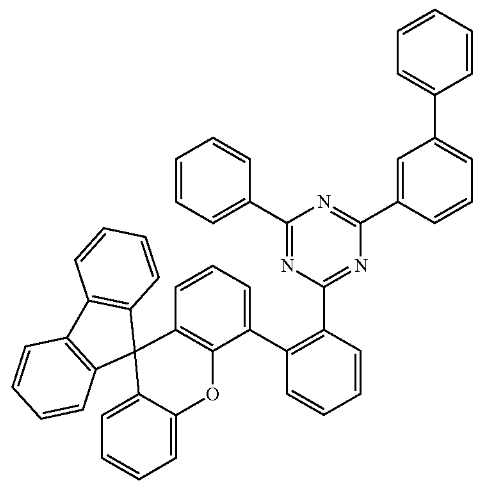
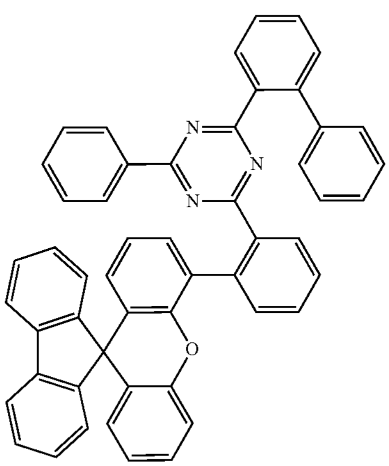
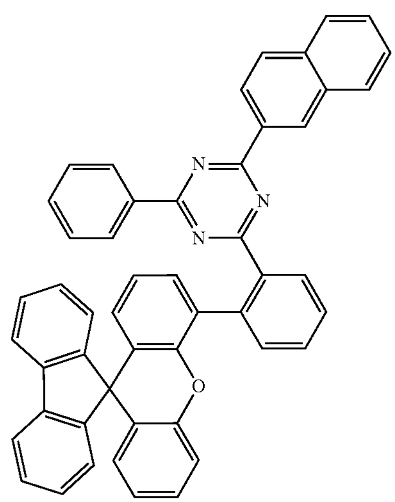

-continued
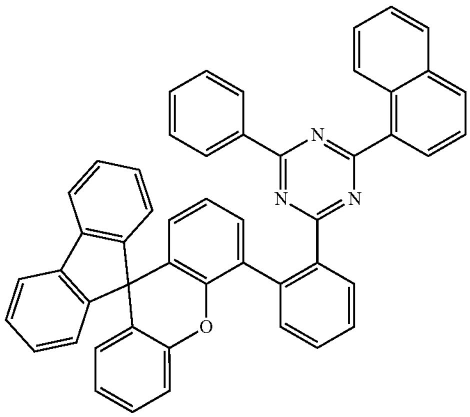
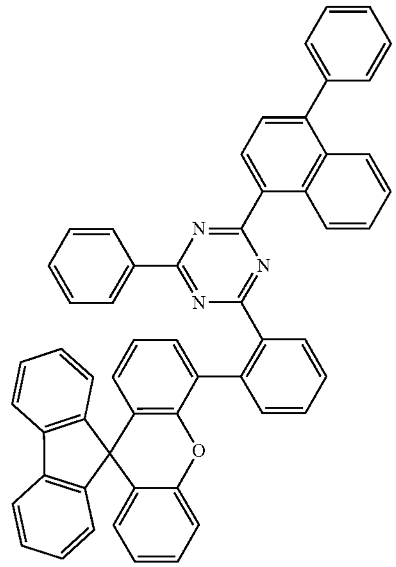
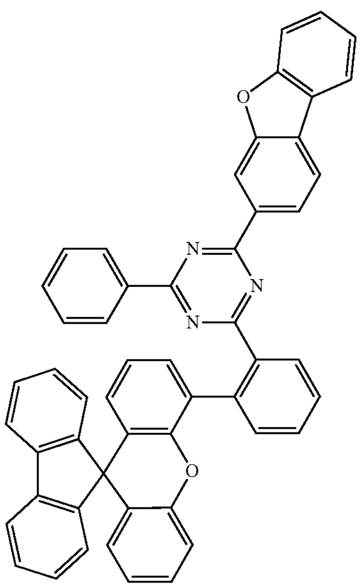
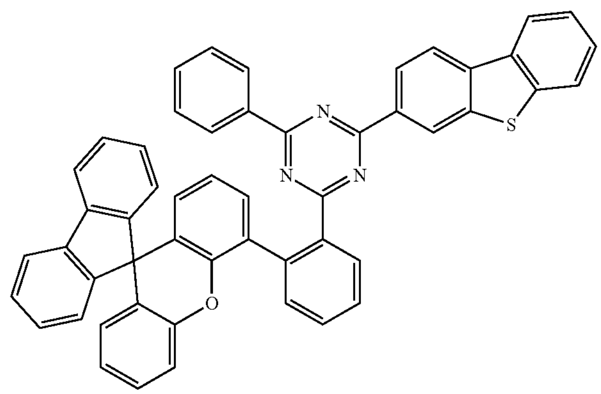
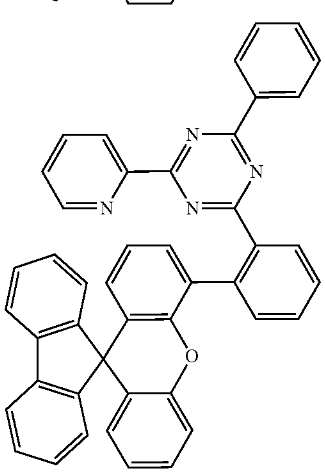
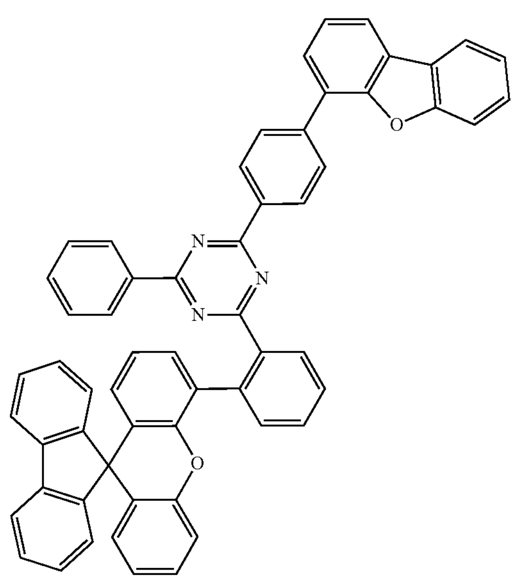

-continued
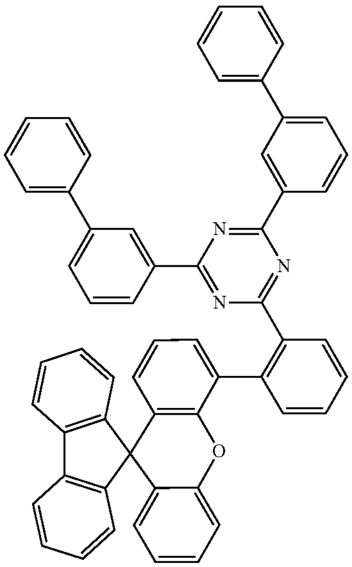
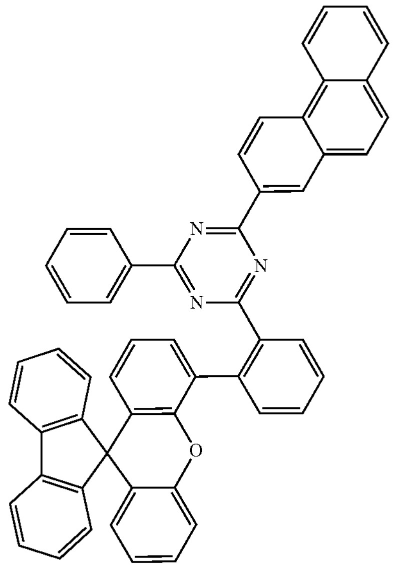
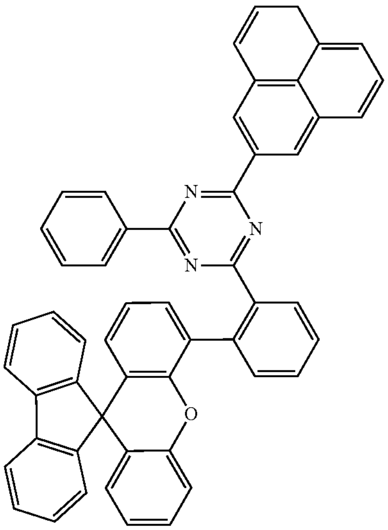
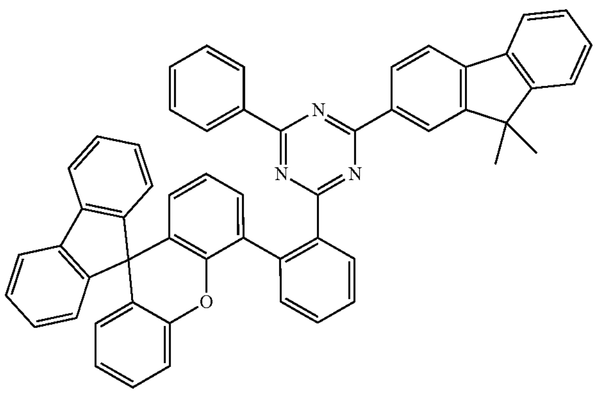
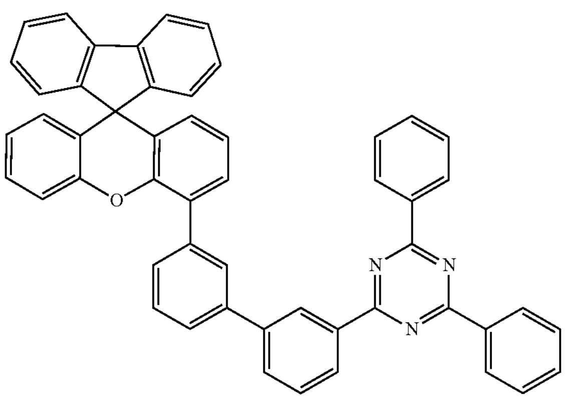
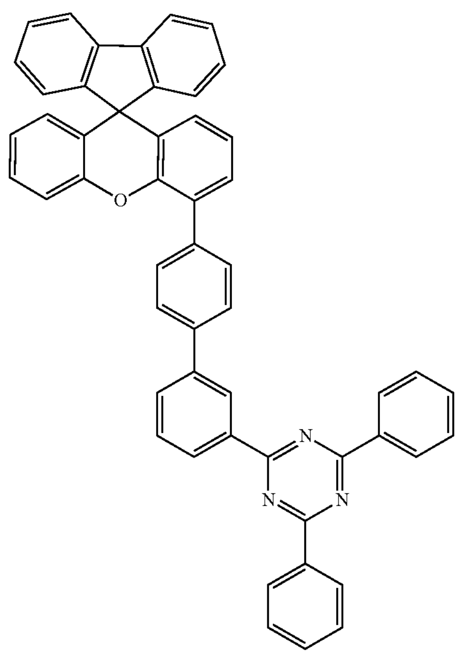

-continued
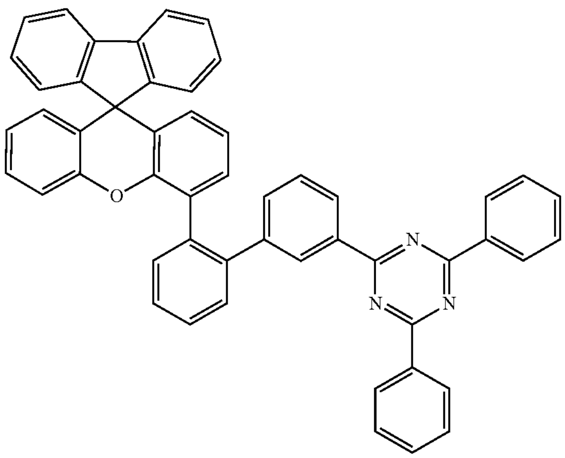
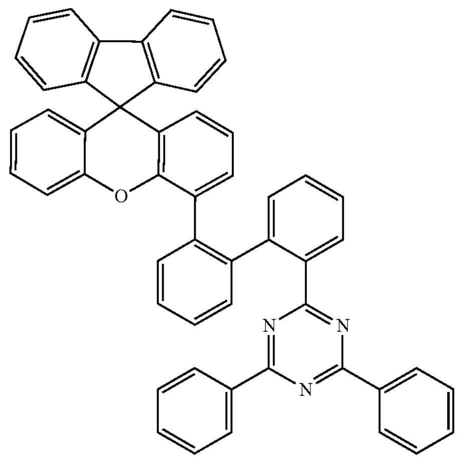
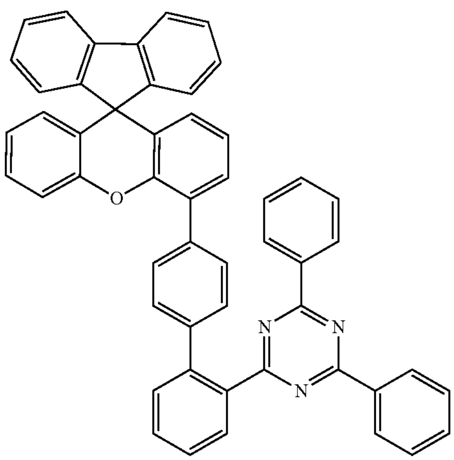
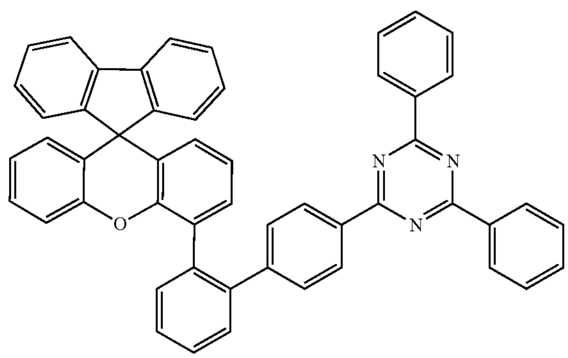
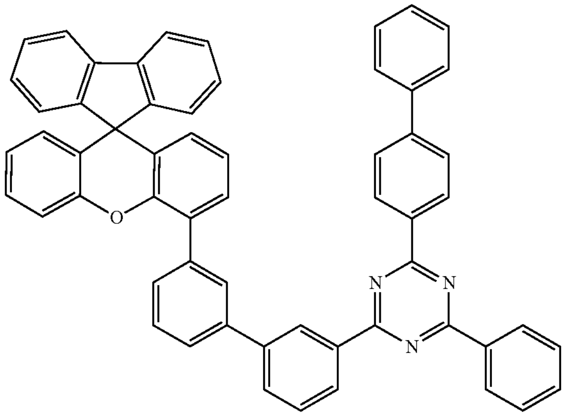
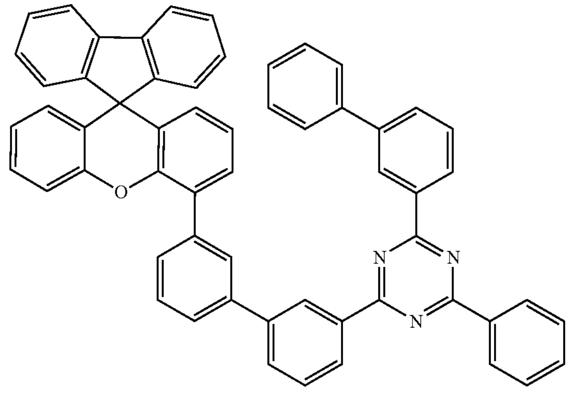

-continued
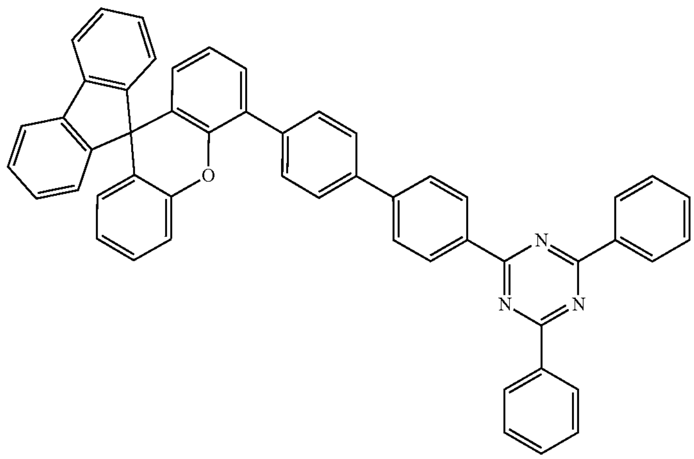
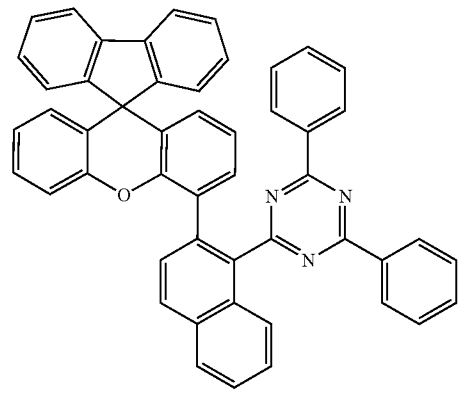
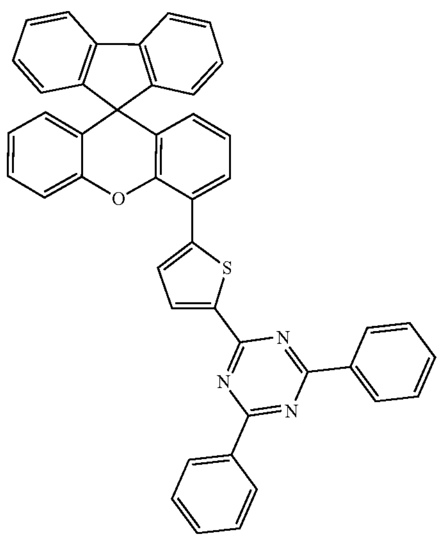
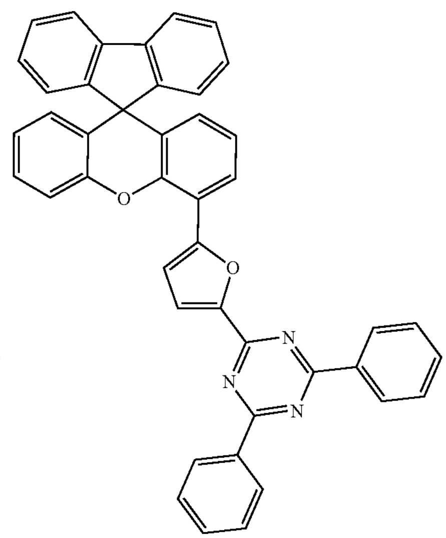
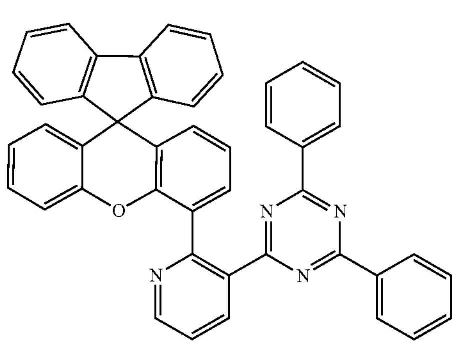
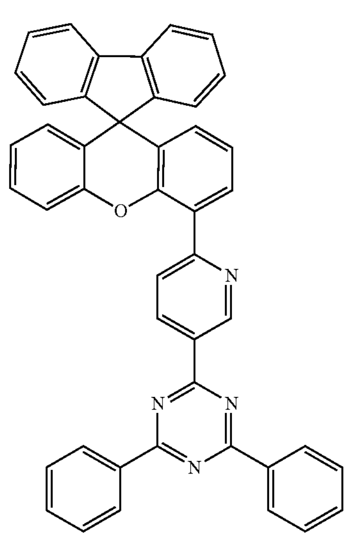

-continued
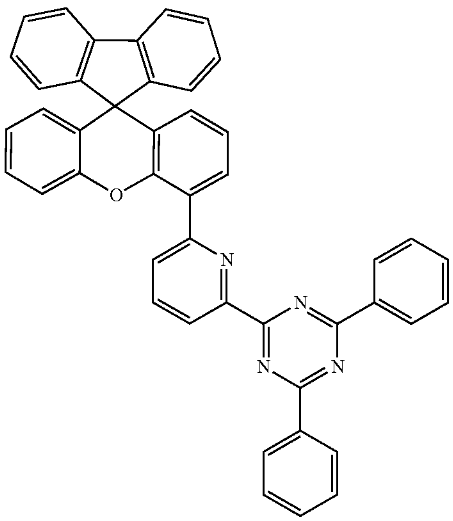
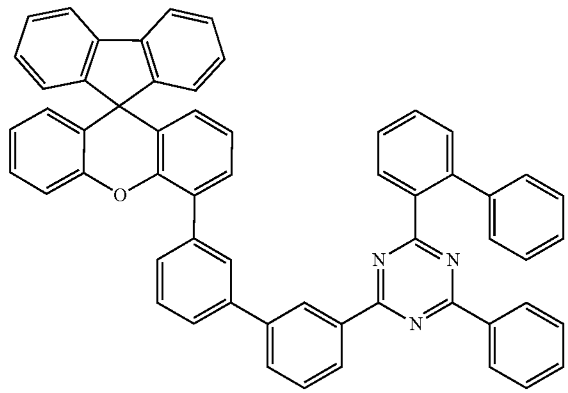
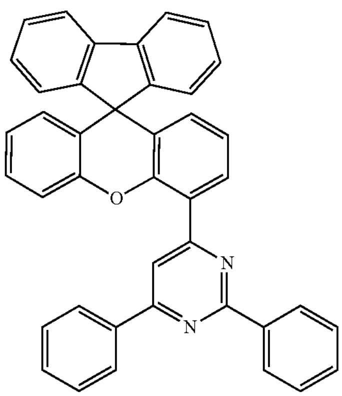
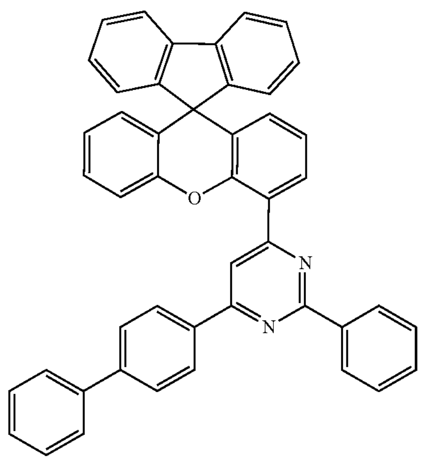
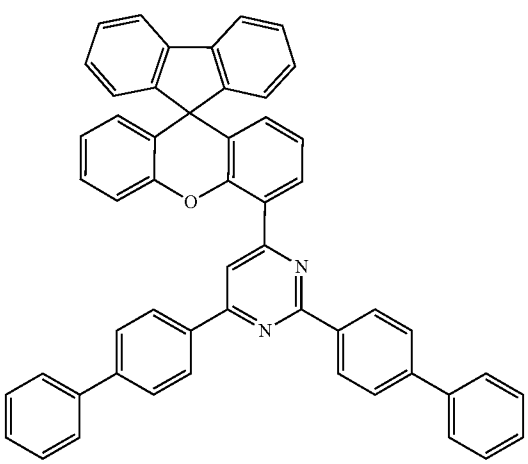
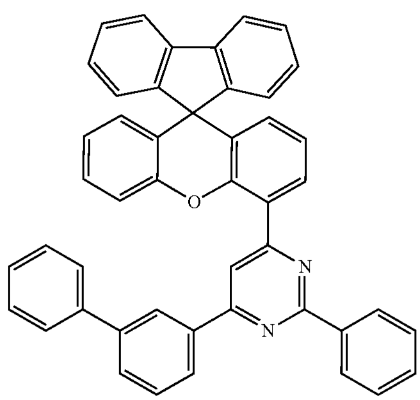

-continued
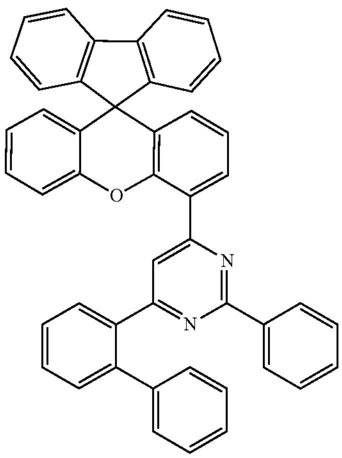
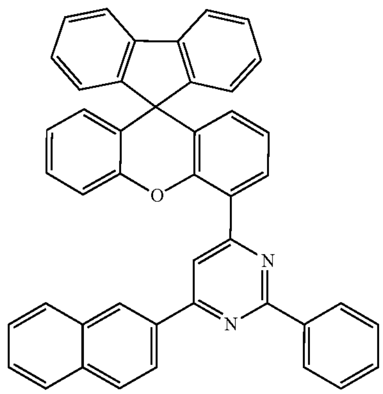
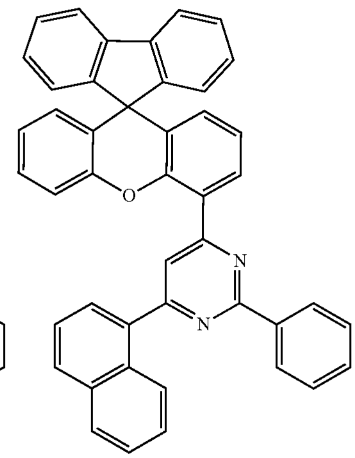
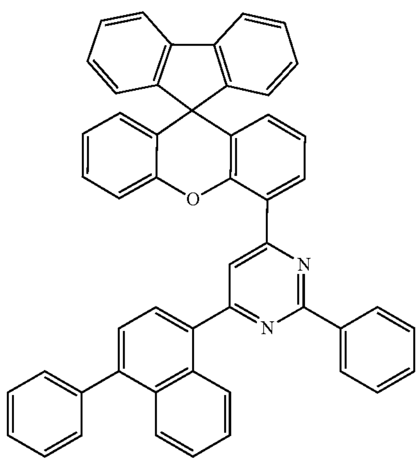
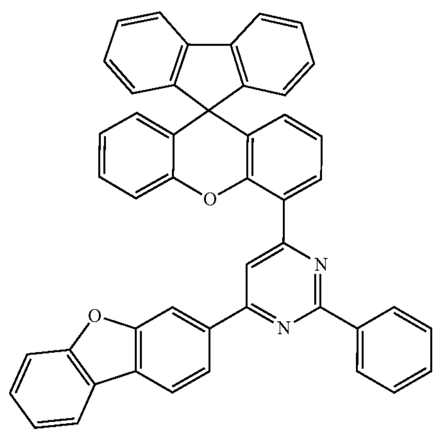
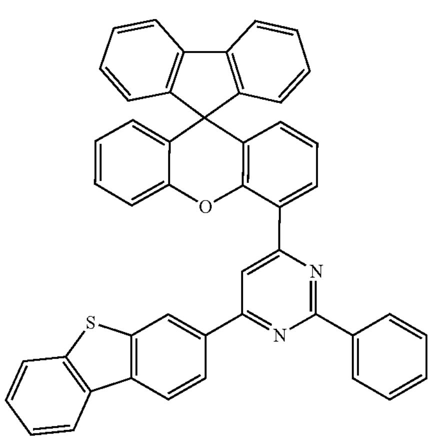
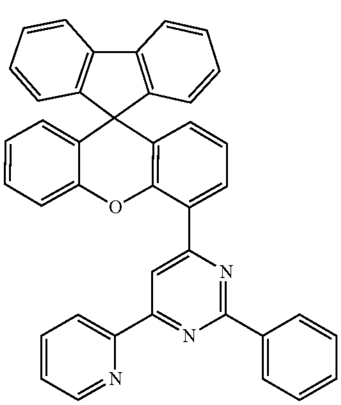

-continued
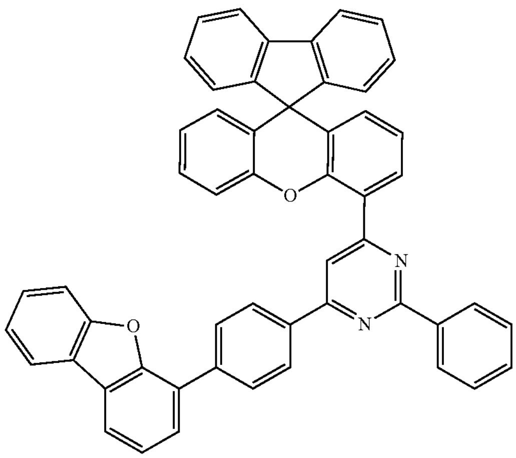
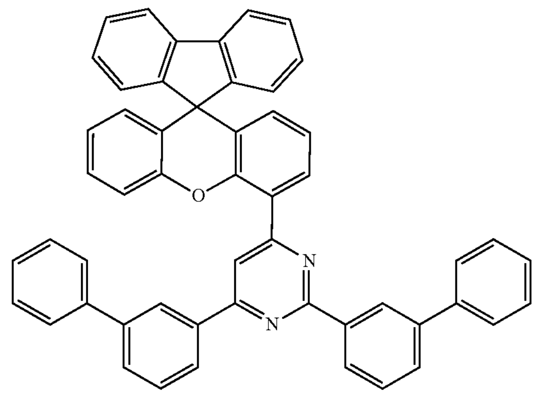
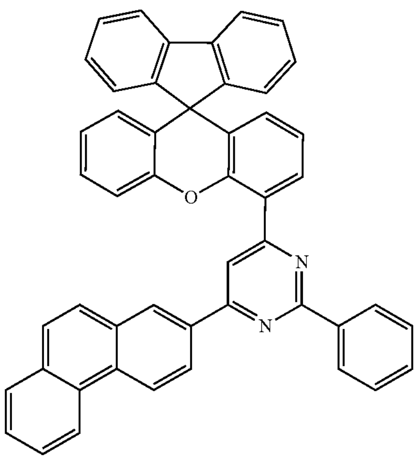
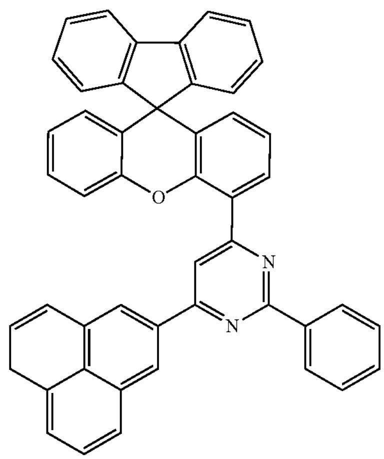
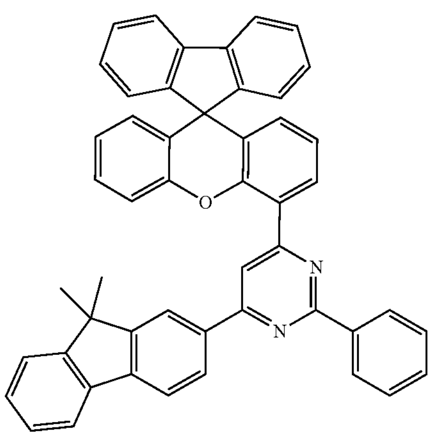
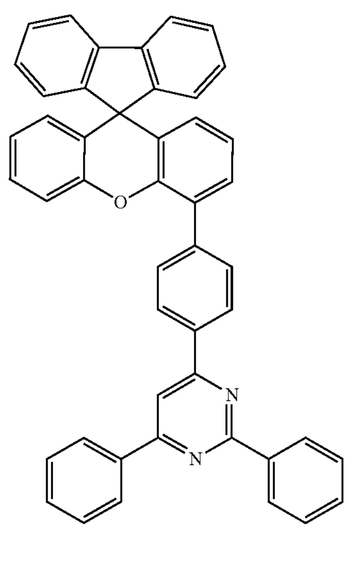

-continued
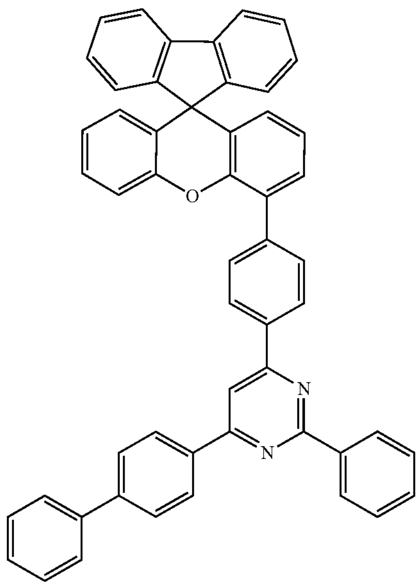
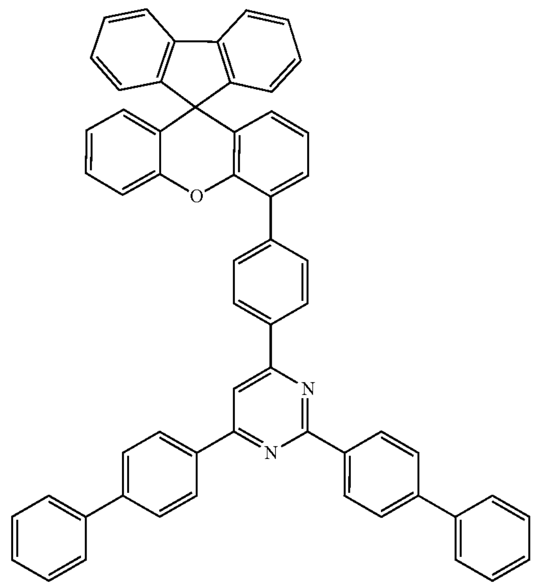
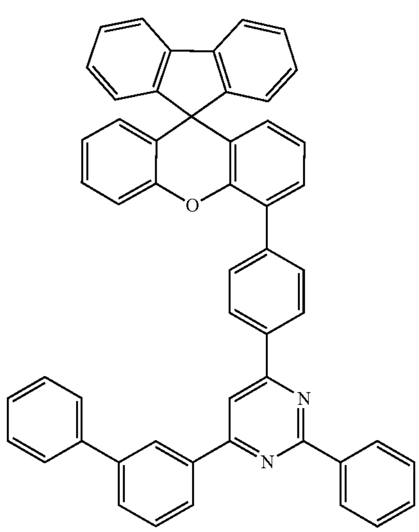
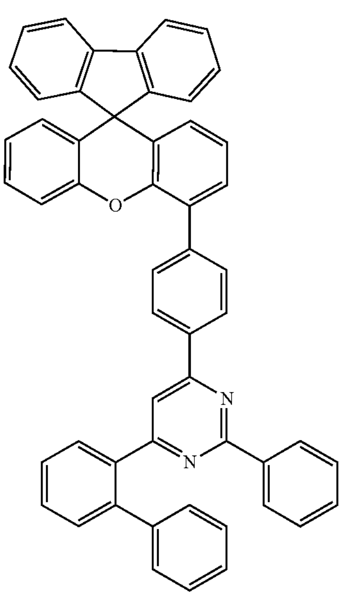
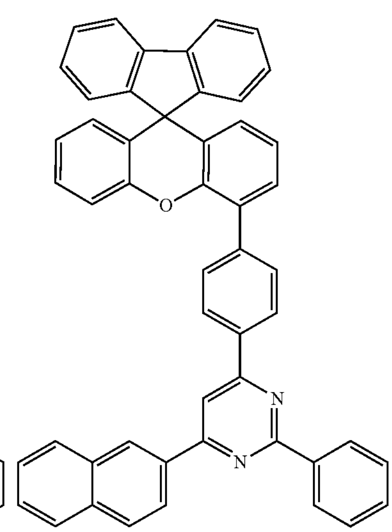

-continued
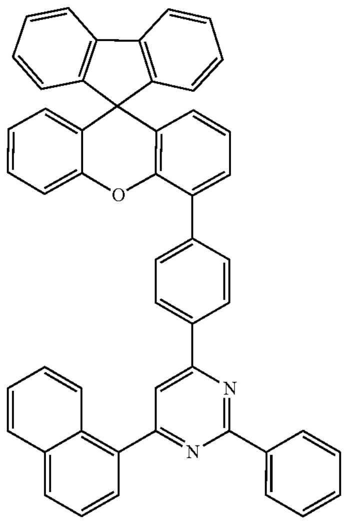
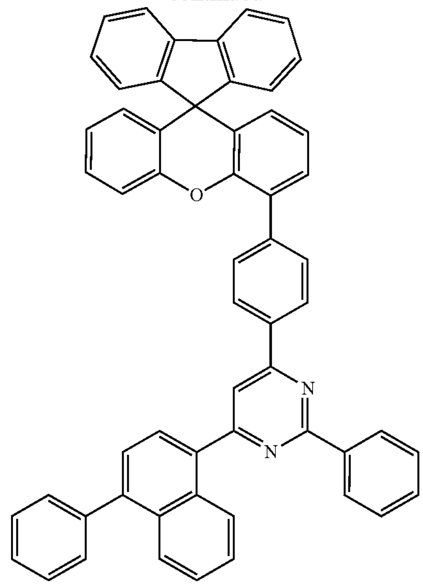
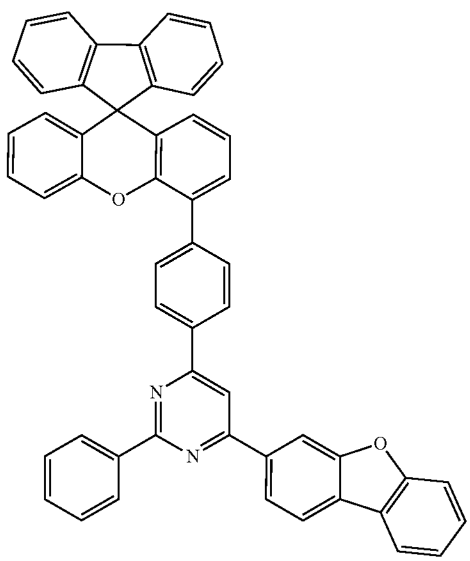
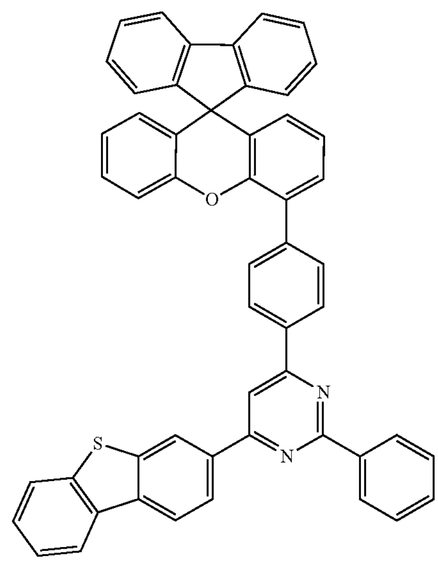
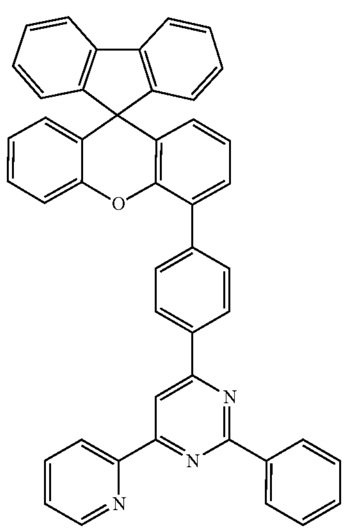
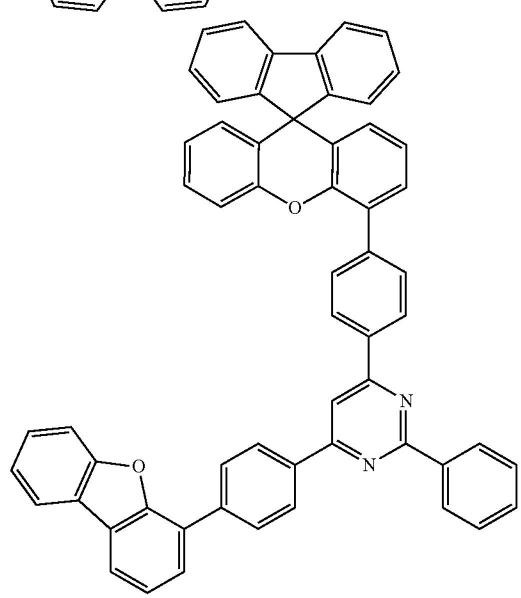

-continued
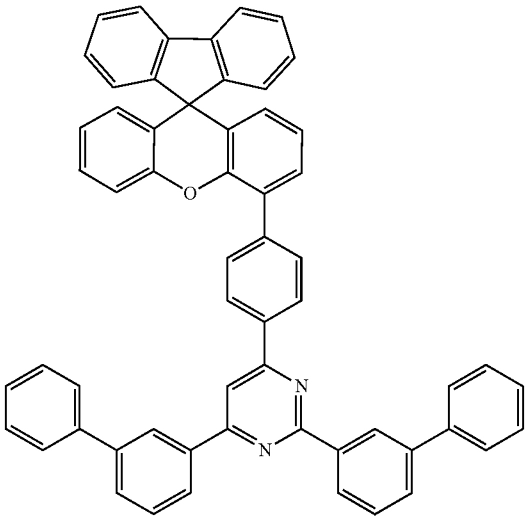
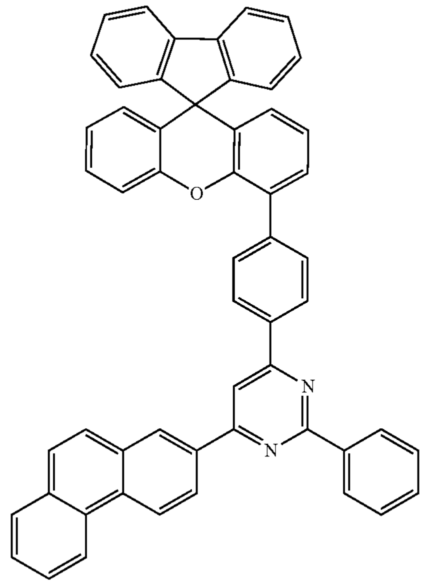
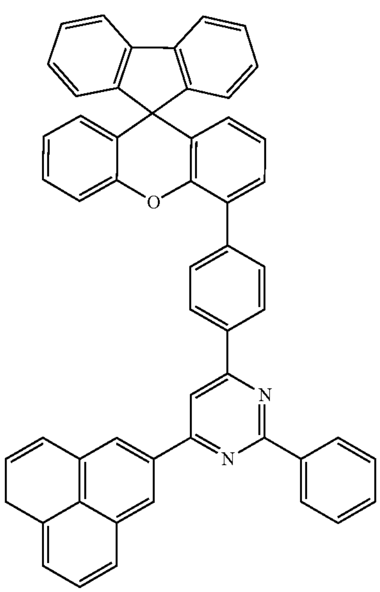
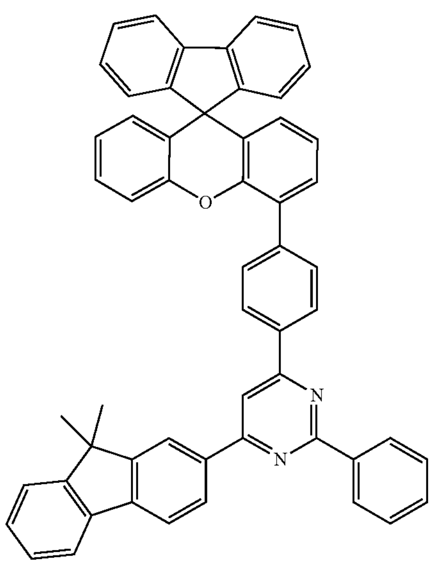

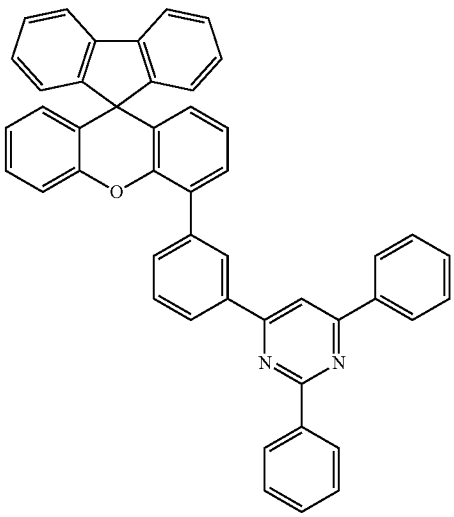
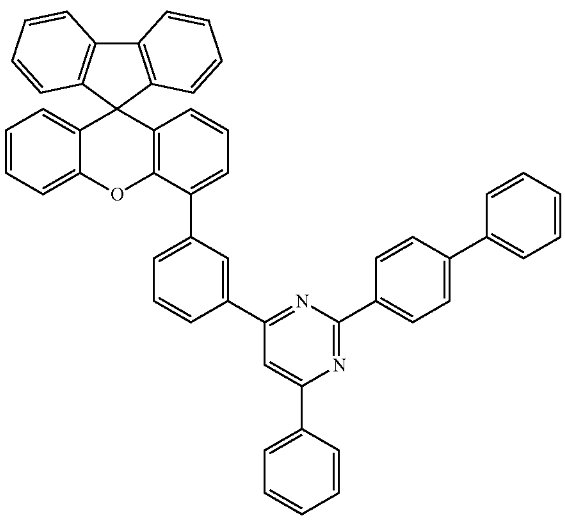
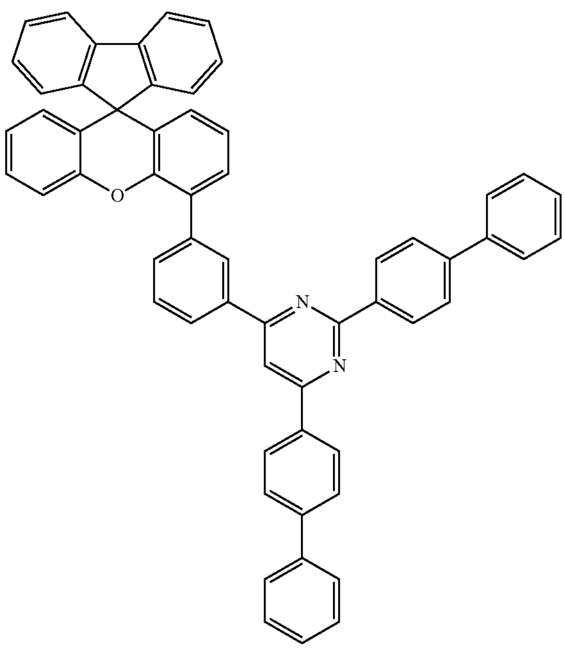
-continued
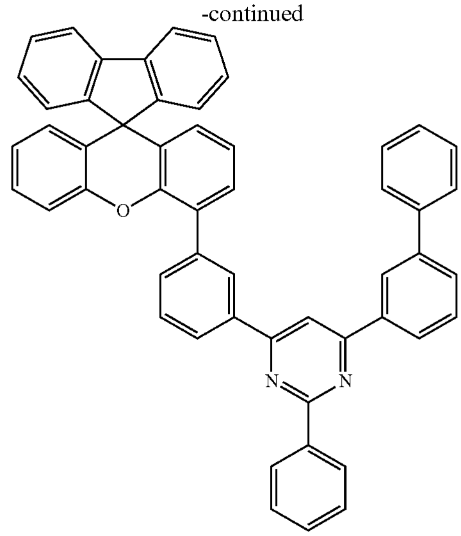
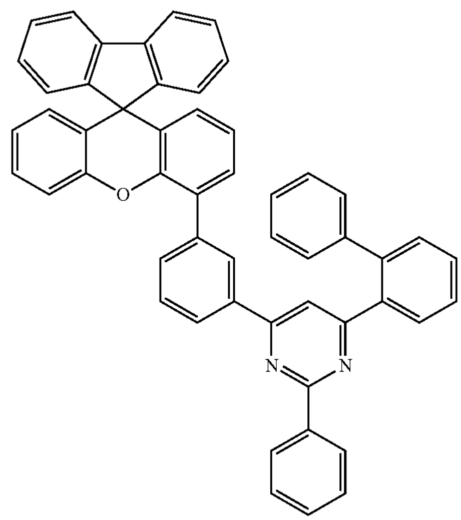
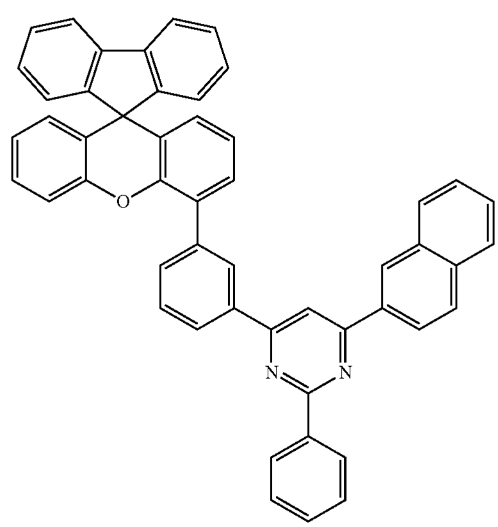

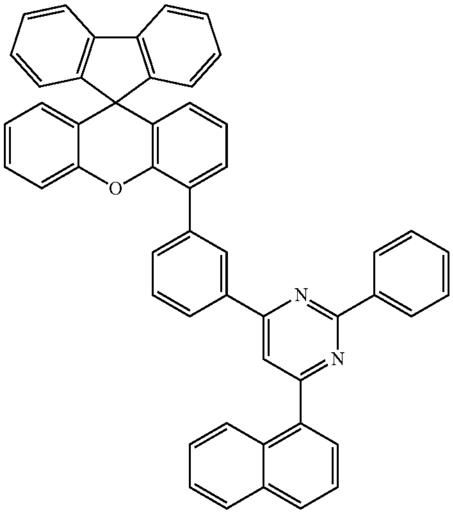
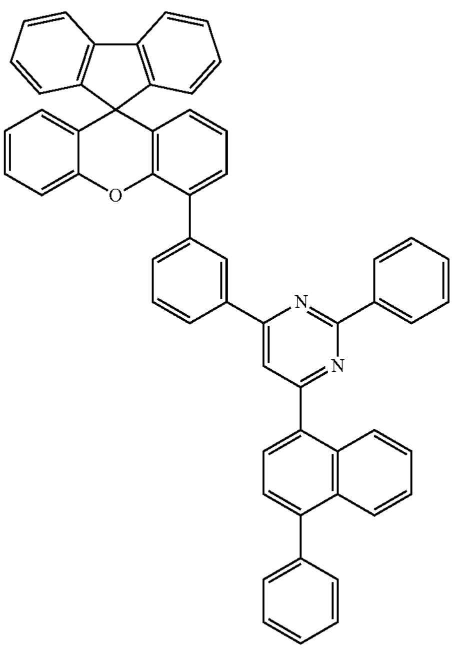
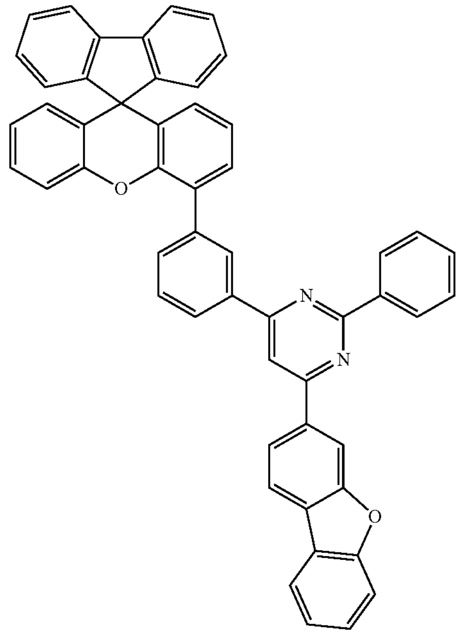
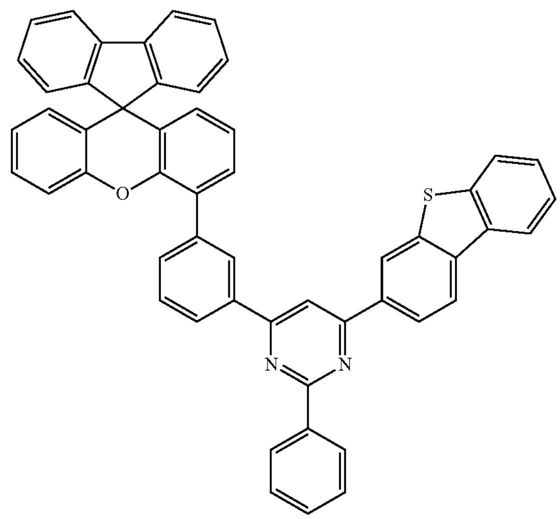
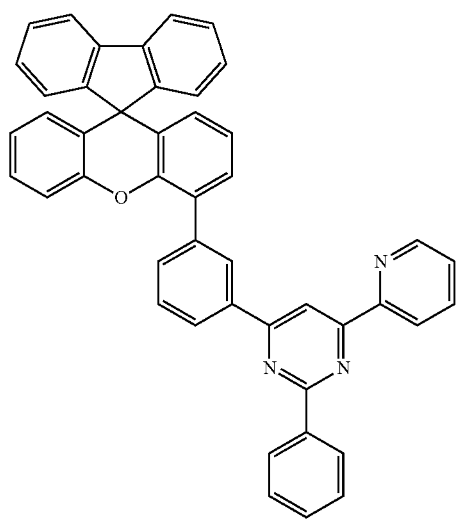

-continued
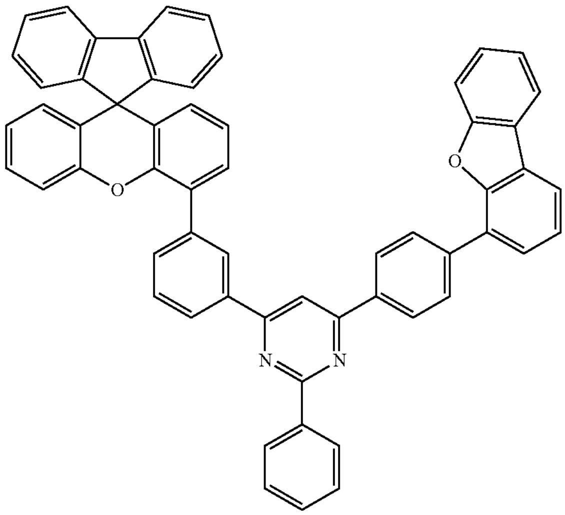
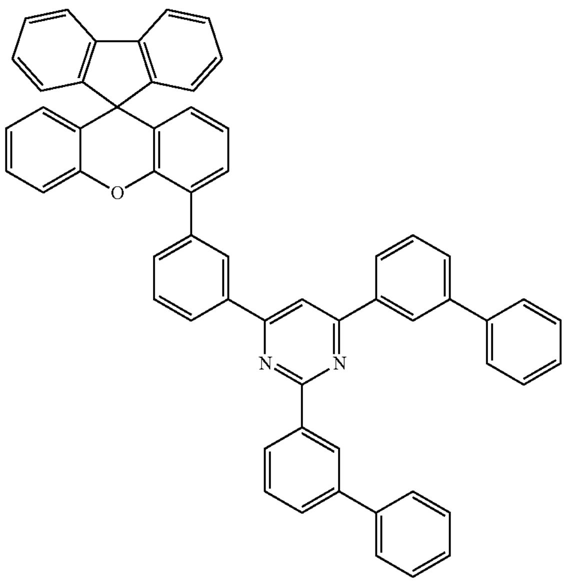
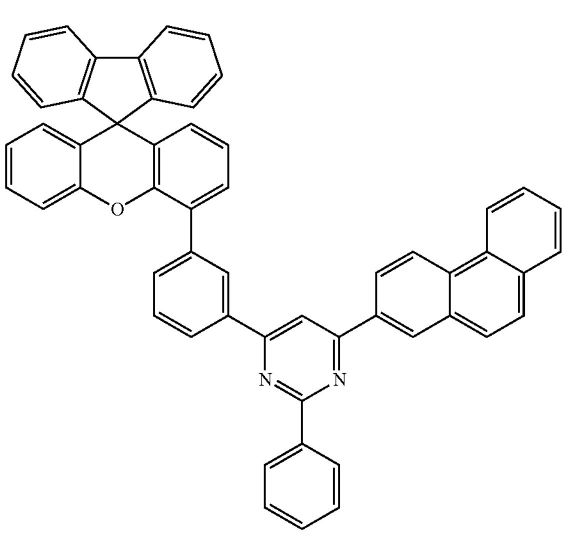
-continued
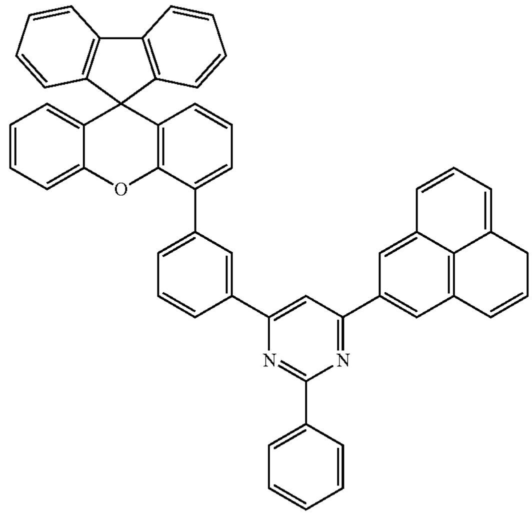
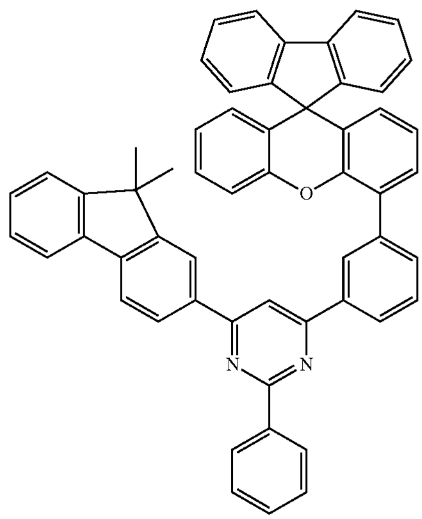
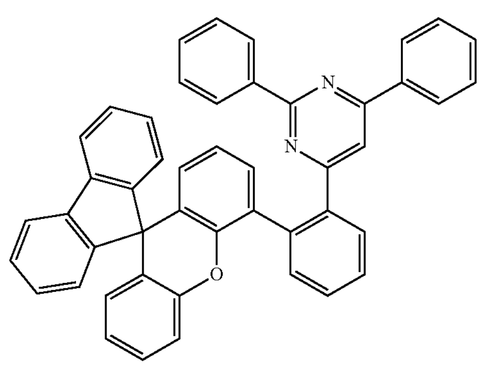

-continued
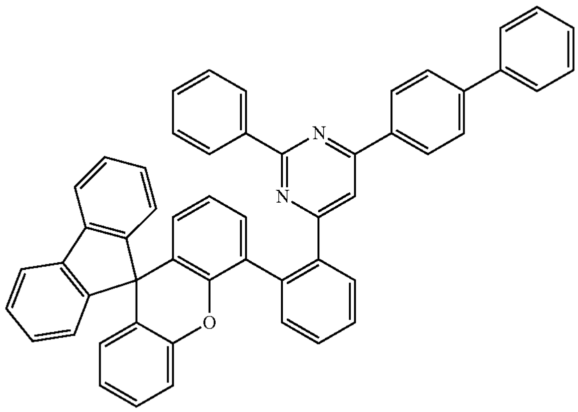
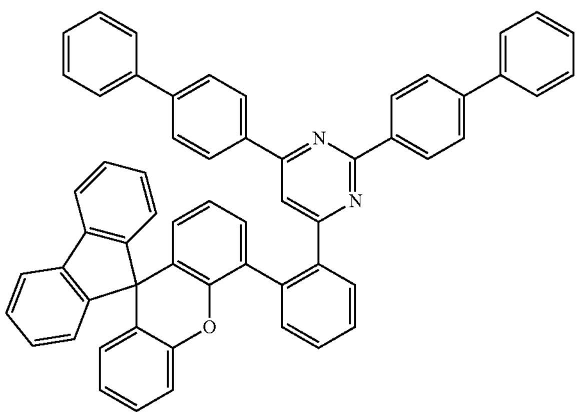
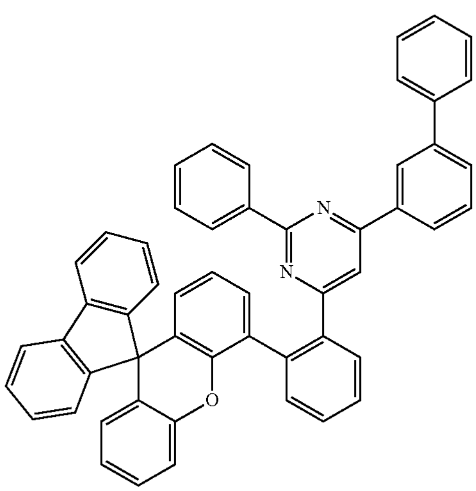
-continued
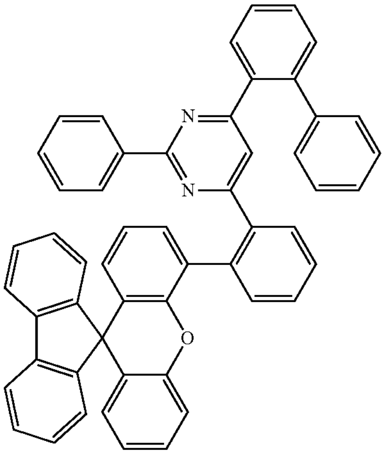
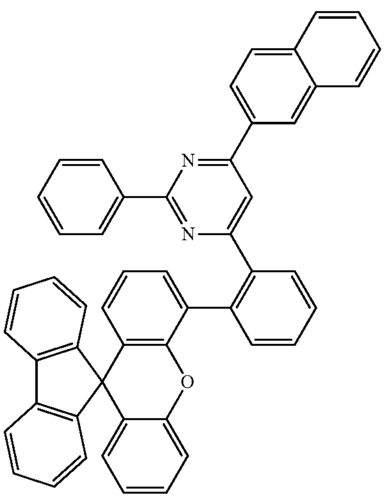
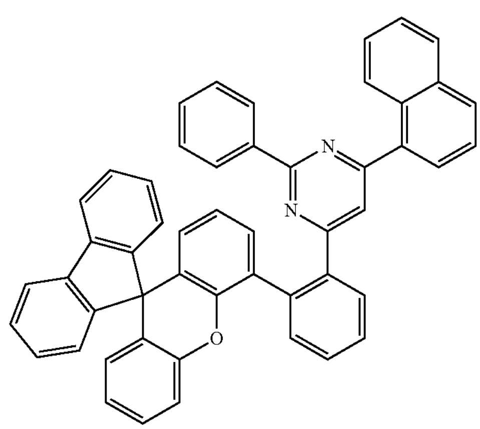

-continued
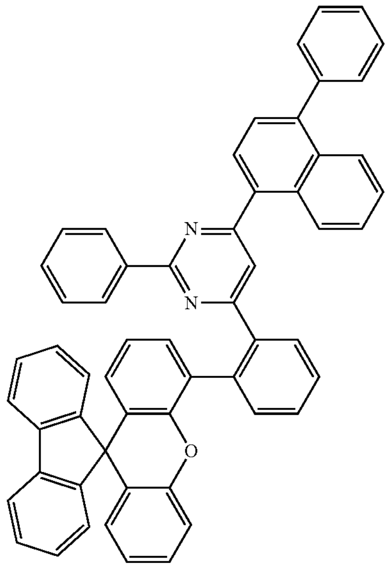
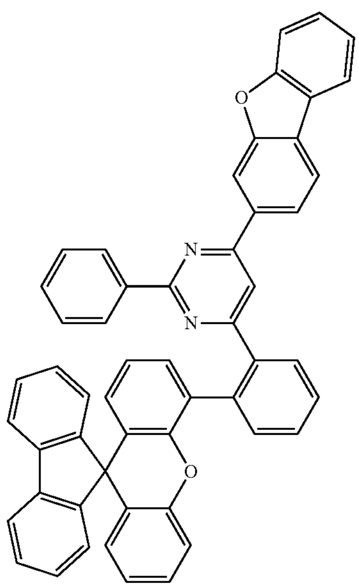
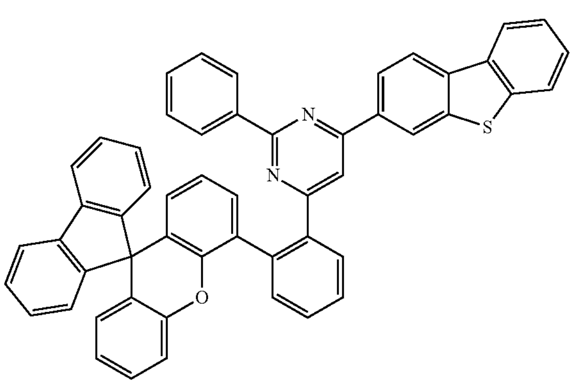
-continued
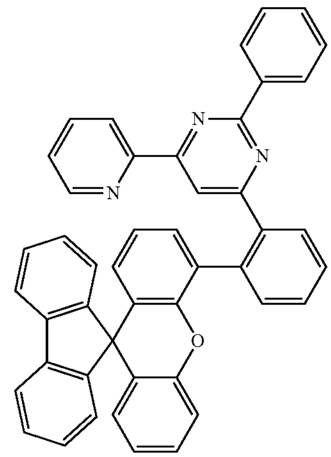
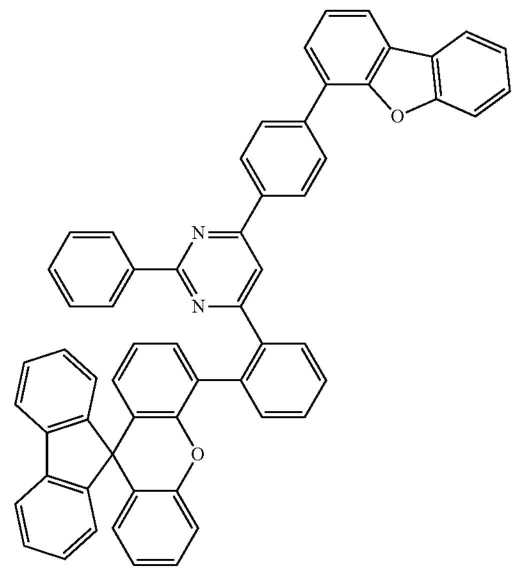
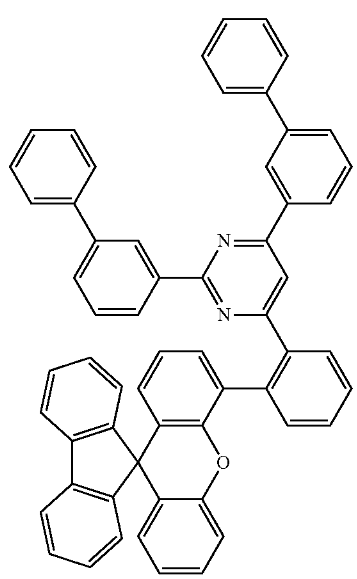

-continued
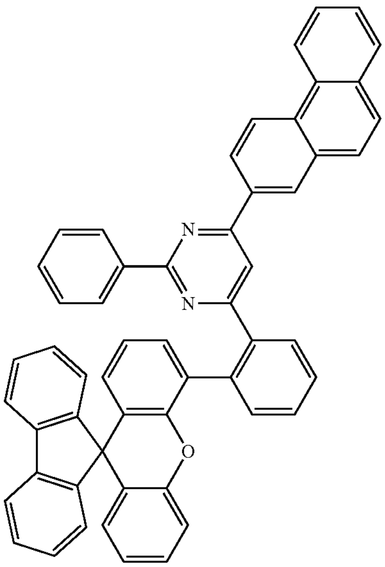
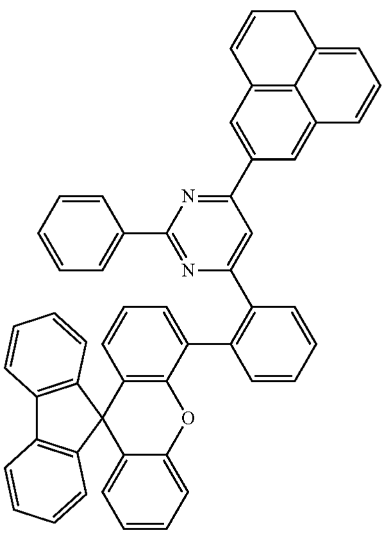
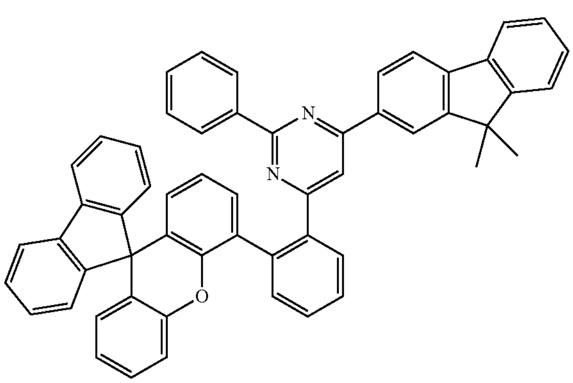
-continued
3
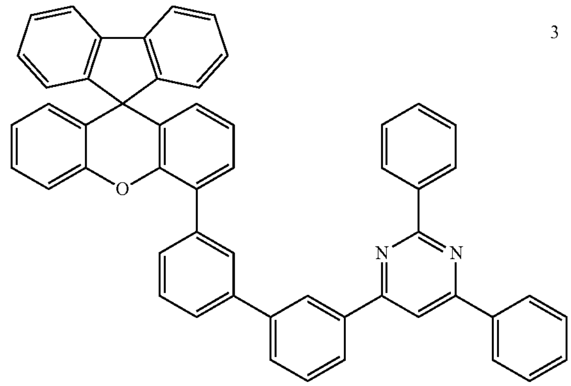
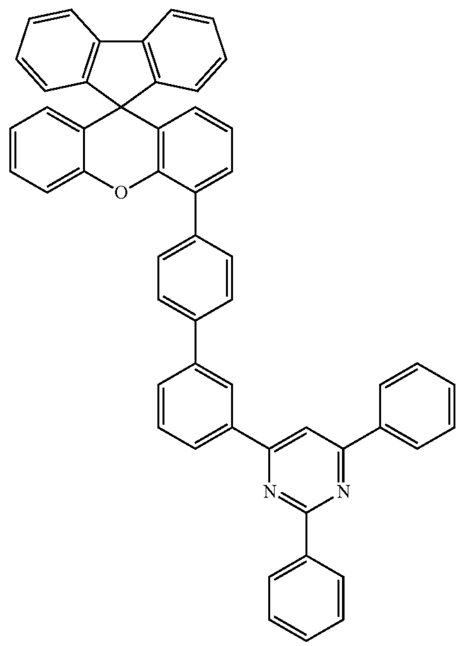
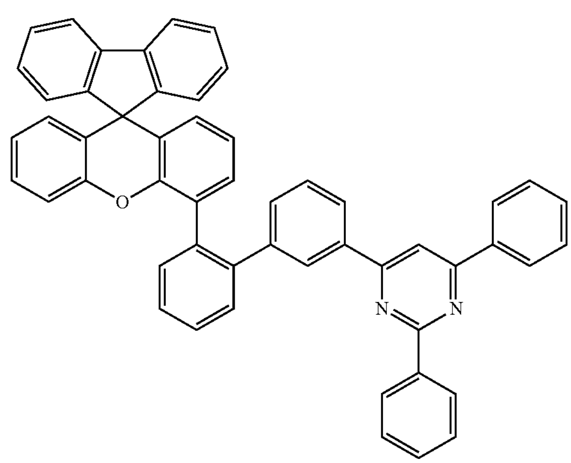

-continued
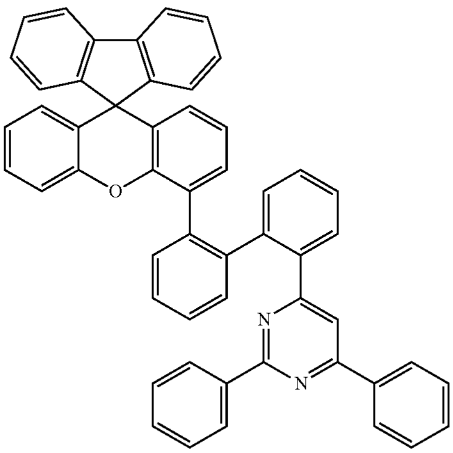
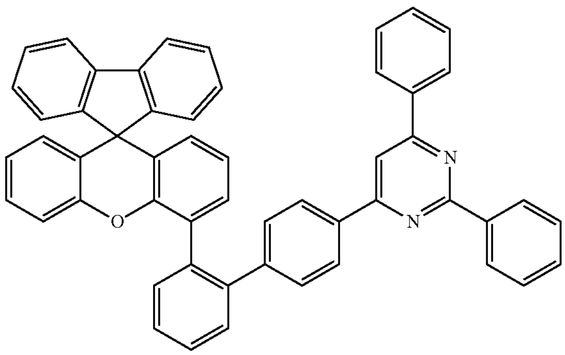
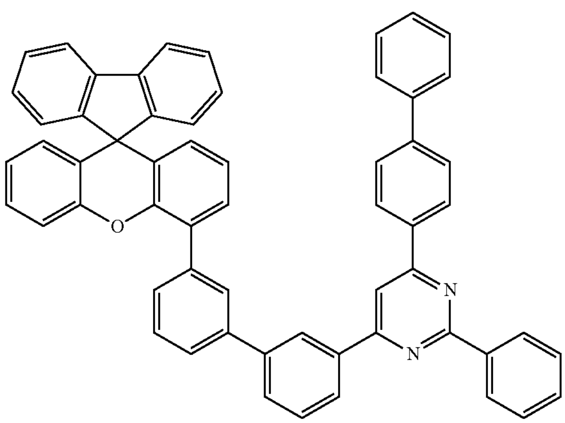
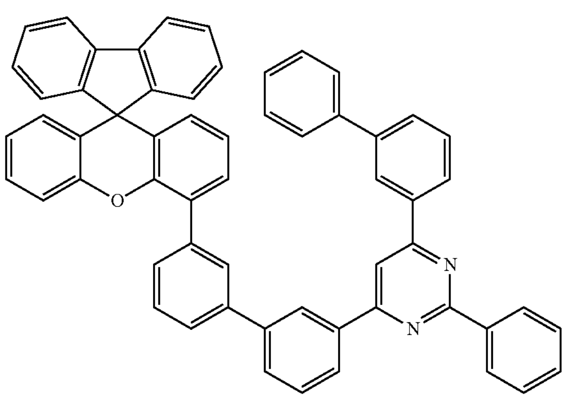
-continued
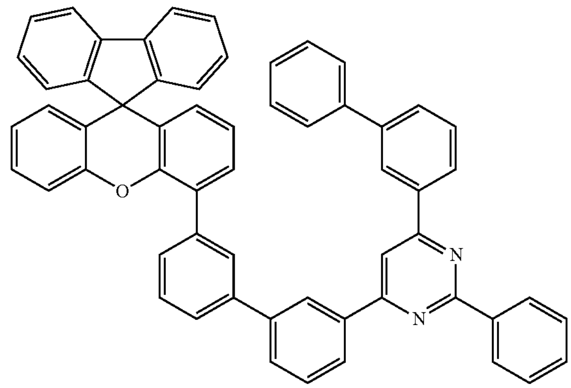
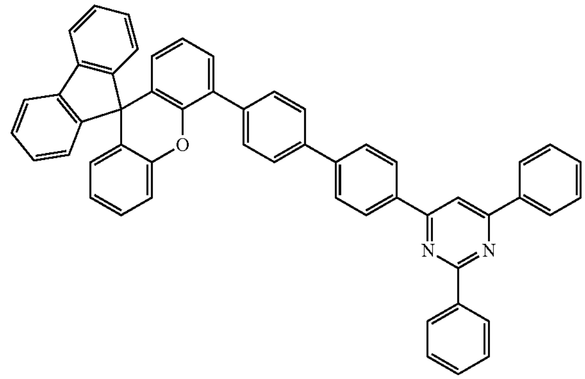
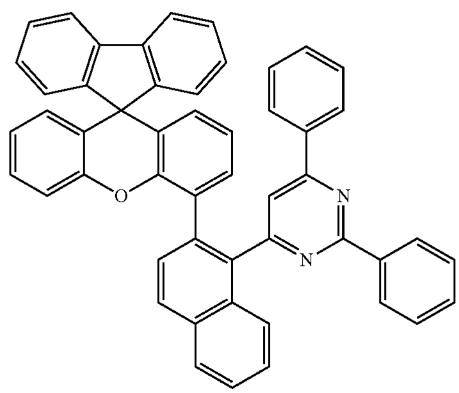
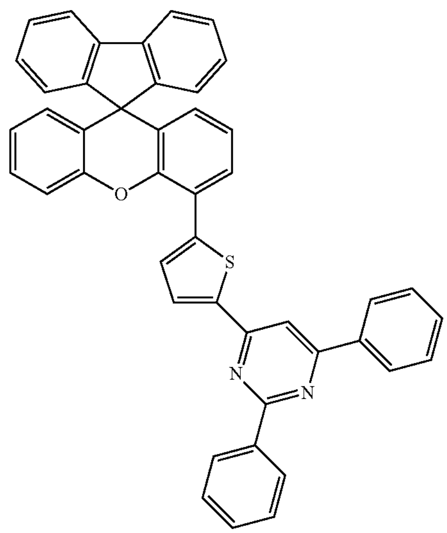

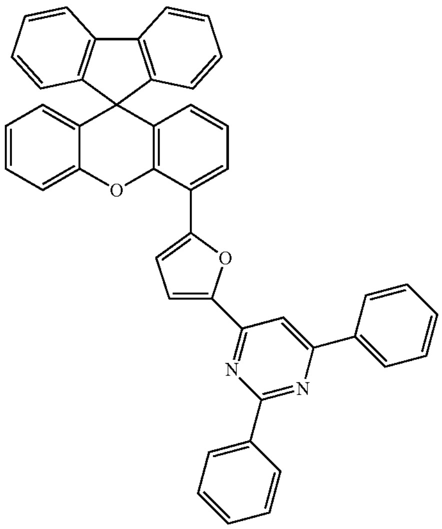
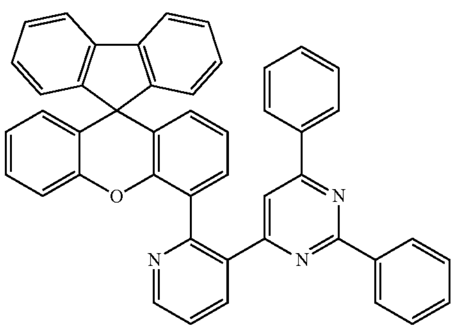
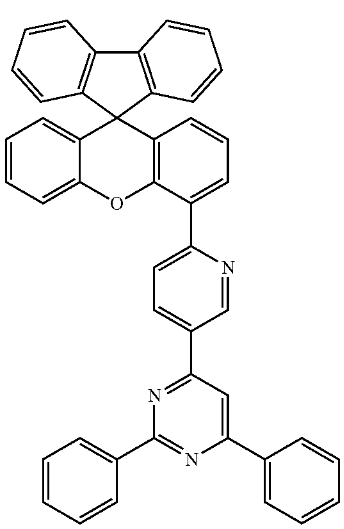
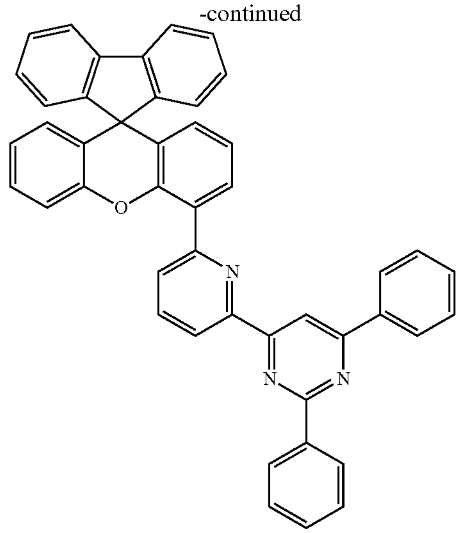
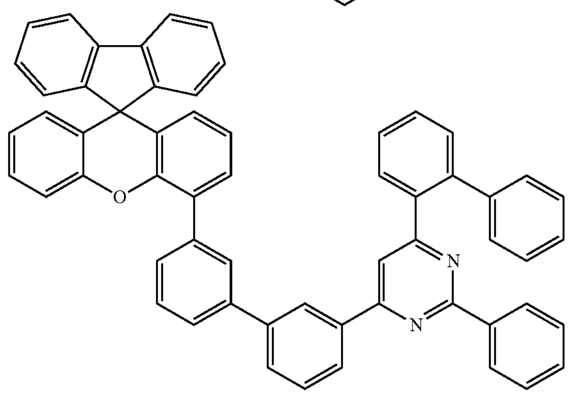
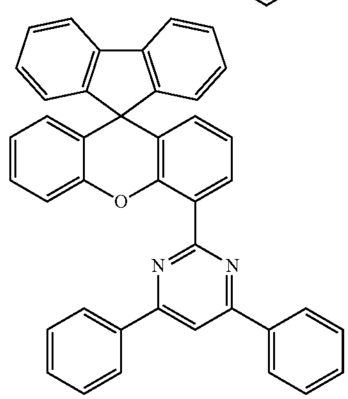
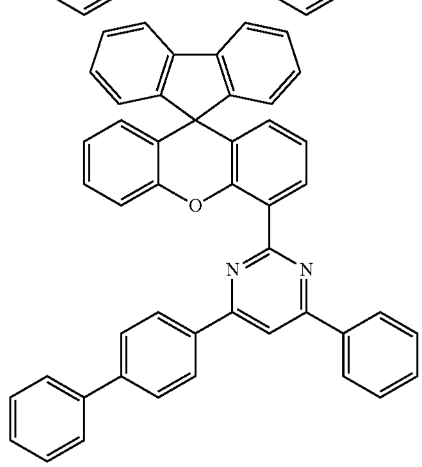

-continued
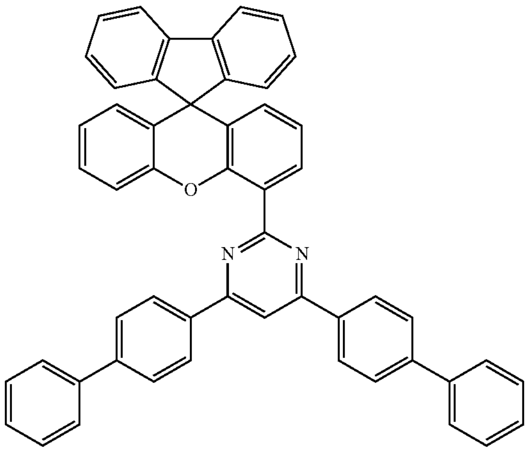
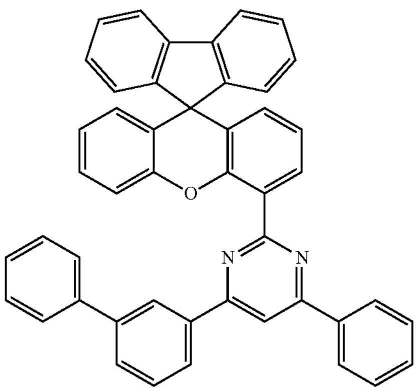
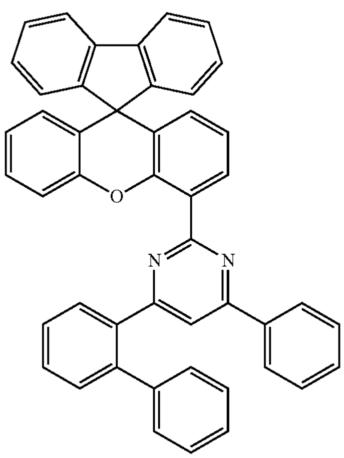
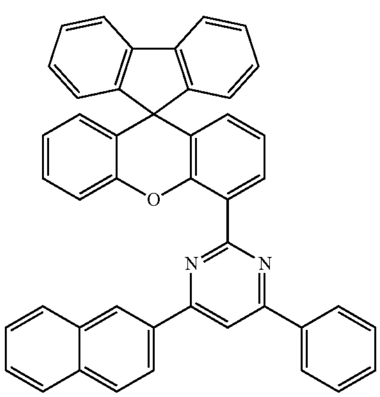
-continued
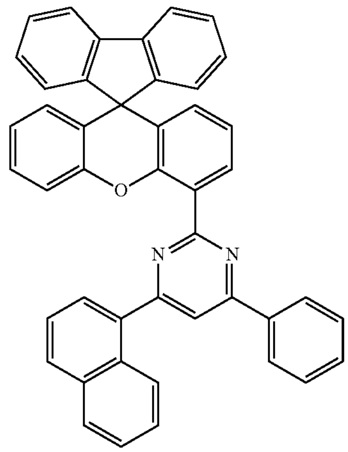
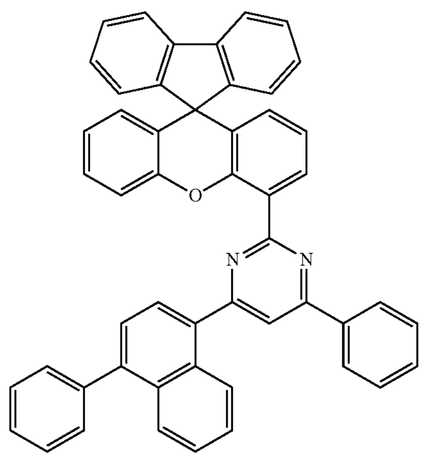
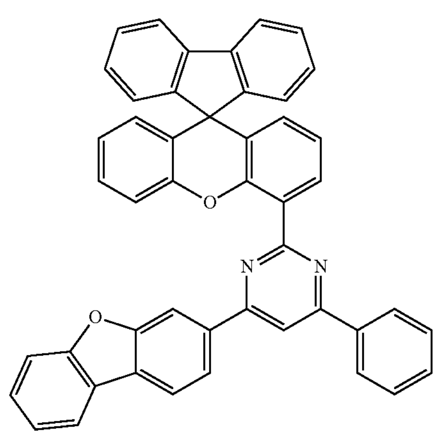

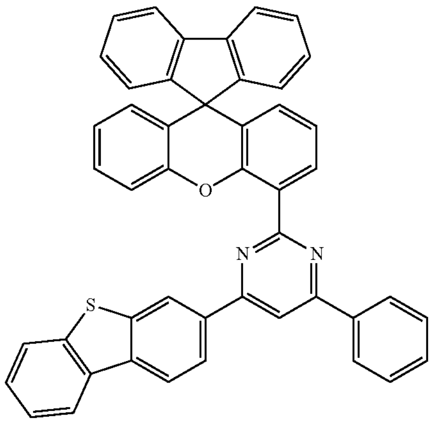
O
N
N
S
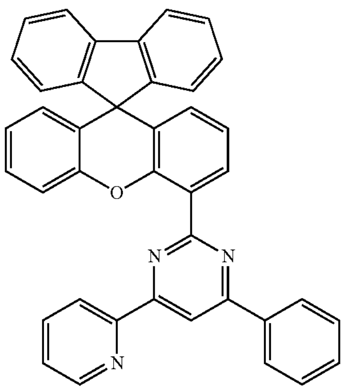
O
N
N
N
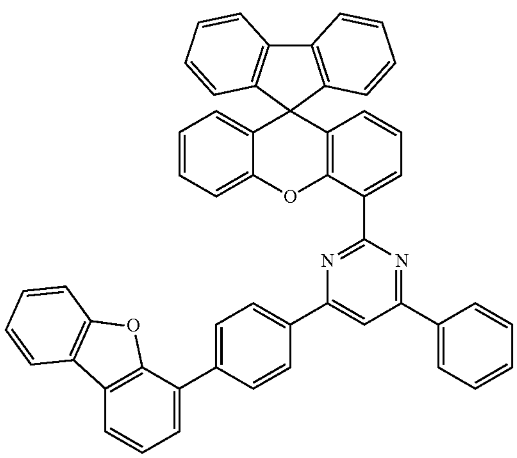
O
N
N
O
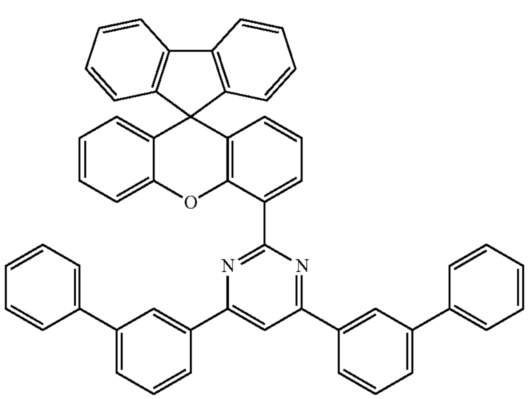
O
N
N
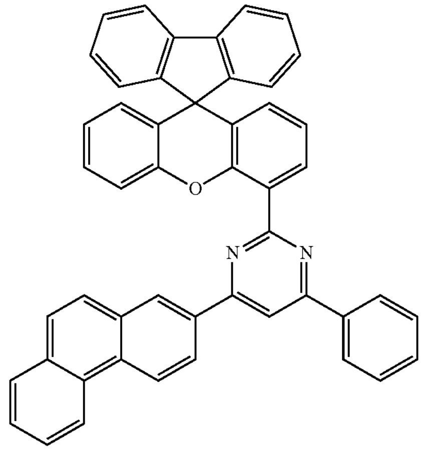
O
N
N
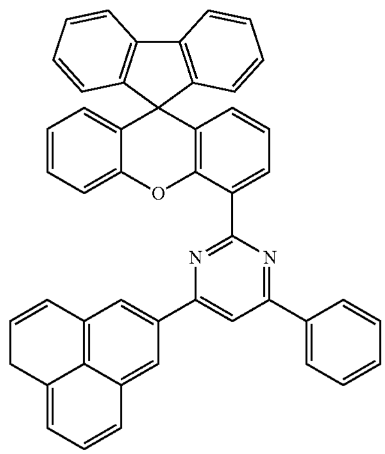
O
N
N
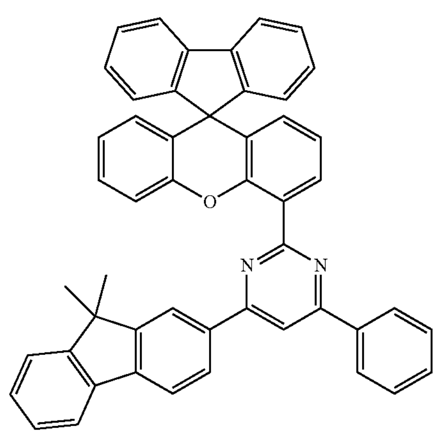
O
N
N -continued
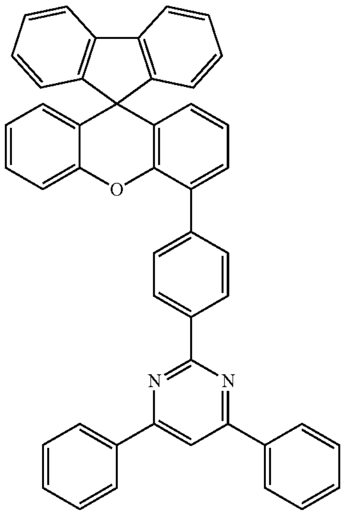
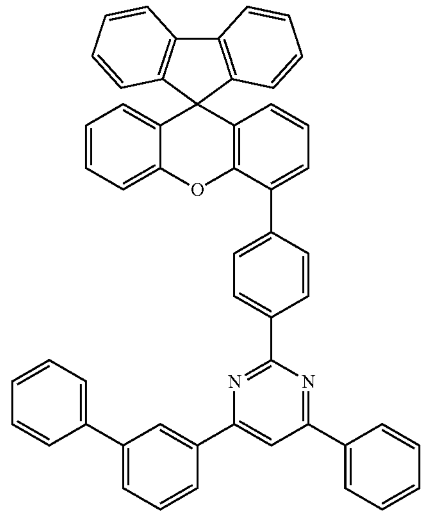
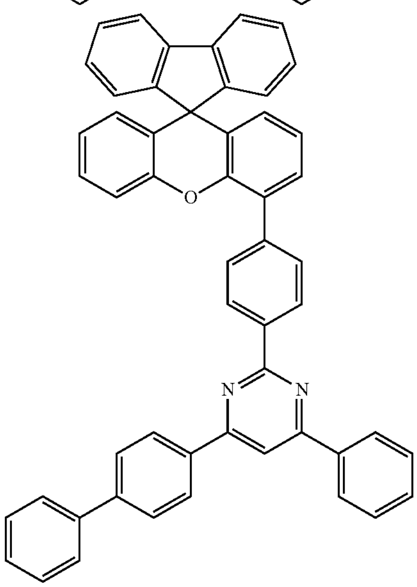
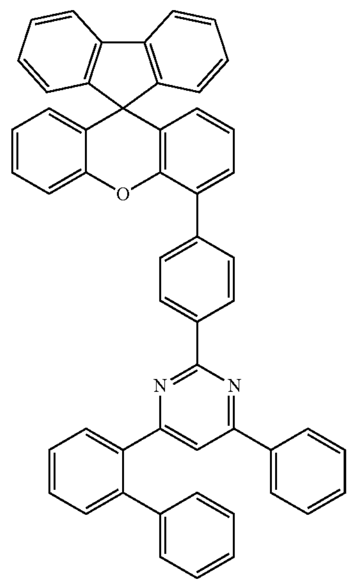
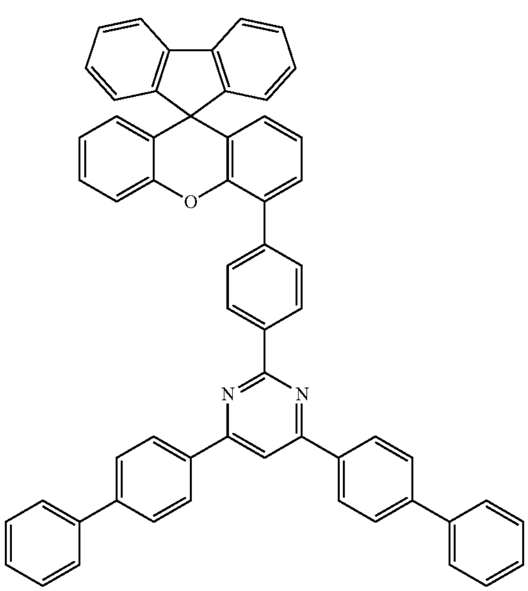
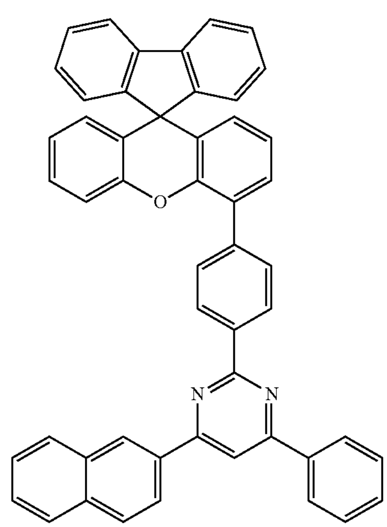

-continued
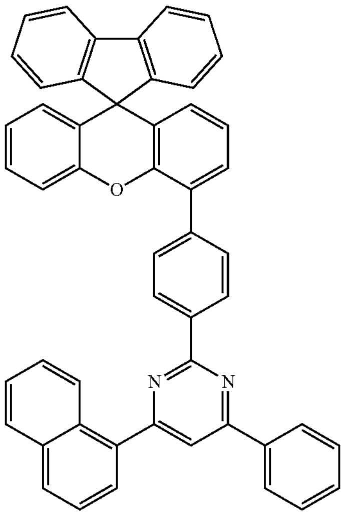
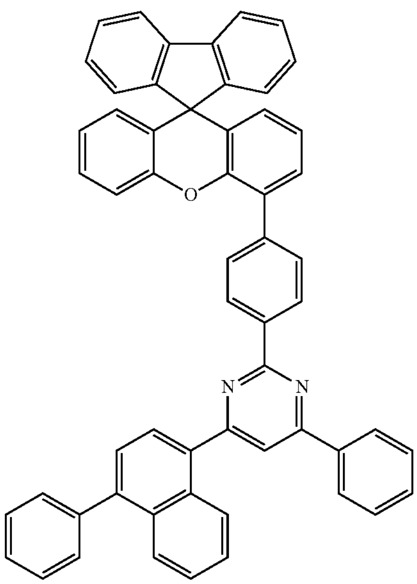
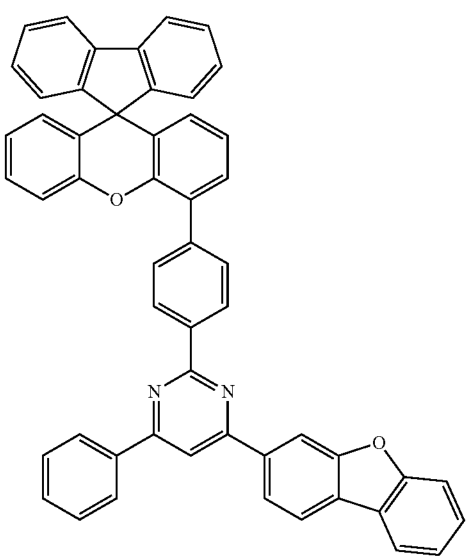
-continued
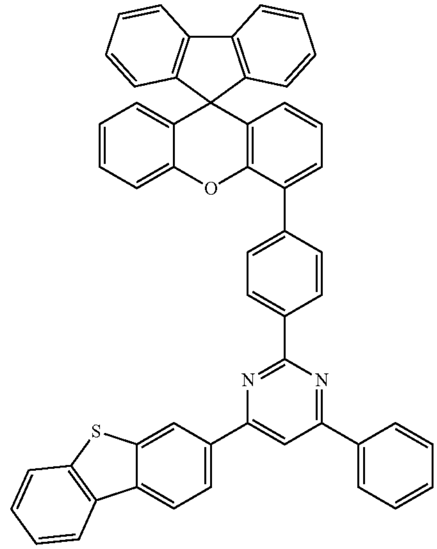
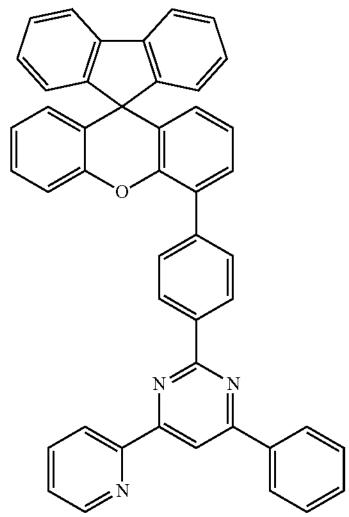
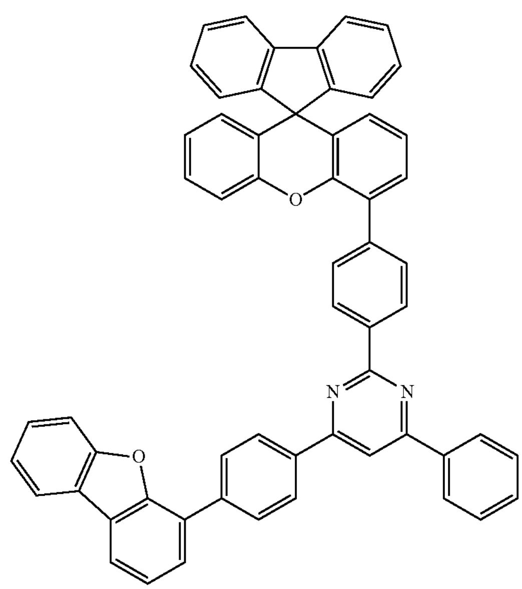

-continued
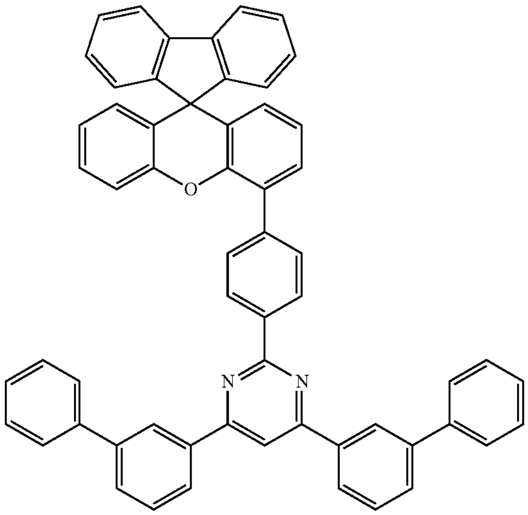
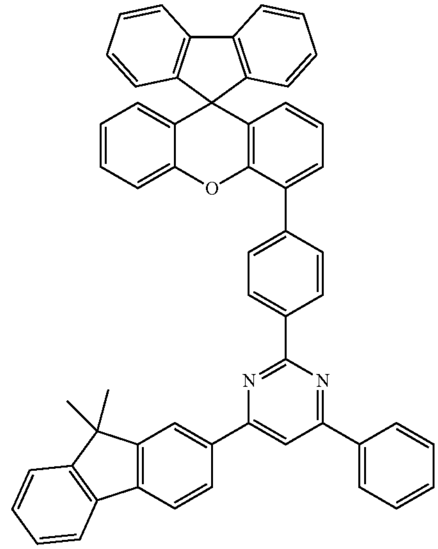
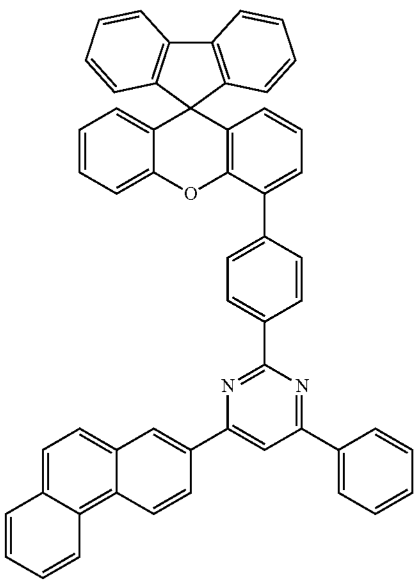
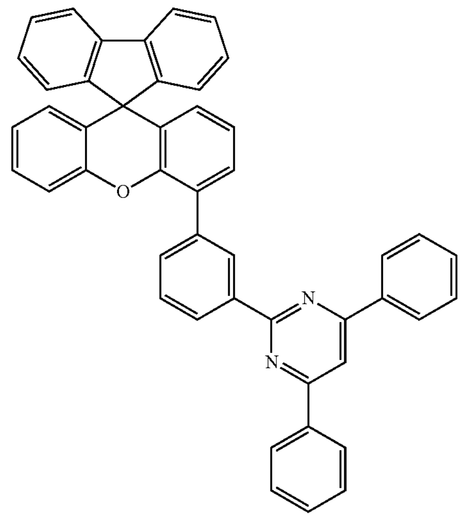
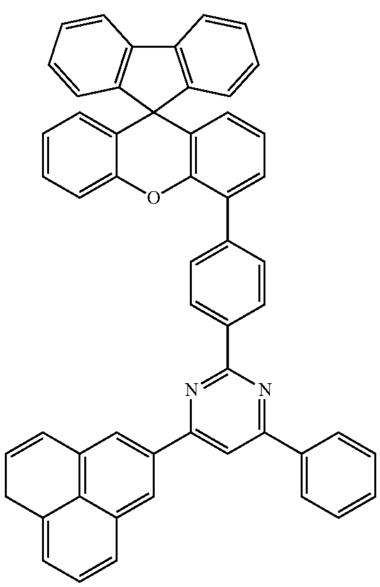
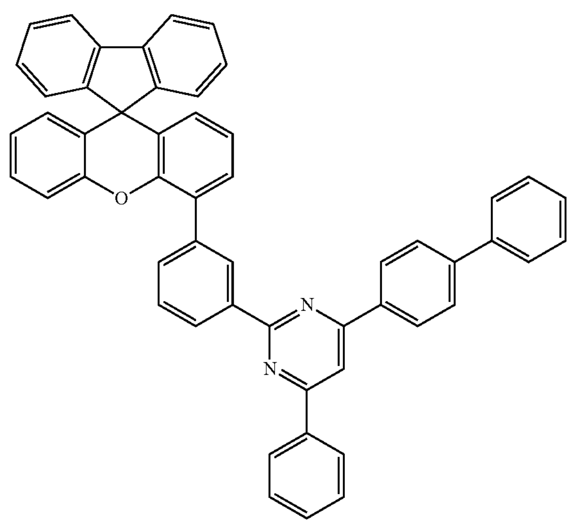

-continued
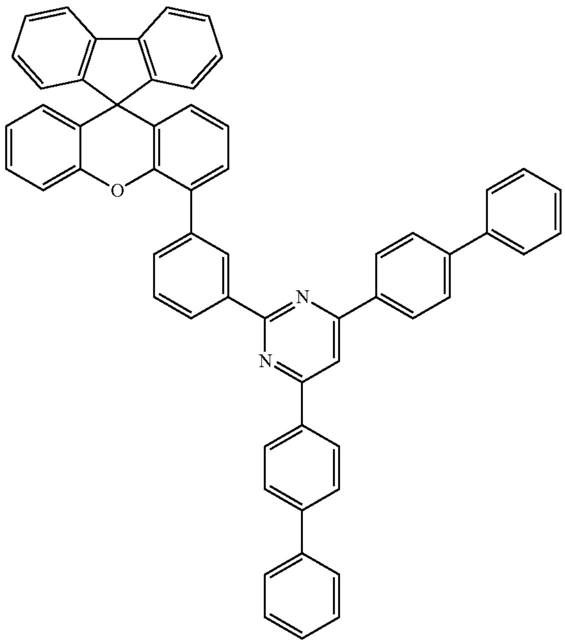
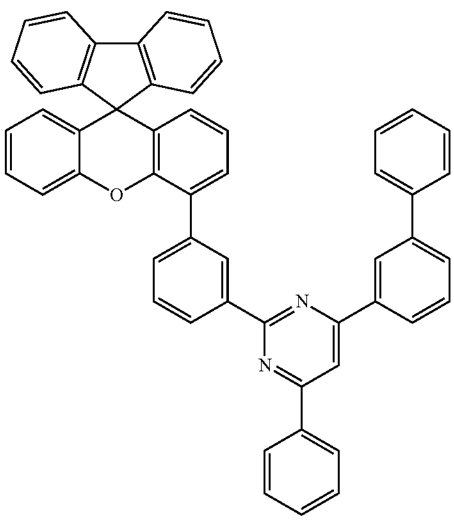
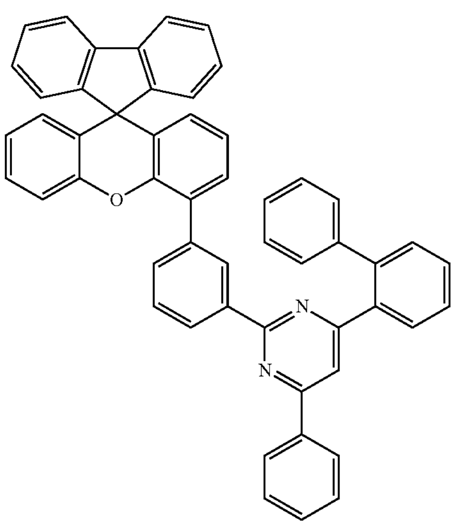
-continued
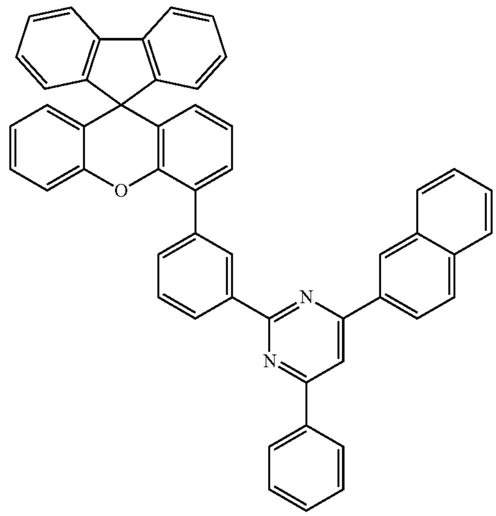
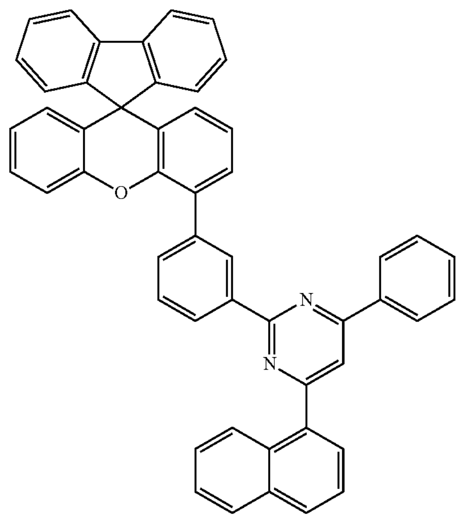
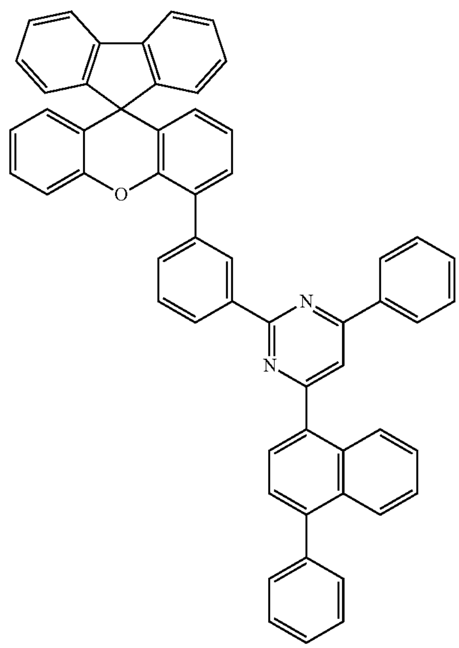

-continued
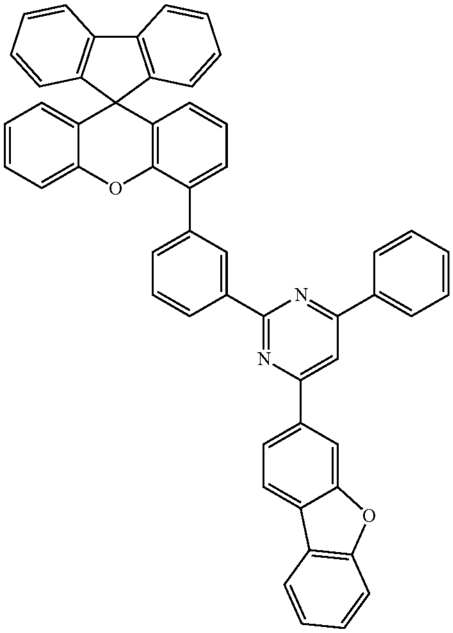
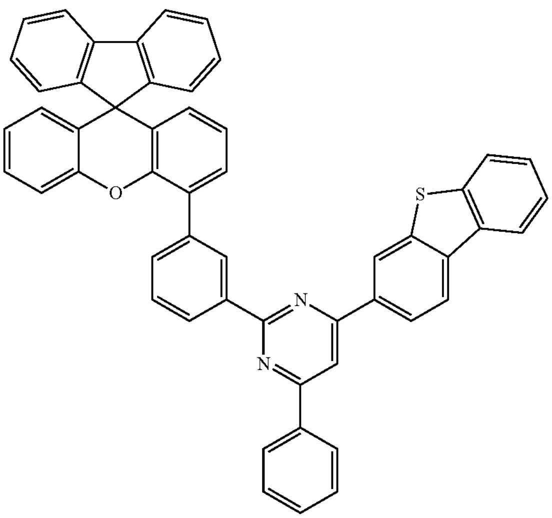
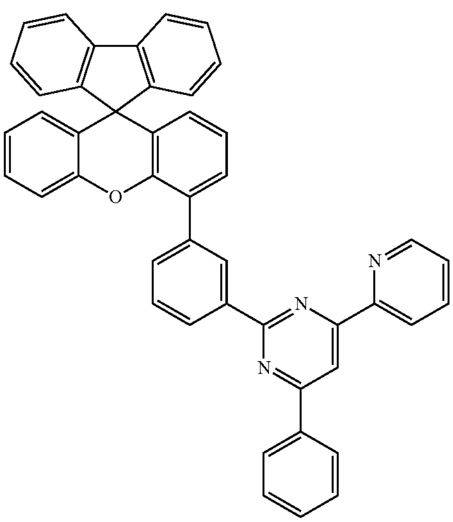
-continued
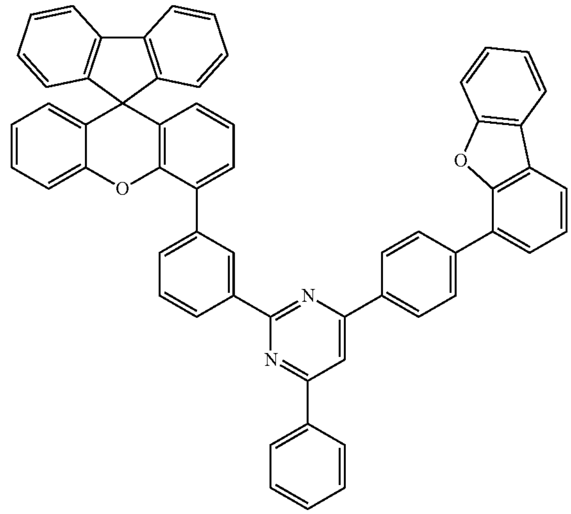
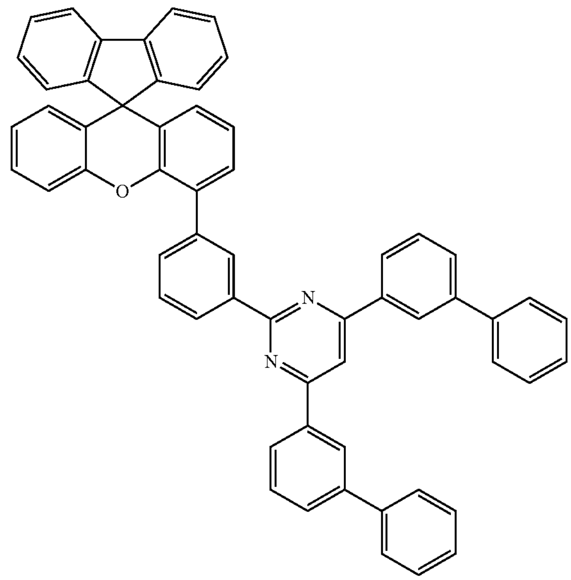
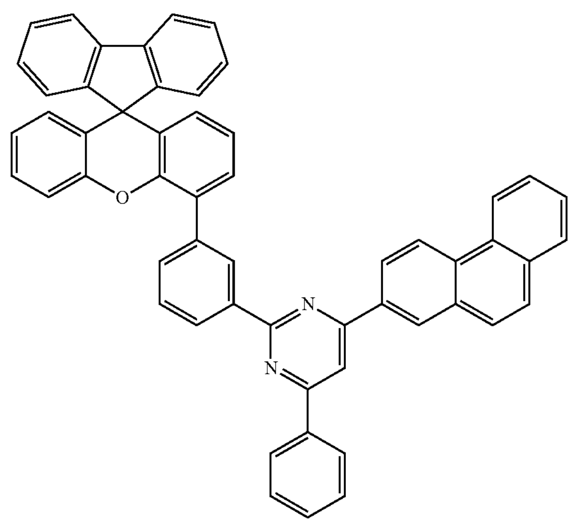

-continued
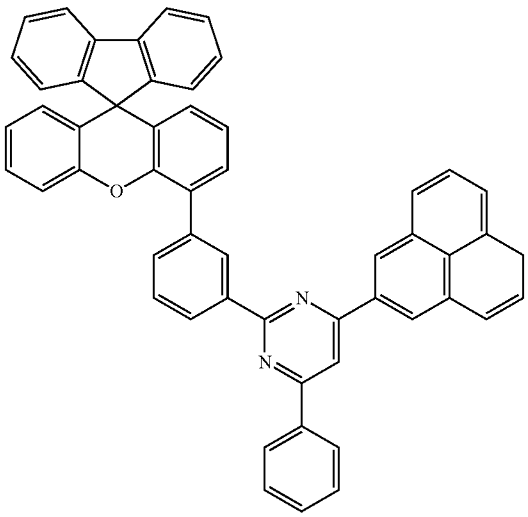
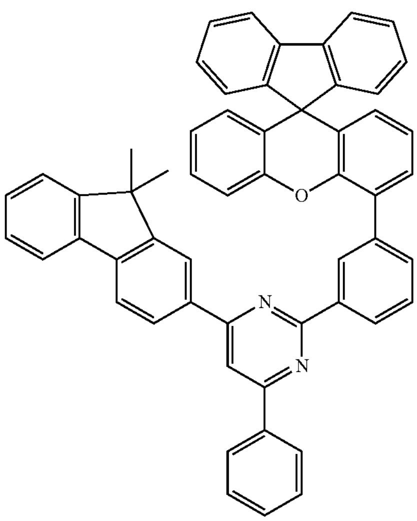
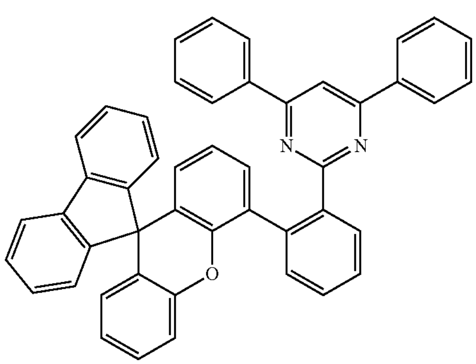
-continued
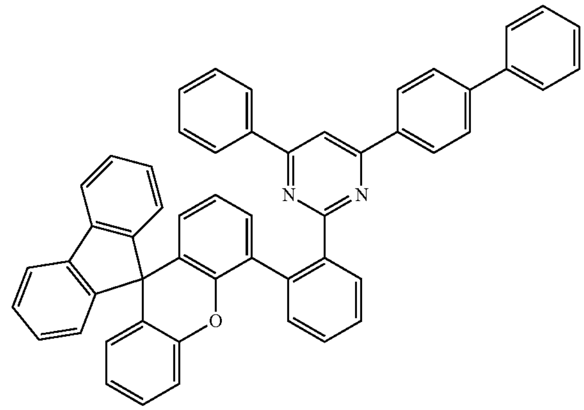
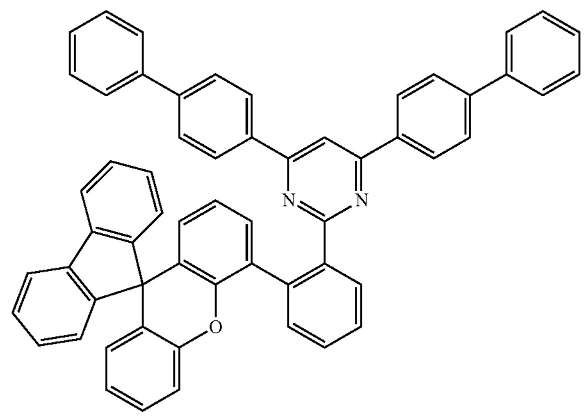
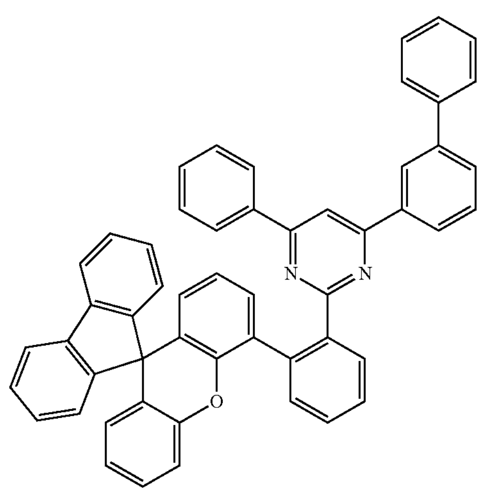

-continued
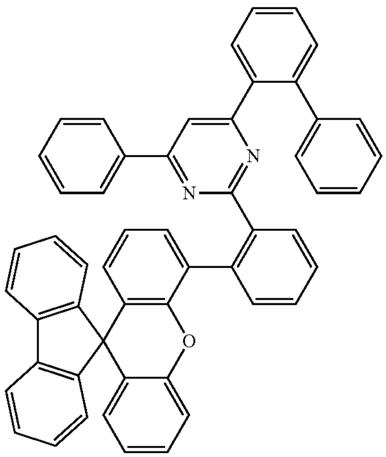
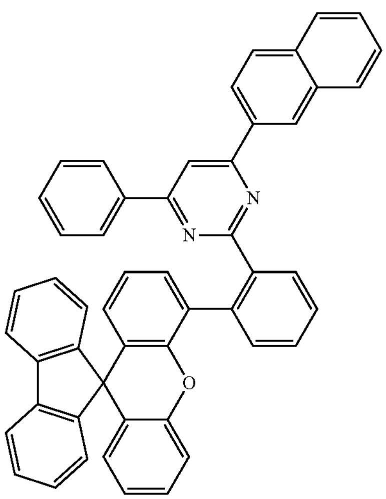
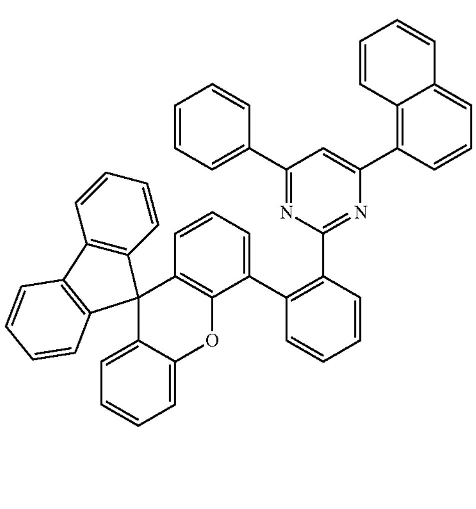
-continued
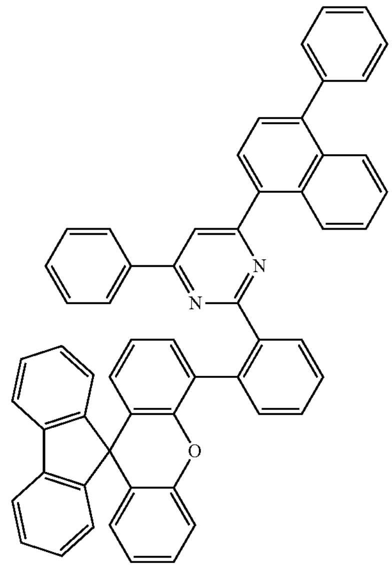
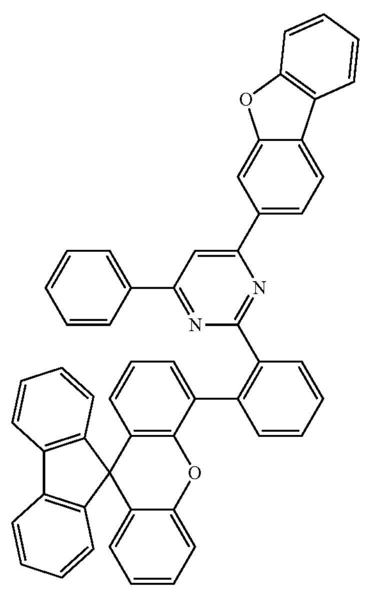
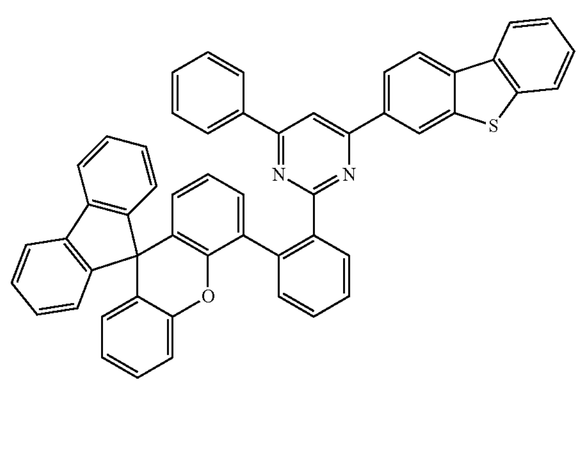

-continued
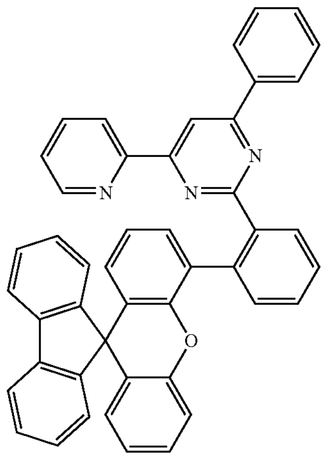
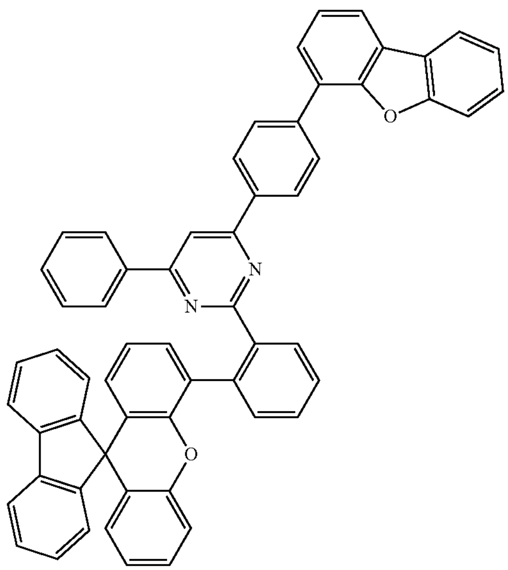
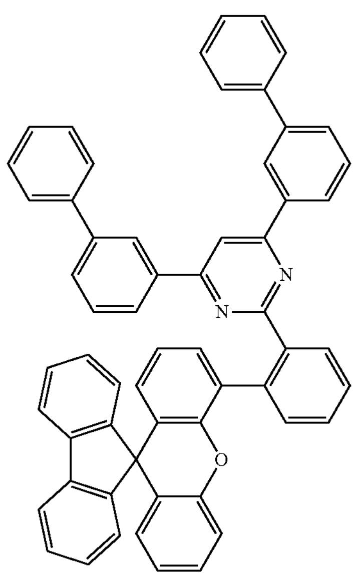
-continued
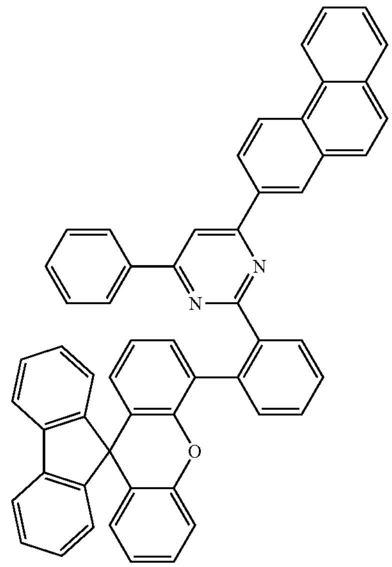
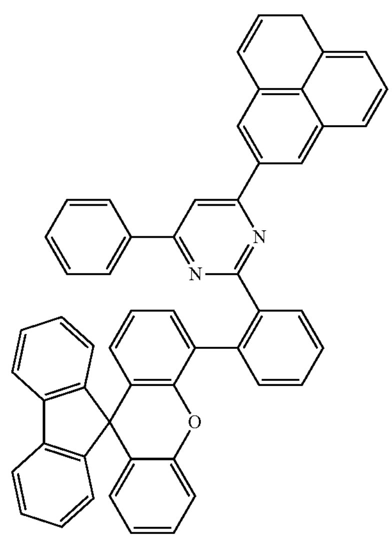
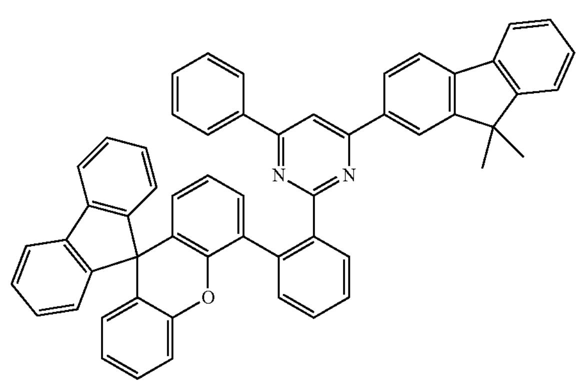

-continued
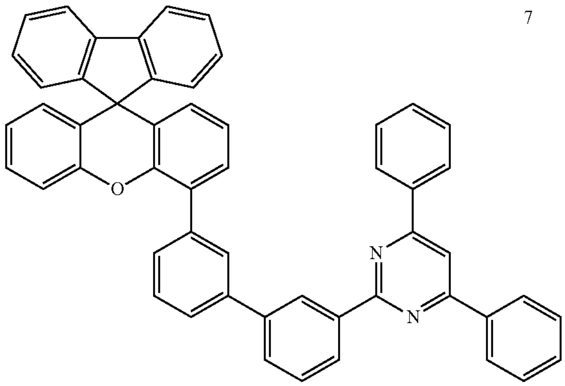
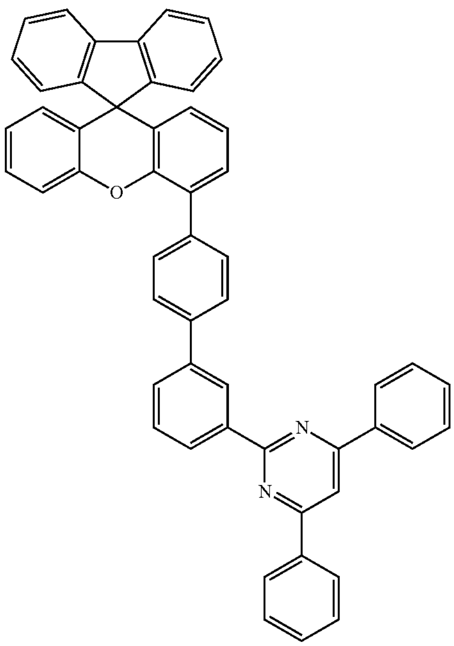
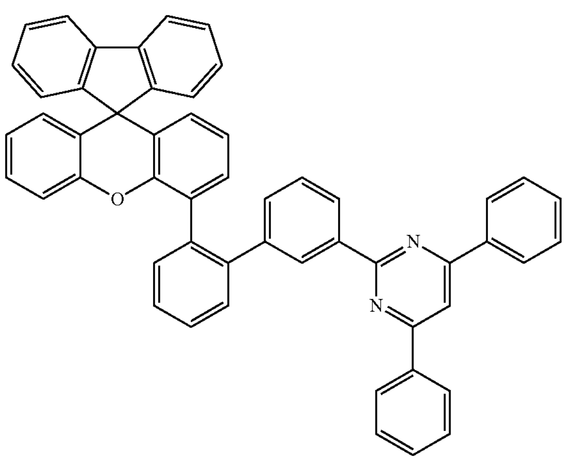
-continued
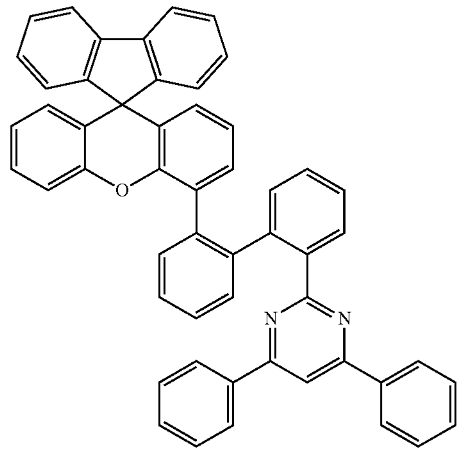
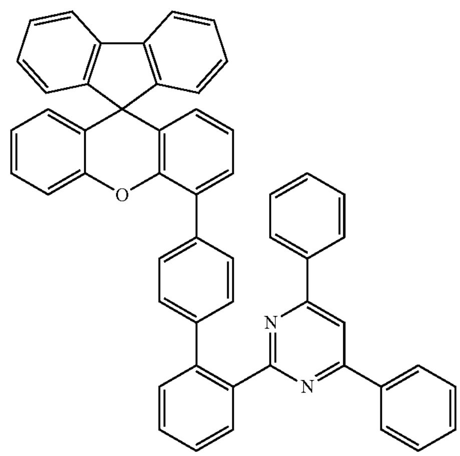
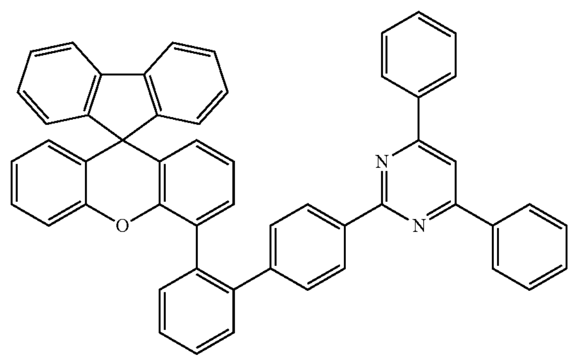
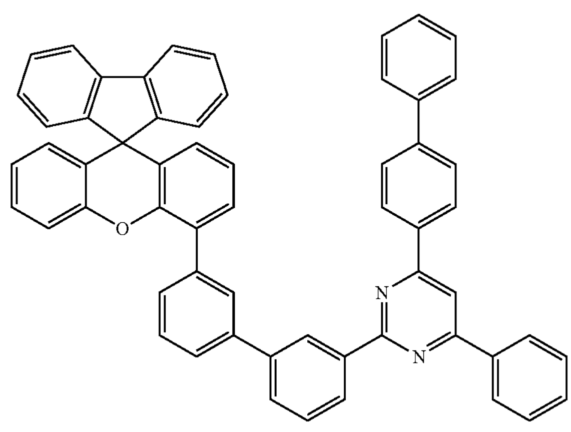

-continued
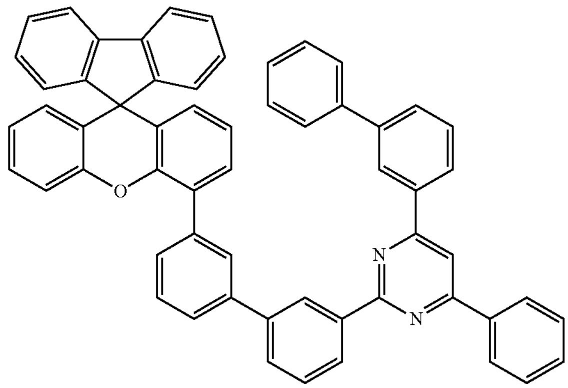
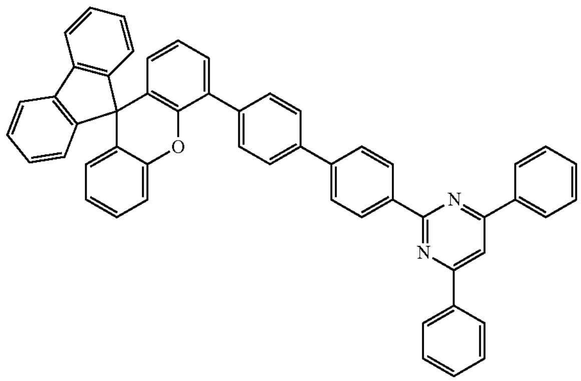
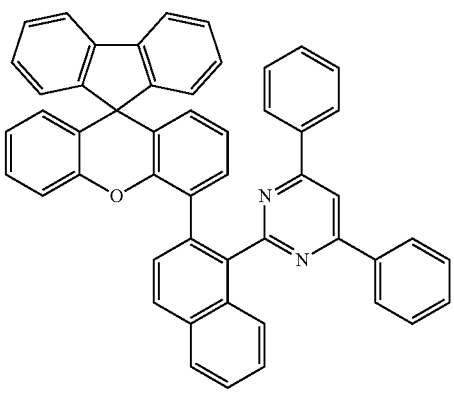
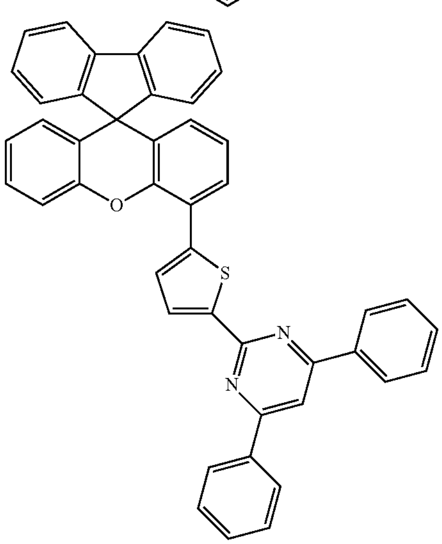
-continued
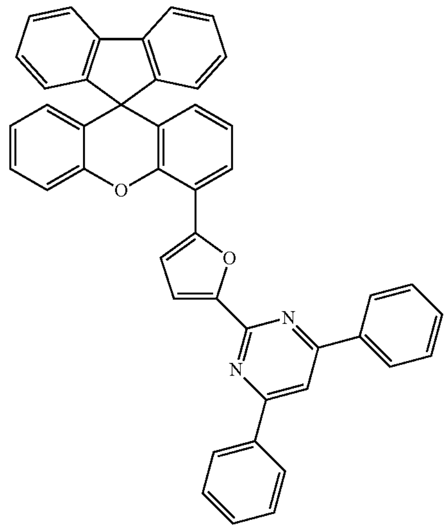
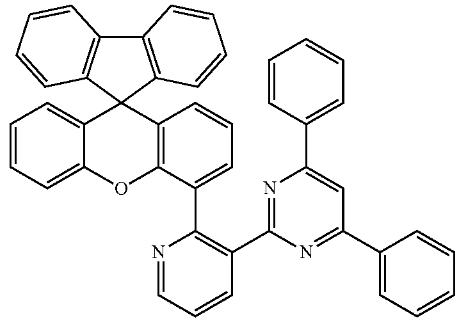
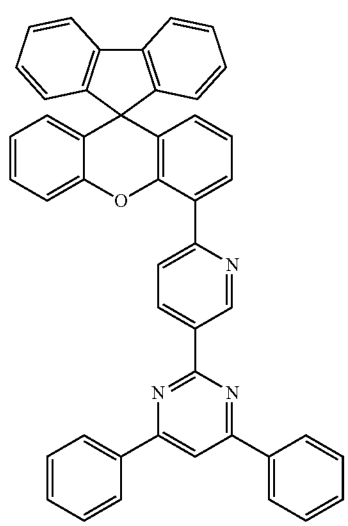

-continued
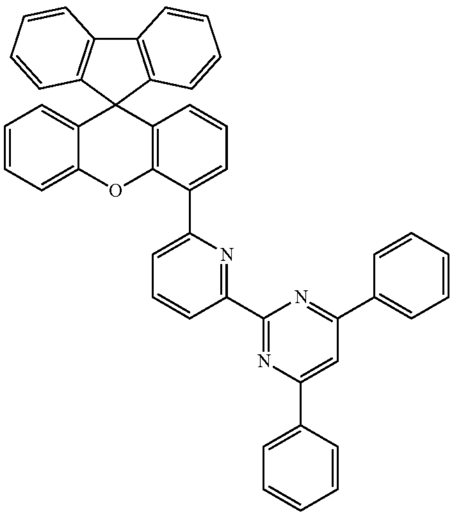
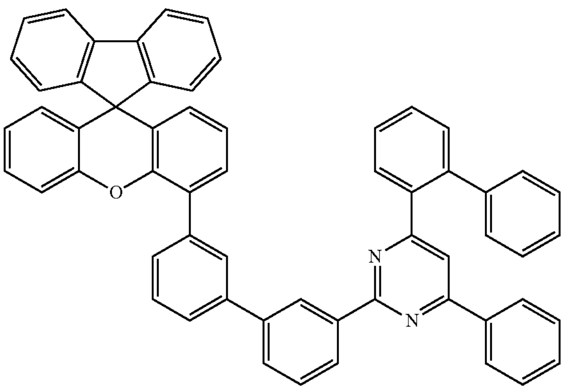
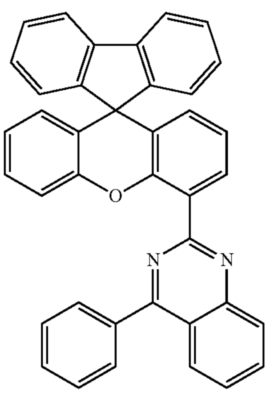
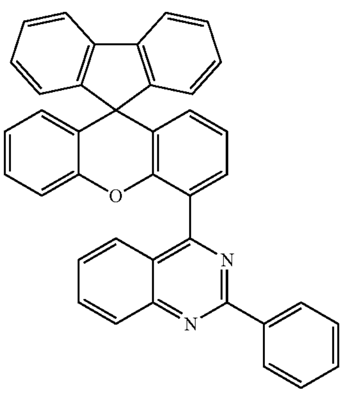
-continued
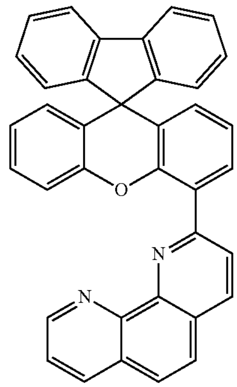
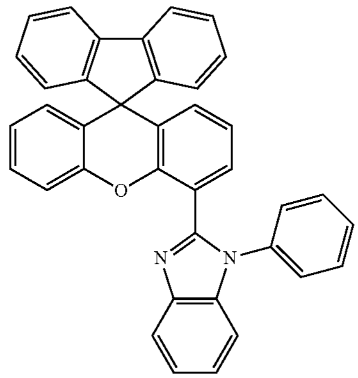
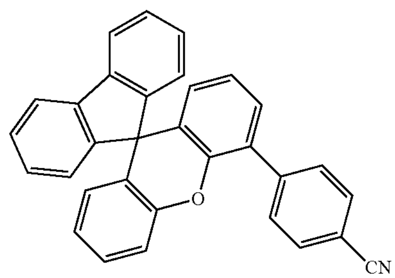
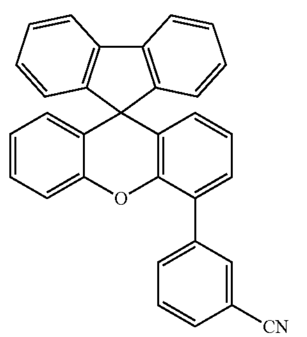
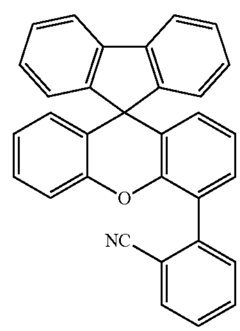
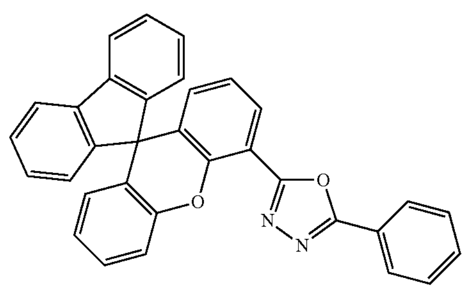

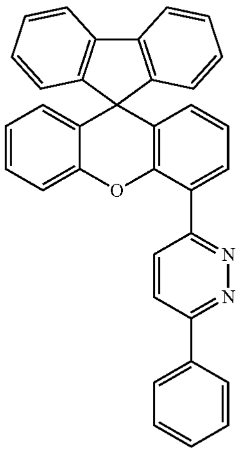
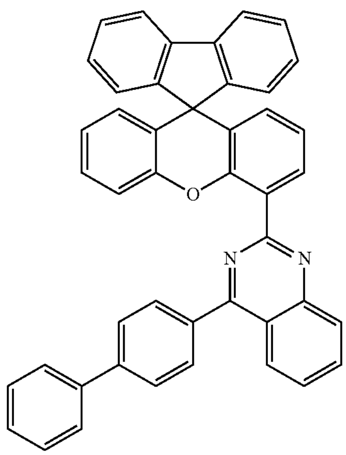
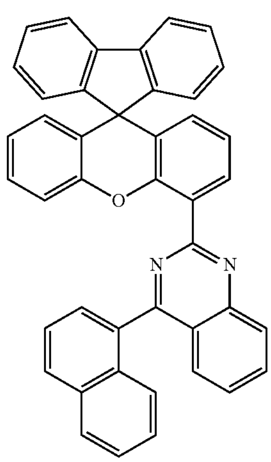
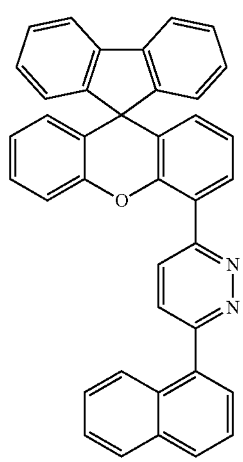
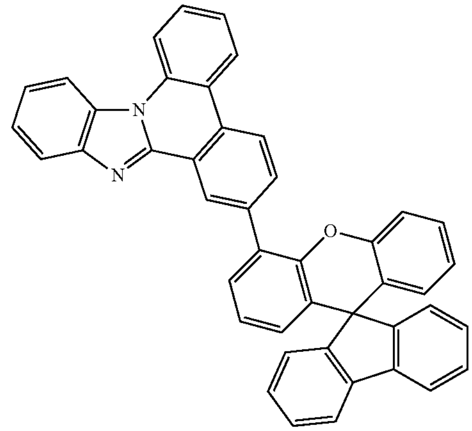
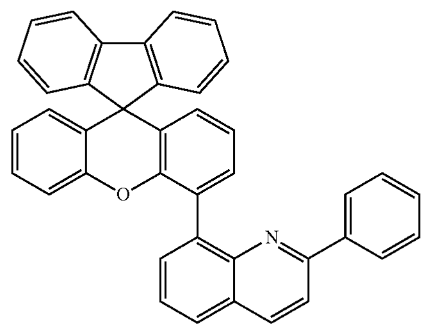
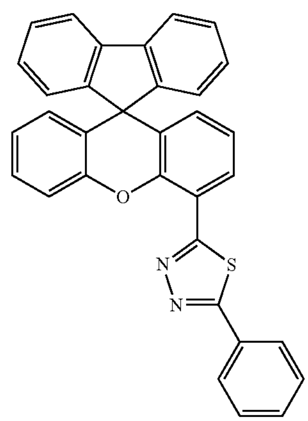
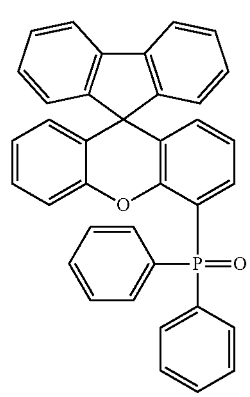

-continued
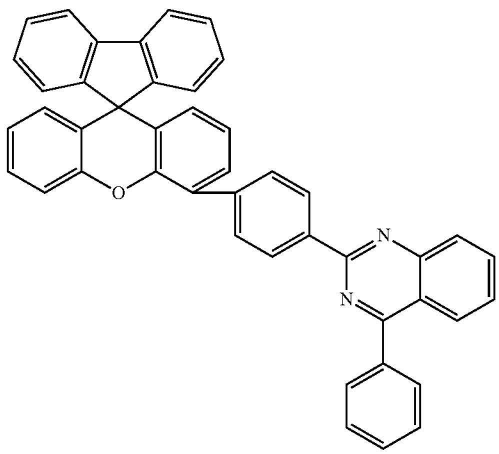
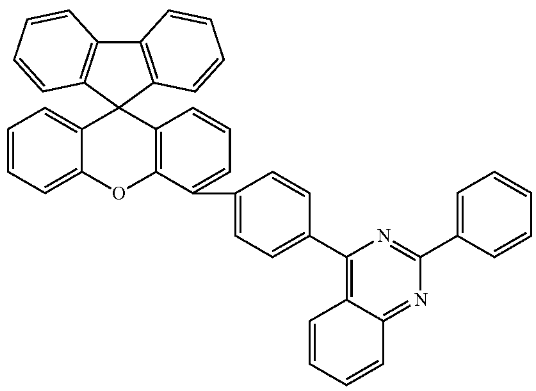
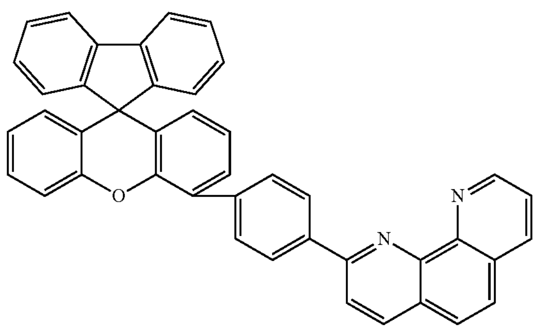
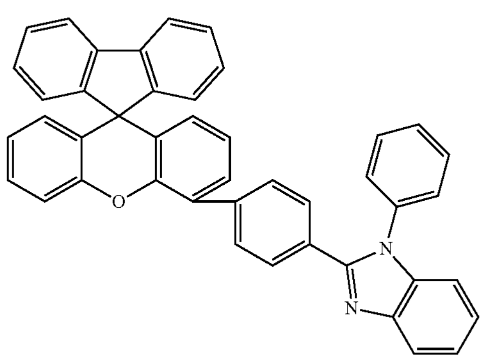
-continued
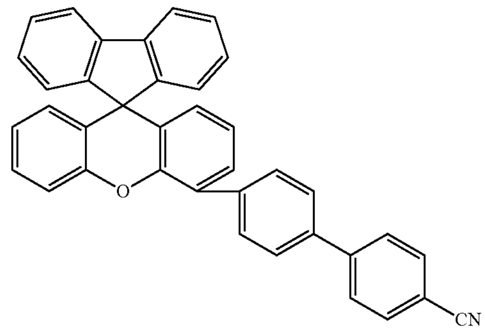
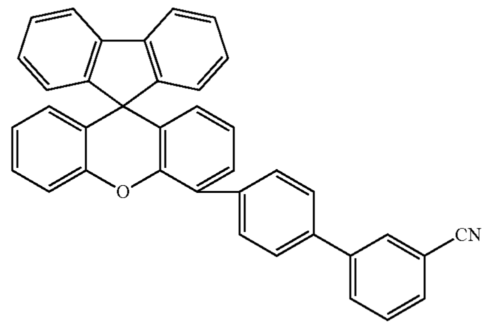
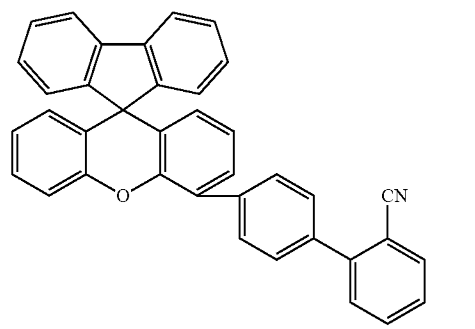
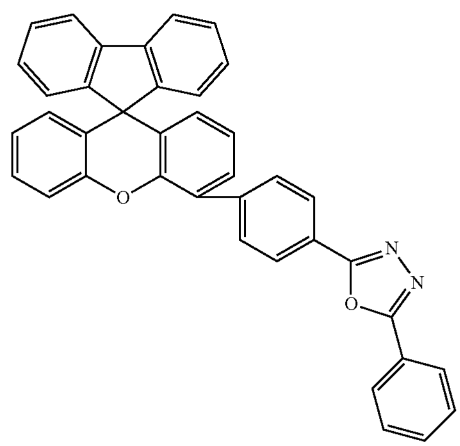

-continued
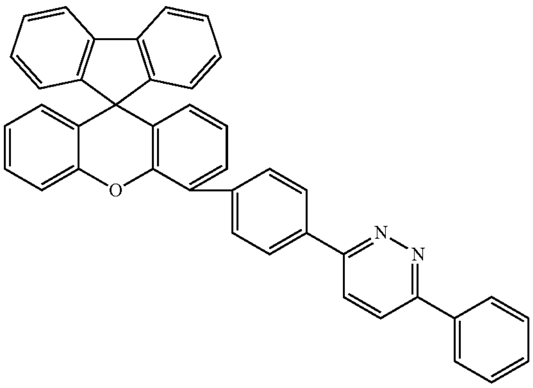
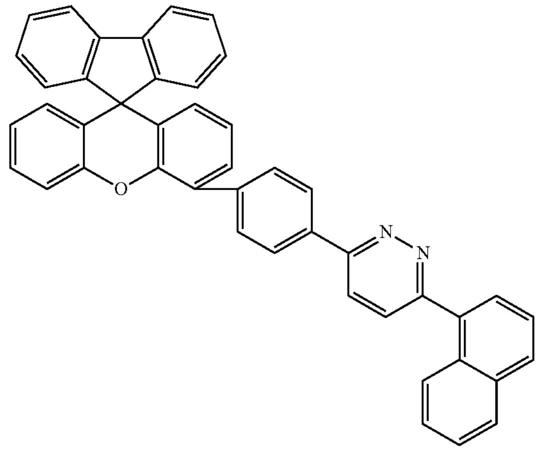
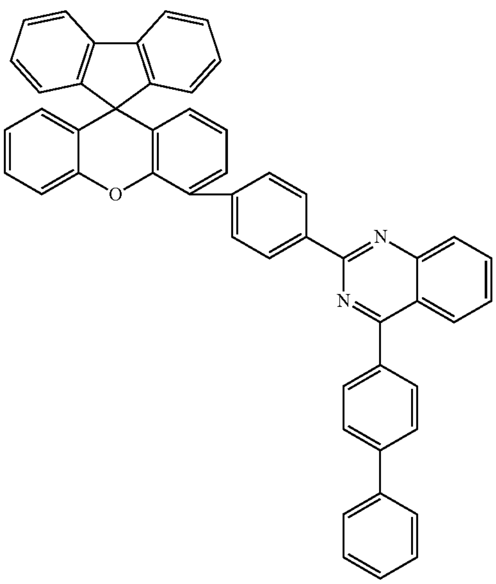
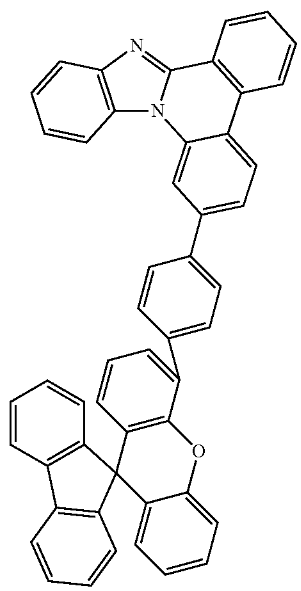
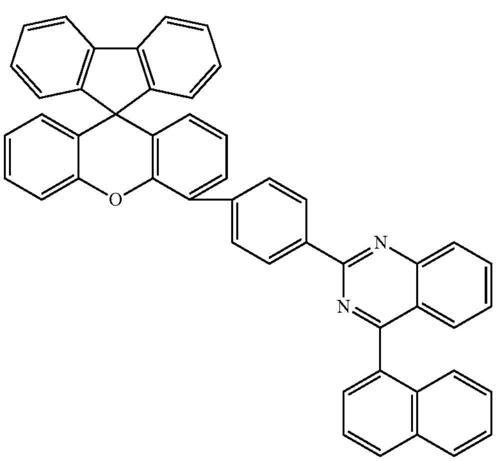
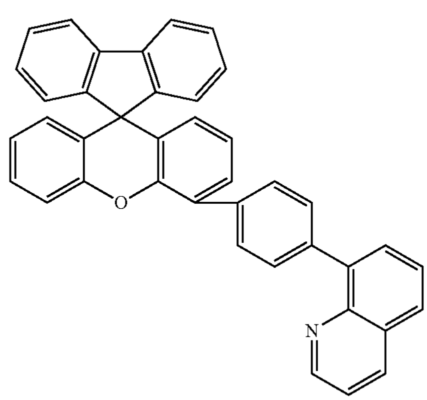

-continued
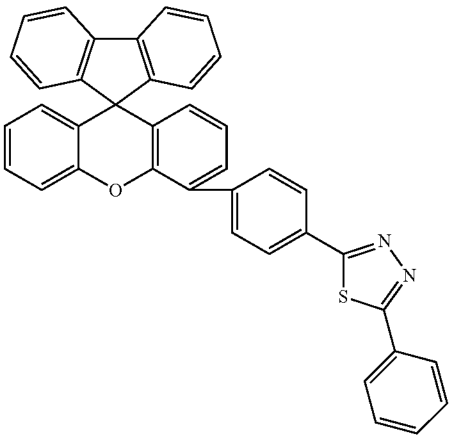
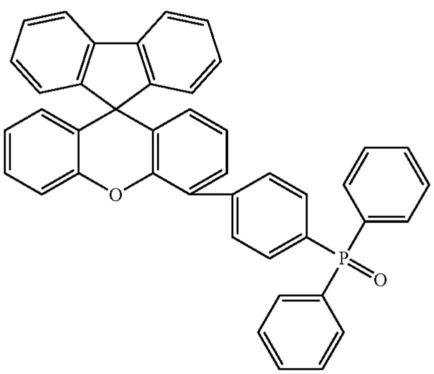
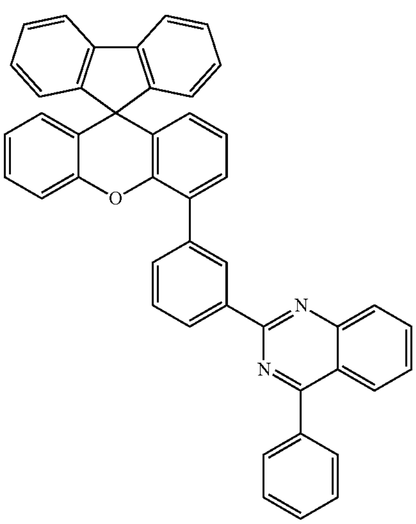
-continued
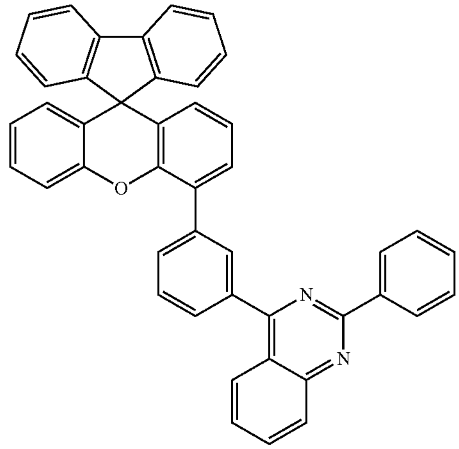
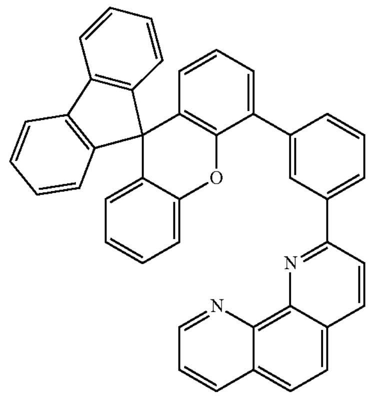
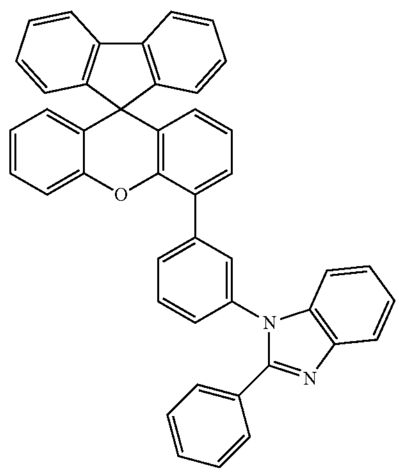
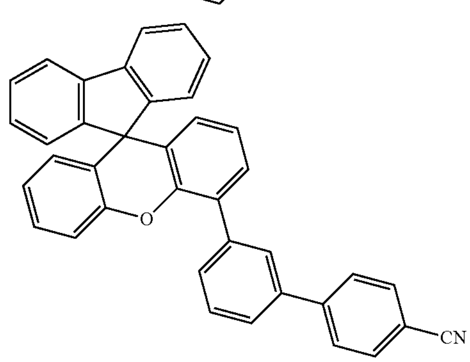

-continued
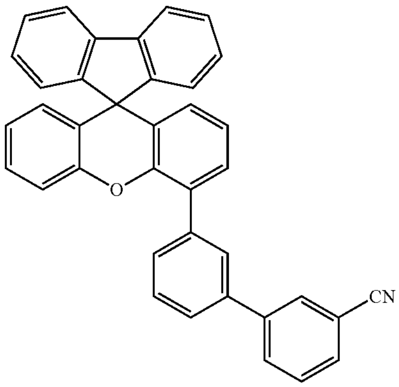
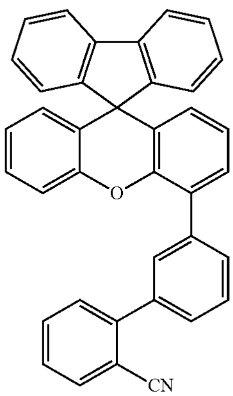
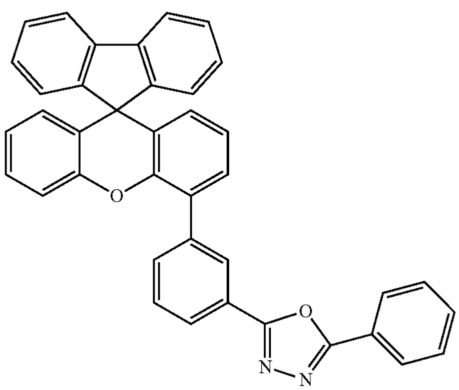
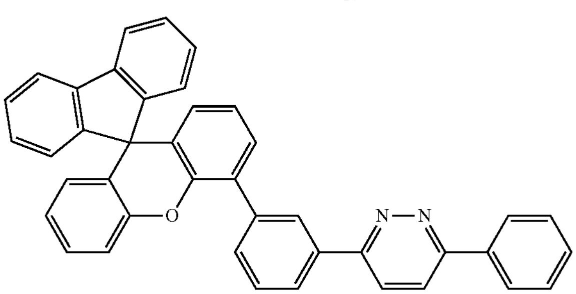
-continued
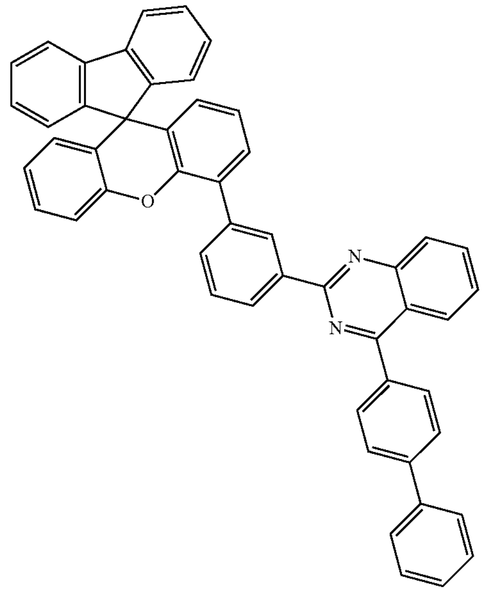
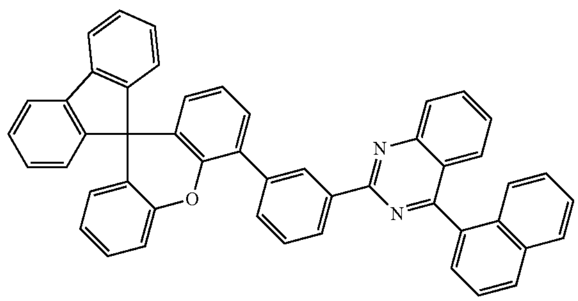
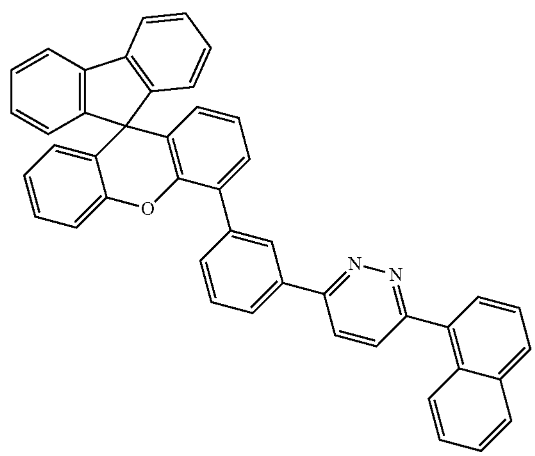

-continued
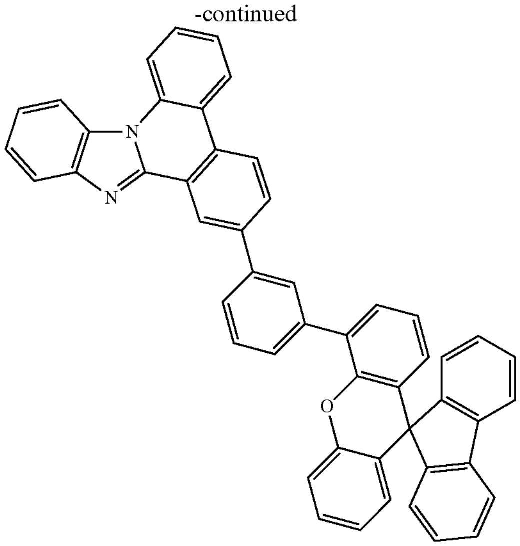
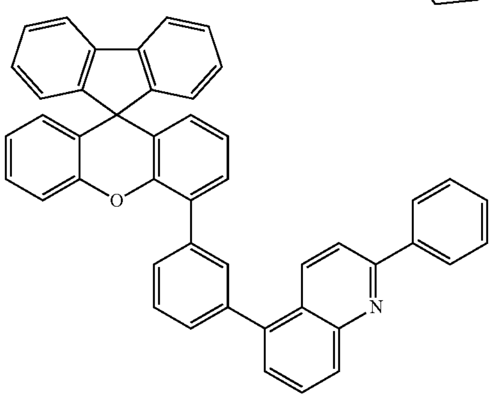
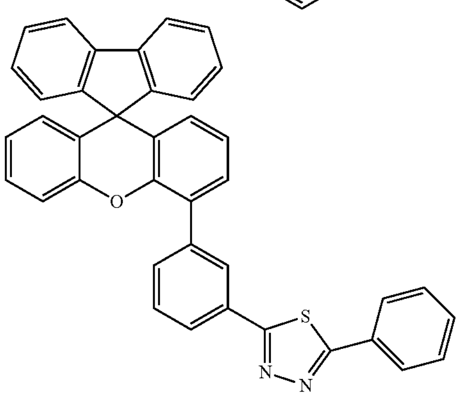
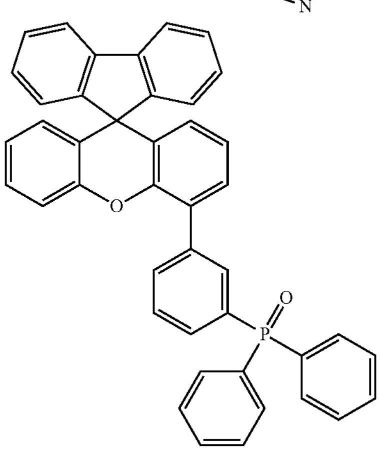
-continued
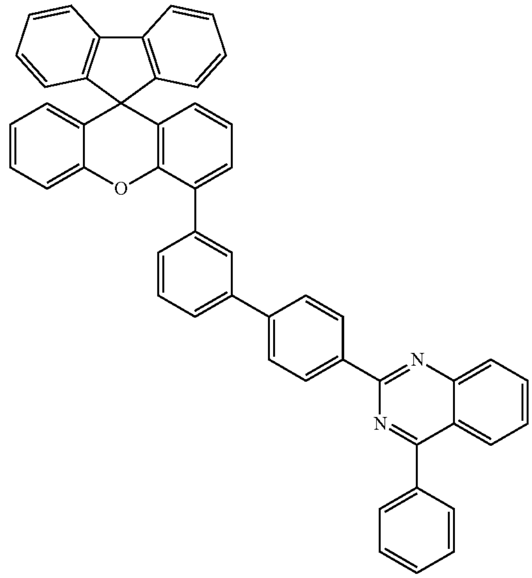
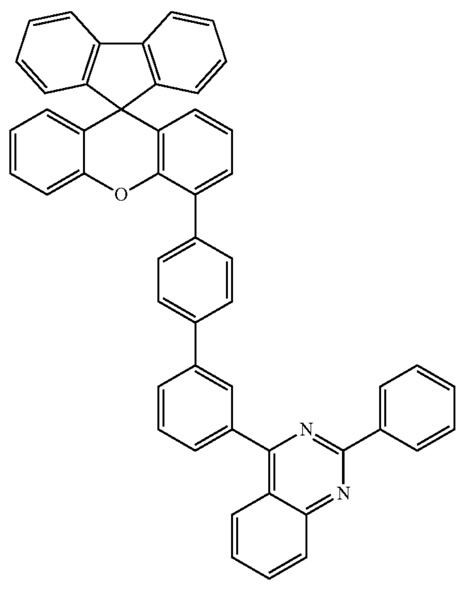
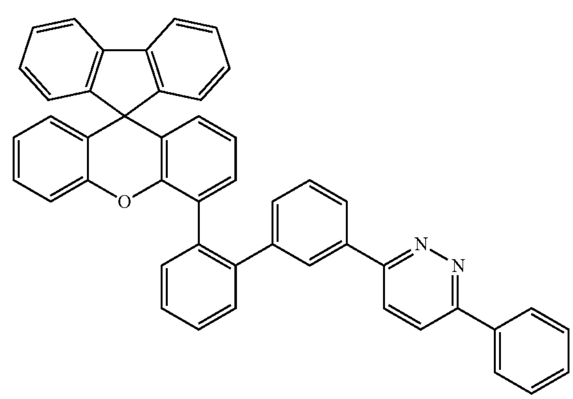

-continued
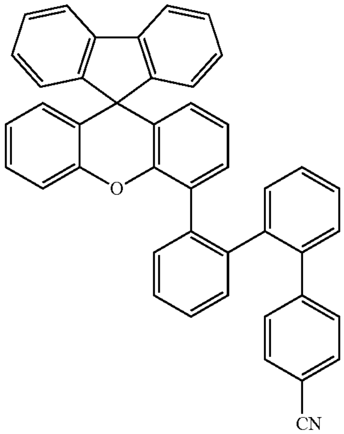
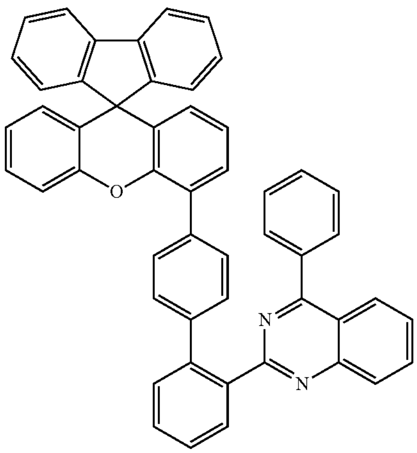
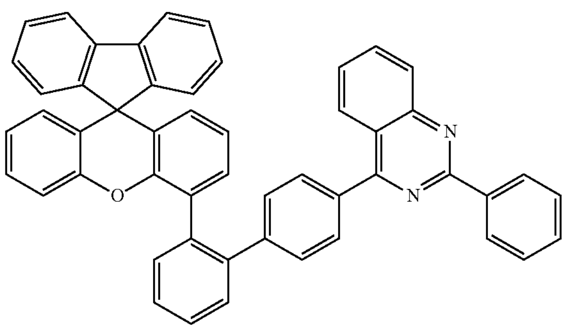
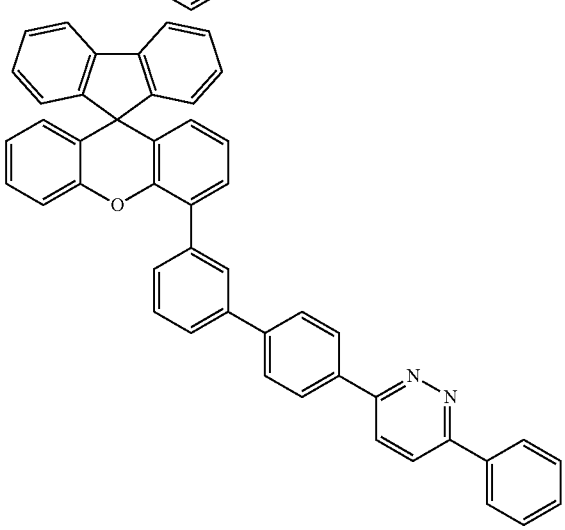
-continued
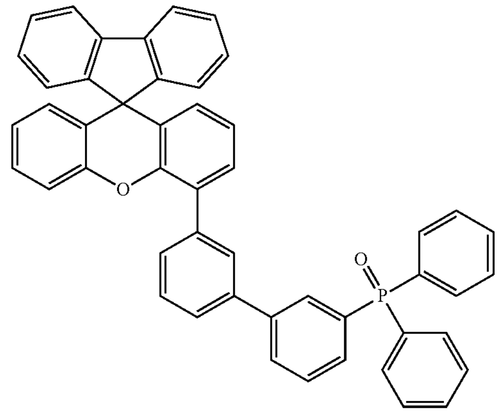
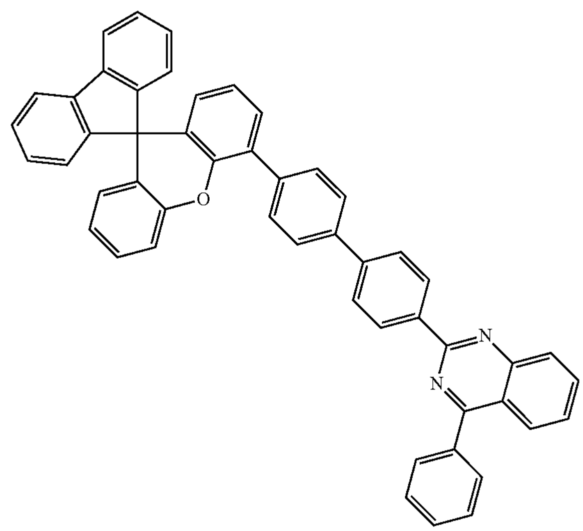
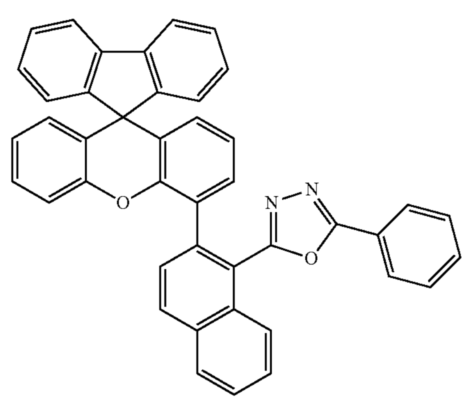

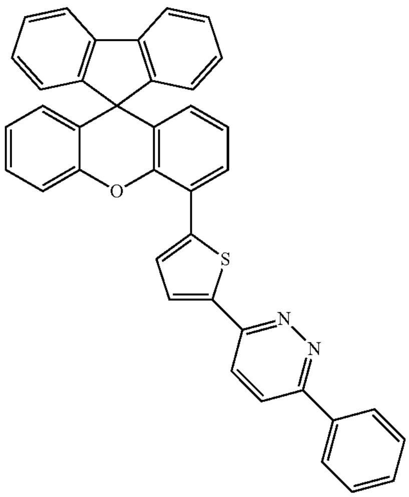
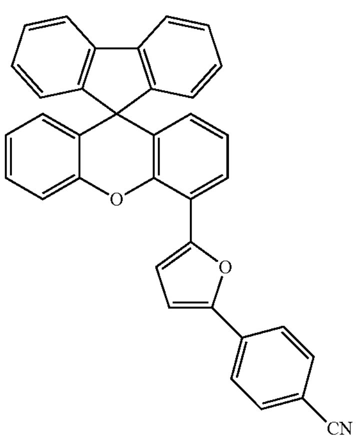
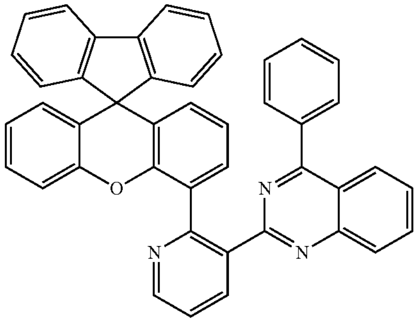
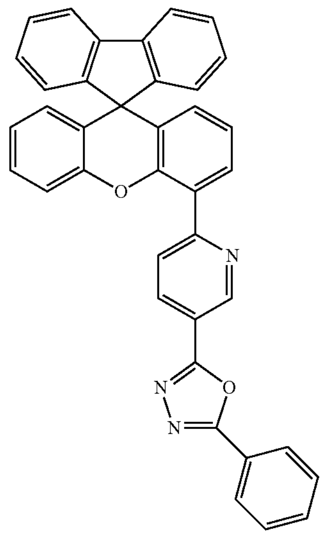
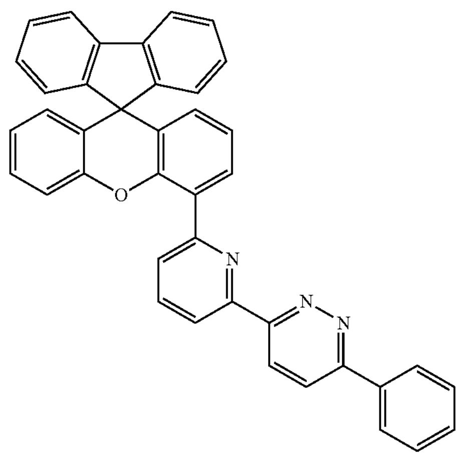
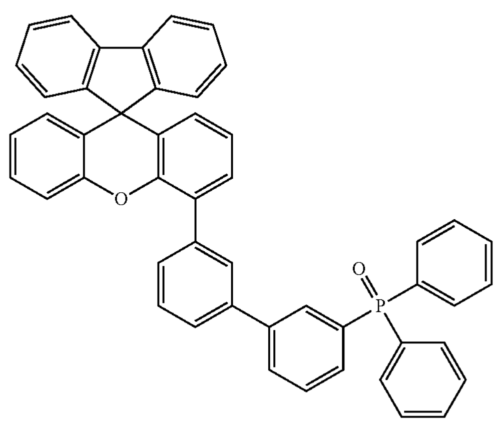

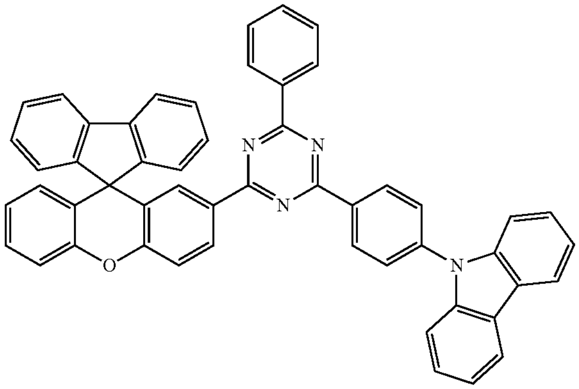
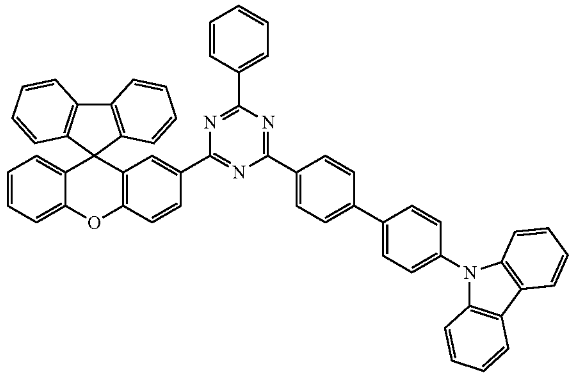
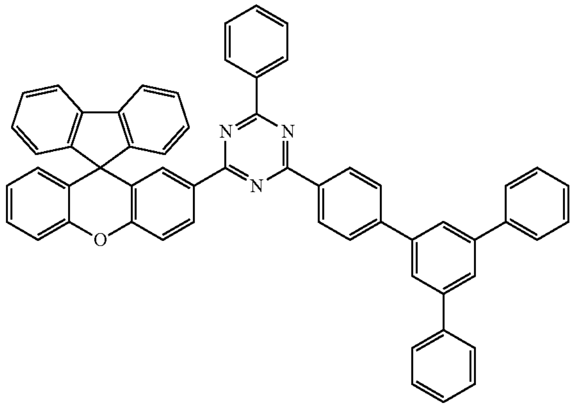
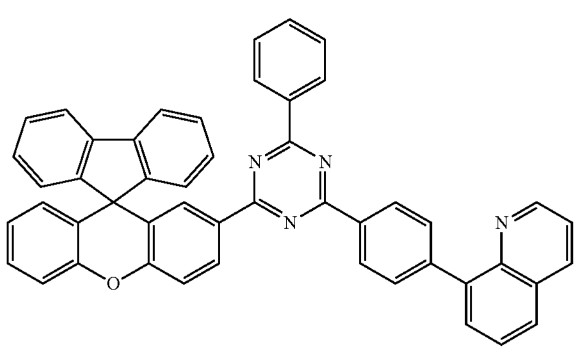
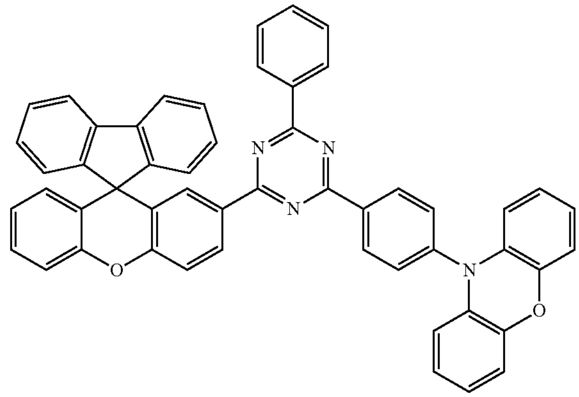
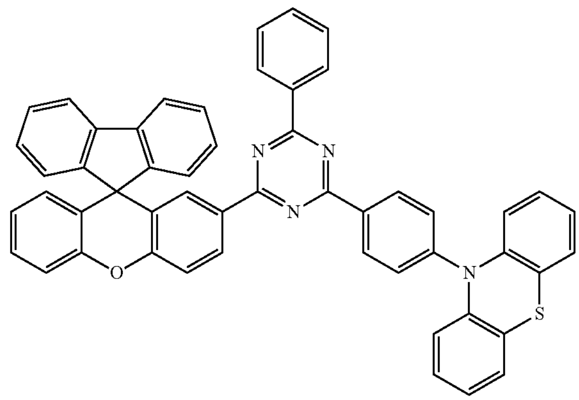
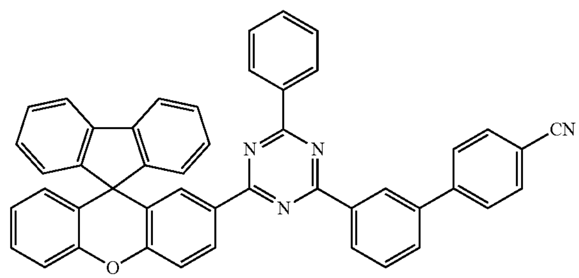
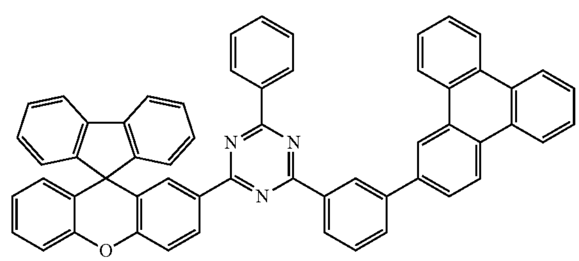
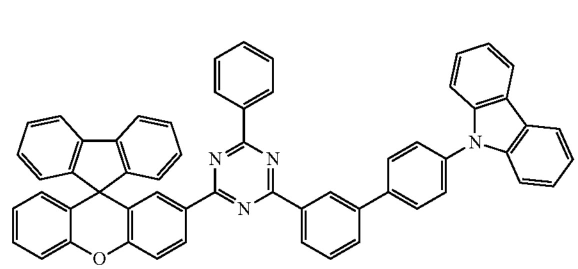

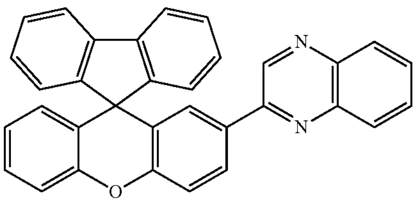
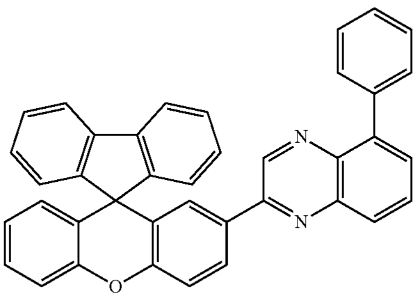
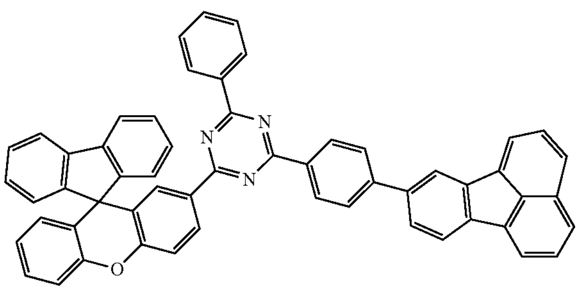
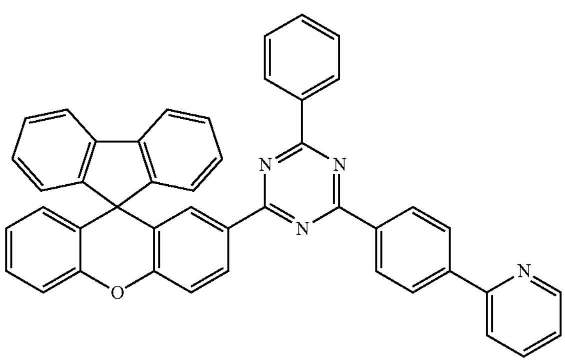
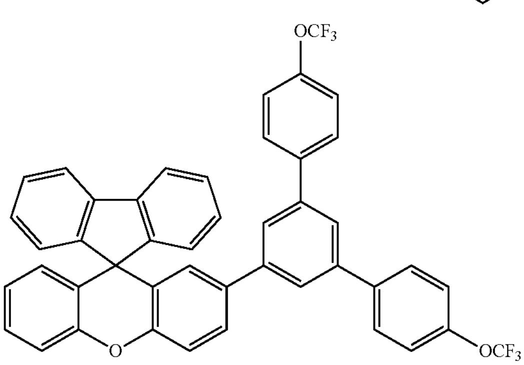
OCF3
OCF3
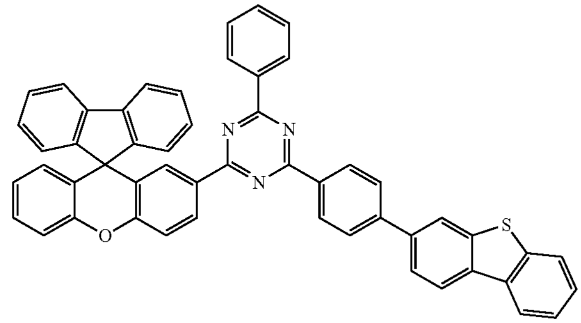
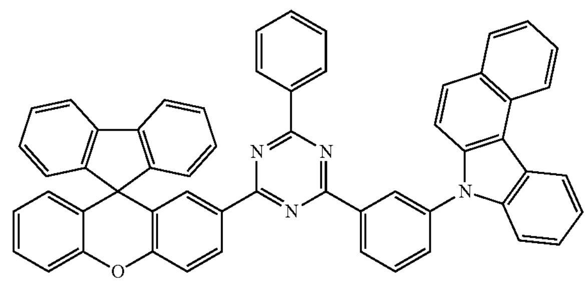
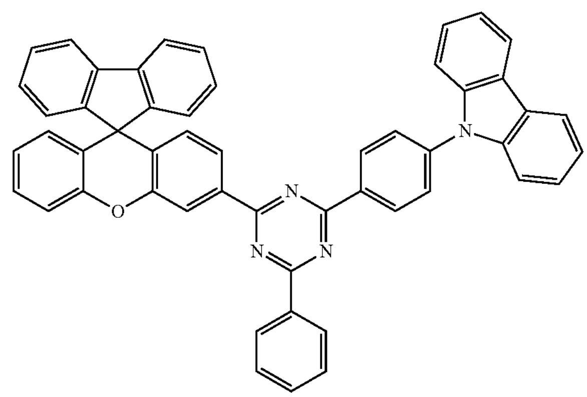
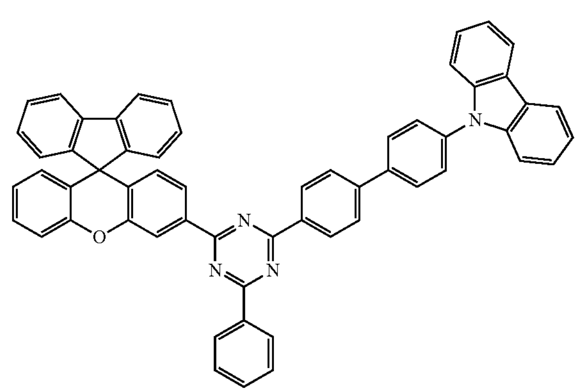

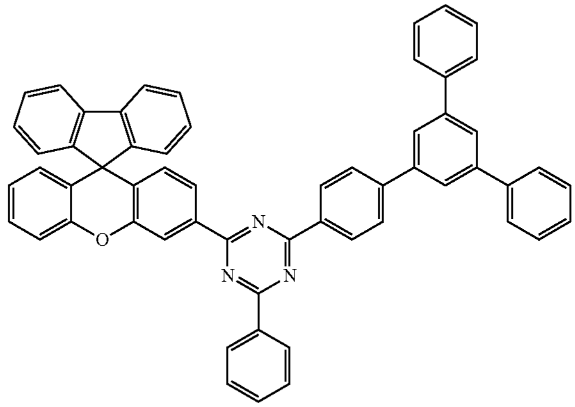
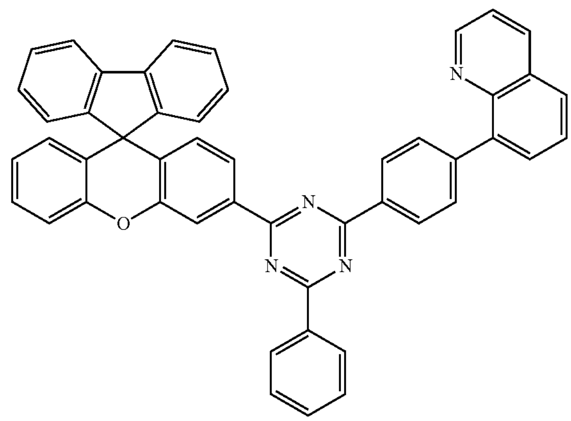
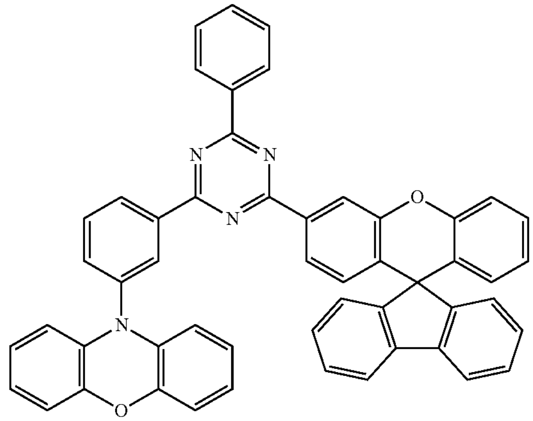
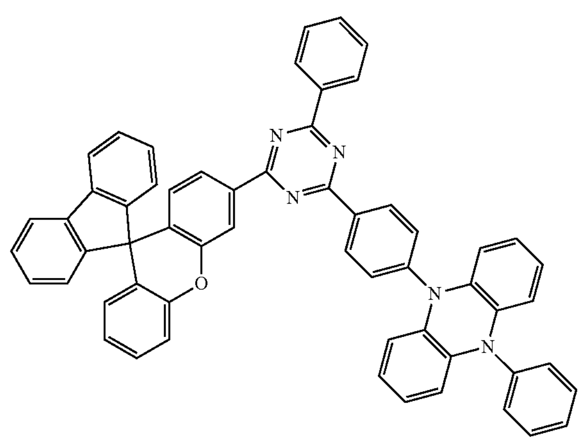
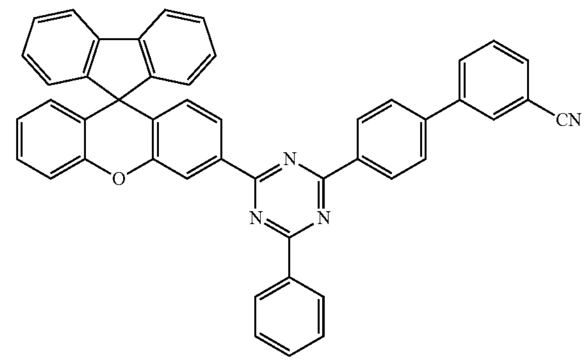
CN
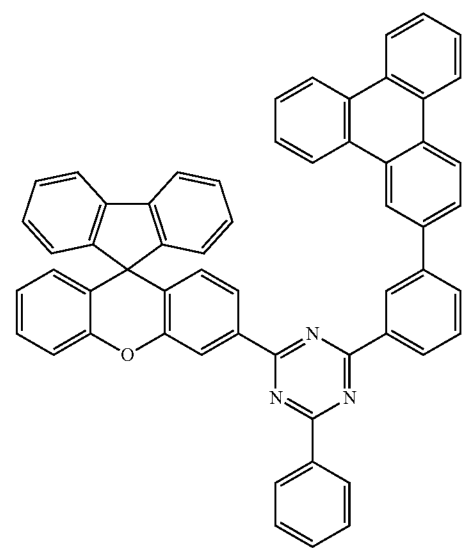
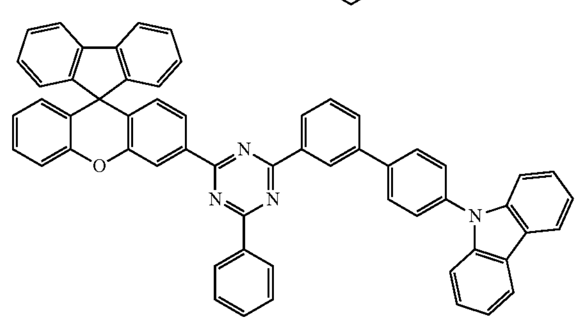
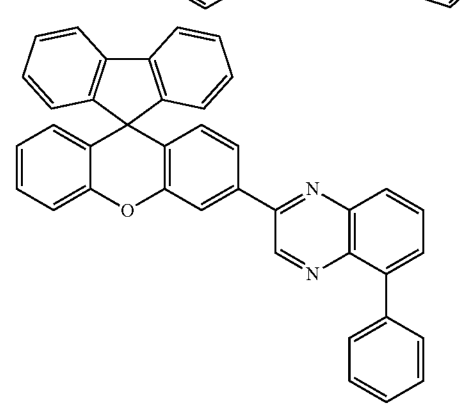

-continued
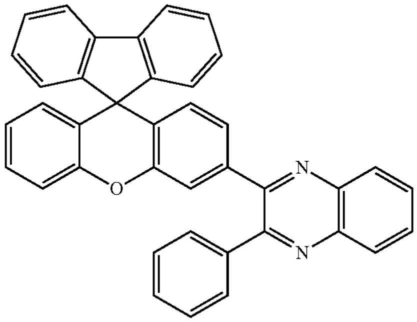
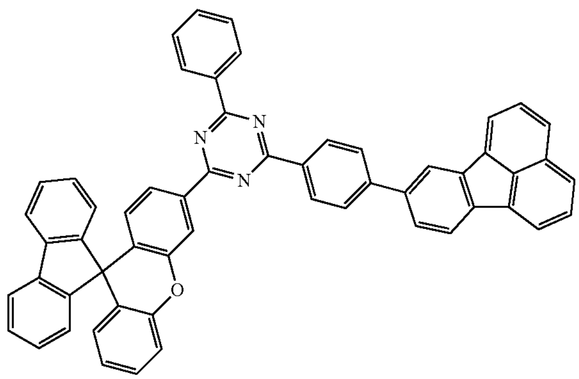
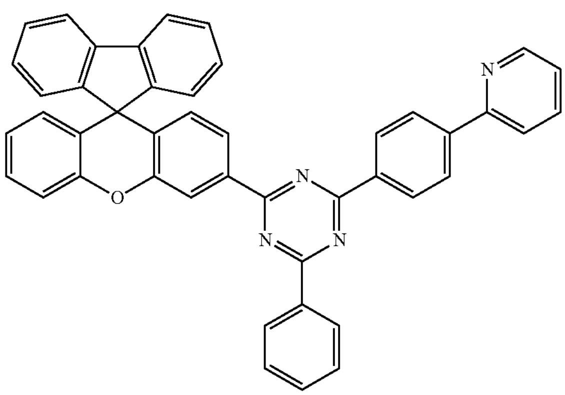
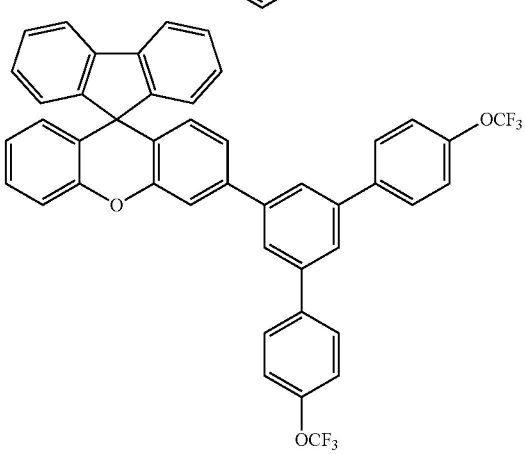
-continued
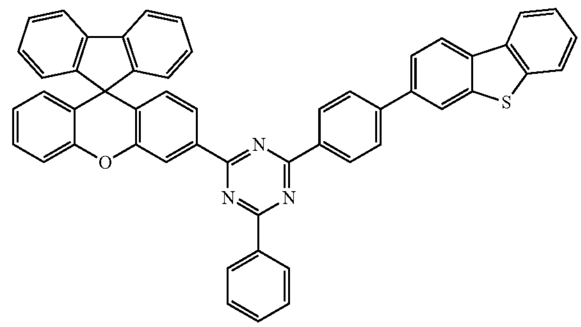
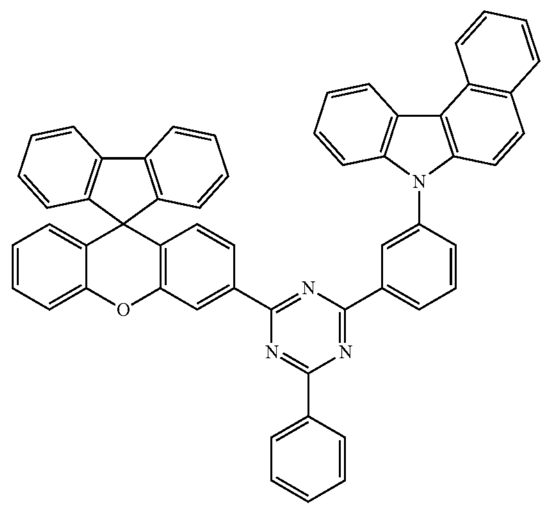
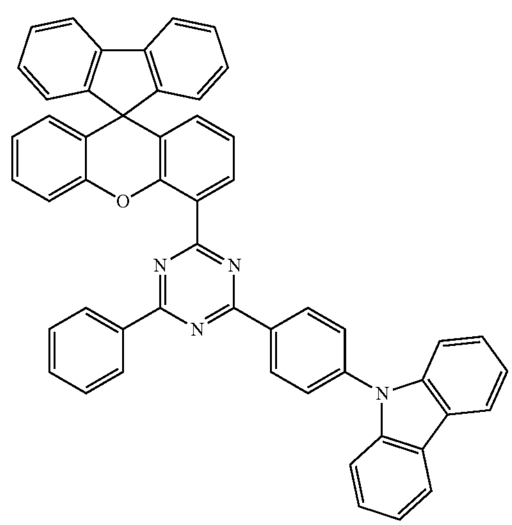

-continued
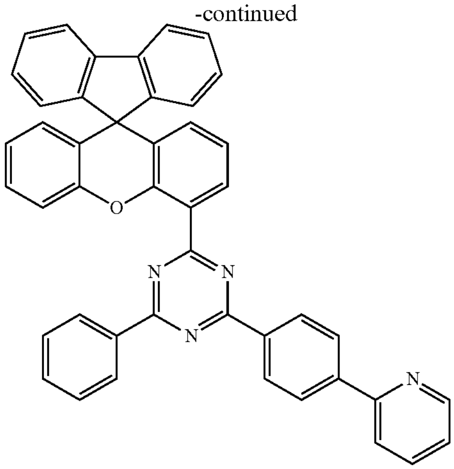
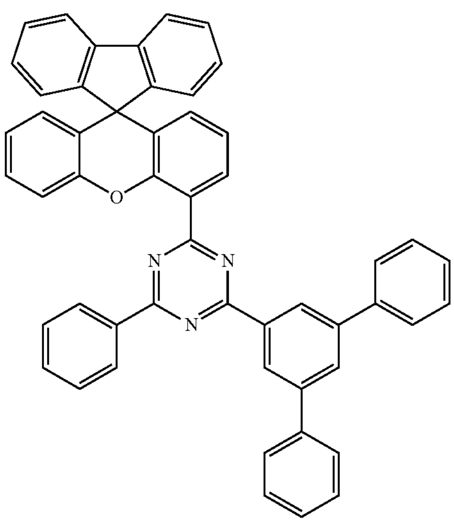
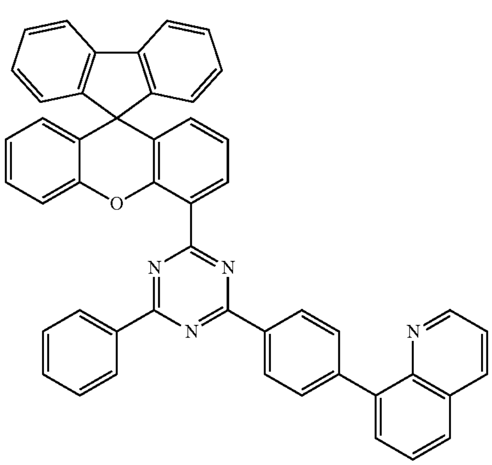
-continued
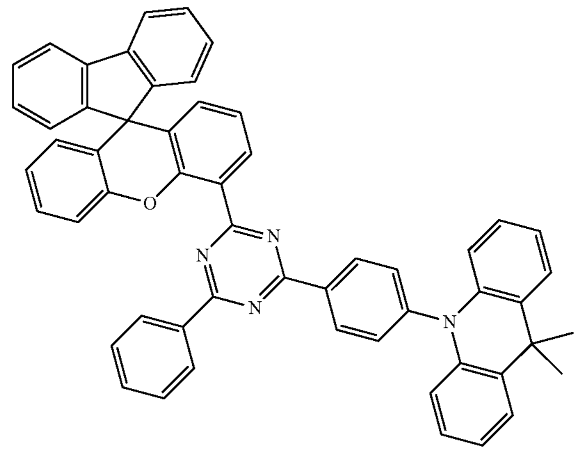
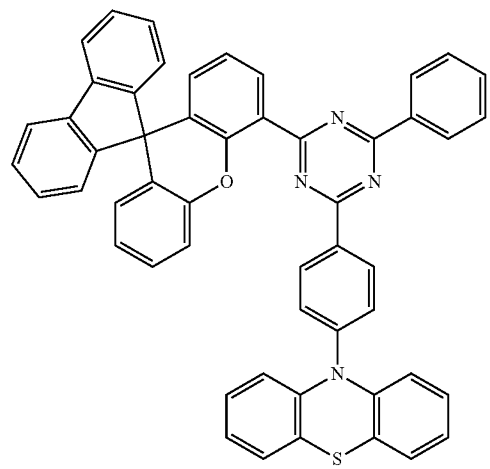
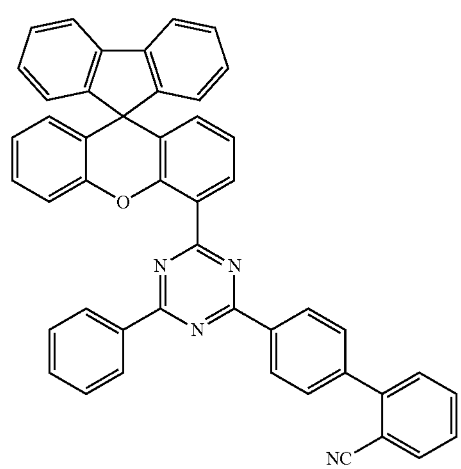

-continued
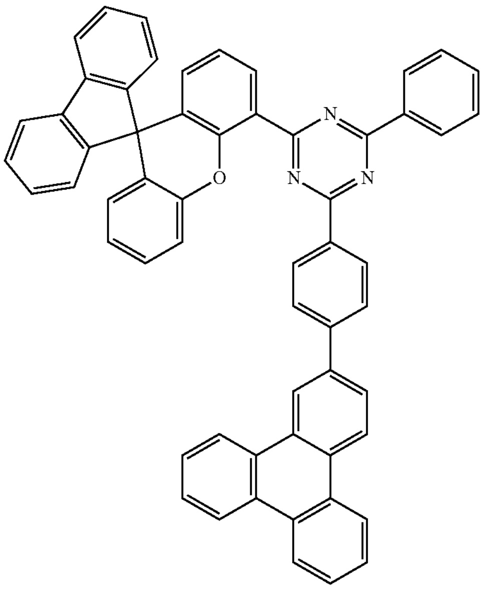
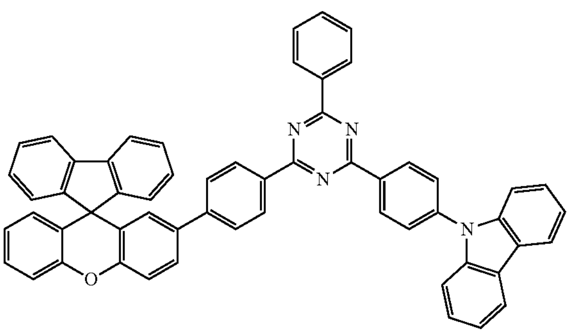
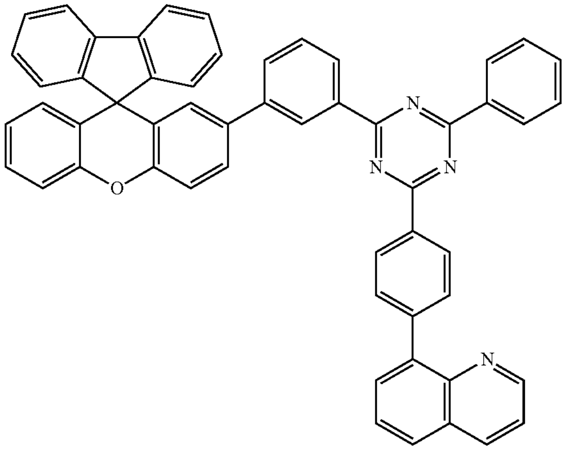
-continued
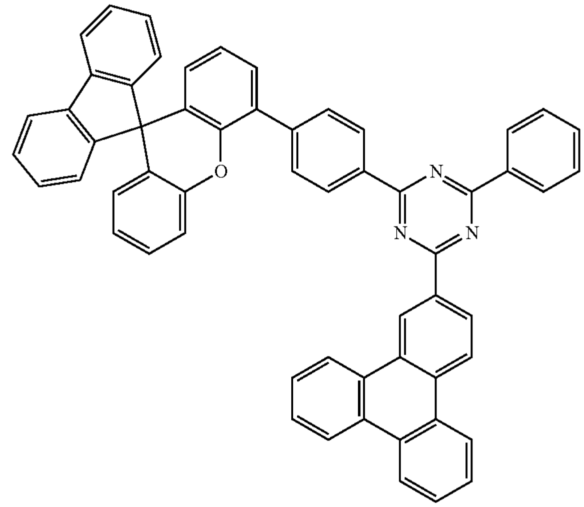
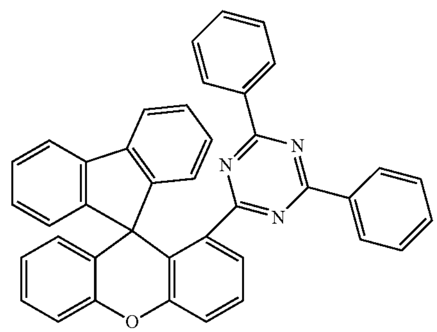
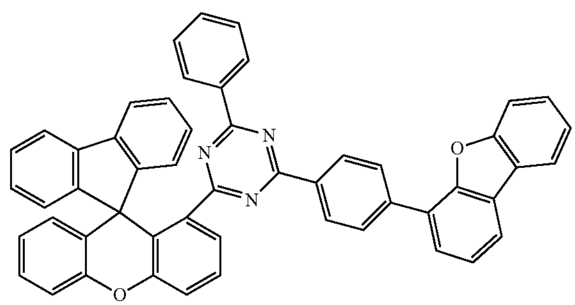
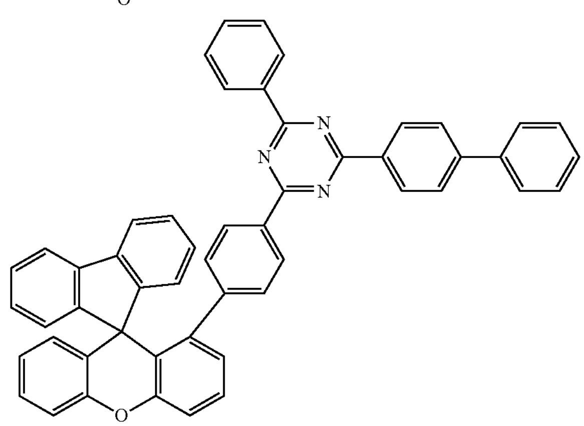

-continued
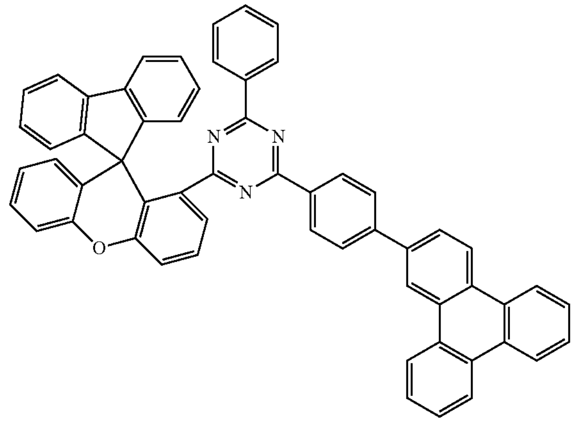
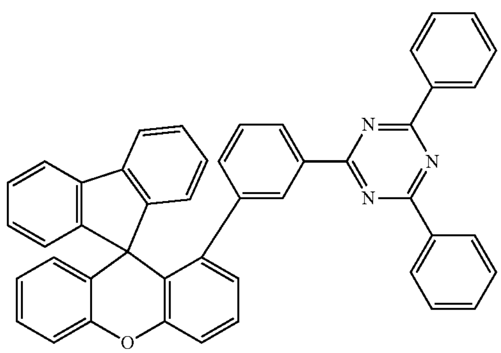
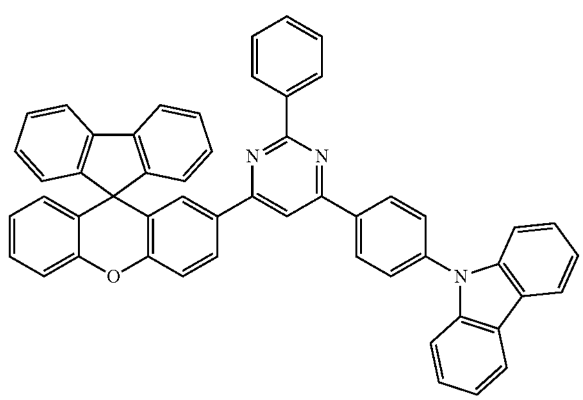
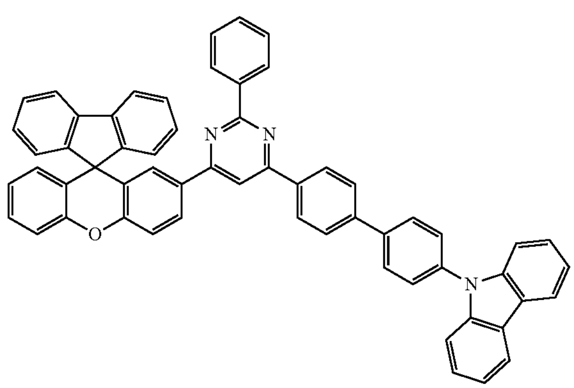
-continued
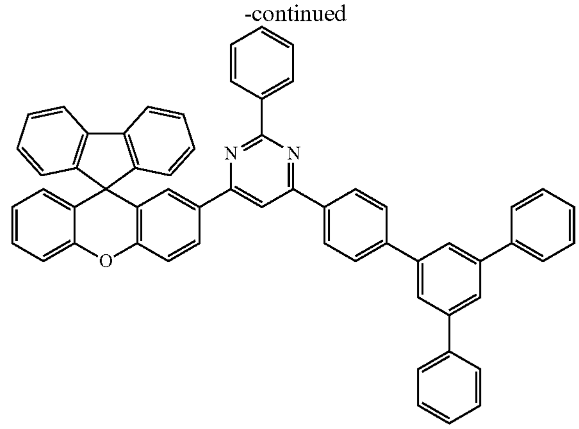
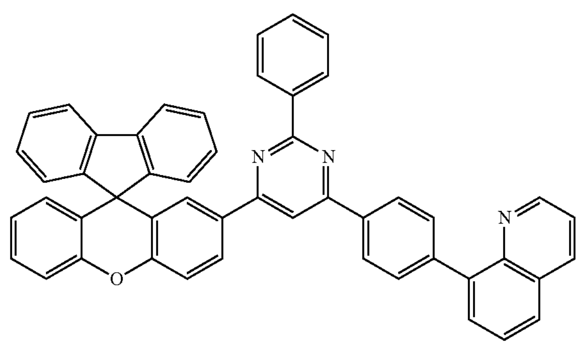
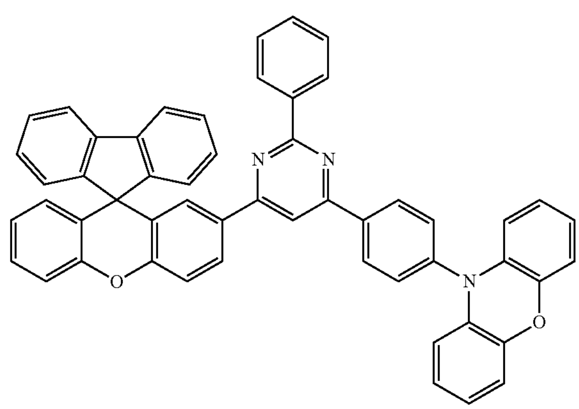
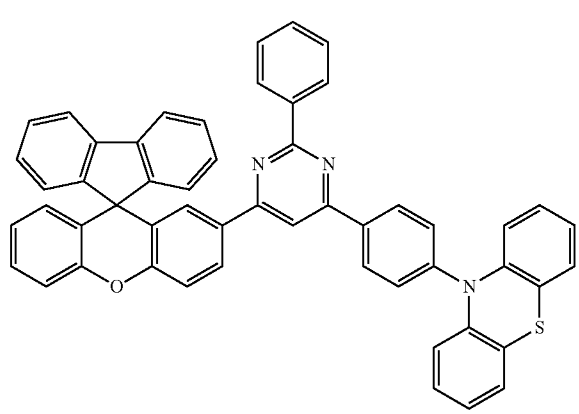

-continued
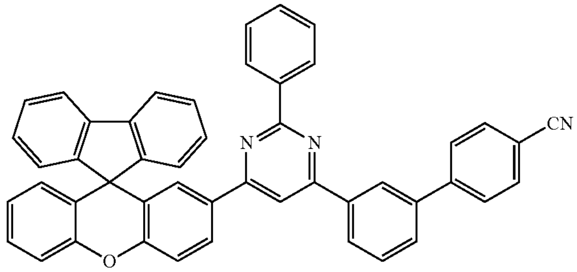
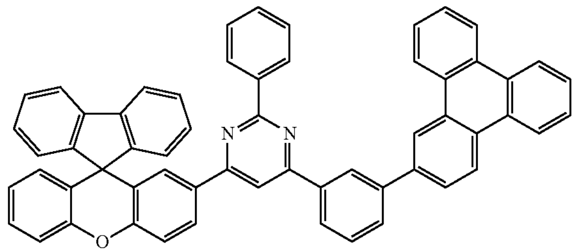
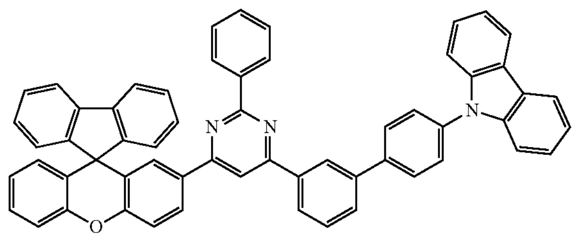
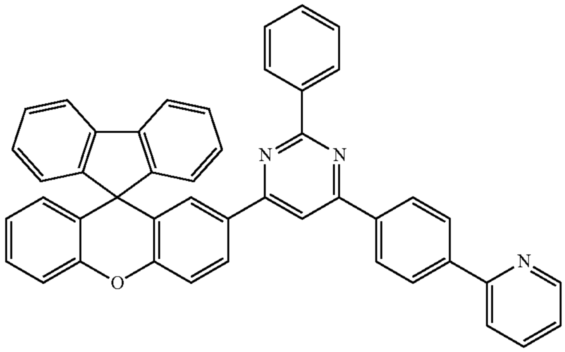
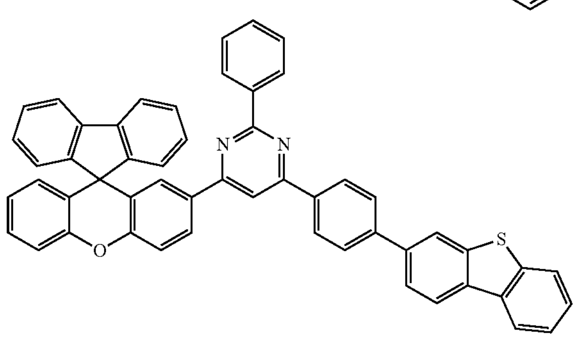
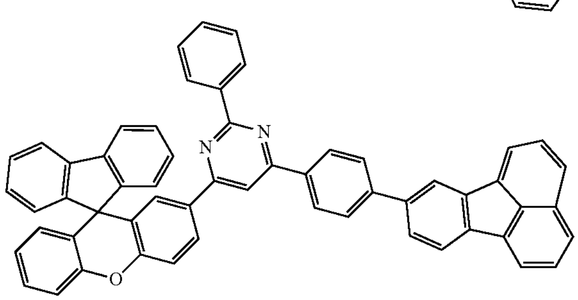
-continued
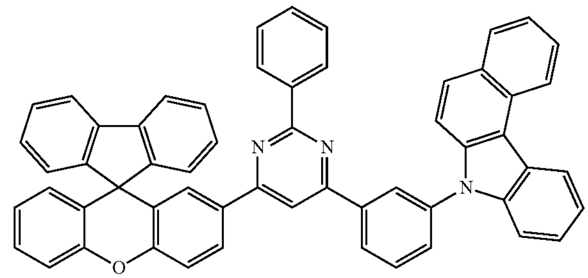
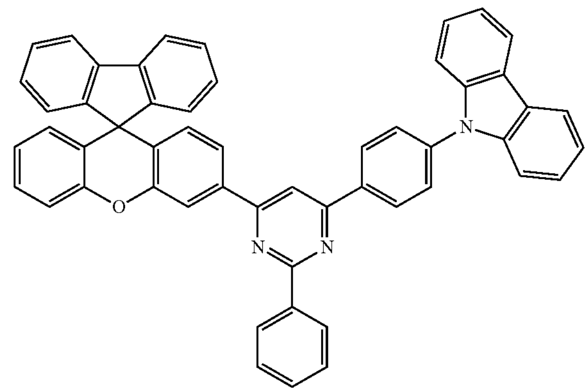
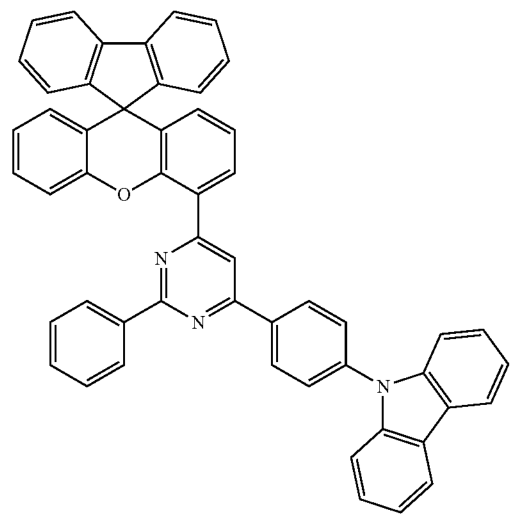
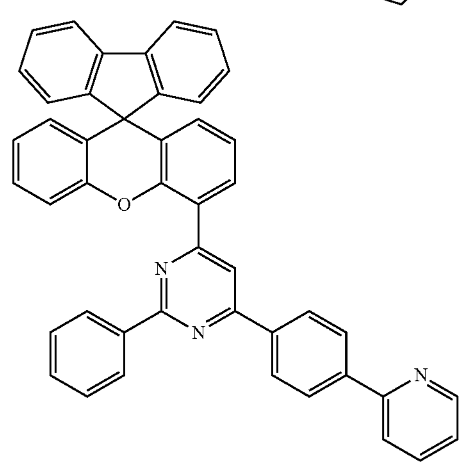

-continued

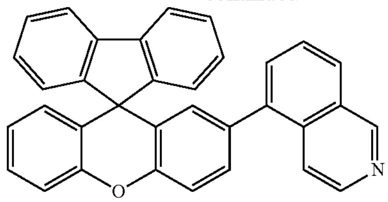

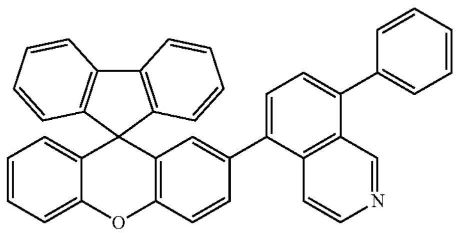

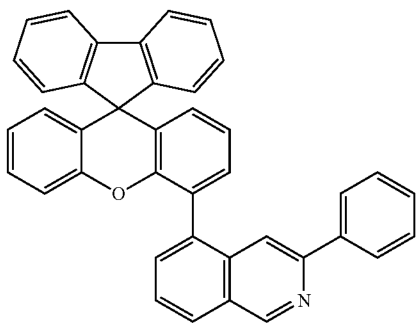

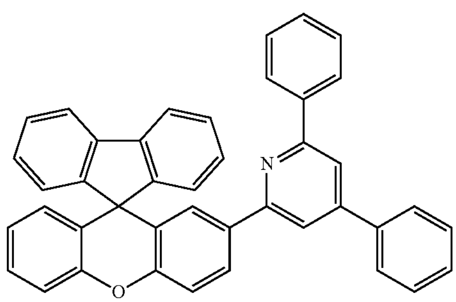

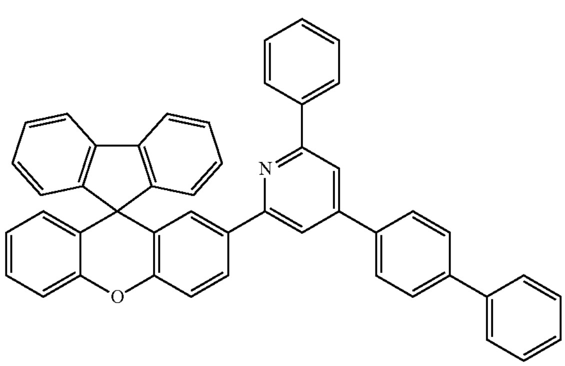

-continued

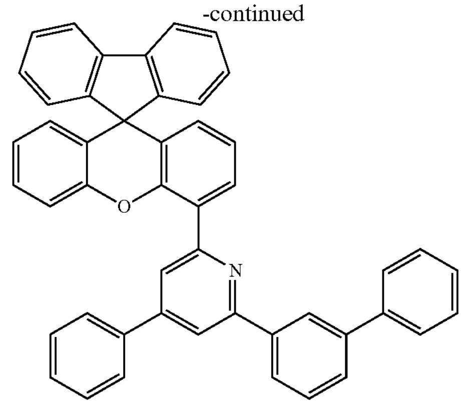

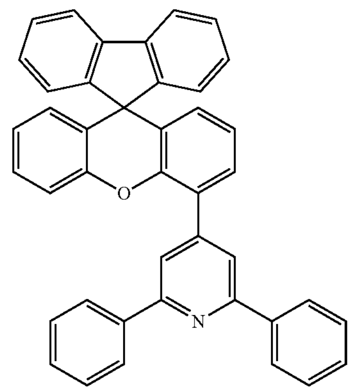

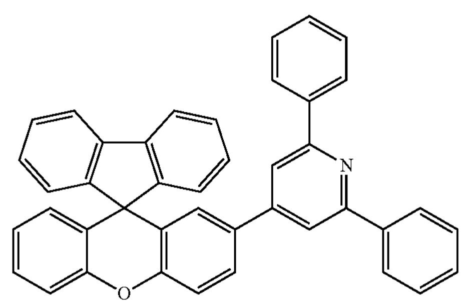

In one embodiment of the present specification, R'1 and R'2 are the same as or different from each other, and each independently is a phenyl group, a naphthyl group or a biphenyl group.

In one embodiment of the present specification, L'1 is a phenylene group, a trivalent phenyl group or a divalent naphthyl group.

According to one embodiment of the present specification, Chemical Formula 3 can be any one selected from among the following compounds.

-continued
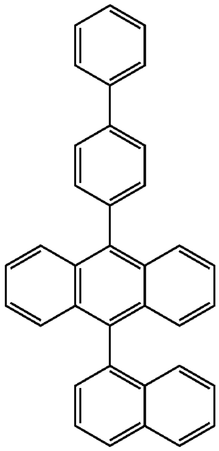
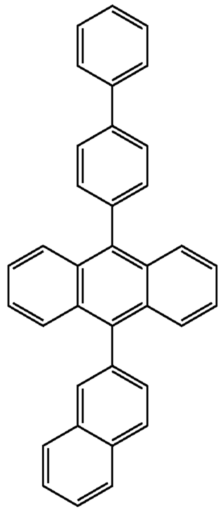
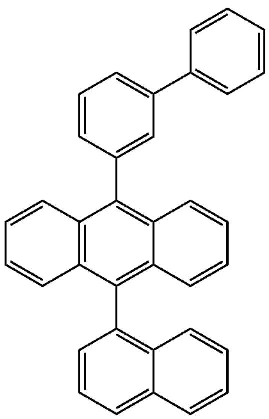
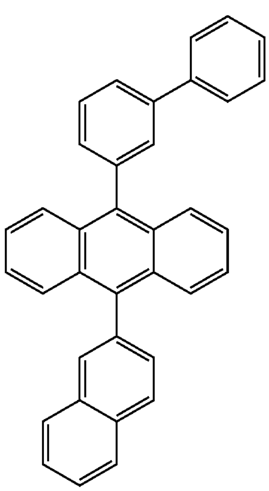
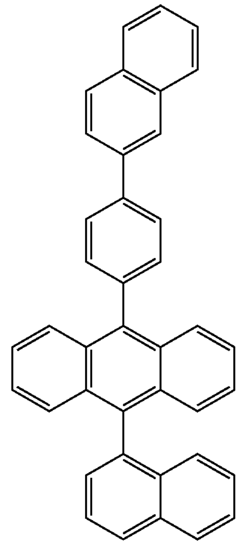
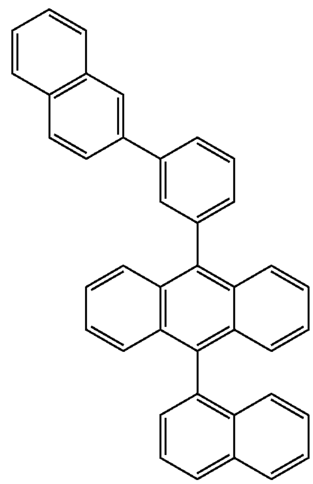
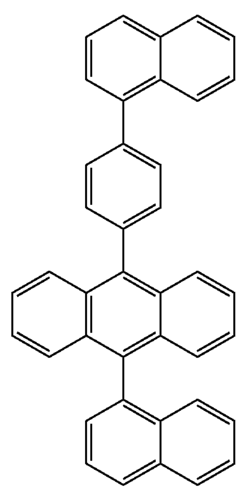

-continued
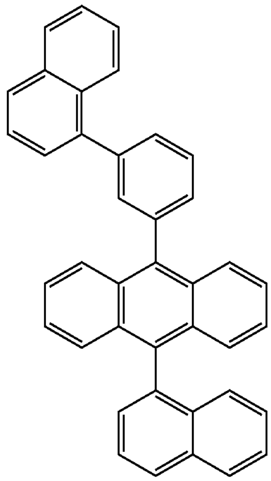
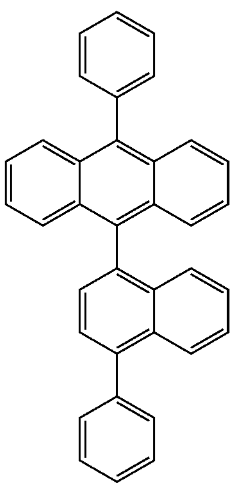
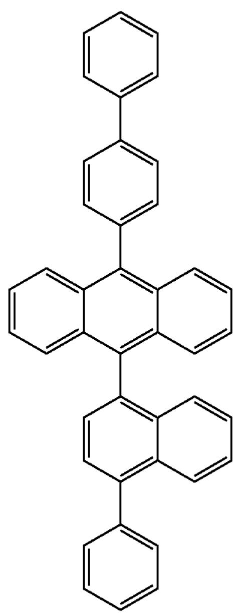
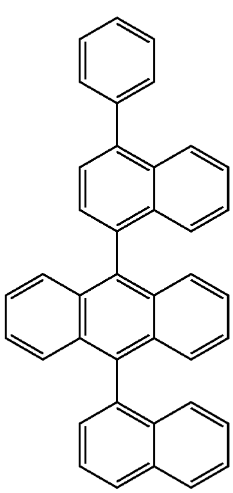
-continued
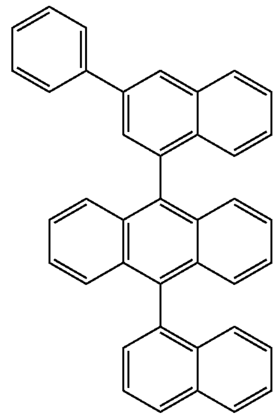
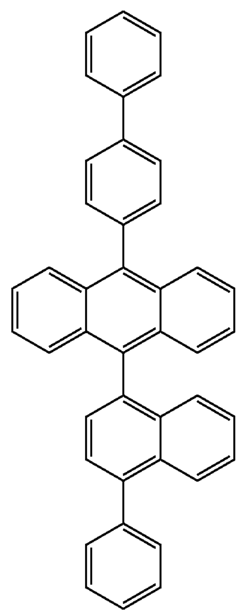
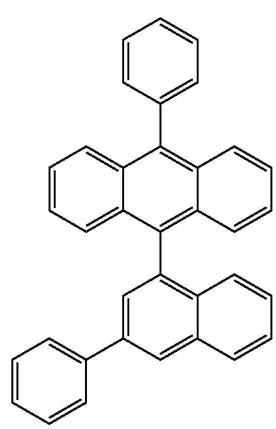

-continued
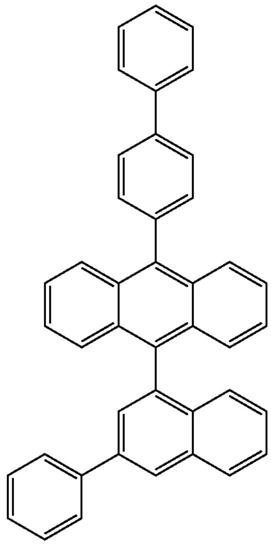
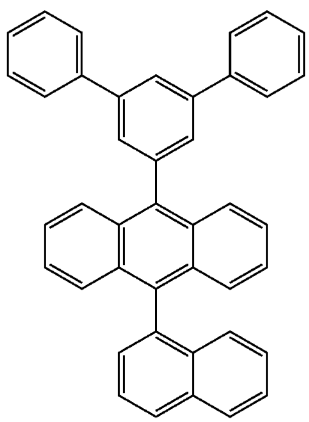
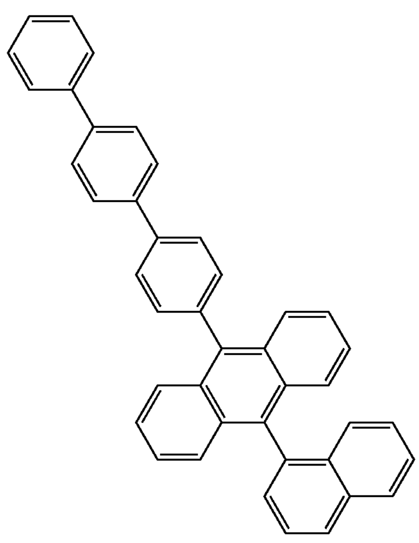
-continued
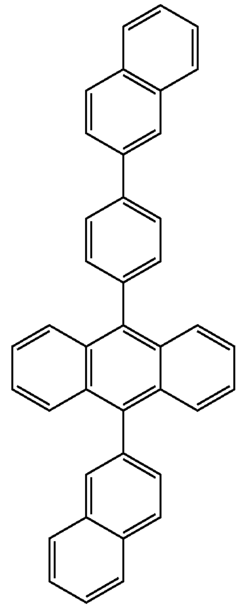
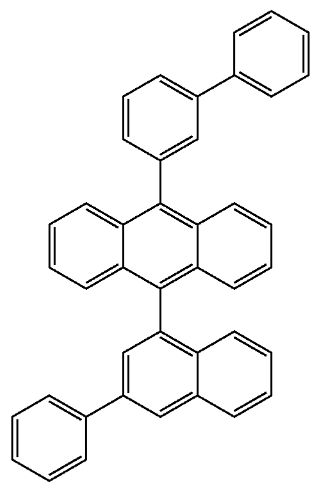
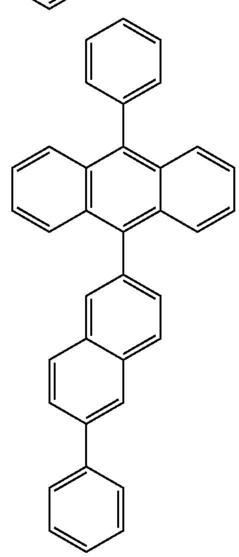

-continued

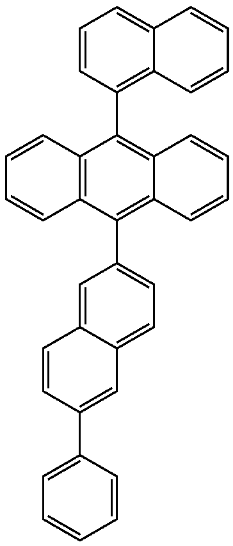

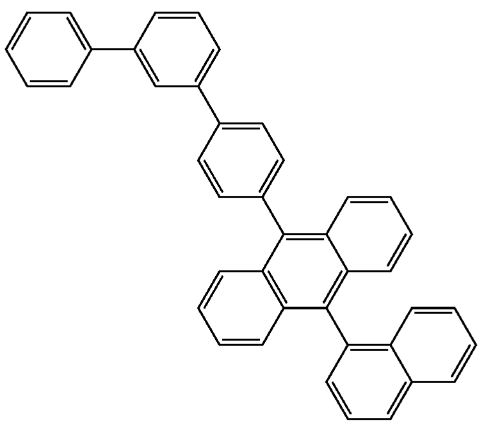

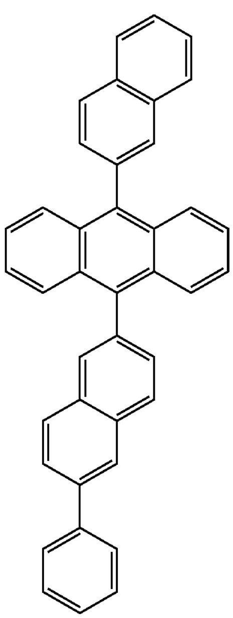

-continued

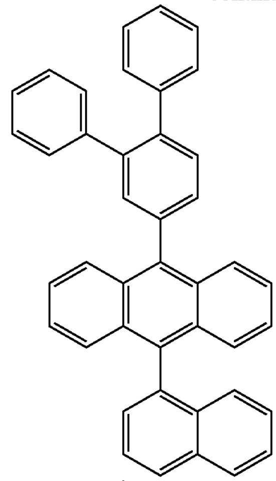

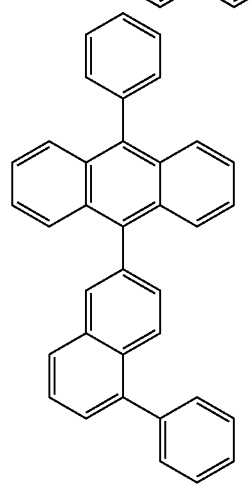

In one embodiment of the present specification, the organic material layer includes an electron control layer, and the electron control layer includes the compound of Chemical Formula 1. In one embodiment of the present specification, the light emitting layer is a blue fluorescent light emitting layer.

In one embodiment of the present specification, the organic material layer further includes one or more organic material layers selected from among an electron injection layer, an electron transfer layer, or an electron transfer and injection layer.

In one embodiment of the present specification, the electron transfer layer, the electron injection layer or the layer carrying out electron injection and electron transfer at the same time can further include an n-type dopant.

According to one embodiment of the present specification, the organic material layer can further include one or more organic material layers selected from among a hole injection layer, a hole transfer layer, an electron transfer layer and an electron injection layer.

The organic light emitting device according to one embodiment of the present specification includes an anode; a cathode; and a light emitting layer provided between the anode and the cathode, and includes an electron control layer provided between the light emitting layer and the cathode and including the compound of Chemical Formula 1, and the light emitting layer includes the compound of Chemical Formula 3, and in addition thereto, the organic light emitting device can further include one or more organic material layers selected from among a hole transfer layer, a hole injection layer, an electron transfer layer and an electron injection layer. However, the structure of the organic light emitting device is not limited thereto, and can include less or more numbers of organic material layers.

According to one embodiment of the present specification, the organic material layer of the organic light emitting device of the present specification can be foamed in a single layer structure, but can be formed in a multilayer structure in which two or more organic material layers are laminated. For example, the organic light emitting device in the present specification can have structures as illustrated in FIG. 1 to FIG. 3, however, the structure is not limited thereto.

FIG. 1 illustrates a structure of an organic light emitting device (10) in which an anode (30), a light emitting layer (40), an electron transfer layer (80) and a cathode (50) are consecutively laminated on a substrate (20). FIG. 1 is an exemplary structure of an organic light emitting device according to one embodiment of the present specification, and other organic material layers can be further included.

FIG. 2 illustrates a structure of an organic light emitting device (11) in which an anode (30), a hole injection layer (60), a hole transfer layer (70), a light emitting layer (40), an electron transfer layer (80), an electron injection layer (90) and a cathode (50) are consecutively laminated on a substrate (20). FIG. 2 is an exemplary structure of an organic light emitting device according to an embodiment of the present specification, and other organic material layers can be further included.

FIG. 3 illustrates a structure of an organic light emitting device (12) in which an anode (30), a hole injection layer (60), a hole transfer layer (70), a light emitting layer (40), an electron control layer (100), an electron transfer layer (80), an electron injection layer (90) and a cathode (50) are consecutively laminated on a substrate (20). FIG. 3 is an exemplary structure of an organic light emitting device according to an embodiment of the present specification, and other organic material layers can be further included.

In one embodiment of the present specification, the n-type dopant can be a metal complex and the like, and an alkali metal such as Li, Na, K, Rb, Cs or Fr; an alkaline-earth metal such as Be, Mg, Ca, Sr, Ba or Ra; a rare-earth metal such as La, Ce, Pr, Nd, Sm, Eu, Tb, Th, Dy, Ho, Er, Em, Gd, Yb, Lu, Y or Mn; or a metal compound including one or more metals of the above-mentioned metals can be used, however, the n-type dopant is not limited thereto, and those known in the art can be used.

The organic light emitting device of the present specification can be manufactured using materials and methods known in the art, except that one or more layers of the organic material layers include the compound of Chemical Formula 1 or the compound of Chemical Formula 3 of the present specification.

When the organic light emitting device includes a plurality of organic material layers, the organic material layers can be formed with materials the same as or different from each other.

For example, the organic light emitting device of the present specification can be manufactured by consecutively laminating an anode, an organic material layer and a cathode on a substrate. Herein, the organic light emitting device can be manufactured by forming an anode on a substrate by depositing a metal, a metal oxide having conductivity, or an alloy thereof using a physical vapor deposition (PVD) method such as sputtering or e-beam evaporation, and forming an organic material layer including a hole injection layer, a hole transfer layer, a light emitting layer, an electron control layer and an electron transfer layer thereon, and then depositing a material capable of being used as a cathode thereon. In addition to such a method, the organic light emitting device can also be manufactured by consecutively depositing a cathode material, an organic material layer and an anode material on a substrate. In addition, the compound of Chemical Formula 1 or Chemical Formula 3 can be formed into an organic material layer using a solution coating method as well as a vacuum deposition method when manufacturing the organic light emitting device. Herein, the solution coating method means spin coating, dip coating, doctor blading, inkjet printing, screen printing, a spray method, roll coating and the like, but is not limited thereto.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al, $LiO_2$/Al or Mg/Ag, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film foiming ability. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer receiving holes from a hole injection layer and transferring the holes to a light emitting layer, and as the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

The light emitting material of the light emitting layer is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes ($Alq_3$), carbazole series compounds, dimerized styryl compounds, BAlq, 10-hydroxybenzoquinoline-metal compounds, benzoxazole, benzothiazole and benzimidazole series compounds poly(p-phenylenevinylene) (PPV) series polymers, spiro compounds, polyfluorene, rubrene, and the like, but are not limited thereto.

The light emitting layer can include a host material and a dopant material. The host material can include fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like can be included, and as the heteroring-containing compound, carbazole derivatives, dibenzofuran derivatives, ladder-type furan compounds, pyrimidine derivatives and the like can be included, however, the host material is not limited thereto.

The dopant material can include aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group, and arylamino group-including pyrene, anthracene, chrysene, peryflanthene and the like can be included. The styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group can be substituted or unsubstituted. Specifically, styrylamine, styryldiamine, styryltriamine, styryltetramine and the like can be included, however, the styrylamine compound is not limited thereto. As the metal complex, iridium complexes, platinum complexes and the like can be used, however, the metal complex is not limited thereto.

The electron transfer layer is a layer receiving electrons from an electron injection layer and transferring the electrons to a light emitting layer, and as the electron transfer material, materials capable of favorably receiving electrons from a cathode, moving the electrons to a light emitting layer, and having high mobility for the electrons are suited. Specific examples thereof include Al complexes of 8-hydroxyquinoline, complexes including $Alq_3$, organic radical compounds, hydroxyflavone-metal complexes, and the like, but are not limited thereto. The electron transfer layer can be used together with any desired cathode material as used in the art. Particularly, examples of the suitable cathode material can include common materials having low work function and having an aluminum layer or a silver layer following. Specifically, cesium, barium, calcium, ytterbium and samarium are included, and in each case, an aluminum layer or a silver layer follows.

The electron injection layer is a layer injecting electrons from an electrode, and compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film foaming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The hole blocking layer is layer blocking holes from reaching a cathode, and can be generally formed under the same condition as the hole injection layer. Specific examples thereof can include oxadiazole derivatives, triazole derivatives, phenanthroline derivatives, BCP, aluminum complexes and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)berylium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato) (1-naphtholato)aluminum, bis(2-methyl-8-quinolinato) (2-naphtholato)gallium and the like, but is not limited thereto.

The organic light emitting device according to the present specification can be a top-emission type, a bottom-emission type or a dual-emission type depending on the materials used.

According to one embodiment of the present specification, the compound of Chemical Formula 1 or Chemical Formula 3 can be included in an organic solar cell or an organic transistor in addition to the organic light emitting device.

Hereinafter, the present specification will be described in detail with reference to examples. However, the examples according to the present specification can be modified to various other forms, and the scope of the present specification is not to be construed as being limited to the examples described below. Examples of the present specification are provided in order to more fully describe the present specification to those having average knowledge in the art.

<Preparation Example 1-1> Synthesis of Compound E1

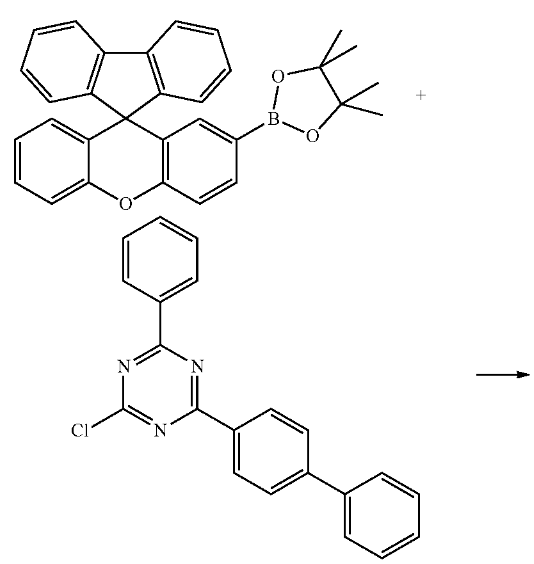

-continued

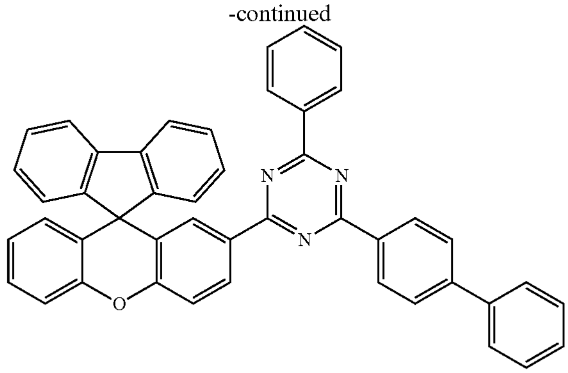

E1

After completely dissolving compounds of 4,4,5,5-tetramethyl-2-(spiro[fluorene-9,9'-xanthen]-2'-yl)-1,3,2-dioxaborolane (10.0 g, 21.8 mmol) and 2-([1,1'-biphenyl]-4-yl)-4-chloro-6-phenyl-1,3,5-triazine (7.5 g, 21.8 mmol) in tetrahydrofuran (100 ml), potassium carbonate (9.0 g, 65.4 mmol) dissolved in water (50 ml) was added thereto, and after introducing tetrakistriphenyl-phosphino palladium (756 mg, 0.65 mmol) thereto, the result was heated and stirred for 8 hours. After lowering the temperature to room temperature and terminating the reaction, the potassium carbonate solution was removed to filter white solids. The filtered white solids were washed twice each with tetrahydrofuran and ethyl acetate to prepare Compound E1 (12.6 g, yield 90%).

$MS[M+H]^+=640$

<Preparation Example 1-2> Synthesis of Compound E2

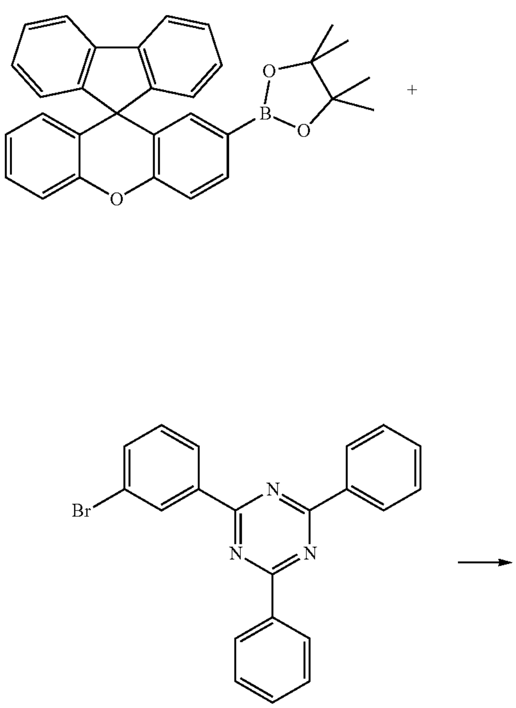

-continued

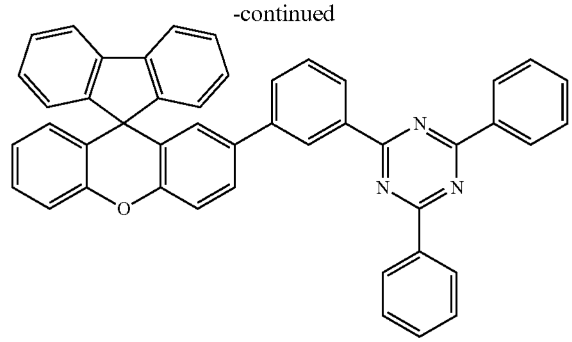

E2

Compound E2 was prepared in the same manner as in Preparation Example 1-1 except that 2-(3-bromophenyl)-4,6-diphenyl-1,3,5-triazine was used instead of the compound 2-([1,1'-biphenyl]-4-yl)-4-chloro-6-phenyl-1,3,5-triazine.

$MS[M+H]^+=640$

<Preparation Example 1-3> Synthesis of Compound E3

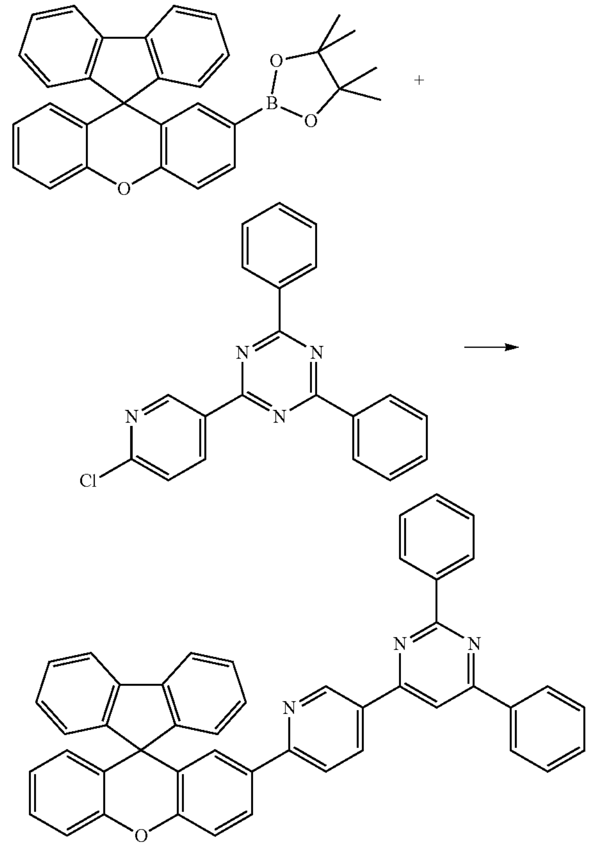

E3

Compound E3 was prepared in the same manner as in Preparation Example 1-1 except that 4-(6-chloropyridin-3-yl)-2,6-diphenylpyrimidine was used instead of the compound 2-([1,1'-biphenyl]-4-yl)-4-chloro-6-phenyl-1,3,5-triazine.

$MS[M+H]^+=640$

<Preparation Example 1-4> Synthesis of Compound E4

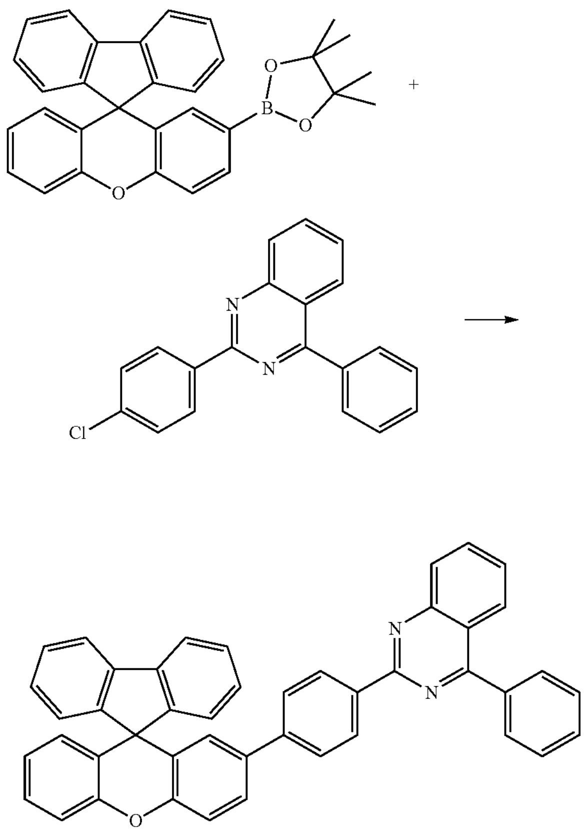

E4

Compound E4 was prepared in the same manner as in Preparation Example 1-1 except that 2-(4-chlorophenyl)-4-phenylquinazoline was used instead of the compound 2-([1,1'-biphenyl]-4-yl)-4-chloro-6-phenyl-1,3,5-triazine.

MS[M+H]+=613

<Preparation Example 1-5> Synthesis of Compound E5

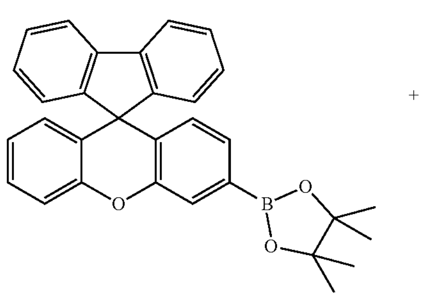

-continued

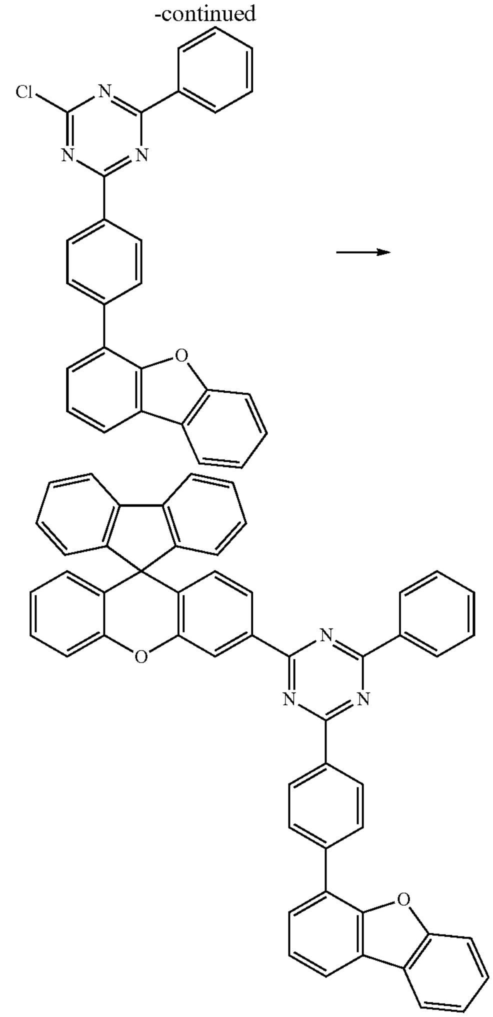

E5

Compound E5 was prepared in the same manner as in Preparation Example 1-1 except that 4,4,5,5-tetramethyl-2-(spiro[fluorene-9,9'-xanthene]-3'-yl)-1,3,2-dioxaborolane was used instead of the compound 4,4,5,5-tetramethyl-2-(spiro[fluorene-9,9'-xanthen]-2'-yl)-1,3,2-dioxaborolane, and 2-chloro-4-(4-(dibenzo[b,d]furan-4-yl)phenyl)-6-phenyl-1,3,5-triazine was used instead of the compound 2-([1,1'-biphenyl]-4-yl)-4-chloro-6-phenyl-1,3,5-triazine.

MS[M+H]+=730

<Preparation Example 1-6> Synthesis of Compound E6

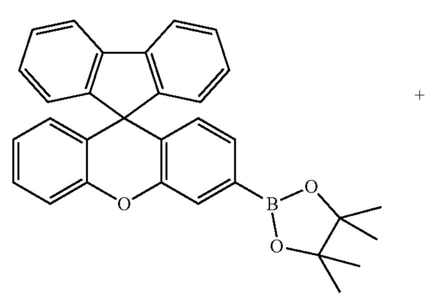

-continued

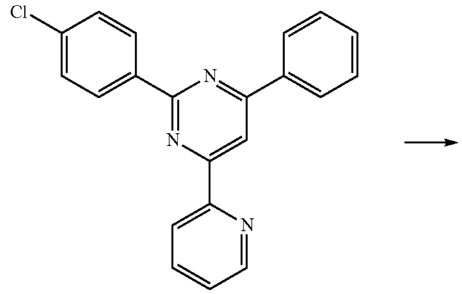

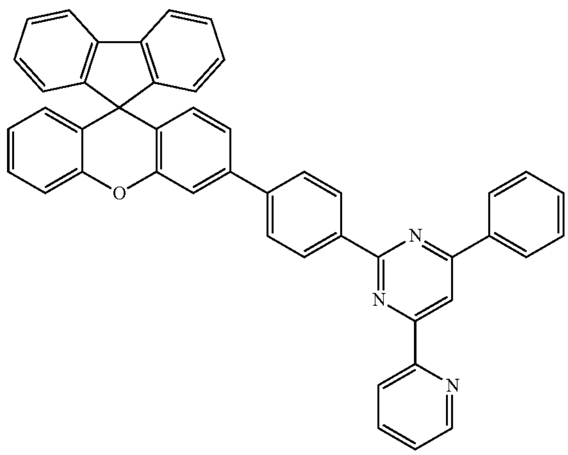

E6

Compound E6 was prepared in the same manner as in Preparation Example 1-5 except that 2-(4-chlorophenyl)-4-phenyl-6-(pyridin-2-yl)pyrimidine was used instead of the compound 2-chloro-4-(4-(dibenzo[b,d]furan-4-yl)phenyl)-6-phenyl-1,3,5-triazine.

MS[M+H]$^+$=640

<Preparation Example 1-7> Synthesis of Compound E7

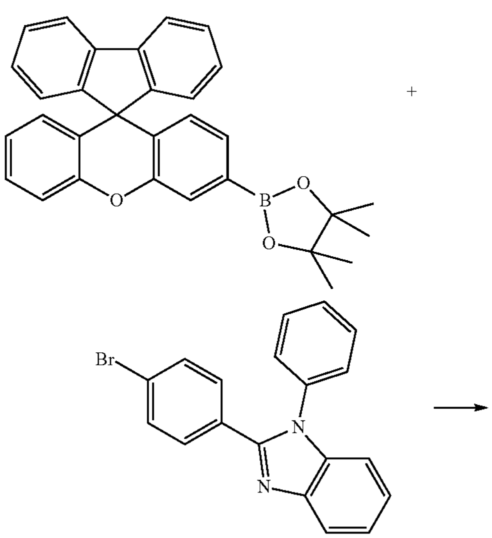

-continued

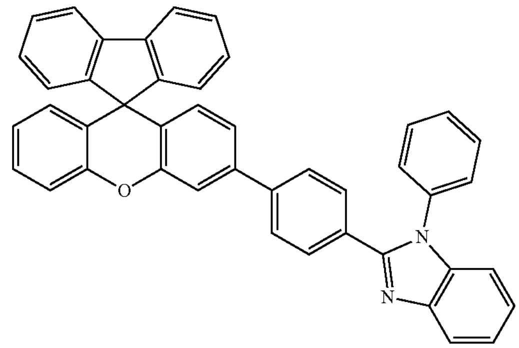

E7

Compound E7 was prepared in the same manner as in Preparation Example 1-5 except that 2-(4-bromophenyl)-1-phenyl-1H-benzo[d]imidazole was used instead of the compound 2-chloro-4-(4-(dibenzo[b,d]furan-4-yl)phenyl)-6-phenyl-1,3,5-triazine.

MS[M+H]$^+$=601

<Preparation Example 1-8> Synthesis of Compound E8

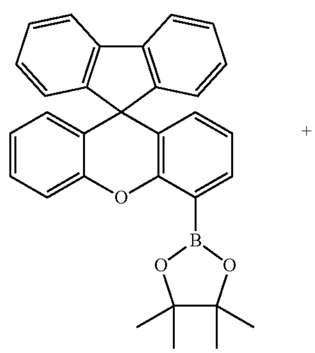

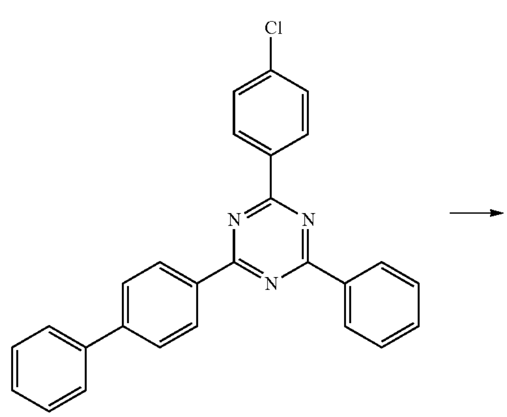

-continued

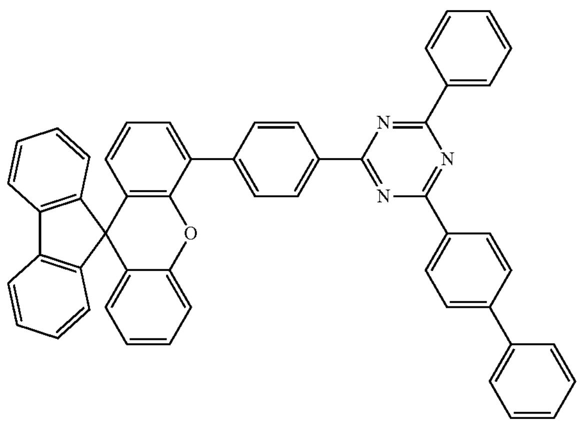

E8

Compound E8 was prepared in the same manner as in Preparation Example 1-1 except that 4,4,5,5-tetramethyl-2-(spiro[fluorene-9,9'-xanthene]-4'-yl)-1,3,2-dioxaborolane was used instead of the compound 4,4,5,5-tetramethyl-2-(spiro[fluorene-9,9'-xanthen]-2'-yl)-1,3,2-dioxaborolane, and 2-([1,1'-biphenyl]-4-yl)-4-(4-chlorophenyl)-6-phenyl-1,3,5-triazine was used instead of the compound 2-([1,1'-biphenyl]-4-yl)-4-chloro-6-phenyl-1,3,5-triazine.

$MS[M+H]^+=716$

<Preparation Example 1-9> Synthesis of Compound E9

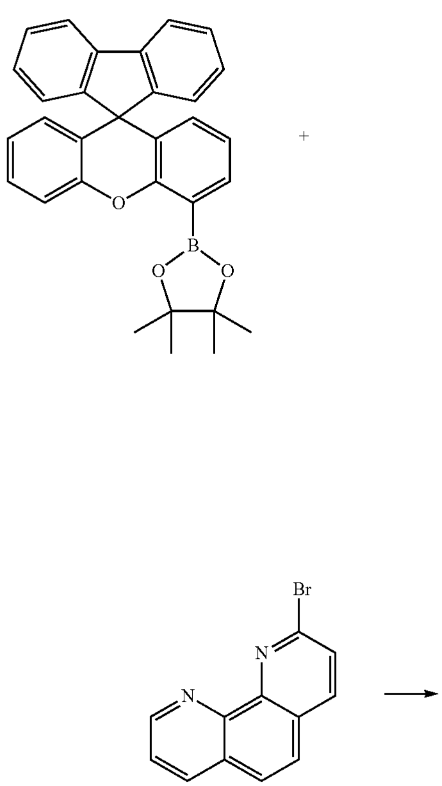

-continued

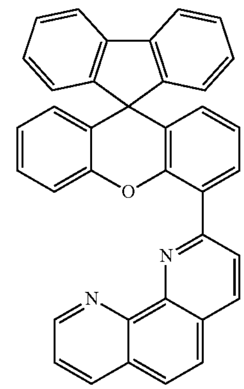

E9

Compound E9 was prepared in the same manner as in Preparation Example 1-8 except that 2-bromo-1,10-phenanthroline was used instead of the compound 2-([1,1'-biphenyl]-4-yl)-4-(4-chlorophenyl)-6-phenyl-1,3,5-triazine.

$MS[M+H]^+=511$

<Preparation Example 1-10> Synthesis of Compound E10

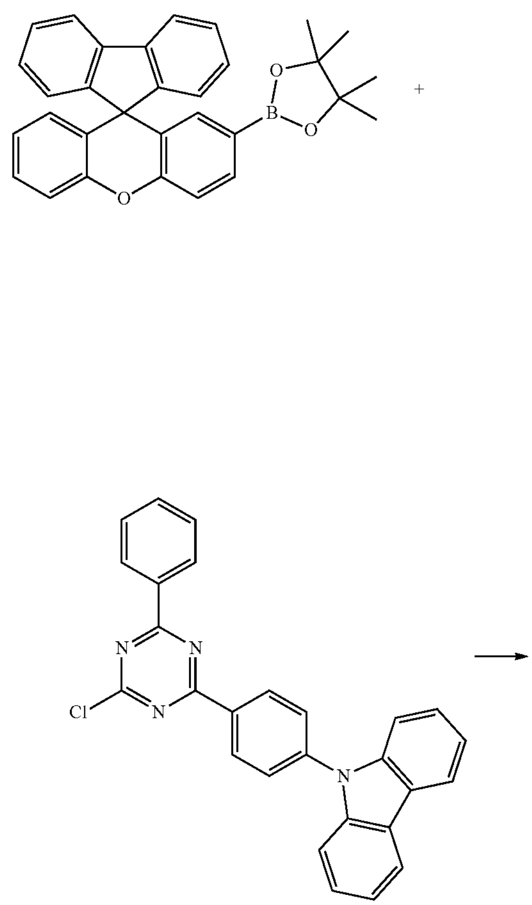

-continued

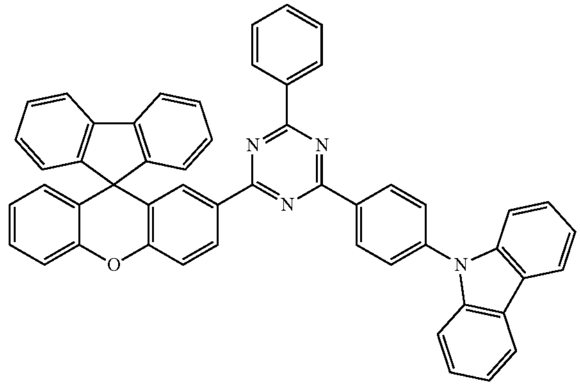

E10

Compound E10 was prepared in the same manner as in Preparation Example 1-1 except that 9-(4-(4-chloro-6-phenyl-1,3,5-triazin-2-yl)phenyl)-9H-carbazole was used instead of the compound 2-([1,1'-biphenyl]-4-yl)-4-chloro-6-phenyl-1,3,5-triazine.

MS[M+H]$^+$=729

<Preparation Example 1-11> Synthesis of Compound E11

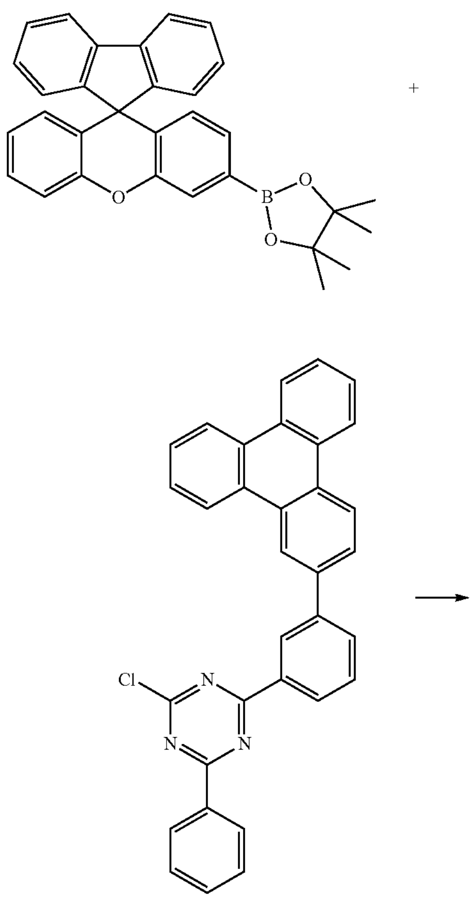

-continued

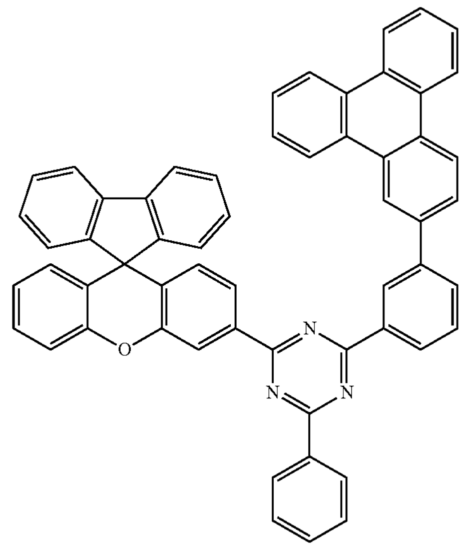

E11

Compound E11 was prepared in the same manner as in Preparation Example 1-5 except that 2-chloro-4-phenyl-6-(3-(triphenylen-2-yl)phenyl)-1,3,5-triazine was used instead of the compound 2-chloro-4-(4-(dibenzo[b,d]furan-4-yl)phenyl)-6-phenyl-1,3,5-triazine.

MS[M+H]$^+$=790

<Preparation Example 1-12> Synthesis of Compound E12

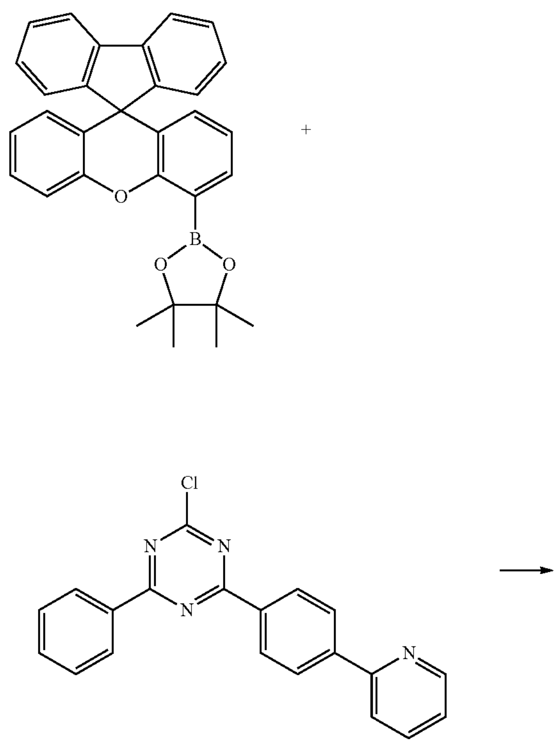

-continued

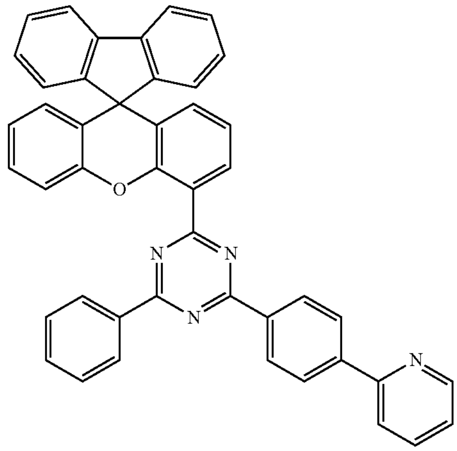

E12

Compound E12 was prepared in the same manner as in Preparation Example 1-8 except that 2-chloro-4-phenyl-6-(4-(pyridin-2-yl)phenyl)-1,3,5-triazine was used instead of the compound 2-([1,1'-biphenyl]-4-yl)-4-(4-chlorophenyl)-6-phenyl-1,3,5-triazine.

MS[M+H]$^+$=641

<Preparation Example 1-13> Synthesis of Compound E13

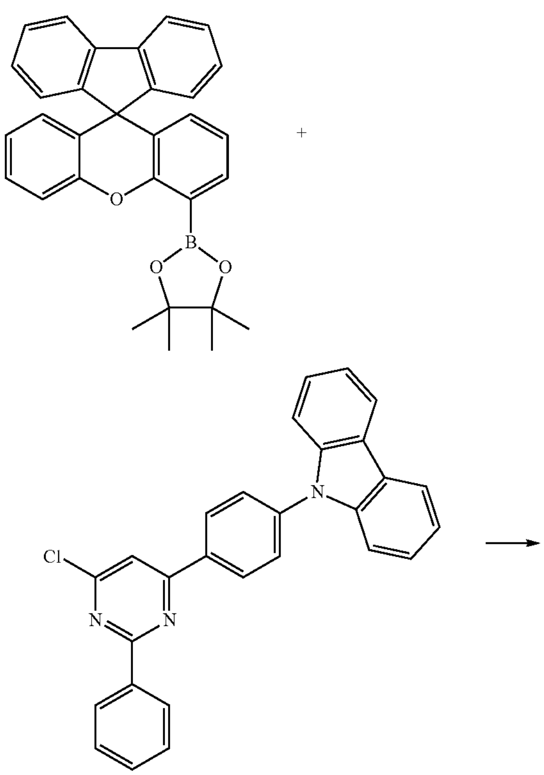

-continued

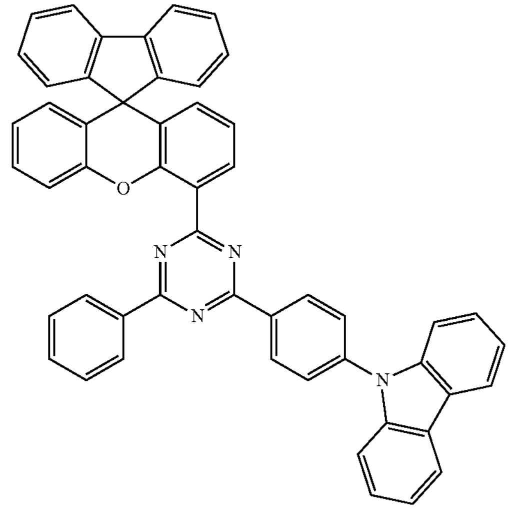

E13

Compound E13 was prepared in the same manner as in Preparation Example 1-8 except that 9-(4-(6-chloro-2-phenylpyridin-4-yl)phenyl)-9H-carbazole was used instead of the compound 2-([1,1'-biphenyl]-4-yl)-4-(4-chlorophenyl)-6-phenyl-1,3,5-triazine.

MS[M+H]$^+$=728

<Preparation Example 1-14> Synthesis of Compound E14

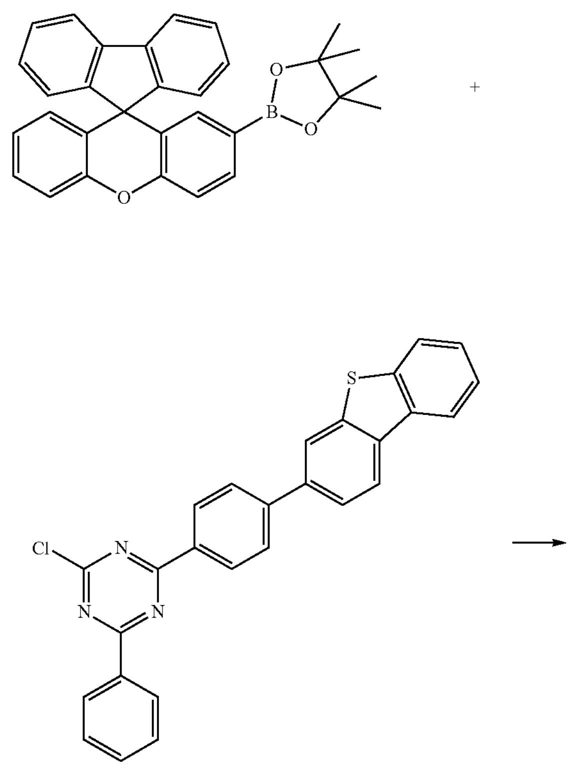

-continued

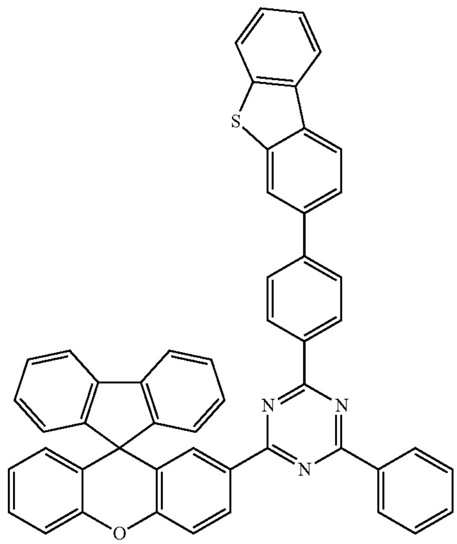

E14

Compound E14 was prepared in the same manner as in Preparation Example 1-1 except that 2-chloro-4-(4-(dibenzo[b,d]thiophen-3-yl)phenyl)-6-phenyl-1,3,5-triazine was used instead of the compound 2-([1,1'-biphenyl]-4-yl)-4-chloro-6-phenyl-1,3,5-triazine.

MS[M+H]+=746

<Preparation Example 1-15> Synthesis of Compound E15

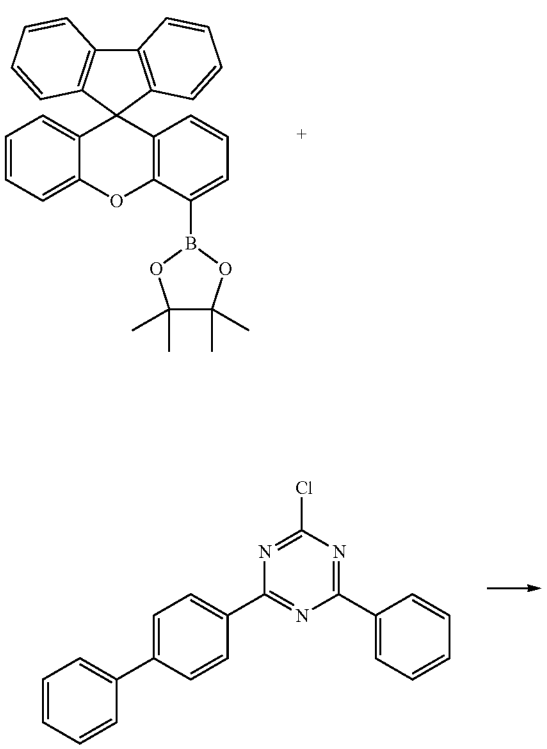

-continued

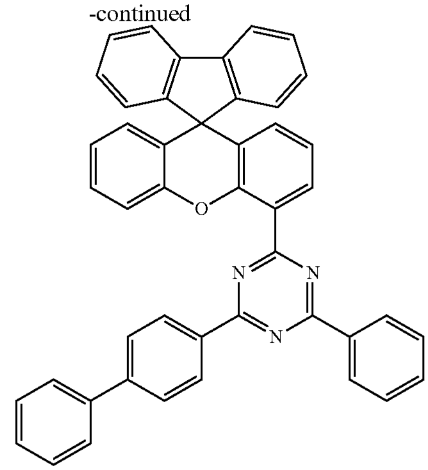

E15

Compound E15 was prepared in the same manner as in Preparation Example 1-8 except that 2-([1,1'-biphenyl]-4-yl)-4-chloro-6-phenyl-1,3,5-triazine was used instead of the compound 2-([1,1'-biphenyl]-4-yl)-4-(4-chlorophenyl)-6-phenyl-1,3,5-triazine.

MS[M+H]+=640

<Preparation Example 1-16> Synthesis of Compound E16

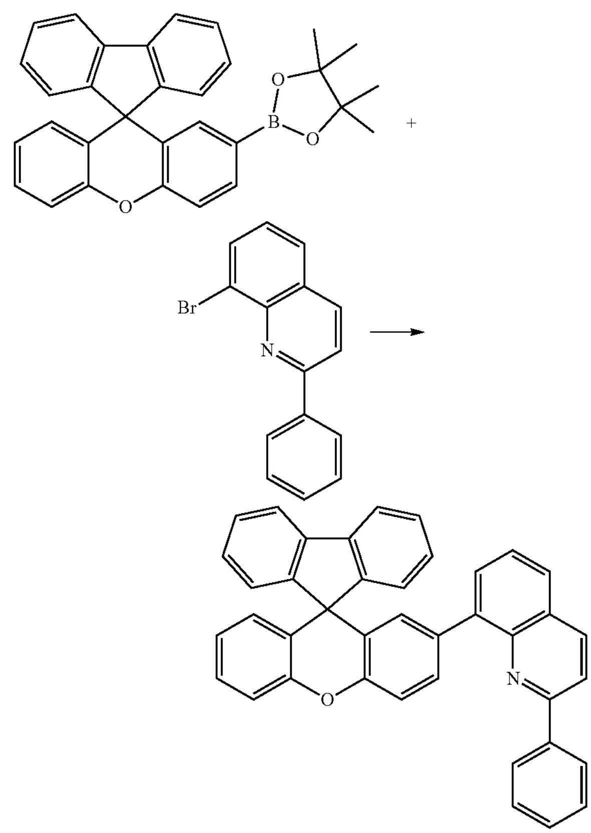

E16

Compound E16 was prepared in the same manner as in Preparation Example 1-1 except that each starting material was as in the above-described reaction formula.

MS[M+H]$^+$=536

<Preparation Example 1-17> Synthesis of Compound E17

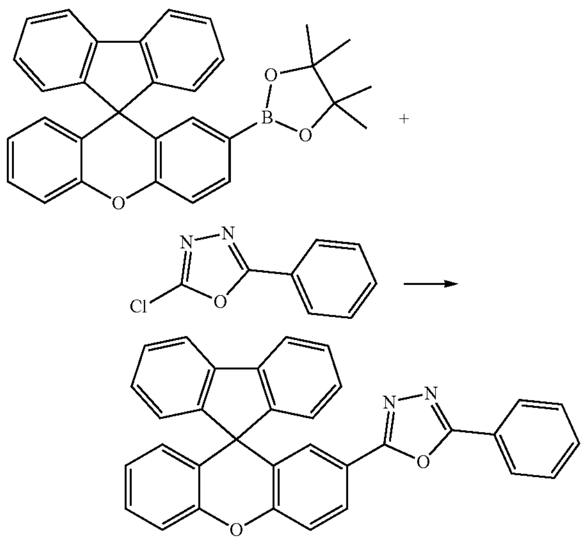

E17

Compound E11 was prepared in the same manner as in Preparation Example 1-1 except that each starting material was as in the above-described reaction formula.

MS[M+H]$^+$=477

<Preparation Example 1-18> Synthesis of Compound E18

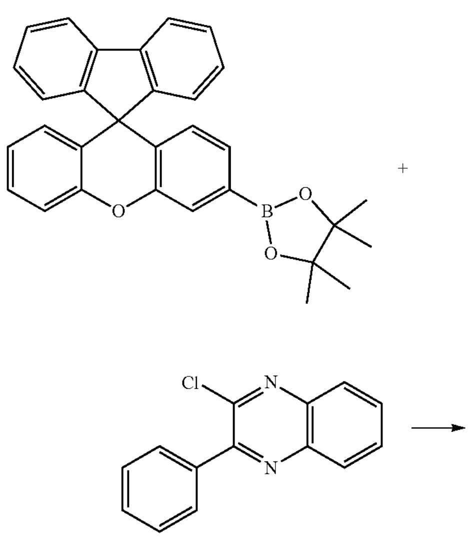

-continued

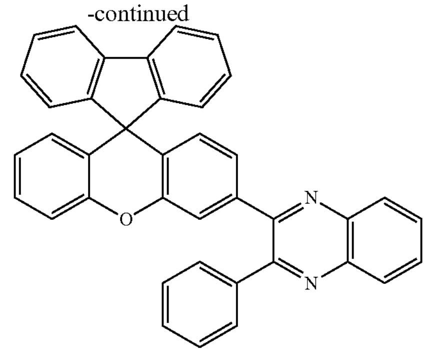

E18

Compound E18 was prepared in the same manner as in Preparation Example 1-1 except that each starting material was as in the above-described reaction formula.

MS[M+H]$^+$=537

<Preparation Example 1-19> Synthesis of Compound E19

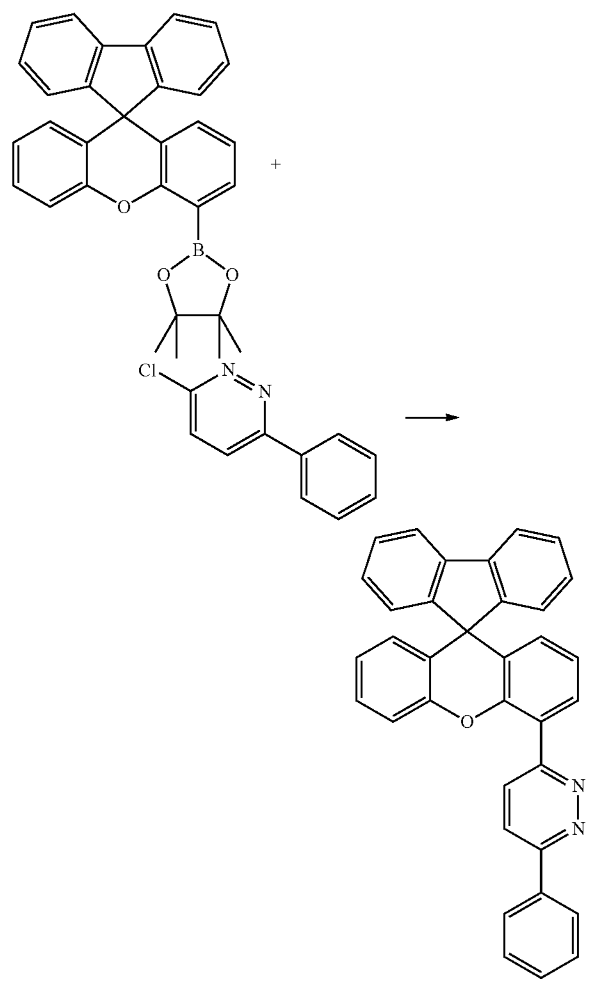

E19

Compound E19 was prepared in the same manner as in Preparation Example 1-1 except that each starting material was as in the above-described reaction formula.

MS[M+H]+=487

<Preparation Example 1-20> Synthesis of Compound E20

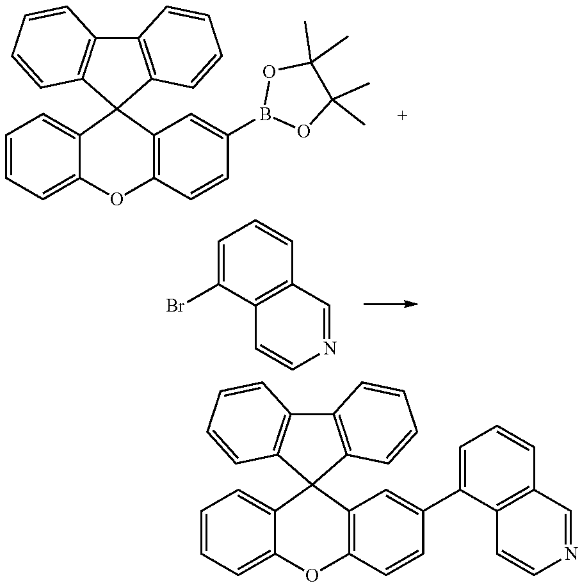

E20

Compound E20 was prepared in the same manner as in Preparation Example 1-1 except that each starting material was as in the above-described reaction formula.

MS[M+H]+=460

<Preparation Example 1-21> Synthesis of Compound E21

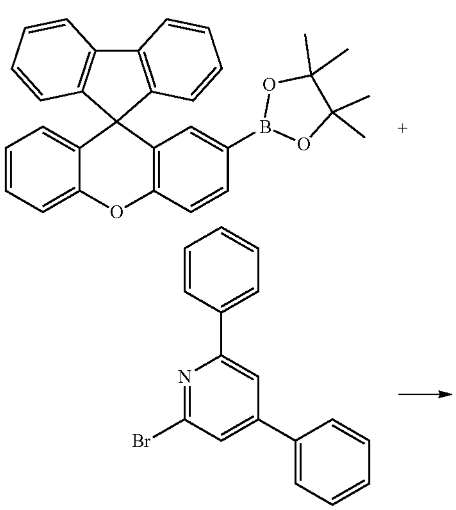

-continued

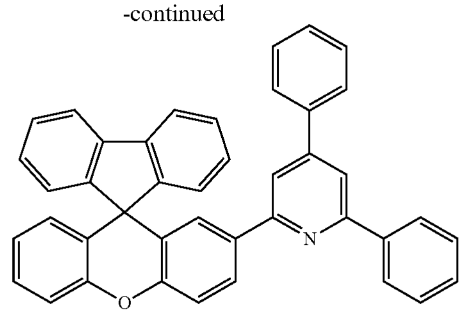

E21

Compound E21 was prepared in the same manner as in Preparation Example 1-1 except that each starting material was as in the above-described reaction formula.

MS[M+H]+=562

<Preparation Example 1-22> Synthesis of Compound E22

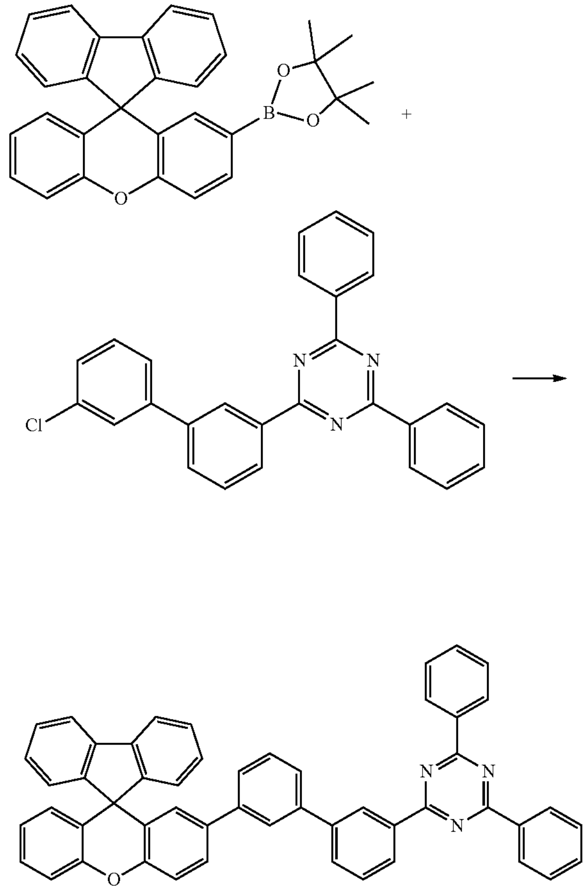

E22

Compound E22 was prepared in the same manner as in Preparation Example 1-1 except that each starting material was as in the above-described reaction formula.

MS[M+H]+=716

<Preparation Example 1-23> Synthesis of Compound E23

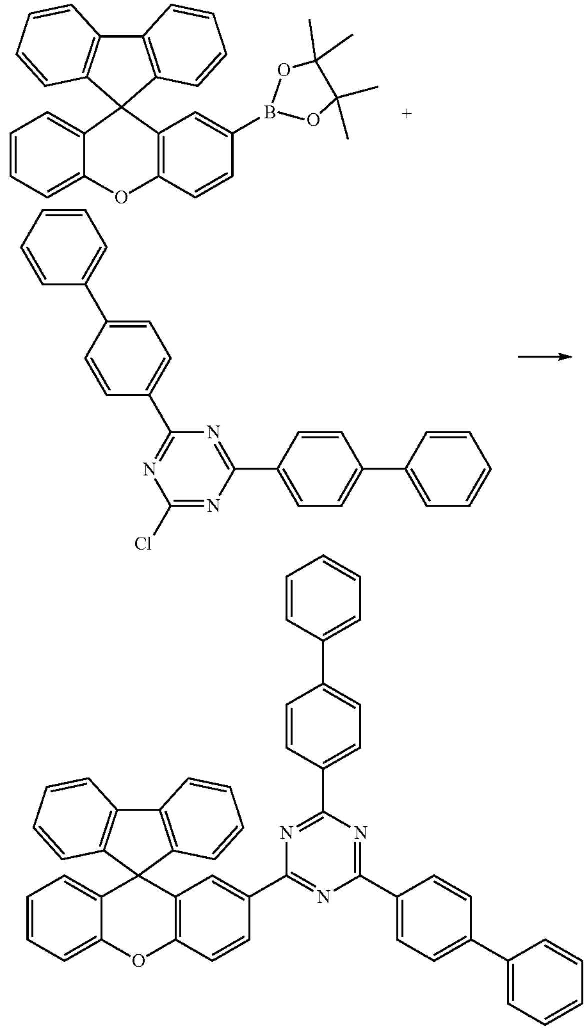

E23

Compound E23 was prepared in the same manner as in Preparation Example 1-1 except that each starting material was as in the above-described reaction formula.

MS[M+H]$^+$=716

<Preparation Example 2-1> Synthesis of Compound F1

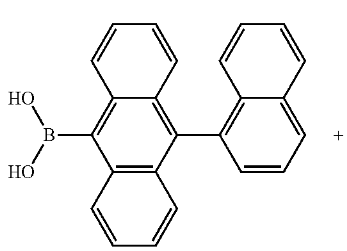

-continued

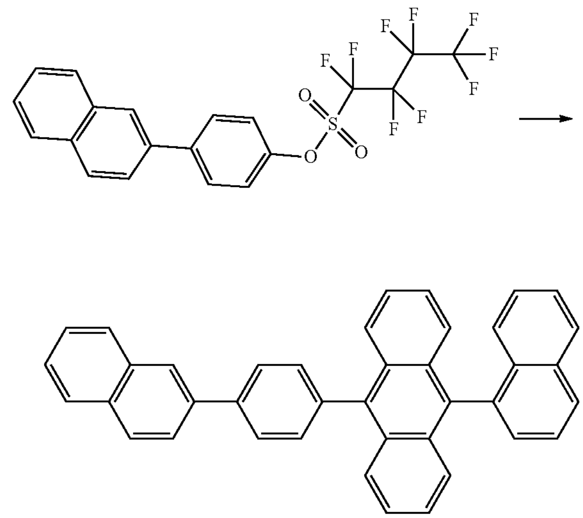

F1

Compound F1 was prepared in the same manner as in Preparation Example 1-1 except that each starting material was as in the above-described reaction formula.

MS[M+H]$^+$=507

<Preparation Example 2-2> Synthesis of Compound F2

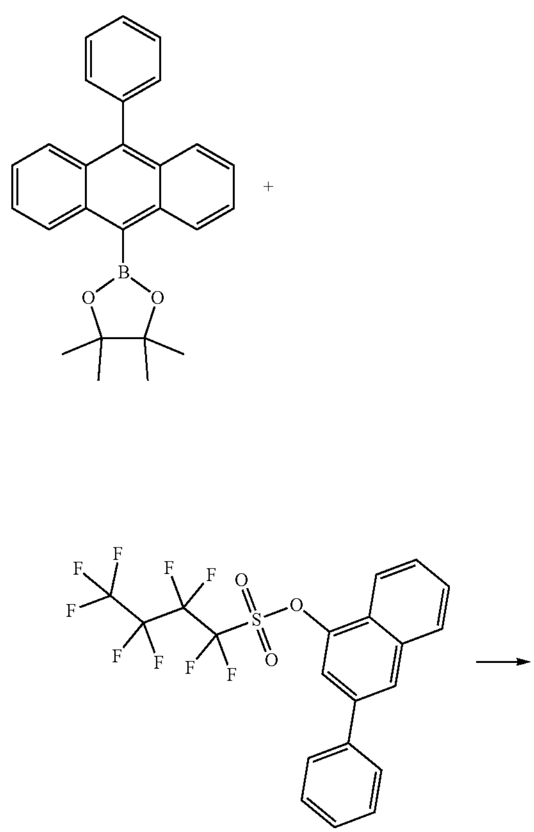

-continued

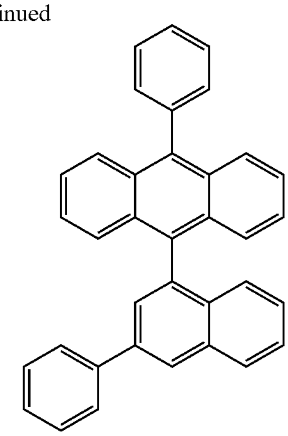

F2

Compound F2 was prepared in the same manner as in Preparation Example 1-1 except that each starting material was as in the above-described reaction formula.

$MS[M+H]^+=457$

Example 1-1

A glass substrate on which indium tin oxide (ITO) was coated as a thin film to a thickness of 1,000 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using oxygen plasma, and then transferred to a vacuum depositor.

On the transparent ITO electrode prepared as above, a hole injection layer was famed by thermal vacuum depositing the following compound [HI-A] to a thickness of 600 Å. A hole transfer layer was famed on the hole injection layer by vacuum depositing hexaazatriphenylene (HAT) of the following chemical formula to 50 Å and the following compound [HT-A] (700 Å) in consecutive order. A light emitting layer was formed on the hole transfer layer to a film thickness of 200 Å by vacuum depositing the compound [F1] and the following compound [BD] in a weight ratio of 25:1.

An electron control layer was formed on the light emitting layer to a thickness of 50 Å by vacuum depositing [Compound E1]. On the electron control layer, an electron transfer layer was formed to a thickness of 300 Å by vacuum depositing [Compound ET-1-J] and the following lithium quinolate [LiQ] compound in a weight ratio of 1:1. A cathode was formed on the electron transfer layer by depositing lithium fluoride (LiF) to a thickness of 10 Å and aluminum to a thickness of 1,000 Å in consecutive order.

An organic light emitting device was manufactured by maintaining, in the above-mentioned processes, the deposition rates of the organic materials at 0.4 Å/sec to 0.9 Å/sec, the deposition rates of the lithium fluoride and the aluminum of the cathode at 0.3 Å/sec and 2 Å/sec, respectively, and the degree of vacuum during the deposition at $1\times10^{-7}$ torr to $5\times10^{-8}$ torr.

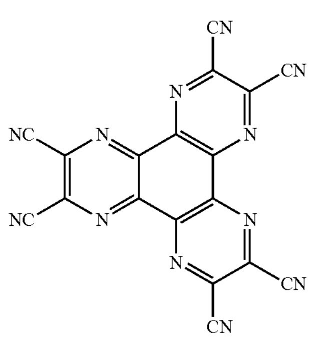

[HAT]

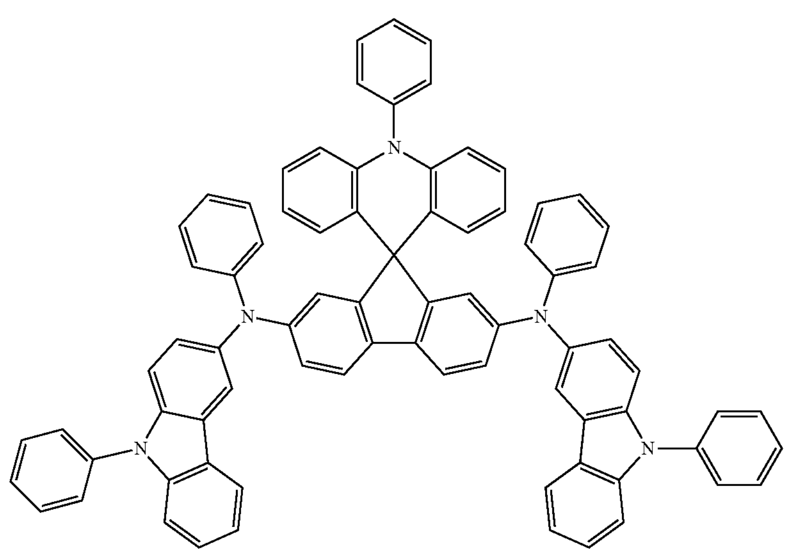

[HI-A]

-continued
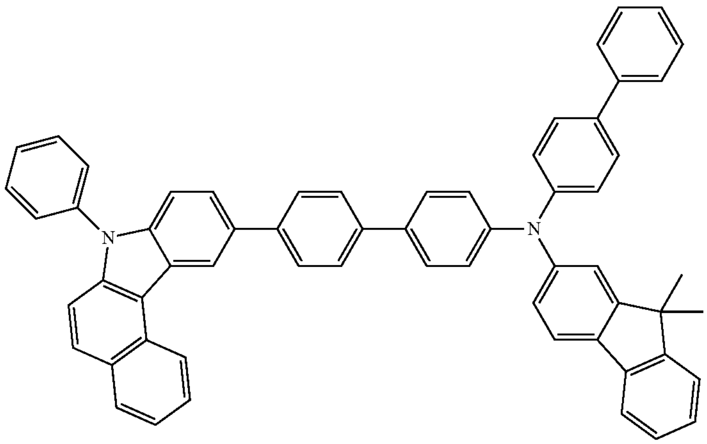
[HT-A]
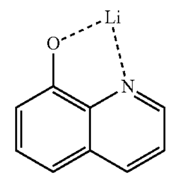
[LiQ]
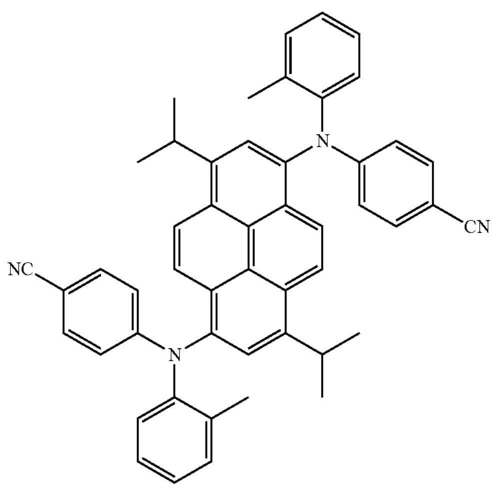
[BD]
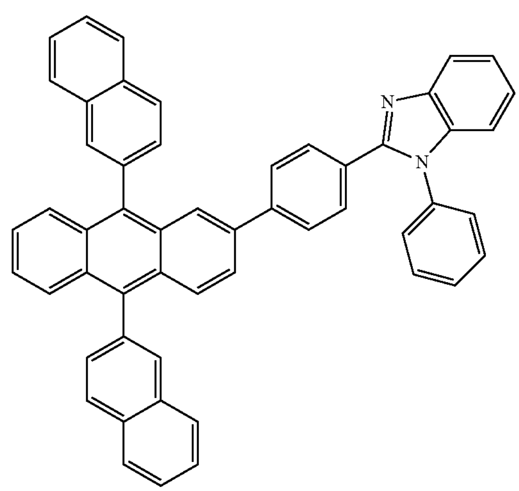
[ET-1-J]
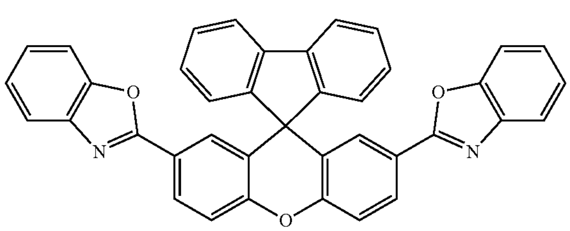
[ET-1-A]
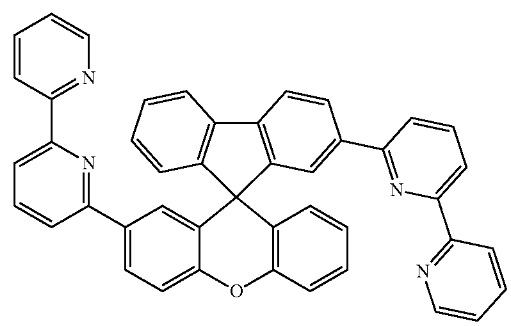
[ET-1-B]

-continued
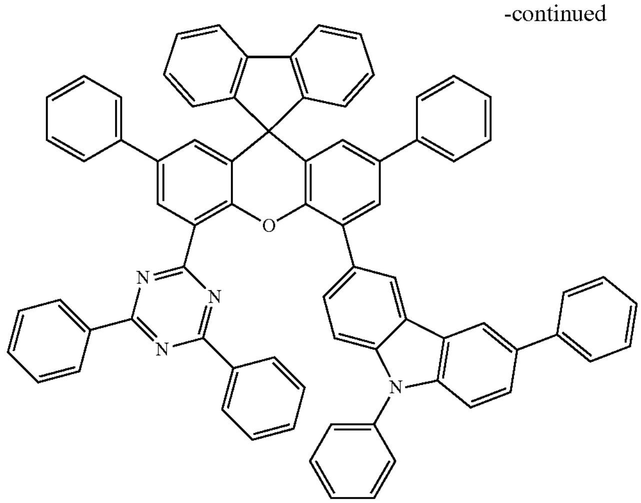
[ET-1-C]
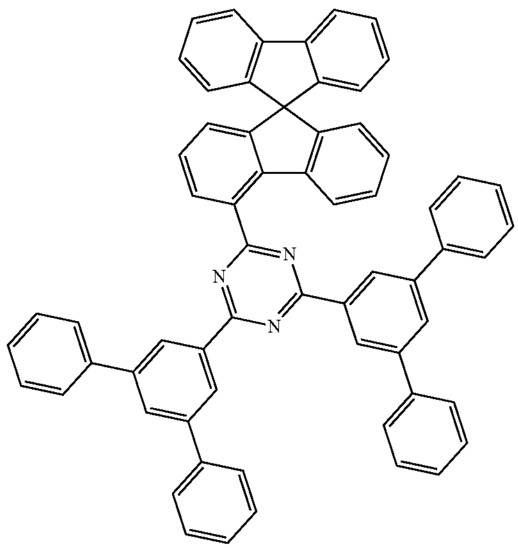
[ET-1-D]
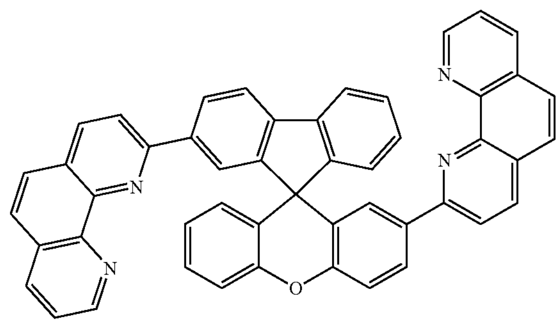
[ET-1-E]
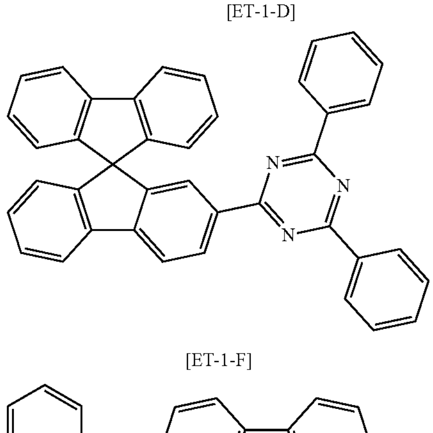
[ET-1-F]
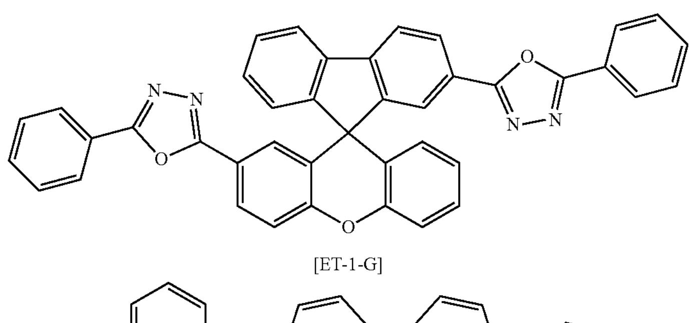
[ET-1-G]
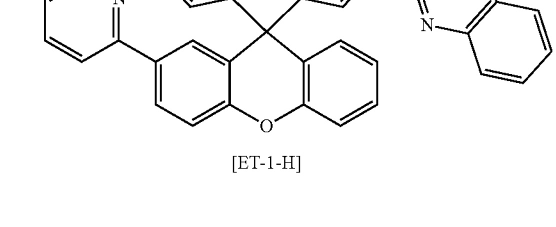
[ET-1-H]
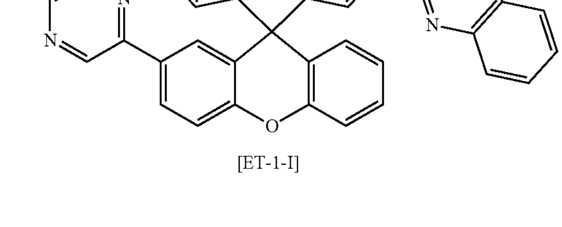
[ET-1-I]

-continued

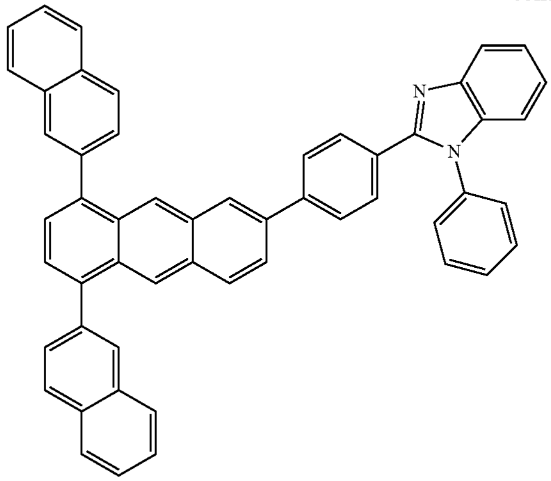

[ET-1-J]

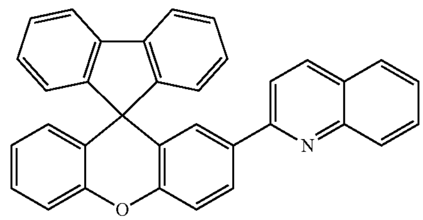

[ET-1-K]

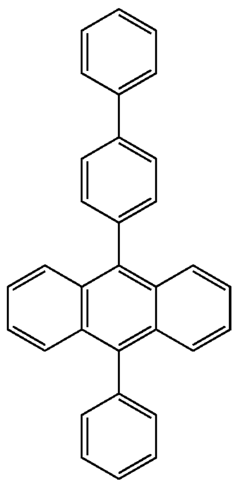

[EM-1-A]

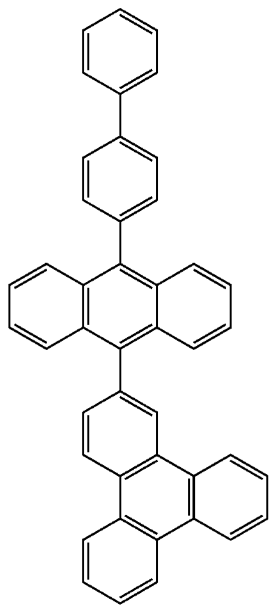

[EM-1-B]

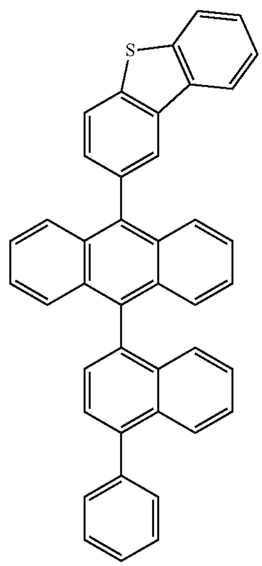

[EM-1-C]

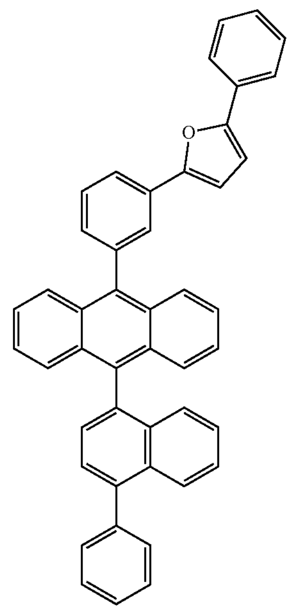

[EM-1-D]

Example 1-2

An organic light emitting device was manufactured in the same manner as in Example 1-1 except that Compound E2 was used instead of Compound E1.

Example 1-3

An organic light emitting device was manufactured in the same manner as in Example 1-1 except that Compound E3 was used instead of Compound E1.

Example 1-4

An organic light emitting device was manufactured in the same manner as in Example 1-1 except that Compound E4 was used instead of Compound E1.

Example 1-5

An organic light emitting device was manufactured in the same manner as in Example 1-1 except that Compound E5 was used instead of Compound E1.

Example 1-6

An organic light emitting device was manufactured in the same manner as in Example 1-1 except that Compound E6 was used instead of Compound E1.

Example 1-7

An organic light emitting device was manufactured in the same manner as in Example 1-1 except that Compound E7 was used instead of Compound E1.

Example 1-8

An organic light emitting device was manufactured in the same manner as in Example 1-1 except that Compound E8 was used instead of Compound E1.

Example 1-9

An organic light emitting device was manufactured in the same manner as in Example 1-1 except that Compound E9 was used instead of Compound E1.

Example 1-10

An organic light emitting device was manufactured in the same manner as in Example 1-1 except that Compound E10 was used instead of Compound E1.

Example 1-11

An organic light emitting device was manufactured in the same manner as in Example 1-1 except that Compound E11 was used instead of Compound E1.

Example 1-12

An organic light emitting device was manufactured in the same manner as in Example 1-1 except that Compound E12 was used instead of Compound E1.

Example 1-13

An organic light emitting device was manufactured in the same manner as in Example 1-1 except that Compound E13 was used instead of Compound E1.

Example 1-14

An organic light emitting device was manufactured in the same manner as in Example 1-1 except that Compound E14 was used instead of Compound E1.

Example 1-15

An organic light emitting device was manufactured in the same manner as in Example 1-1 except that Compound Ely was used instead of Compound E1.

Example 1-16

An organic light emitting device was manufactured in the same manner as in Example 1-1 except that Compound E16 was used instead of Compound E1.

Example 1-17

An organic light emitting device was manufactured in the same manner as in Example 1-1 except that Compound E11 was used instead of Compound E1.

Example 1-18

An organic light emitting device was manufactured in the same manner as in Example 1-1 except that Compound E18 was used instead of Compound E1.

Example 1-19

An organic light emitting device was manufactured in the same manner as in Example 1-1 except that Compound E19 was used instead of Compound E1.

Example 1-20

An organic light emitting device was manufactured in the same manner as in Example 1-1 except that Compound E20 was used instead of Compound E1.

Example 1-21

An organic light emitting device was manufactured in the same manner as in Example 1-1 except that Compound E21 was used instead of Compound E1.

Example 1-22

An organic light emitting device was manufactured in the same manner as in Example 1-1 except that Compound E22 was used instead of Compound E1.

Example 1-23

An organic light emitting device was manufactured in the same manner as in Example 1-1 except that Compound E23 was used instead of Compound E1.

Example 1-24

An organic light emitting device was manufactured in the same manner as in Example 1-1 except that Compound F2 was used instead of Compound F1.

Example 1-25

An organic light emitting device was manufactured in the same manner as in Example 1-2 except that Compound F2 was used instead of Compound F1.

Example 1-26

An organic light emitting device was manufactured in the same manner as in Example 1-3 except that Compound F2 was used instead of Compound F1.

Example 1-27

An organic light emitting device was manufactured in the same manner as in Example 1-4 except that Compound F2 was used instead of Compound F1.

Example 1-28

An organic light emitting device was manufactured in the same manner as in Example 1-5 except that Compound F2 was used instead of Compound F1.

Example 1-29

An organic light emitting device was manufactured in the same manner as in Example 1-6 except that Compound F2 was used instead of Compound F1.

Example 1-30

An organic light emitting device was manufactured in the same manner as in Example 1-7 except that Compound F2 was used instead of Compound F1.

Example 1-31

An organic light emitting device was manufactured in the same manner as in Example 1-8 except that Compound F2 was used instead of Compound F1.

Example 1-32

An organic light emitting device was manufactured in the same manner as in Example 1-9 except that Compound F2 was used instead of Compound F1.

Example 1-33

An organic light emitting device was manufactured in the same manner as in Example 1-10 except that Compound F2 was used instead of Compound F1.

Example 1-34

An organic light emitting device was manufactured in the same manner as in Example 1-11 except that Compound F2 was used instead of Compound F1.

Example 1-35

An organic light emitting device was manufactured in the same manner as in Example 1-12 except that Compound F2 was used instead of Compound F1.

Example 1-36

An organic light emitting device was manufactured in the same manner as in Example 1-13 except that Compound F2 was used instead of Compound F1.

Example 1-37

An organic light emitting device was manufactured in the same manner as in Example 1-14 except that Compound F2 was used instead of Compound F1.

Example 1-38

An organic light emitting device was manufactured in the same manner as in Example 1-15 except that Compound F2 was used instead of Compound F1.

Example 1-39

An organic light emitting device was manufactured in the same manner as in Example 1-16 except that Compound F2 was used instead of Compound F1.

Example 1-40

An organic light emitting device was manufactured in the same manner as in Example 1-17 except that Compound F2 was used instead of Compound F1.

Example 1-41

An organic light emitting device was manufactured in the same manner as in Example 1-18 except that Compound F2 was used instead of Compound F1.

Example 1-42

An organic light emitting device was manufactured in the same manner as in Example 1-19 except that Compound F2 was used instead of Compound F1.

Example 1-43

An organic light emitting device was manufactured in the same manner as in Example 1-20 except that Compound F2 was used instead of Compound F1.

Example 1-44

An organic light emitting device was manufactured in the same manner as in Example 1-21 except that Compound F2 was used instead of Compound F1.

Example 1-45

An organic light emitting device was manufactured in the same manner as in Example 1-22 except that Compound F2 was used instead of Compound F1.

Example 1-46

An organic light emitting device was manufactured in the same manner as in Example 1-23 except that Compound F2 was used instead of Compound F1.

Comparative Example 1-1

An organic light emitting device was manufactured in the same manner as in Example 1-1 except that Compound ET-1-A was used instead of Compound E1.

Comparative Example 1-2

An organic light emitting device was manufactured in the same manner as in Example 1-1 except that Compound ET-1-B was used instead of Compound E1.

Comparative Example 1-3

An organic light emitting device was manufactured in the same manner as in Example 1-1 except that Compound ET-1-C was used instead of Compound E1.

Comparative Example 1-4

An organic light emitting device was manufactured in the same manner as in Example 1-1 except that Compound ET-1-D was used instead of Compound E1.

Comparative Example 1-5

An organic light emitting device was manufactured in the same manner as in Example 1-1 except that Compound ET-1-E was used instead of Compound E1.

Comparative Example 1-6

An organic light emitting device was manufactured in the same manner as in Example 1-1 except that Compound ET-1-F was used instead of Compound E1.

Comparative Example 1-7

An organic light emitting device was manufactured in the same manner as in Example 1-1 except that Compound ET-1-G was used instead of Compound E1.

Comparative Example 1-8

An organic light emitting device was manufactured in the same manner as in Example 1-1 except that Compound ET-1-H was used instead of Compound E1.

Comparative Example 1-9

An organic light emitting device was manufactured in the same manner as in Example 1-1 except that Compound ET-1-I was used instead of Compound E1.

Comparative Example 1-10

An organic light emitting device was manufactured in the same manner as in Example 1-1 except that Compound ET-1-J was used instead of Compound E1.

Comparative Example 1-11

An organic light emitting device was manufactured in the same manner as in Example 1-1 except that Compound ET-1-K was used instead of Compound E1.

Comparative Example 1-12

An organic light emitting device was manufactured in the same manner as in Example 1-2 except that Compound EM-1-A was used instead of Compound F1.

Comparative Example 1-13

An organic light emitting device was manufactured in the same manner as in Example 1-2 except that Compound EM-1-B was used instead of Compound F1.

Comparative Example 1-14

An organic light emitting device was manufactured in the same manner as in Example 1-2 except that Compound EM-1-C was used instead of Compound F1.

Comparative Example 1-15

An organic light emitting device was manufactured in the same manner as in Example 1-2 except that Compound EM-1-D was used instead of Compound F1.

Comparative Example 1-16

An organic light emitting device was manufactured in the same manner as in Example 1-1 except that the electron transfer layer was formed to a thickness of 350 Å by vacuum depositing Compounds ET-1-J and LiQ in a weight ratio of 1:1 without the electron control layer.

Comparative Example 1-17

An organic light emitting device was manufactured in the same manner as in Example 1-1 except that Compound EM-1-A was used instead of Compound F1 and Compound ET-1-A was used instead of Compound E1.

For the organic light emitting devices manufactured using the methods of Examples 1-1 to 1-46 and Comparative Examples 1-1 to 1-17 described above, a driving voltage and light emission efficiency were measured at current density of 10 mA/cm$^2$, and time taken for the luminance decreasing to 90% compared to its initial luminance ($T_{90}$) was measured at current density of 20 mA/cm$^2$. The results are shown in the following Table 1.

TABLE 1

| | Compound (Electron Control Layer) | Compound (Light Emitting Layer, Host) | Voltage (V@10 mA/cm$^2$) | Efficiency (cd/A@10 mA/cm$^2$) | Color Coordinate (x,y) | Lifetime (h) $T_{90}$ at 20 mA/Cm$^2$ |
|---|---|---|---|---|---|---|
| Example 1-1 | E1 | F1 | 3.48 | 5.86 | (0.142, 0.097) | 228 |
| Example 1-2 | E2 | F1 | 3.45 | 5.88 | (0.142, 0.096) | 220 |
| Example 1-3 | E3 | F1 | 3.48 | 5.94 | (0.142, 0.096) | 211 |
| Example 1-4 | E4 | F1 | 3.44 | 5.69 | (0.142, 0.096) | 187 |
| Example 1-5 | E5 | F1 | 3.53 | 5.79 | (0.142, 0.096) | 239 |
| Example 1-6 | E6 | F1 | 3.55 | 5.81 | (0.142, 0.098) | 221 |
| Example 1-7 | E7 | F1 | 3.65 | 5.66 | (0.142, 0.102) | 181 |
| Example 1-8 | E8 | F1 | 3.48 | 5.90 | (0.142, 0.096) | 229 |
| Example 1-9 | E9 | F1 | 3.62 | 5.67 | (0.142, 0.096) | 169 |
| Example 1-10 | E10 | F1 | 3.58 | 5.78 | (0.142, 0.096) | 236 |
| Example 1-11 | E11 | F1 | 3.49 | 5.79 | (0.142, 0.096) | 217 |
| Example 1-12 | E12 | F1 | 3.47 | 5.78 | (0.142, 0.096) | 228 |
| Example 1-13 | E13 | F1 | 3.50 | 5.92 | (0.142, 0.096) | 220 |
| Example 1-14 | E14 | F1 | 3.53 | 5.74 | (0.142, 0.096) | 249 |
| Example 1-15 | E15 | F1 | 3.48 | 5.88 | (0.142, 0.096) | 235 |
| Example 1-16 | E16 | F1 | 3.52 | 5.80 | (0.142, 0.097) | 240 |
| Example 1-17 | E17 | F1 | 3.55 | 5.66 | (0.142, 0.096) | 176 |
| Example 1-18 | E18 | F1 | 3.54 | 5.66 | (0.142, 0.096) | 175 |
| Example 1-19 | E19 | F1 | 3.59 | 5.82 | (0.142, 0.096) | 219 |
| Example 1-20 | E20 | F1 | 3.66 | 5.64 | (0.142, 0.096) | 170 |
| Example 1-21 | E21 | F1 | 3.67 | 5.70 | (0.142, 0.097) | 186 |
| Example 1-12 | E22 | F1 | 3.52 | 5.94 | (0.142, 0.096) | 208 |
| Example 1-23 | E23 | F1 | 3.54 | 5.84 | (0.142, 0.097) | 216 |
| Example 1-24 | E1 | F2 | 3.45 | 5.83 | (0.142, 0.097) | 233 |
| Example 1-25 | E2 | F2 | 3.44 | 5.86 | (0.142, 0.096) | 225 |

TABLE 1-continued

| | Compound (Electron Control Layer) | Compound (Light Emitting Layer, Host) | Voltage (V@10 mA/cm$^2$) | Efficiency (cd/A@10 mA/cm$^2$) | Color Coordinate (x,y) | Lifetime (h) $T_{90}$ at 20 mA/Cm$^2$ |
|---|---|---|---|---|---|---|
| Example 1-26 | E3 | F2 | 3.50 | 5.92 | (0.142, 0.096) | 217 |
| Example 1-27 | E4 | F2 | 3.65 | 5.62 | (0.142, 0.096) | 192 |
| Example 1-28 | E5 | F2 | 3.54 | 5.75 | (0.142, 0.096) | 244 |
| Example 1-29 | E6 | F2 | 3.57 | 5.76 | (0.142, 0.098) | 228 |
| Example 1-30 | E7 | F2 | 3.67 | 5.63 | (0.142, 0.102) | 187 |
| Example 1-31 | E8 | F2 | 3.44 | 5.87 | (0.142, 0.096) | 240 |
| Example 1-32 | E9 | F2 | 3.64 | 5.65 | (0.142, 0.096) | 176 |
| Example 1-33 | E10 | F2 | 3.60 | 5.76 | (0.142, 0.096) | 239 |
| Example 1-34 | E11 | F2 | 3.50 | 5.76 | (0.142, 0.096) | 228 |
| Example 1-35 | E12 | F2 | 3.48 | 5.74 | (0.142, 0.096) | 235 |
| Example 1-36 | E13 | F2 | 3.51 | 5.88 | (0.142, 0.096) | 229 |
| Example 1-37 | E14 | F2 | 3.55 | 5.71 | (0.142, 0.096) | 255 |
| Example 1-38 | E15 | F2 | 3.49 | 5.84 | (0.142, 0.096) | 240 |
| Example 1-39 | E16 | F2 | 3.53 | 5.76 | (0.142, 0.097) | 248 |
| Example 1-40 | E17 | F2 | 3.57 | 5.63 | (0.142, 0.096) | 175 |
| Example 1-41 | E18 | F2 | 3.56 | 5.64 | (0.142, 0.096) | 179 |
| Example 1-42 | E19 | F2 | 3.61 | 5.88 | (0.142, 0.096) | 316 |
| Example 1-43 | E20 | F2 | 3.68 | 5.72 | (0.142, 0.096) | 278 |
| Example 1-44 | E21 | F2 | 3.69 | 5.67 | (0.142, 0.097) | 279 |
| Example 1-45 | E22 | F2 | 3.53 | 6.02 | (0.142, 0.096) | 312 |
| Example 1-46 | E23 | F2 | 3.56 | 5.92 | (0.142, 0.097) | 320 |
| Comparative Example 1-1 | ET-1-A | F1 | 3.75 | 3.71 | (0.142, 0.096) | 64 |
| Comparative Example 1-2 | ET-1-B | F1 | 3.82 | 3.92 | (0.142, 0.098) | 68 |
| Comparative Example 1-3 | ET-1-C | F1 | 3.93 | 3.73 | (0.142, 0.097) | 72 |
| Comparative Example 1-4 | ET-1-D | F1 | 3.89 | 3.94 | (0.142, 0.096) | 44 |
| Comparative Example 1-5 | ET-1-E | F1 | 3.96 | 3.41 | (0.142, 0.097) | 54 |
| Comparative Example 1-6 | ET-1-F | F1 | 3.94 | 4.16 | (0.142, 0.097) | 32 |
| Comparative Example 1-7 | ET-1-G | F1 | 3.98 | 3.05 | (0.142, 0.097) | 53 |
| Comparative Example 1-8 | ET-1-H | F1 | 3.92 | 3.05 | (0.142, 0.097) | 41 |
| Comparative Example 1-9 | ET-1-I | F1 | 3.92 | 3.04 | (0.142, 0.097) | 42 |
| Comparative Example 1-10 | ET-1-J | F1 | 3.94 | 3.83 | (0.142, 0.096) | 61 |
| Comparative Example 1-11 | ET-1-K | F1 | 3.94 | 4.05 | (0.142, 0.096) | 77 |
| Comparative Example 1-12 | E2 | EM-1-A | 4.08 | 5.13 | (0.142, 0.097) | 65 |
| Comparative Example 1-13 | E2 | EM-1-B | 4.07 | 5.17 | (0.142, 0.096) | 99 |
| Comparative Example 1-14 | E2 | EM-1-C | 3.82 | 5.57 | (0.142, 0.096) | 21 |
| Comparative Example 1-15 | E2 | EM-1-D | 3.91 | 5.11 | (0.142, 0.096) | 33 |
| Comparative Example 1-16 | — | F1 | 3.85 | 4.54 | (0.142, 0.096) | 69 |
| Comparative Example 1-17 | ET-1-A | EM-1-A | 4.11 | 3.00 | (0.142, 0.097) | 40 |

Based on the results of Table 1, it was identified that, when comparing Examples 1-1 to 1-46 with Comparative Examples 1-1, 1-2, 1-3, 1-5, 1-7, 1-8 and 1-9, the compound in which only one heteroaryl group substitutes in the spiro fluorene xanthene skeleton as in Chemical Formula 1 had excellent properties in terms of driving voltage, efficiency and lifetime in an organic light emitting device compared to the compound having two or more substituents in the Spiro fluorene xanthene skeleton.

When referring to FIG. 10 and FIG. 11 presenting 3D structures of Compounds E9 and E18 according to one embodiment of the present specification, it was identified that the molecules of the compounds had a horizontal structure, and when referring to FIG. 12 and FIG. 13 presenting 3D structures of Compounds ET-1-E and ET-1-I, it was identified that the A axis and the B axis were almost perpendicular to each other in each compound, and the molecule was very out of a horizontal structure.

As a result, when comparing FIG. 10 and FIG. 11 presenting 3D structures of Compounds E9 and E18 according to one embodiment of the present specification and FIG. 12 and FIG. 13 presenting 3D structures of Compounds ET-1-E and ET-1-I, it was seen that the heterocyclic compound of Chemical Formula 1 according to one embodiment of the present specification had a more horizontal structure due to a difference in orientation in the molecular 3D structure. Accordingly, the compound in which only one heteroaryl group substitutes in the spiro fluorene xanthene skeleton as in Chemical Formula 1 of Examples 1-1 to 1-46 had a strong tendency toward a horizontal structure of the molecule compared to the compound having two or more substituents in the spiro fluorene xanthene skeleton resulting in an increase in the electron mobility, and effects of low driving voltage, high efficiency and long lifetime are obtained in an organic light emitting device.

In addition, when comparing Examples 1-1 to 1-46 with Comparative Examples 1-4 and 1-6, it was identified that the structure of Chemical Formula 1 including spiro fluorene xanthene exhibited excellent properties in an organic light emitting device compared to the structure including a spiro fluorene group.

In addition, when comparing Examples 1-16 and 1-39 with Comparative Example 1-11, it was identified that, depending on the bonding position of quinoline in spiro fluorene xanthene of the structure of Chemical Formula 1 including the spiro fluorene xanthene, the structure of Chemical Formula 1 in which a benzene ring that does not include N bonds to the spiro fluorene xanthene exhibited more superior properties in the organic light emitting device compared to the compound in which a benzene ring that includes N bonds to spiro fluorene xanthene.

When comparing Examples 1-1 to 1-46 with Comparative Examples 1-12 and 1-13, it was identified that excellent efficiency and lifetime properties were obtained in the organic light emitting device when using the compound of Chemical Formula 3 having a naphthalene group as a light emitting layer host compared to the compound without a naphthalene group as a light emitting layer host.

When comparing Examples 1-1 to 1-46 with Comparative Examples 1-14 and 1-15, it was identified that excellent efficiency and lifetime properties were obtained in the organic light emitting device when using the compound of Chemical Formula 3 without a heteroaryl group as a light emitting layer host compared to the compound having a heteroaryl group as a light emitting layer host.

In addition, when comparing Examples 1-1 to 1-46 with Comparative Example 1-16, it was identified that excellent efficiency and lifetime properties were obtained in the organic light emitting device including an electron control layer including the compound of Chemical Formula 1 compared to the structure without foaming an electron control layer as a film in the organic light emitting device.

In addition, when comparing Examples 1-1 to 1-46 with Comparative Example 1-17, it was identified that excellent efficiency and lifetime properties were obtained in the organic light emitting device including the compounds of Chemical formula 1 and Chemical Formula 3 compared to the structure not film-formed with Chemical Formula 1 and Chemical Formula 3.

The heterocyclic compound of Chemical Formula 1 according to one embodiment of the present specification is capable of having excellent properties by having excellent thermal stability, a deep HOMO level of 6.0 eV or greater, high triplet energy (ET) and hole stability.

Particularly, when Ar1 is a triazine group or a pyrimidine group in Chemical Formula 1 in the examples, the HOMO energy was deep of 6.1 eV or greater, and particularly, a role as the electron control layer (electron blocking layer) was smoothly performed, and excellent properties were obtained in tams of driving voltage, efficiency and lifetime when used in the organic light emitting device due to high electron mobility. Specifically, it was identified that, Examples 1-1 to 1-3, 1-5, 1-6, 1-8, 1-10 to 1-15, 1-23 to 1-26, 1-28, 1-29, 1-31, 1-33 to 1-38, 1-45, 1-46 exhibited superior properties in terms of driving voltage, efficiency and/or lifetime compared to Examples 1-21 and 1-44 in which Ar1 is a pyridine group (one N).

In addition, the LUMO energy was formed to be 2.8 eV or greater when forming a light emitting layer host with Chemical Formula 3 facilitating hole injection to the light emitting layer. (refer to the following Example 2)

Accordingly, the heterocyclic compound of Chemical Formula 1 and/or Chemical Formula 3 according to one embodiment of the present specification has low driving voltage and high efficiency, and is capable of enhancing device stability by hole stability of the compound.

Example 2

HOMO energy and LUMO energy values of the following Compound E1 corresponding to the compound of Chemical Formula 1 according to one embodiment of the present specification, Compound E2, the following Compound F1 corresponding to the compound of Chemical Formula 3, and Compounds ET-1-J and EM-1-C of comparative examples are shown in the following Table 2.

[E1]

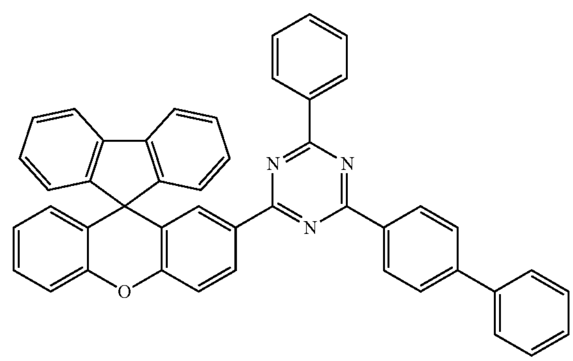

[E2]

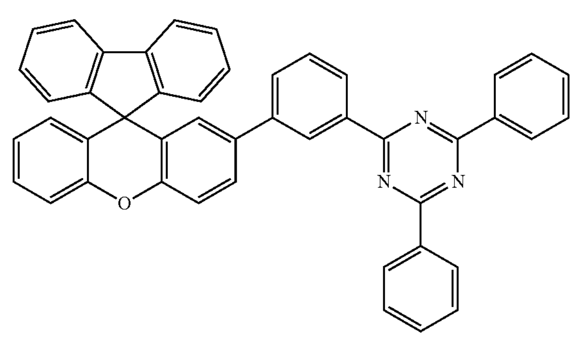

-continued

[ET-1-J]

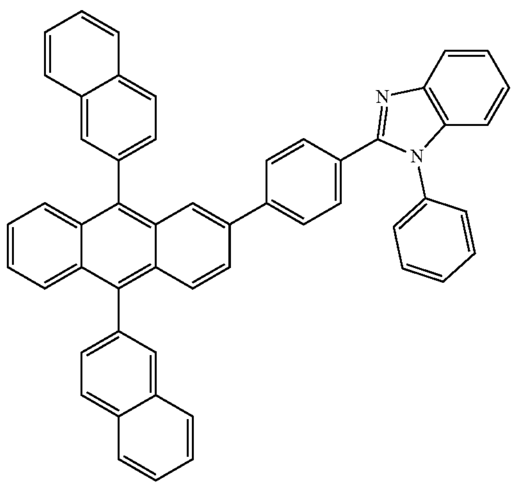

[F1]

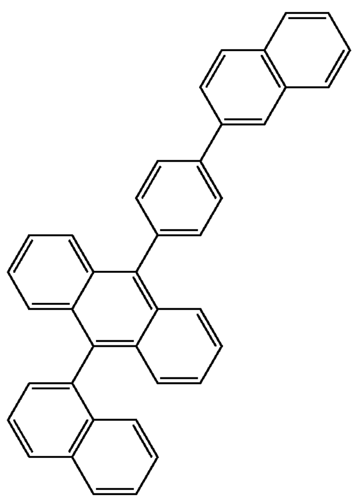

[EM-1-C]

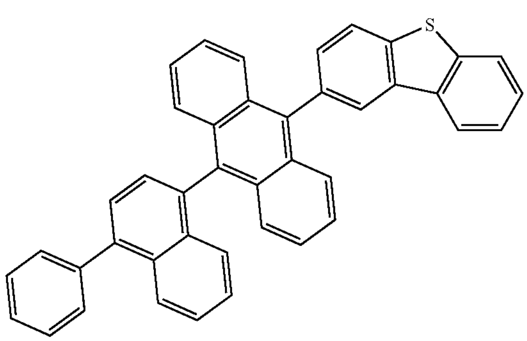

In the examples of the present specification, the HOMO level was measured using an optoelectronic spectrometer (manufactured by RIKEN KEIKI Co., Ltd.: AC3) under the atmosphere.

In the examples of the present specification, the LUMO energy level was calculated as a wavelength value measured through photoluminescence (PL).

In the examples of the present specification, the triplet energy ($E_T$) was calculated with a TD-DFT calculation method using Gaussian 09.

TABLE 2

| Compound | HOMO (eV) | LUMO (eV) | $E_T$ (eV) |
|---|---|---|---|
| E1 | 6.20 | 2.70 | 2.74 |
| E2 | 6.16 | 2.92 | 2.83 |
| ET-1-J | 5.70 | 2.87 | 1.56 |
| F1 | 5.84 | 2.92 | 1.58 |
| EM-1-C | 5.70 | 2.77 | 1.60 |

Compounds E1 and E2 had a deep HOMO energy level of 6.0 eV or greater, and specifically, the HOMO energy level was deep of 6.1 eV or greater. It was identified that Compounds E1 and E2 also had a bandgap of 3.0 eV or greater. Accordingly, it was seen that, when using the compound of Chemical Formula 1 in the electron control layer (hole block layer) in the organic light emitting device, excellent properties were obtained in terms of driving voltage, efficiency and lifetime due to high electron mobility.

In addition, Compound F1 had HOMO energy formed to be 5.8 eV or greater, and, when formed as an electron blocking layer, can facilitate hole injection to the light emitting layer.

Hereinbefore, preferred embodiments of the present disclosure have been described, however, the present disclosure is not limited thereto, and various modifications can be made within the scope of the claims and detailed descriptions of the disclosure, and these also fall within the category of the disclosure.

In the Claims
In Claim 8, please replace the Chemical Structure appearing at Column 436, Lines 56-65 with:
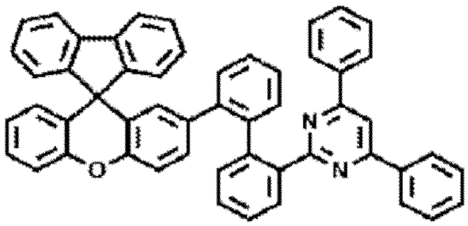

The invention claimed is:

1. An organic light emitting device comprising:

an anode;

a cathode;

a light emitting layer provided between the anode and the cathode; and an organic material layer provided between the light emitting layer and the cathode and including a compound of the following Chemical Formula 1, wherein the light emitting layer includes a compound of the following Chemical Formula 3:

[Chemical Formula 1]

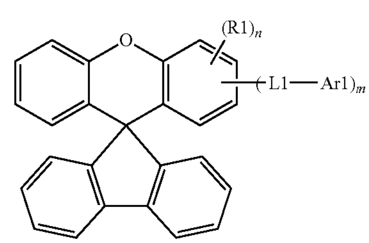

wherein in Chemical Formula 1:

R1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

L1 is a direct bond, a substituted or unsubstituted arylene group, or a substituted or unsubstituted heteroarylene group;

Ar1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, a substituted or unsubstituted monocyclic heterocyclic group, a substituted or unsubstituted tricyclic or higher heterocyclic group, a substituted or unsubstituted bicyclic heterocyclic group including two or more nitrogens, a substituted or unsubstituted isoquinolyl group, or a structure of the following Chemical Formula 2 or the following Chemical Formula 13;

m is an integer of 1 to 4, n is an integer of 0 to 3, and $1 \leq n+m \leq 4$; and when m and n are each an integer of 2 or greater, structures in the two or more parentheses are the same as or different from each other;

[Chemical Formula 2]

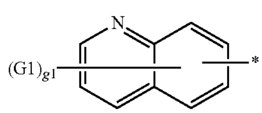

wherein in Chemical Formula 2:

G1 is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

g1 is an integer of 1 to 6, and when g1 is 2 or greater, the G1s are the same as or different from each other; and

* is a site bonding to L1 of Chemical Formula 1;

[Chemical Formula 13]

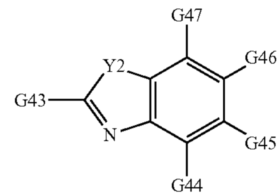

wherein:

Y2 is O, S, NQ4, or CQ5Q6;

any one of G43 to G47 is a site bonding to L1 of Chemical Formula 1; and the rest of G43 to G47 other than the site bonding to L1 of Chemical Formula 1, and Q4 to Q6 are the same as or different from each other, and each independently is hydrogen, deuterium, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group;

[Chemical Formula 3]

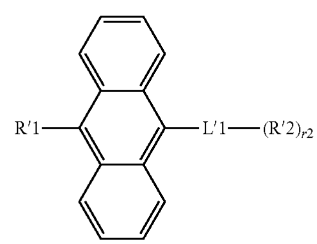

wherein in Chemical Formula 3:

at least one of R'1, R'2 and L'1 is a naphthyl group or a divalent naphthyl group;

R'1 and R'2 are the same as or different from each other, and each independently is a substituted or unsubstituted aryl group;

L'1 is a substituted or unsubstituted arylene group; and r2 is an integer of 1 to 3, and when r2 is 2 or greater, the R'2s are the same as or different from each other.

2. The organic light emitting device of claim 1, wherein L1 is a direct bond, a substituted or unsubstituted phenylene group, a substituted or unsubstituted biphenylylene group, a substituted or unsubstituted naphthylene group, a substituted or unsubstituted terphenylylene group, a substituted or unsubstituted quaterphenylene group, a substituted or unsubstituted anthracenylene group, a substituted or unsubstituted phenanthrenylene group, a substituted or unsubstituted triphenylenylene group, a substituted or unsubstituted pyrenylene group, a substituted or unsubstituted fluorenylene group, a substituted or unsubstituted spirocyclopentanefluorenylene group, a substituted or unsubstituted dibenzofuranylene group, a substituted or unsubstituted divalent dibenzothiophene group, a substituted or unsubstituted carbazolene group, a substituted or unsubstituted pyridylene group, a substituted or unsubstituted pyrimidylene group, a substituted or unsubstituted divalent furan group, or a substituted or unsubstituted divalent thiophene group.

3. The organic light emitting device of claim 1, wherein Ar1 is a nitrile group, a substituted or unsubstituted alkoxy group, a substituted or unsubstituted phosphine oxide group, a substituted or unsubstituted silyl group, a substituted or unsubstituted aryl group, a substituted or unsubstituted monocyclic heterocyclic group, a substituted or unsubstituted tricyclic or higher heterocyclic group, a substituted or unsubstituted bicyclic heterocyclic group including two or more nitrogens, a substituted or unsubstituted isoquinolyl group, or the structure of Chemical Formula 2.

4. The organic light emitting device of claim 1, wherein Ar1 is represented by any one of Chemical Formula 2 and the following Chemical Formulae 6 to 15:

[Chemical Formula 6]

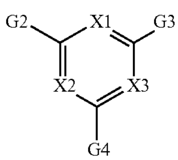

[Chemical Formula 7]

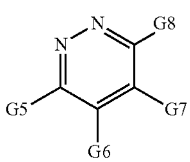

[Chemical Formula 8]

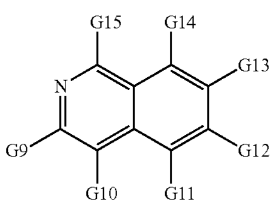

[Chemical Formula 9]

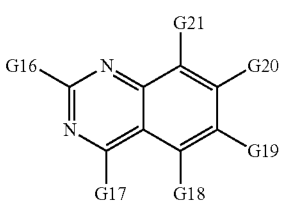

[Chemical Formula 10]

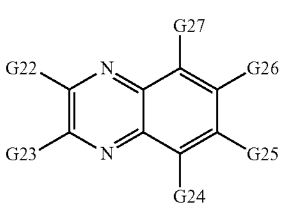

-continued

[Chemical Formula 11]

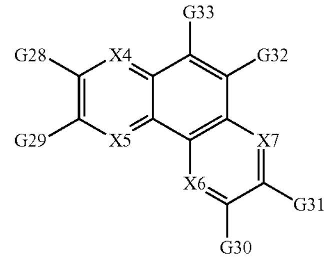

[Chemical Formula 12]

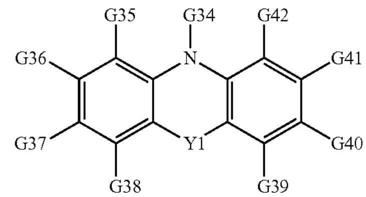

[Chemical Formula 13]

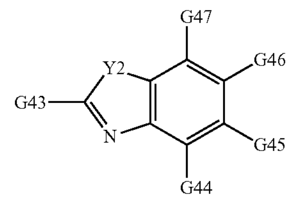

[Chemical Formula 14]

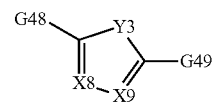

[Chemical Formula 15]

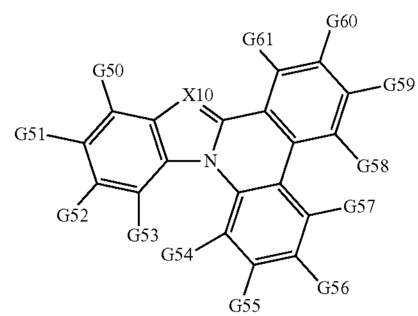

wherein in Chemical Formulae 6 to 15:

X1 is N or CR11;

X2 is N or CR12;

X3 is N or CR13;

X4 is N or CR14;

X5 is N or CR15;

X6 is N or CR16;

X7 is N or CR17;

X8 is N or CR18;

X9 is N or CR19;

X10 is N or CR20;

at least two of X1 to X3 are N, and at least one of X4 to X7 is N;

Y1 is O, S, NQ1, or CQ2Q3;

Y2 is O, S, NQ4, or CQ5Q6;

Y3 is O, S, or NQ7;

any one of G2 to G4 and R11 to R13, any one of G5 to G8, any one of G9 to G15, any one of G16 to G21, any one of G22 to G27, any one of G28 to G33 and R14 to R17, any one of G34 to G42, any one of G43 to G47, any one of G48, G49, R18 and R19, and any one of G50 to G61 is a site bonding to L1 of Chemical Formula 1; and the rest of G2 to G61 and R11 to R19 other than the site bonding to L1 of Chemical Formula 1, R20 and Q1 to Q7 are the same as or different from each other, and each independently is hydrogen, deuterium, a nitrile group, a nitro, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heteroaryl group.

5. The organic light emitting device of claim 1, wherein Chemical Formula 1 is any one of the following Chemical Formulae 1-1 to 1-4:

[Chemical Formula 1-1]

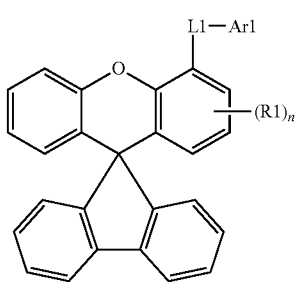

[Chemical Formula 1-2]

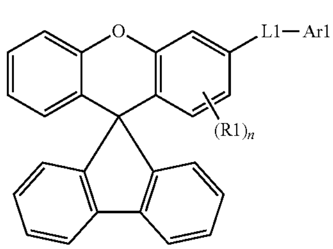

[Chemical Formula 1-3]

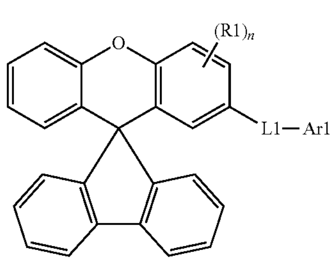

-continued

[Chemical Formula 1-4]

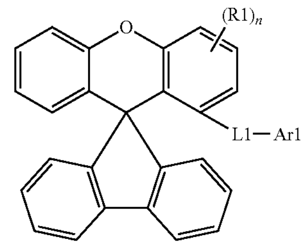

wherein in Chemical Formulae 1-1 to 1-4,

L1, Ar1, R1 and n have the same definitions as in Chemical Formula 1.

6. The organic light emitting device of claim 1, wherein R'1 and R'2 are the same as or different from each other, and each independently is a phenyl group, a naphthyl group or a biphenyl group.

7. The organic light emitting device of claim 1, wherein L'1 is a phenylene group, a trivalent phenyl group, or a divalent naphthyl group.

8. The organic light emitting device of claim 1, wherein the compound of Chemical Formula 1 is any one compound selected from among the following compounds:

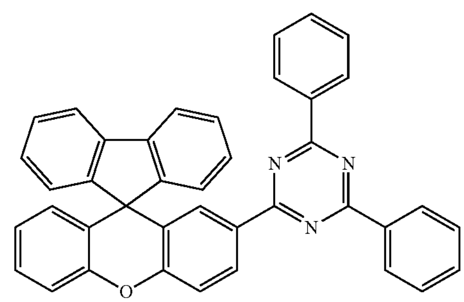

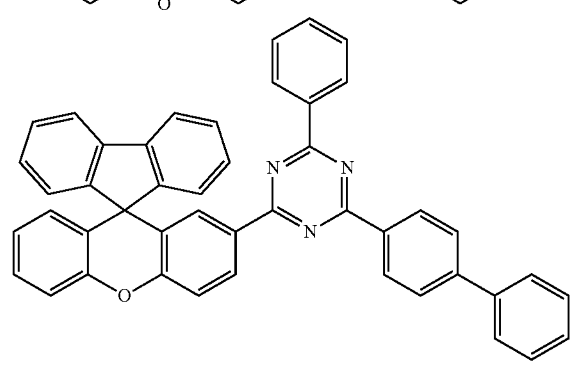

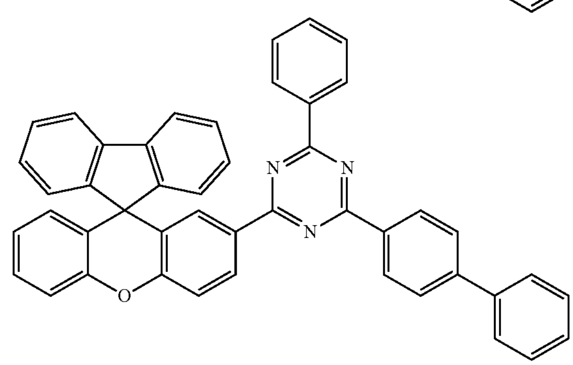

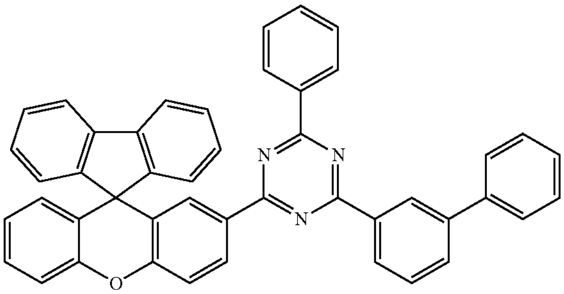
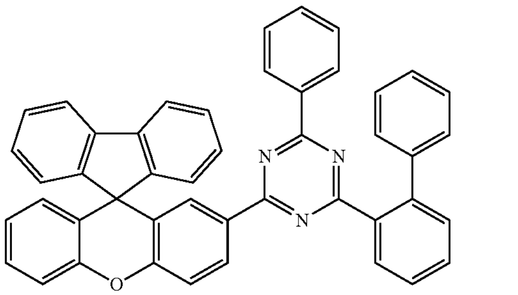
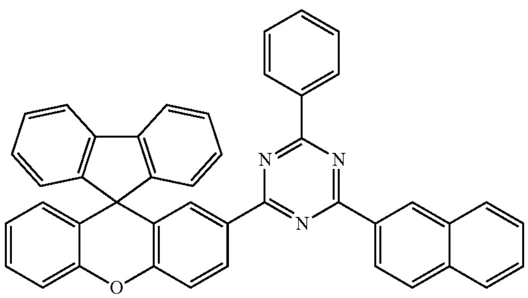
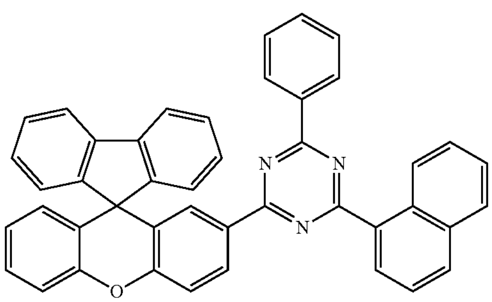
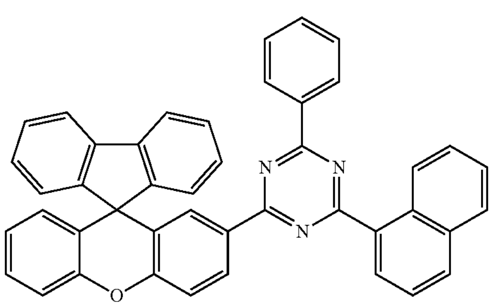
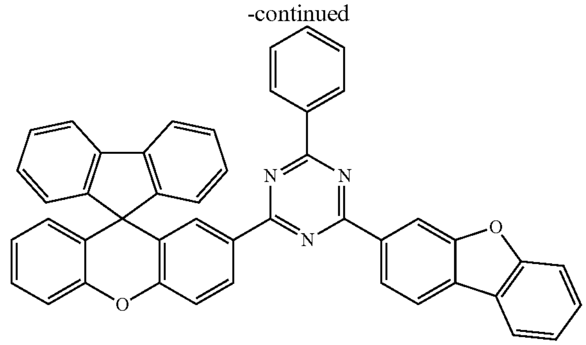
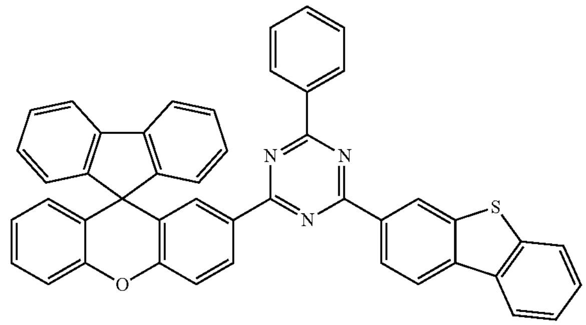
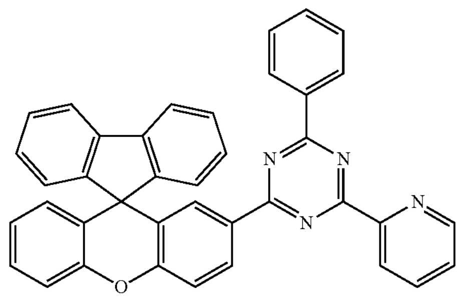
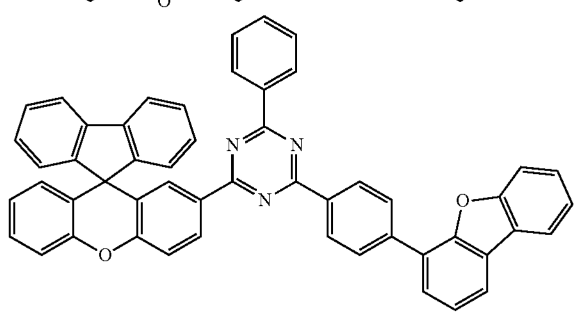
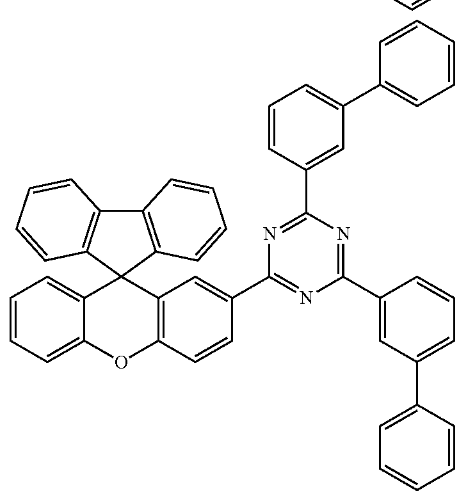

-continued
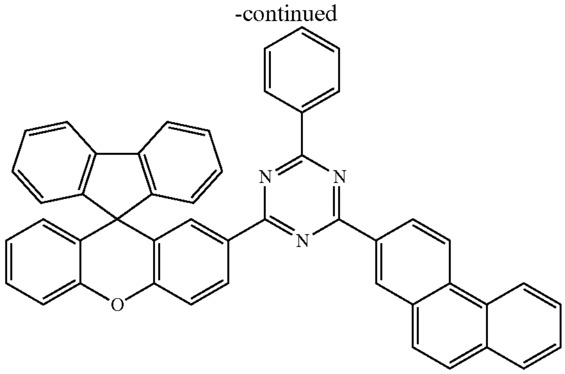
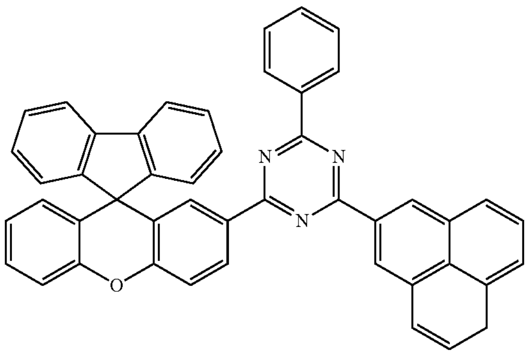
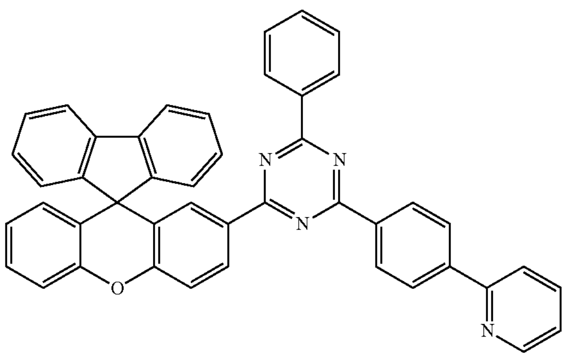
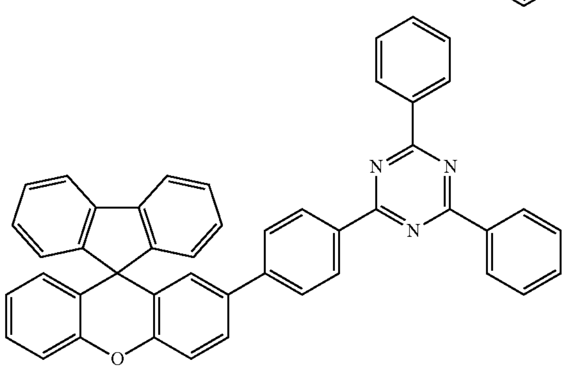
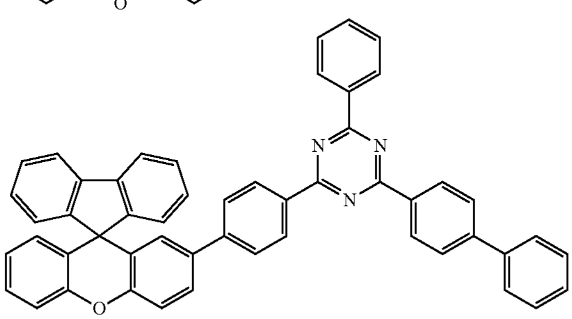
-continued
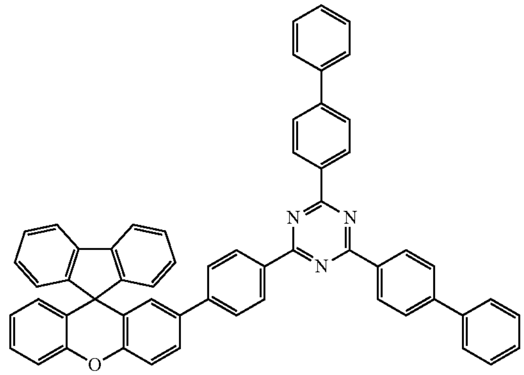
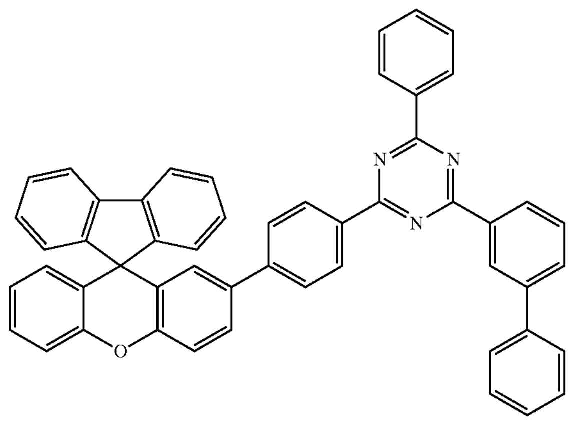
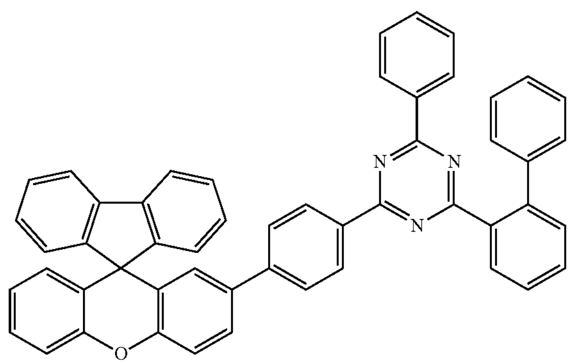
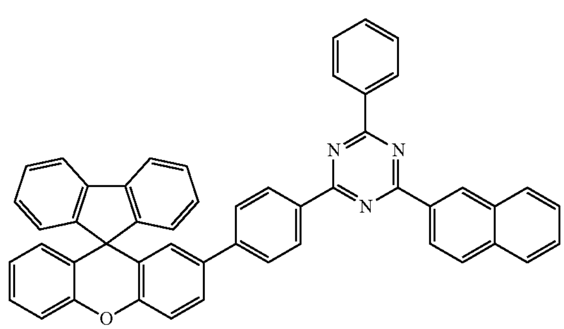

-continued
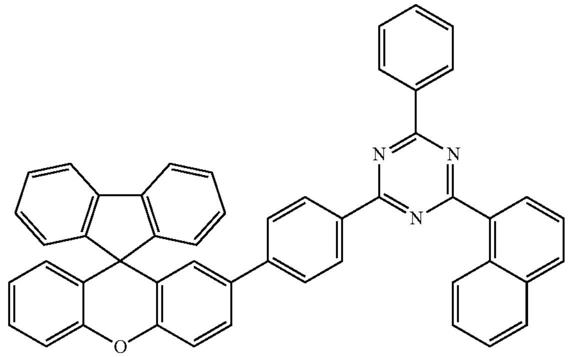
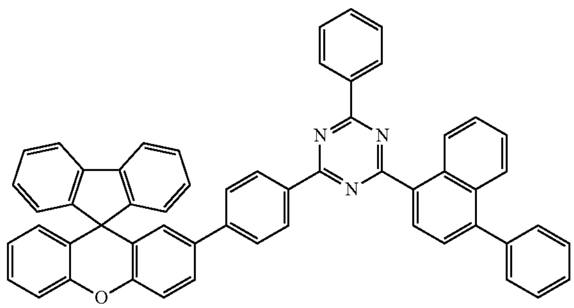
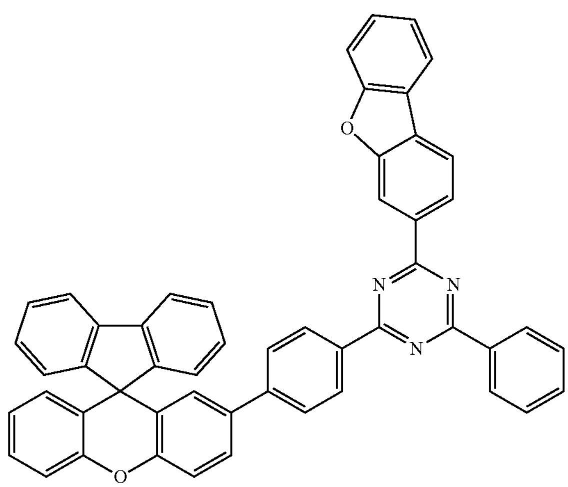
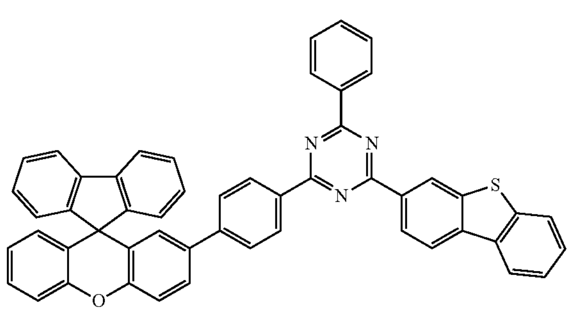
-continued
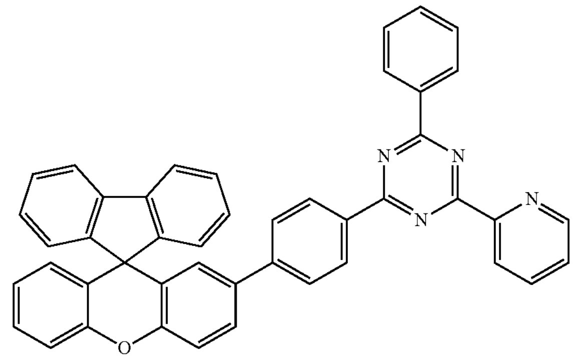
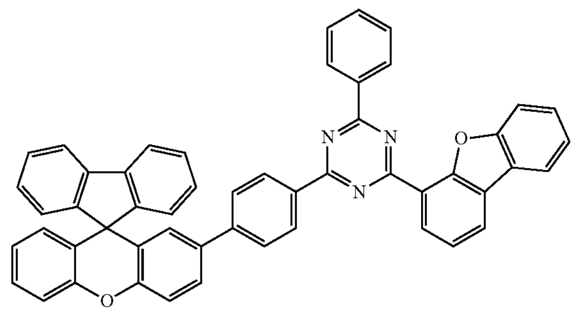
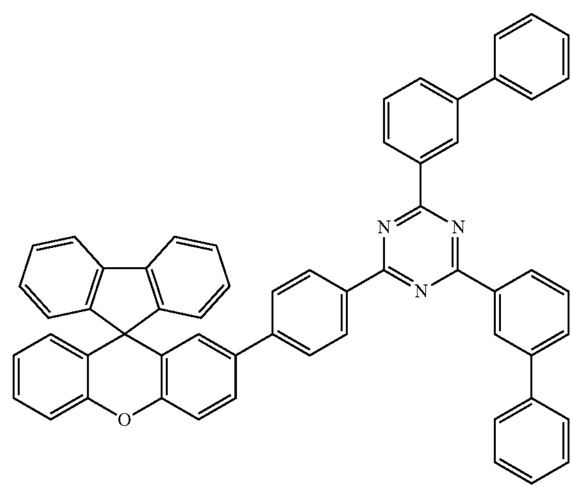
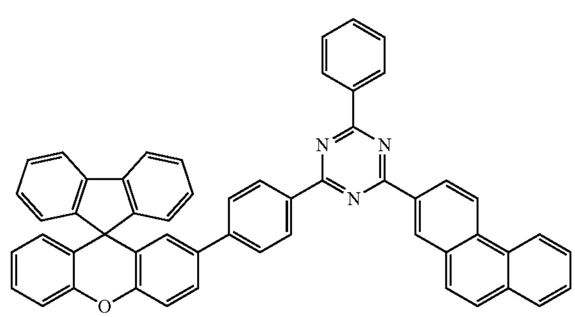

-continued
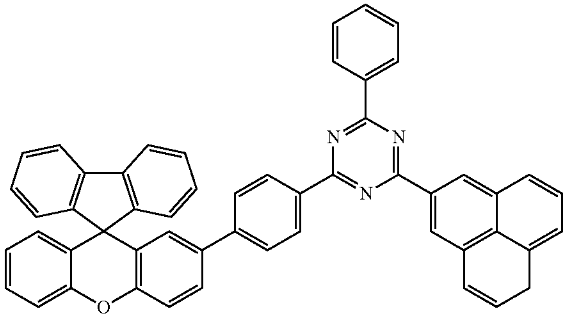
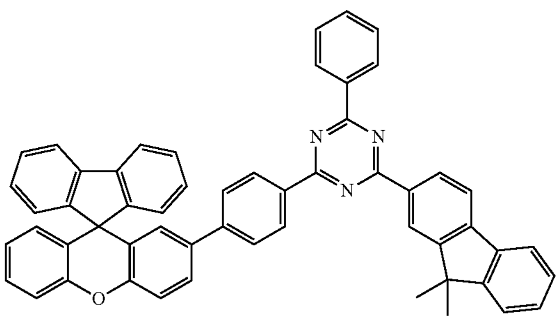
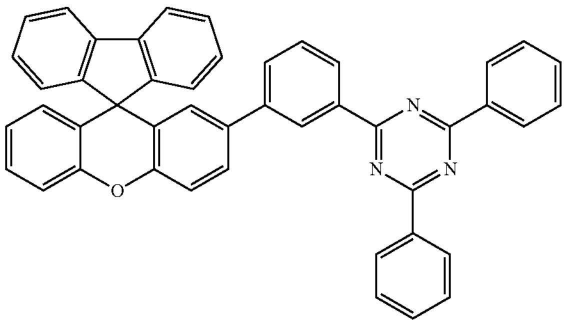
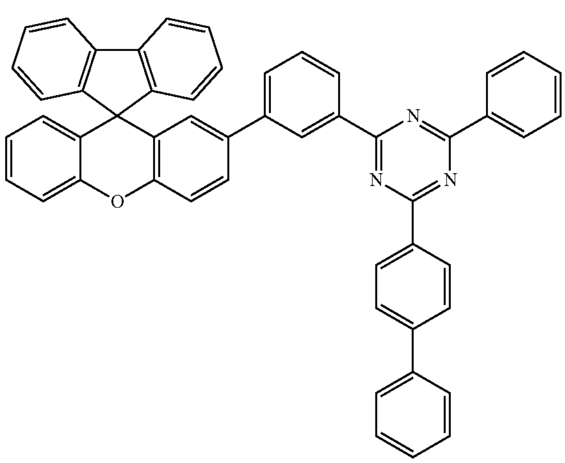
-continued
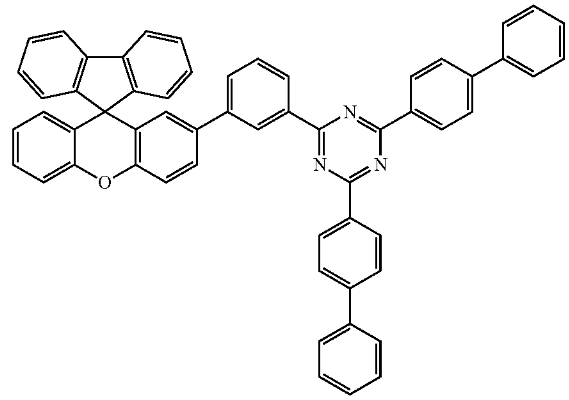
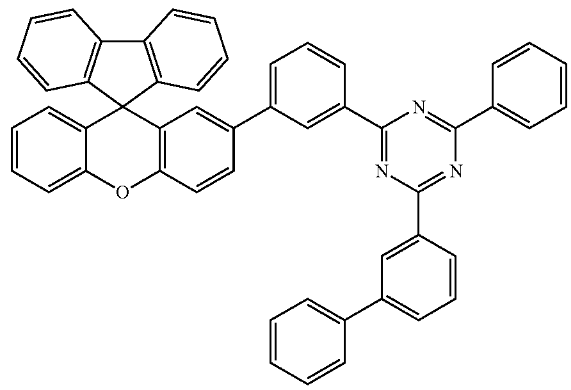
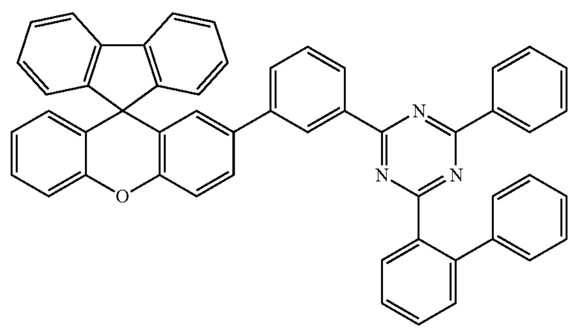
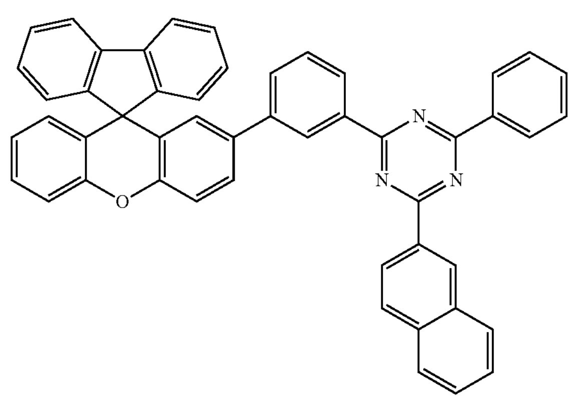

-continued
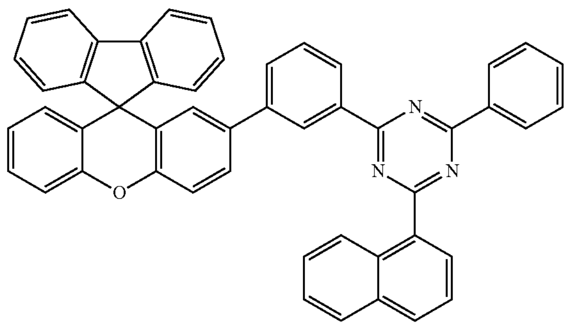
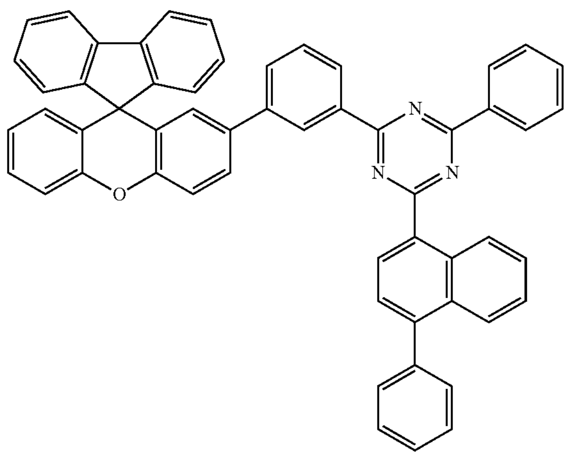
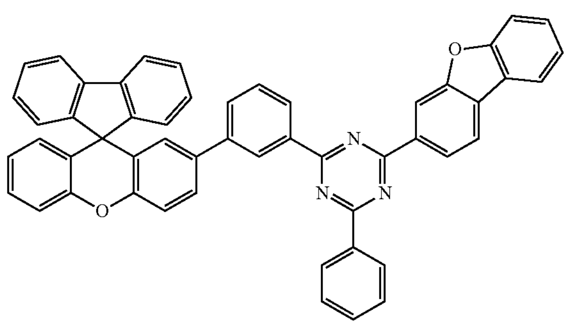
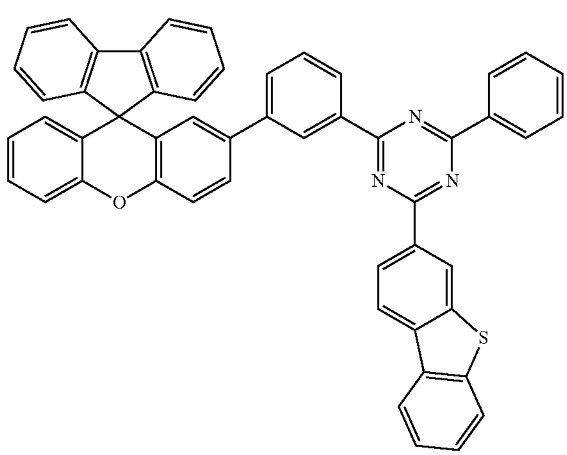
-continued
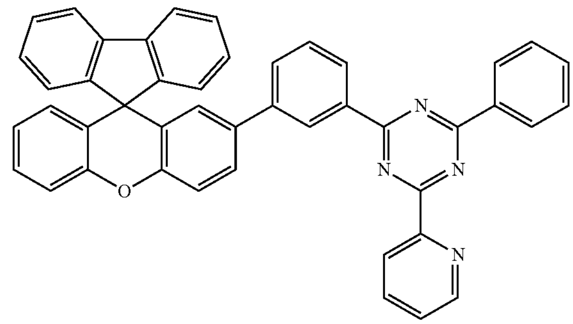
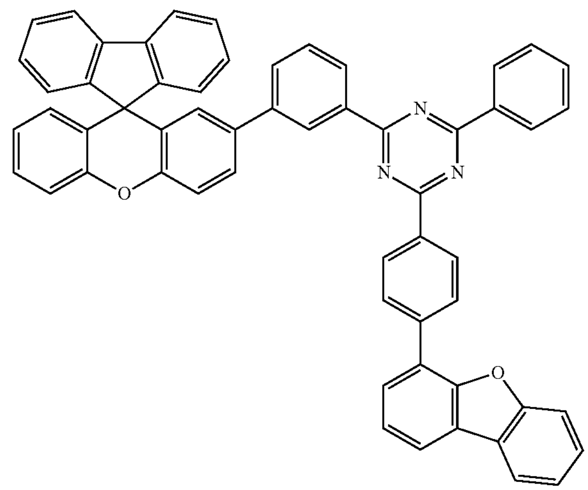
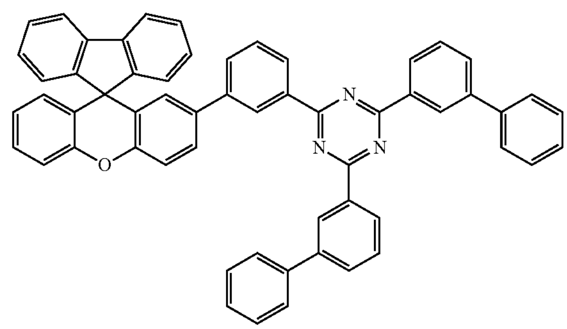
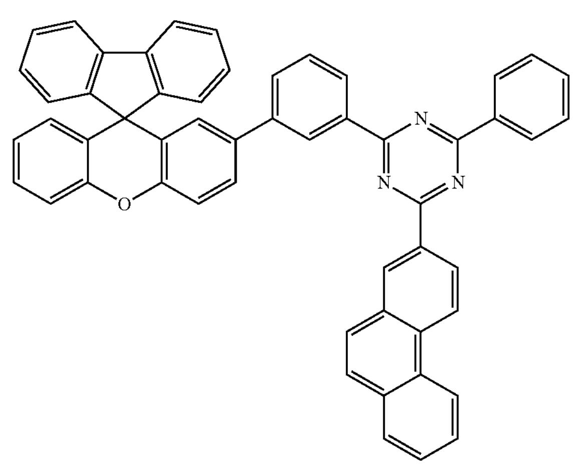

-continued
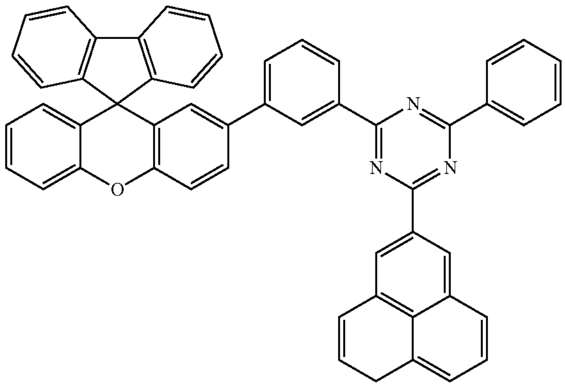
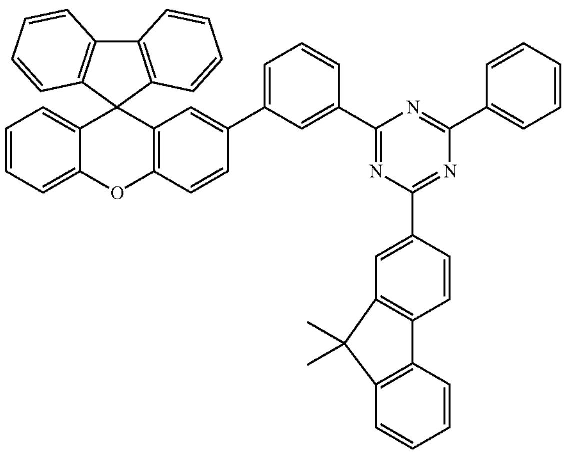
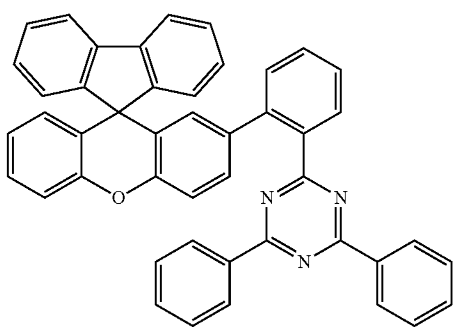
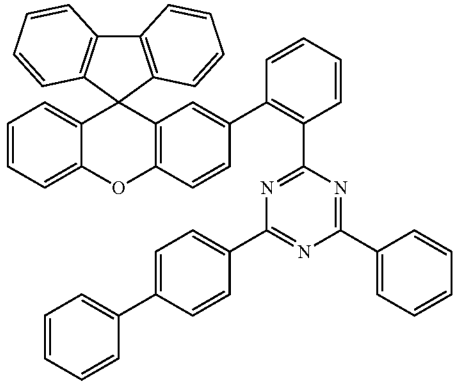
-continued
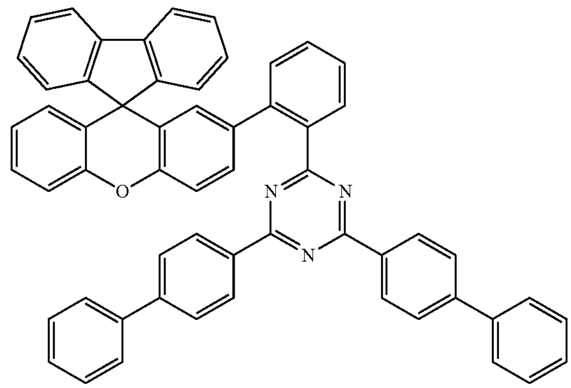
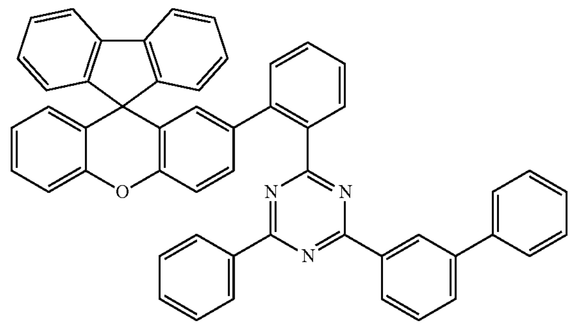
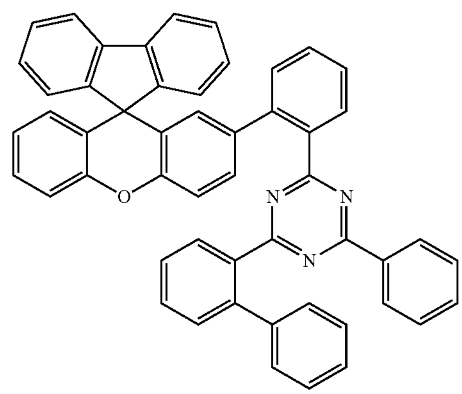
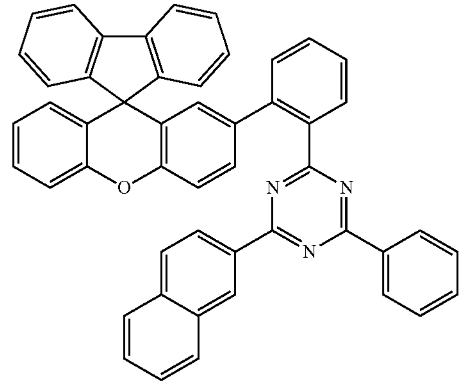

-continued
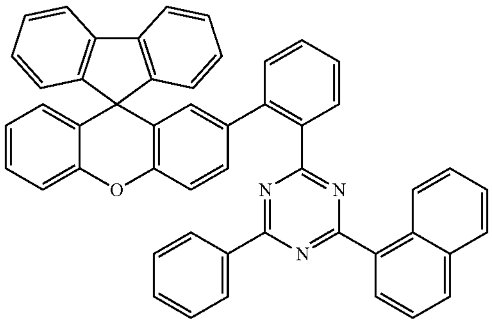
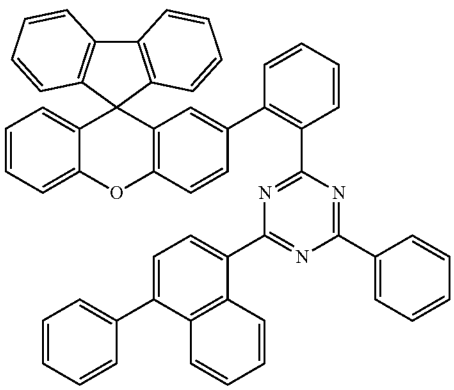
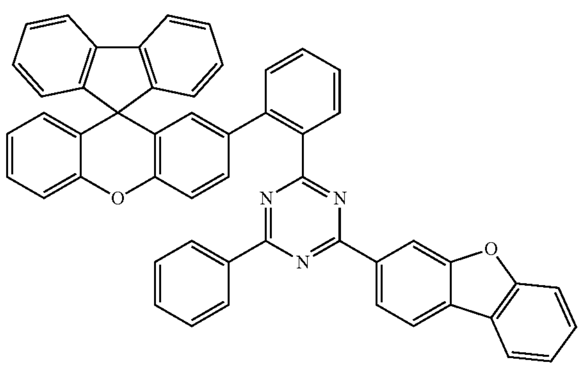
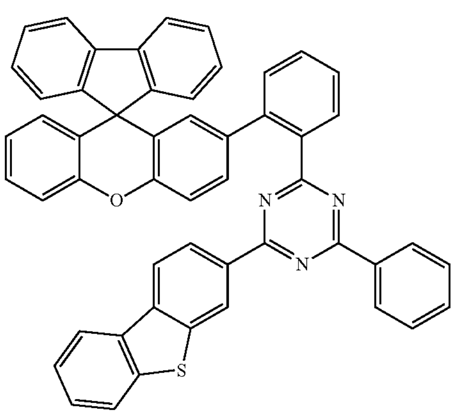
-continued
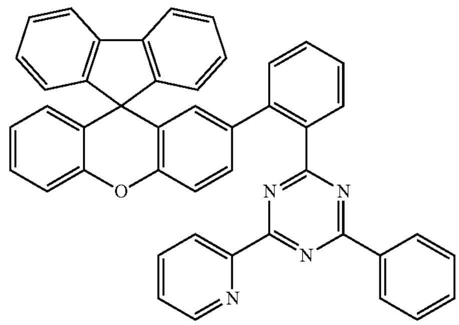
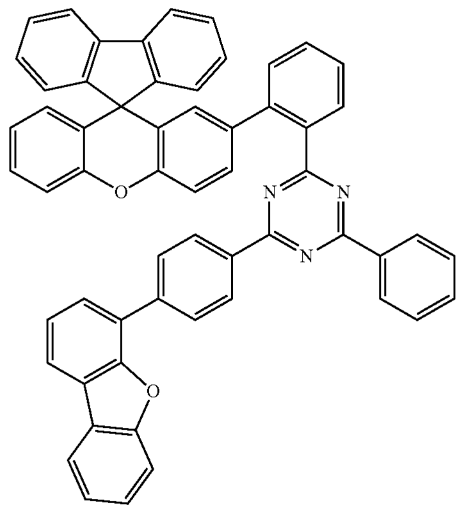
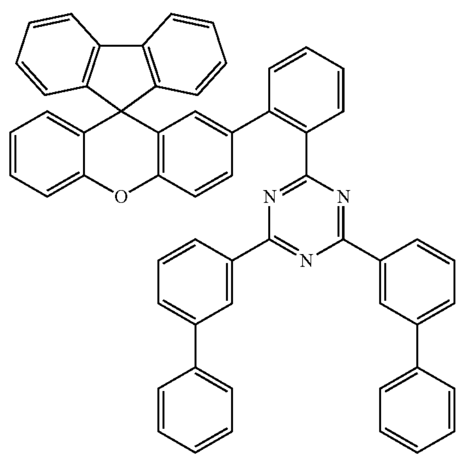
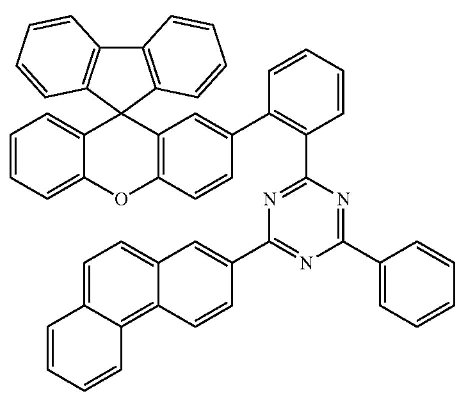

-continued
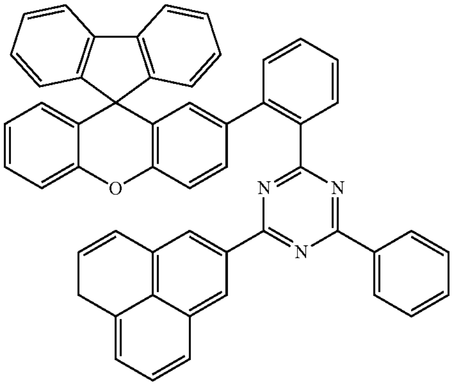
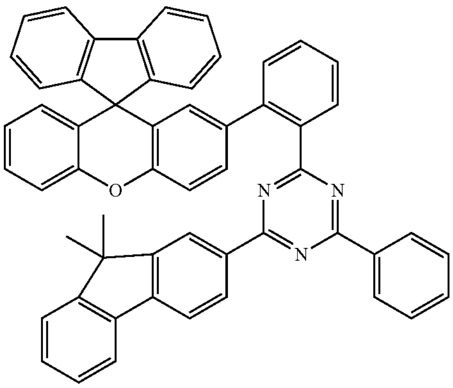
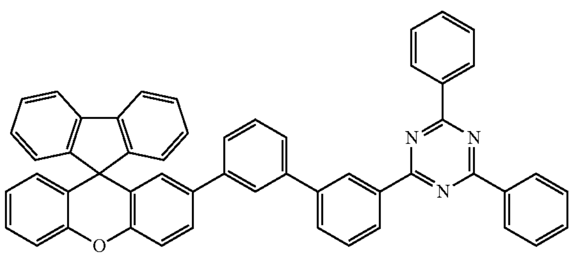
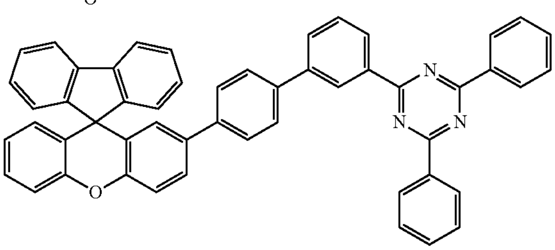
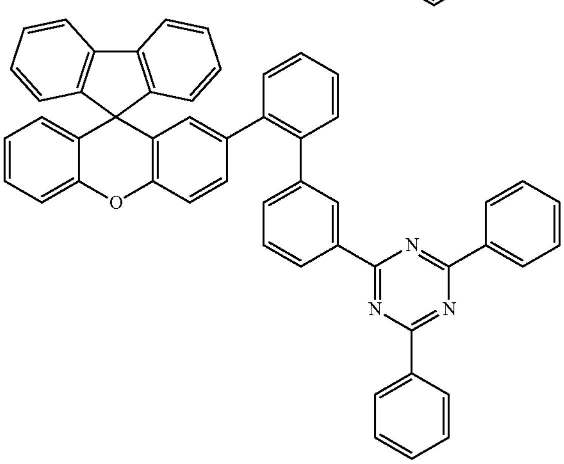
-continued
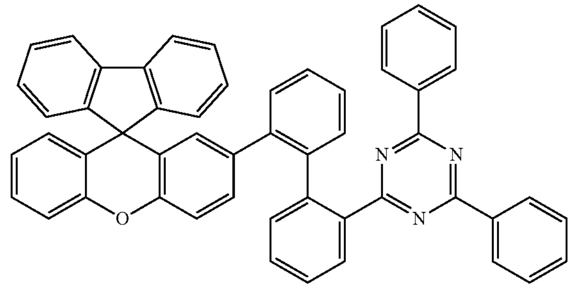
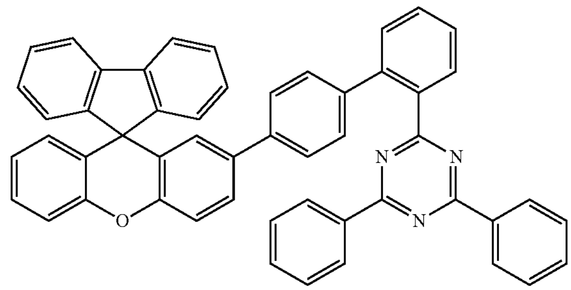
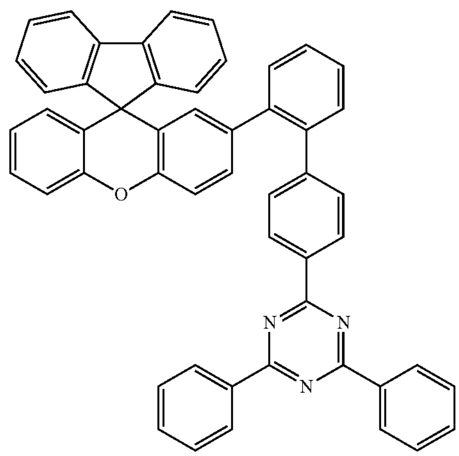
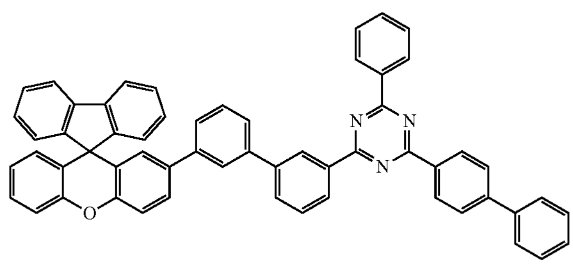
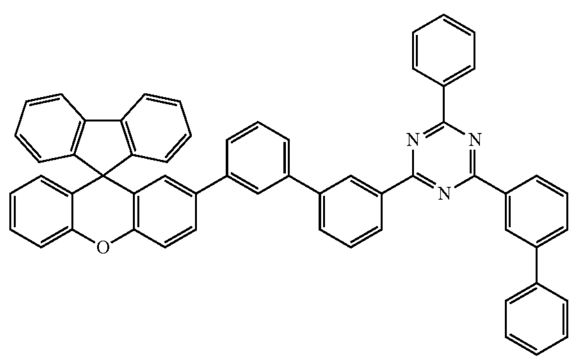

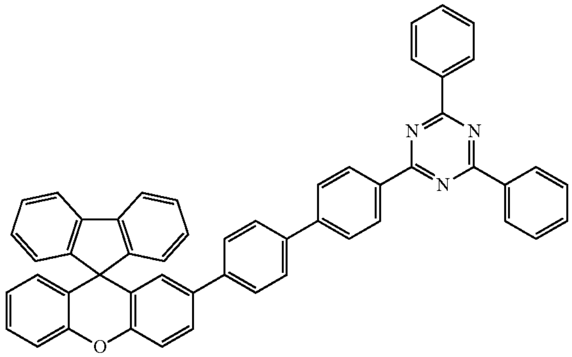
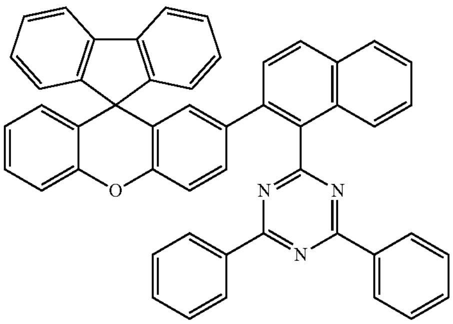
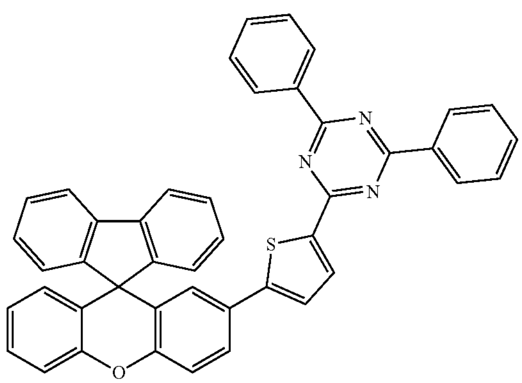
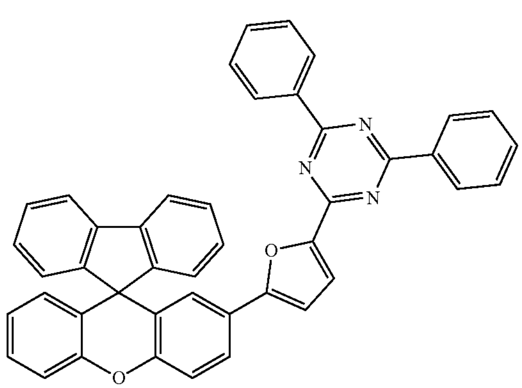
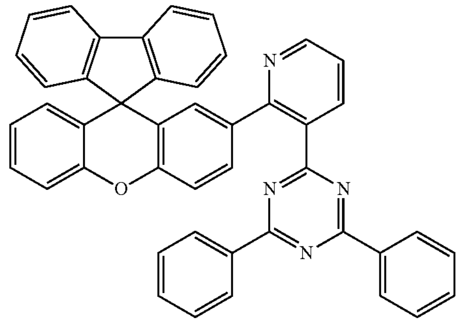
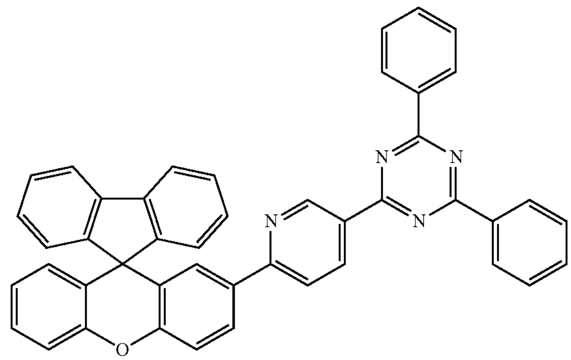
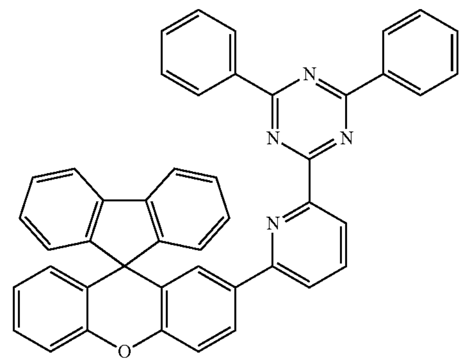
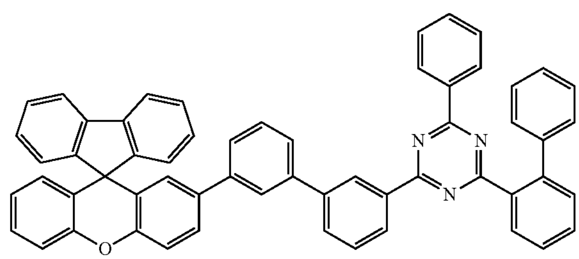
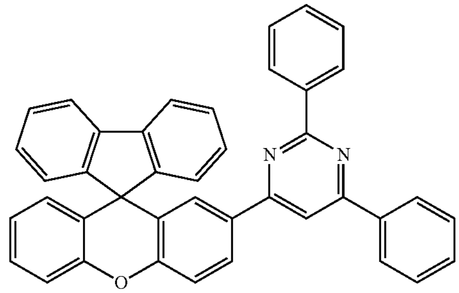

-continued
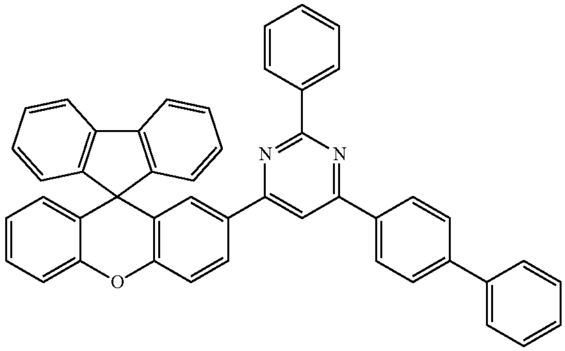
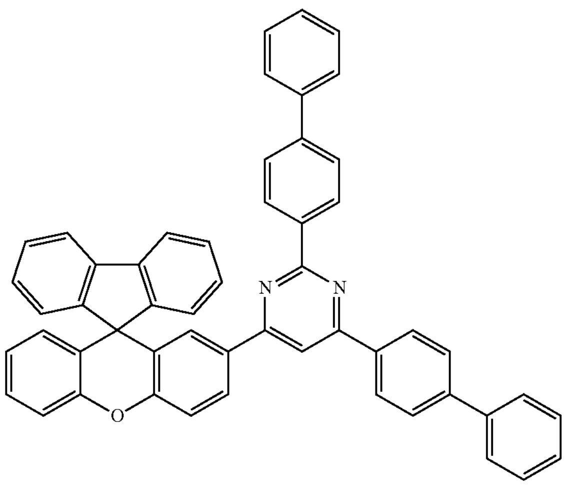
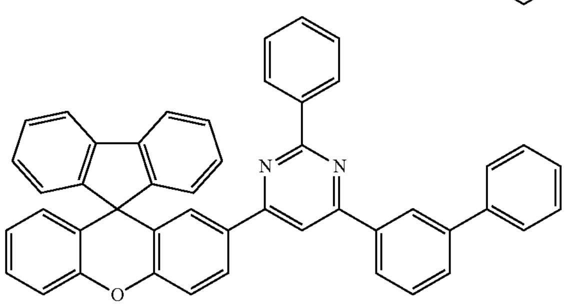
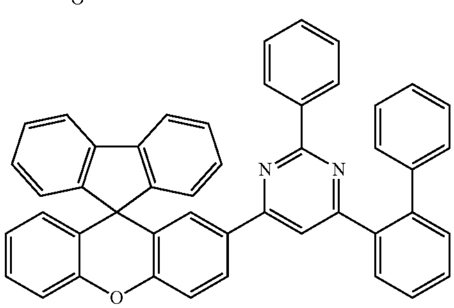
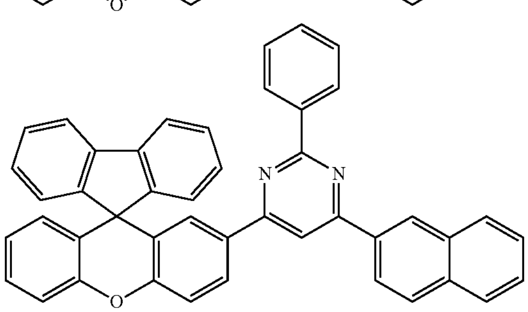
-continued
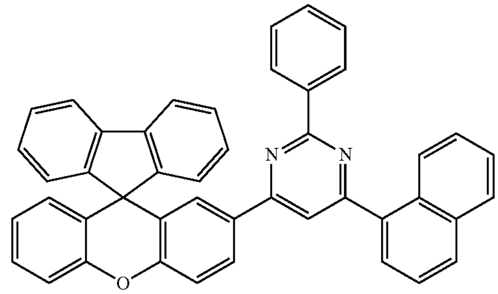
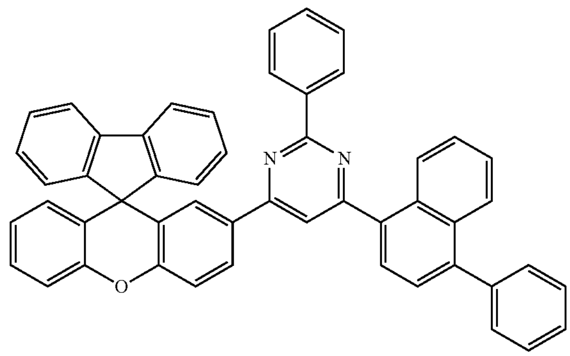
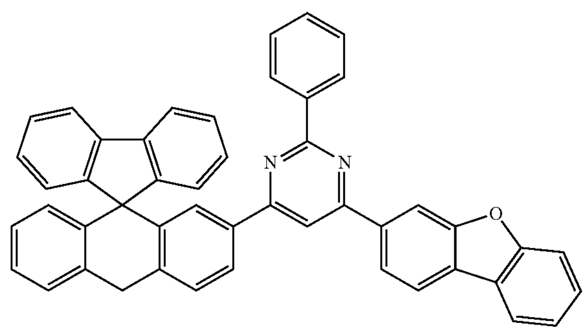
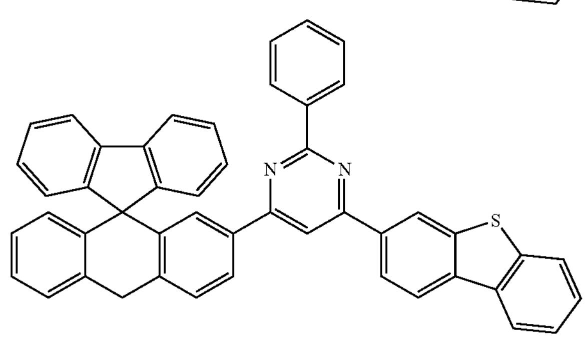
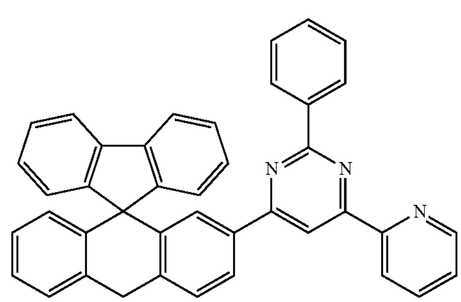

-continued
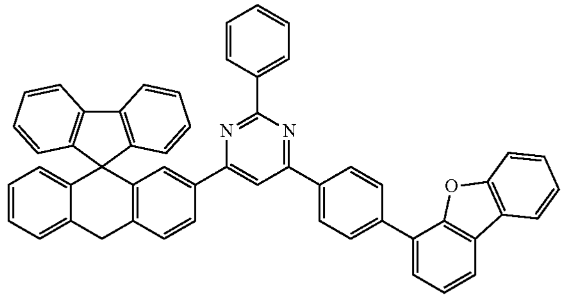
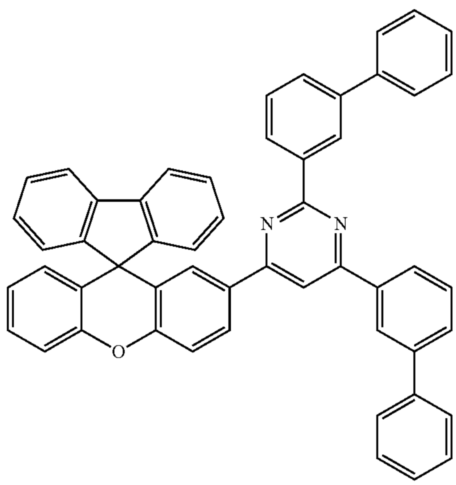
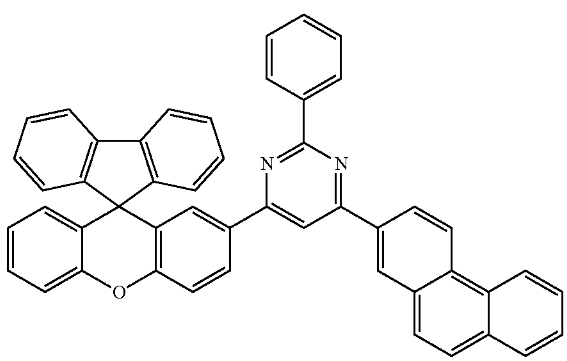
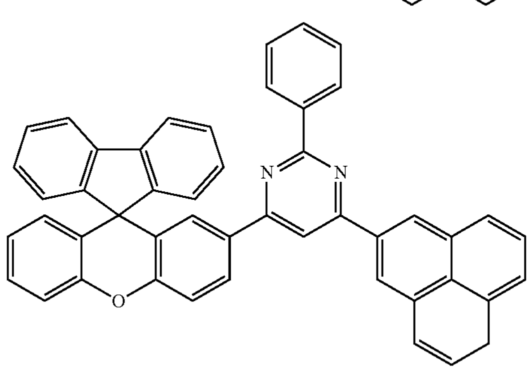
-continued
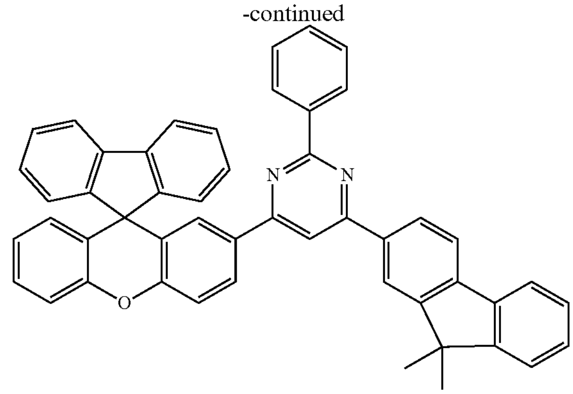
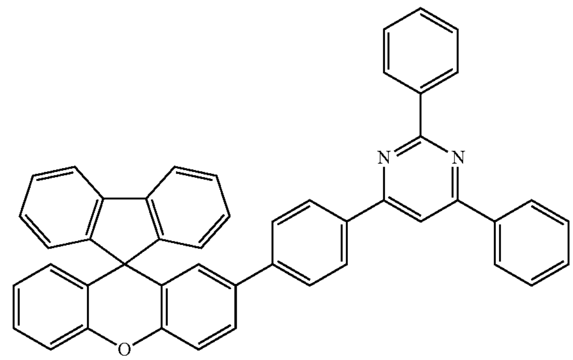
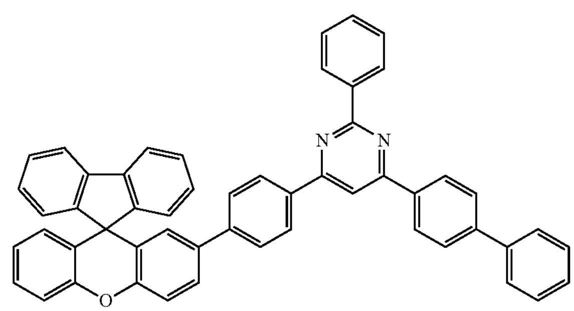
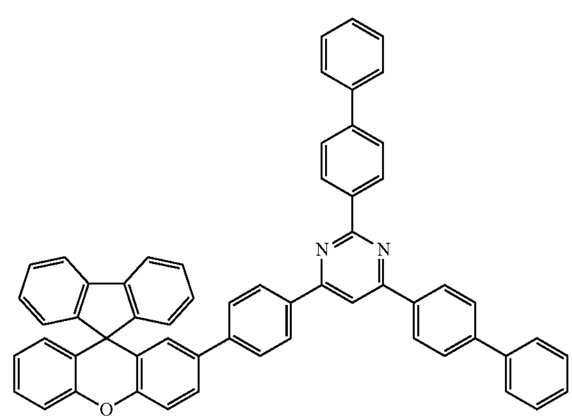

-continued
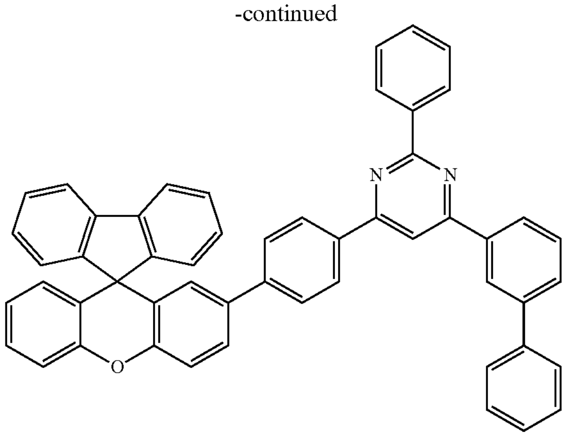
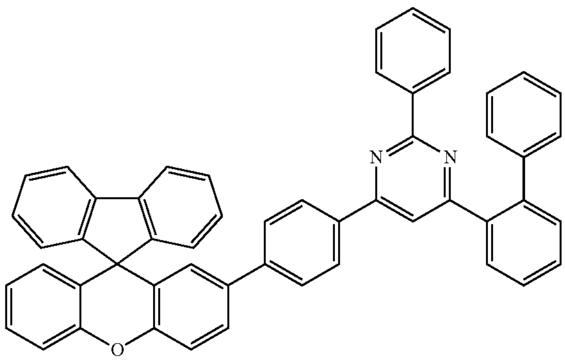
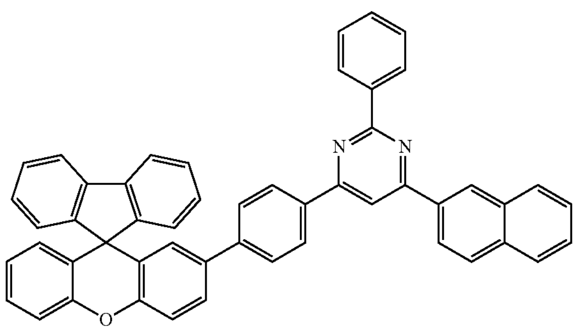
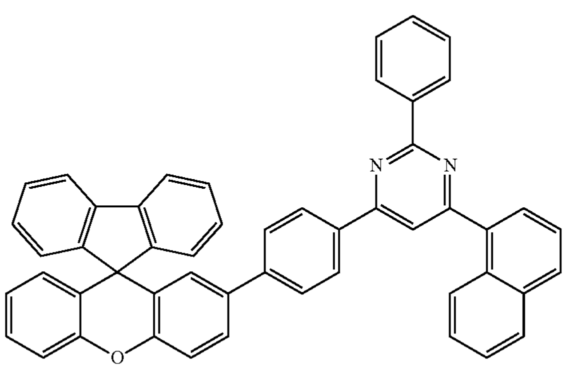
-continued
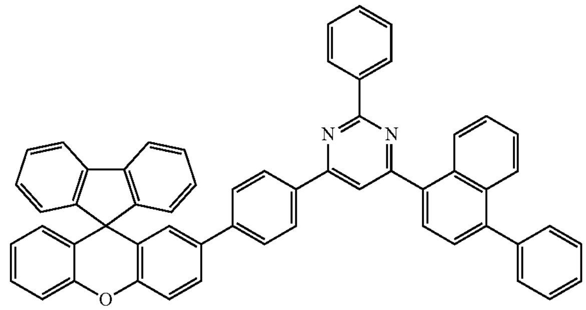
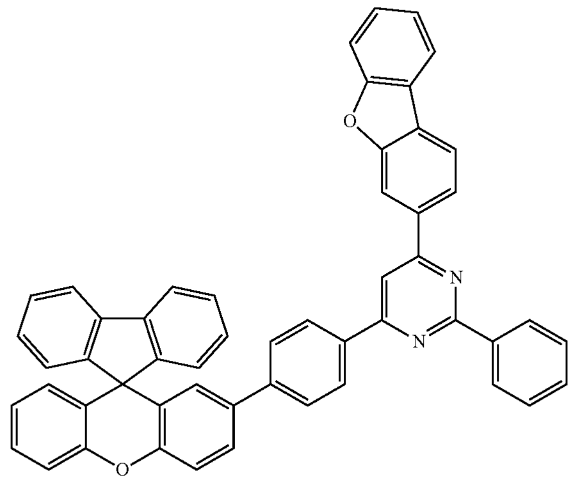
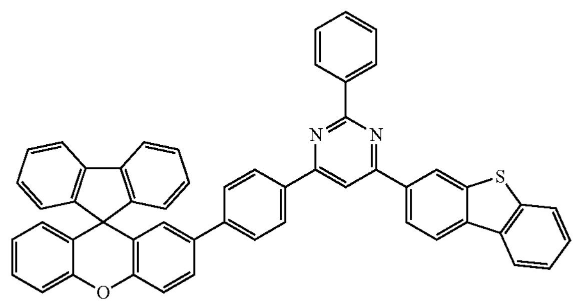
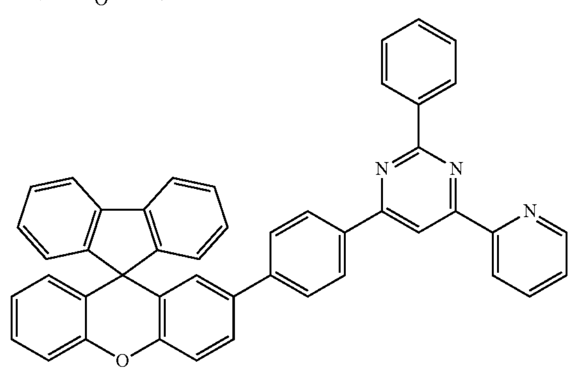
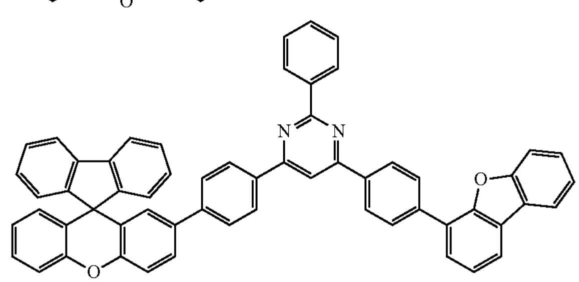

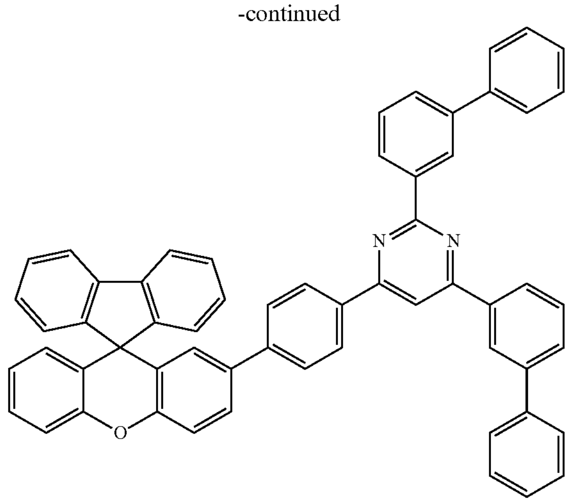
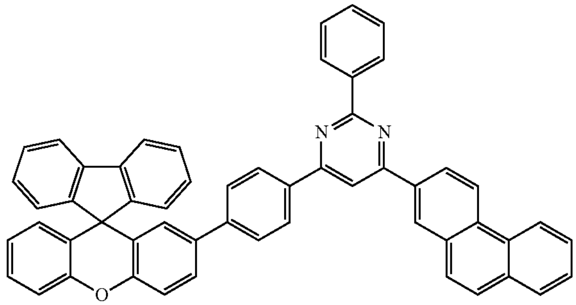
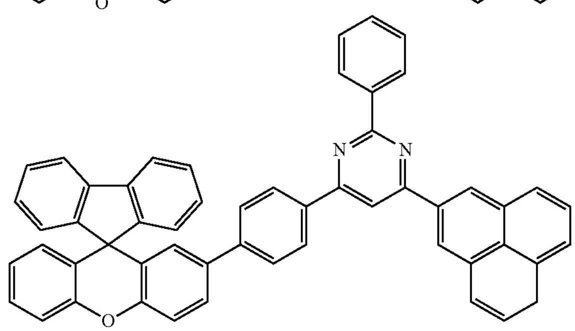
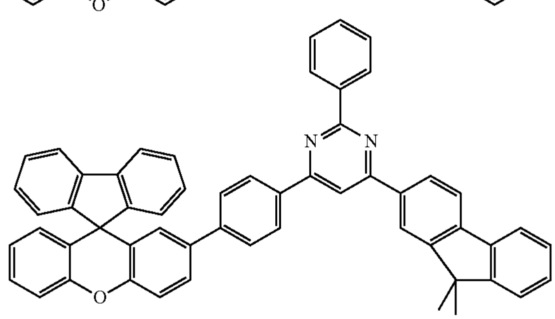
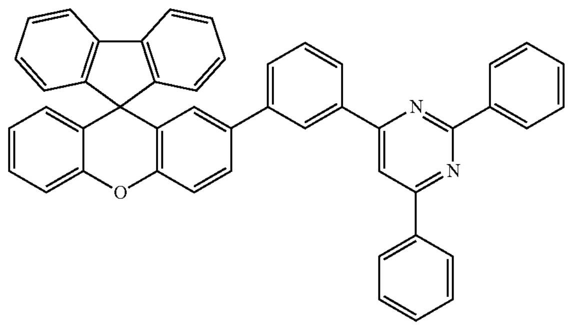
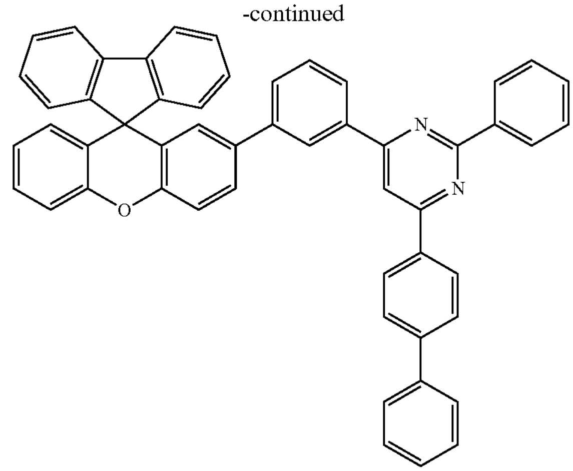
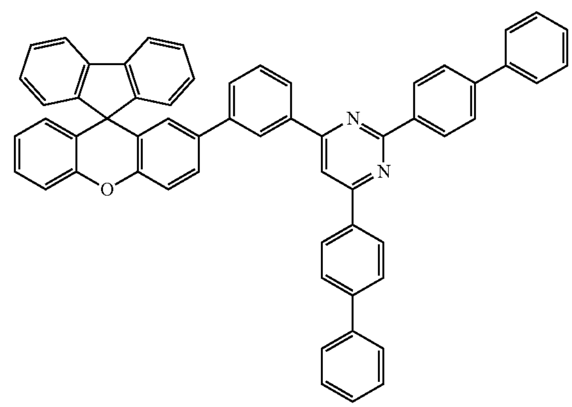
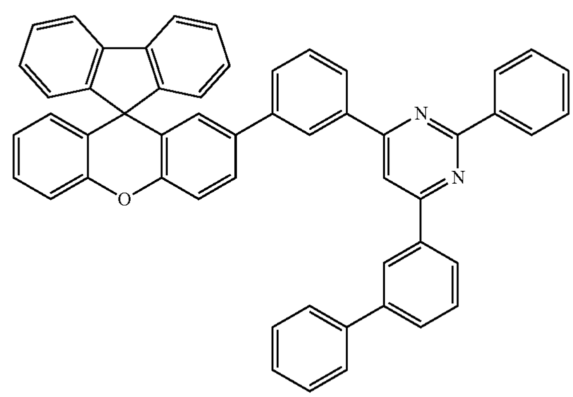
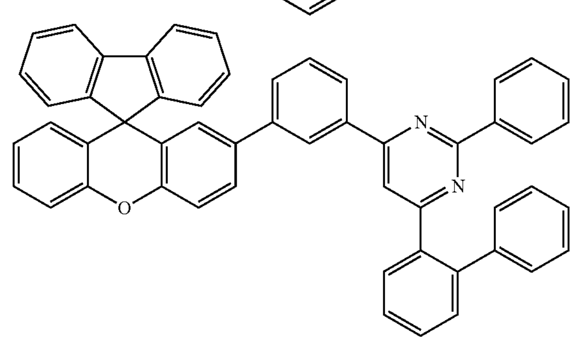

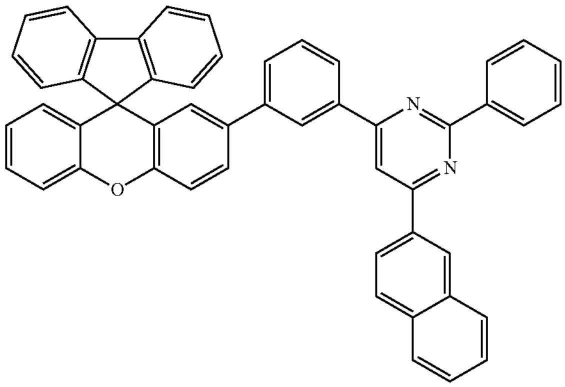
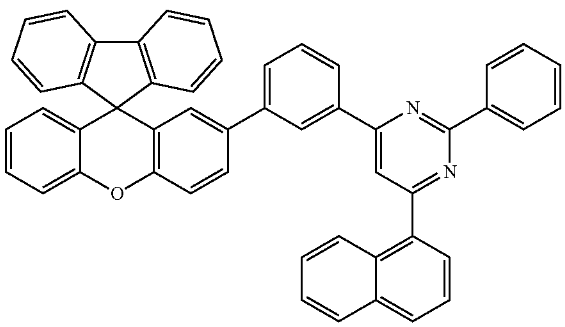
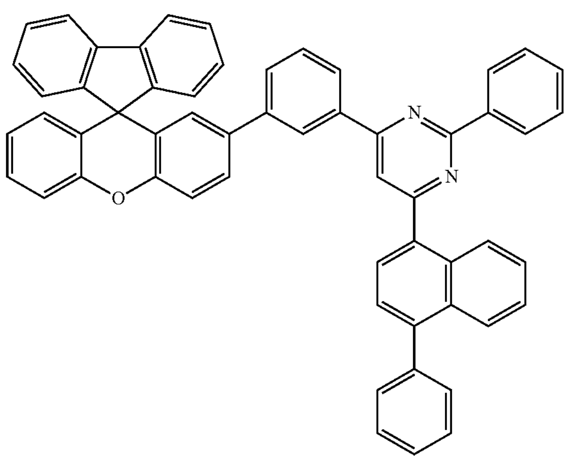
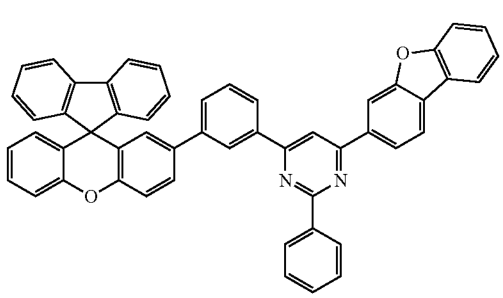
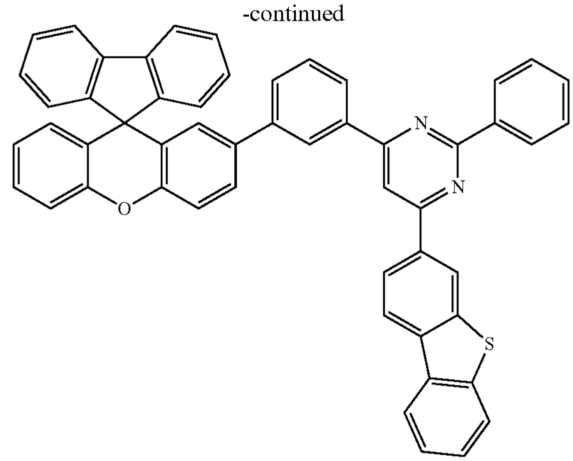
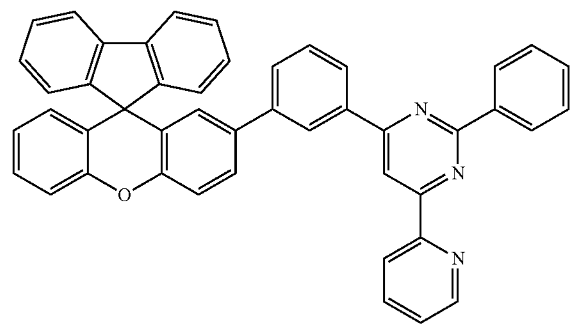
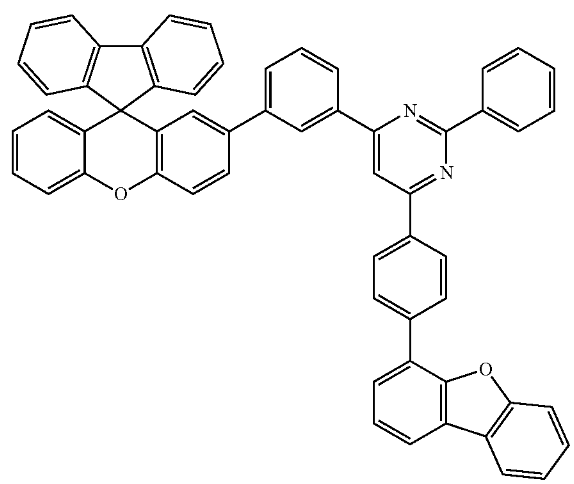
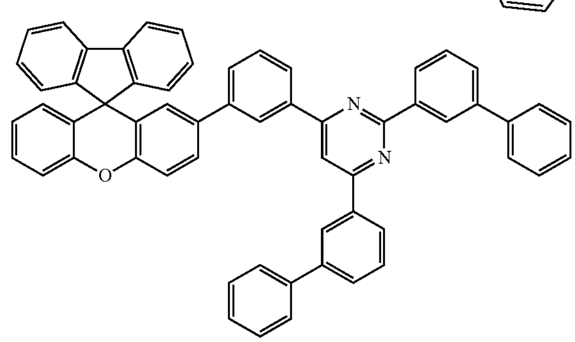

-continued
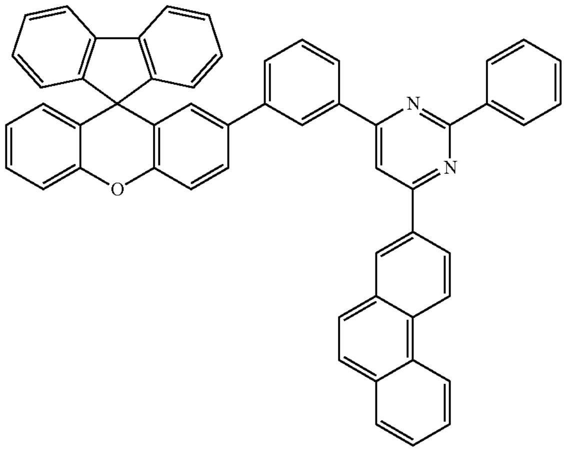
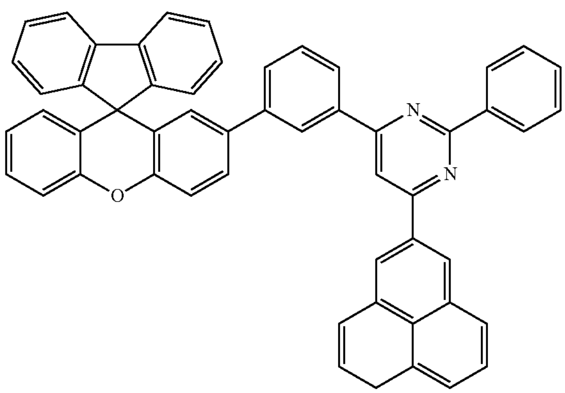
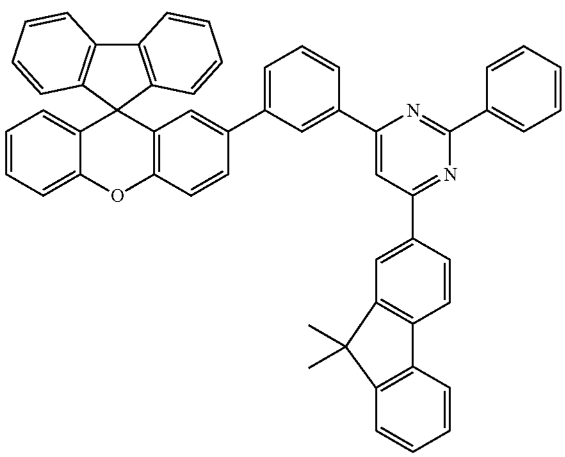
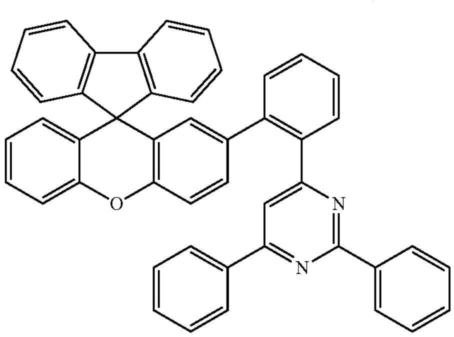
-continued
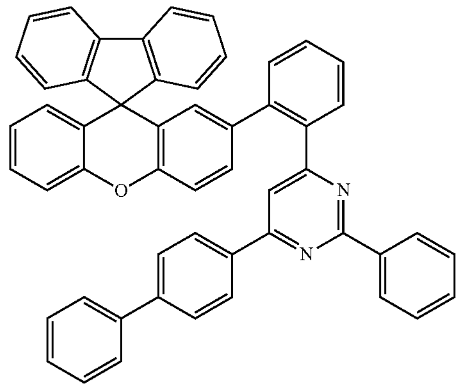
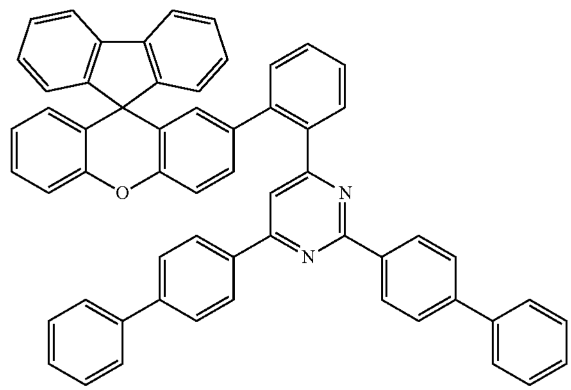
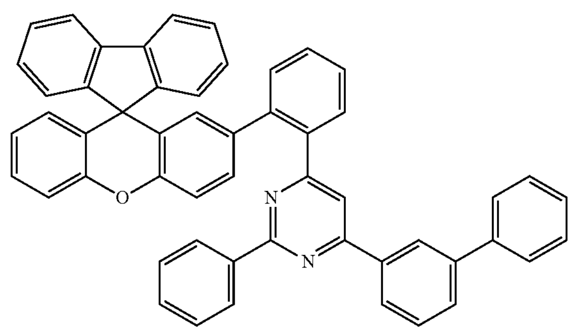
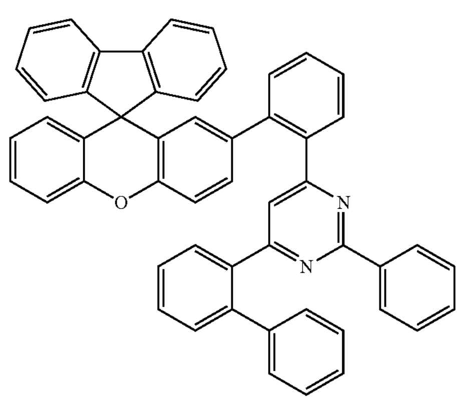

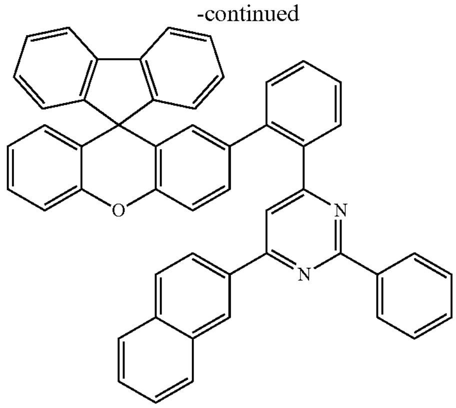
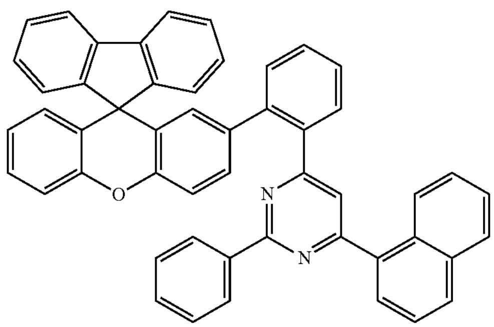
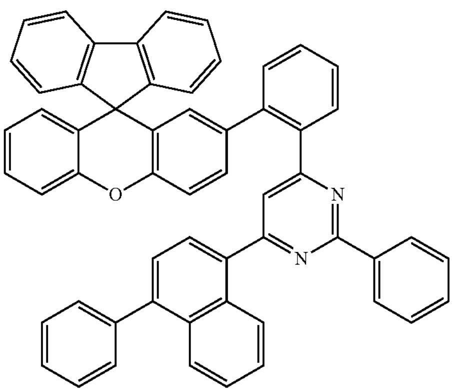
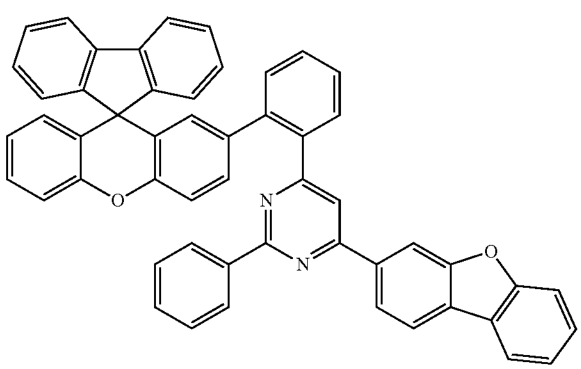
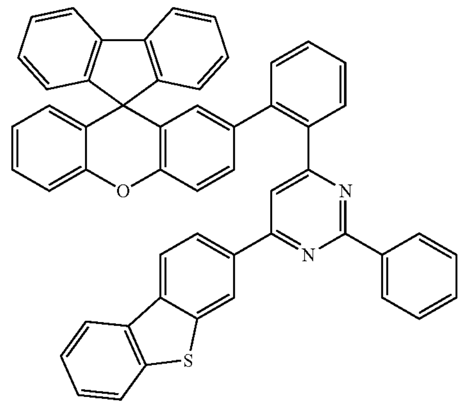
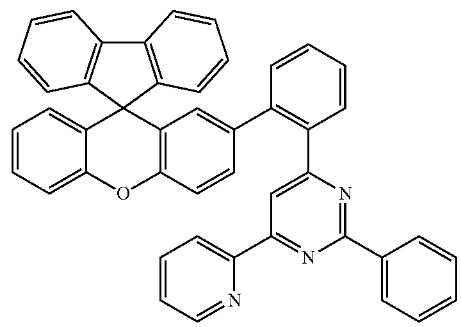
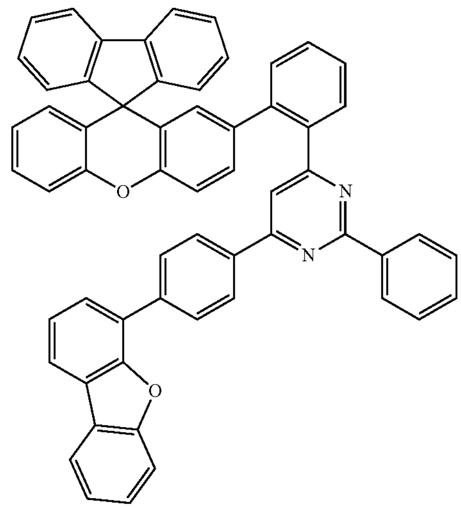
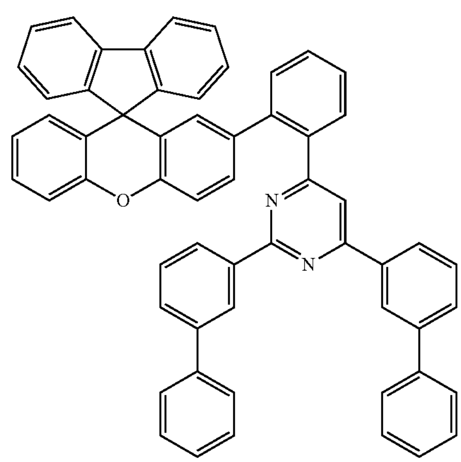

-continued
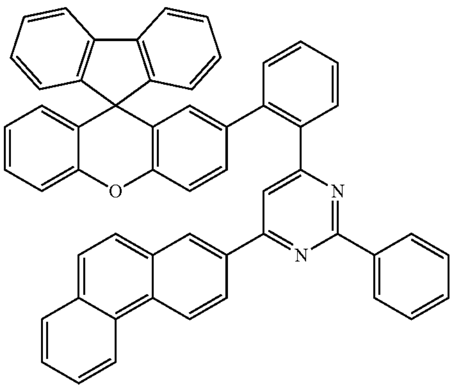
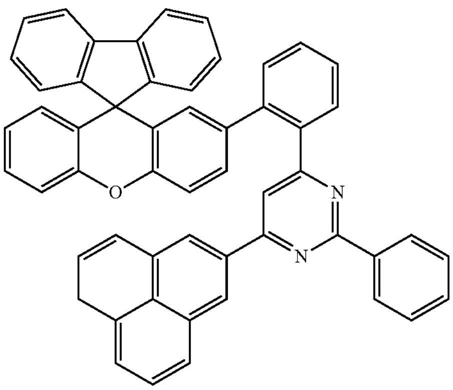
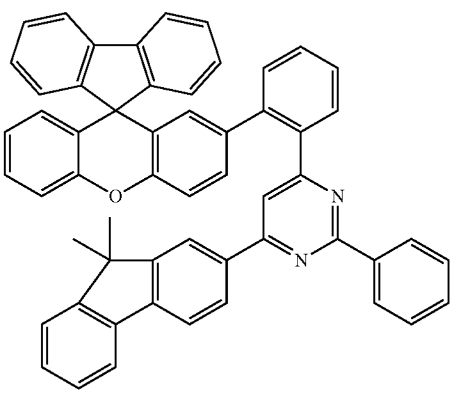
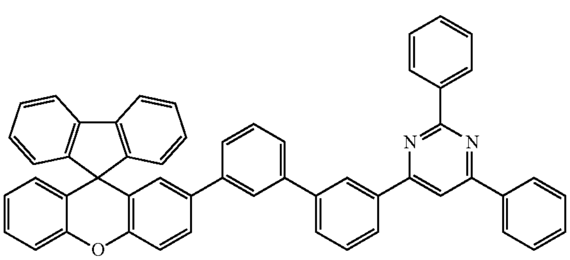
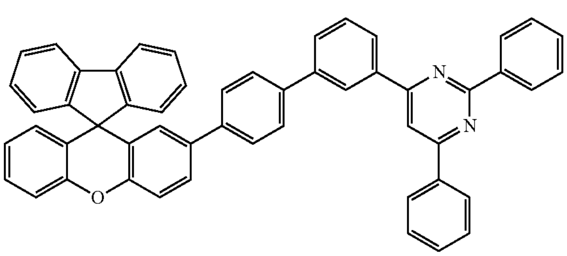
-continued
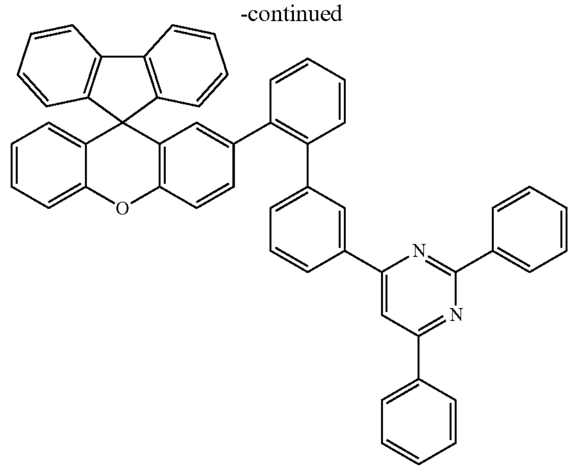
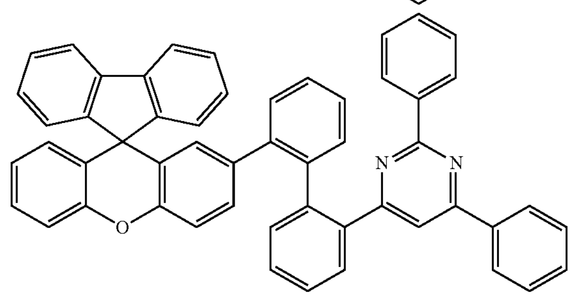
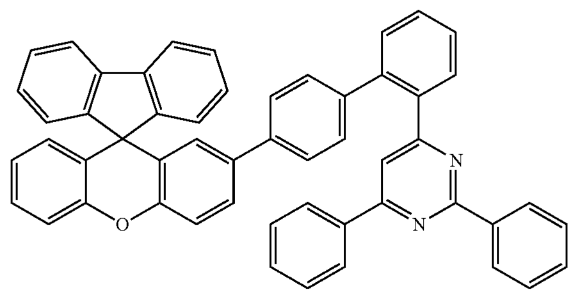
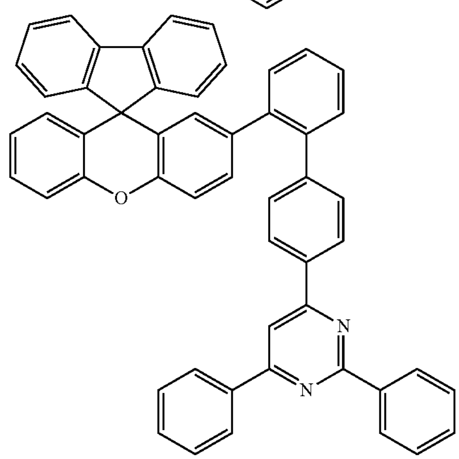
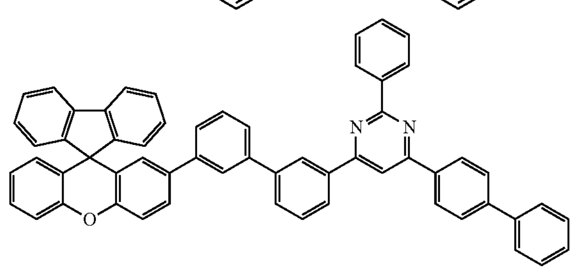

-continued
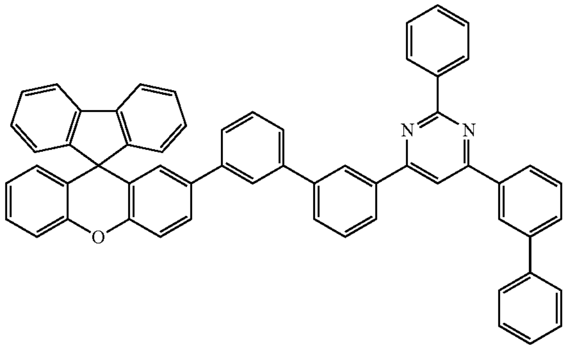
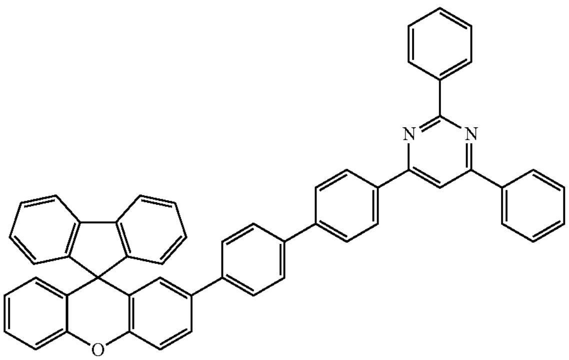
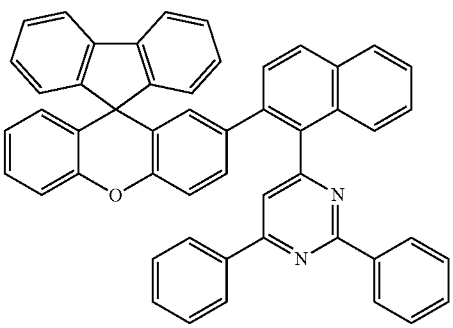
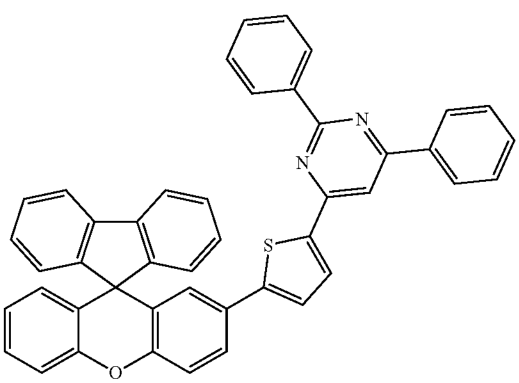
-continued
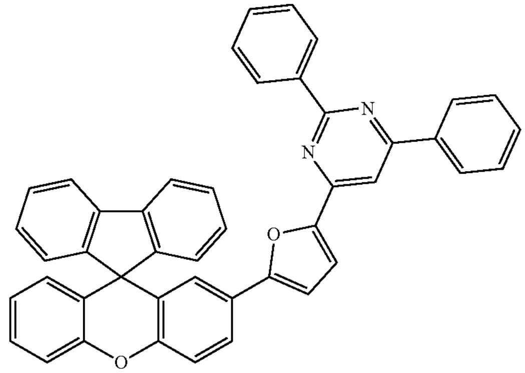
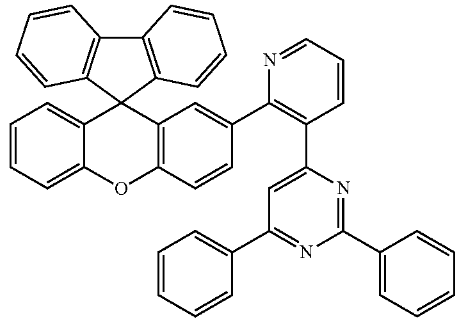
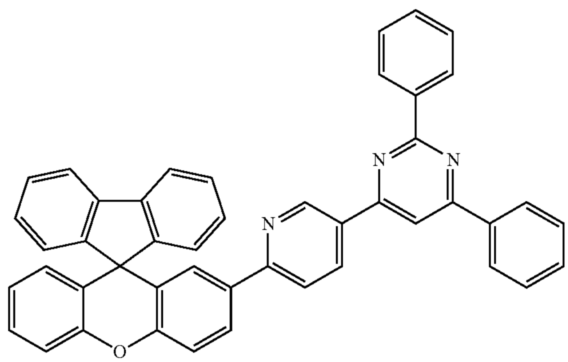
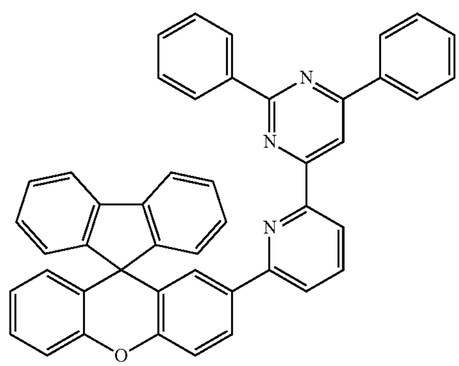
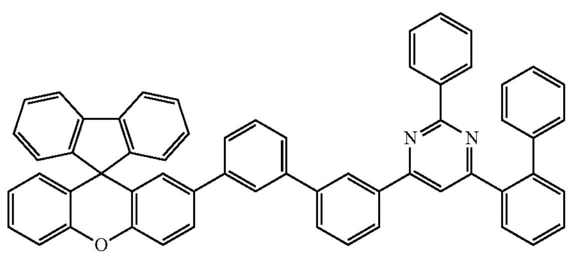

-continued
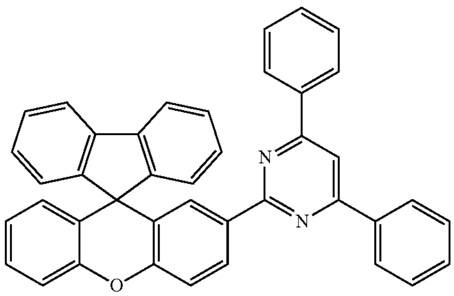
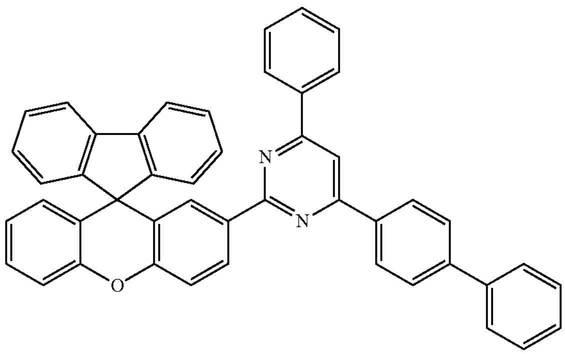
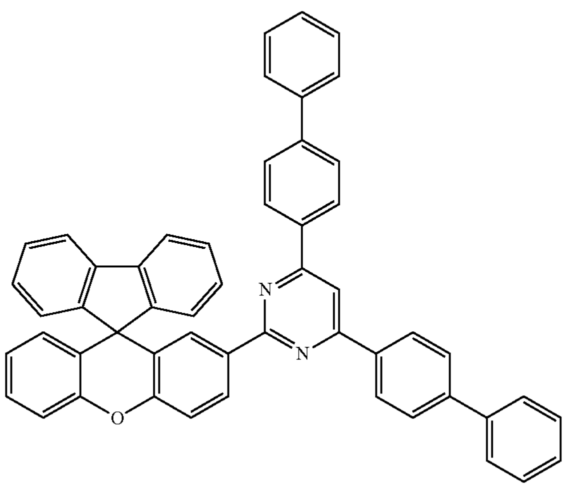
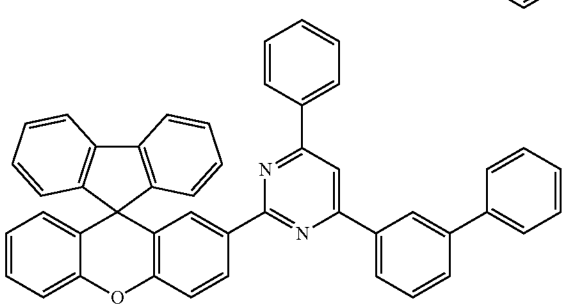
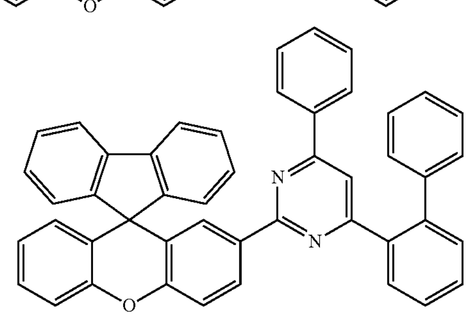
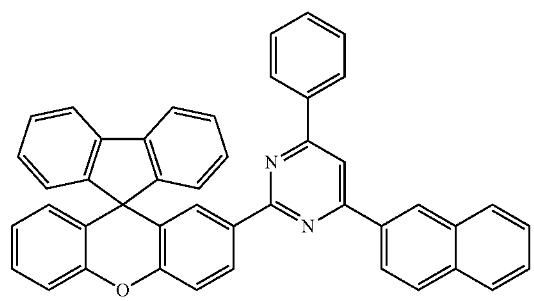
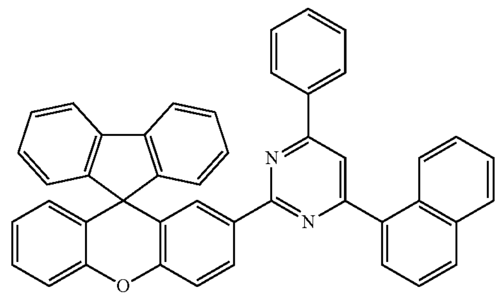
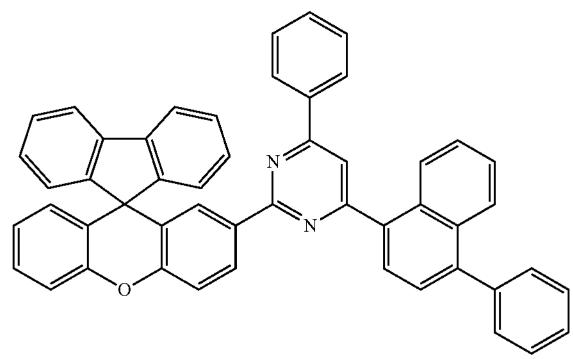
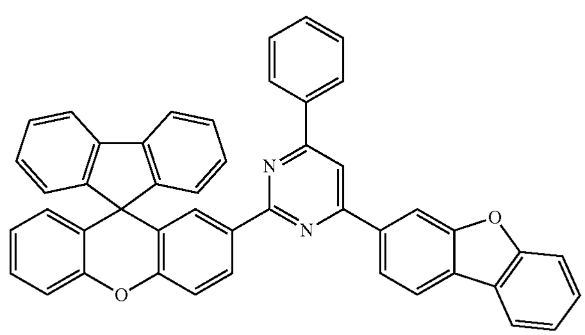
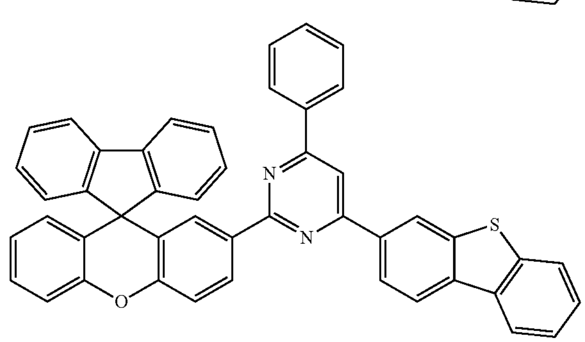

-continued
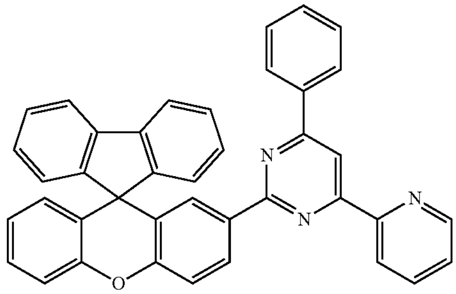
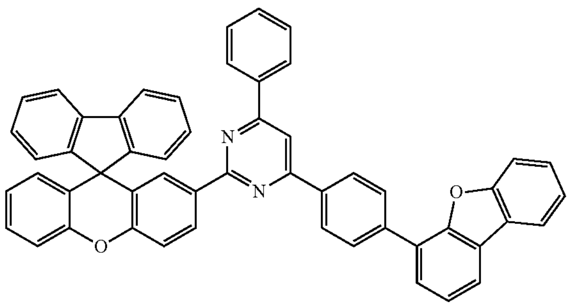
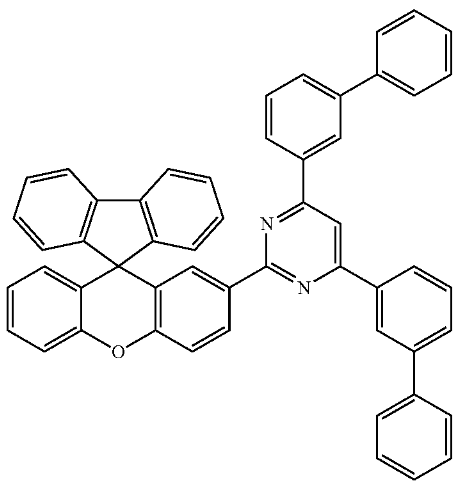
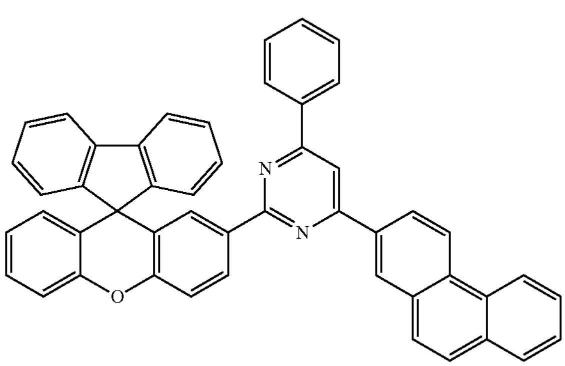
-continued
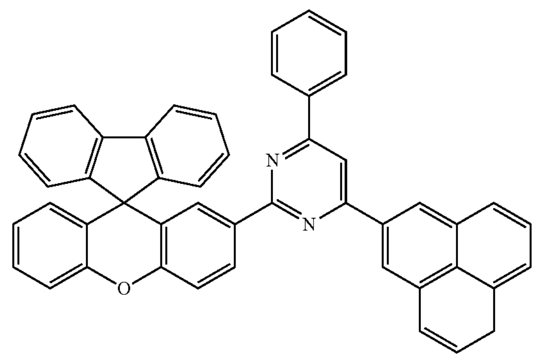
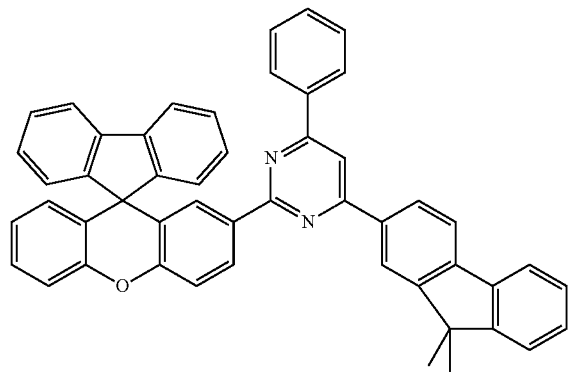
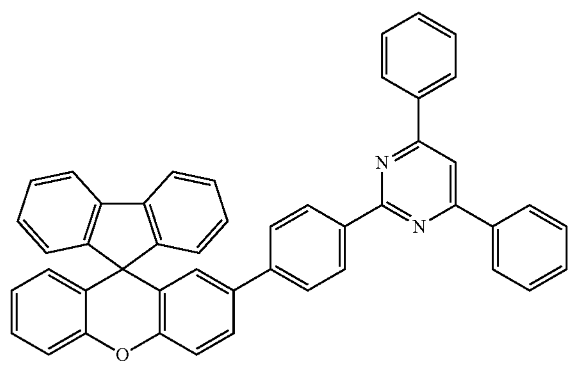
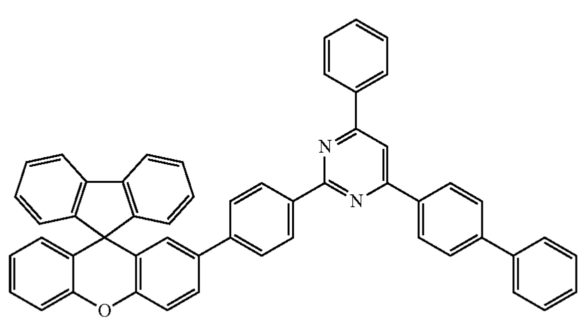

-continued
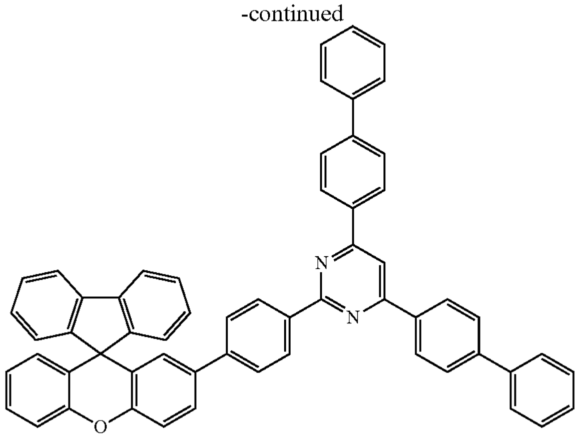
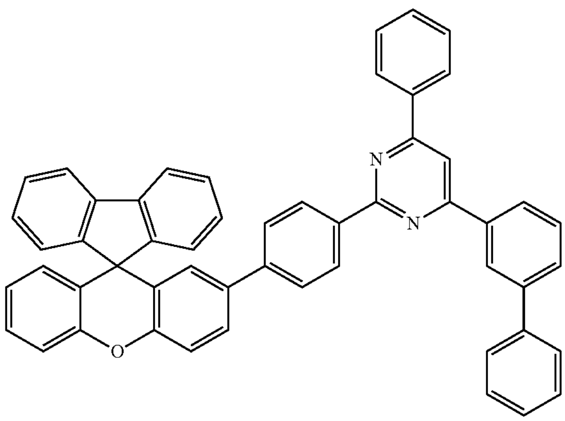
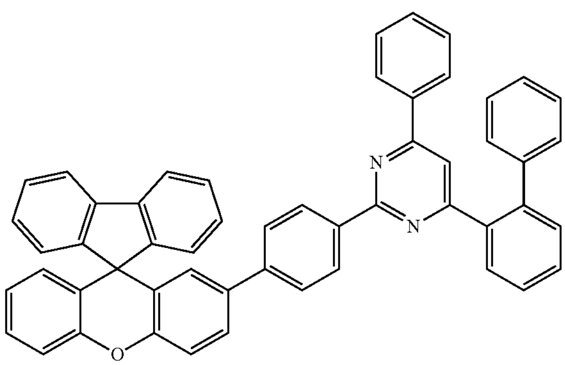
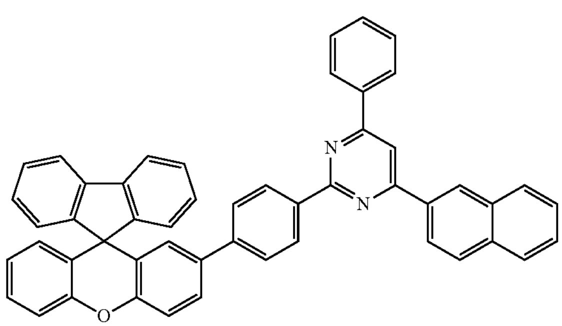
-continued
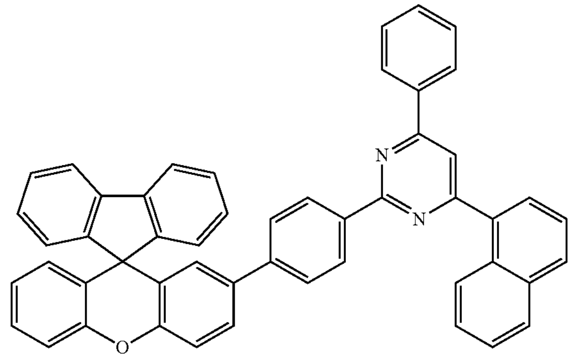
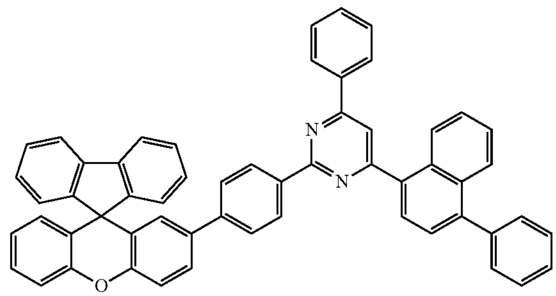
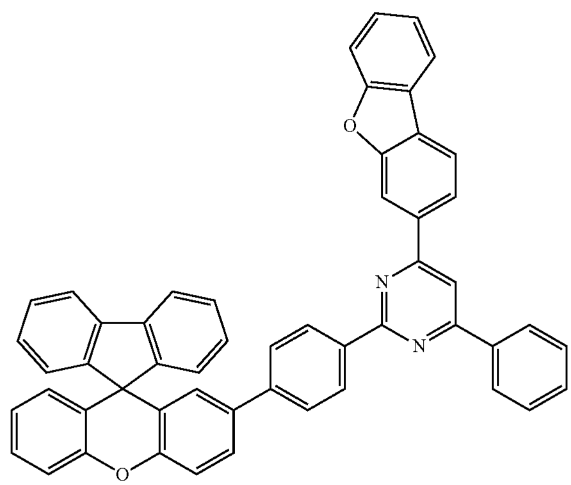
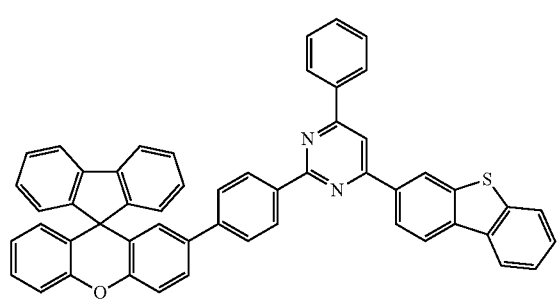

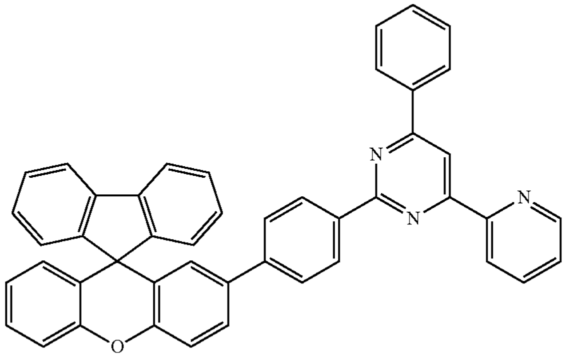
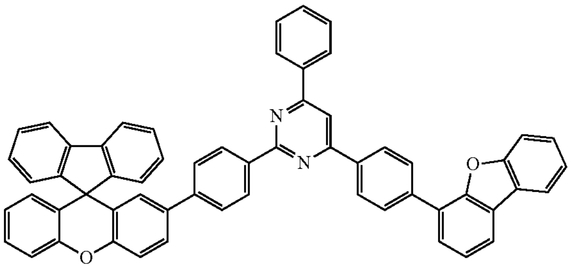
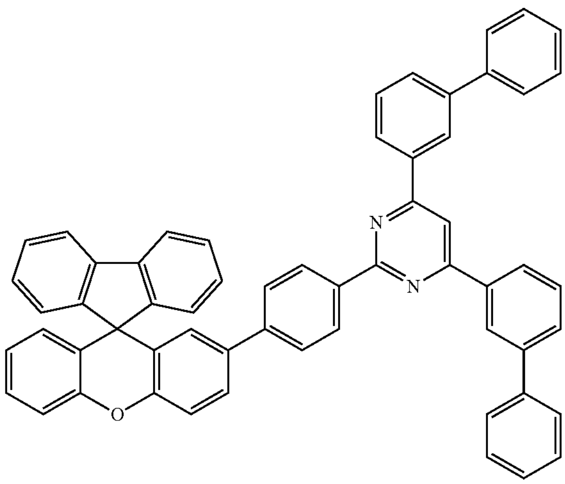
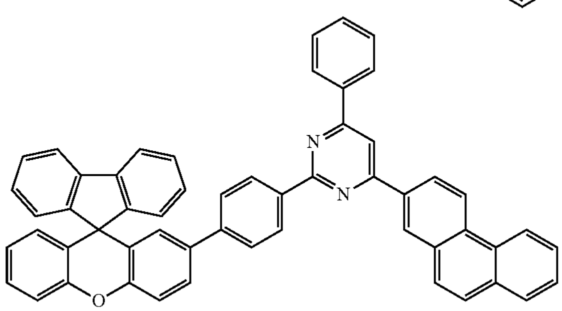
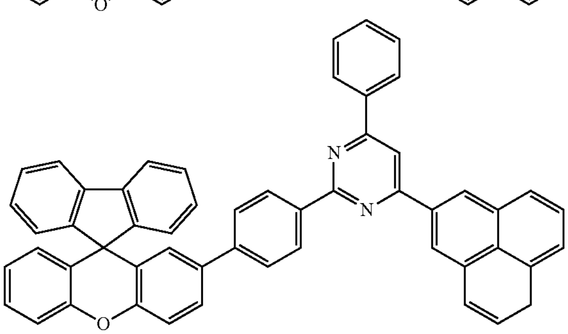
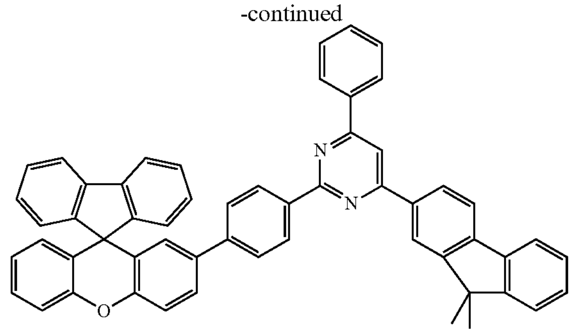
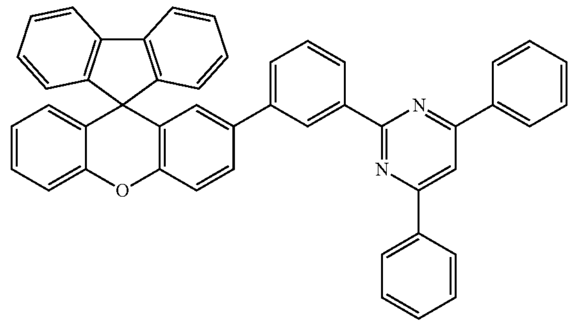
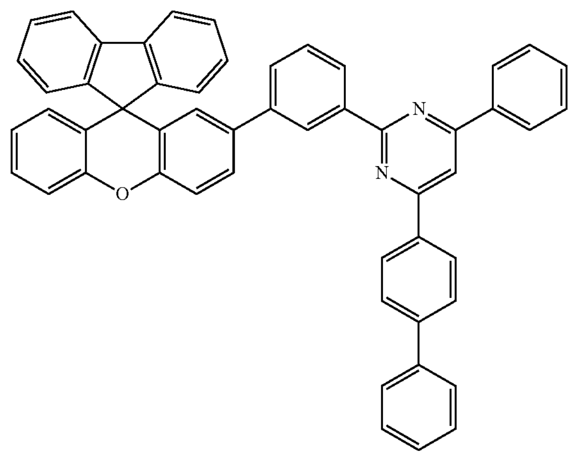
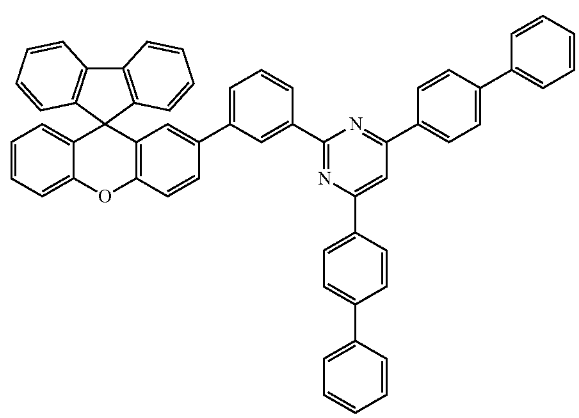

-continued
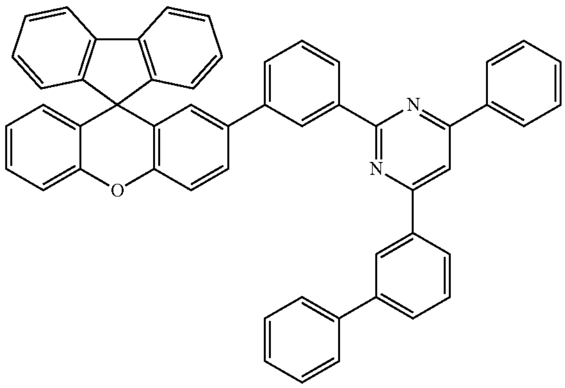
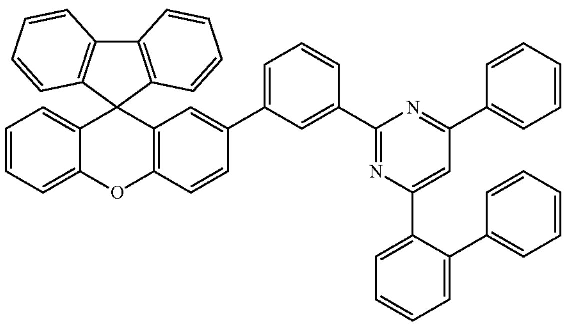
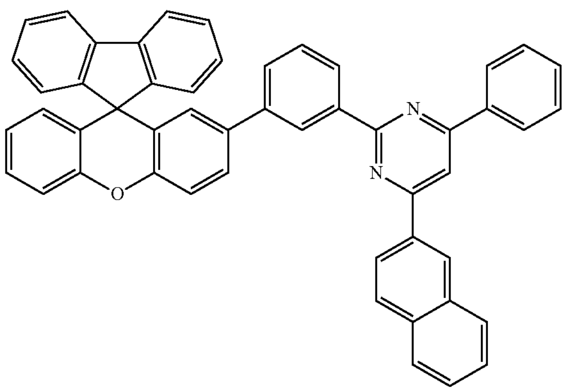
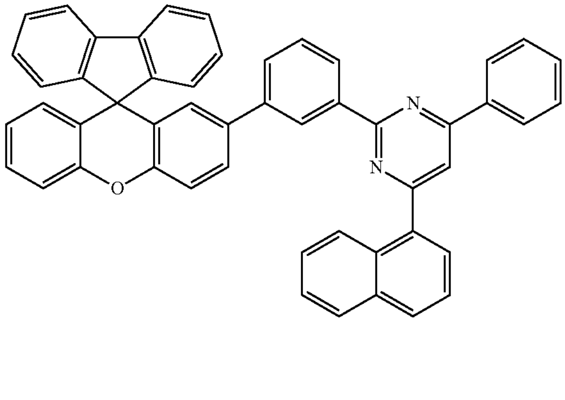
-continued
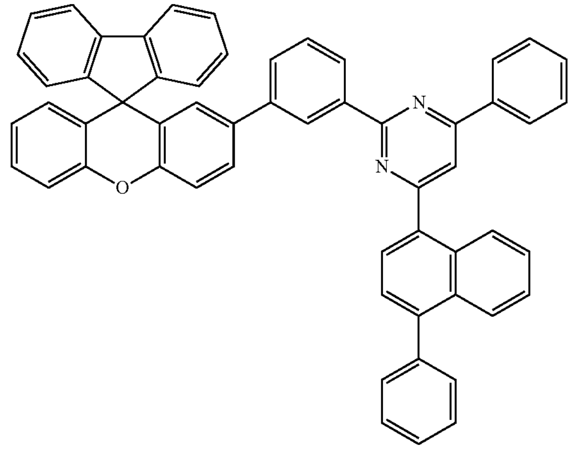
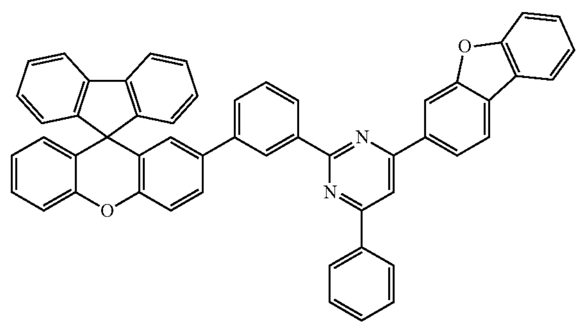
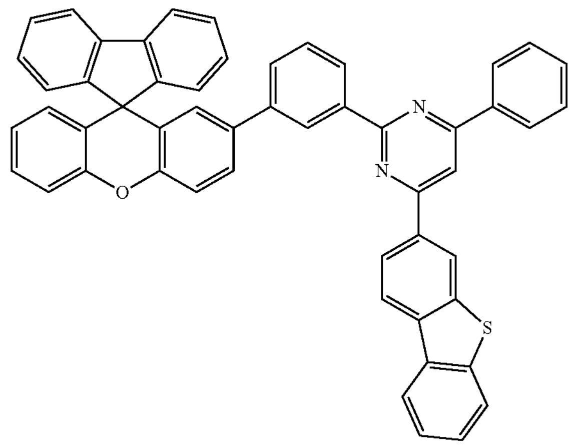
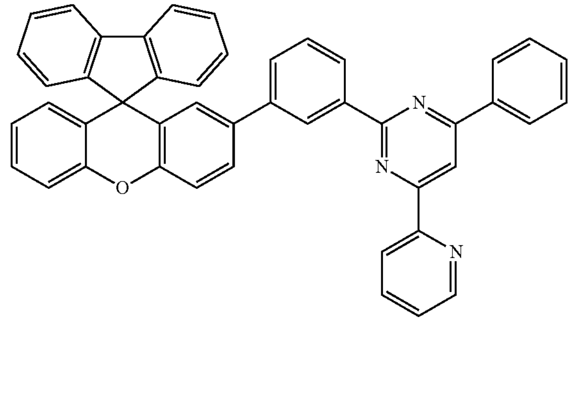

-continued
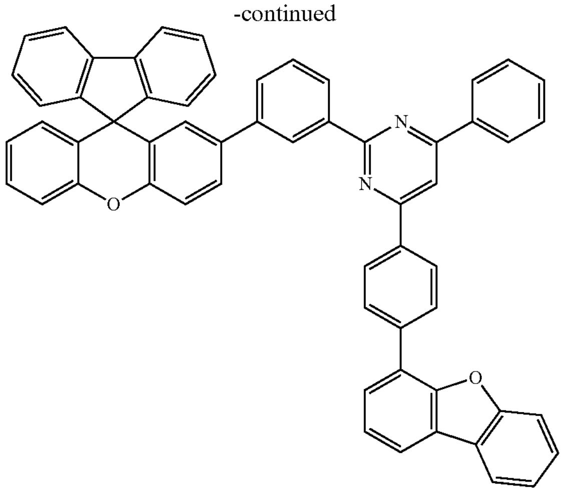
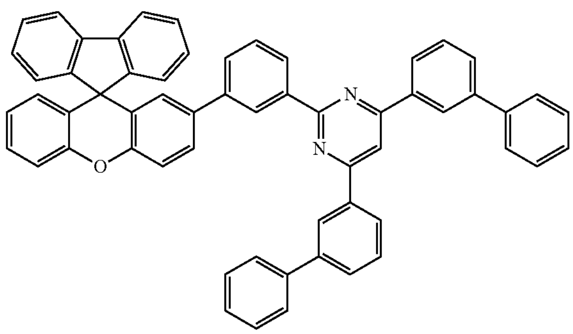
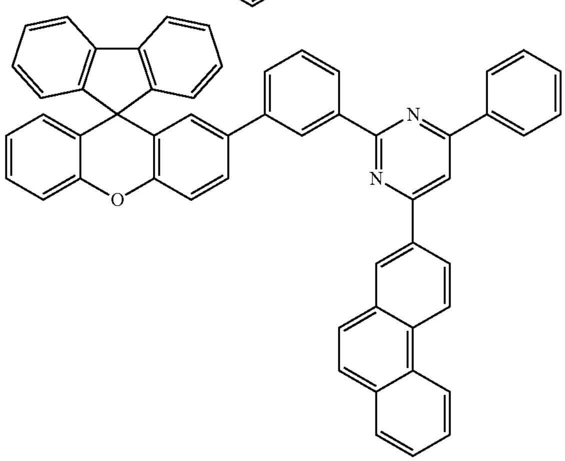
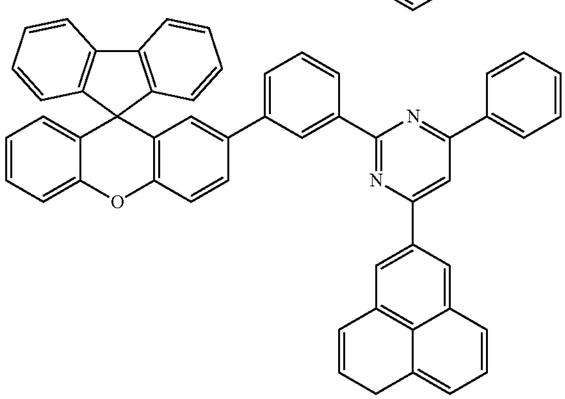
-continued
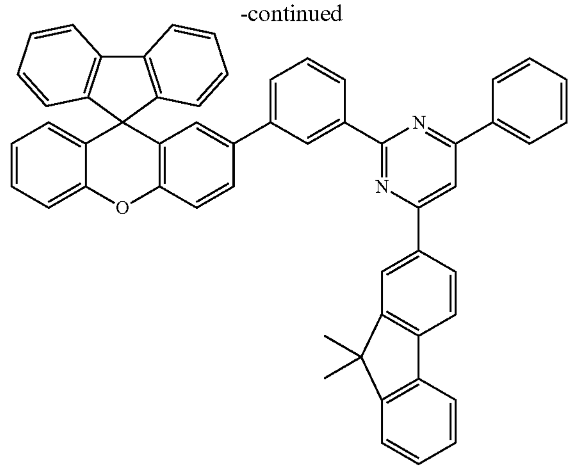
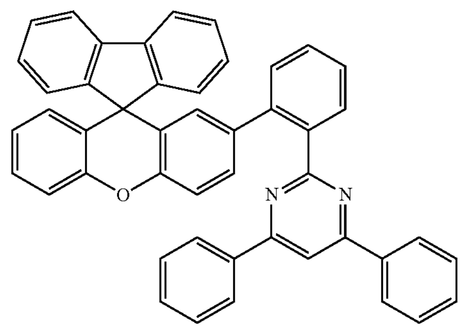
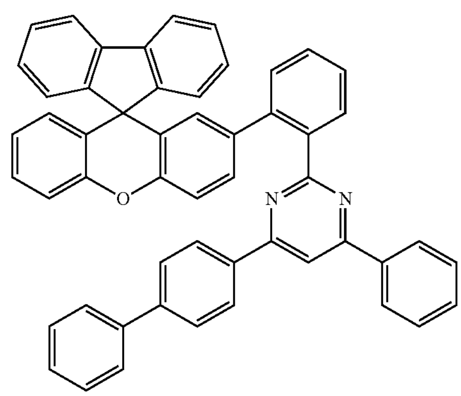
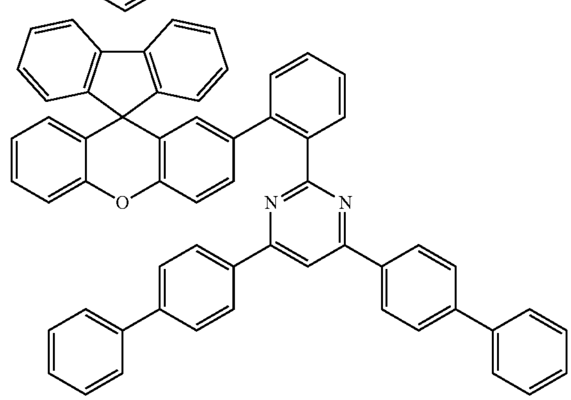

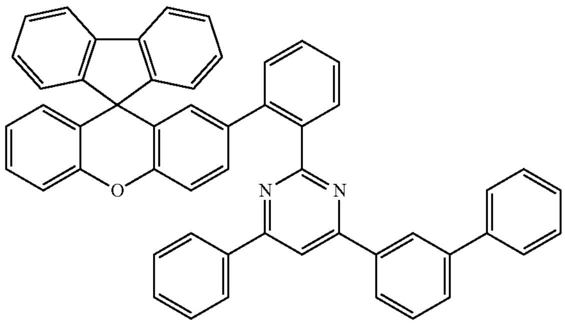
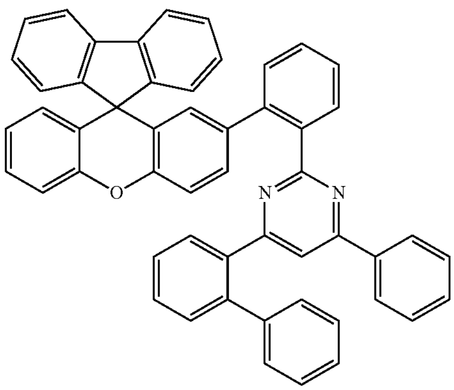
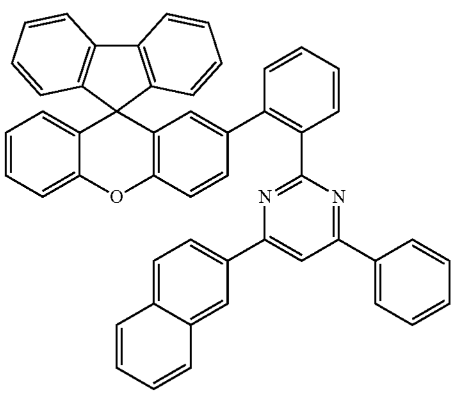
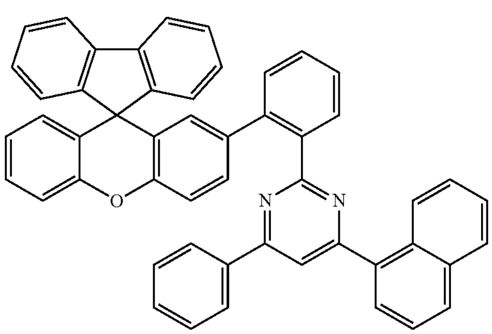
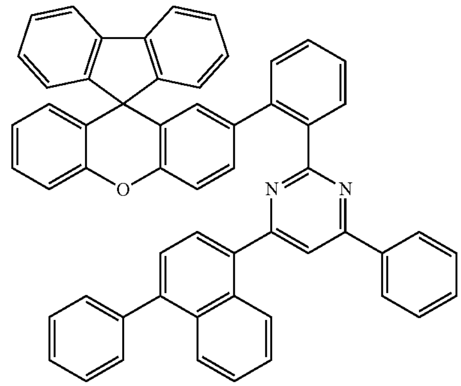
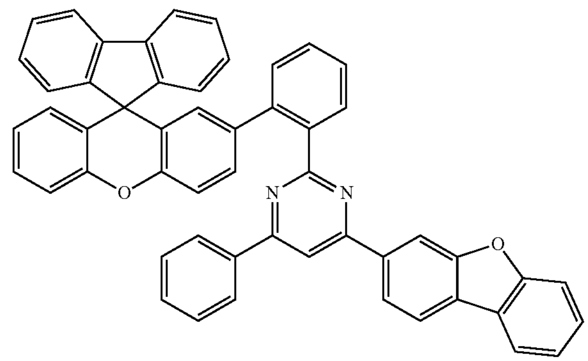
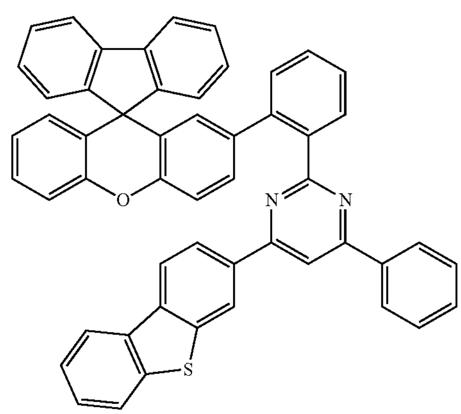
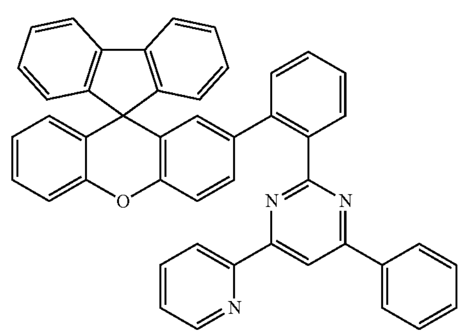

-continued
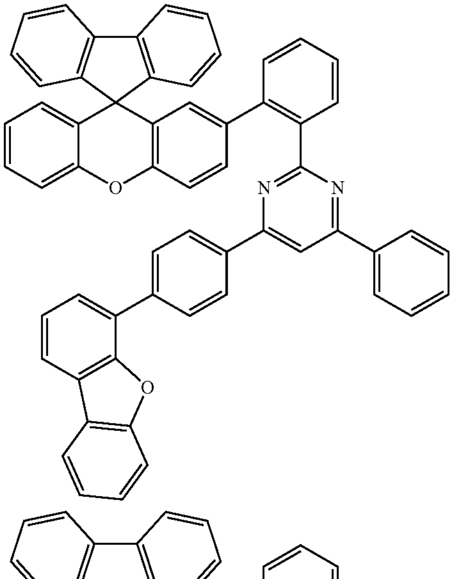
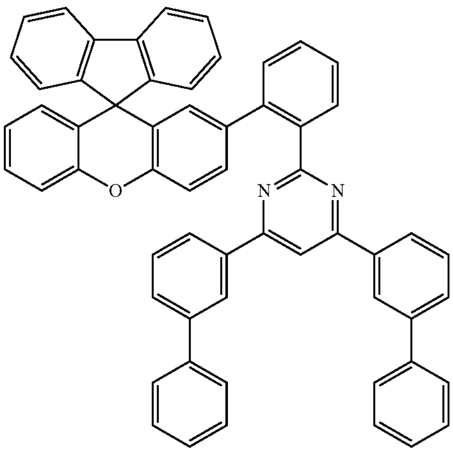
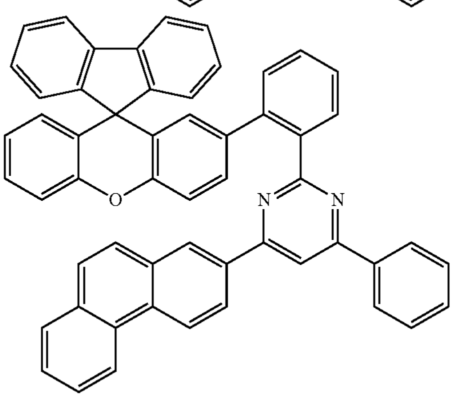
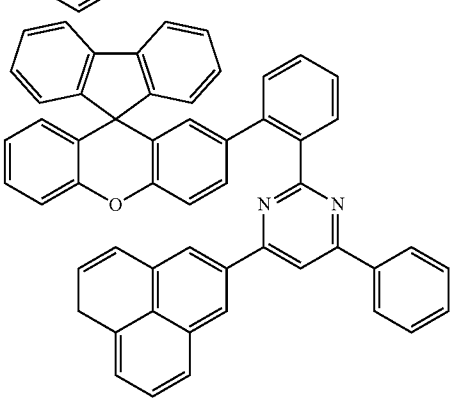
-continued
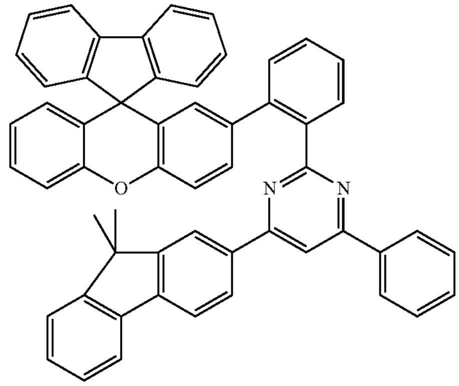
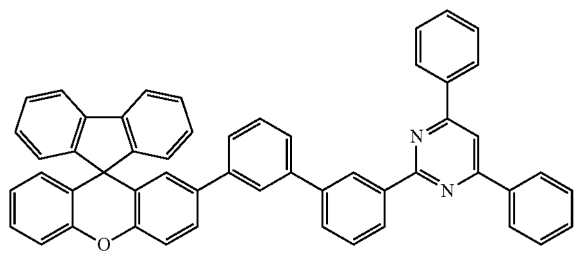
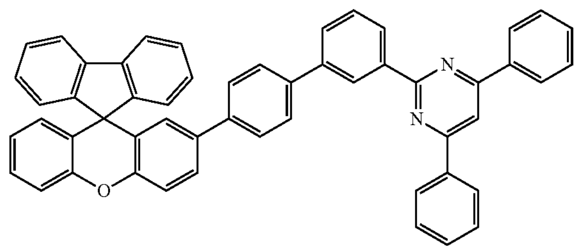
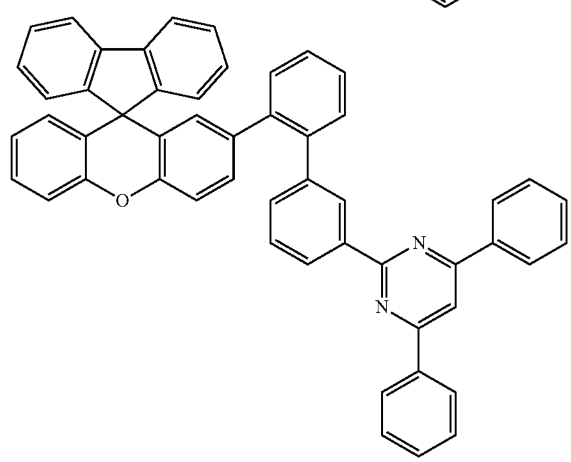
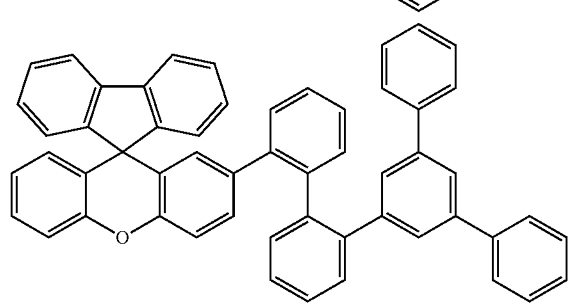

-continued
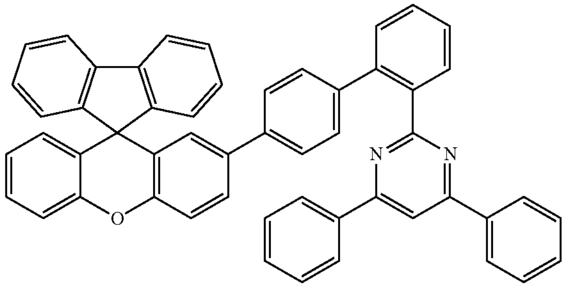
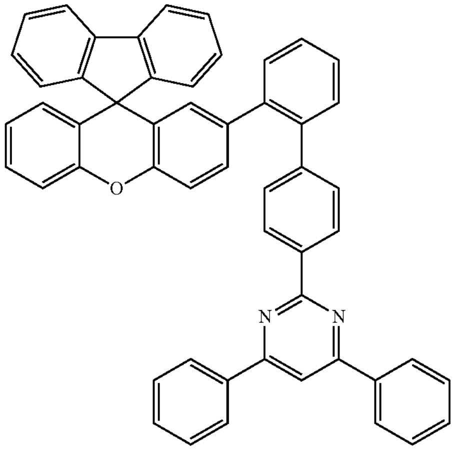
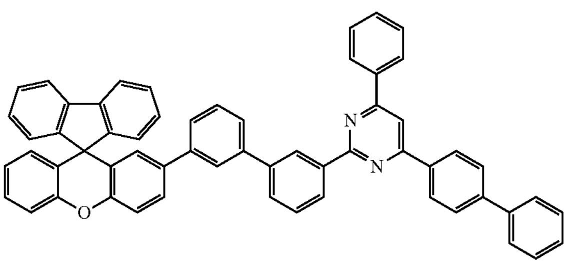
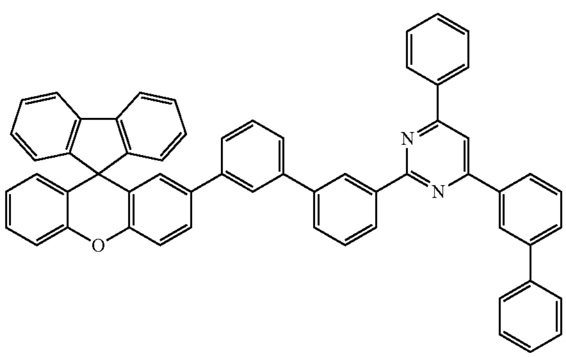
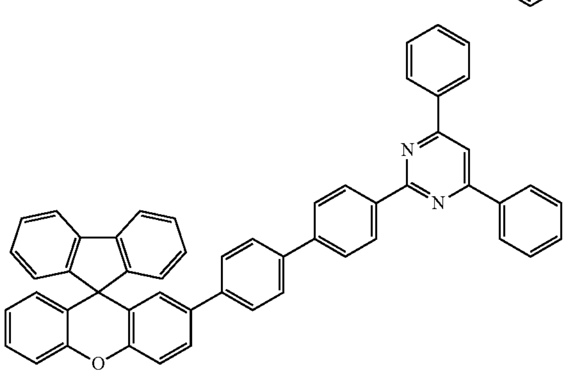
-continued
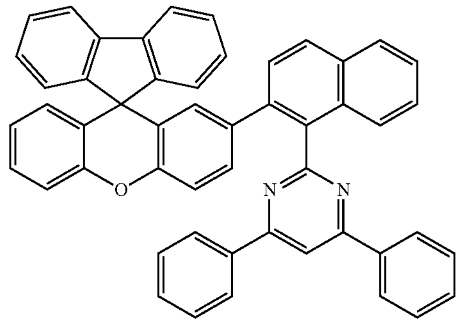
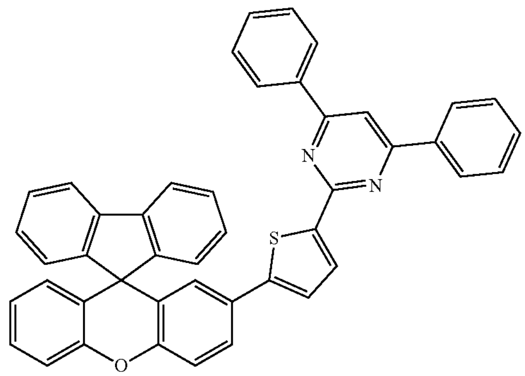
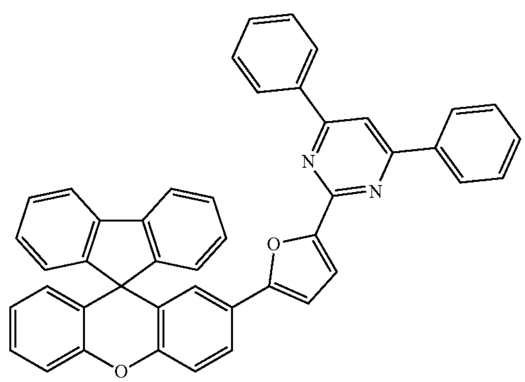
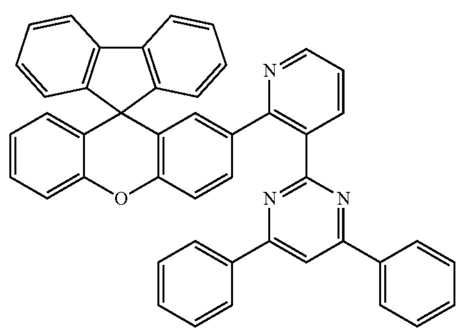

-continued
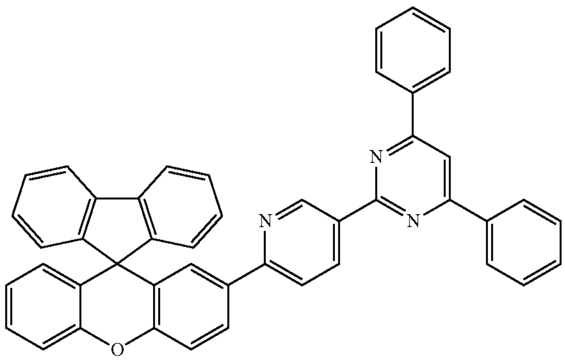
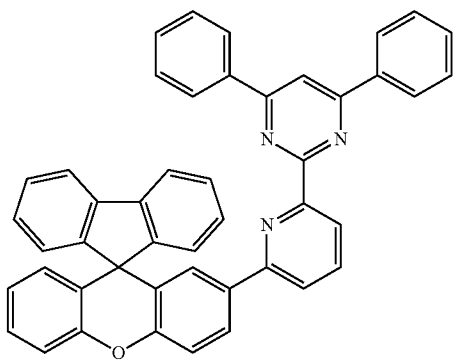
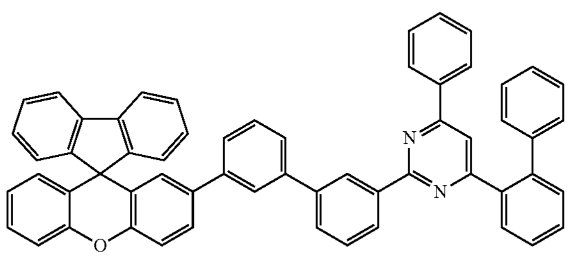
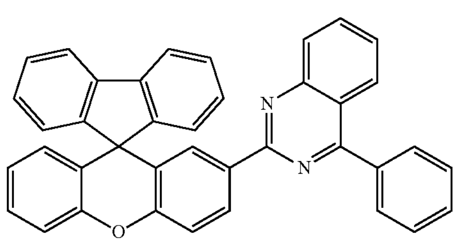
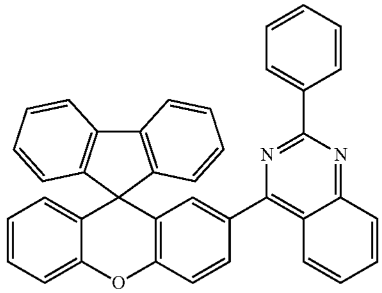
-continued
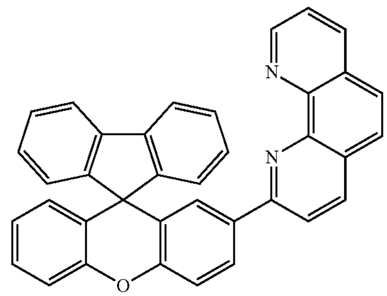
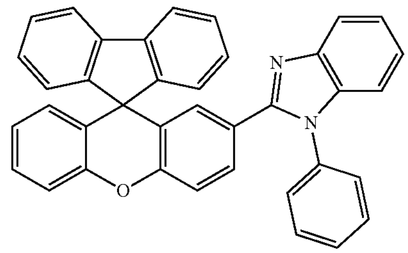
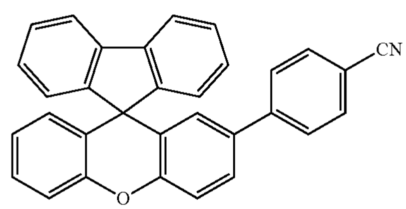
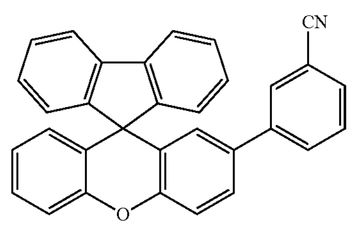
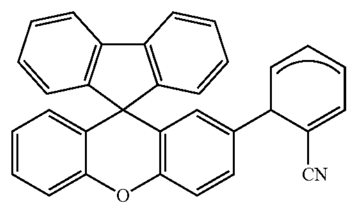
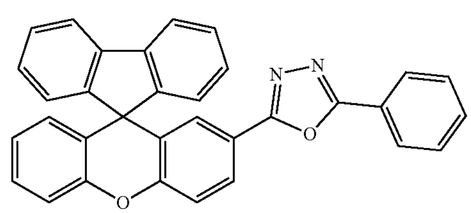
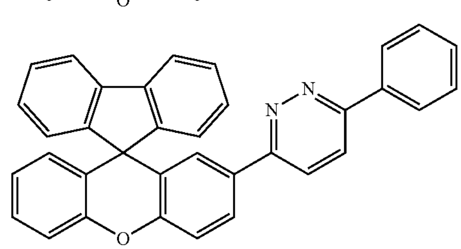

-continued
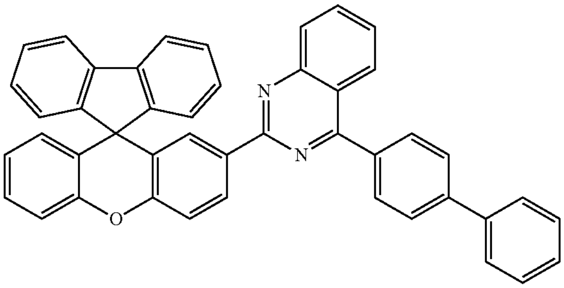
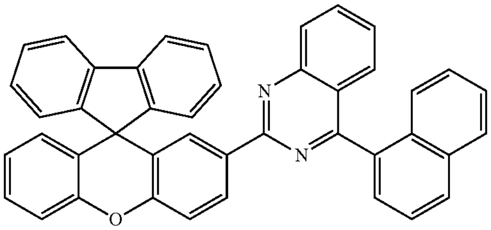
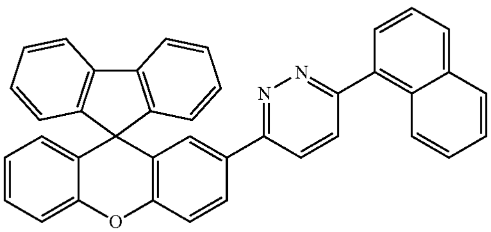
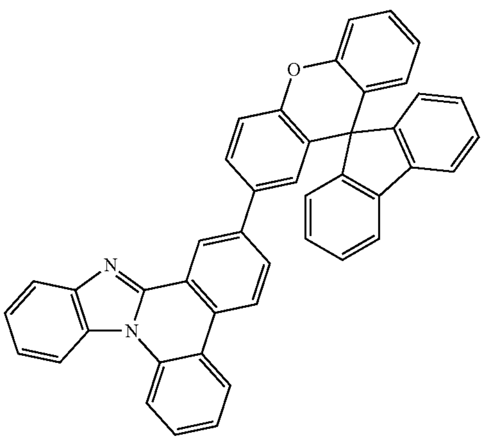
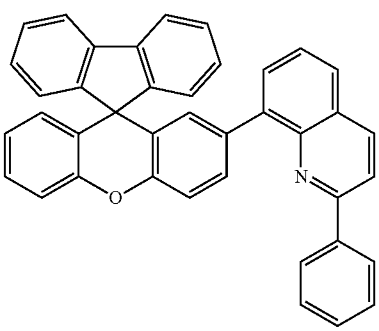
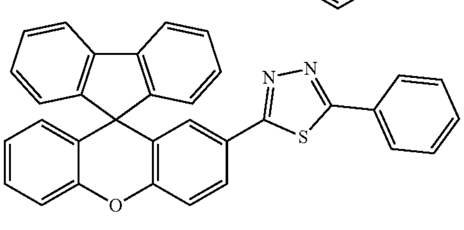
-continued
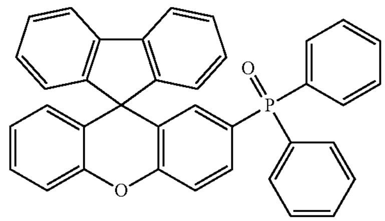
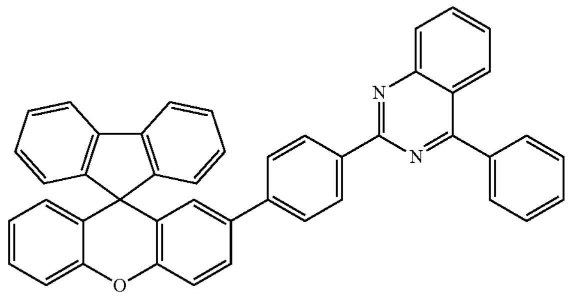
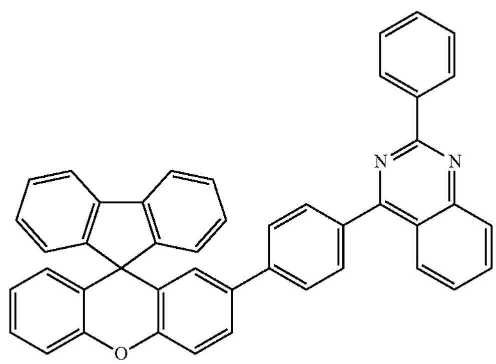
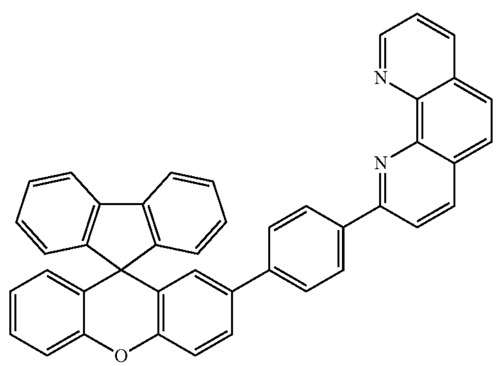
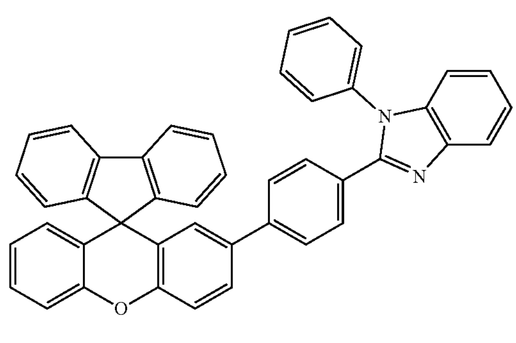

-continued
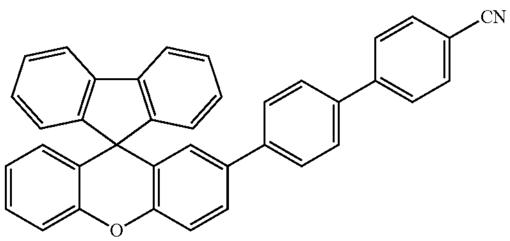
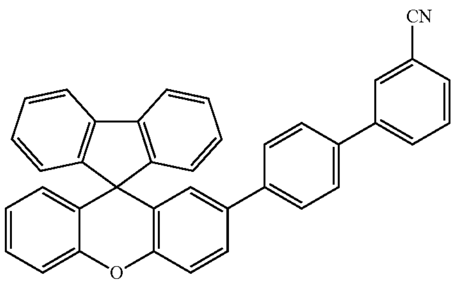
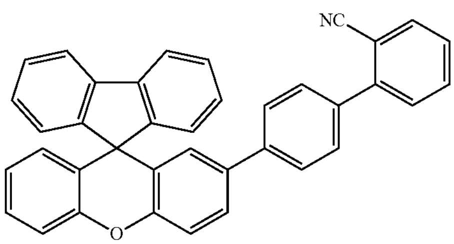
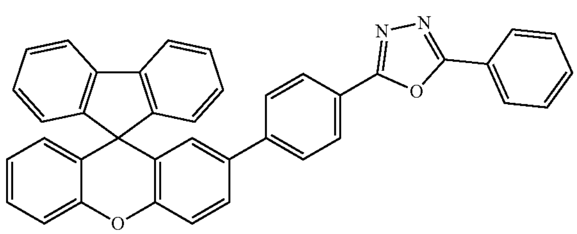
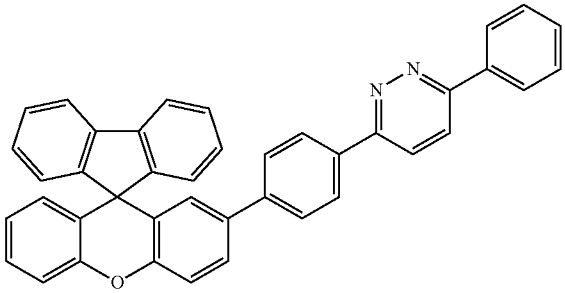
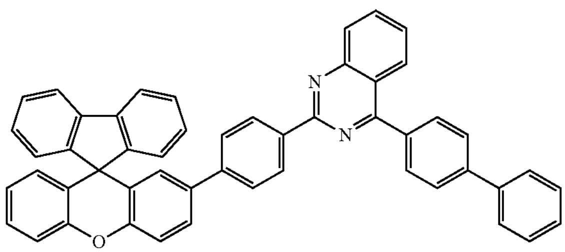
-continued
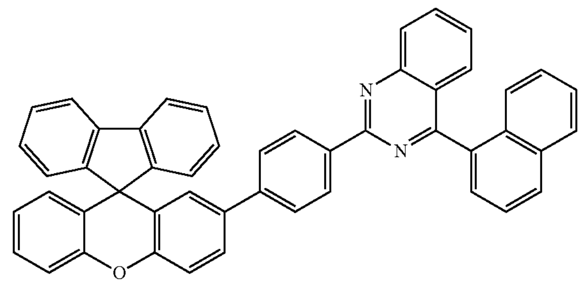
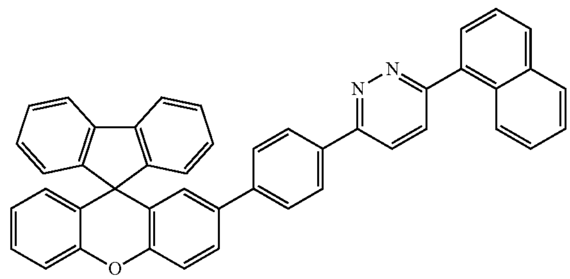
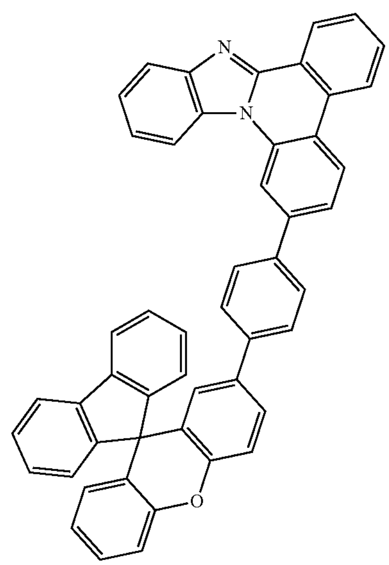
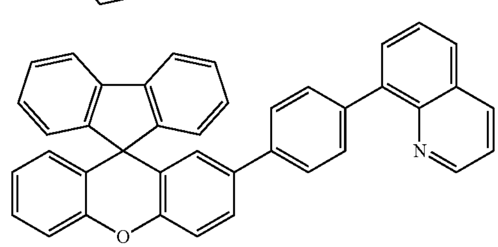
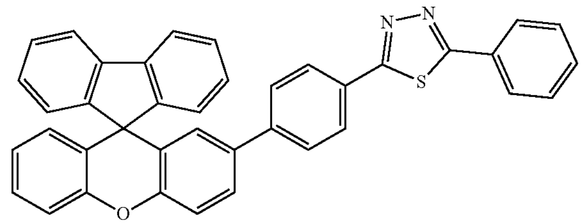

-continued
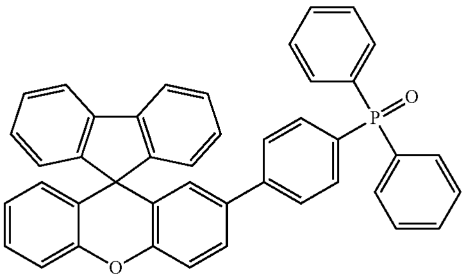
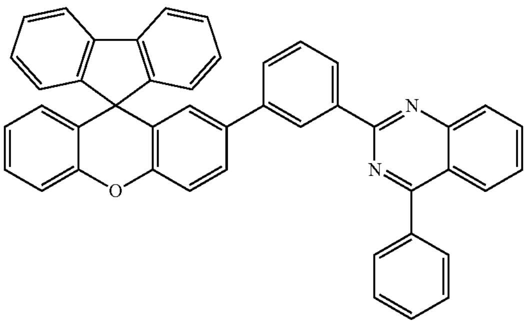
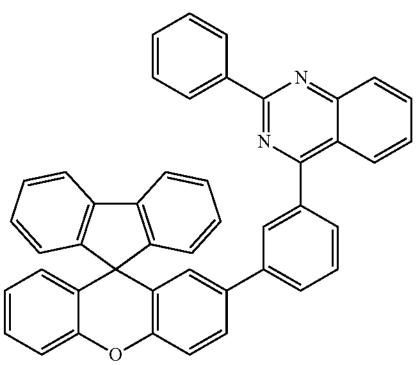
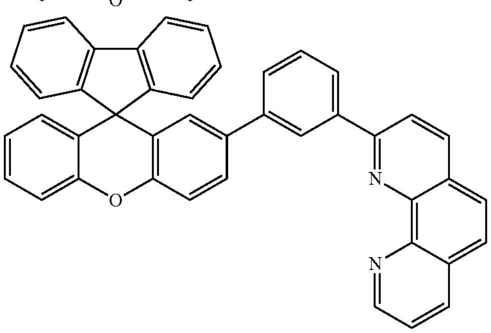
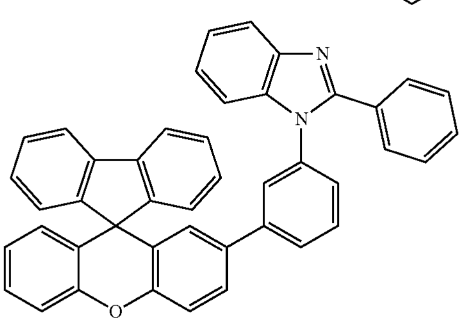
-continued
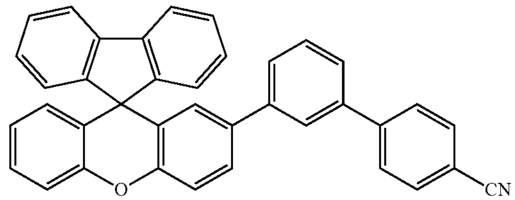
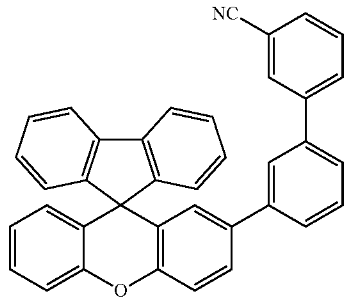
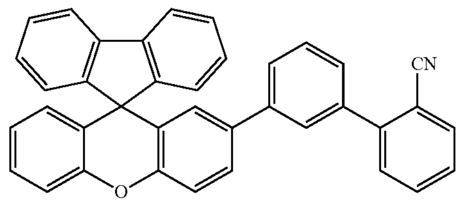
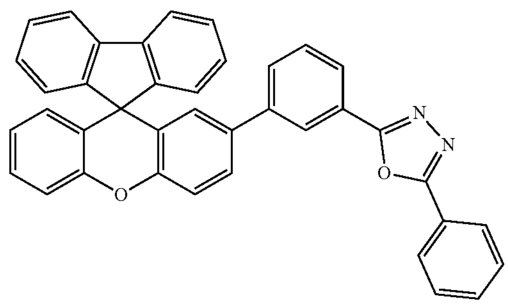
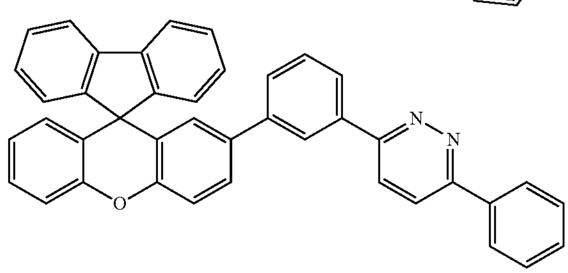
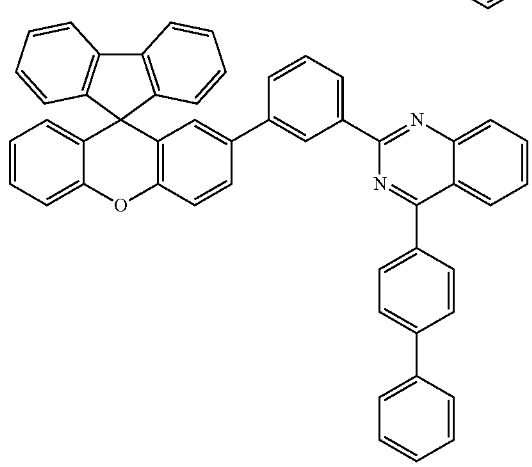

-continued
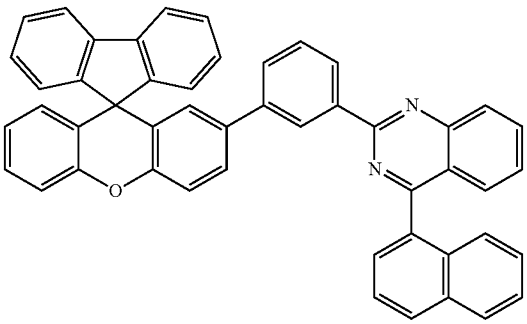
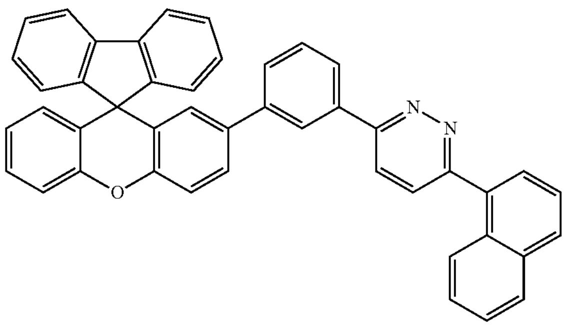
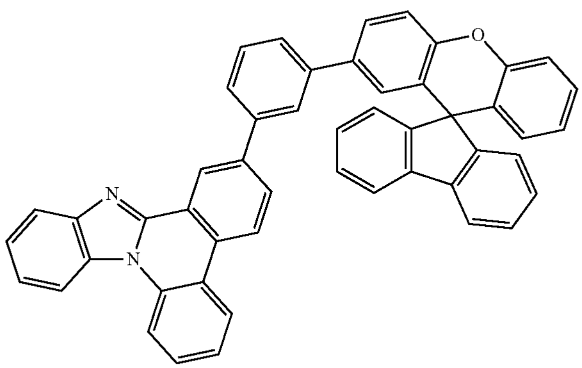
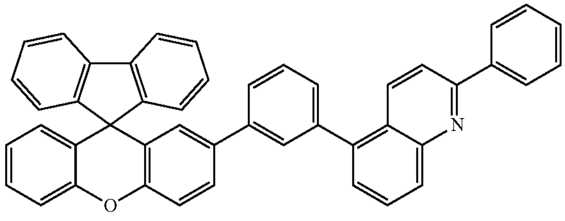
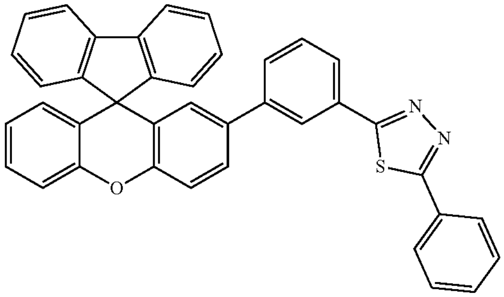
-continued
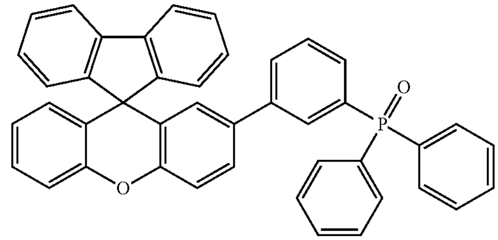
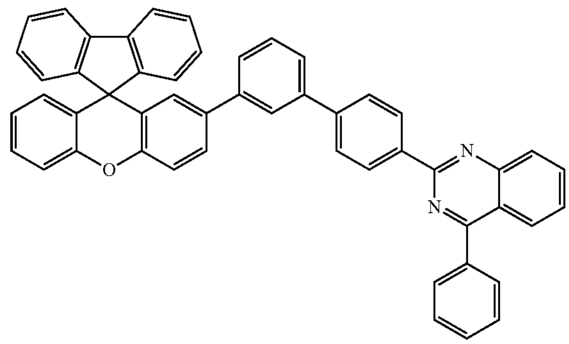
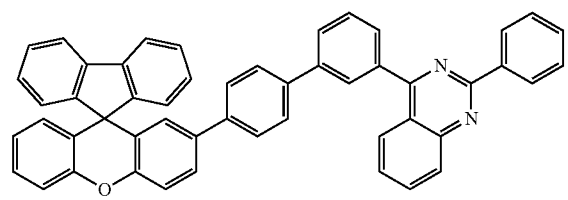
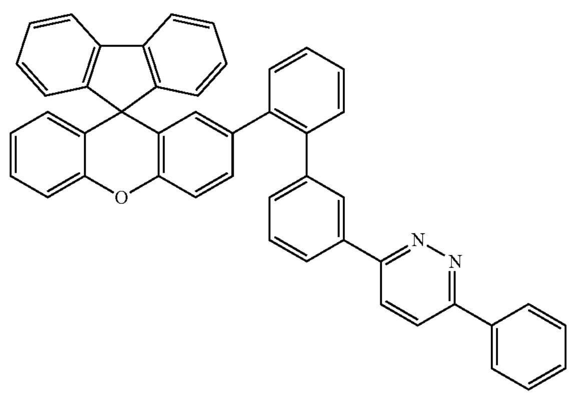
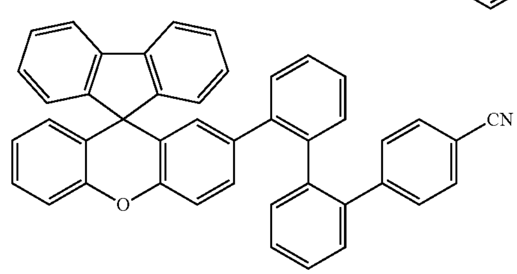
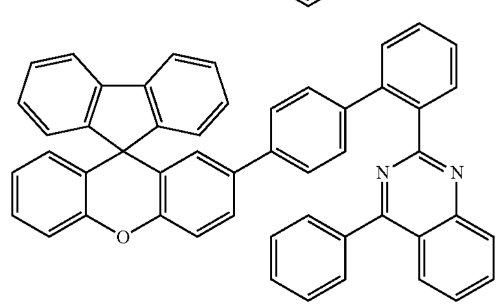

-continued
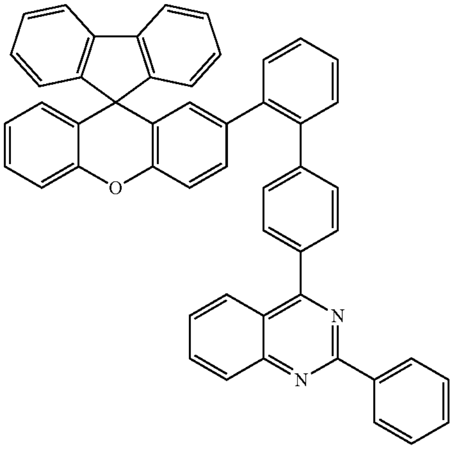
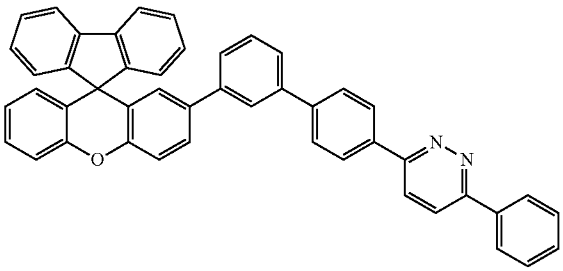
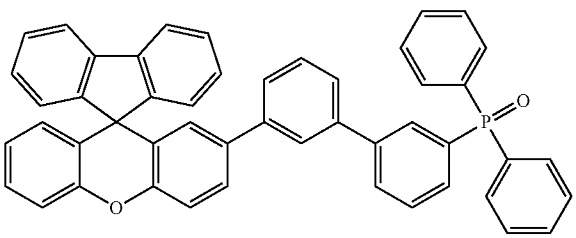
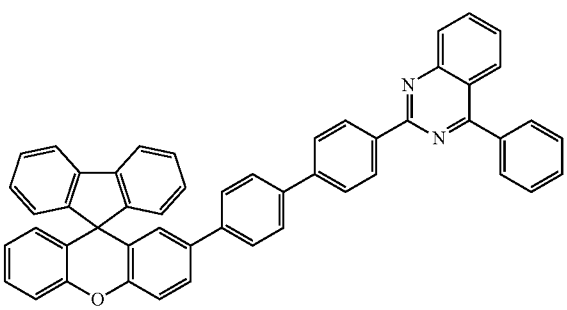
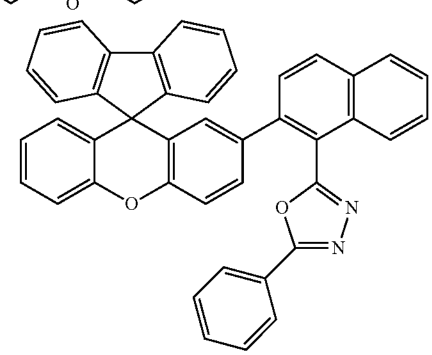
-continued
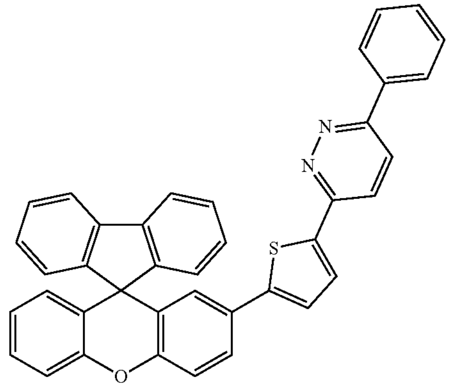
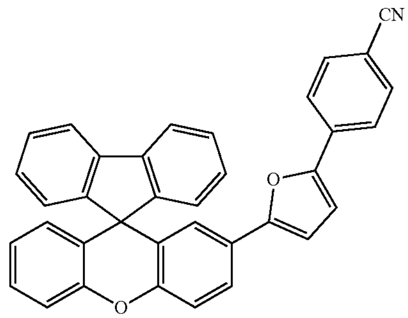
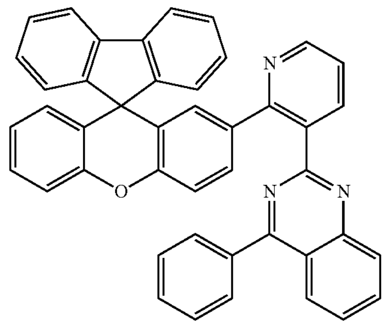
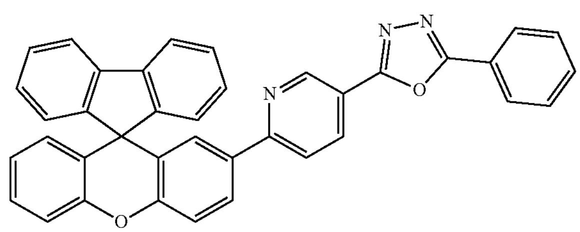
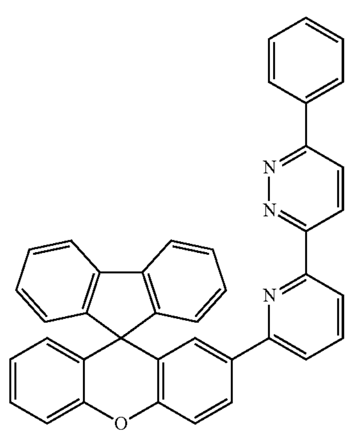

-continued
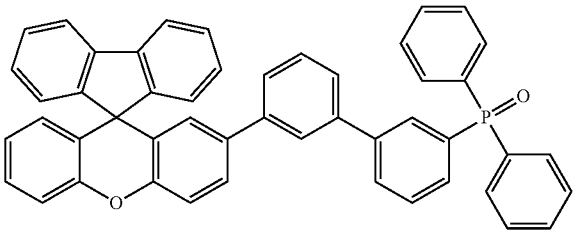
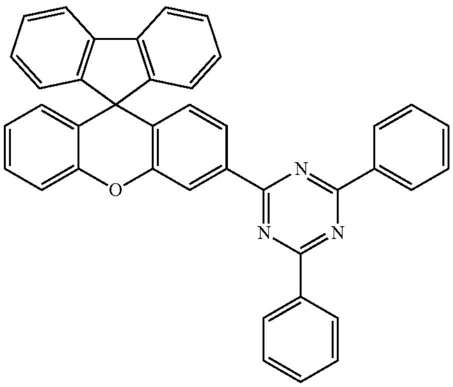
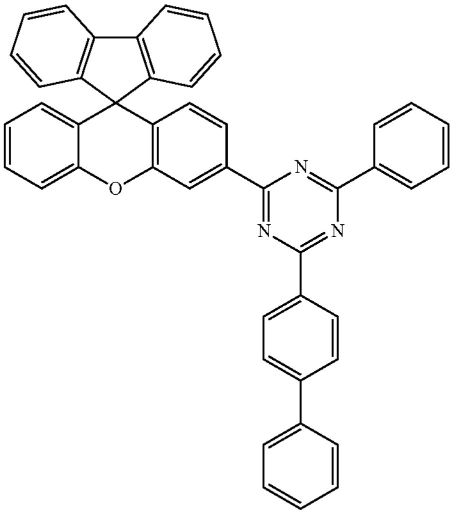
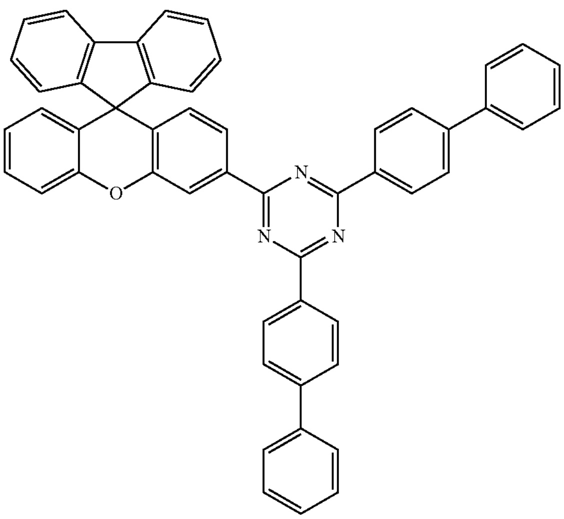
-continued
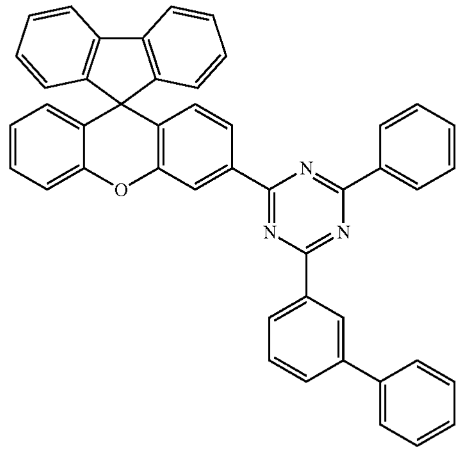
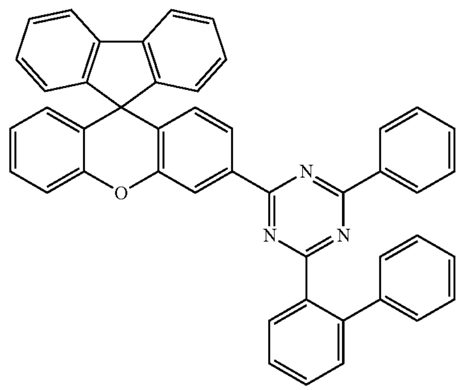
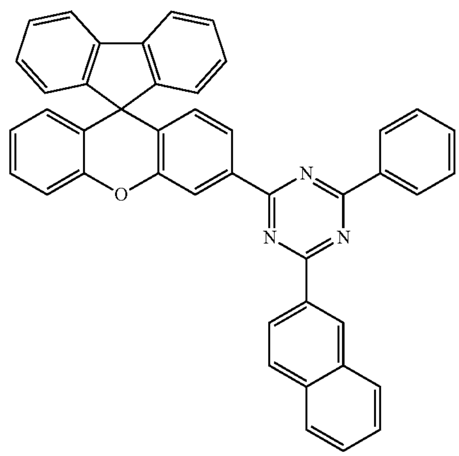
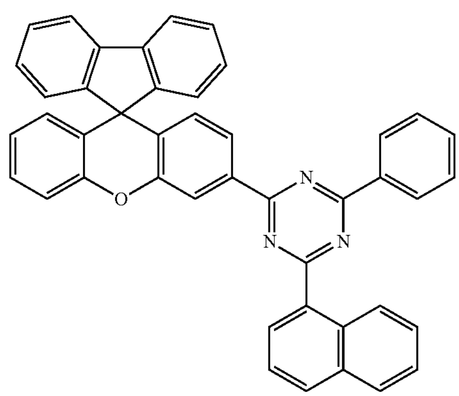

-continued
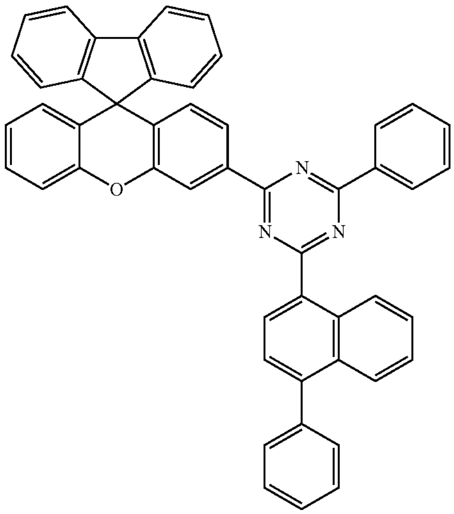
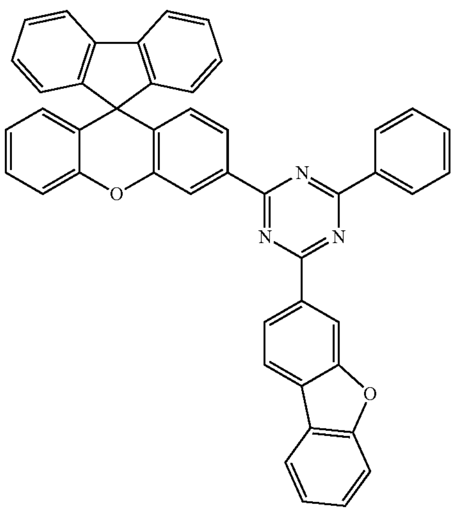
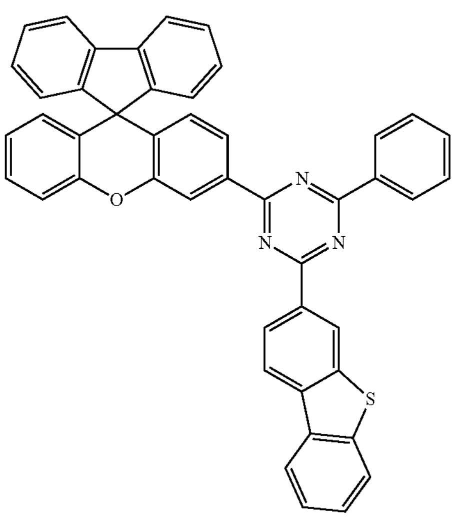
-continued
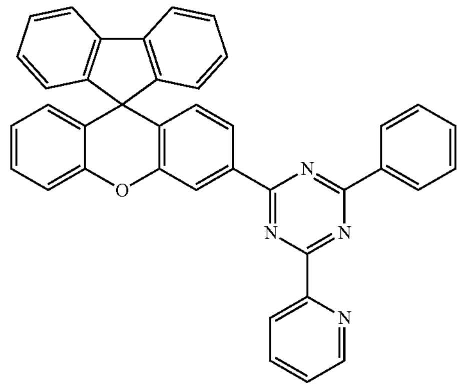
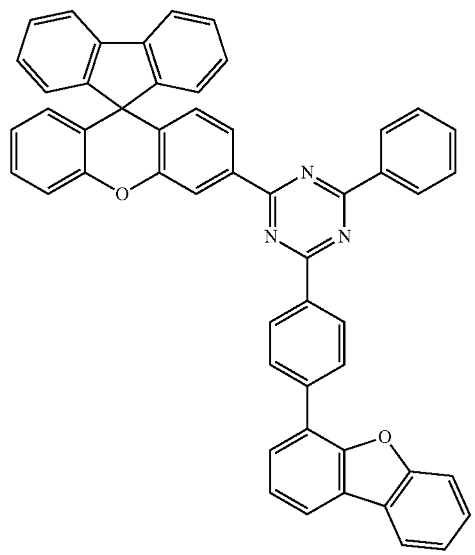
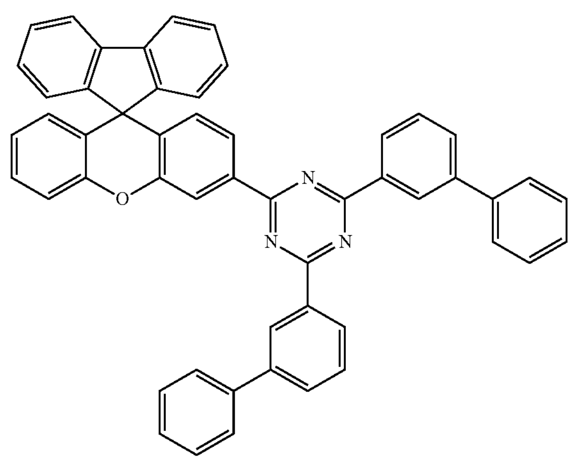

-continued
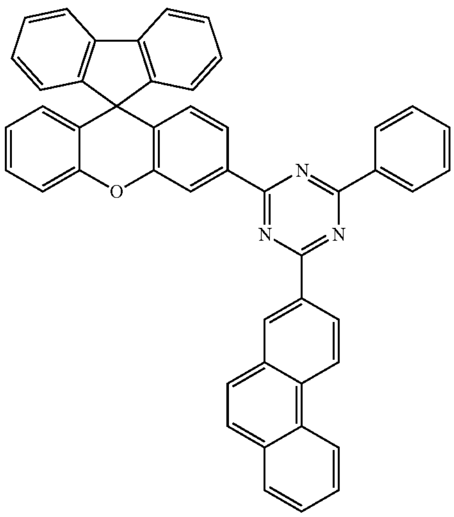
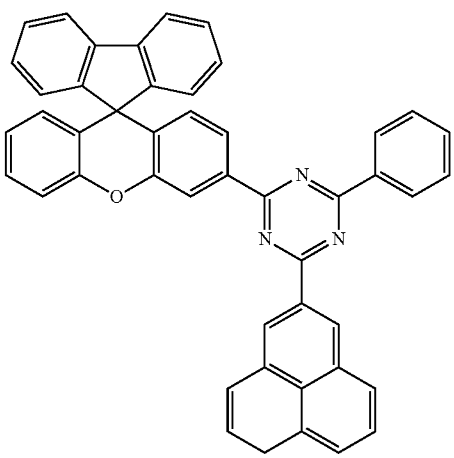
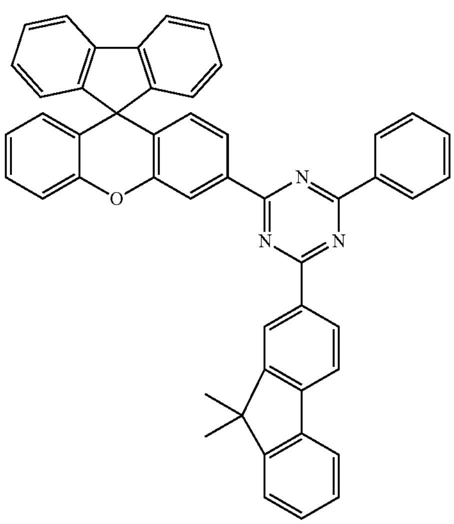
-continued
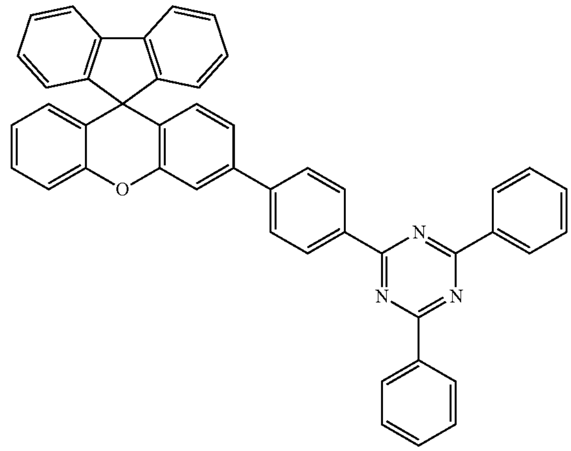
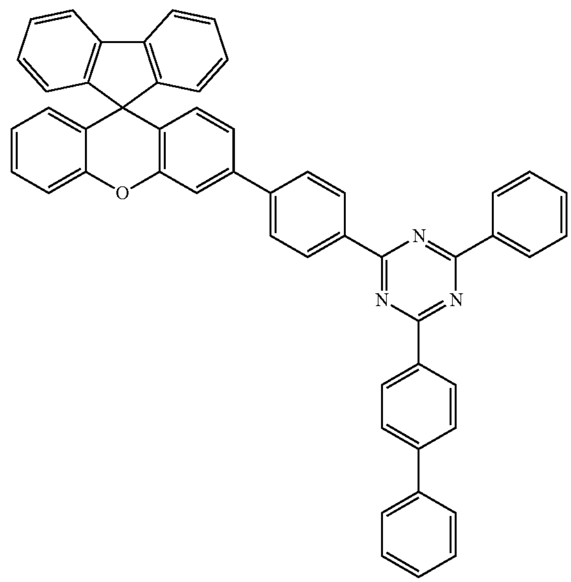
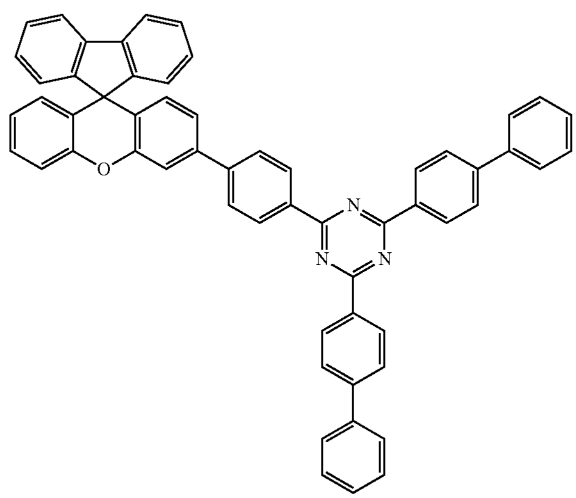

-continued
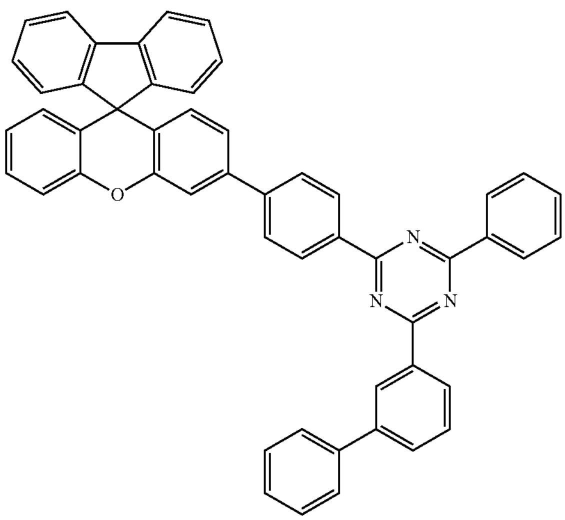
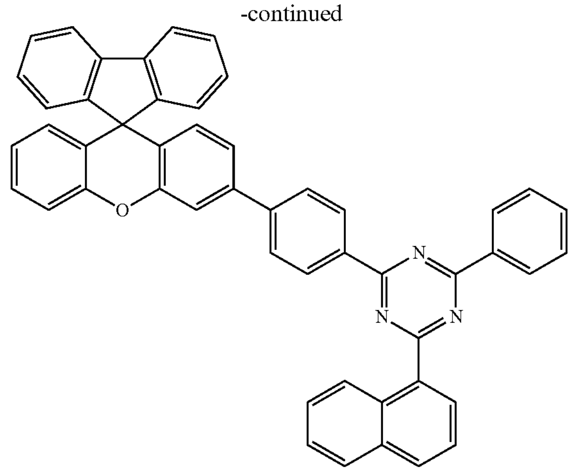
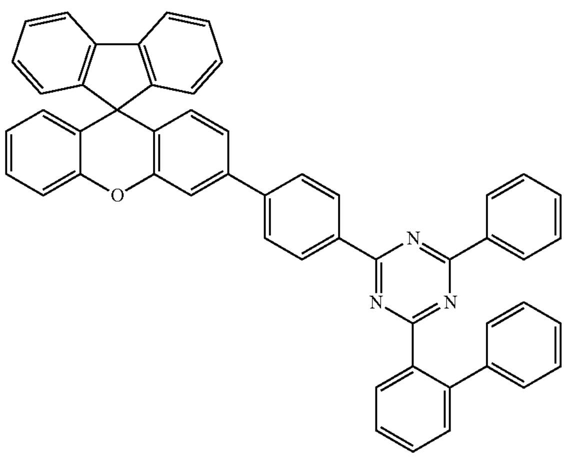
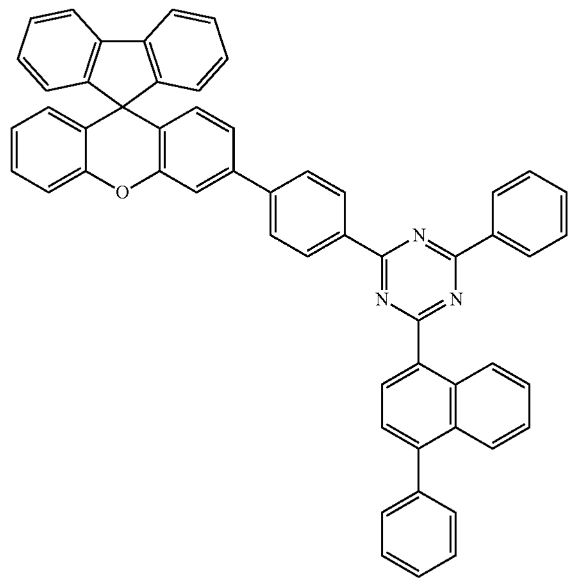
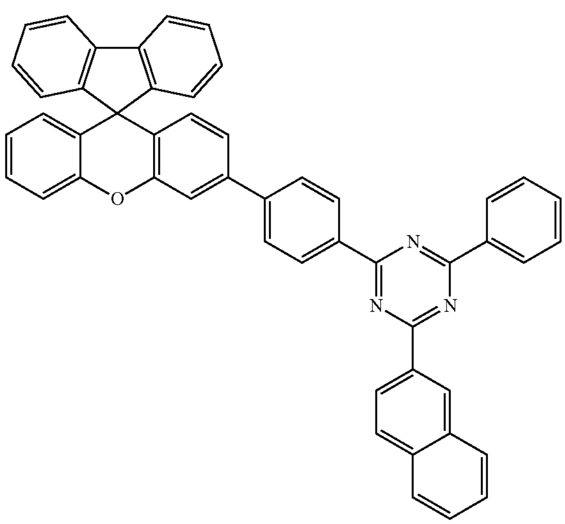
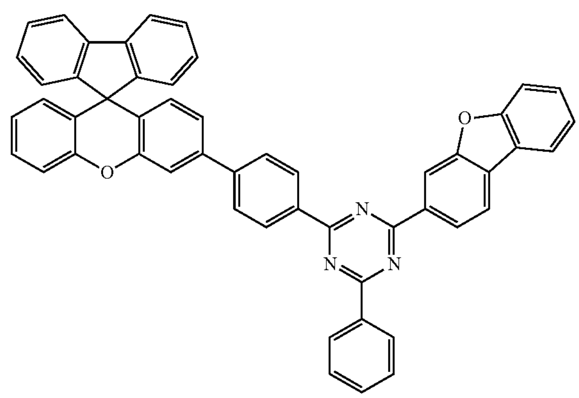
-continued

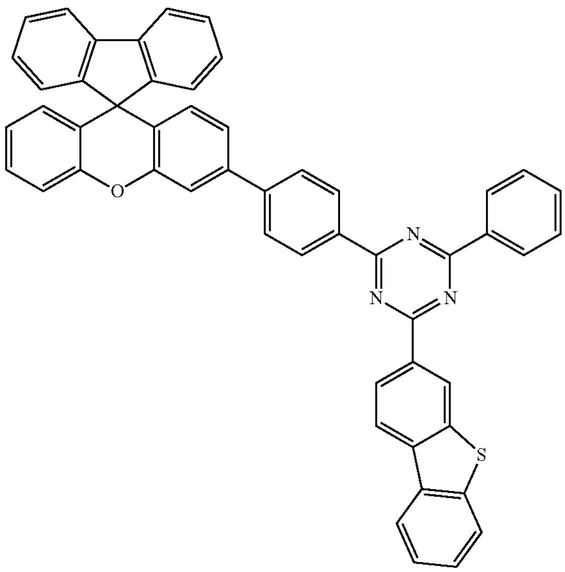
O
N
N
N
S
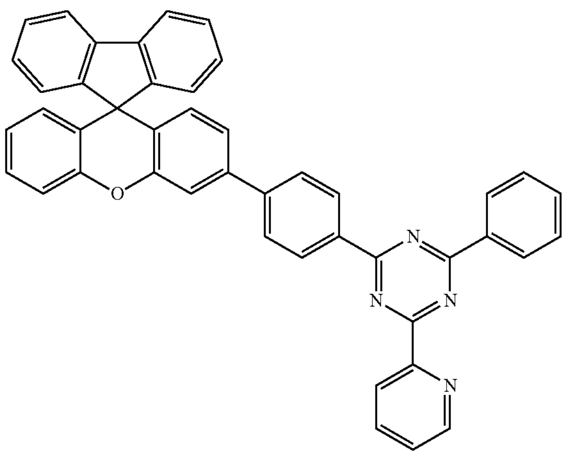
O
N
N
N
N
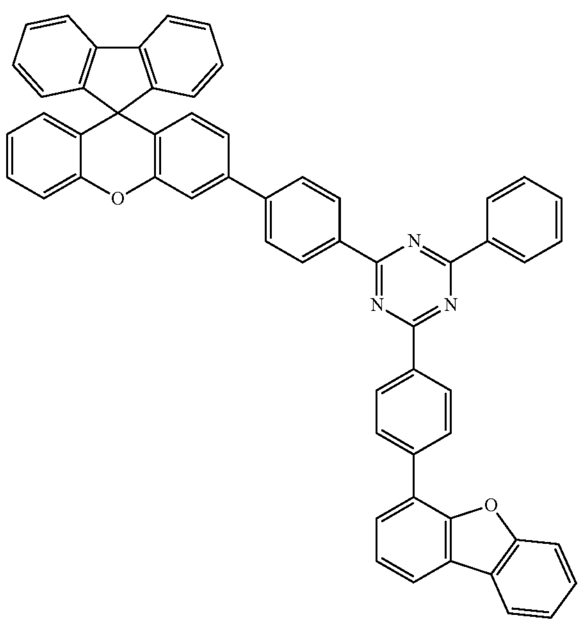
O
N
N
N
O
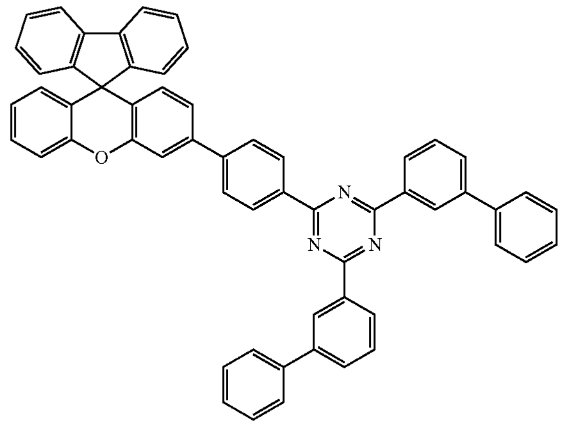
O
N
N
N
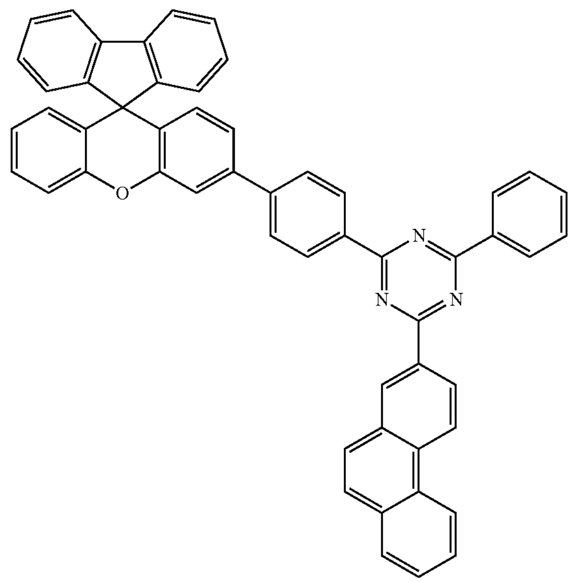
O
N
N
N
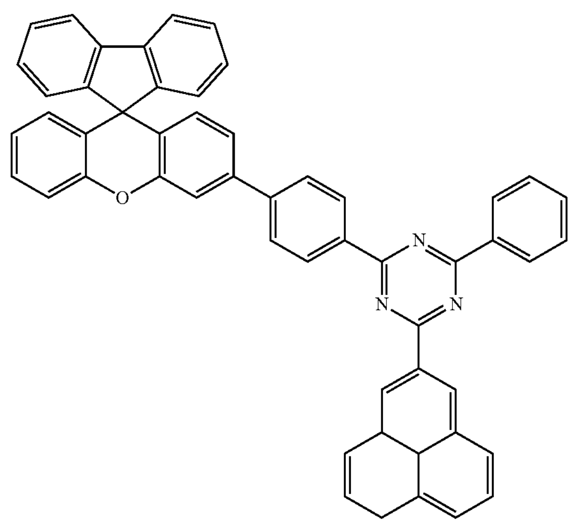
O
N
N
N -continued
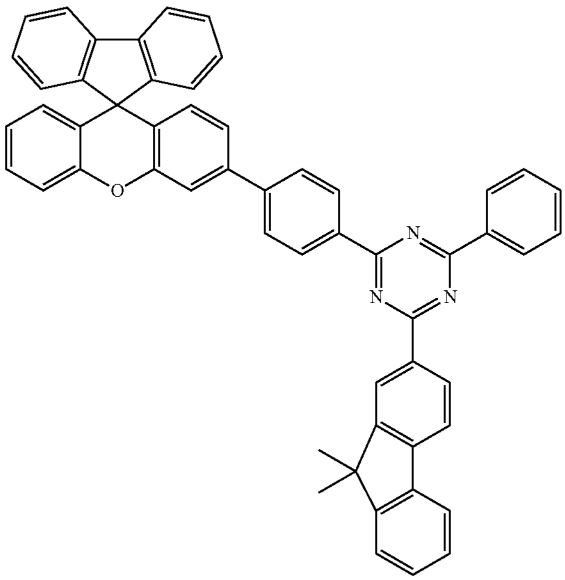
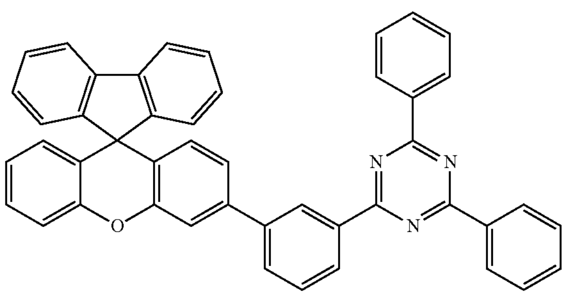
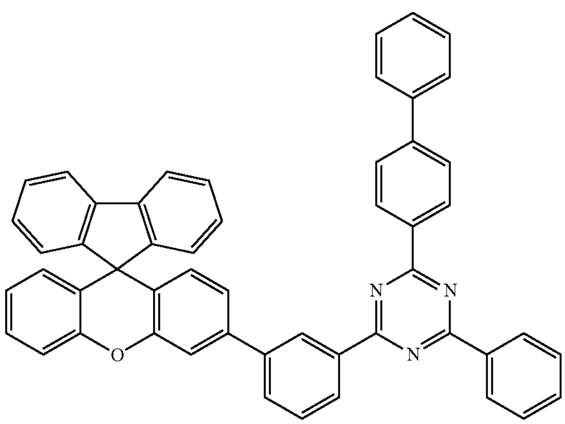
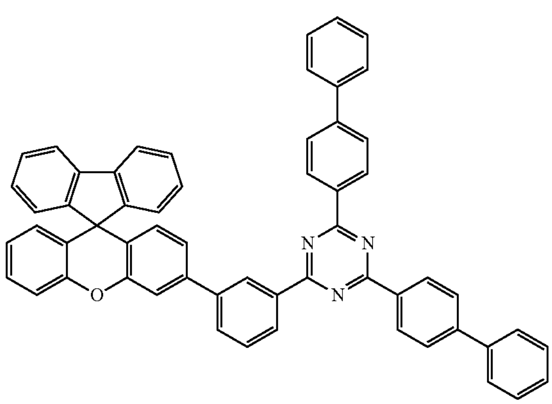
-continued
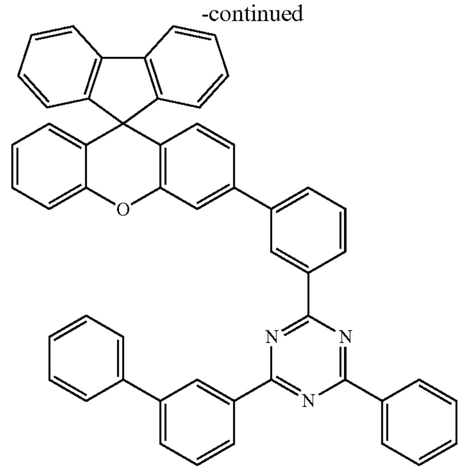
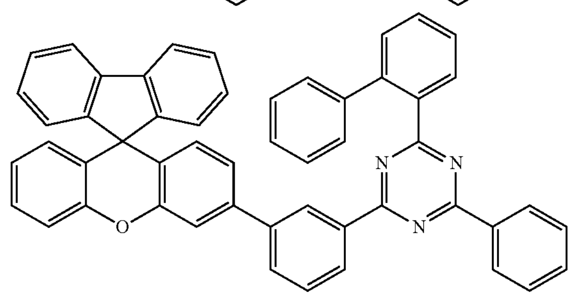
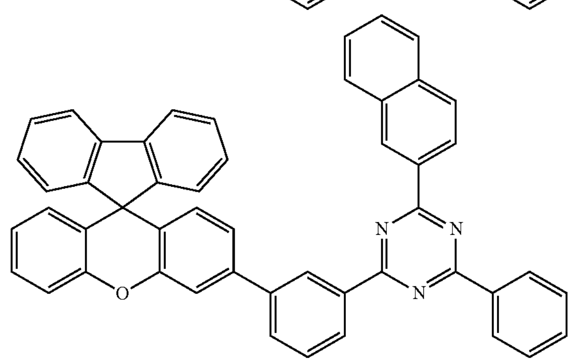
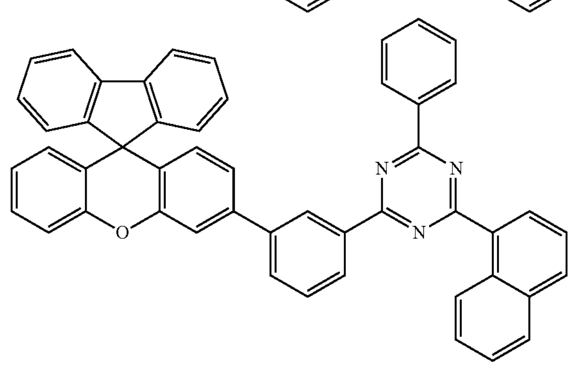
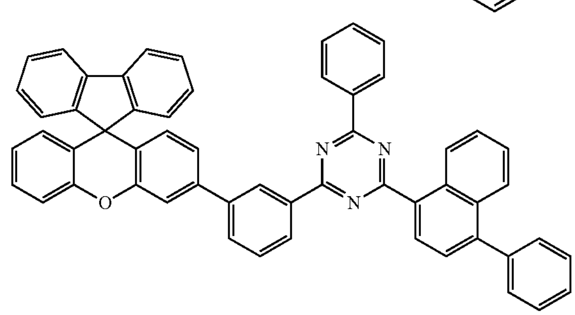

-continued
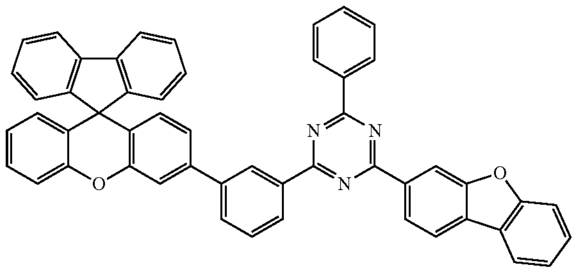
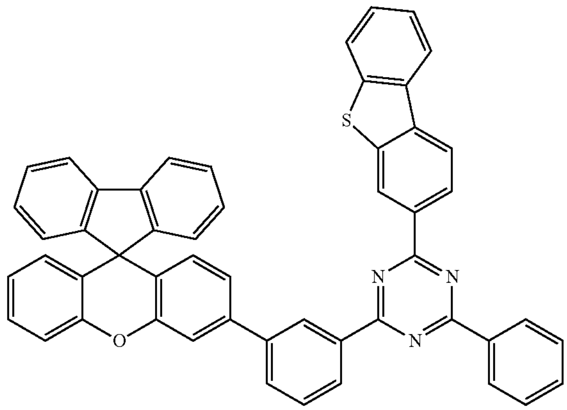
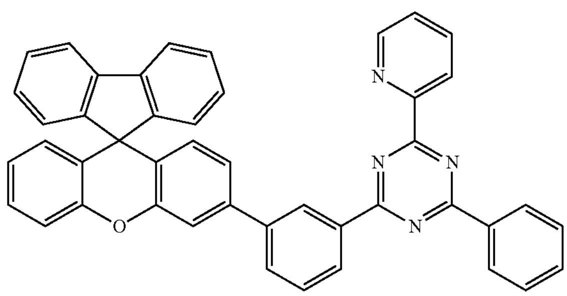
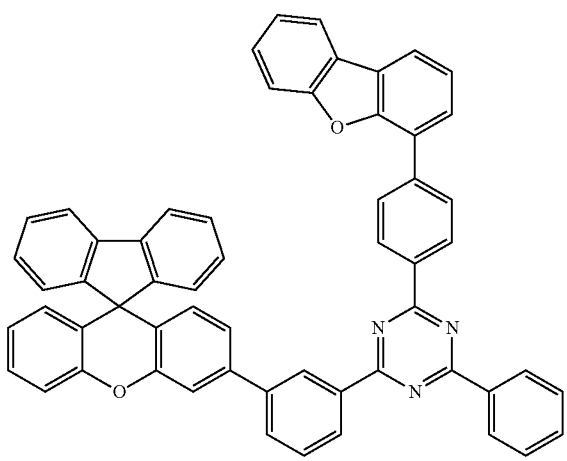
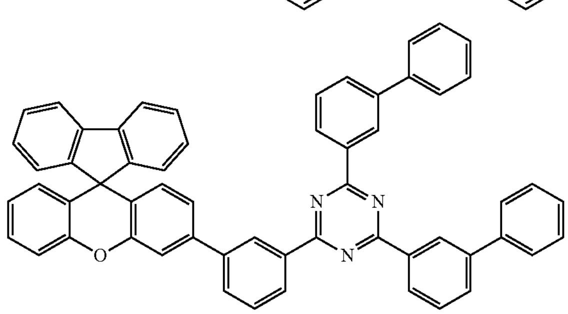
-continued
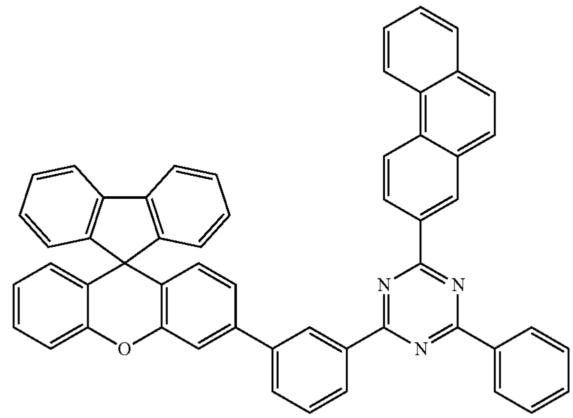
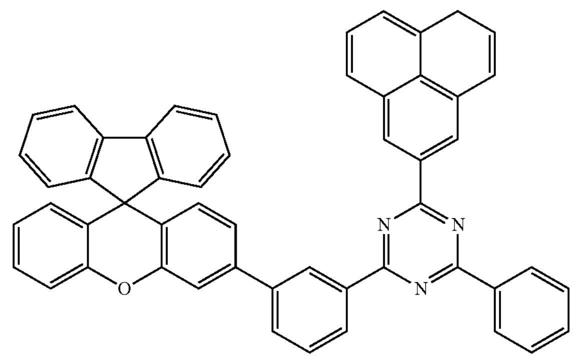
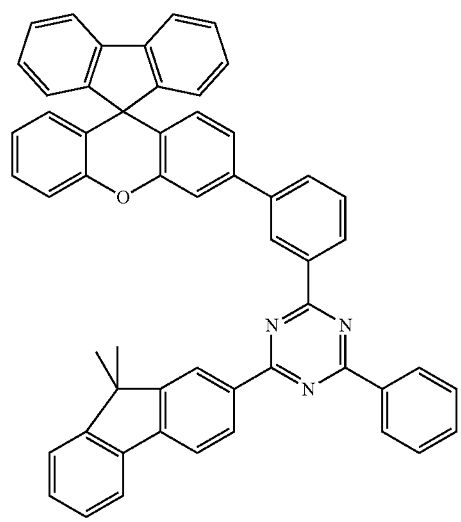
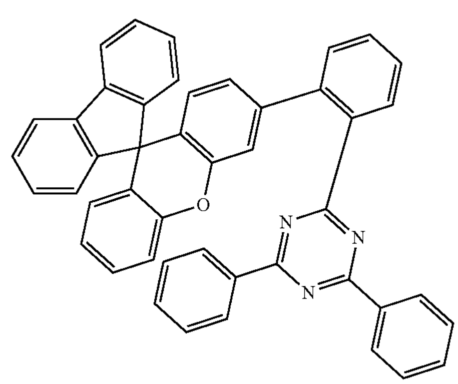

-continued
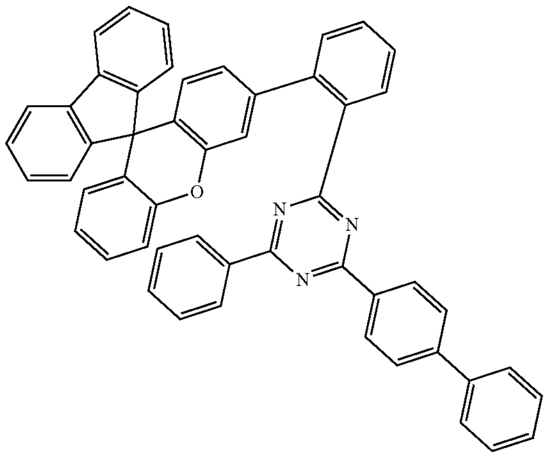
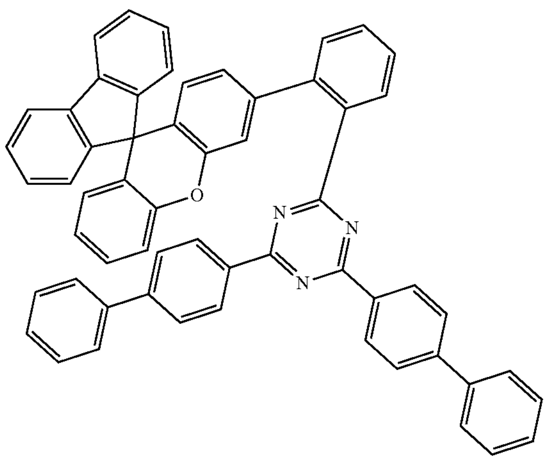
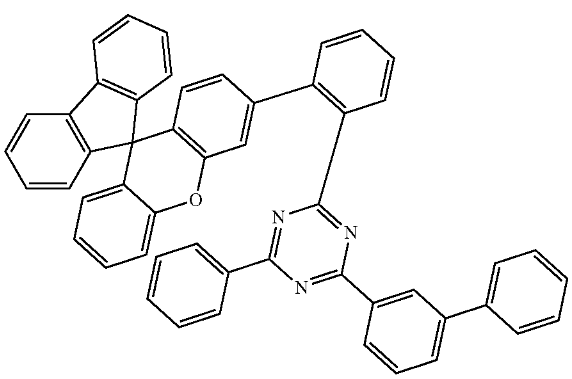
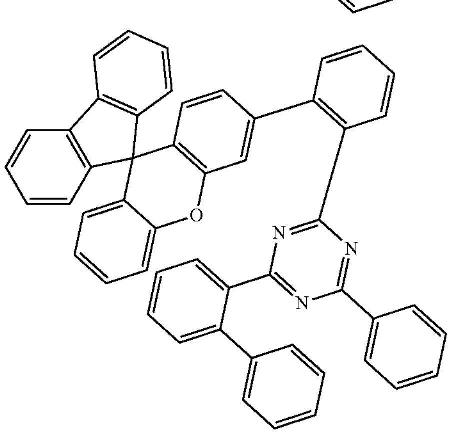
-continued
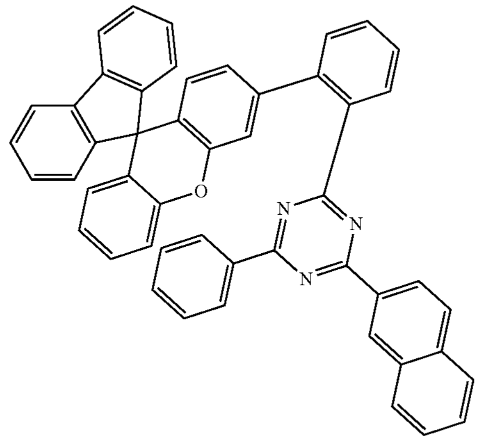
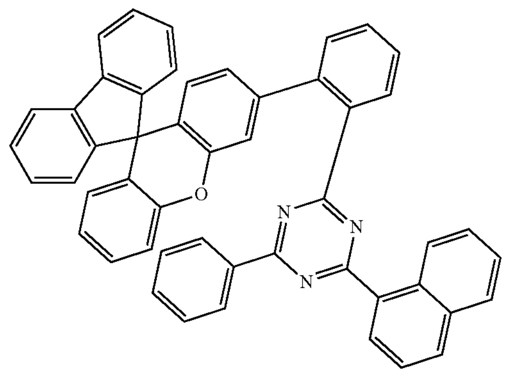
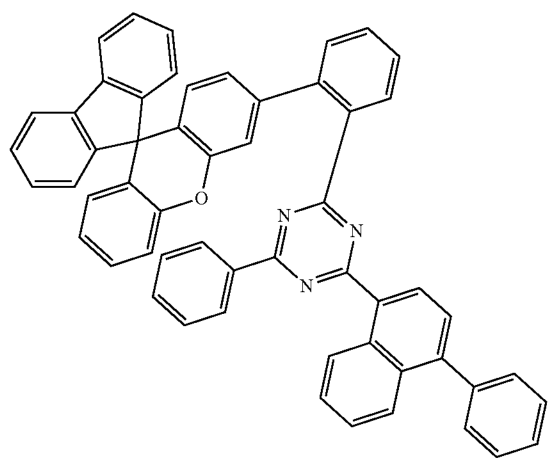
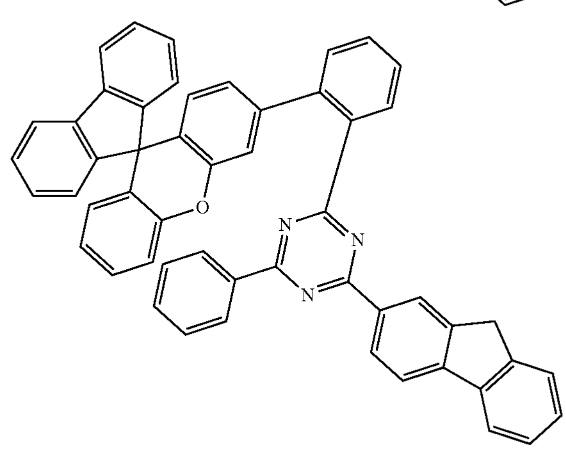

-continued
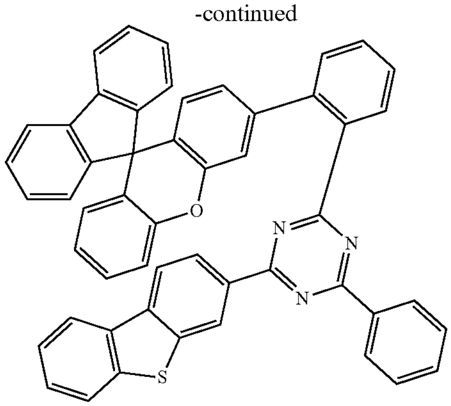
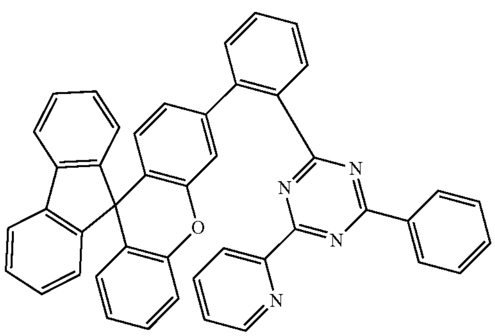
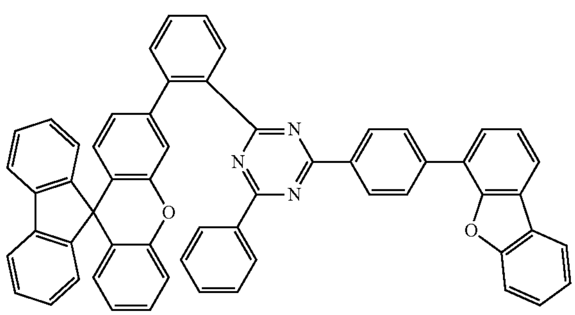
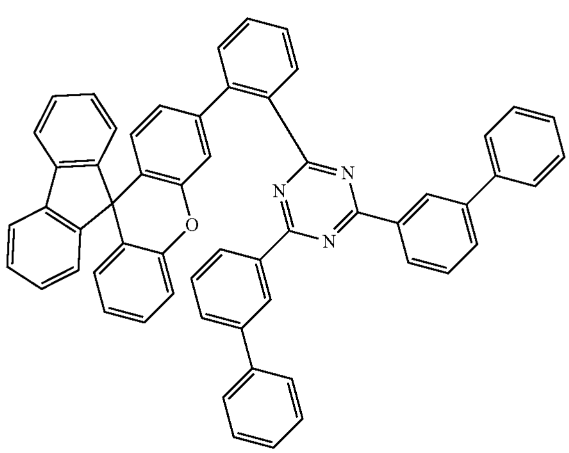
-continued
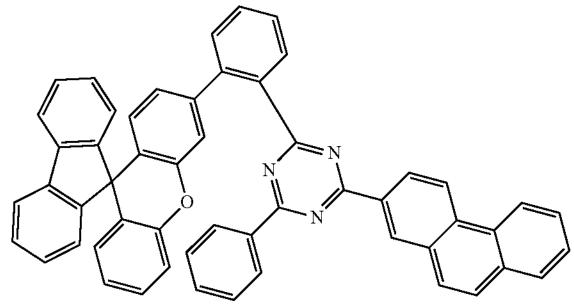
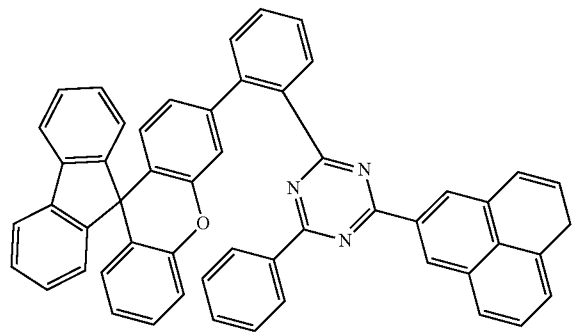
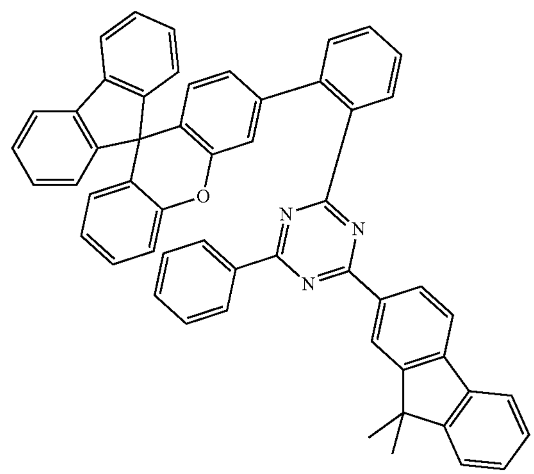
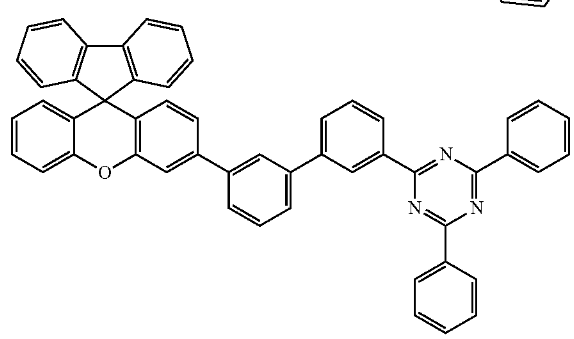
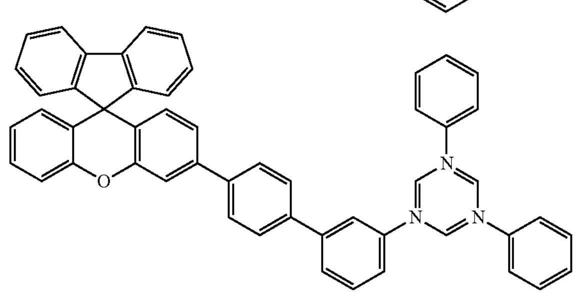

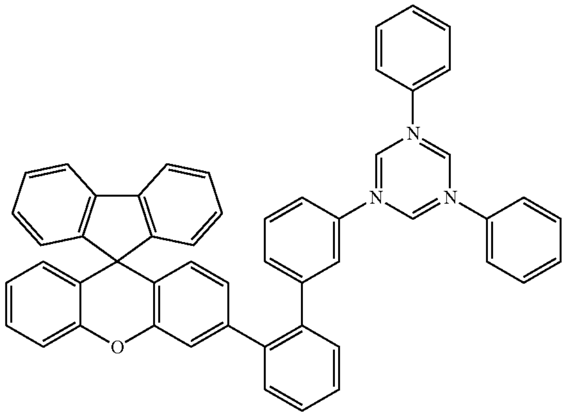
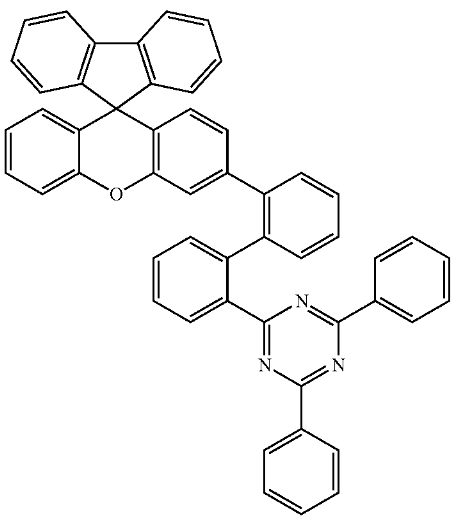
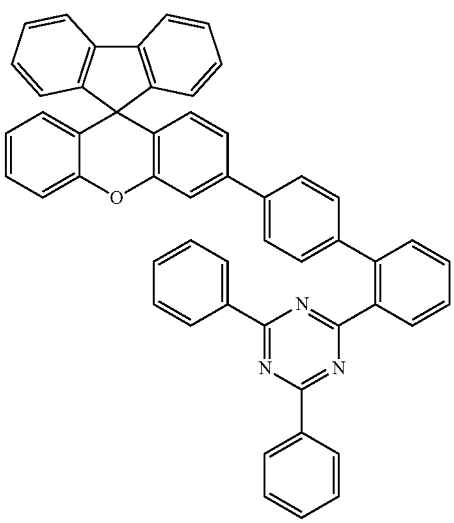
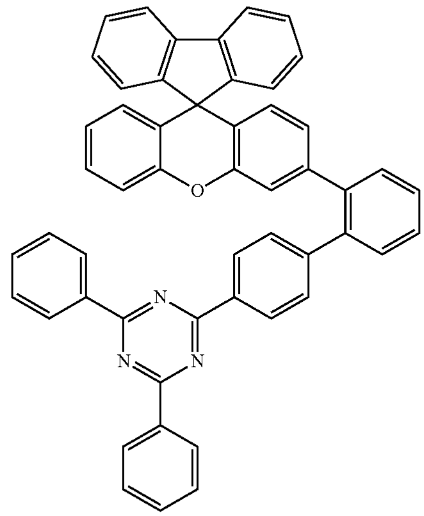
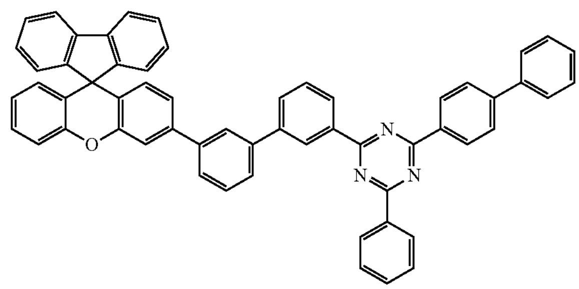
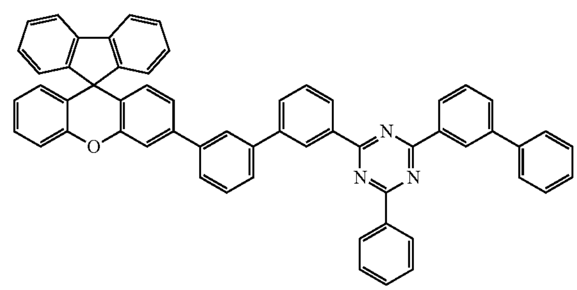
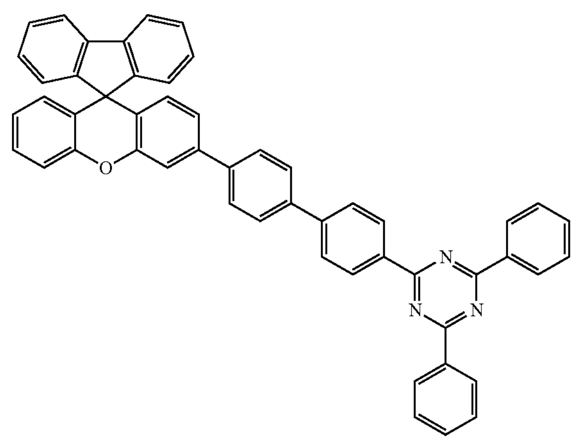

-continued
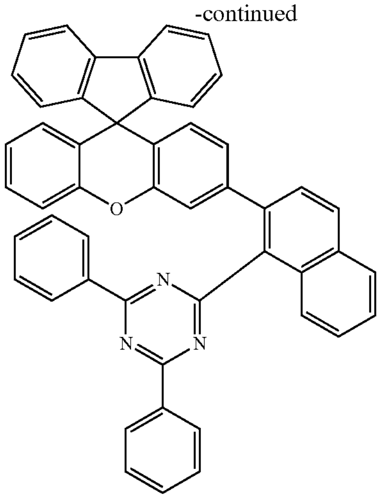
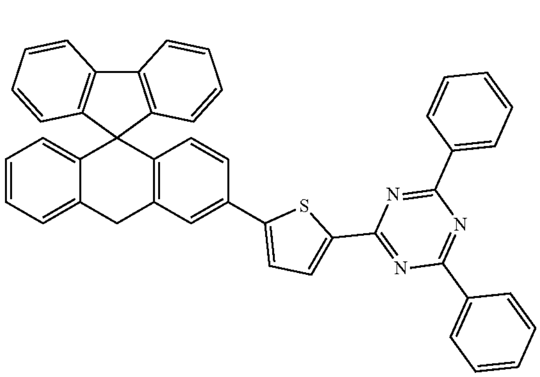
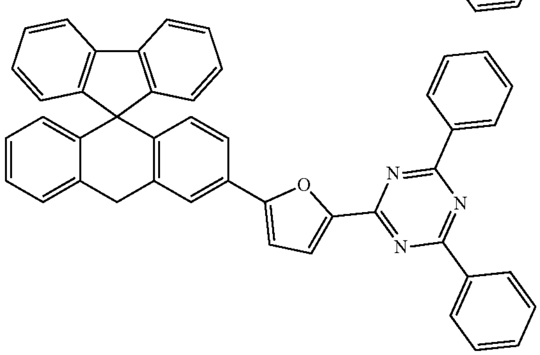
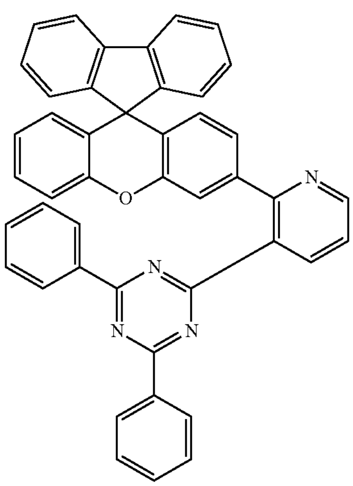
-continued
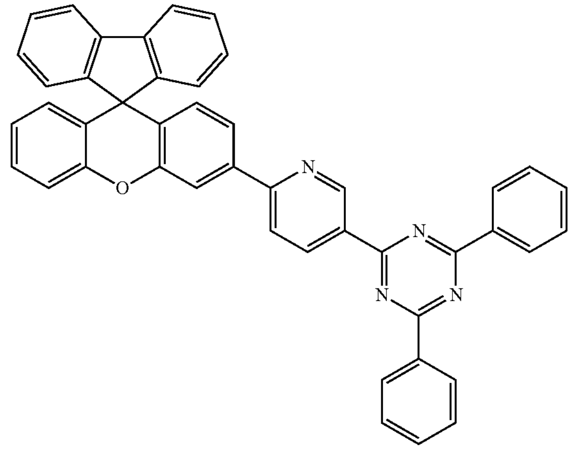
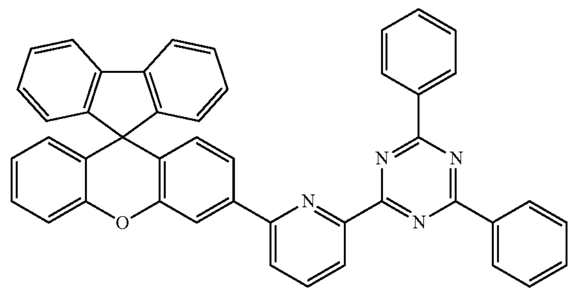
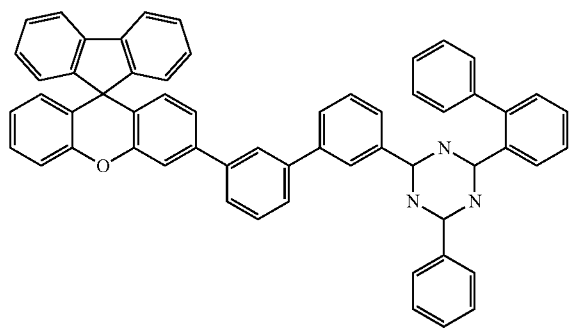
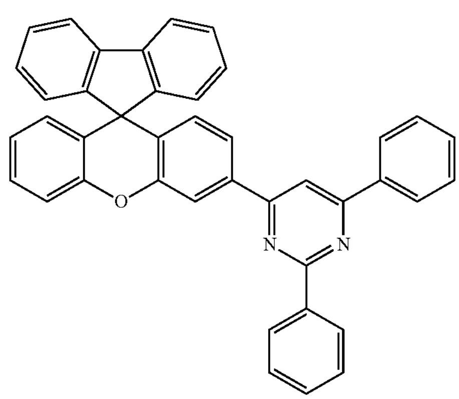

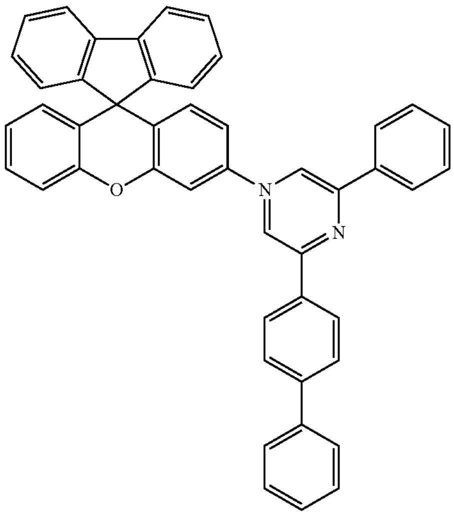
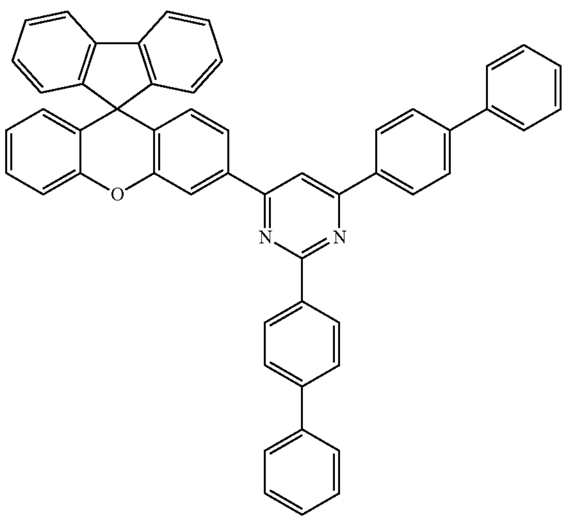
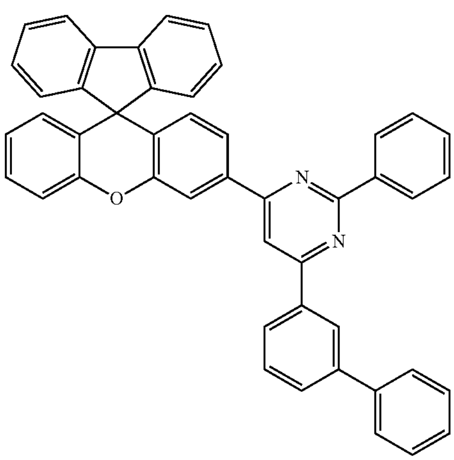
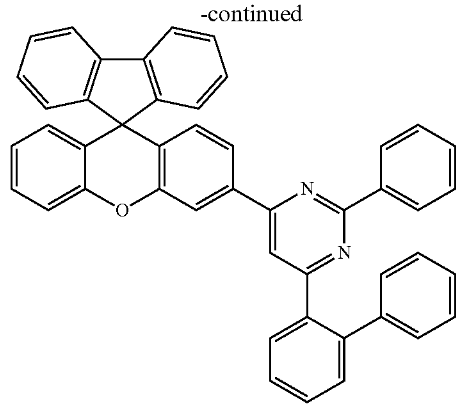
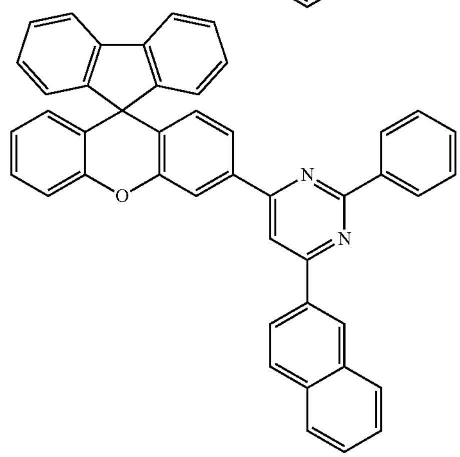
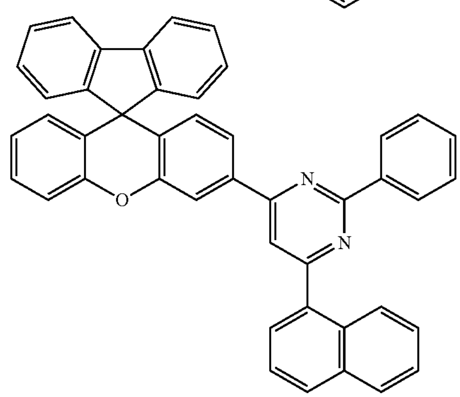
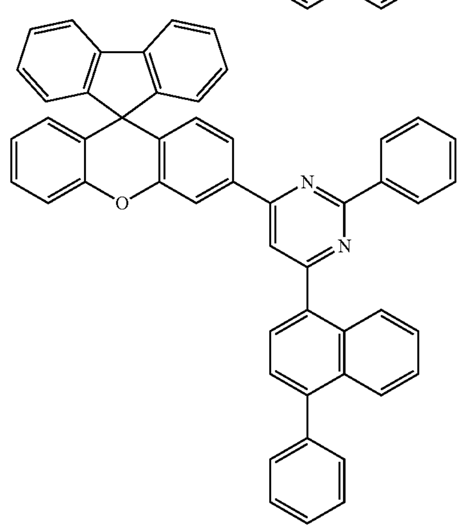
O
N
N -continued
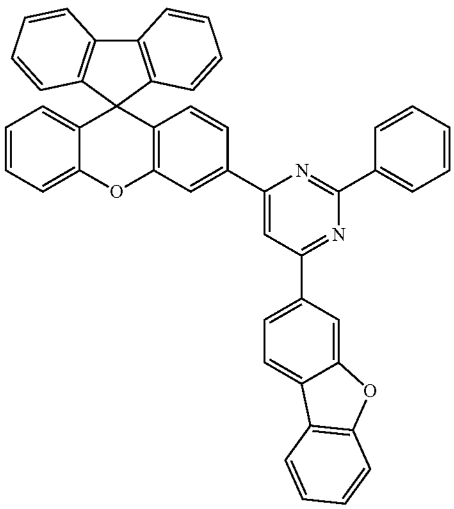
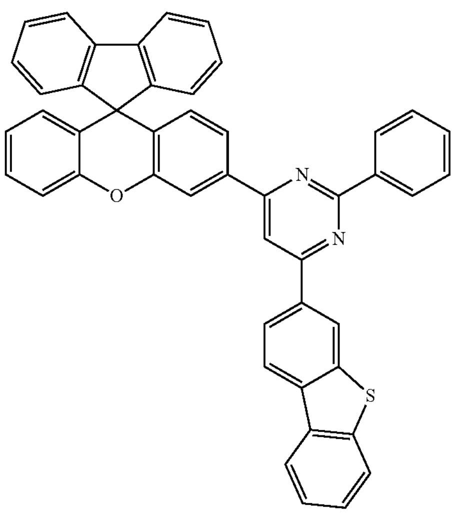
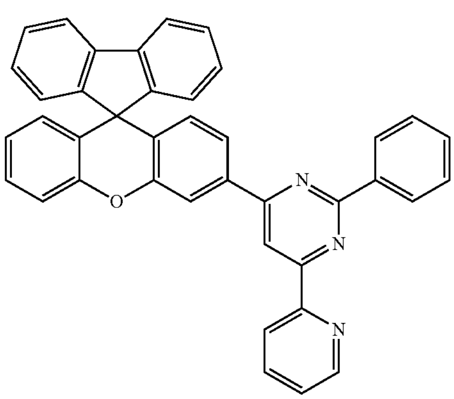
-continued
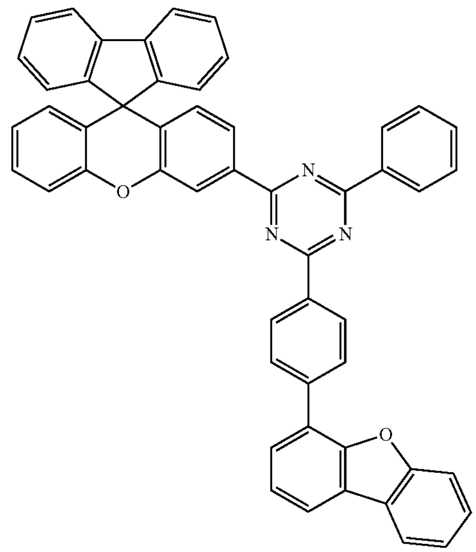
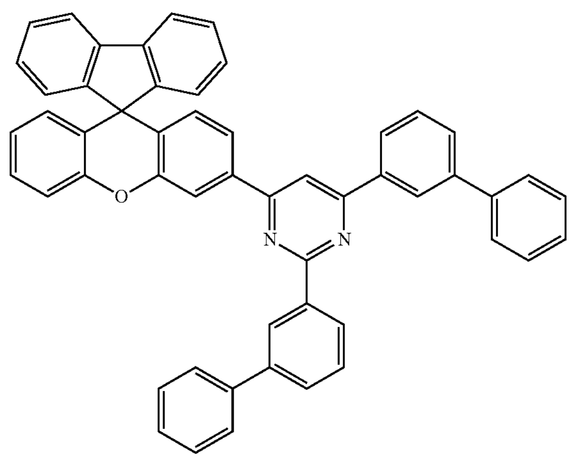
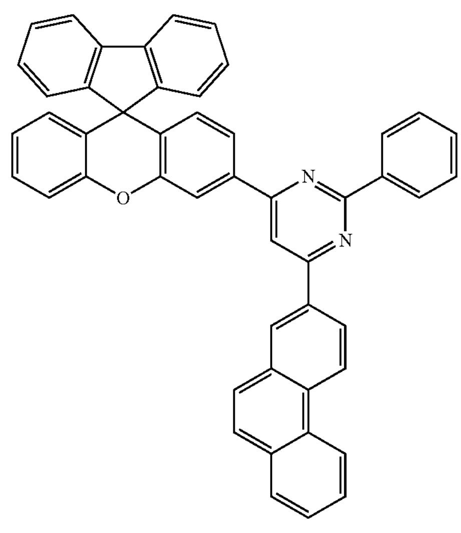

-continued
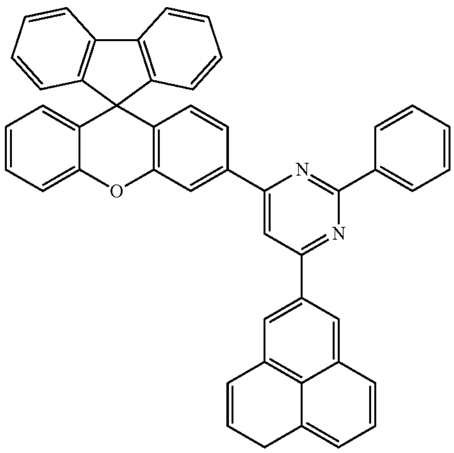
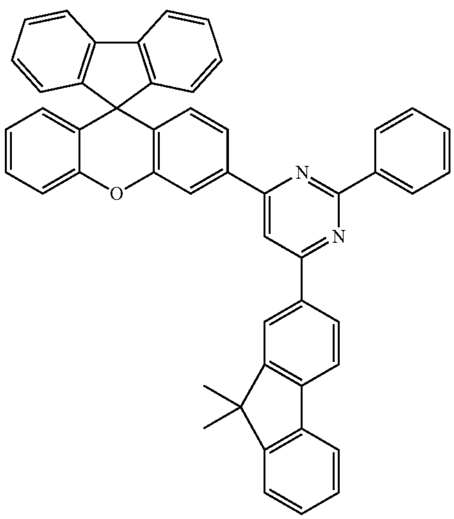
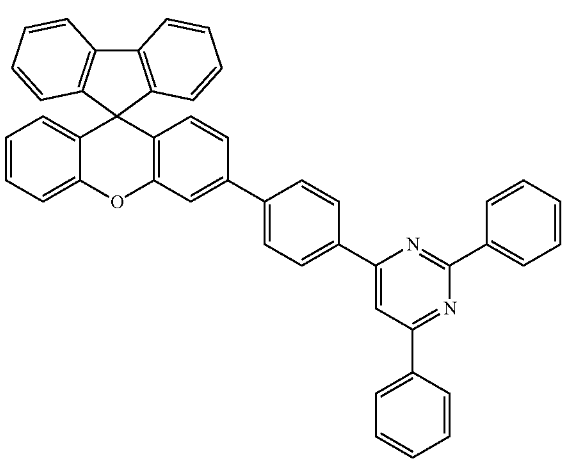
-continued
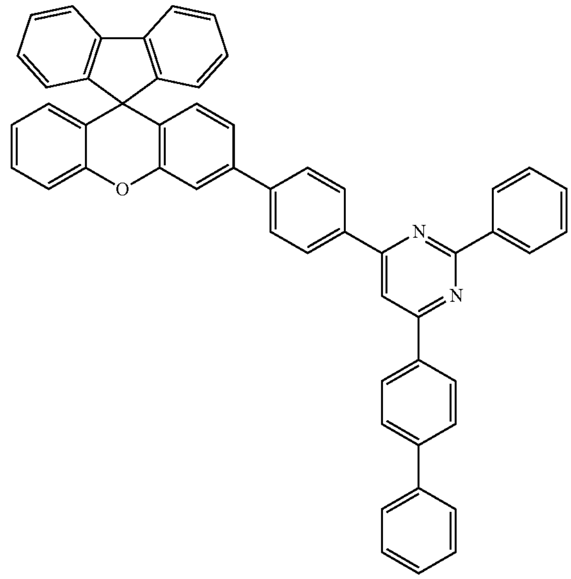
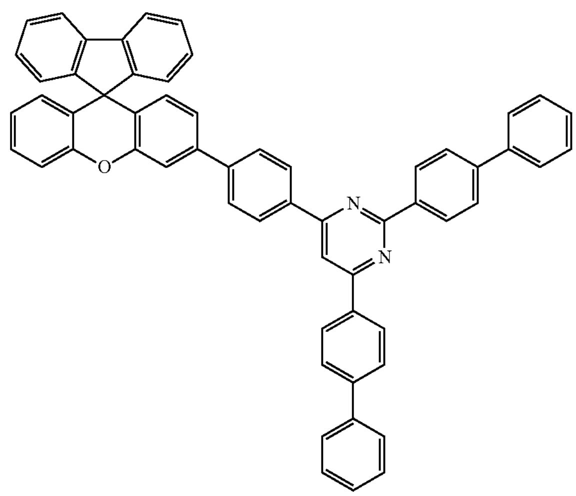
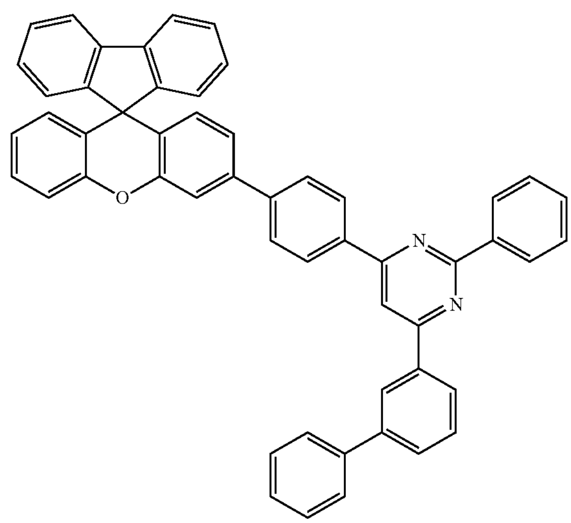

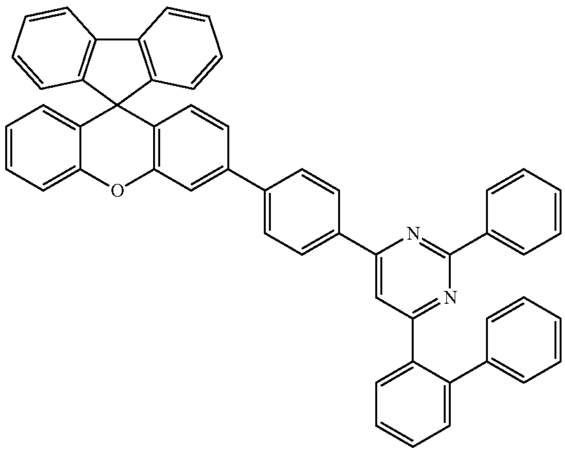
O
N
N
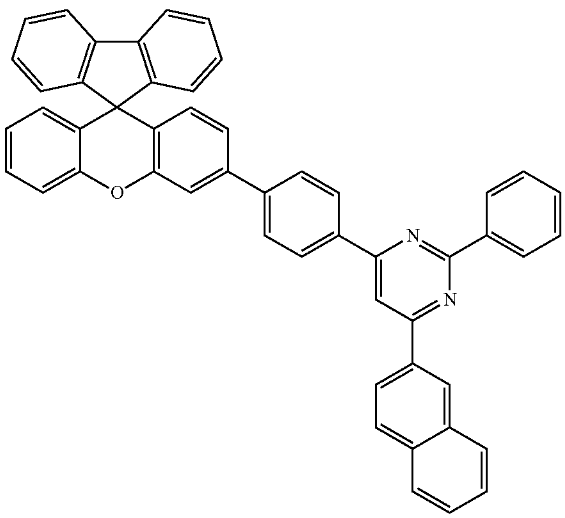
O
N
N
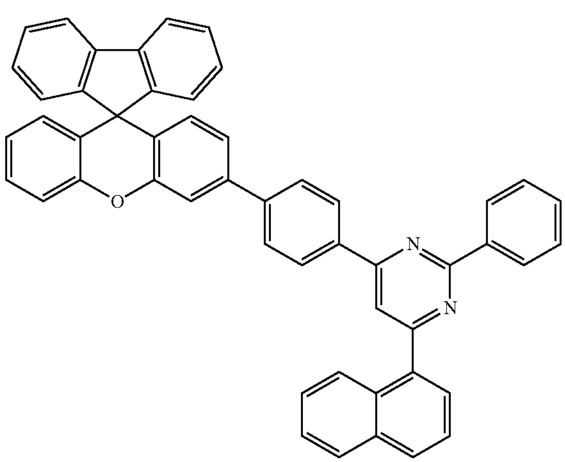
O
N
N
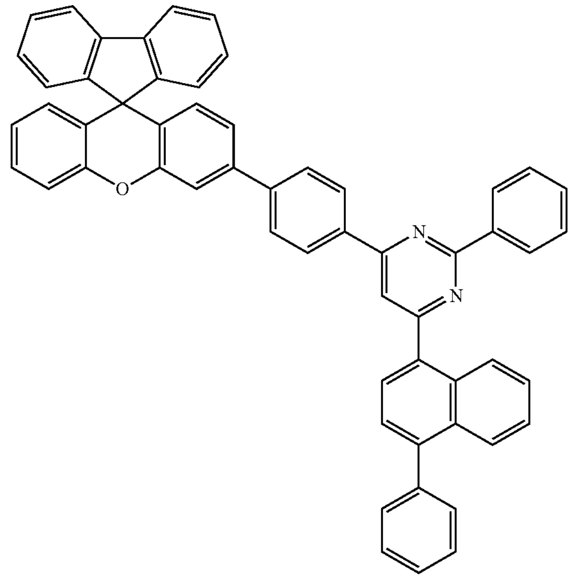
O
N
N
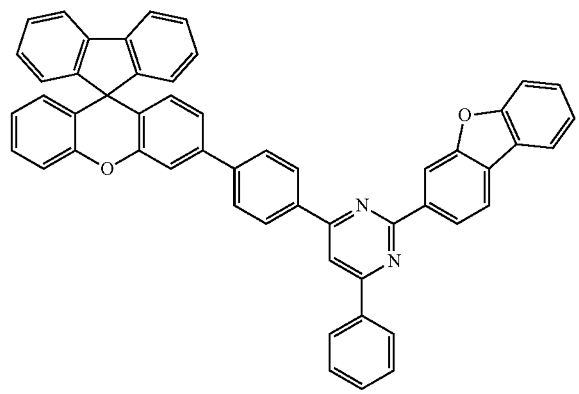
O
N
N
O
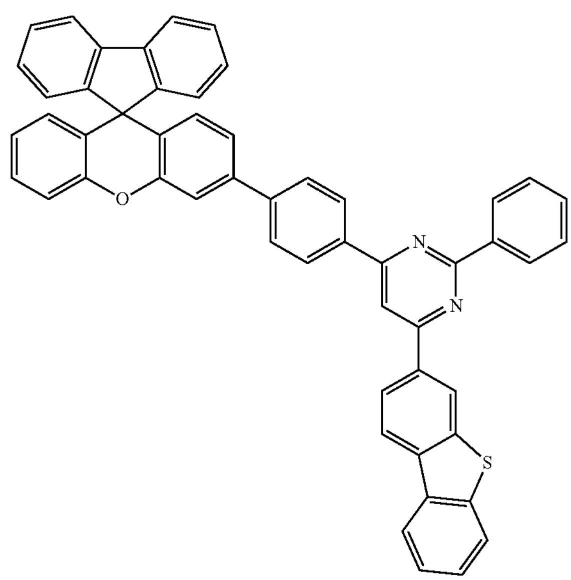
O
N
N
S -continued
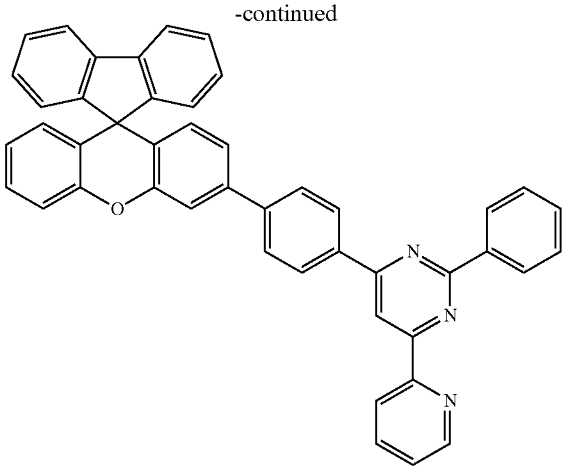
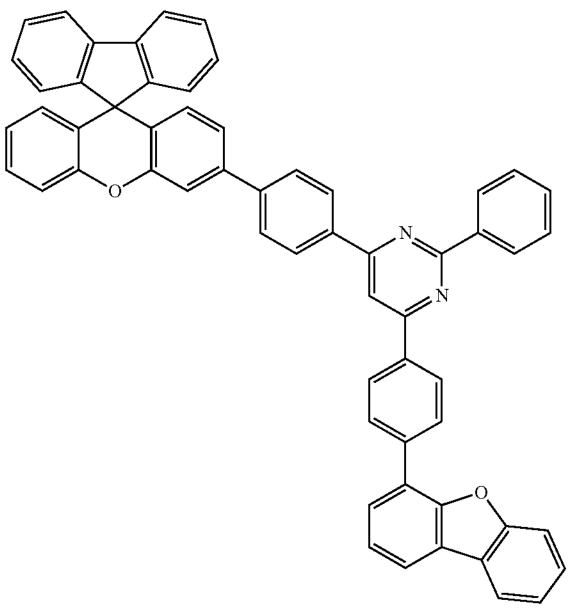
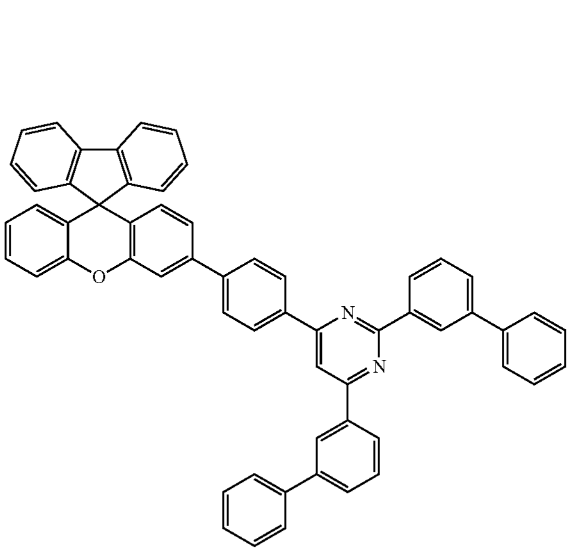
-continued
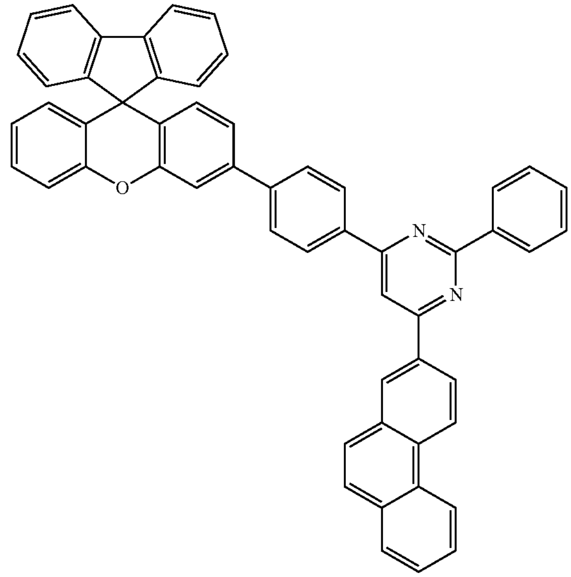
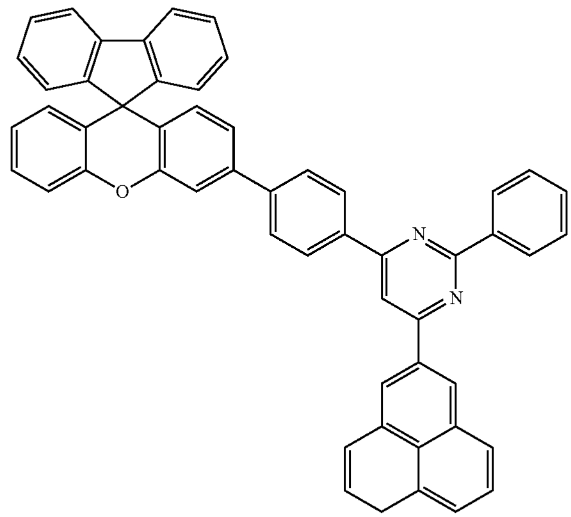
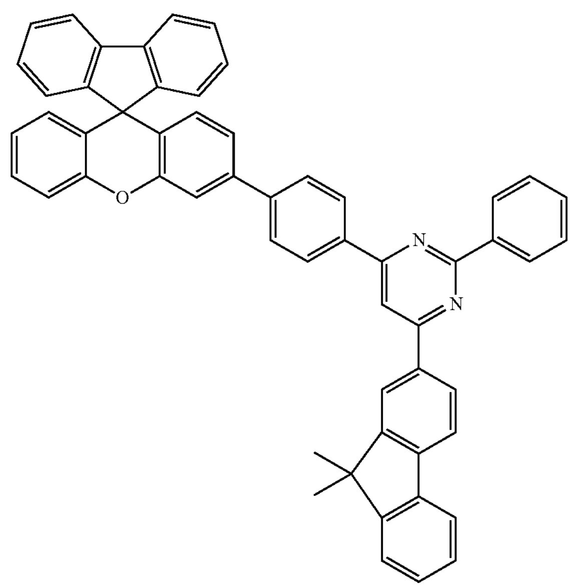

-continued
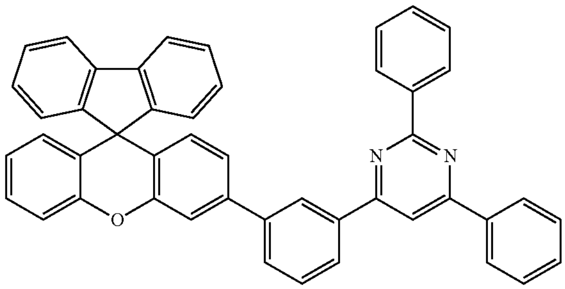
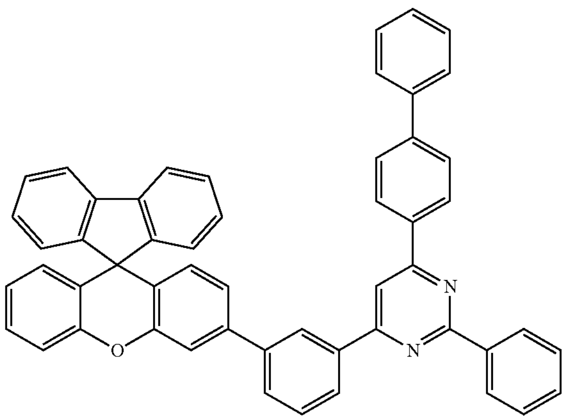
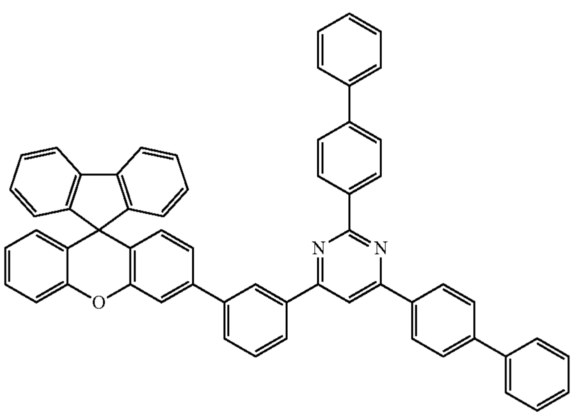
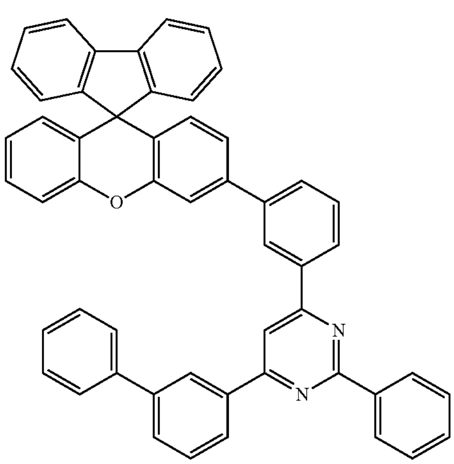
-continued
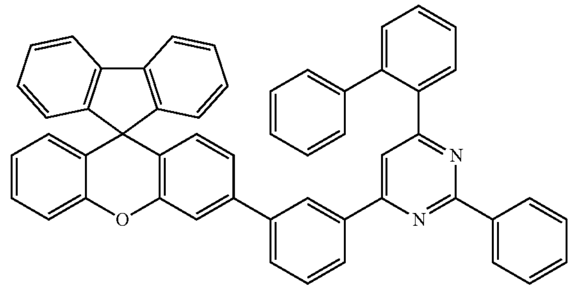
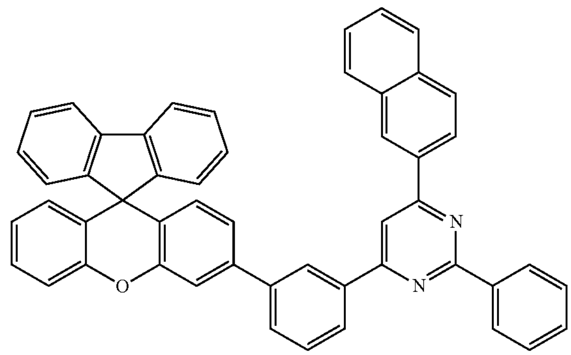
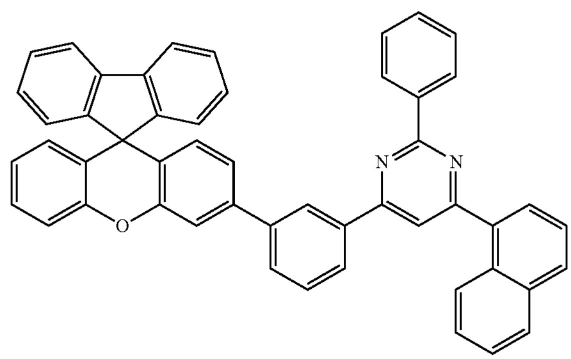
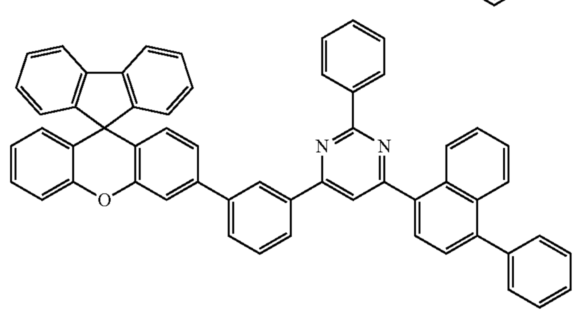
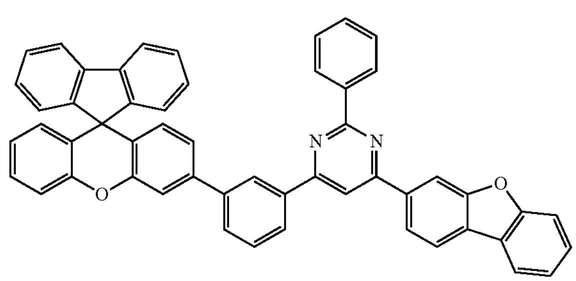

-continued
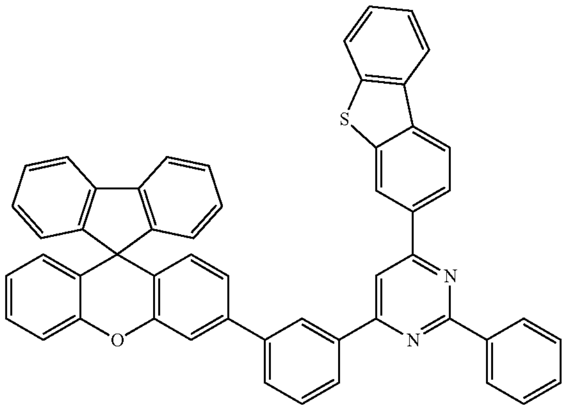
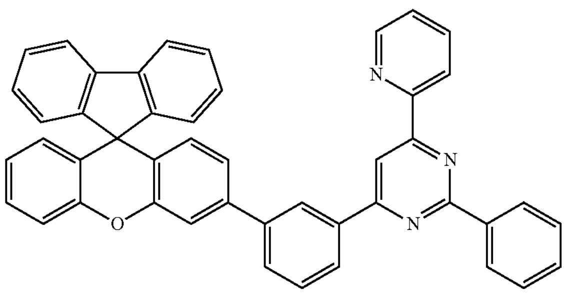
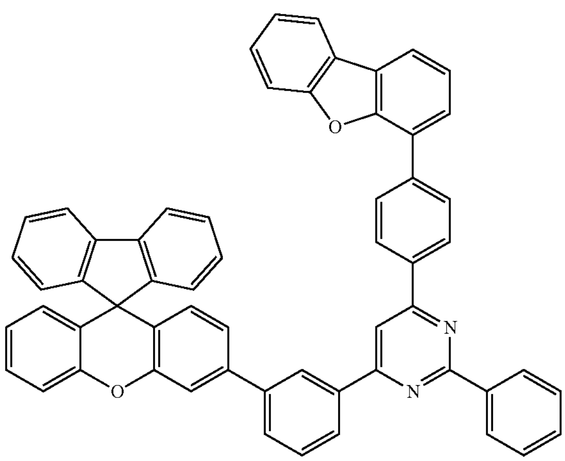
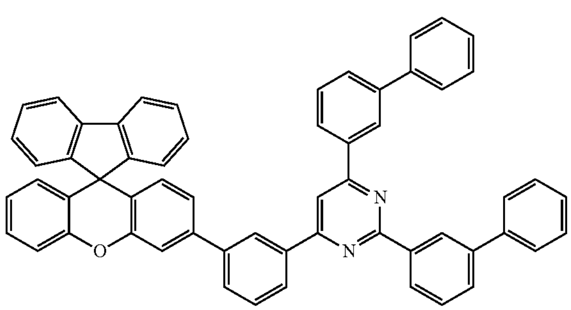
-continued
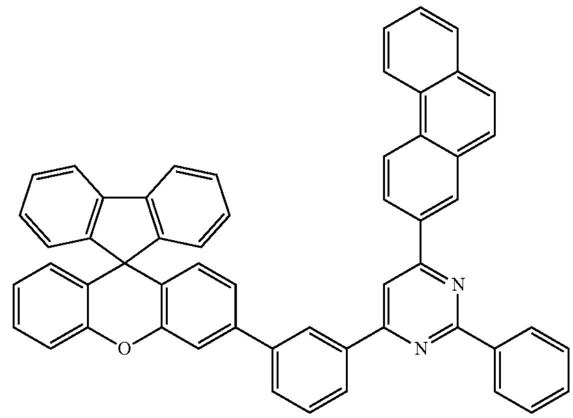
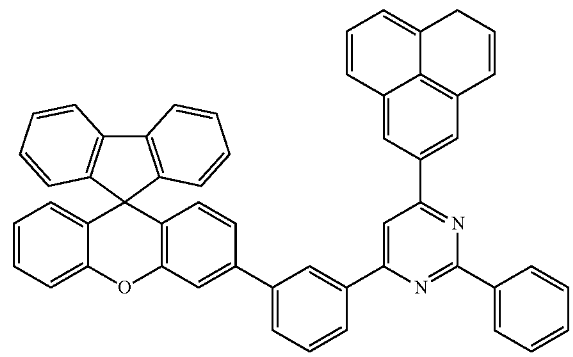
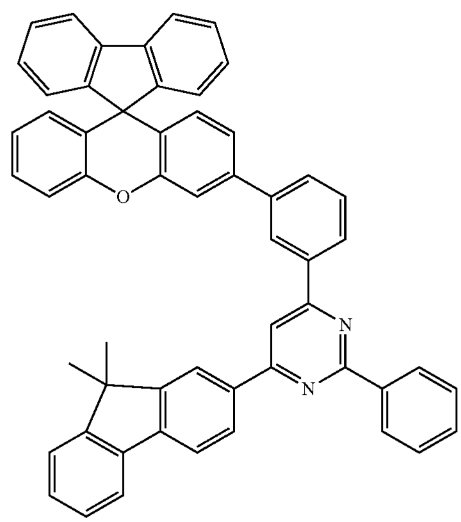
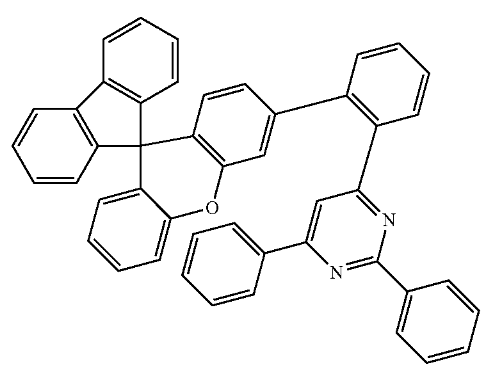

-continued
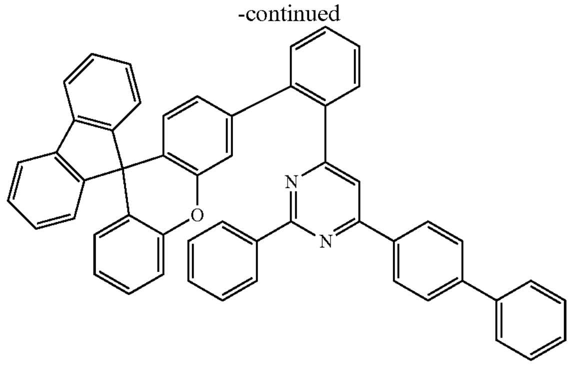
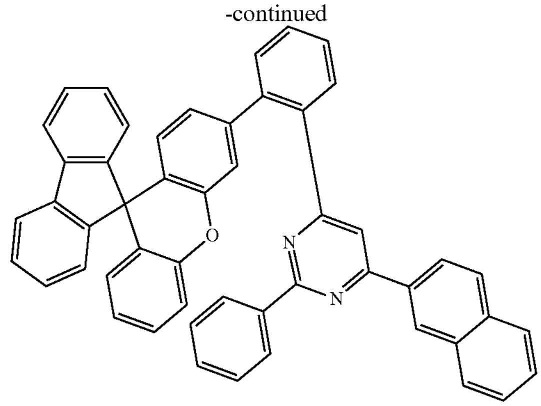
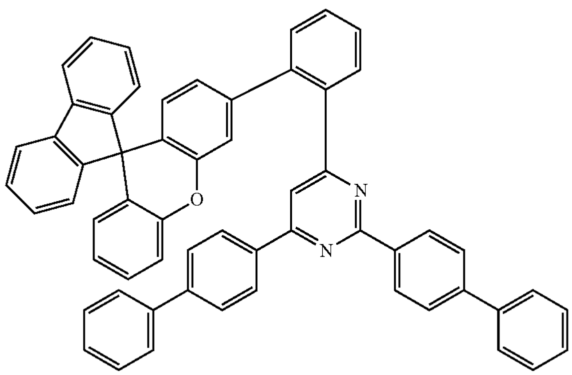
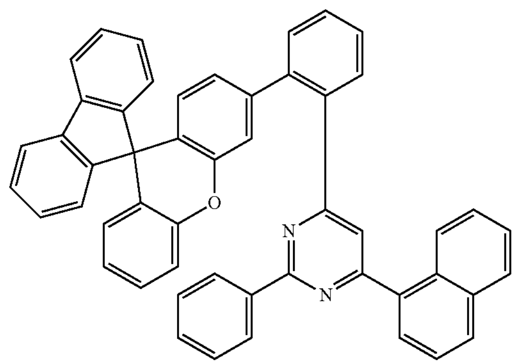
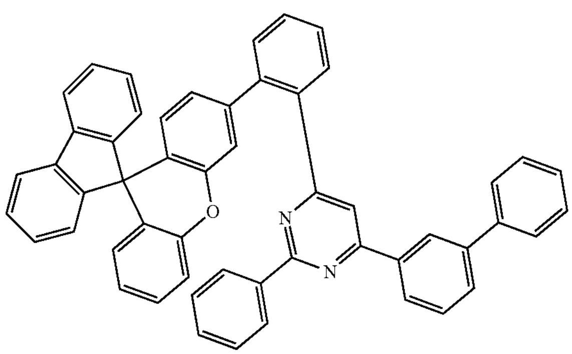
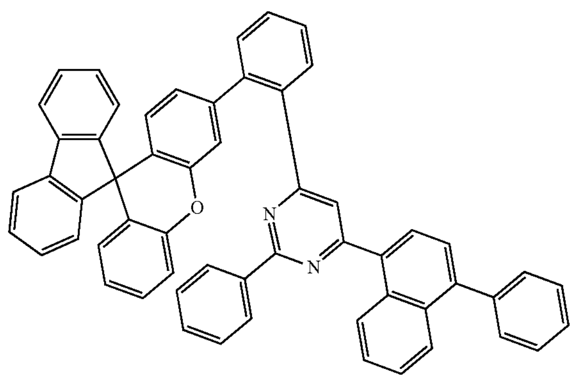
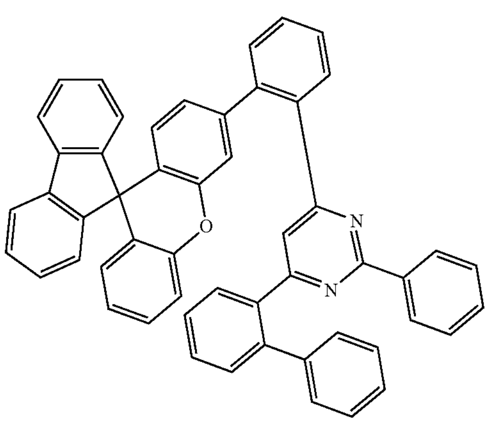
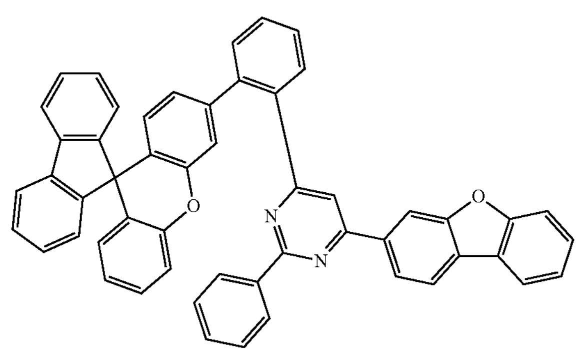

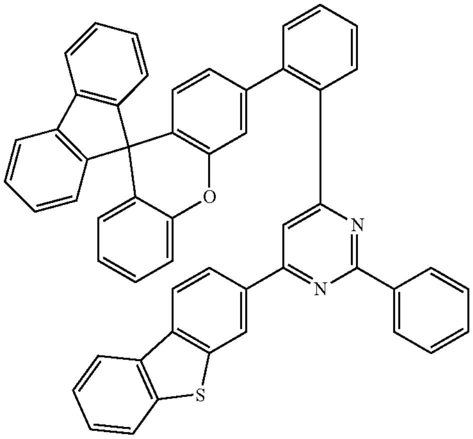
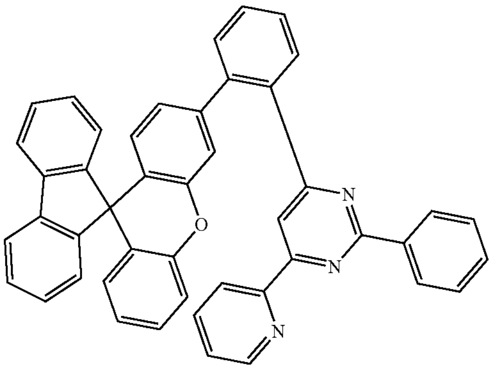
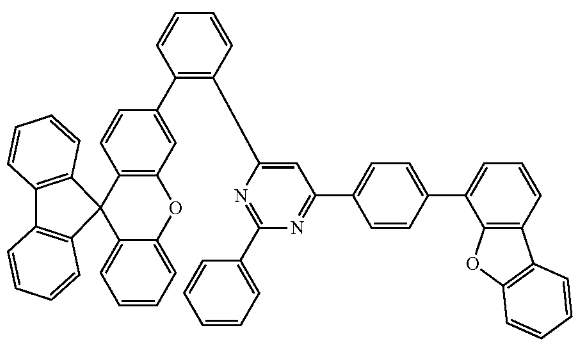
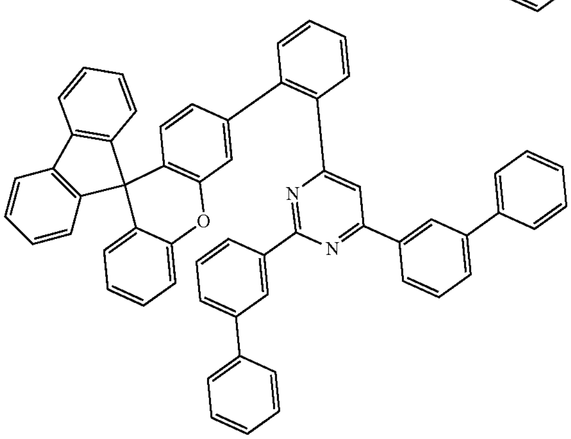
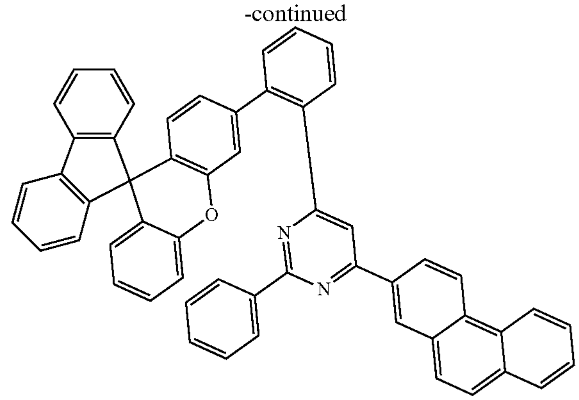
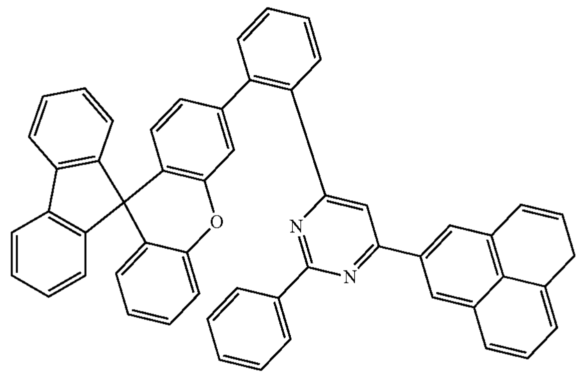
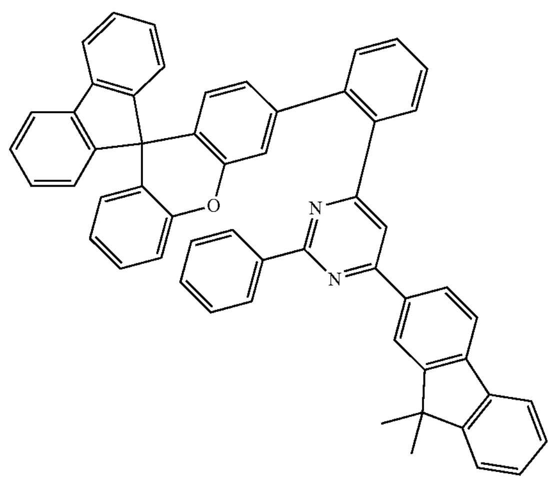
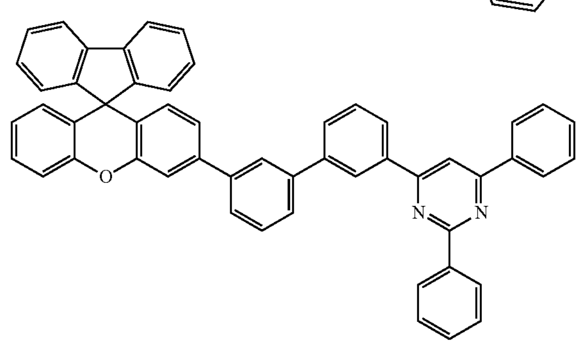

-continued
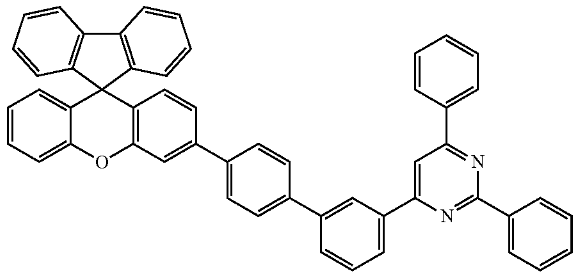
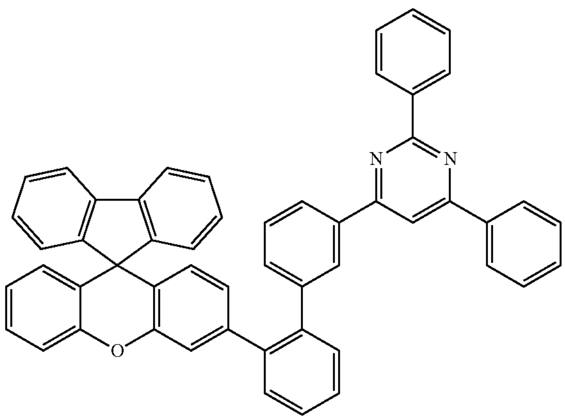
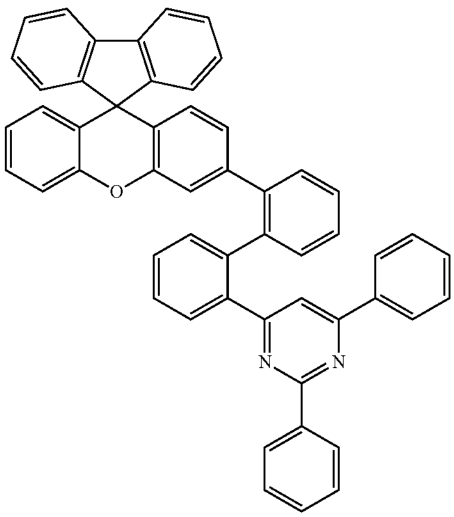
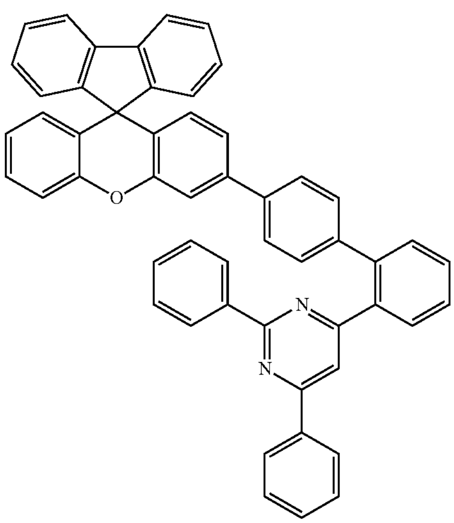
-continued
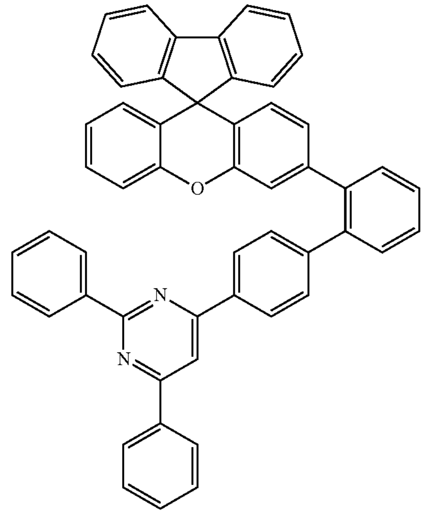
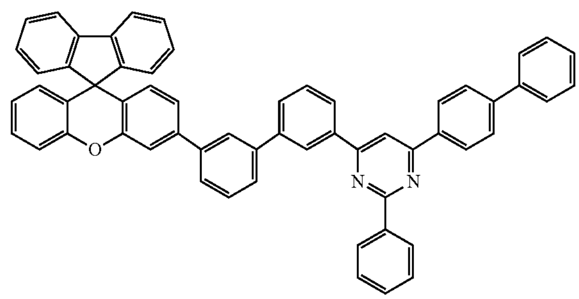
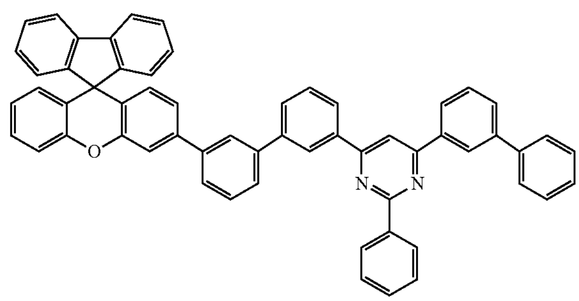
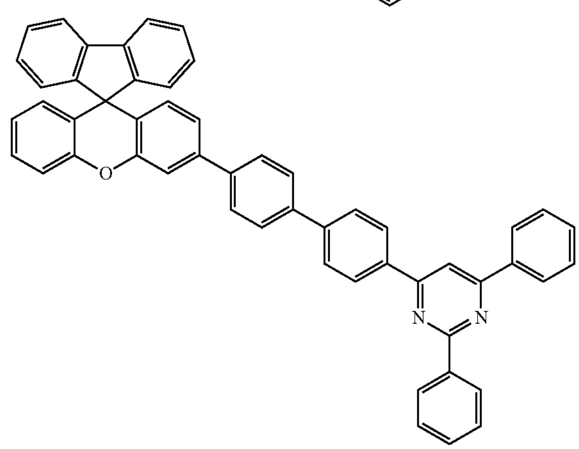

-continued
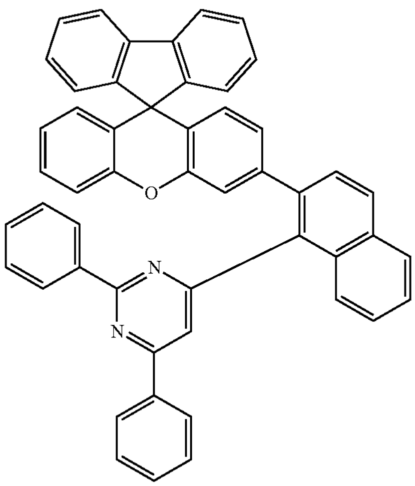
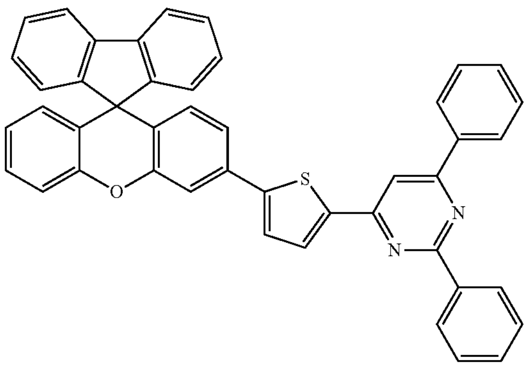
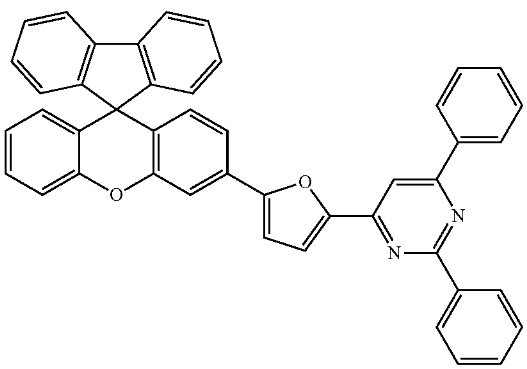
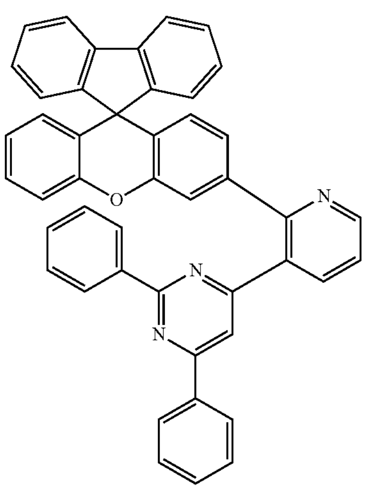
-continued
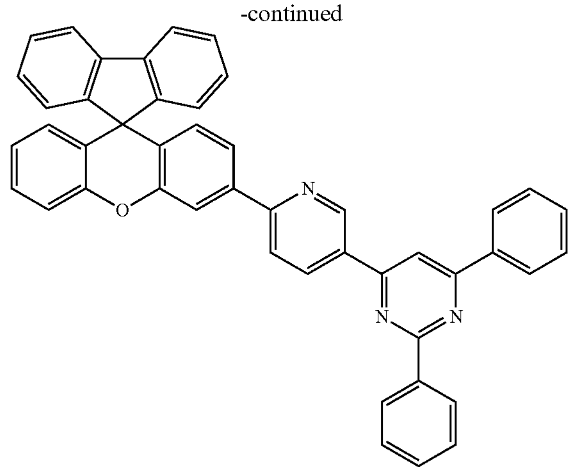
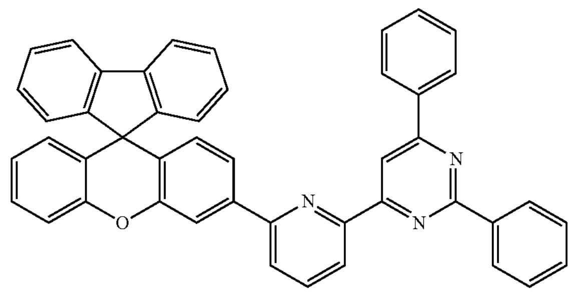
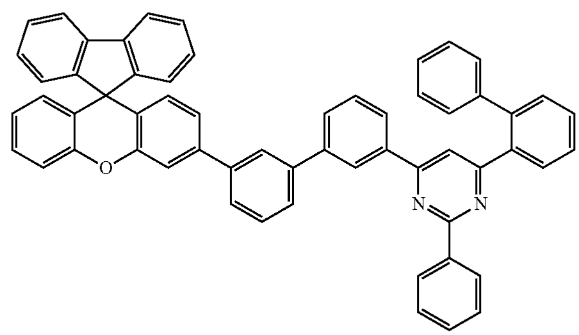
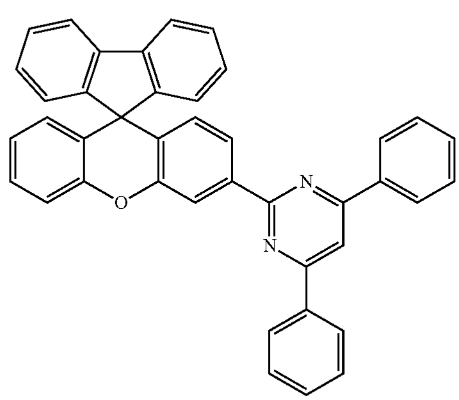

-continued
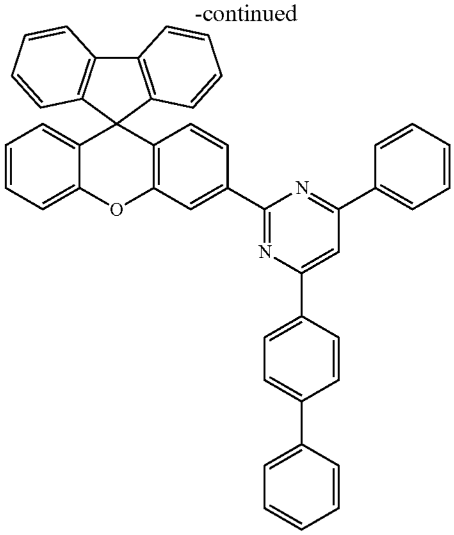
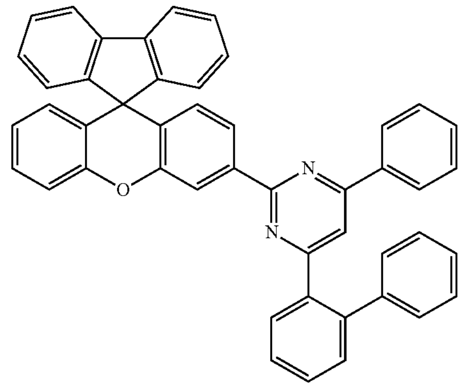
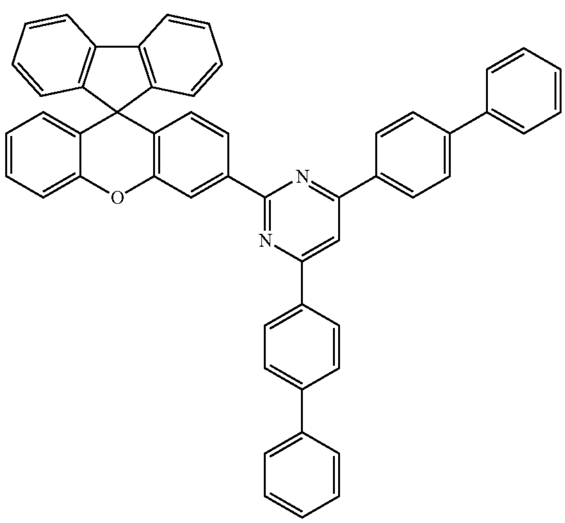
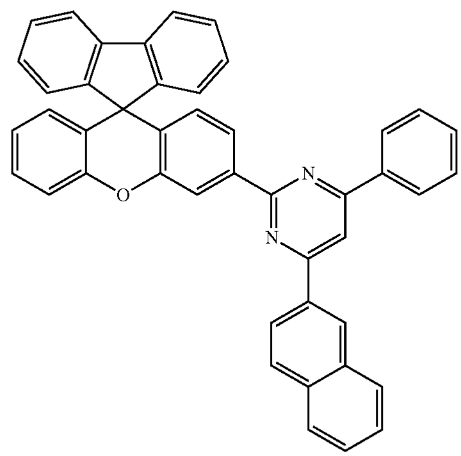
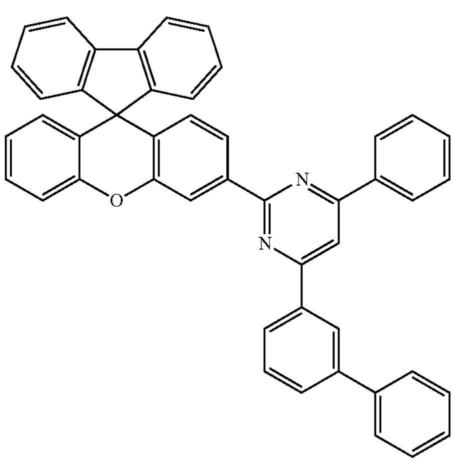
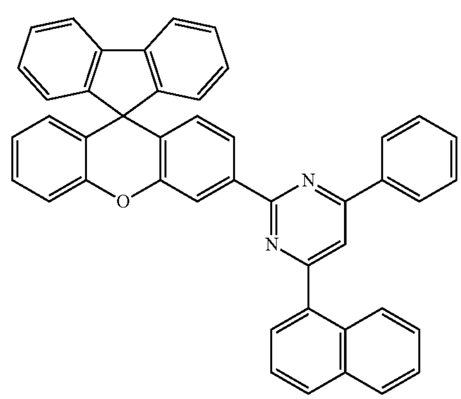
-continued -continued
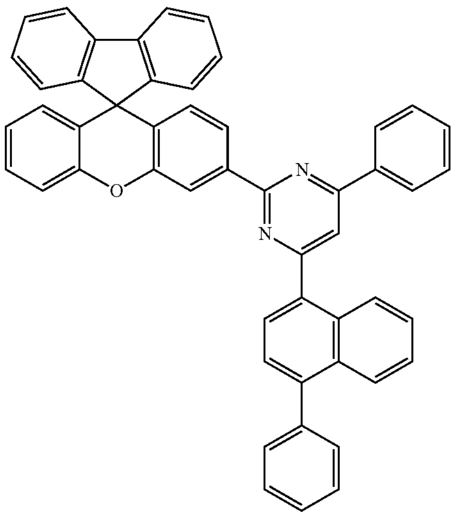
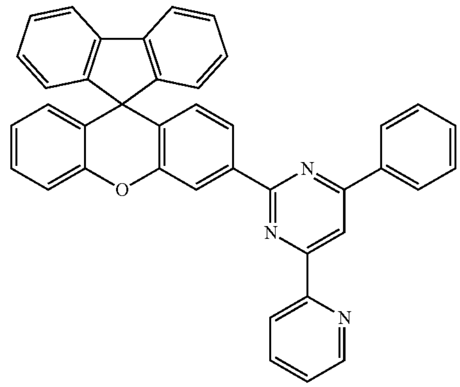
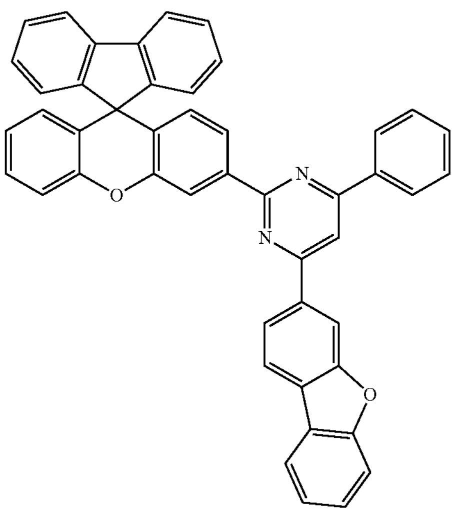
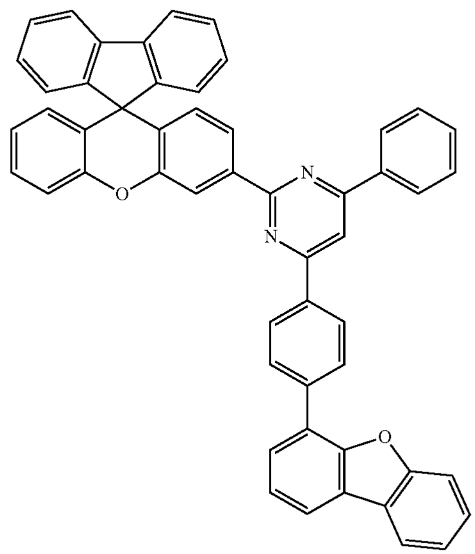
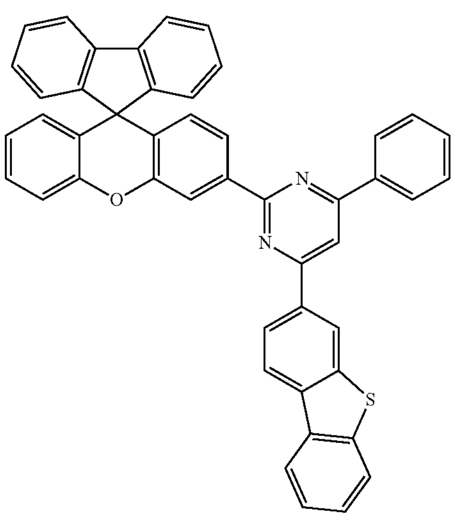
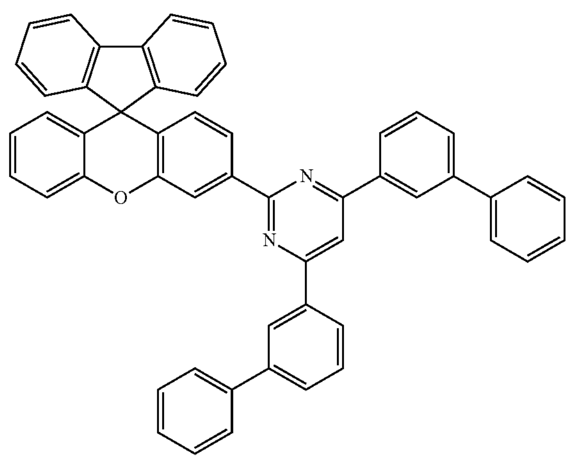
-continued

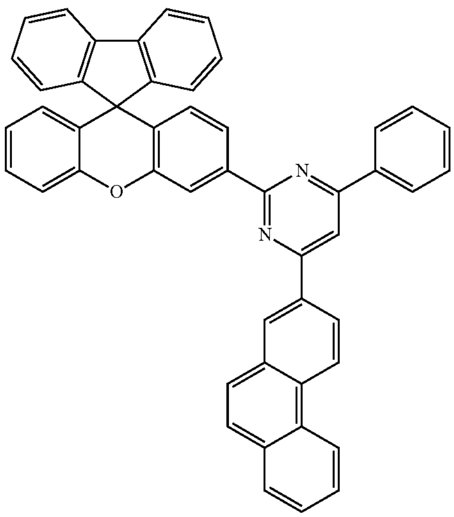
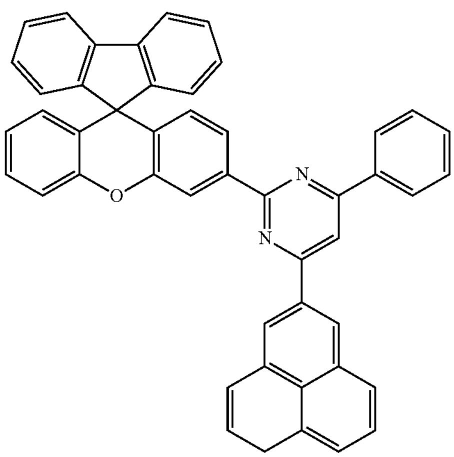
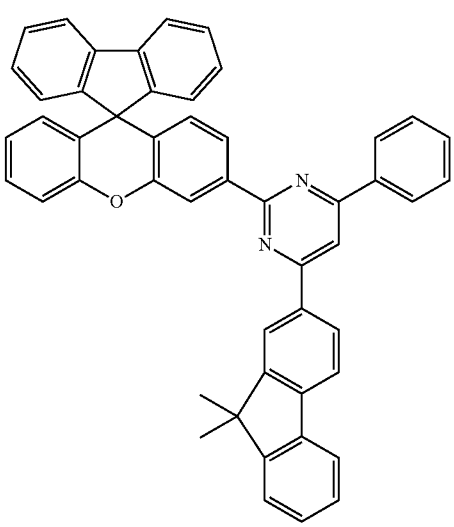
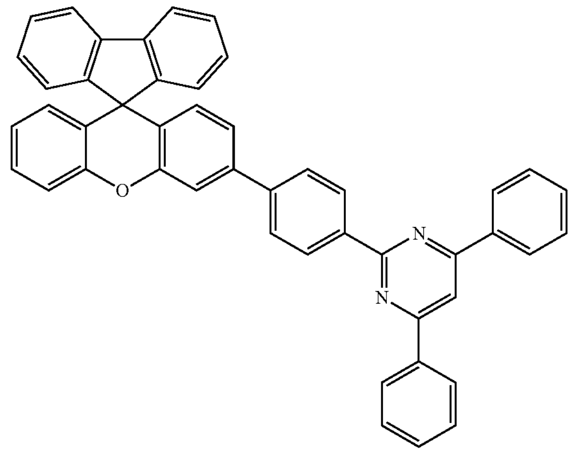
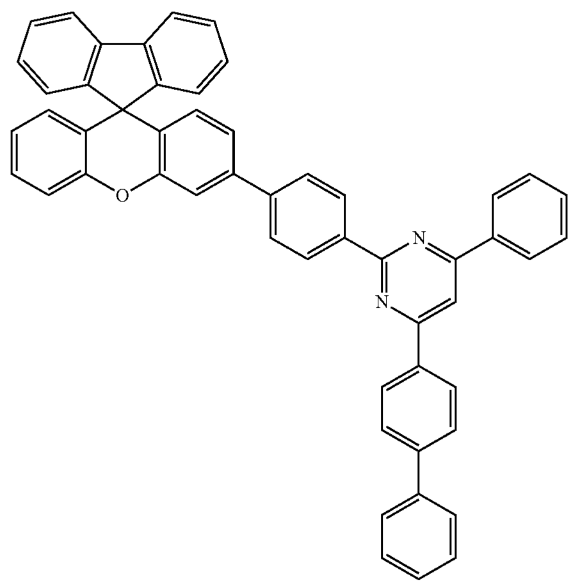
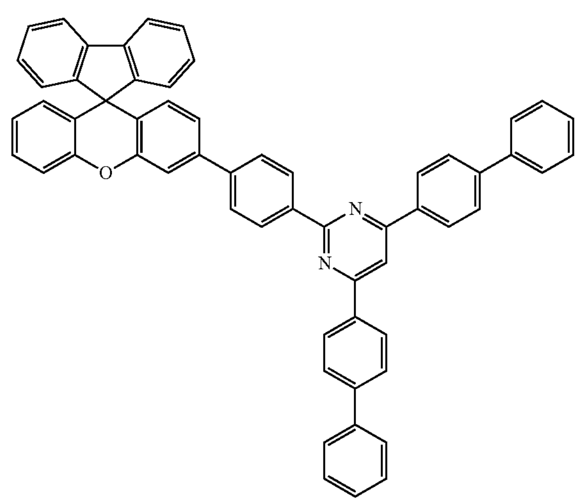

-continued
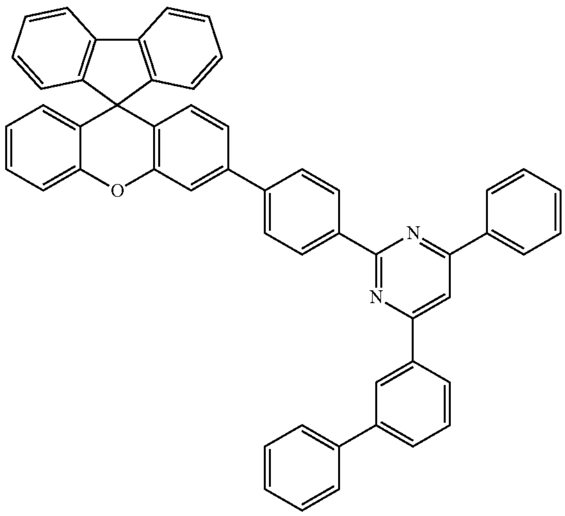
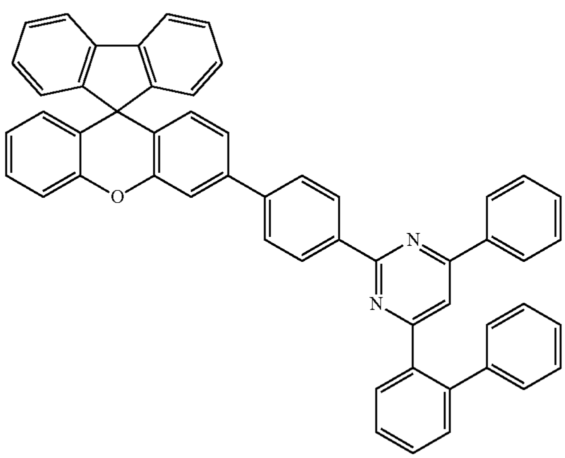
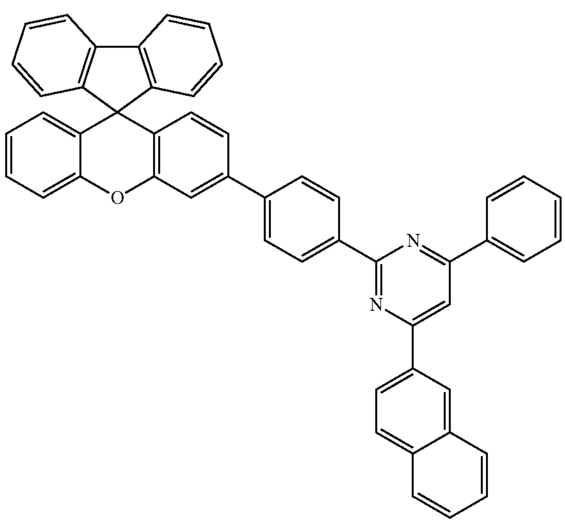
-continued
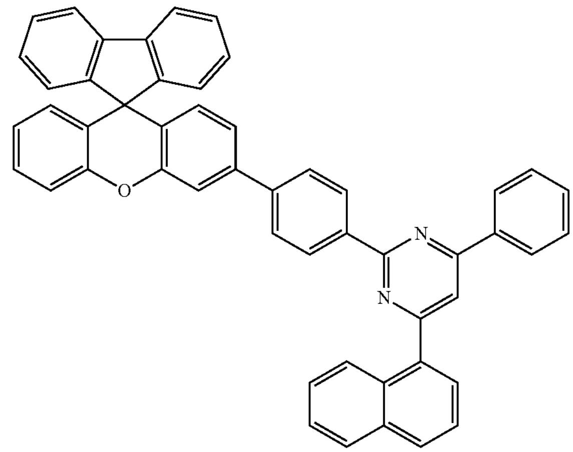
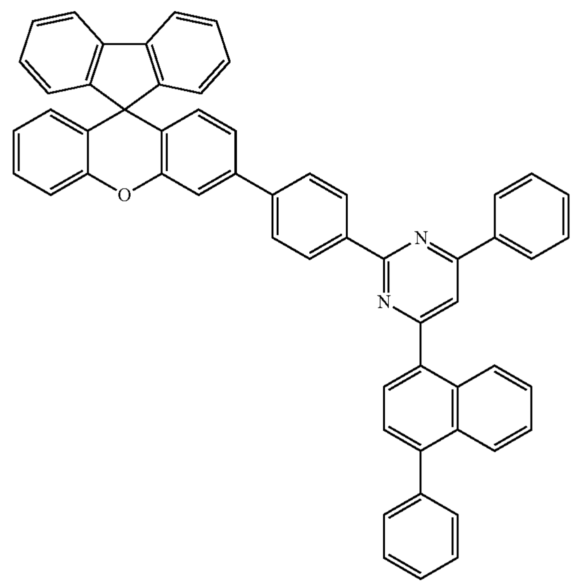
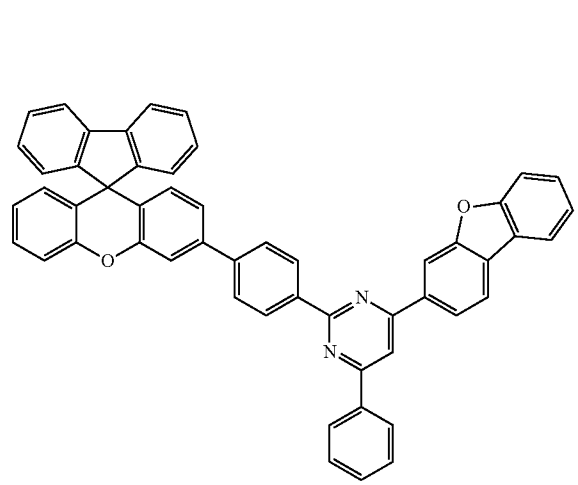

-continued
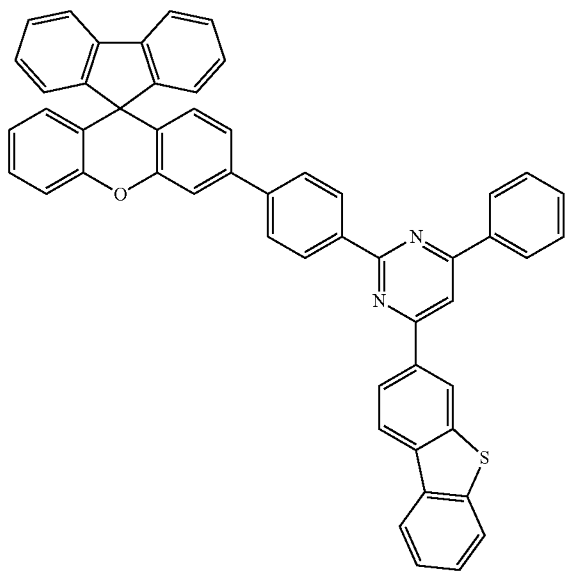
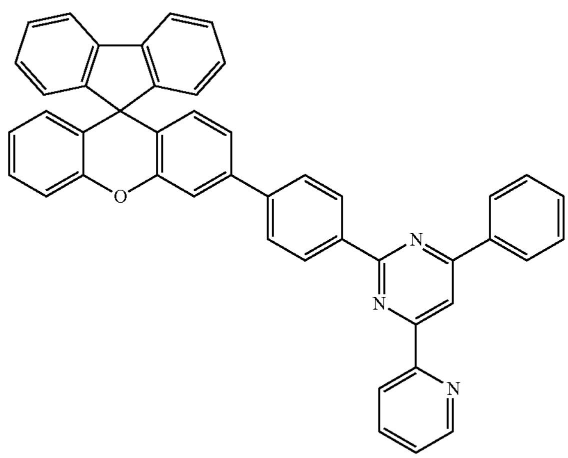
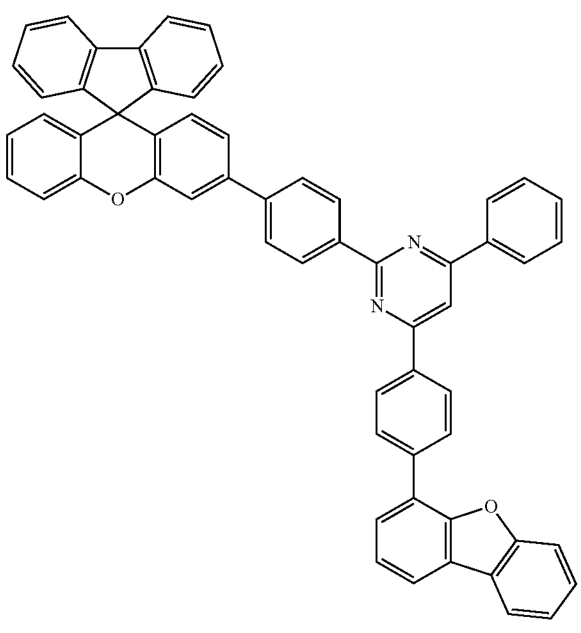
-continued
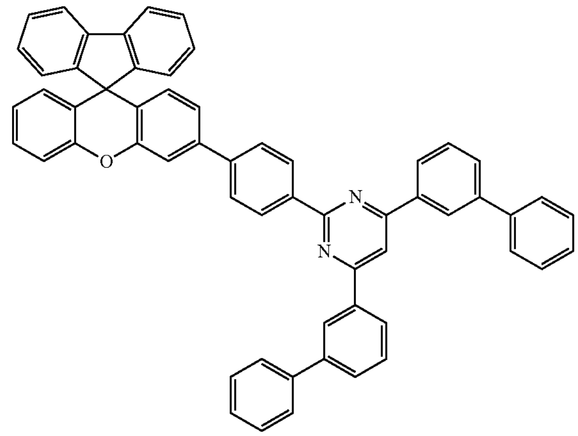
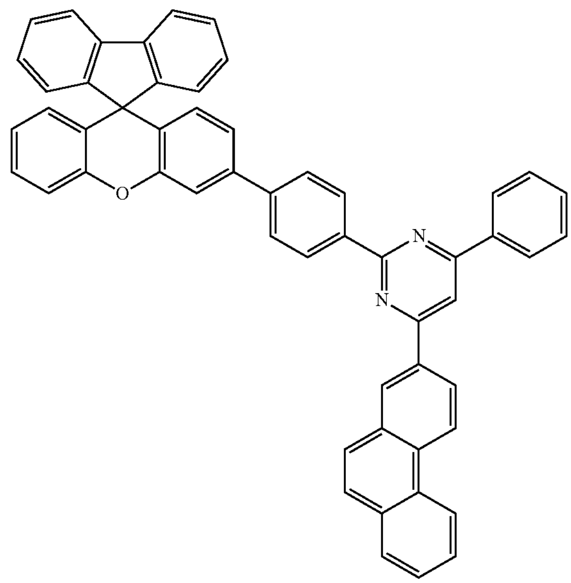
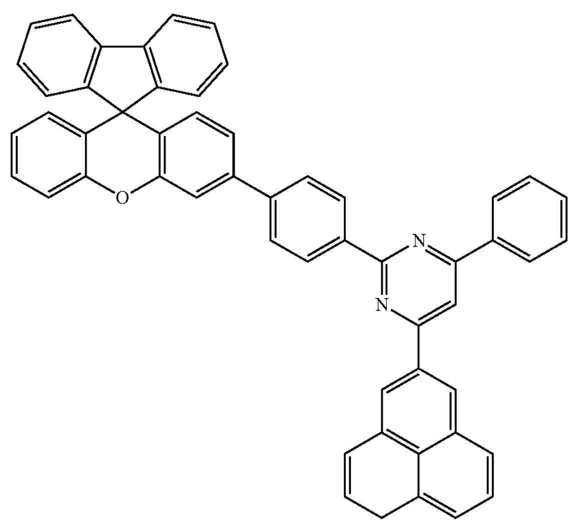

-continued
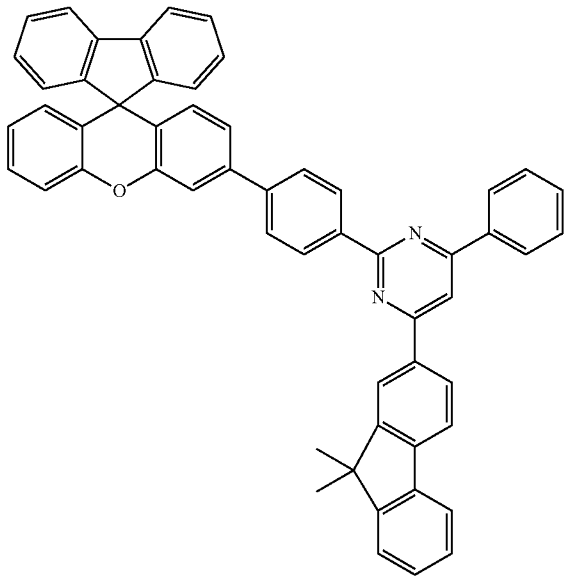
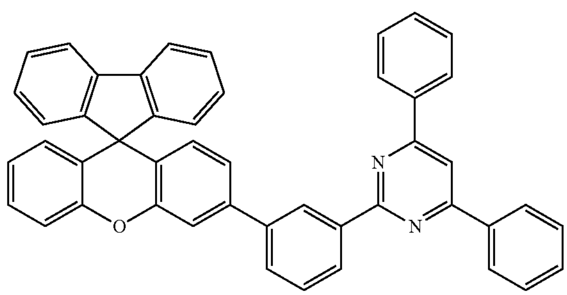
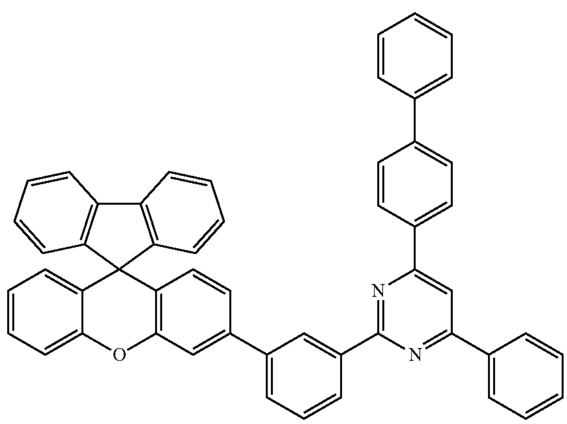
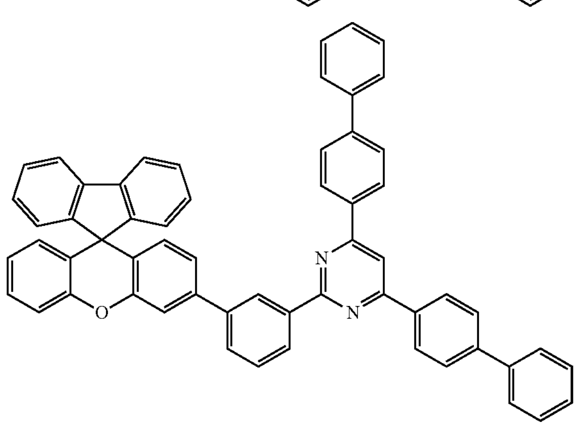
-continued
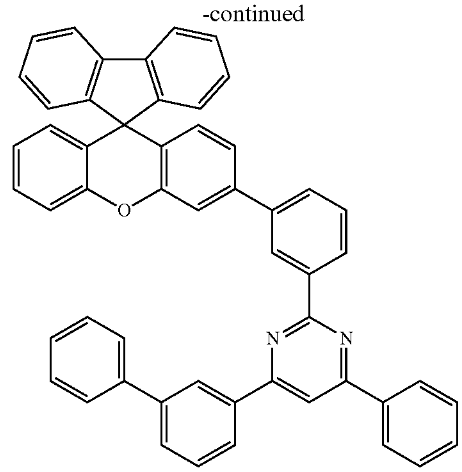
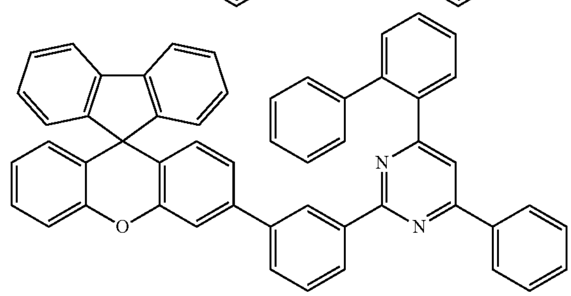
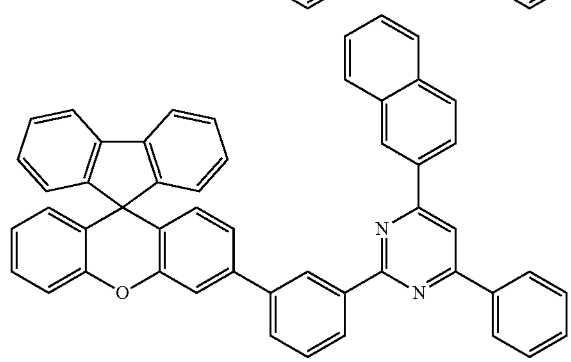
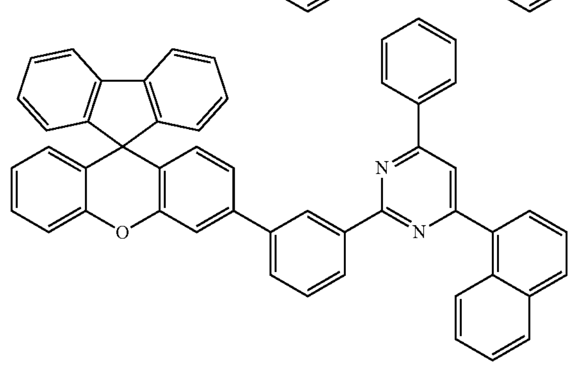
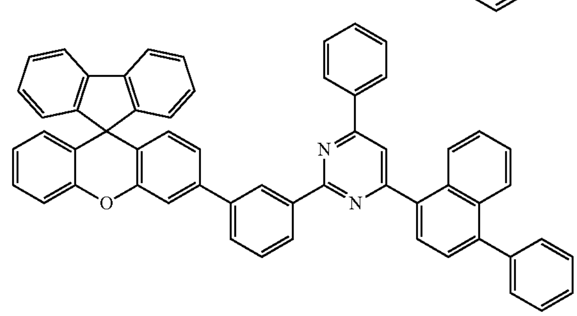

-continued
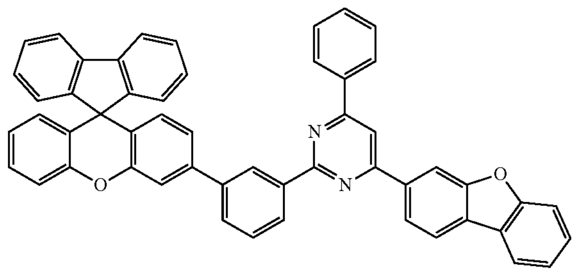
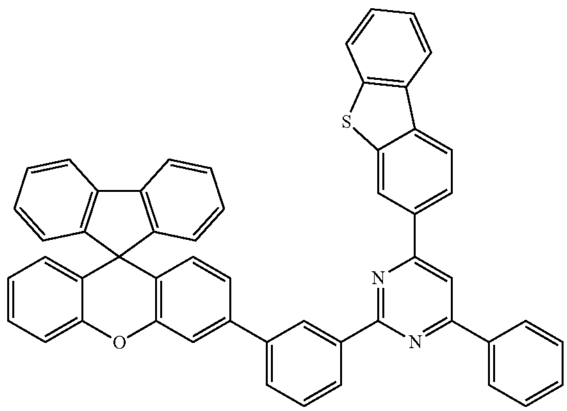
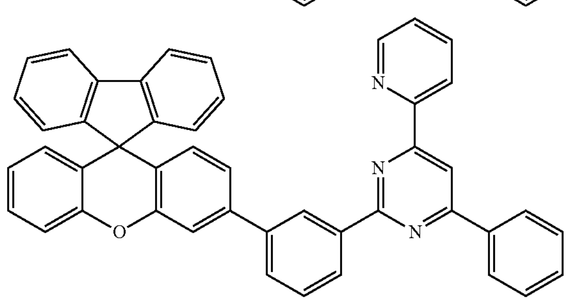
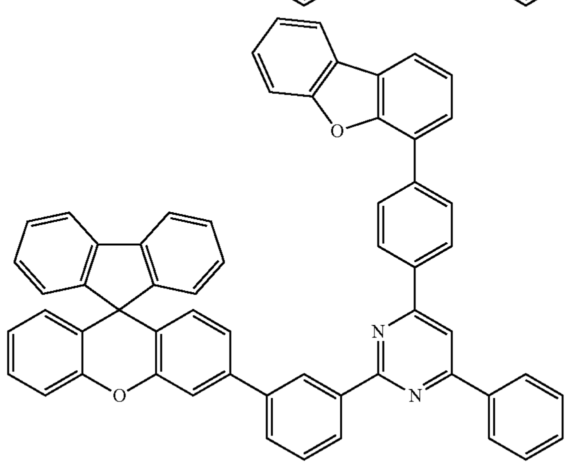
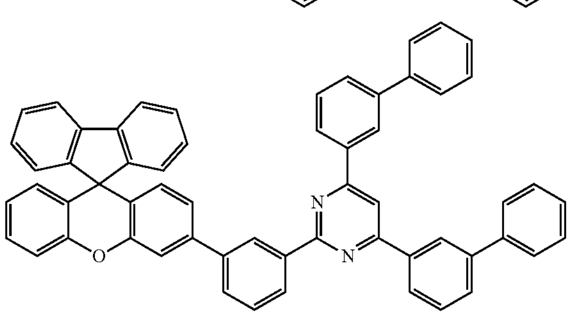
-continued
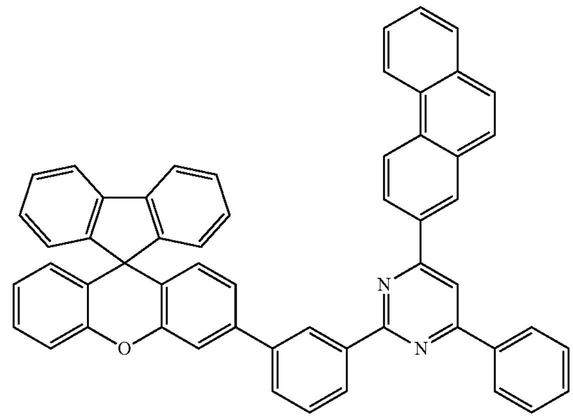
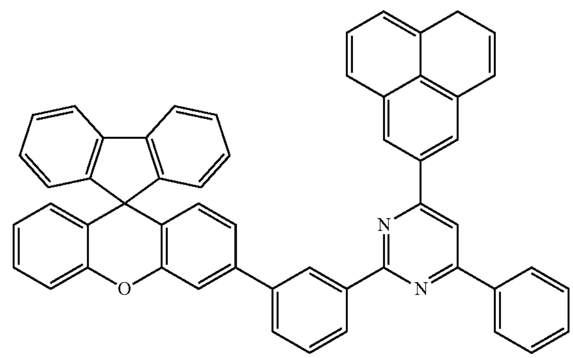
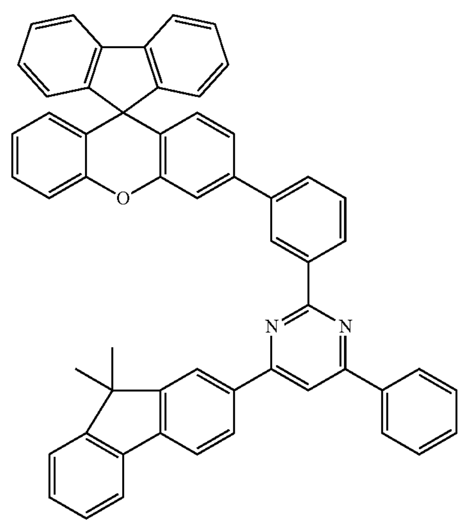
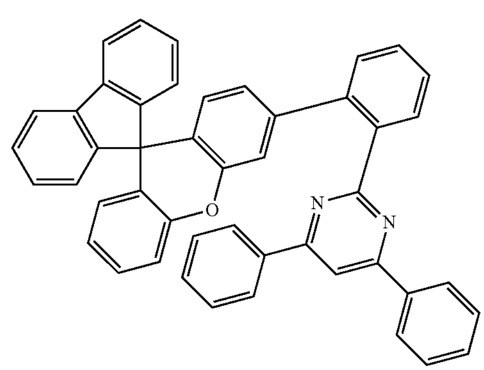

-continued
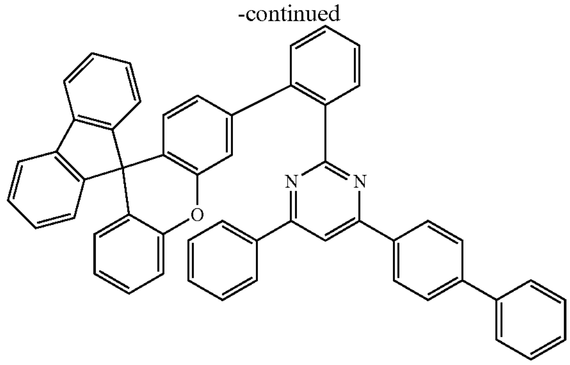
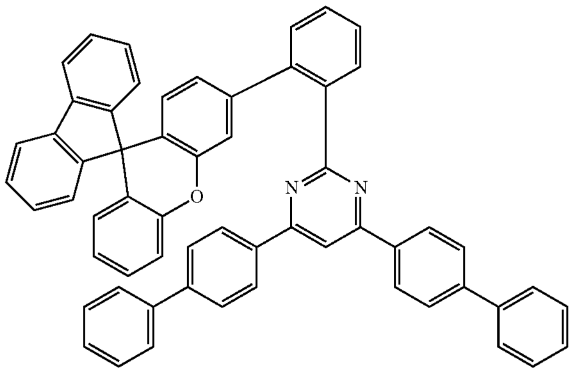
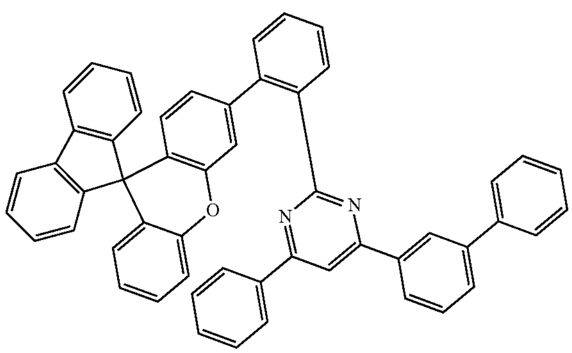
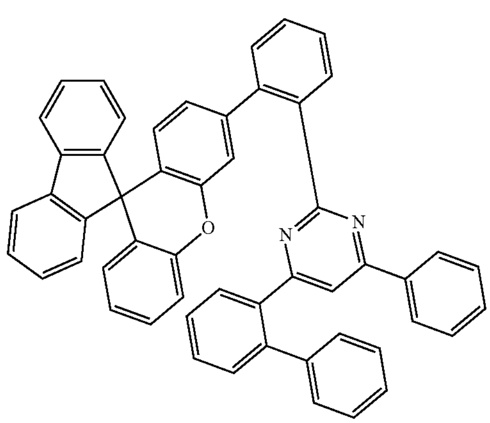
-continued
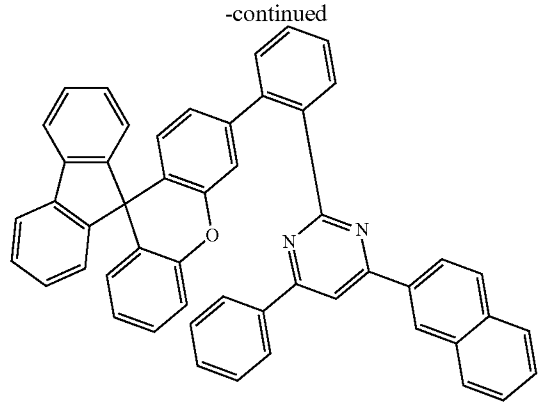
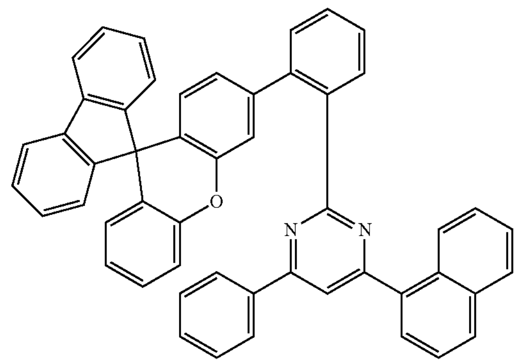
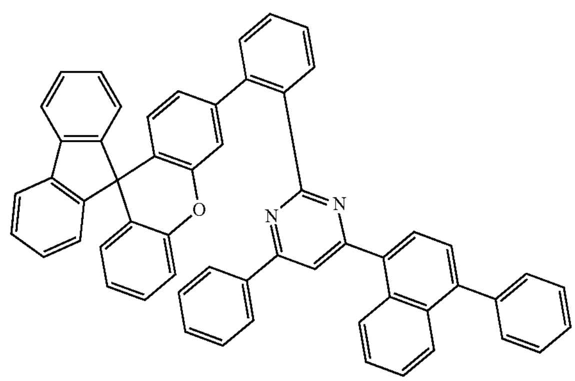
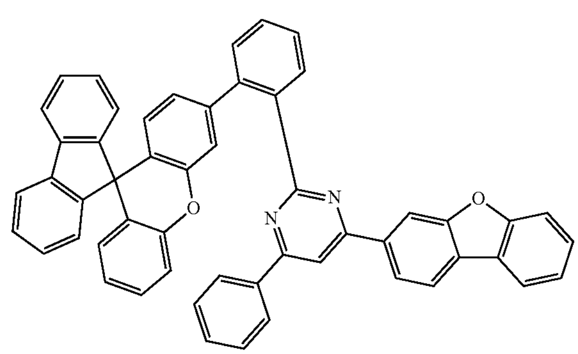

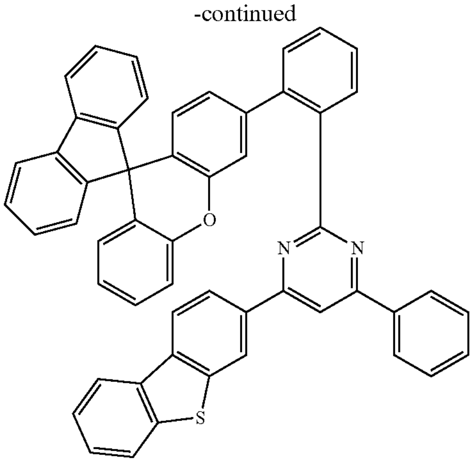
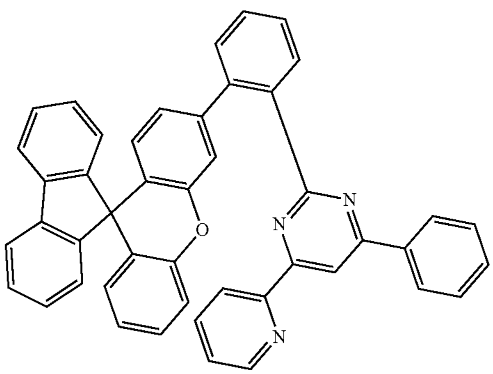
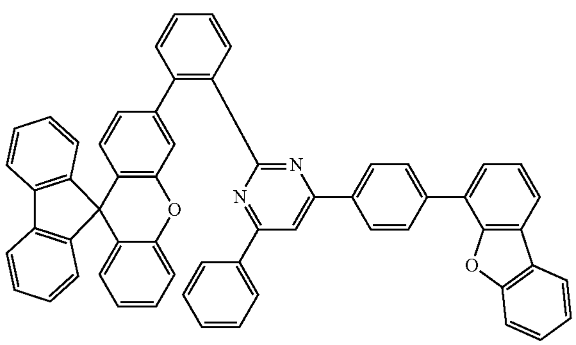
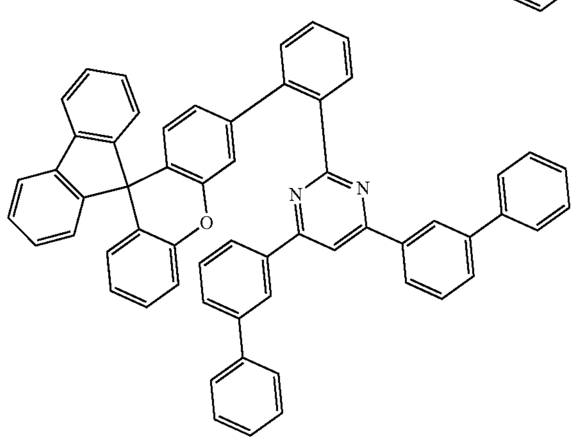
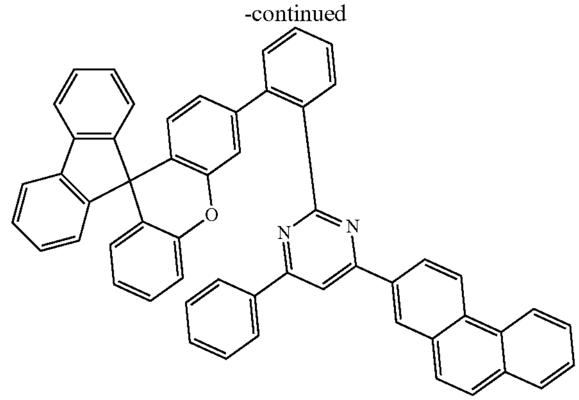
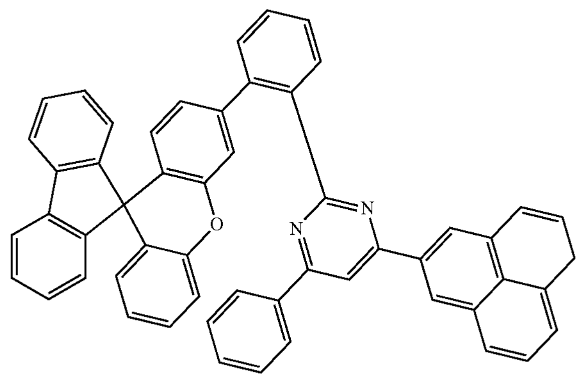
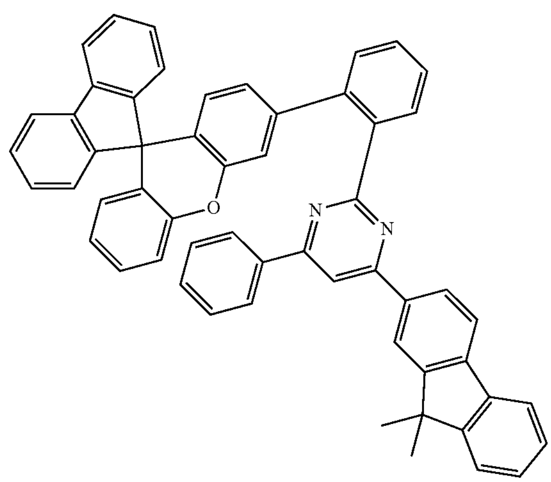
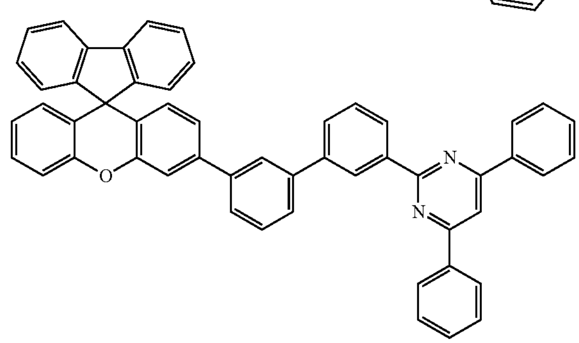

-continued
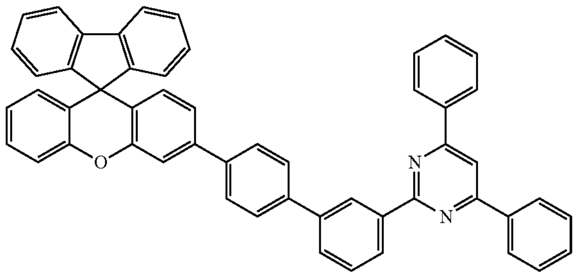
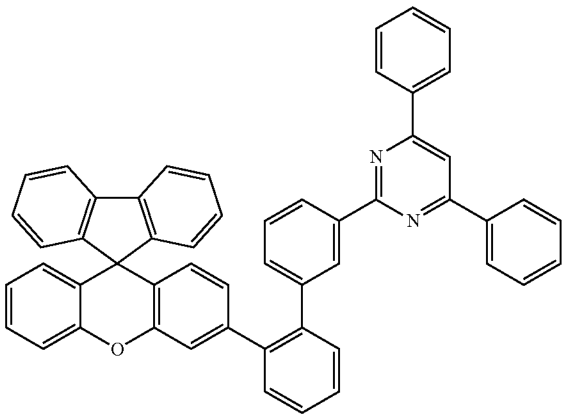
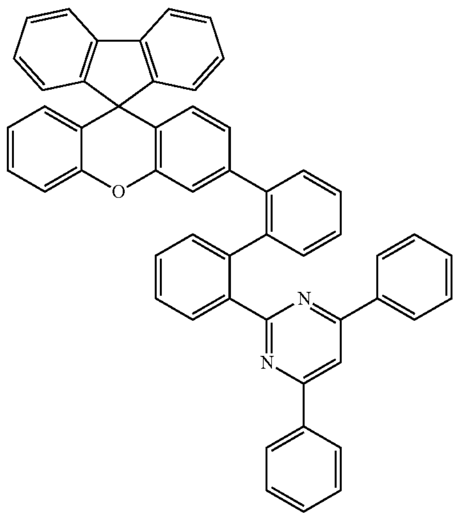
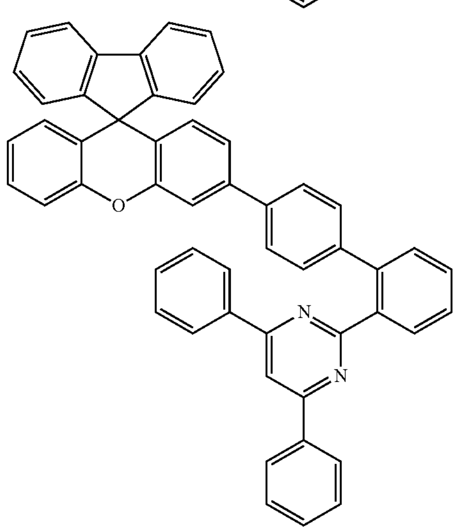
-continued
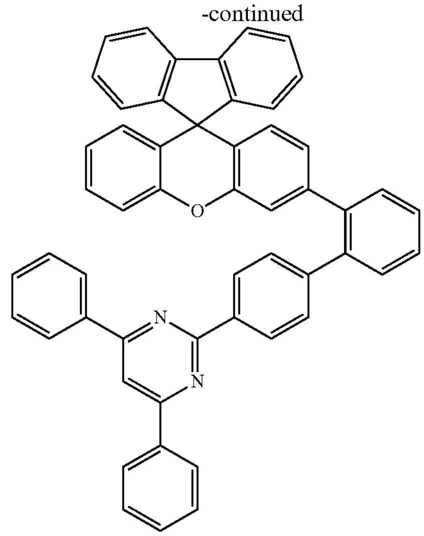
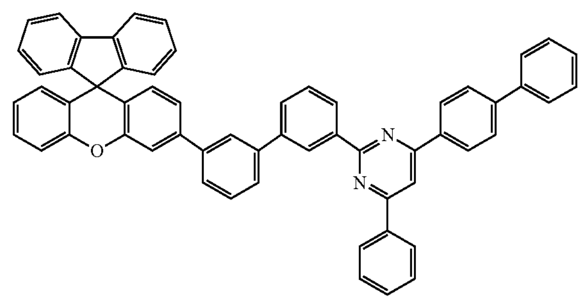
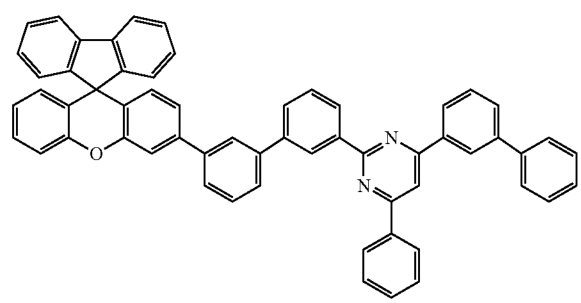
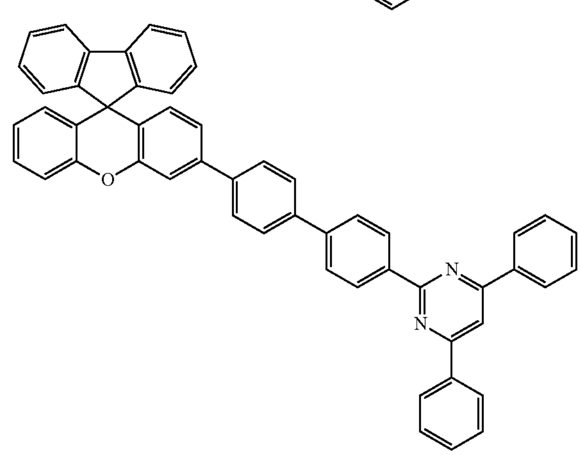

-continued
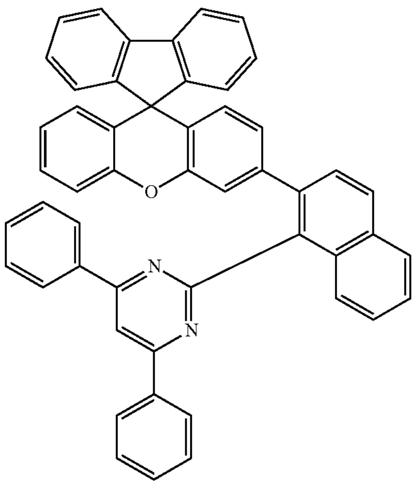
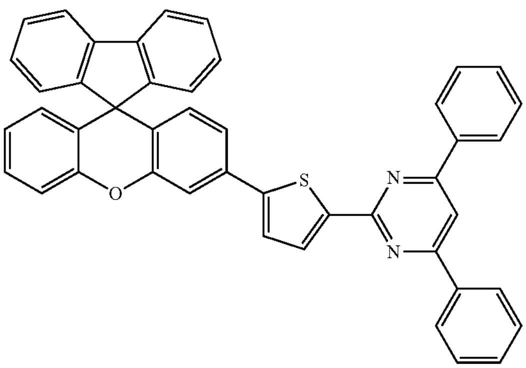
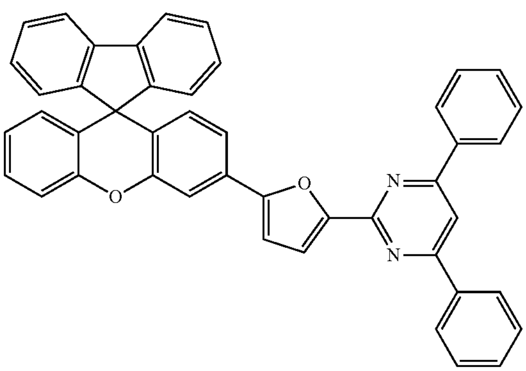
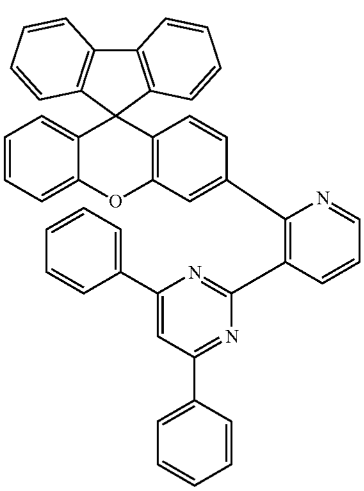
-continued
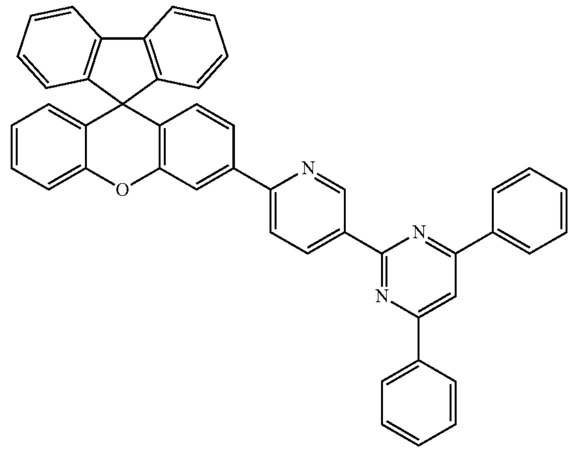
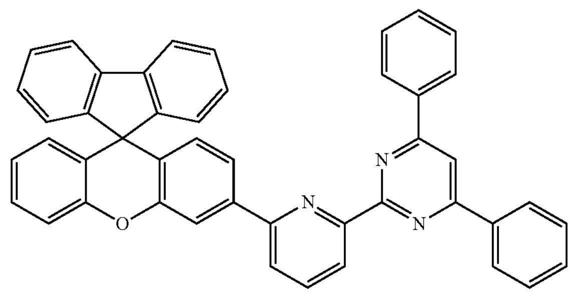
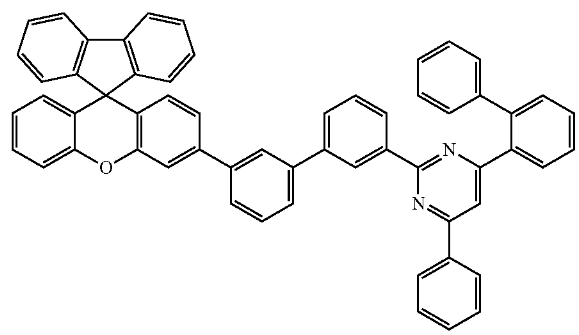
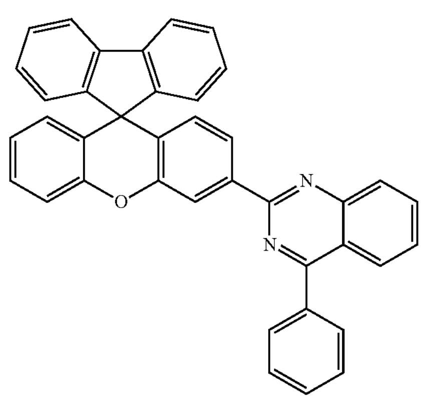

-continued
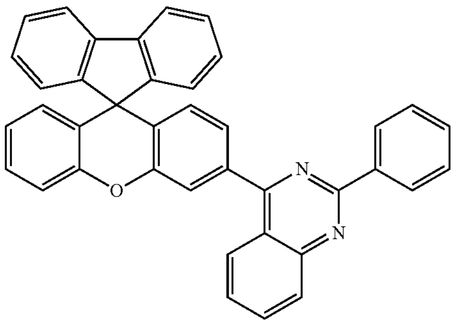
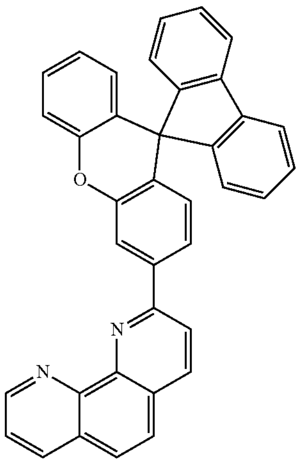
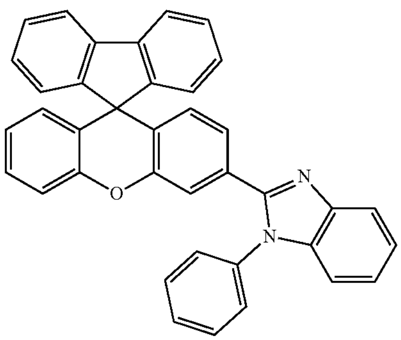
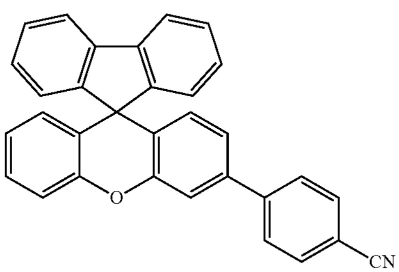
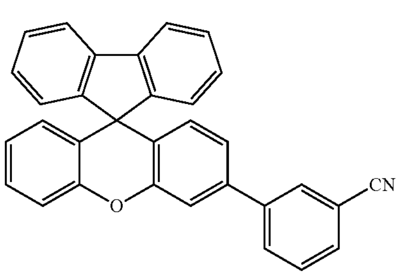
-continued
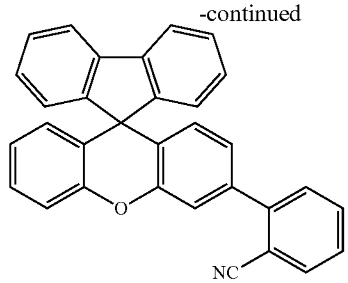
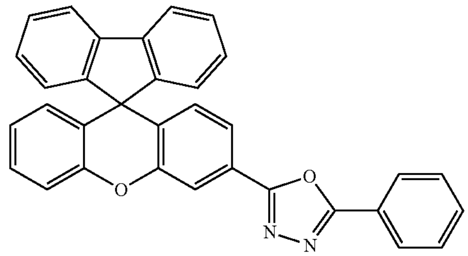
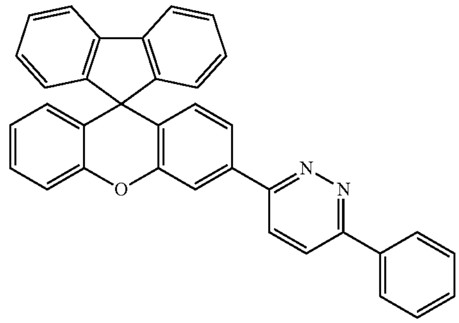
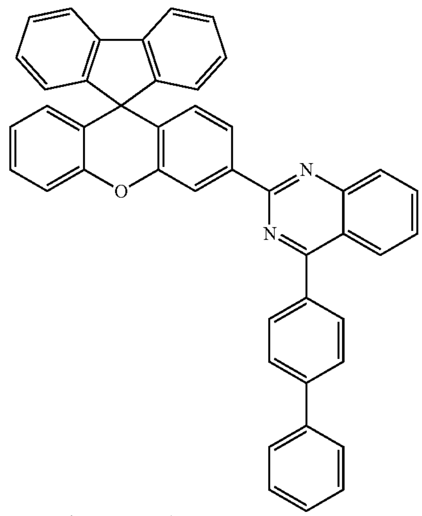
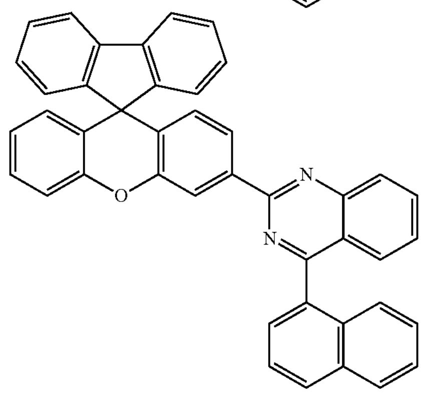

-continued
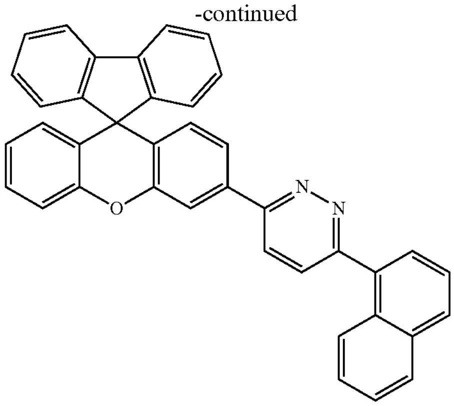
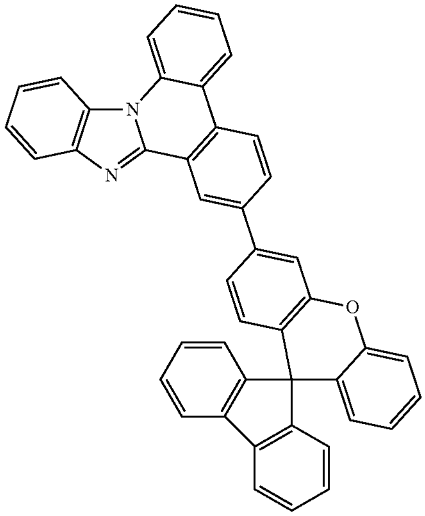
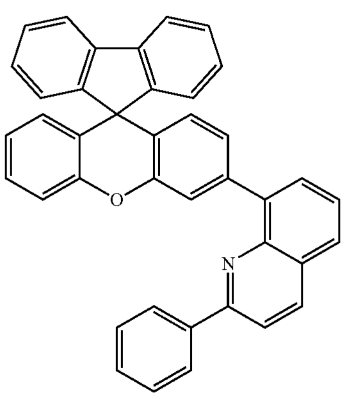
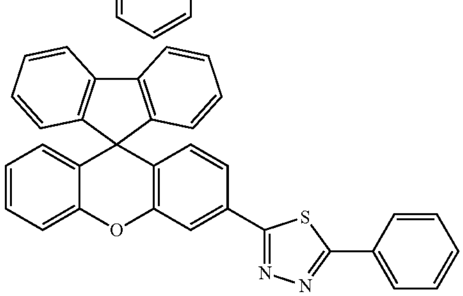
-continued
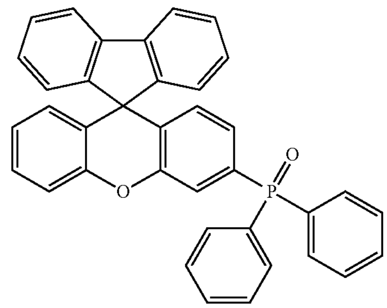
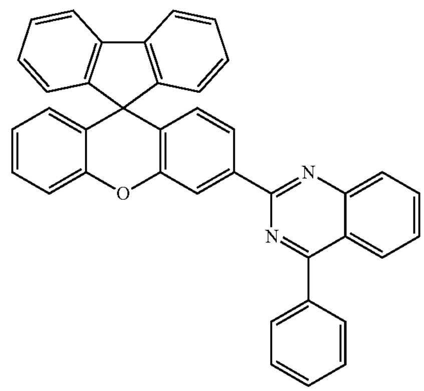
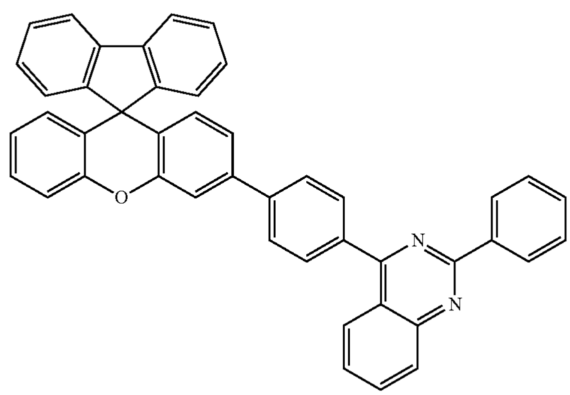
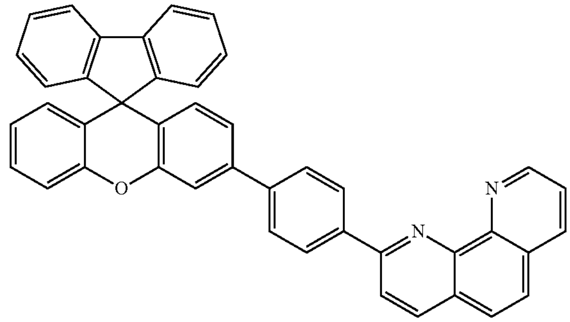

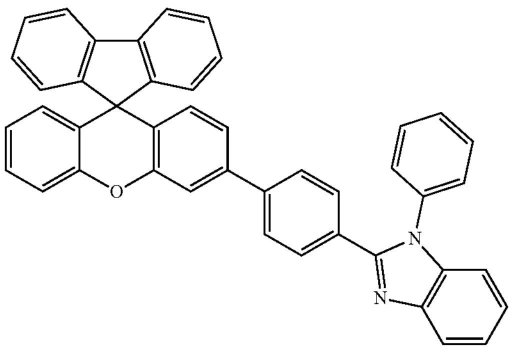
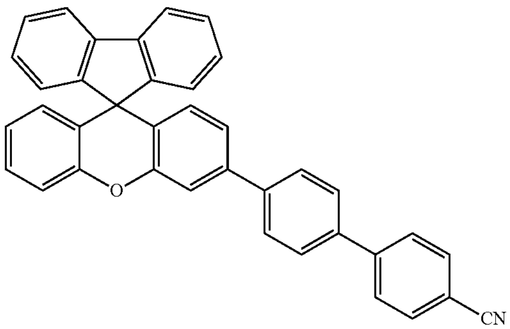
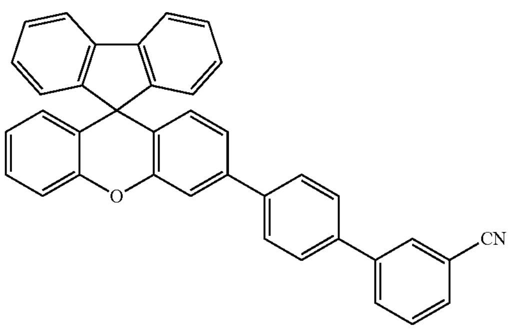
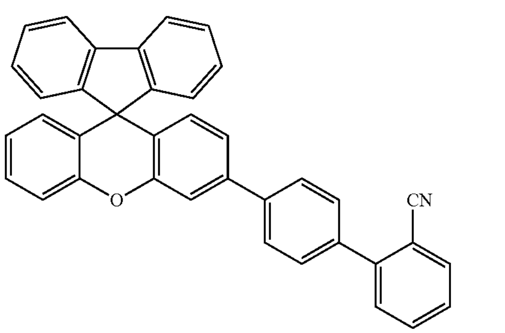
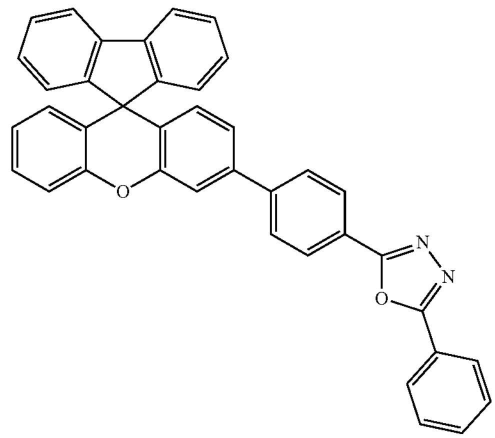
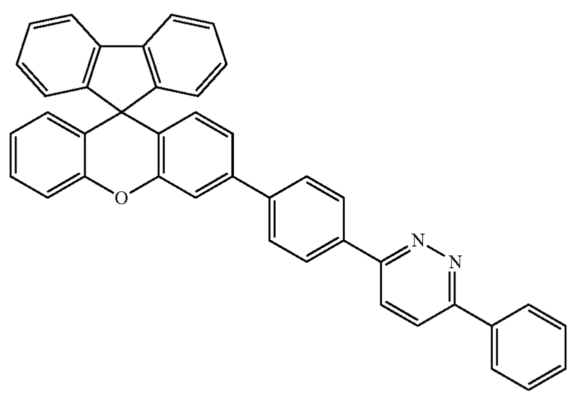
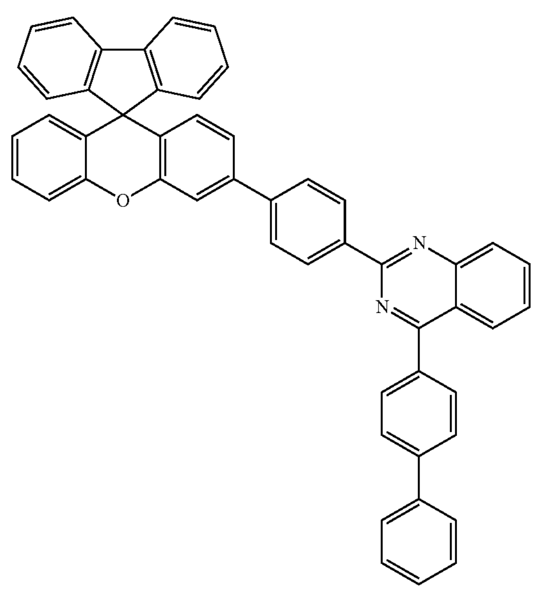

-continued
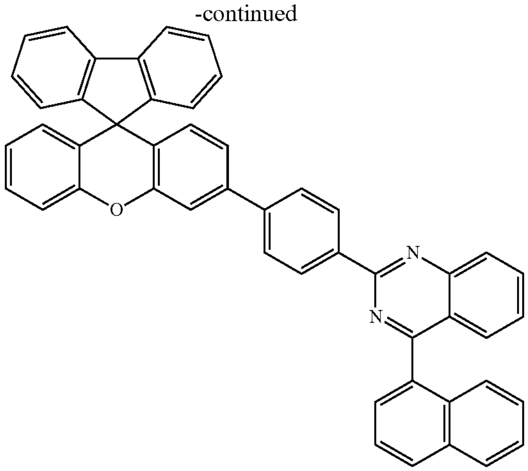
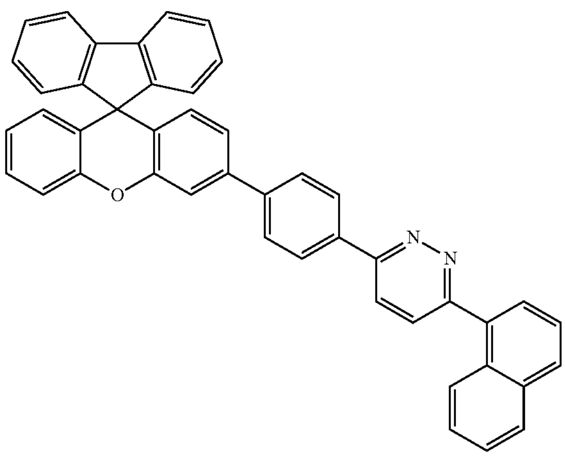
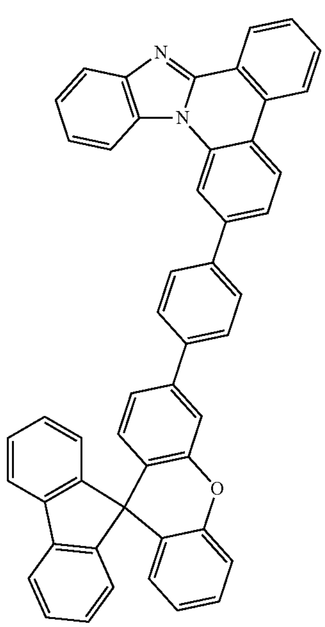
-continued
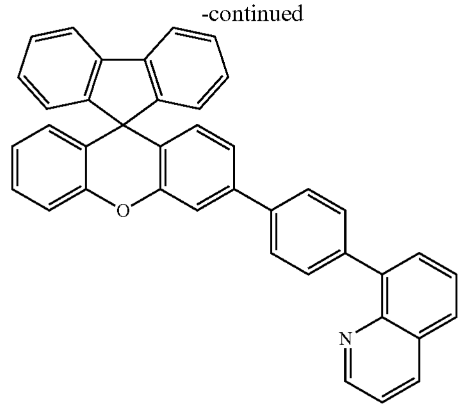
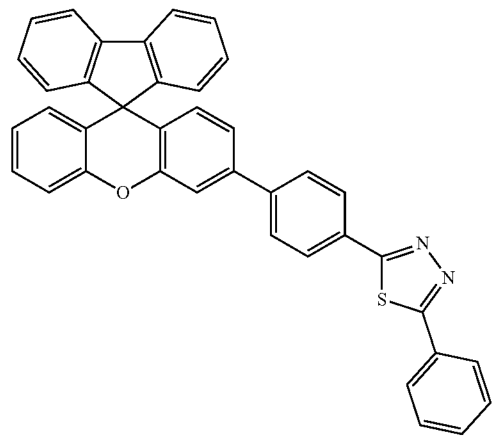
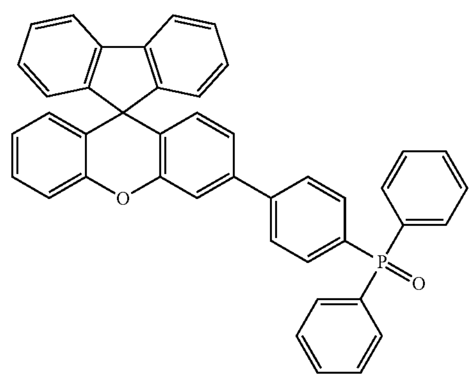
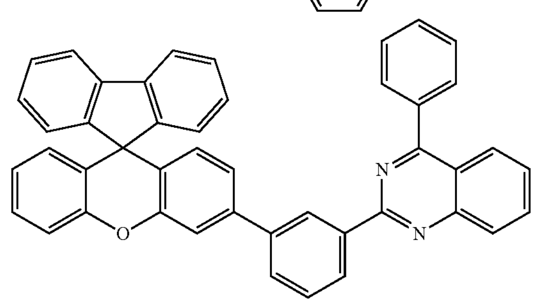

-continued
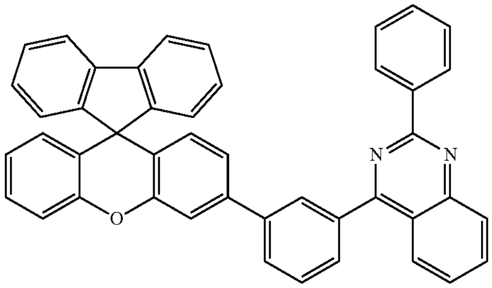
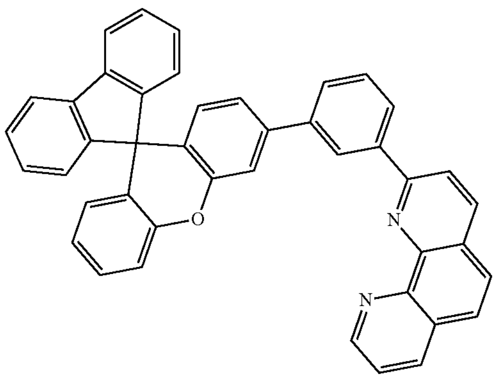
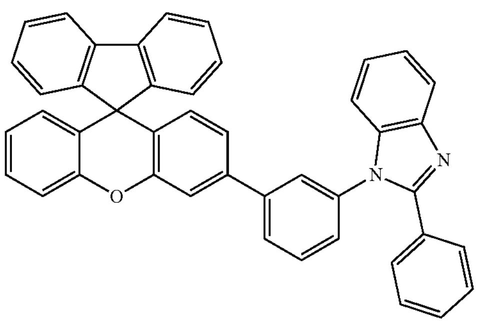
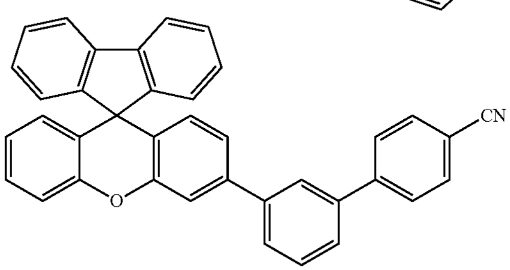
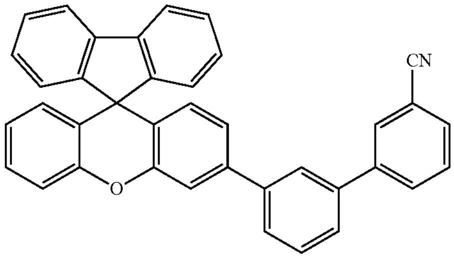
-continued
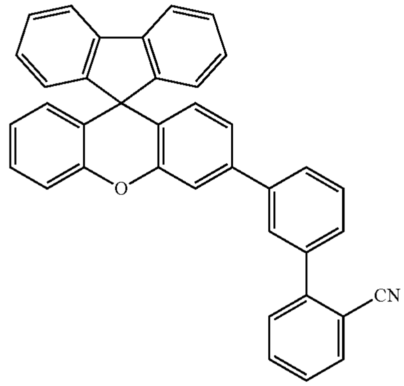
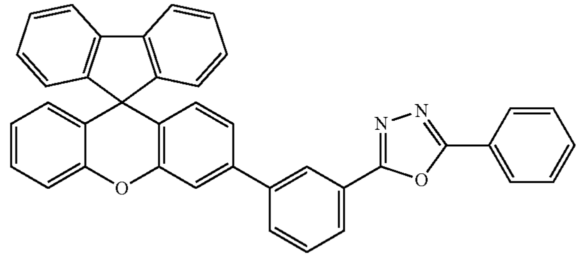
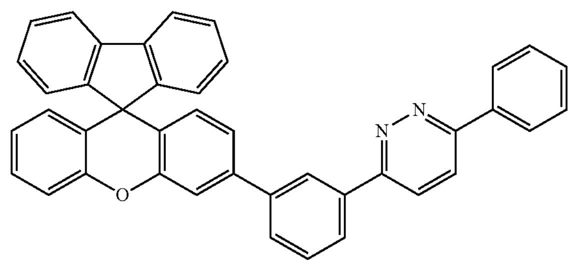
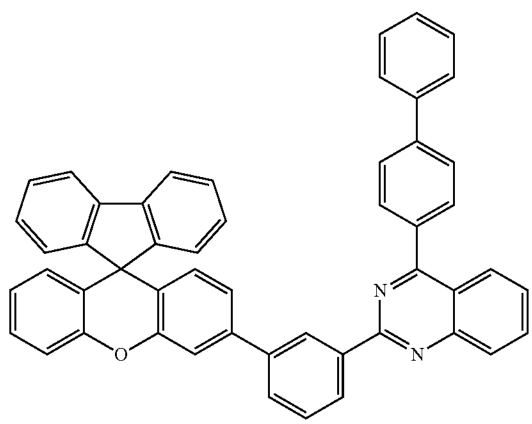
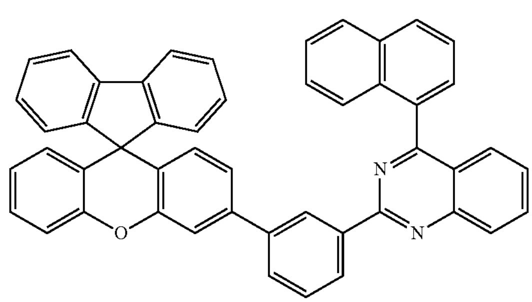

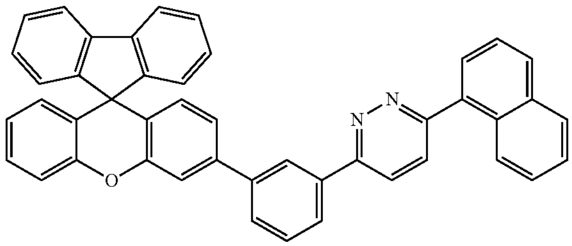
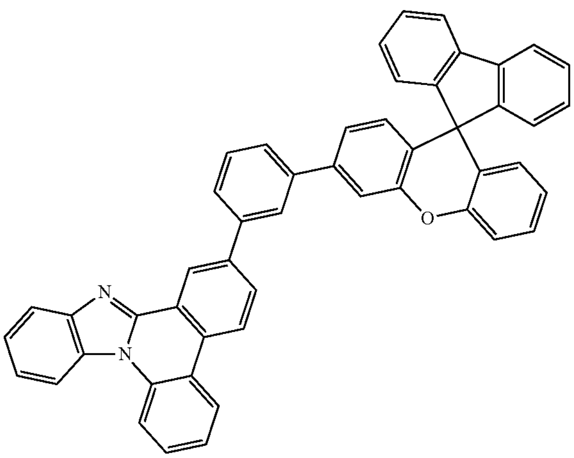
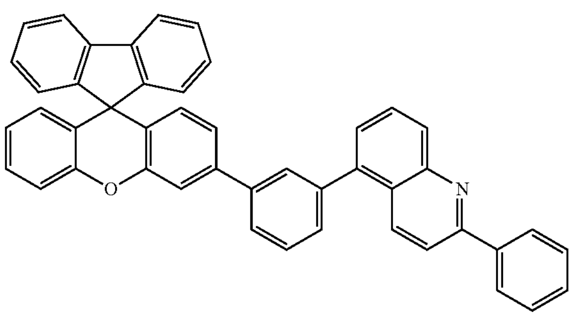
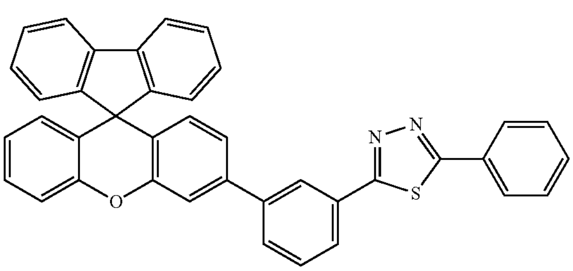
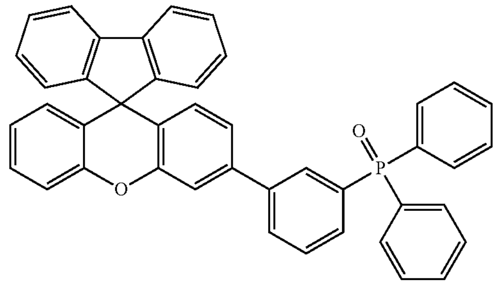
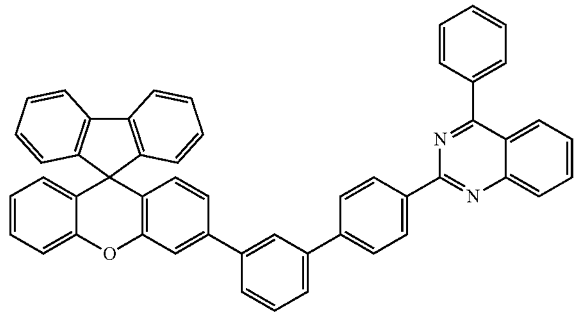
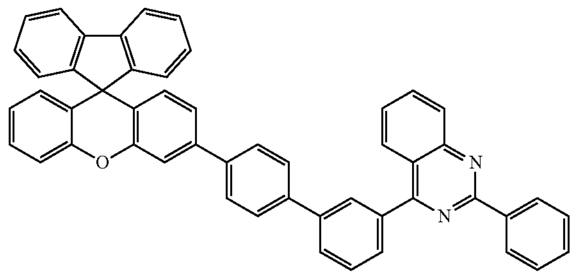
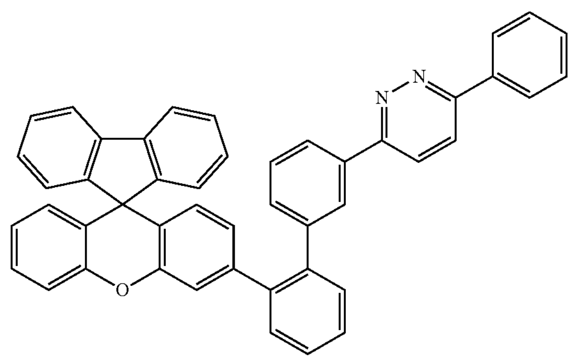
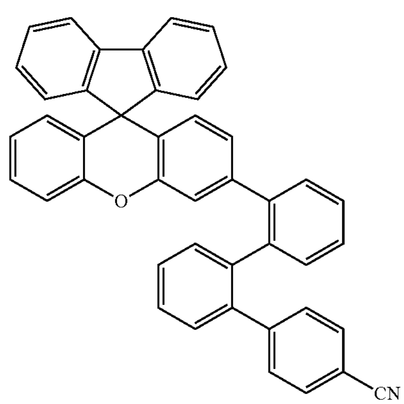

-continued
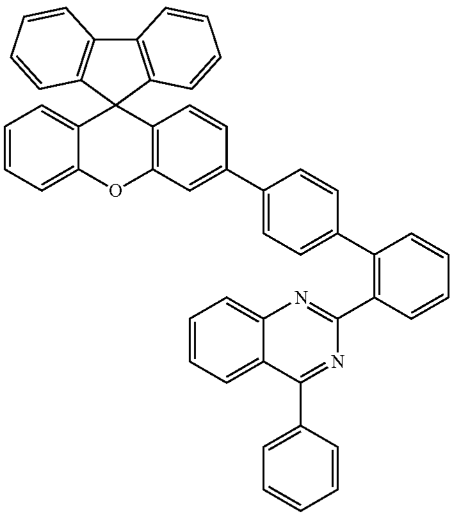
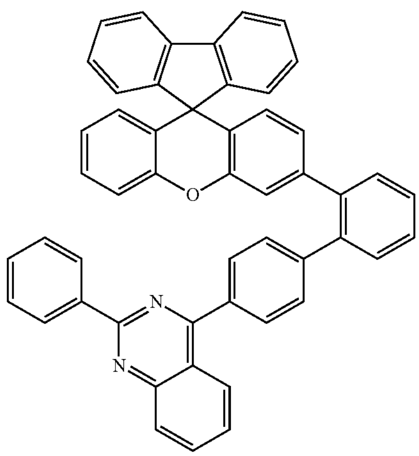
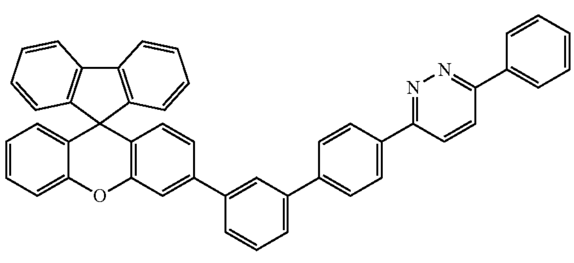
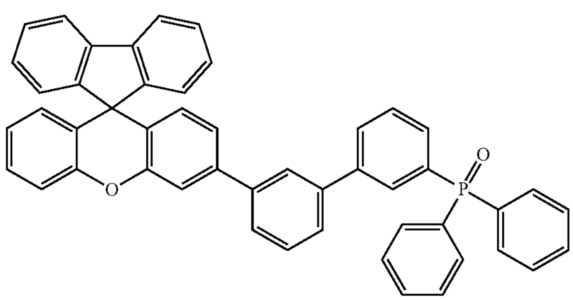
-continued
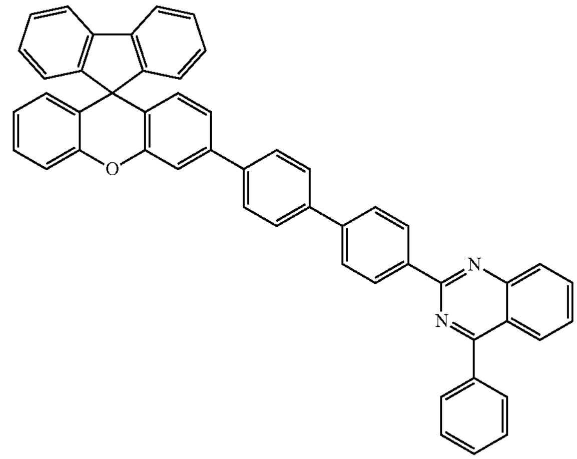
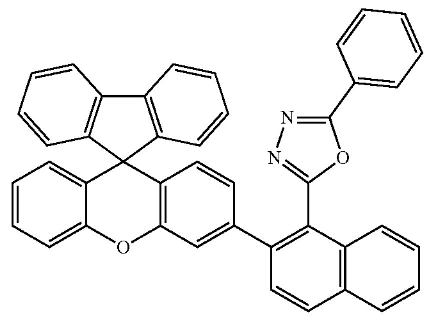
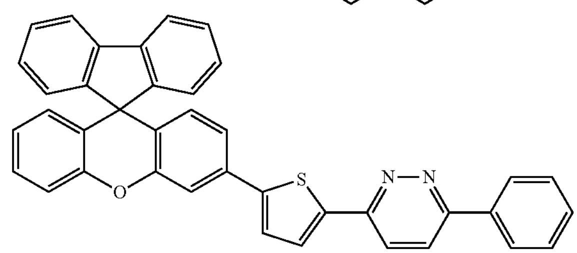
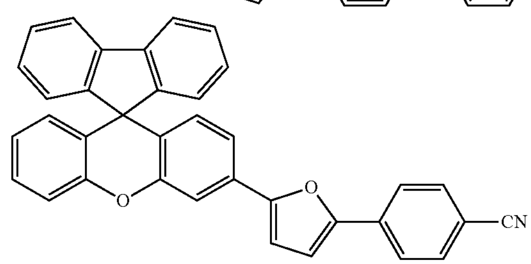
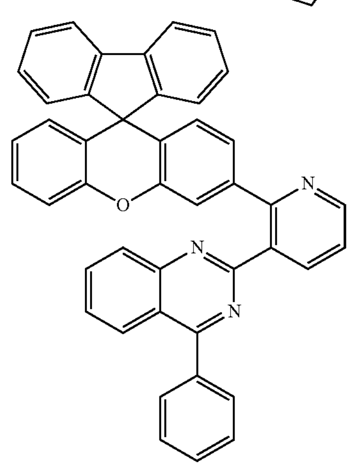

-continued
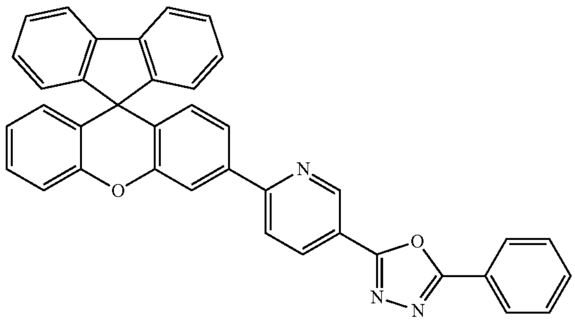
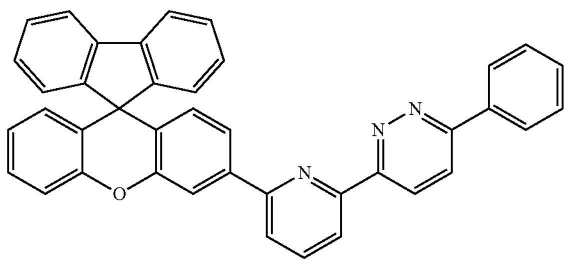
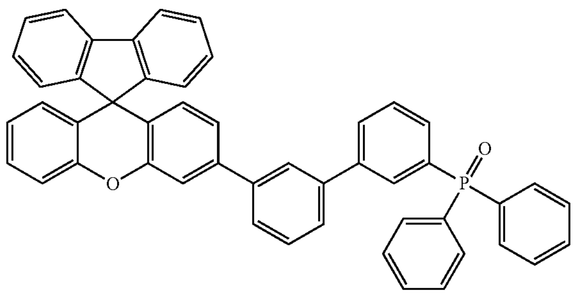
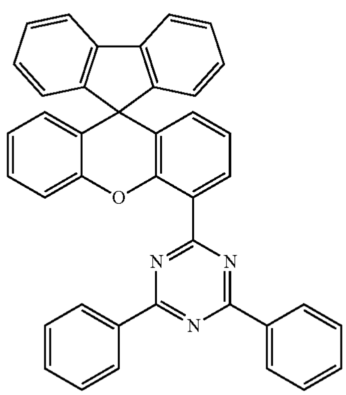
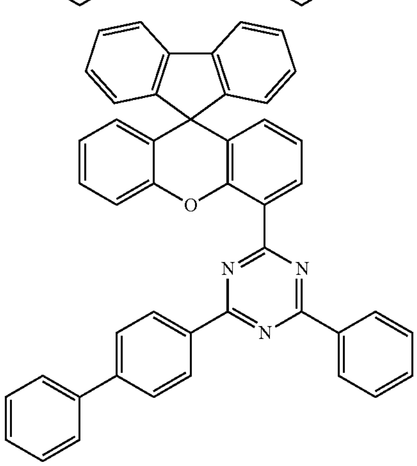
-continued
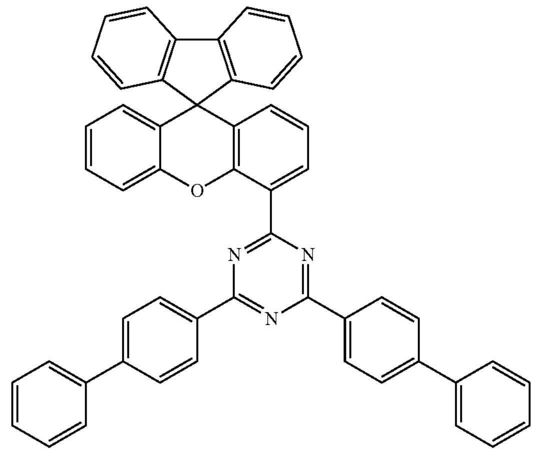
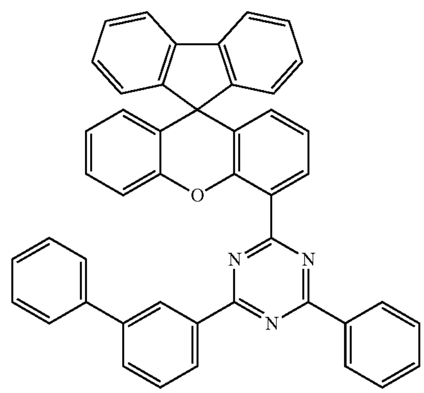
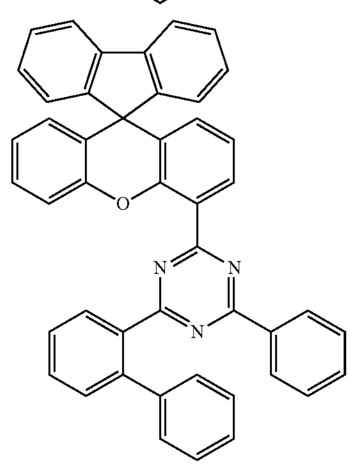
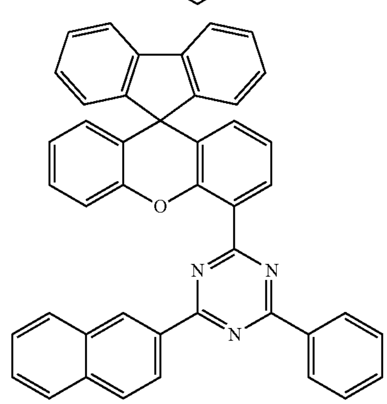

-continued
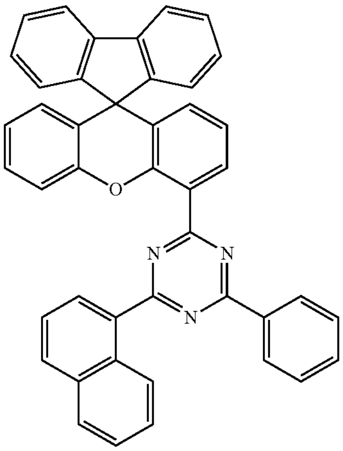
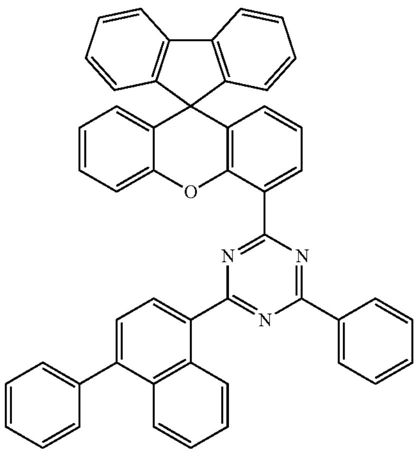
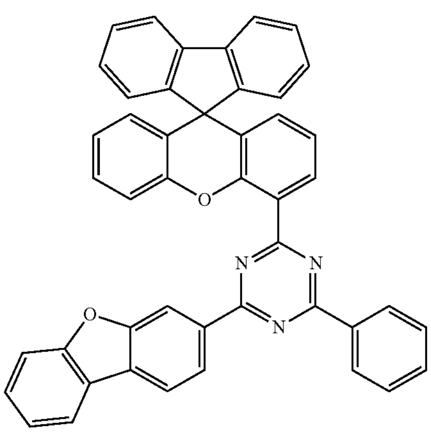
-continued
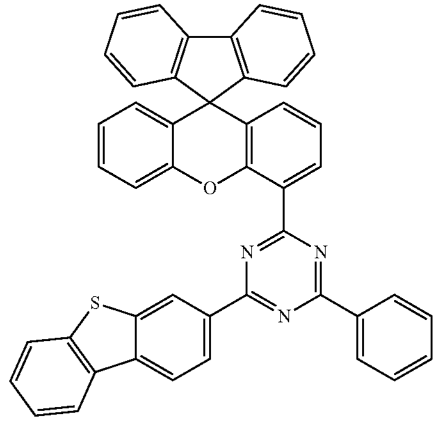
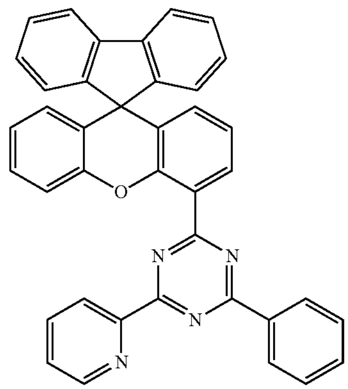
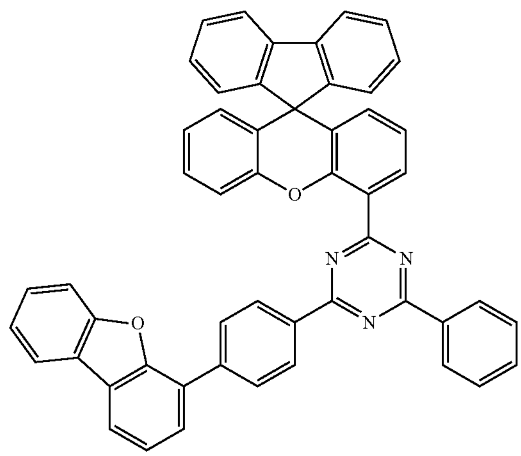
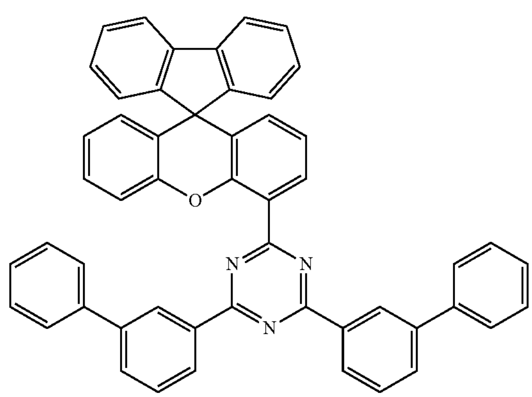

-continued
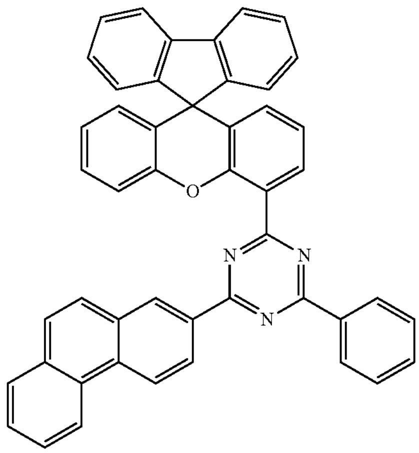
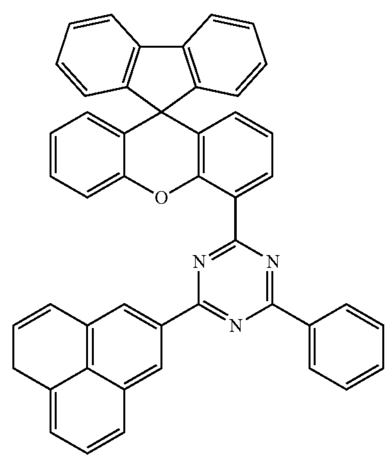
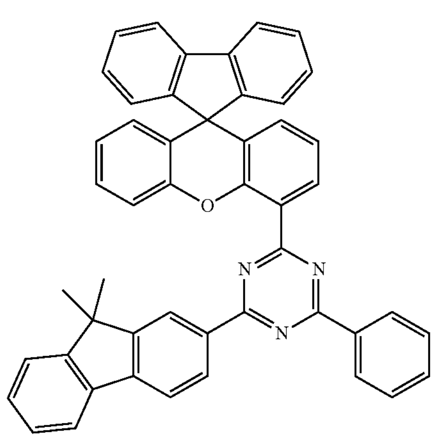
-continued
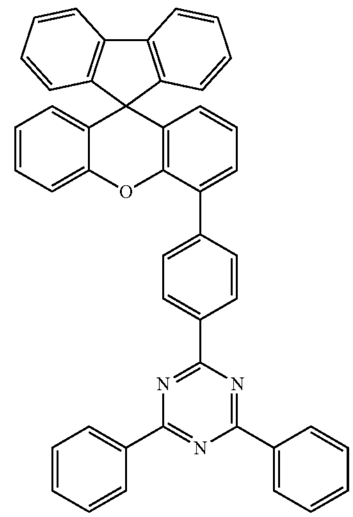
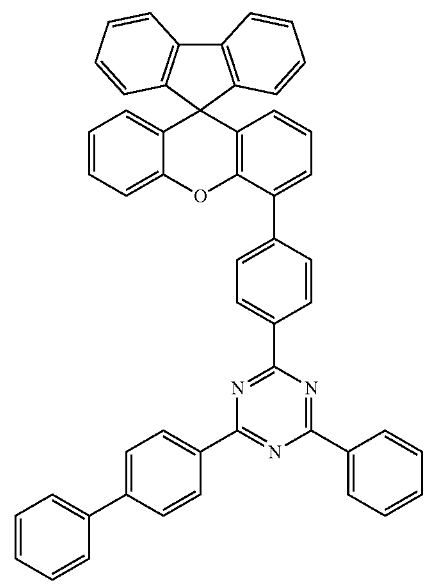
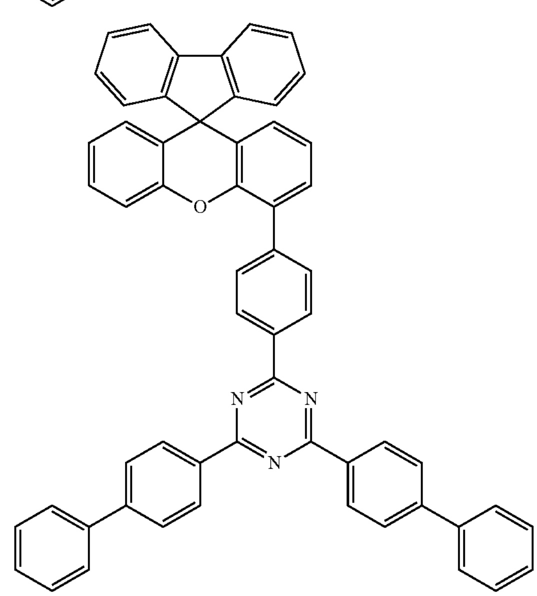

-continued
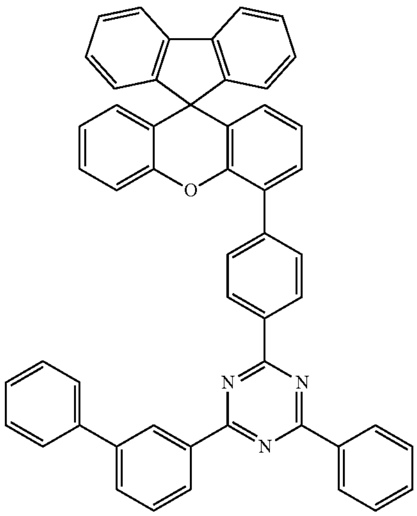
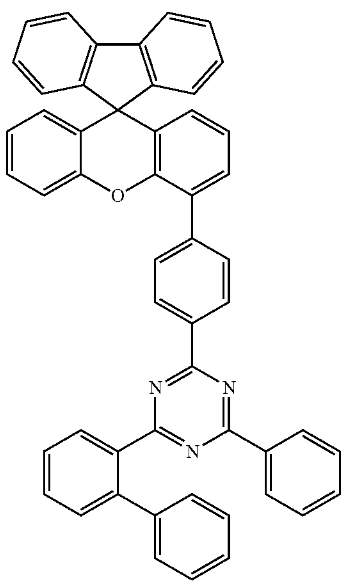
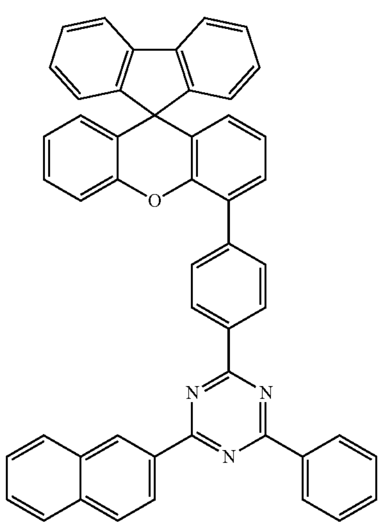
-continued
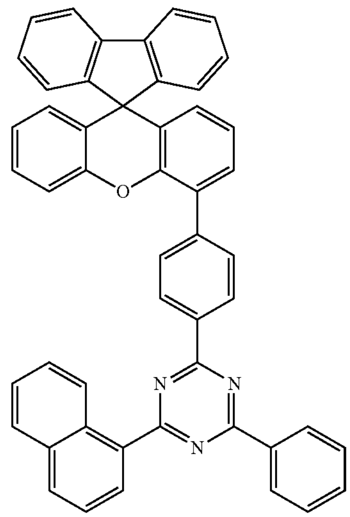
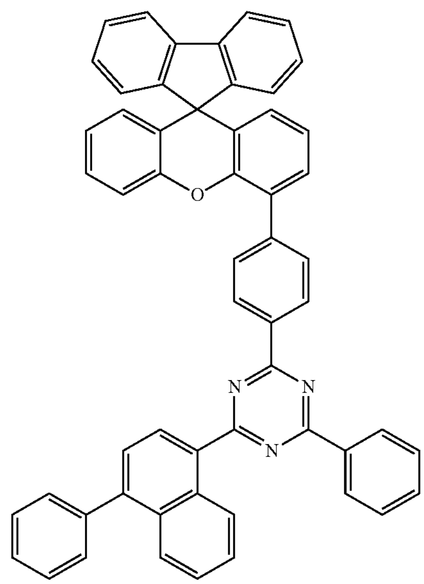
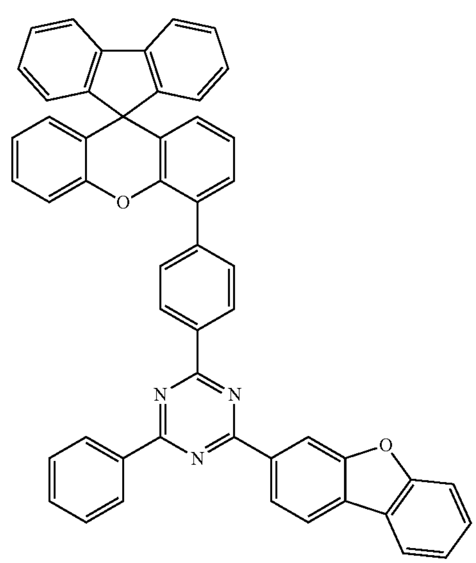

-continued
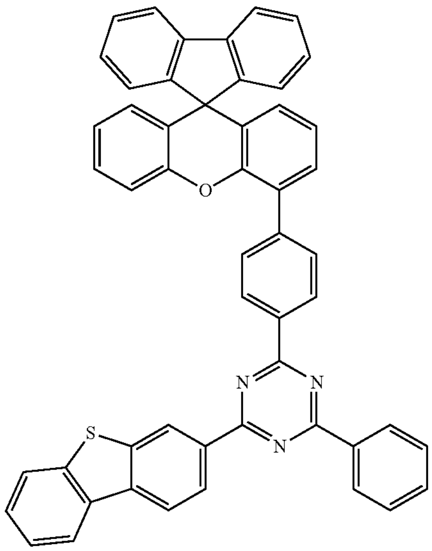
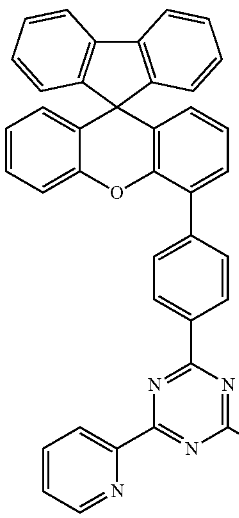
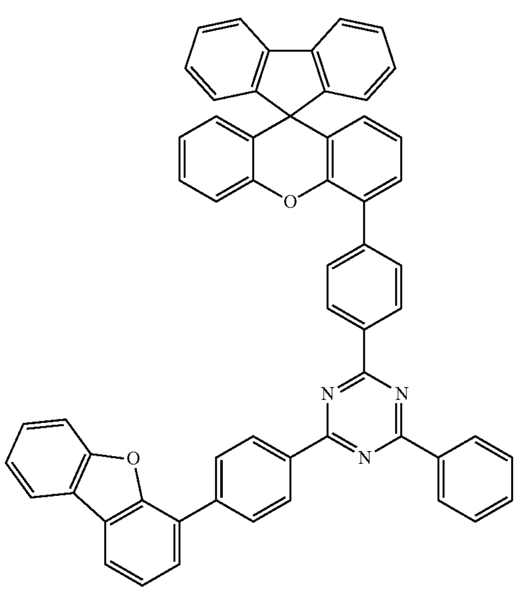
-continued
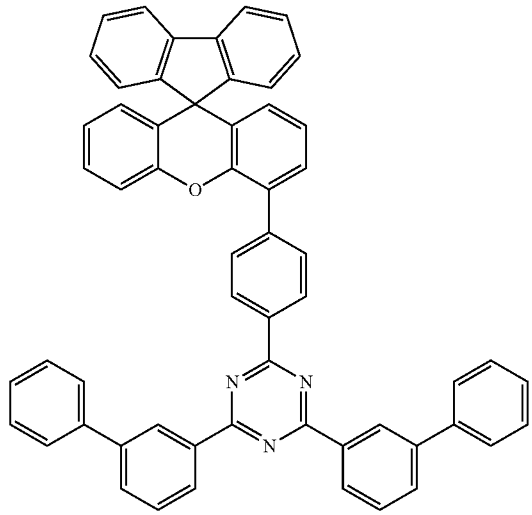
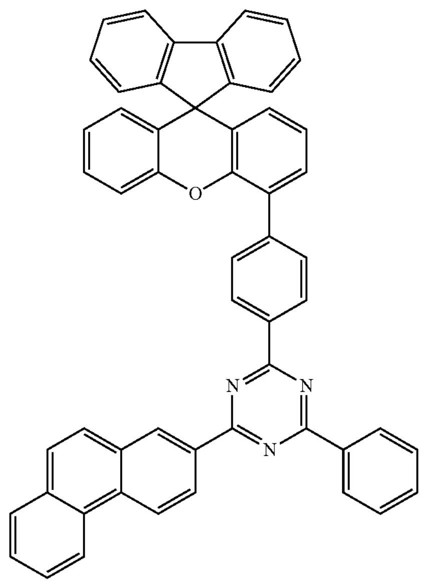
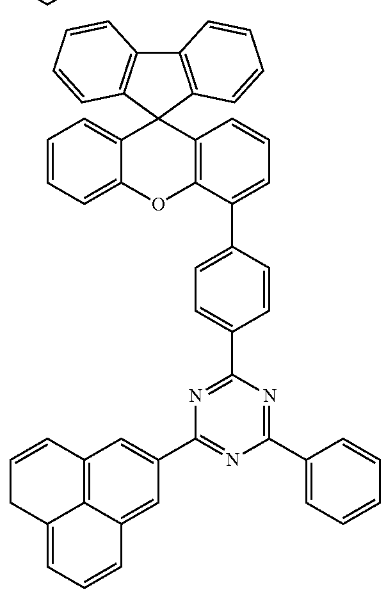

-continued
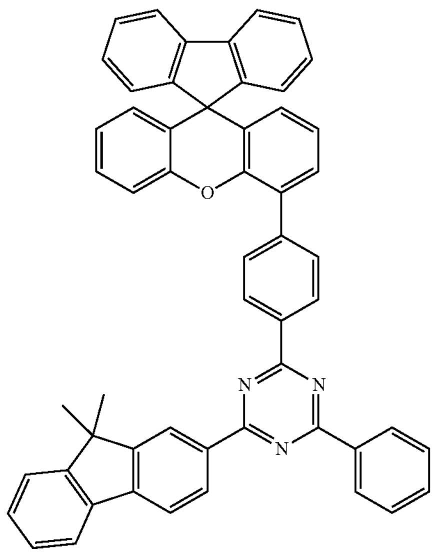
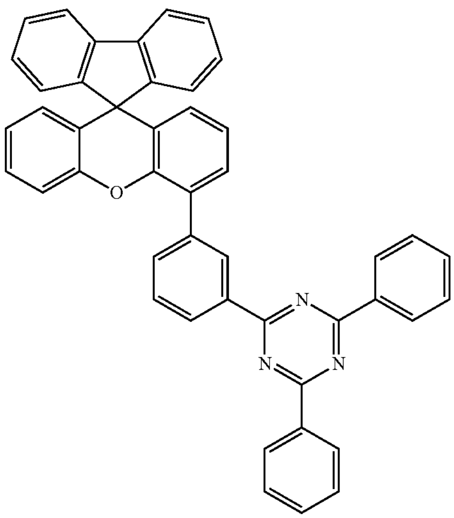
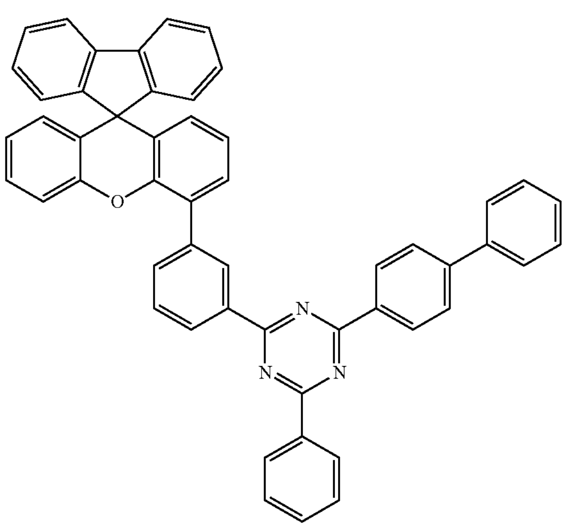
-continued
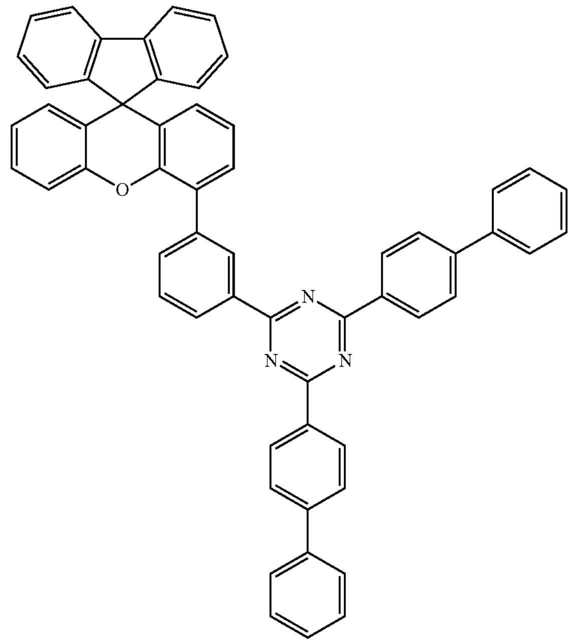
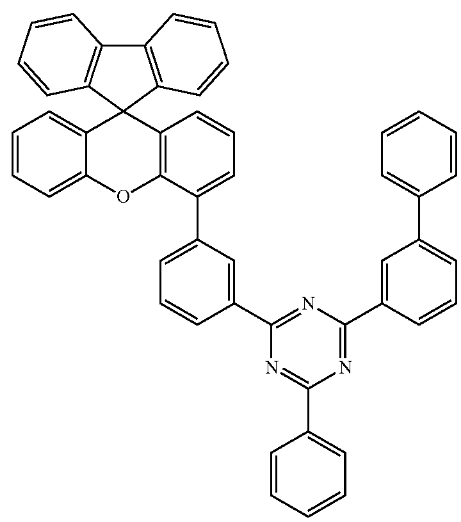
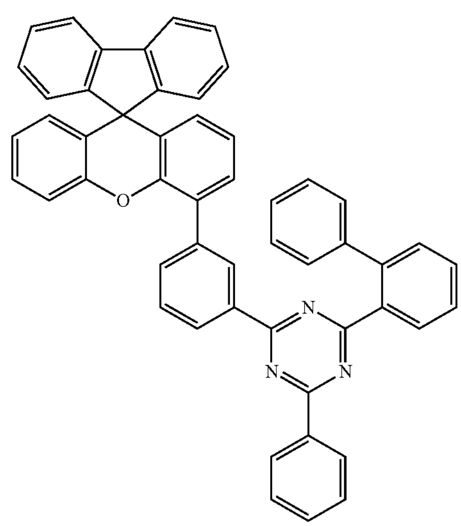

-continued
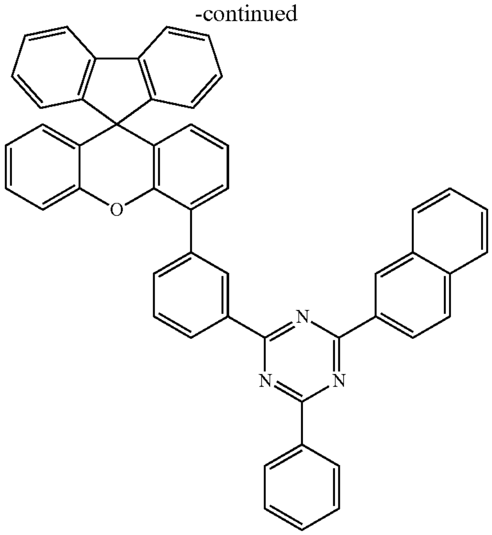
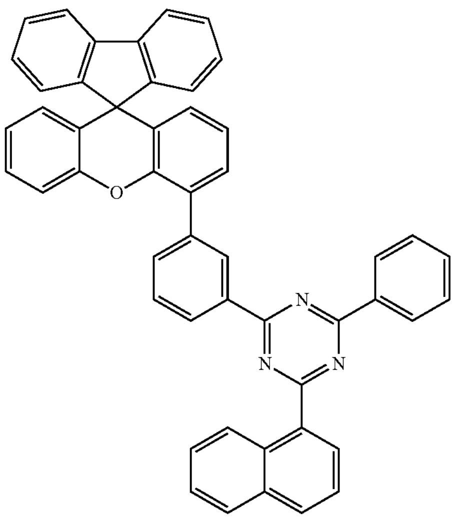
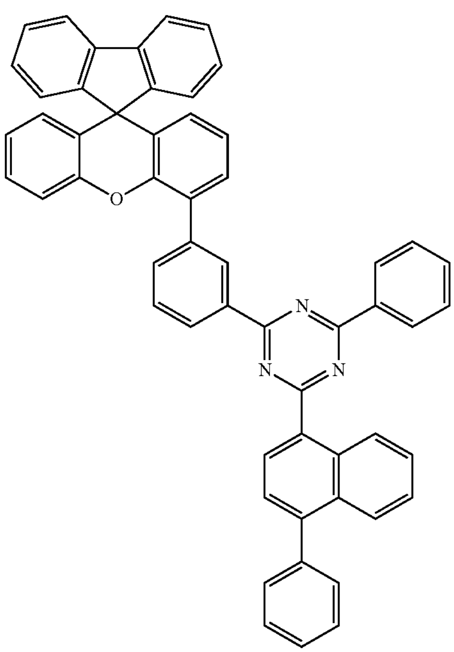
-continued
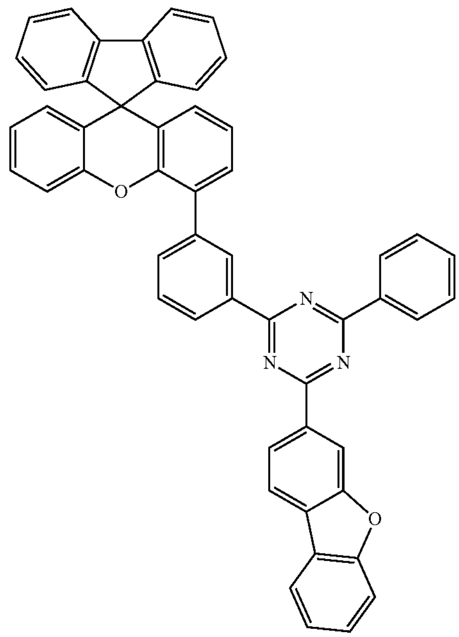
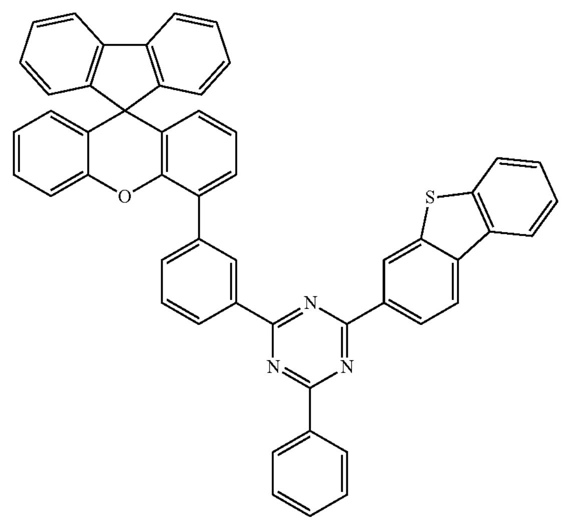
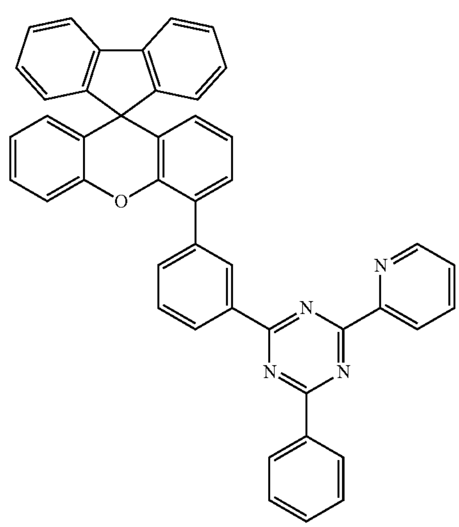

-continued
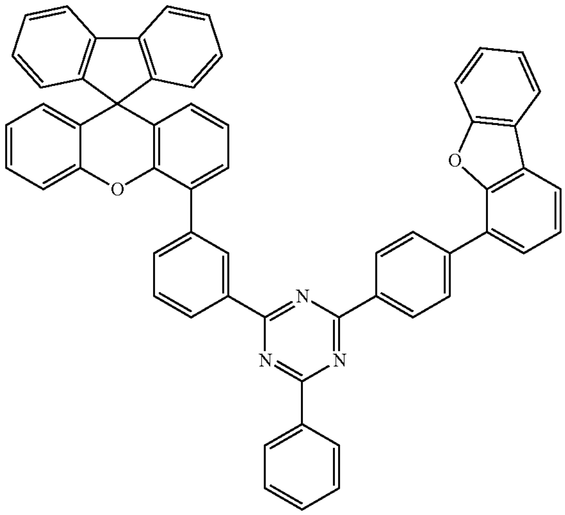
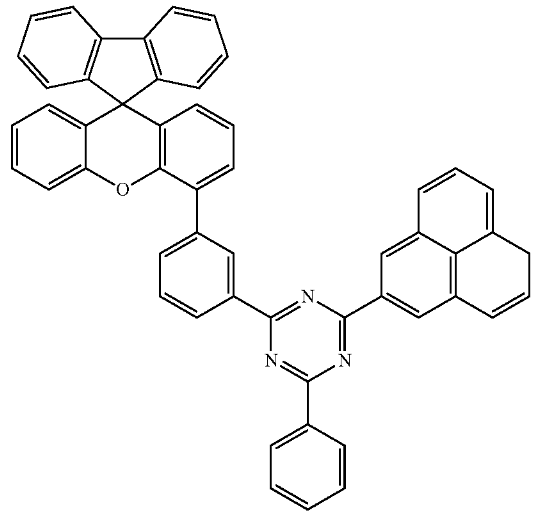
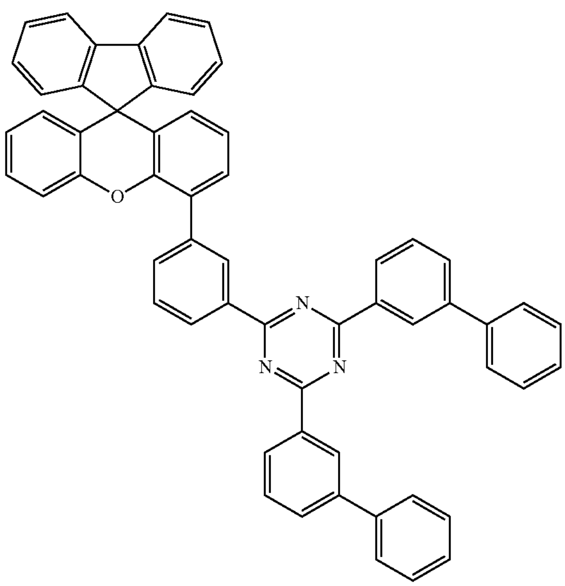
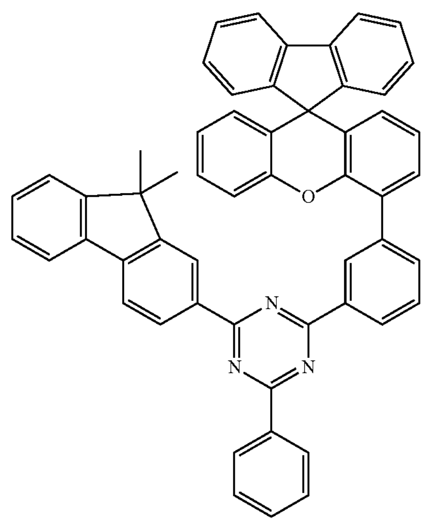
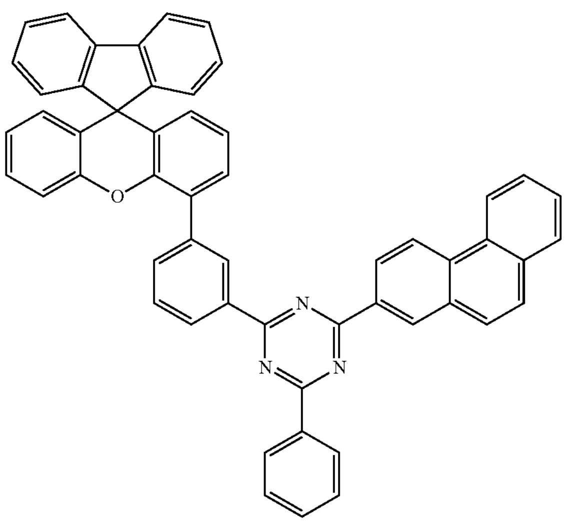
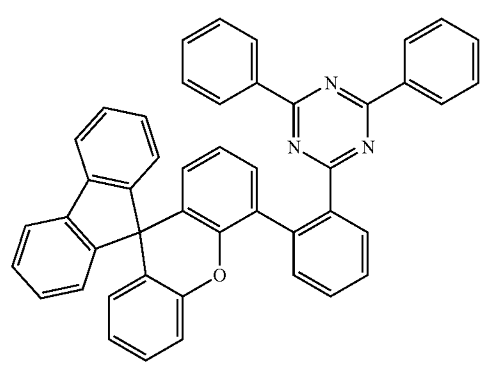
-continued -continued
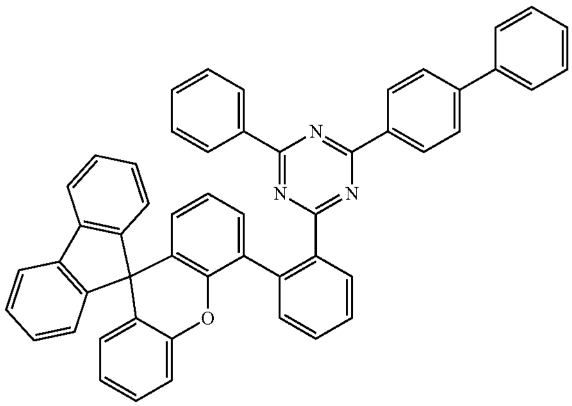
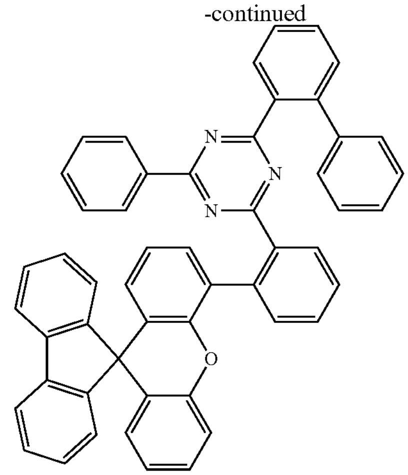
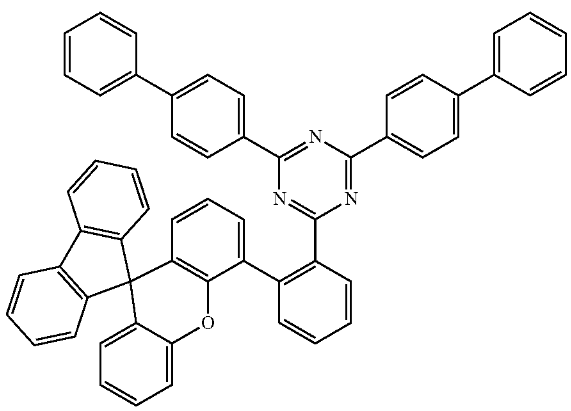
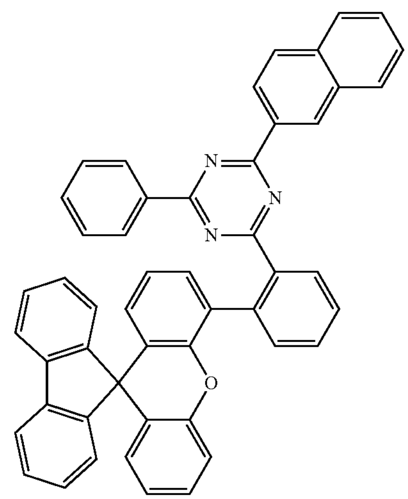
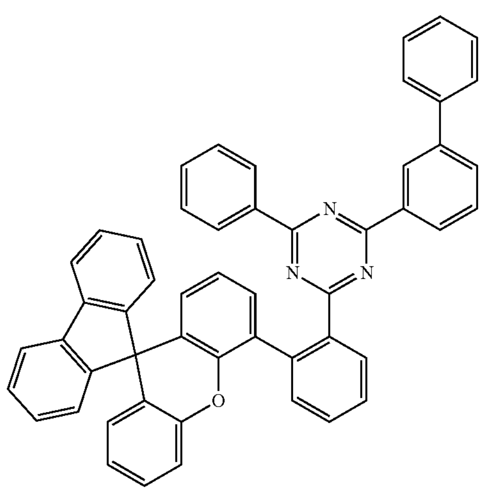
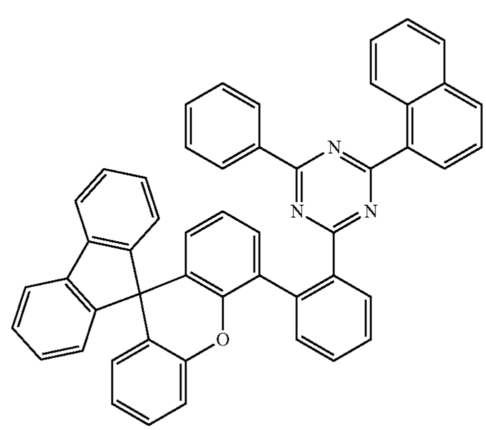

-continued
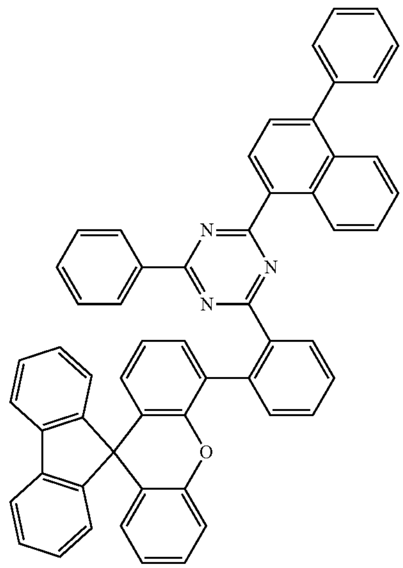
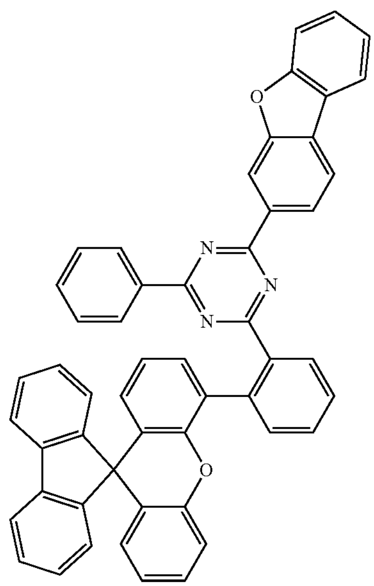
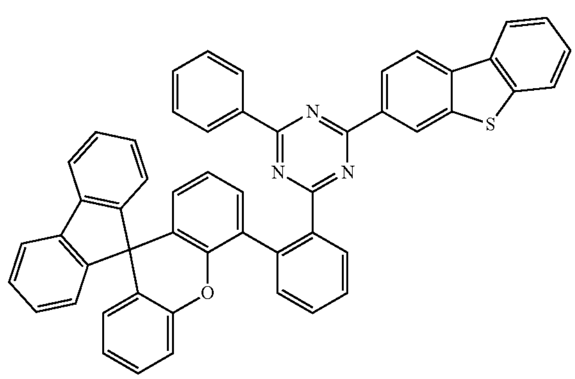
-continued
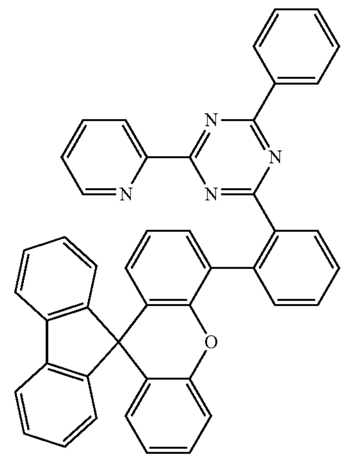
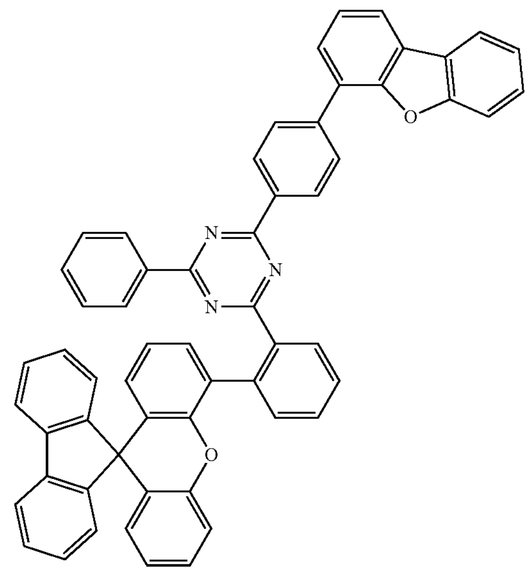
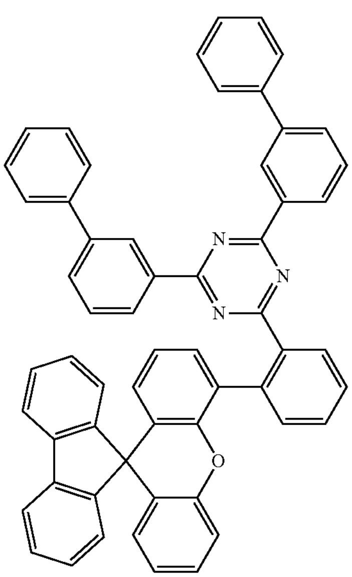

-continued
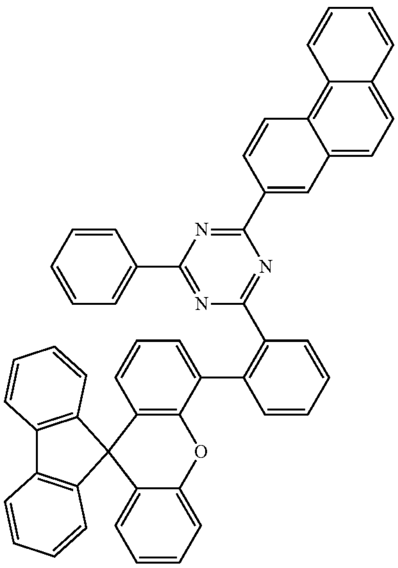
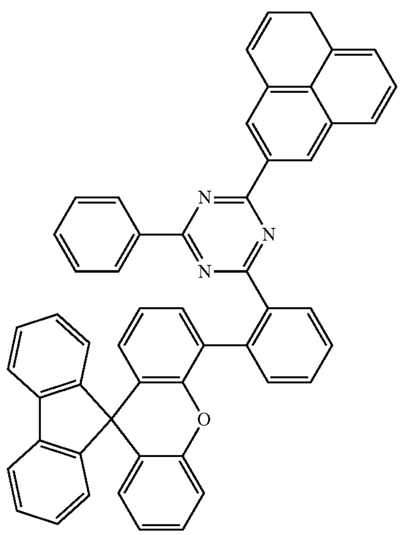
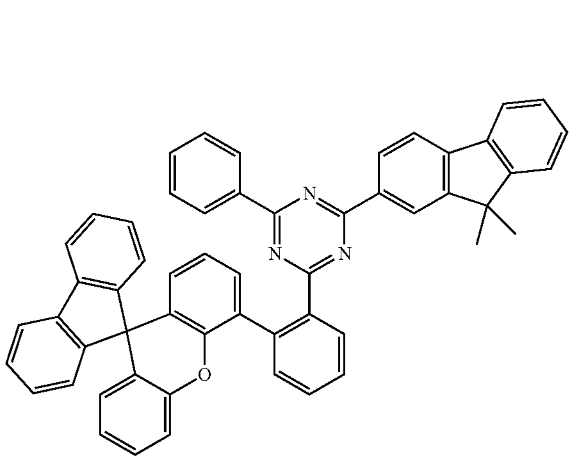
-continued
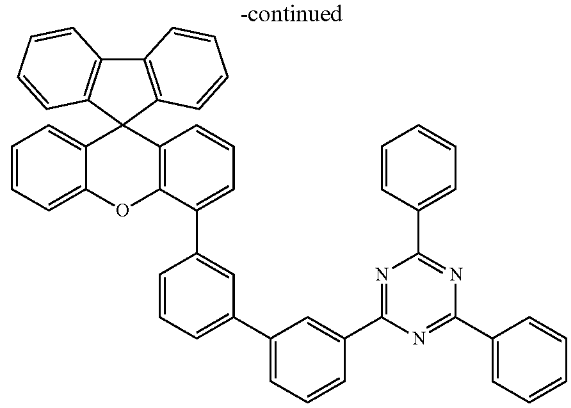
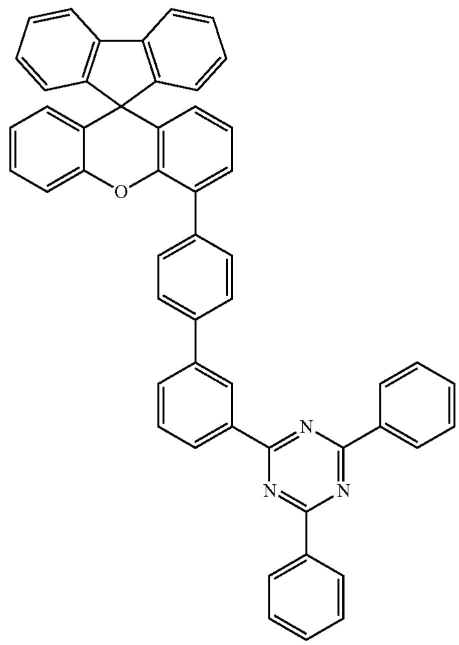
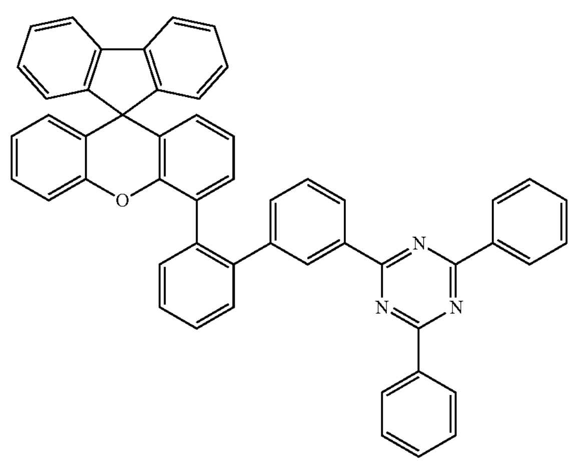

-continued
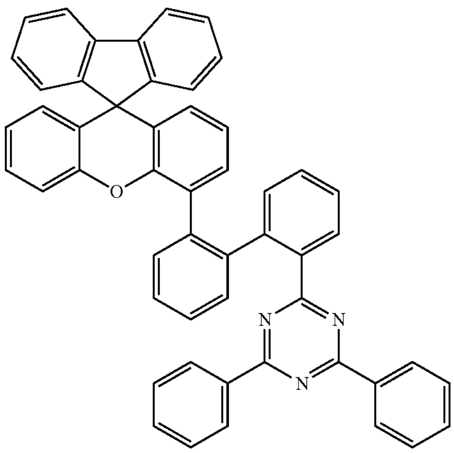
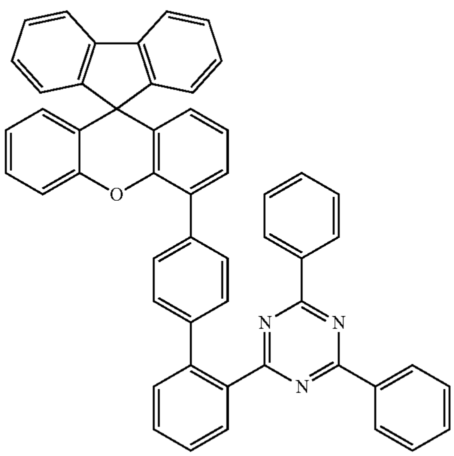
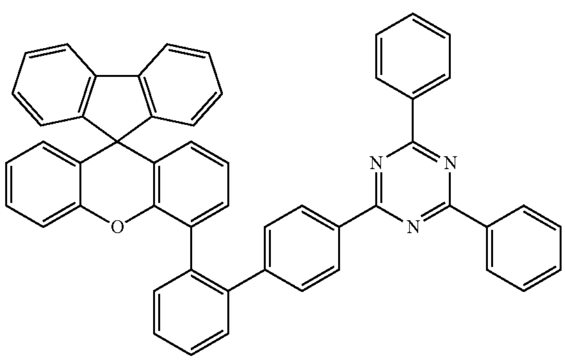
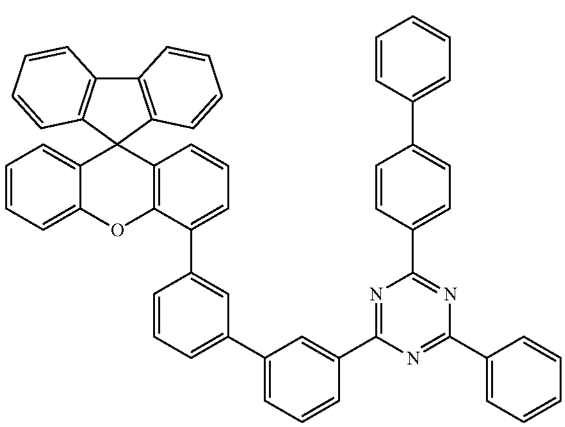
-continued
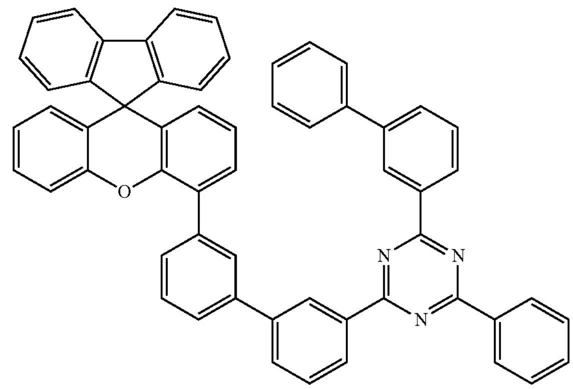
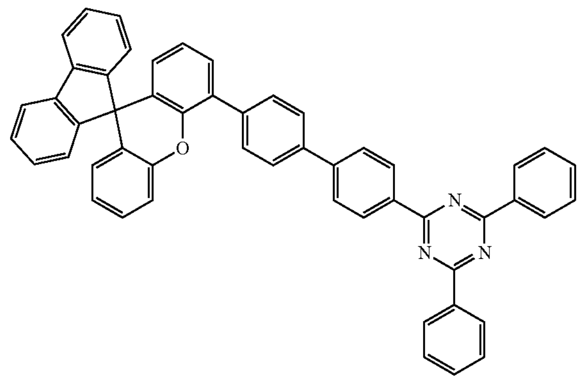
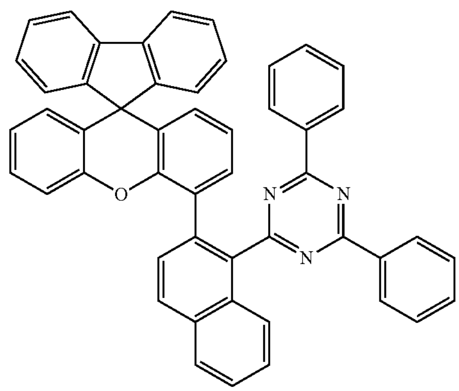
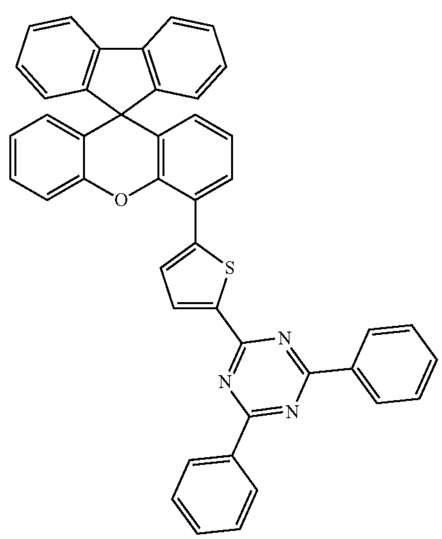

-continued
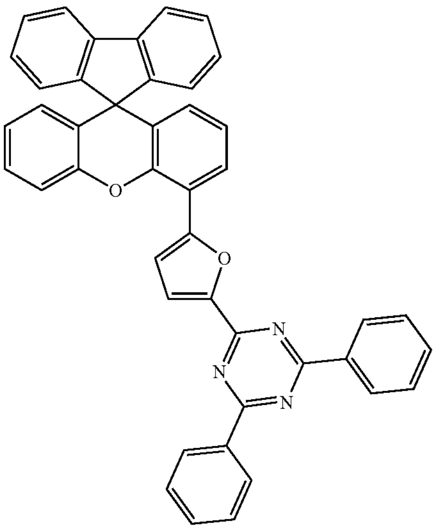
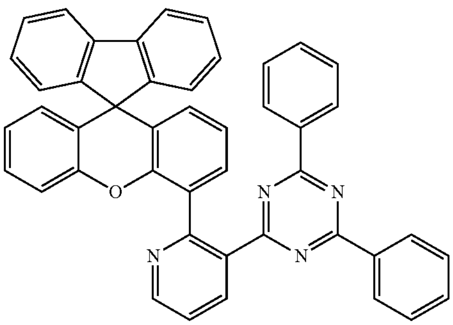
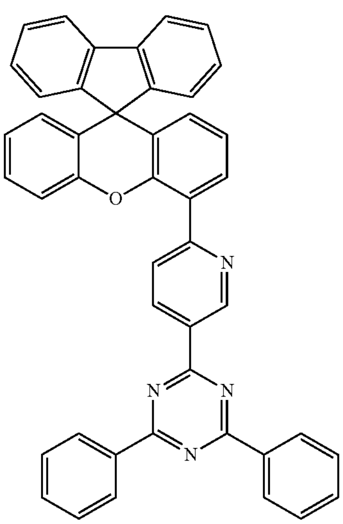
-continued
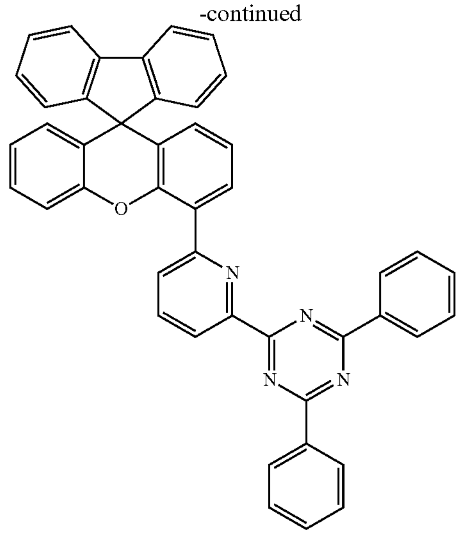
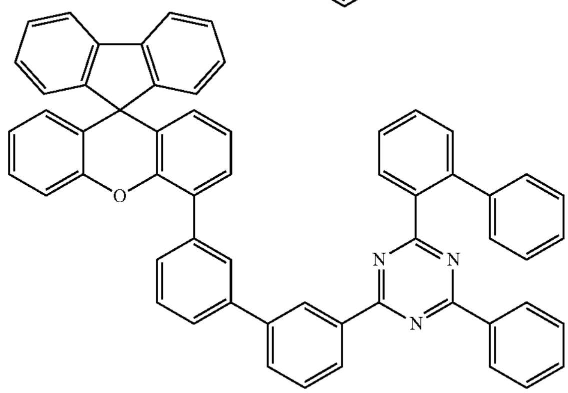
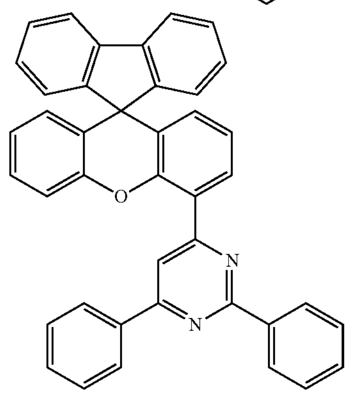
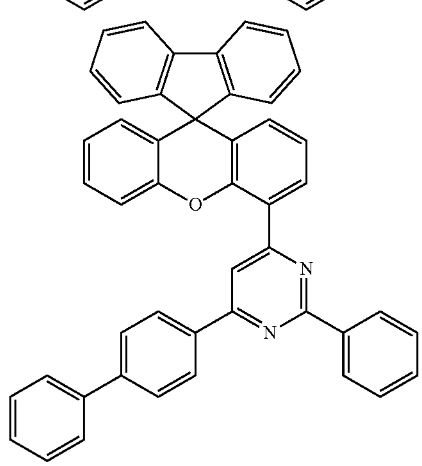

-continued
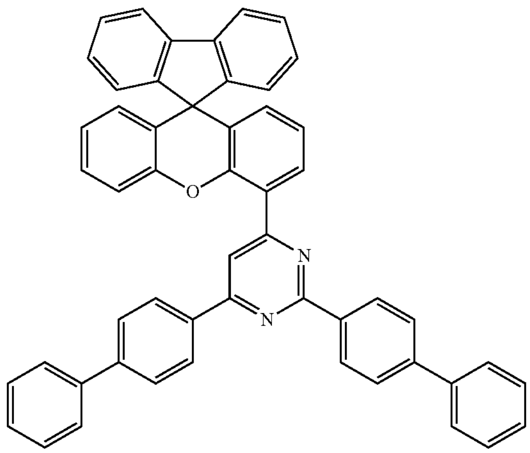
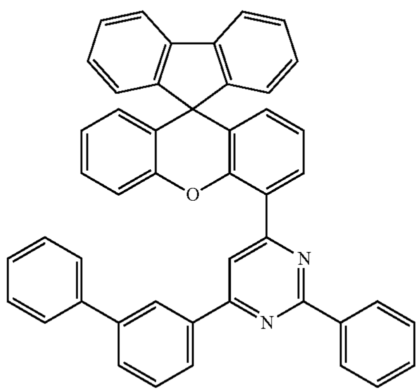
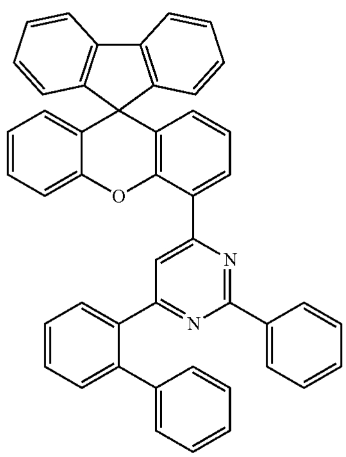
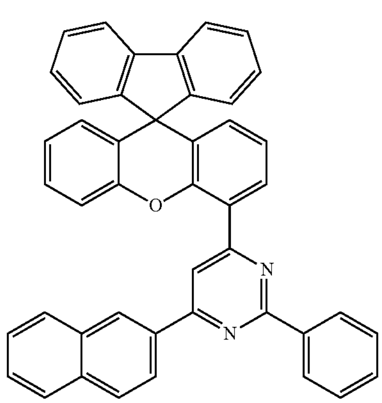
-continued
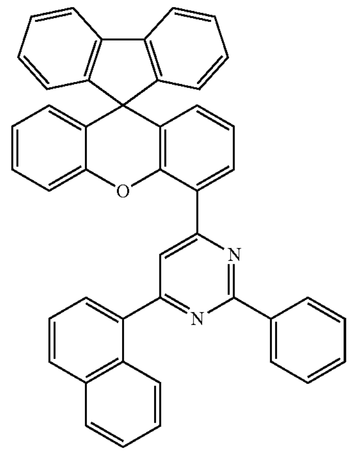
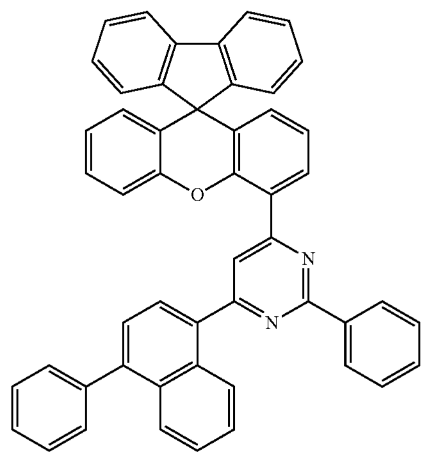
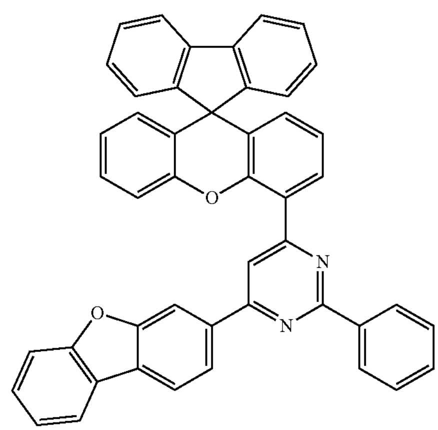

-continued
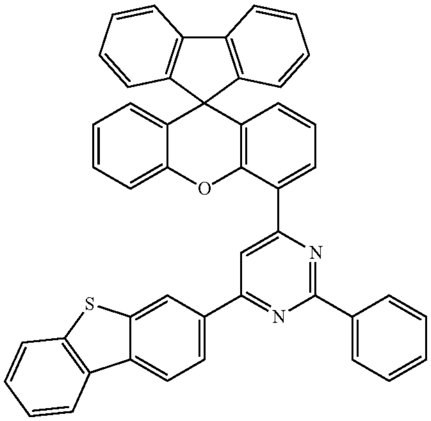
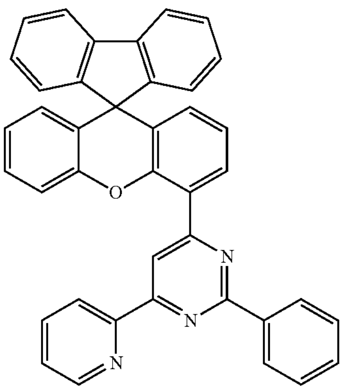
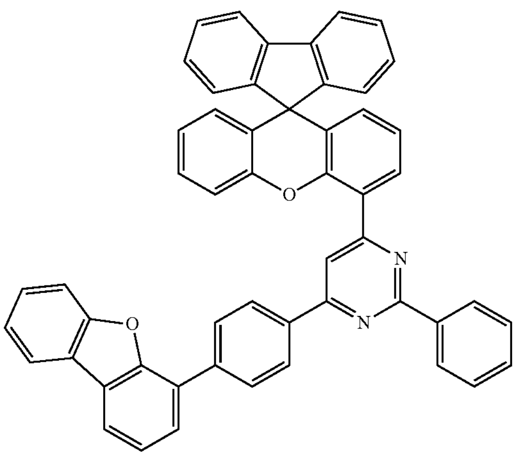
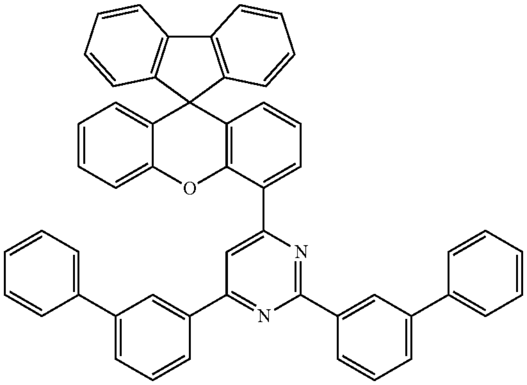
-continued
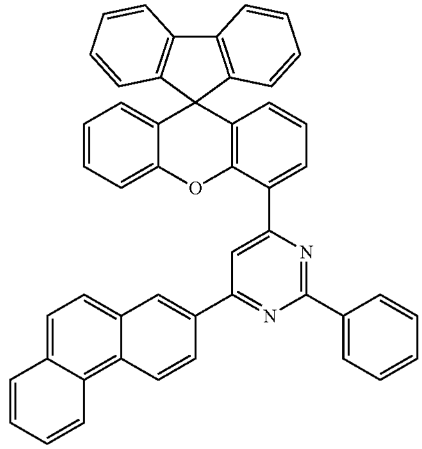
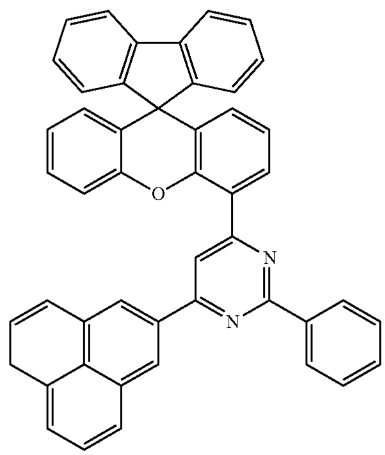
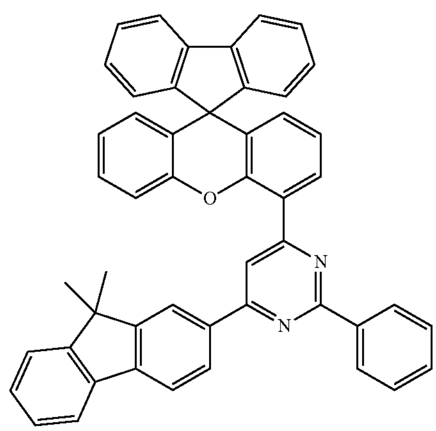

-continued
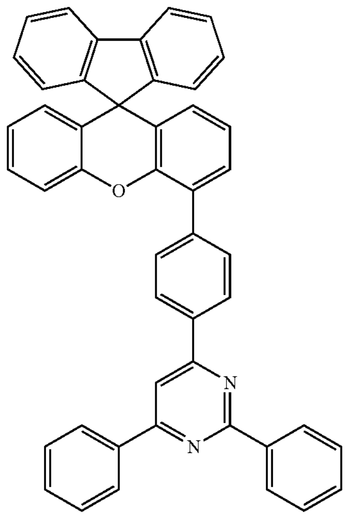
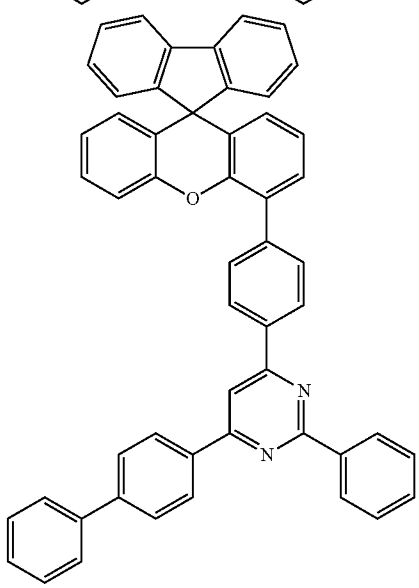
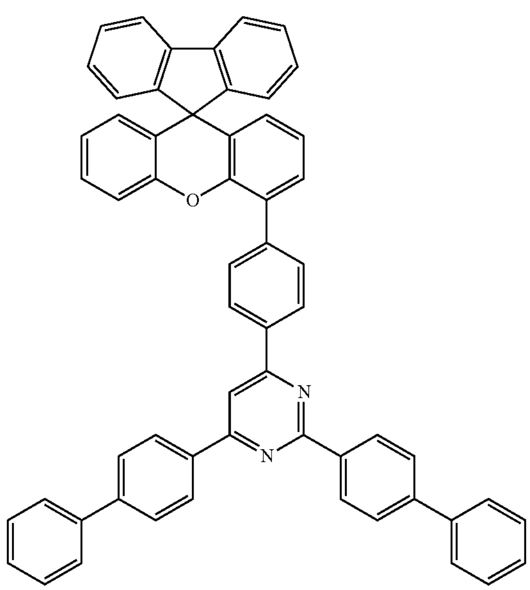
-continued
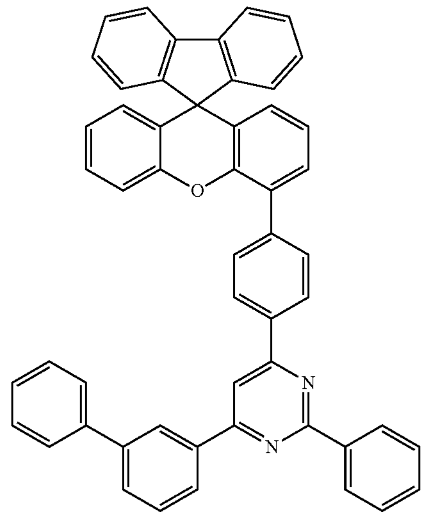
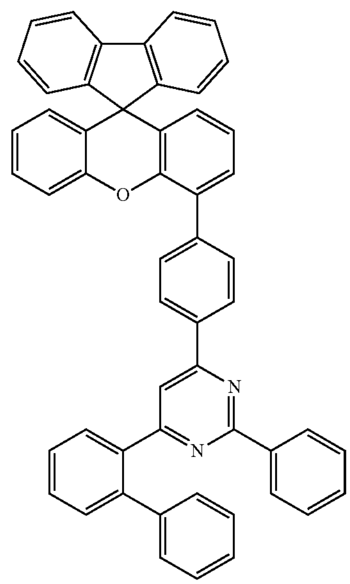
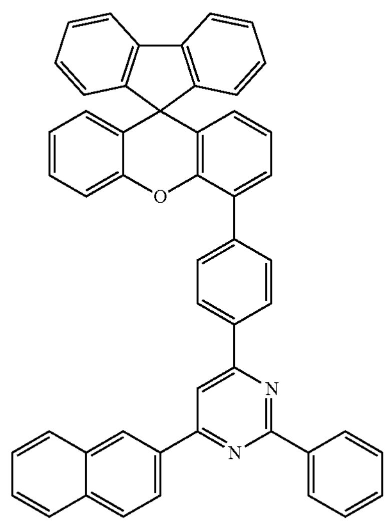

-continued
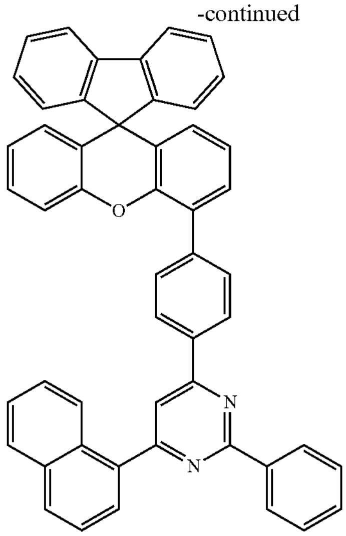
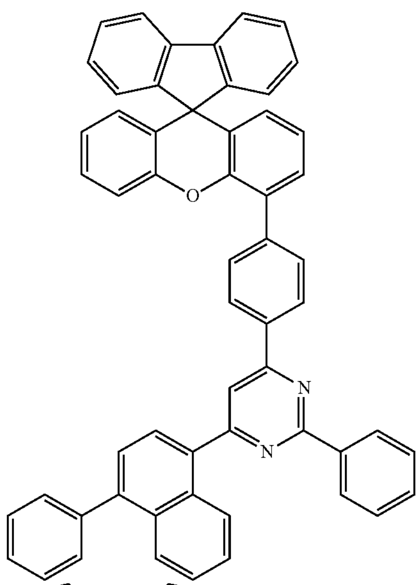
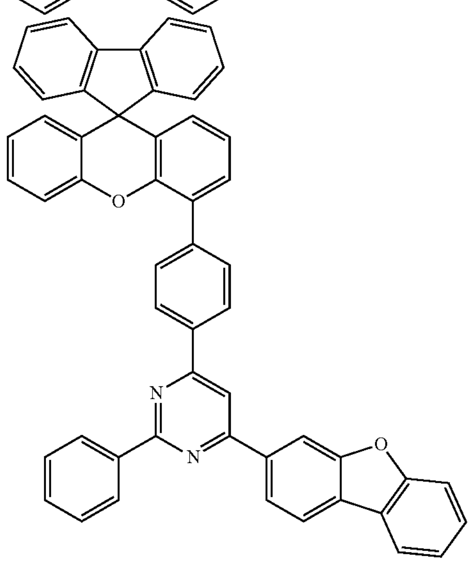
-continued
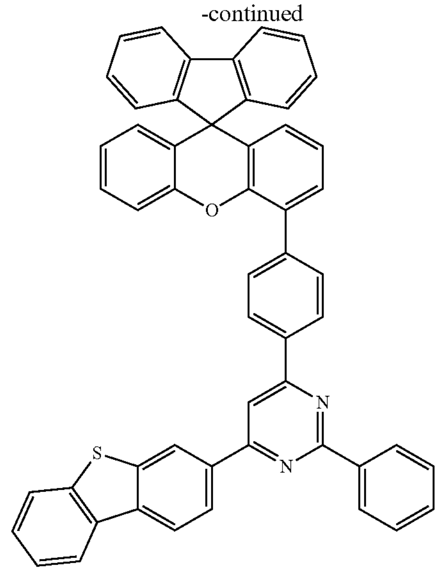
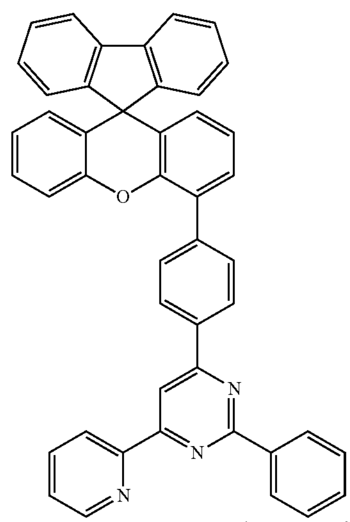
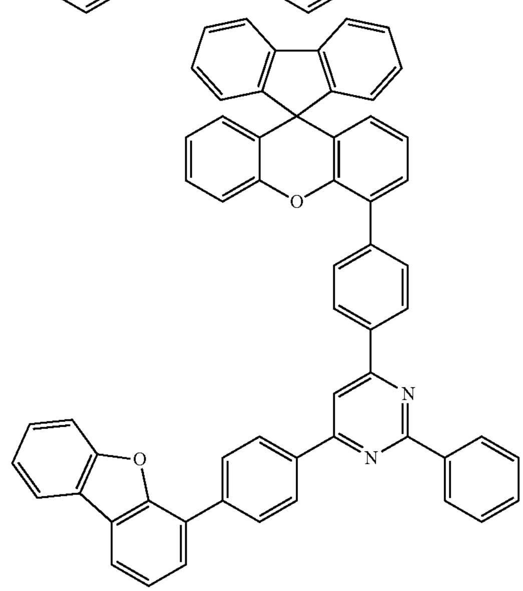

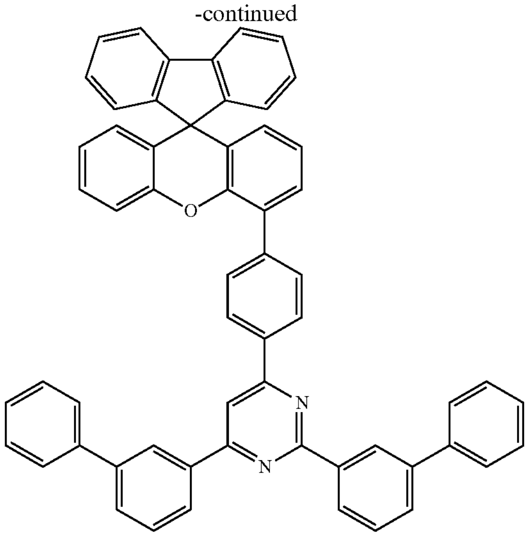
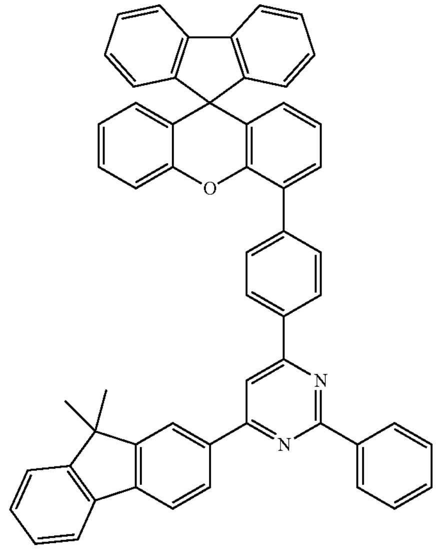
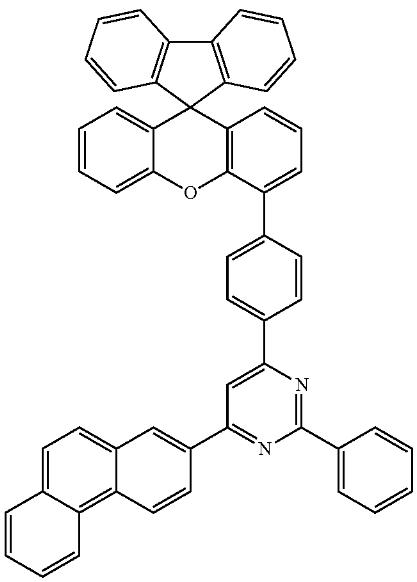
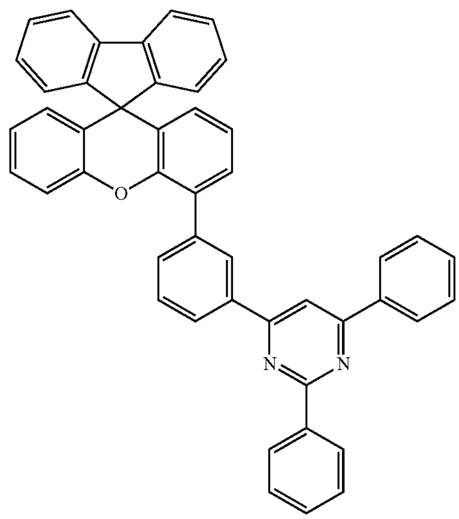
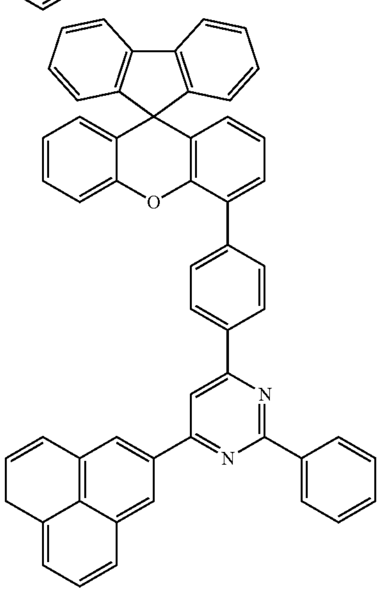
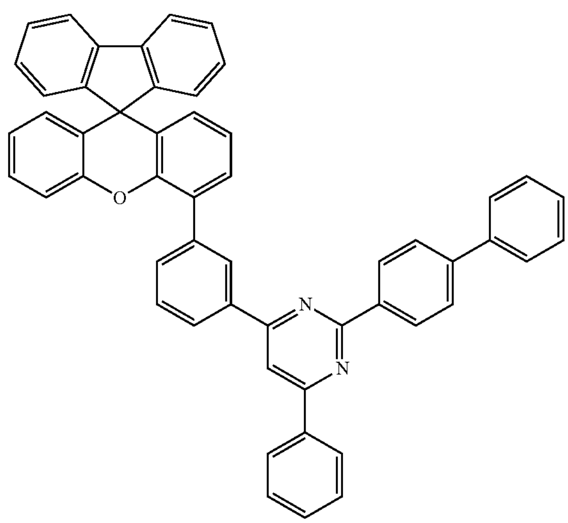
O
N
N -continued
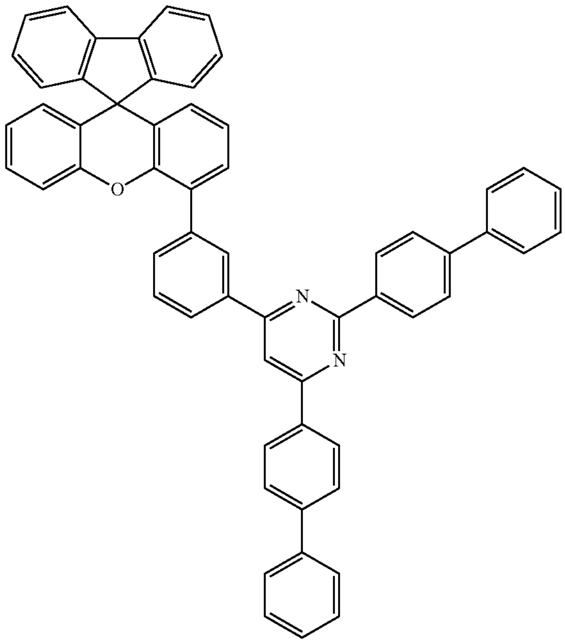
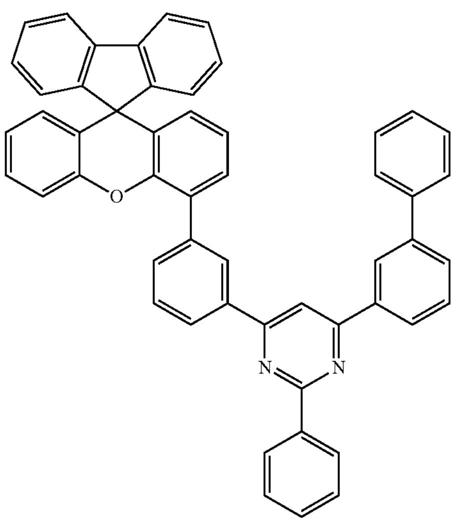
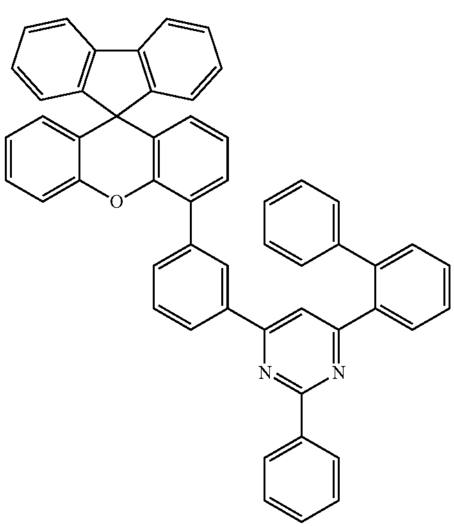
-continued
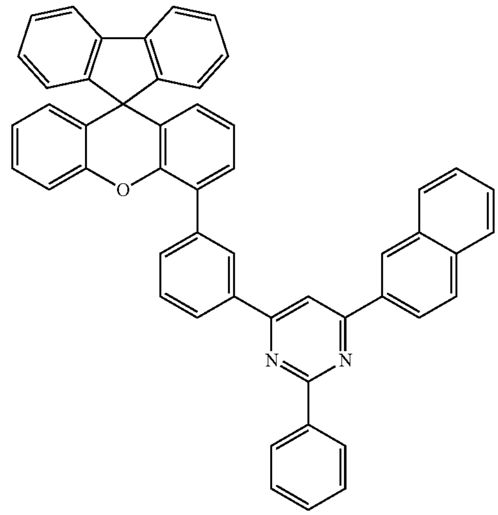
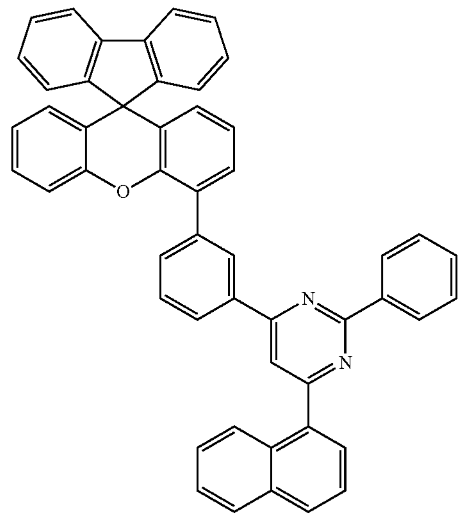
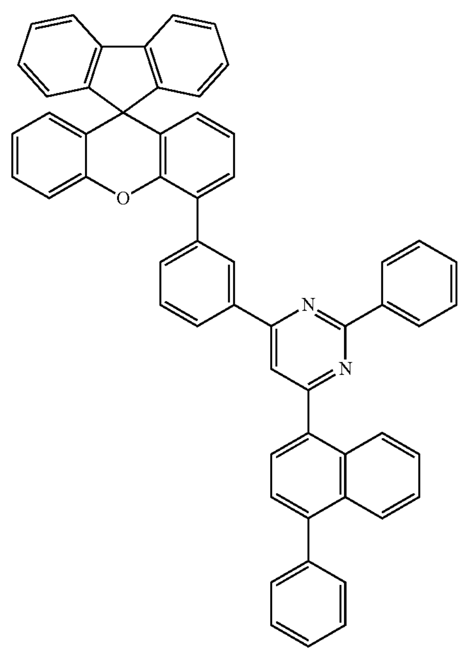

-continued
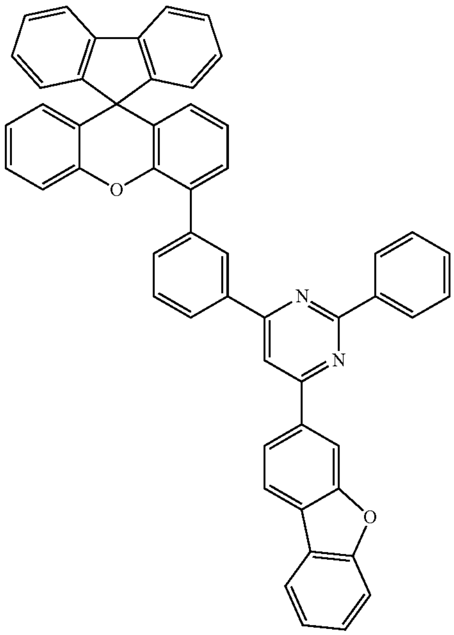
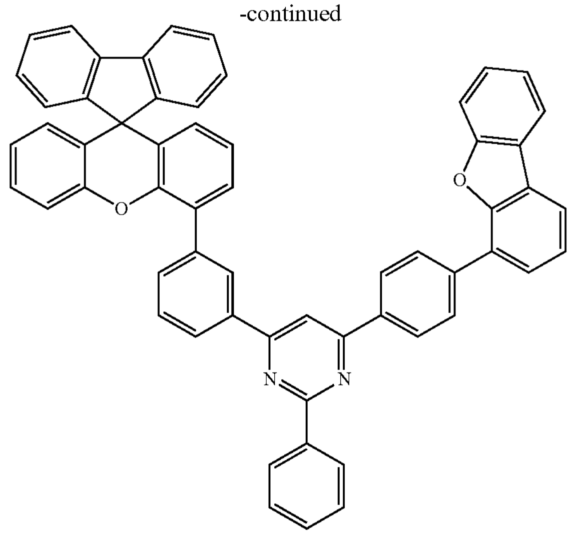
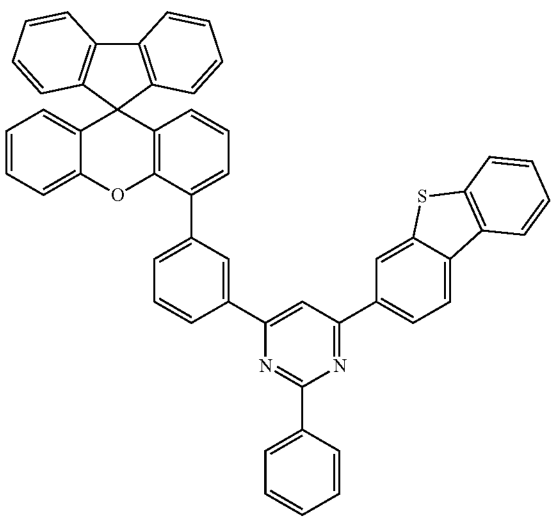
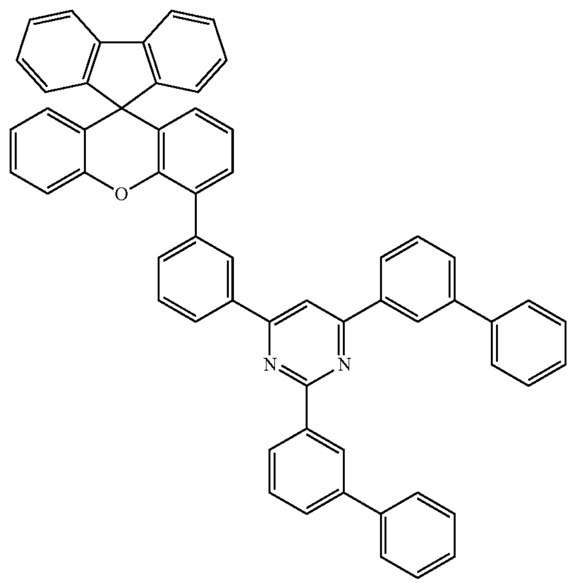
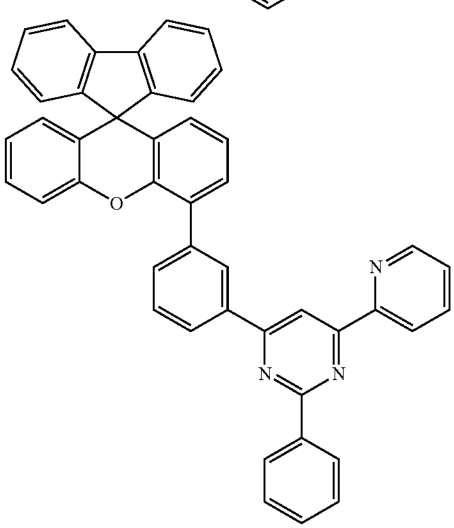
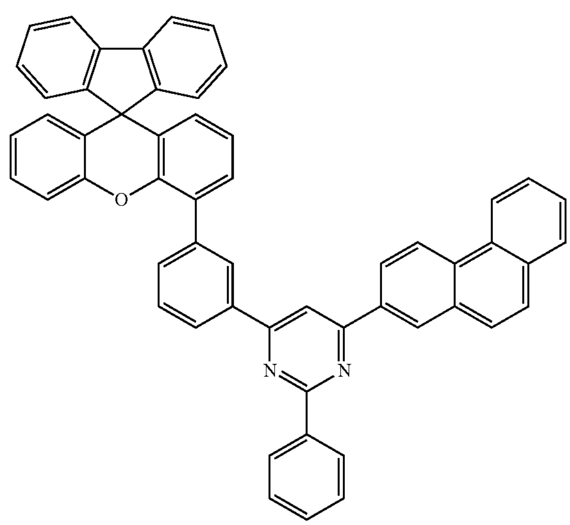

-continued
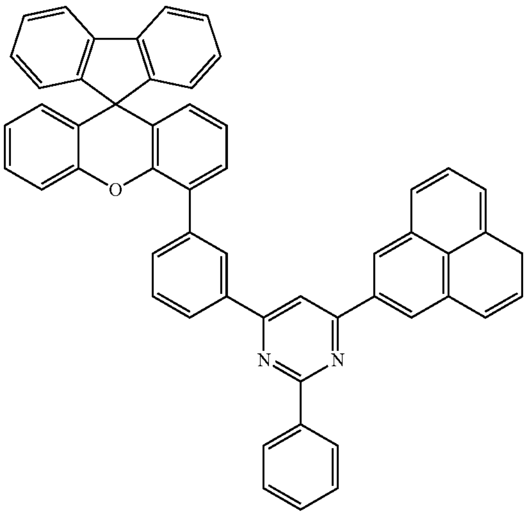
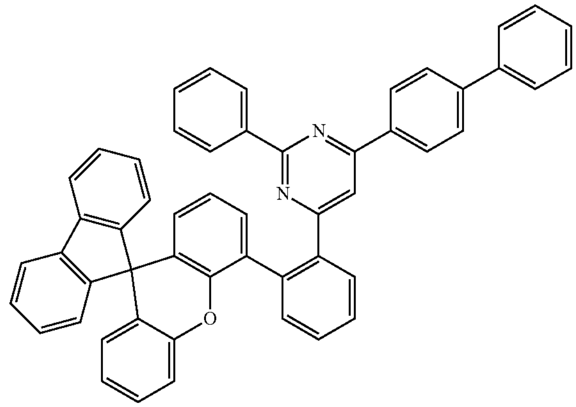
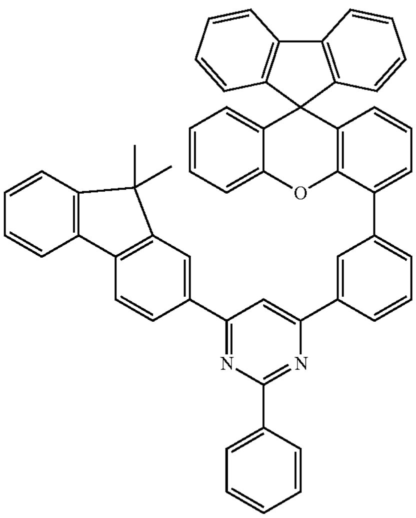
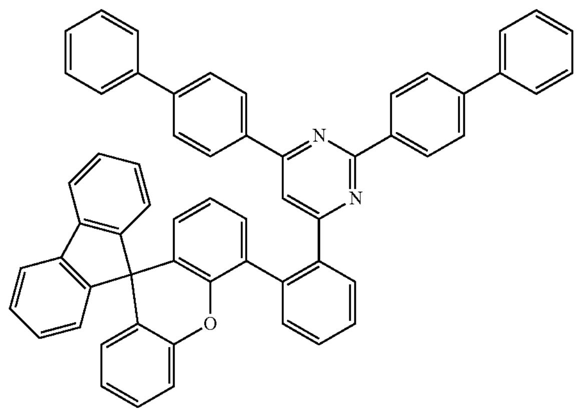
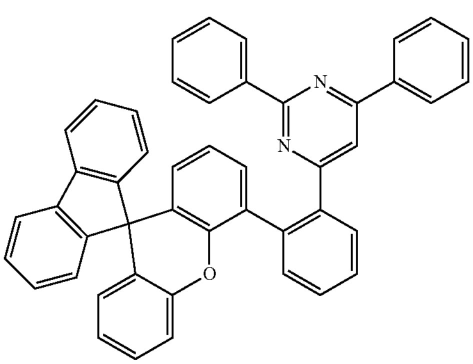
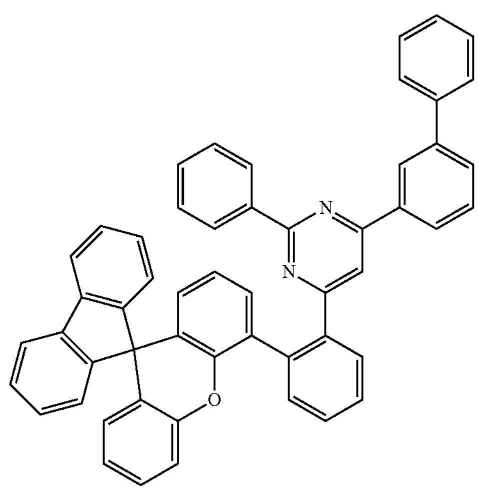

-continued
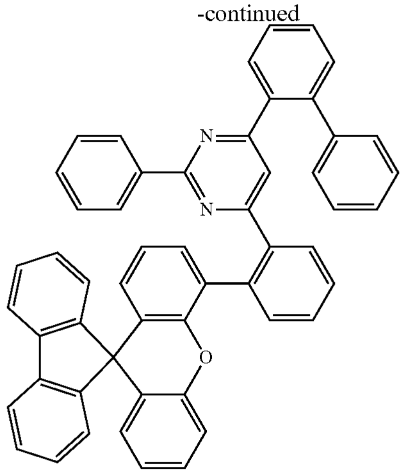
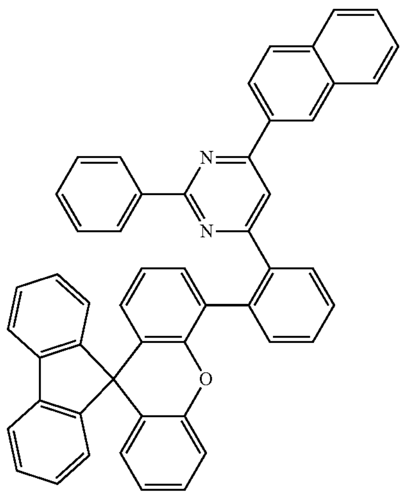
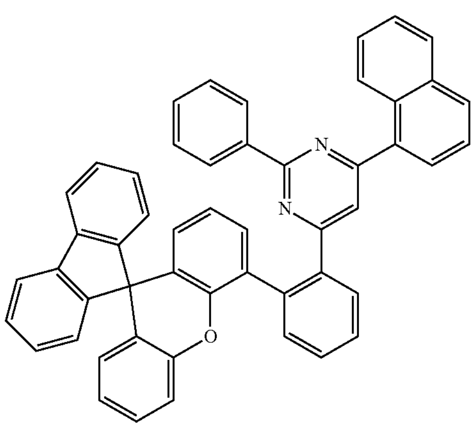
-continued
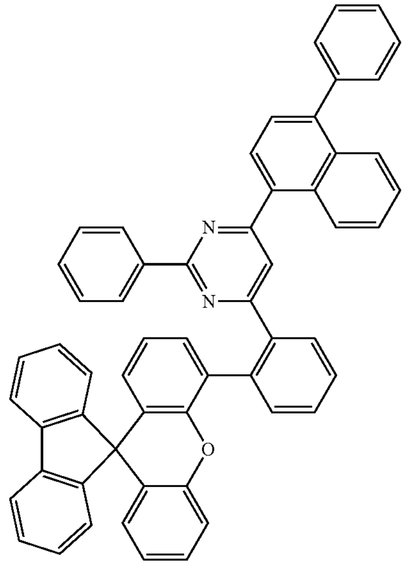
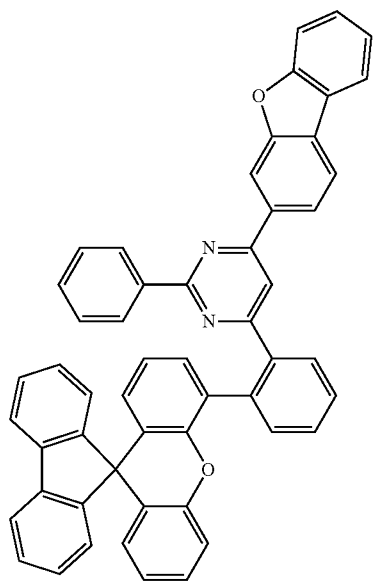
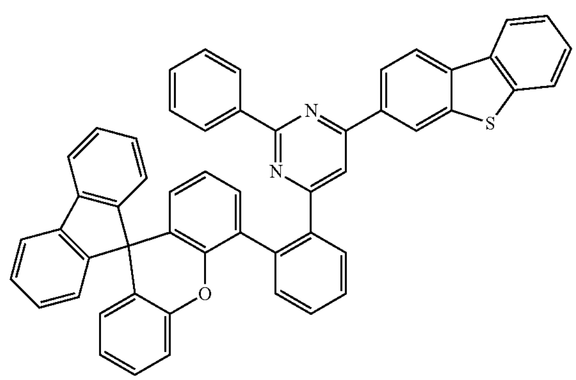

-continued
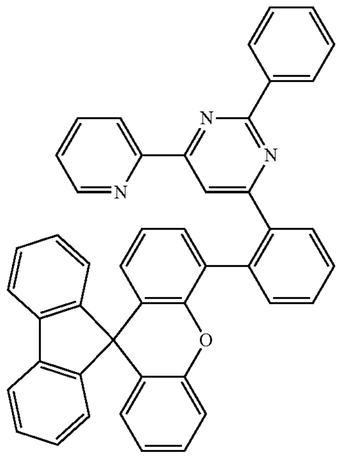
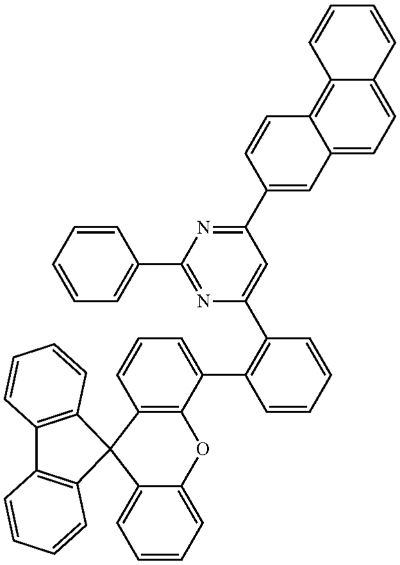
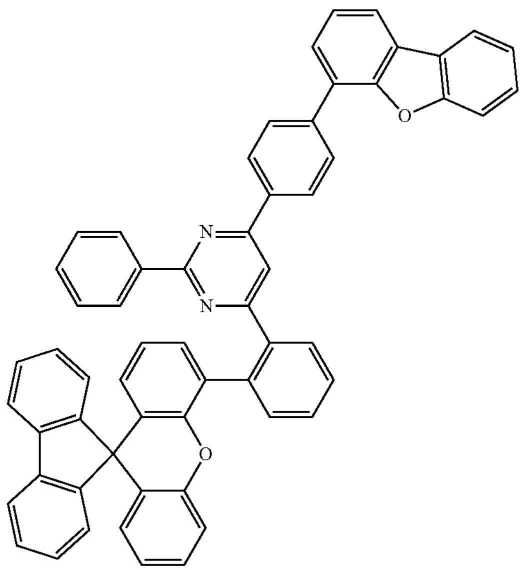
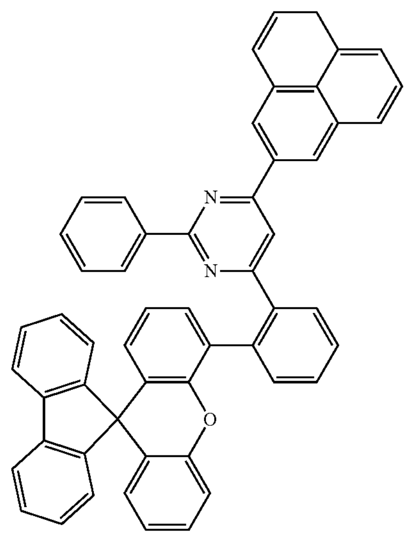
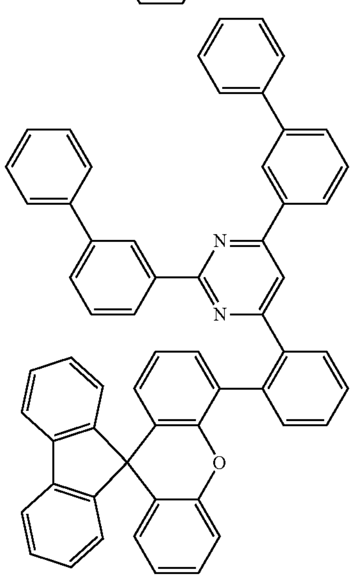
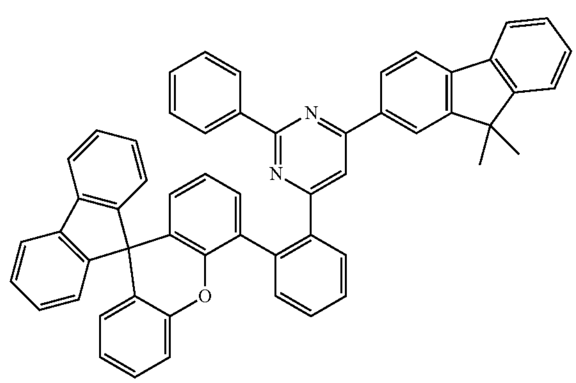

-continued
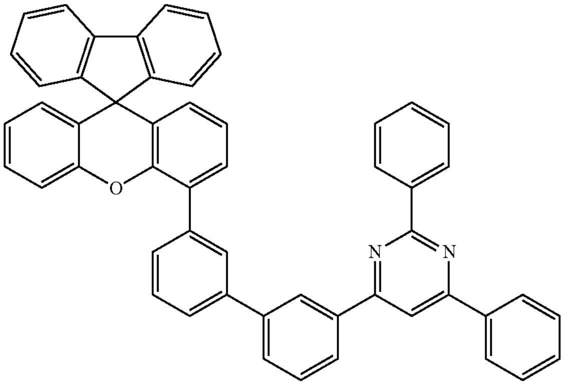
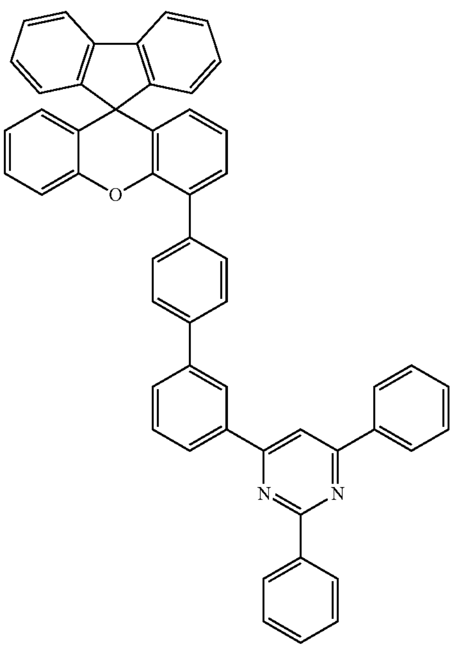
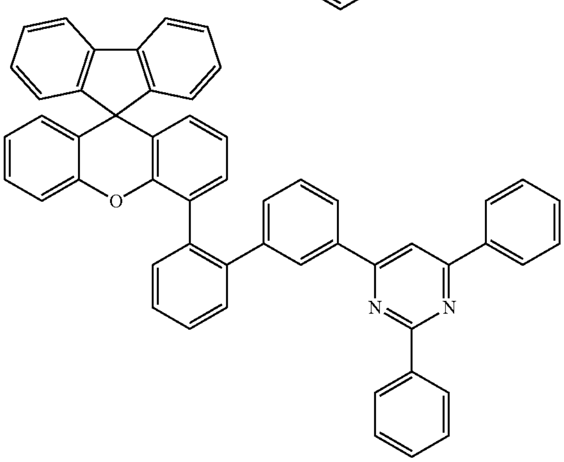
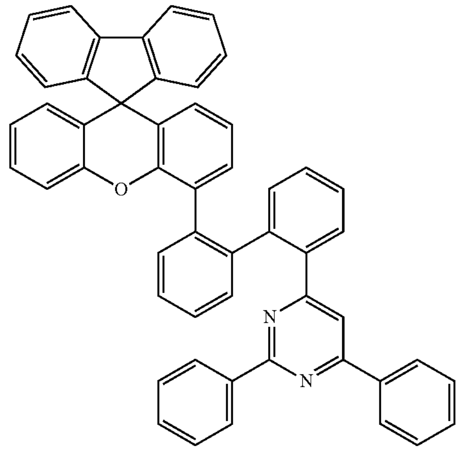
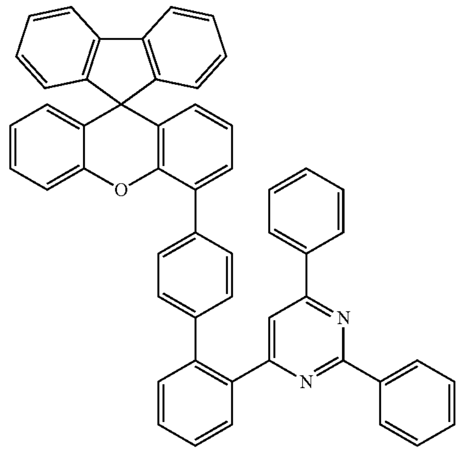
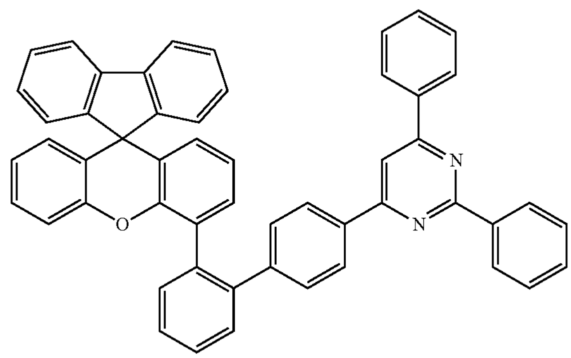
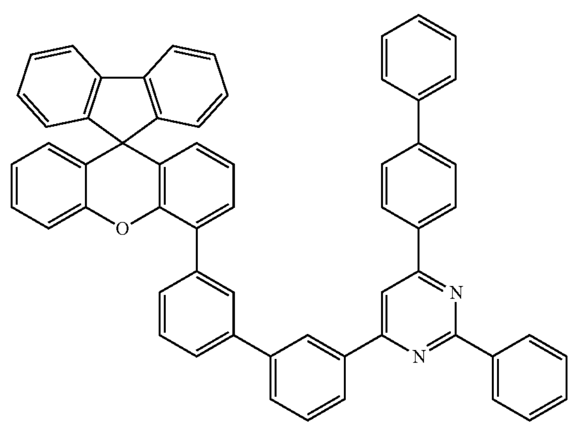

-continued
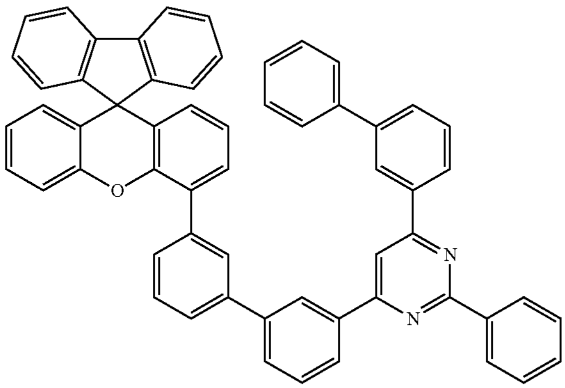
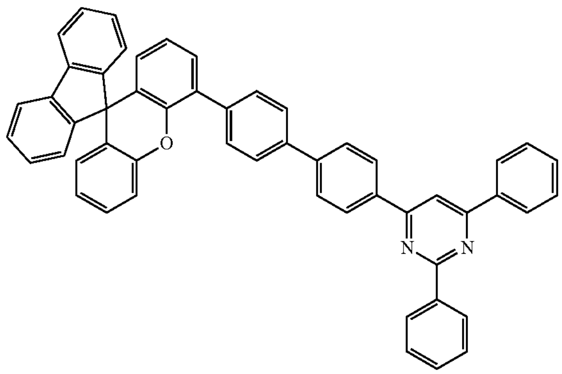
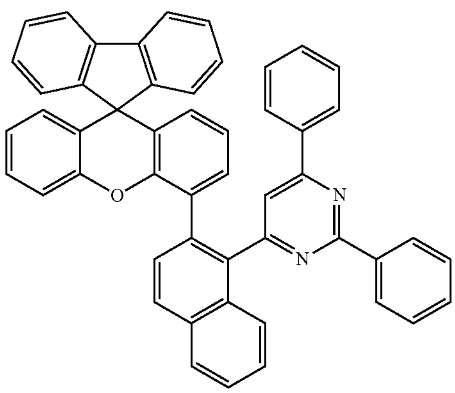
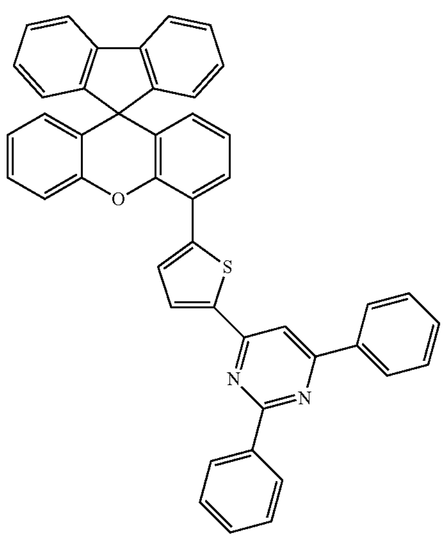
-continued
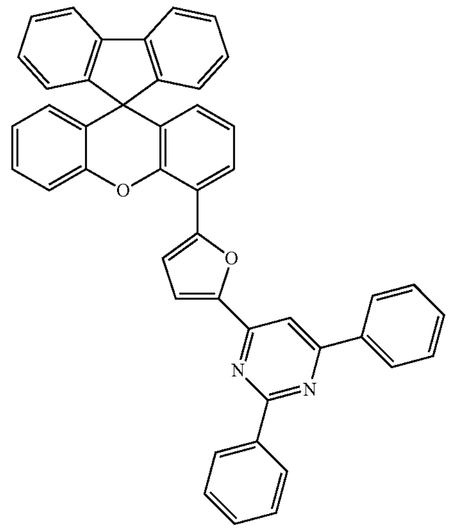
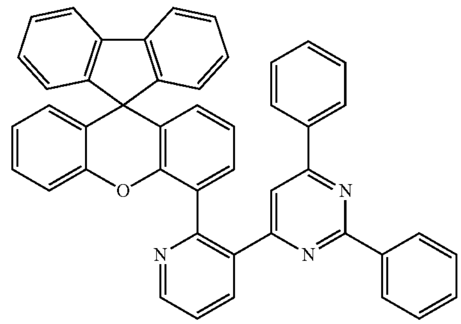
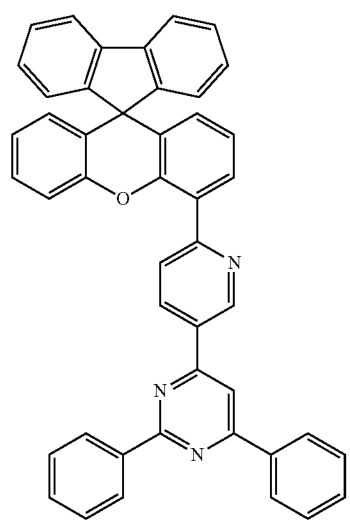

-continued
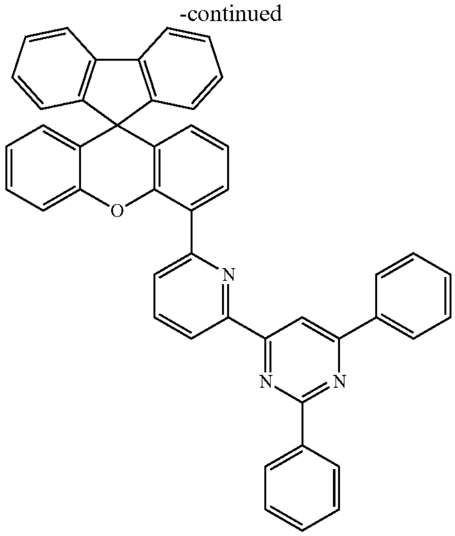
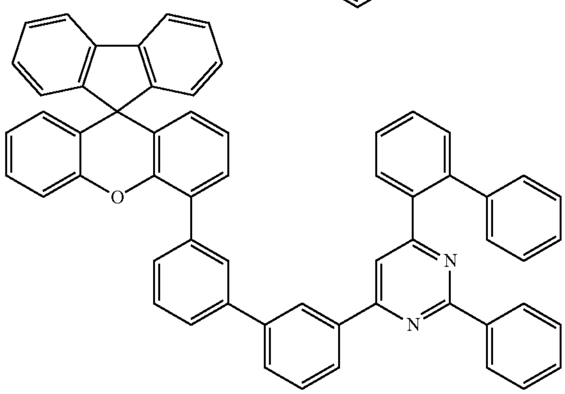
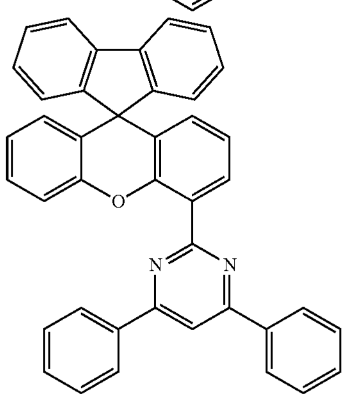
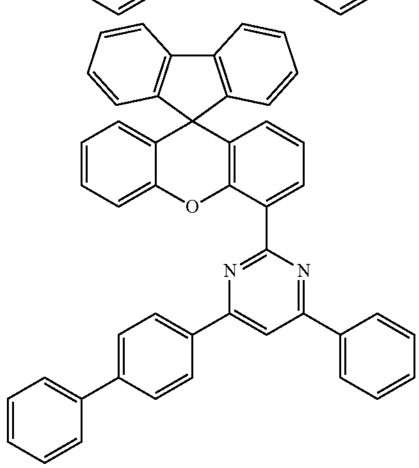
-continued
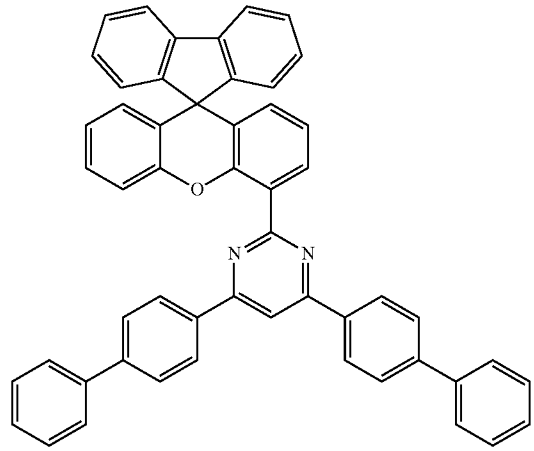
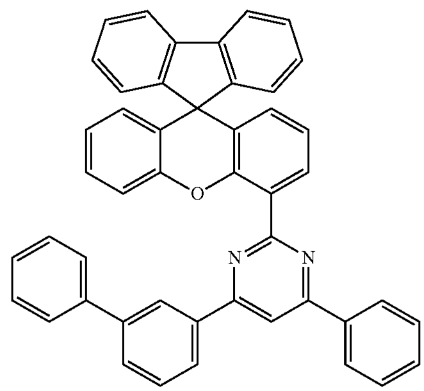
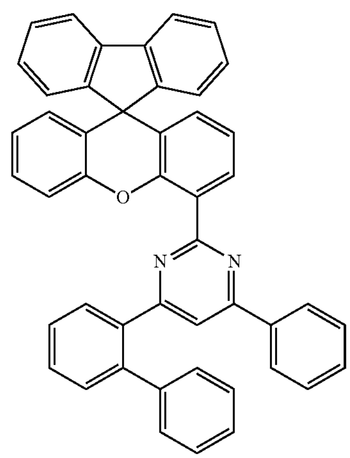
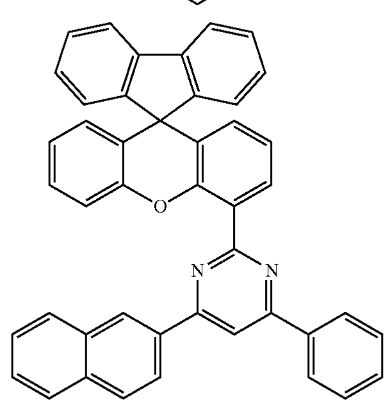

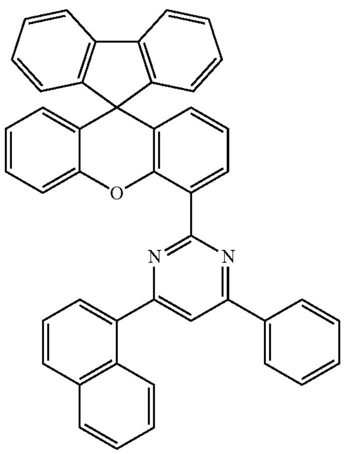
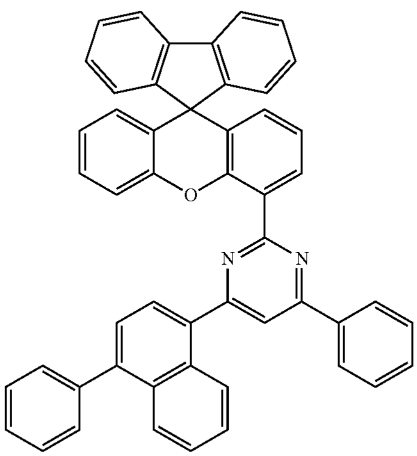
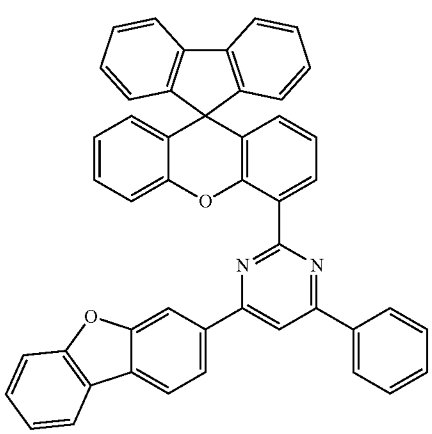
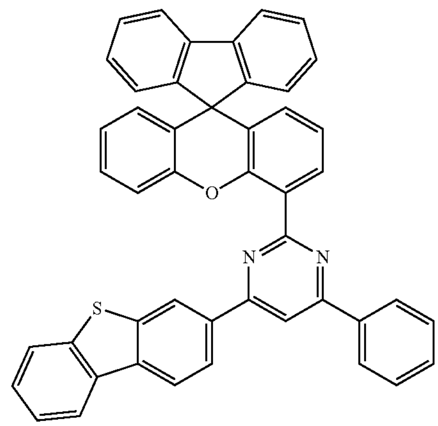
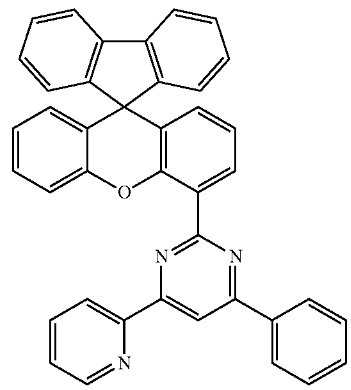
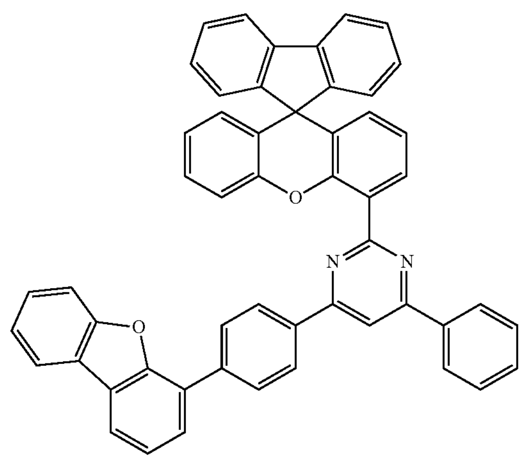
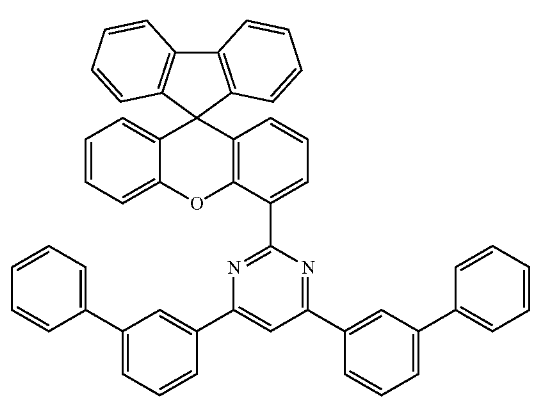

-continued
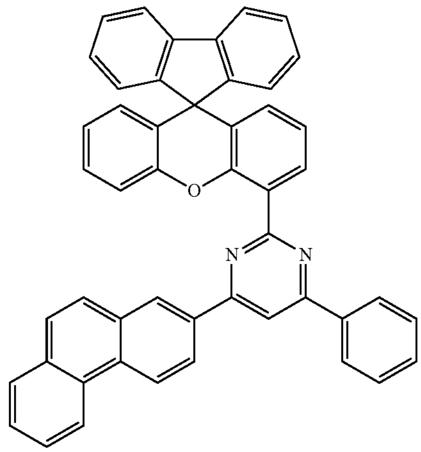
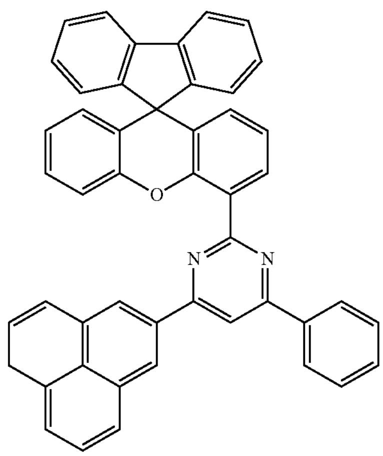
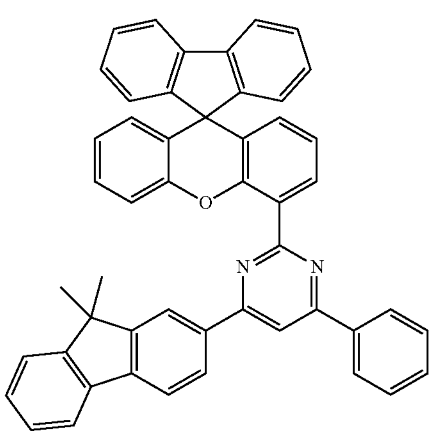
-continued
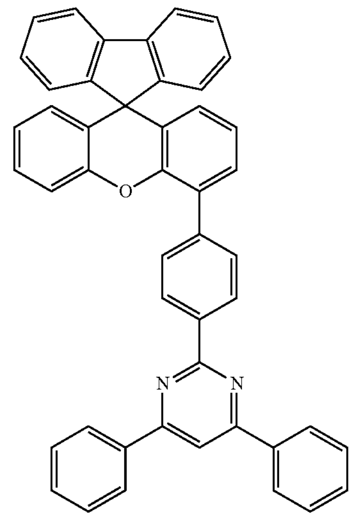
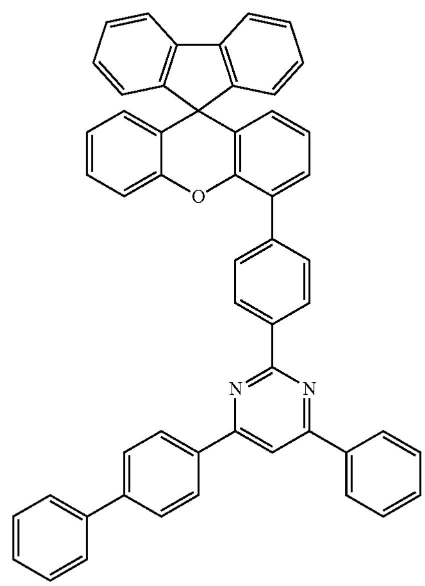
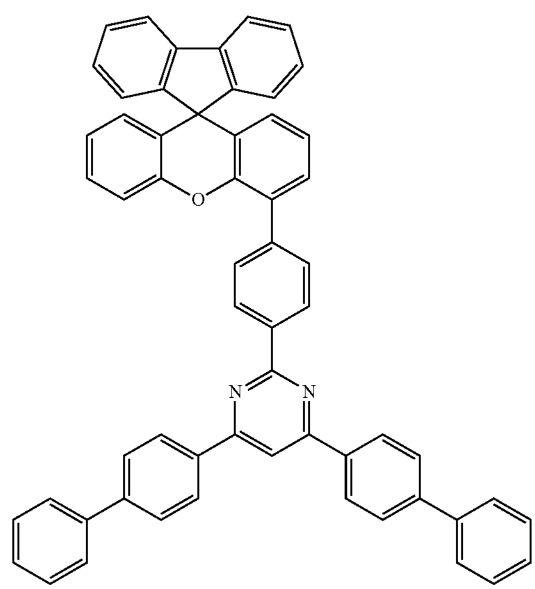

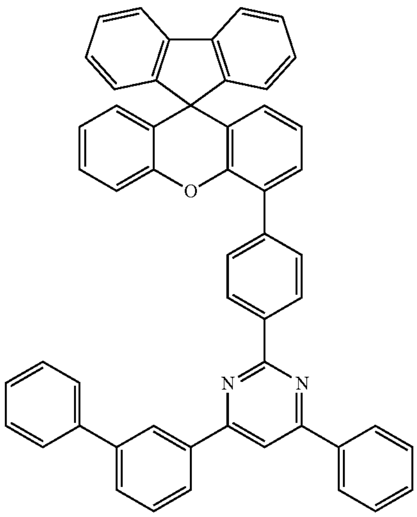
O
N
N
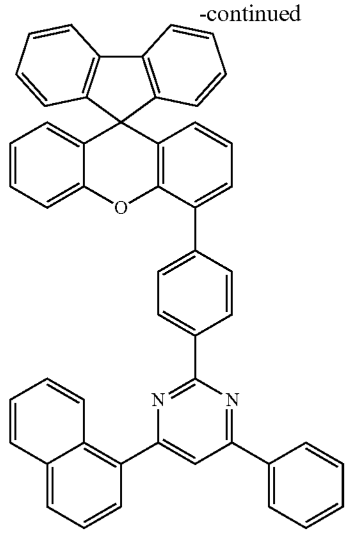
O
N
N
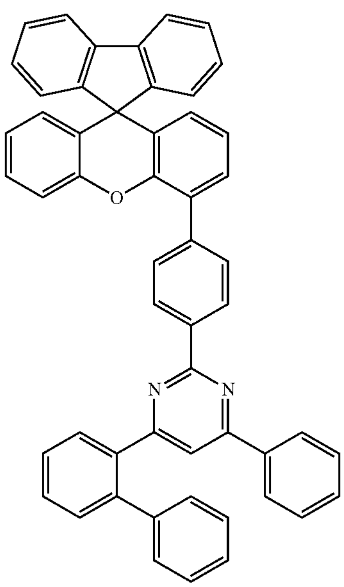
O
N
N
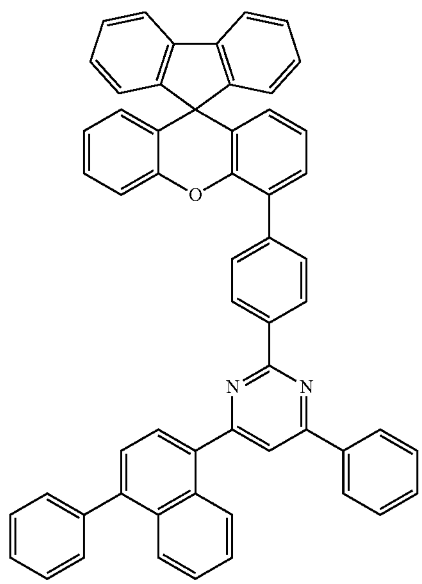
O
N
N
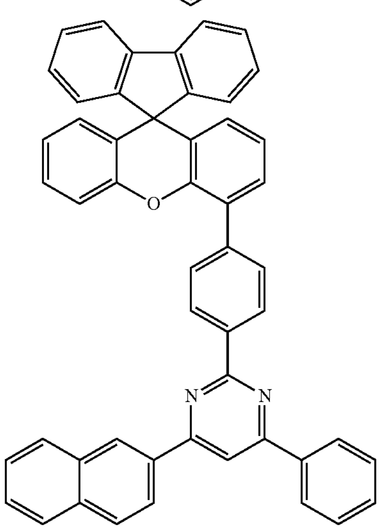
O
N
N
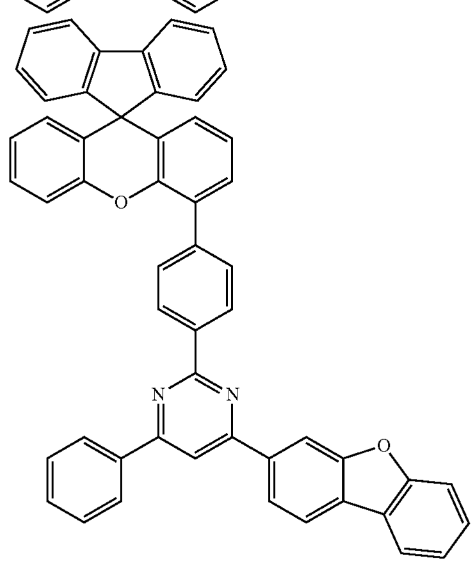
O
N
N
O -continued
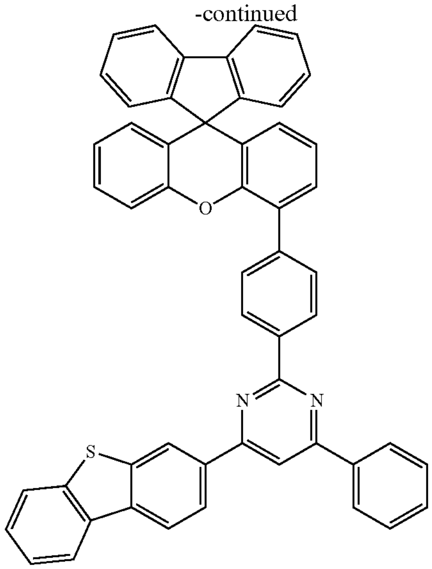
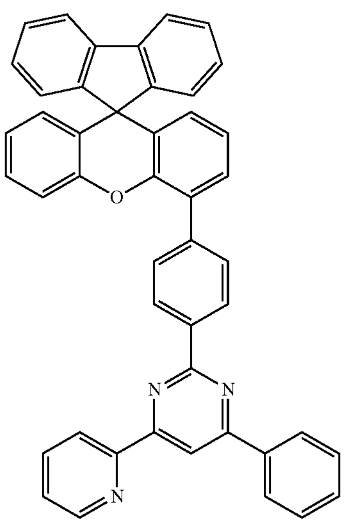
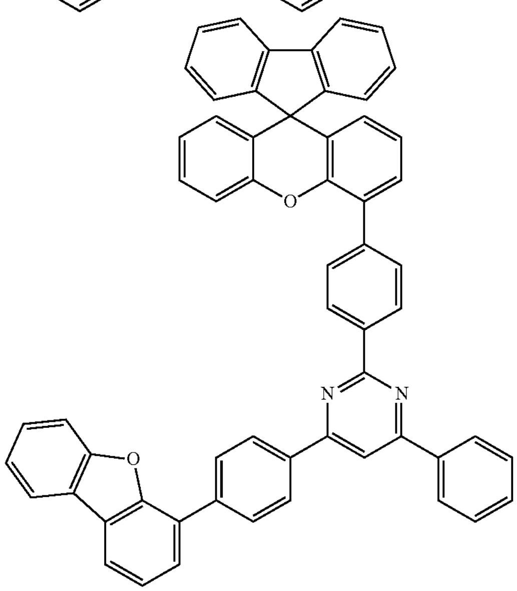
-continued
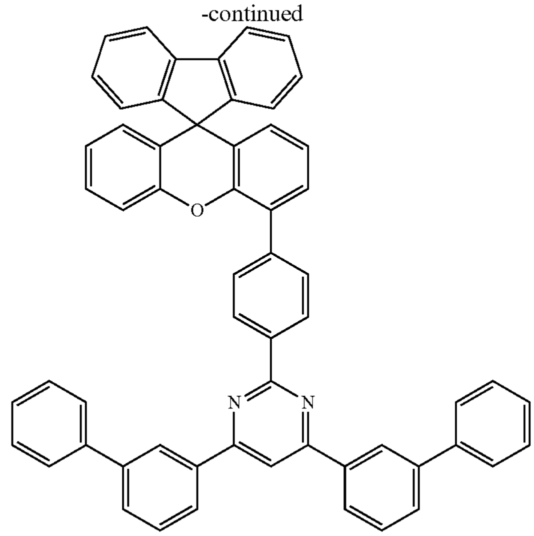
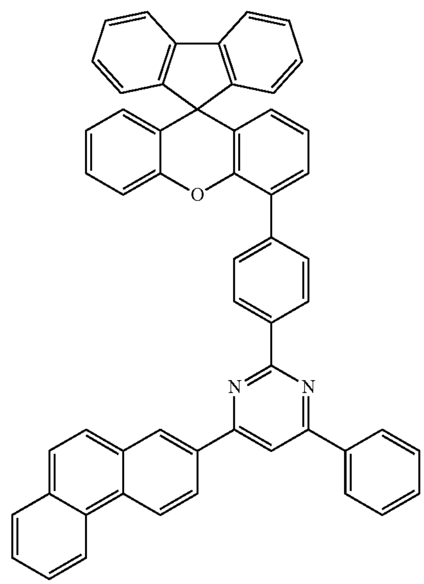
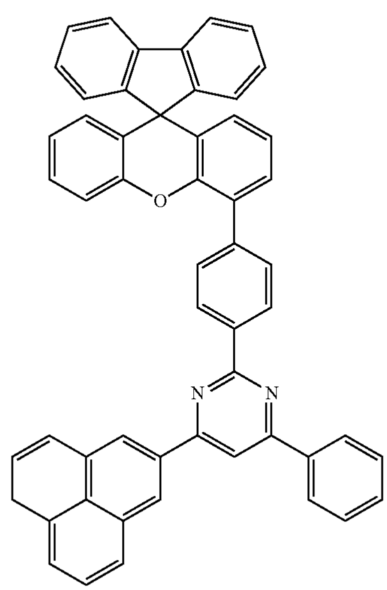

-continued
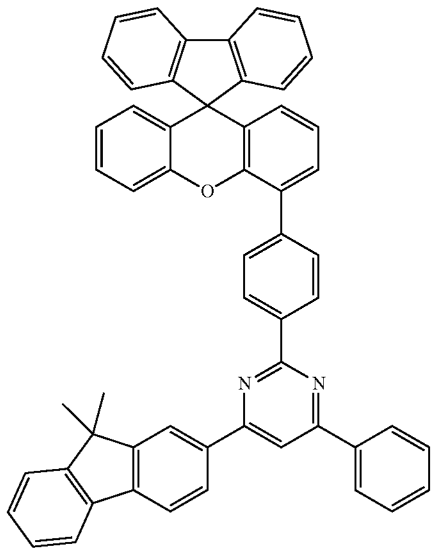
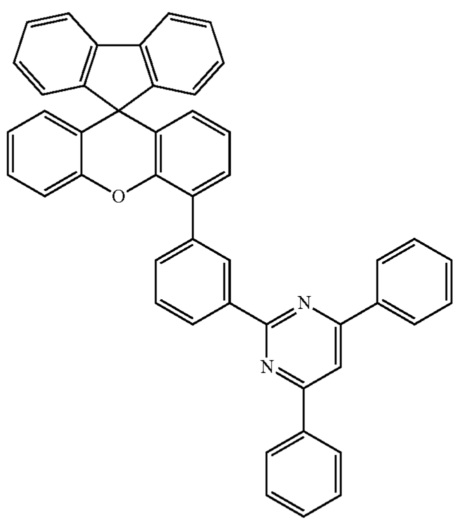
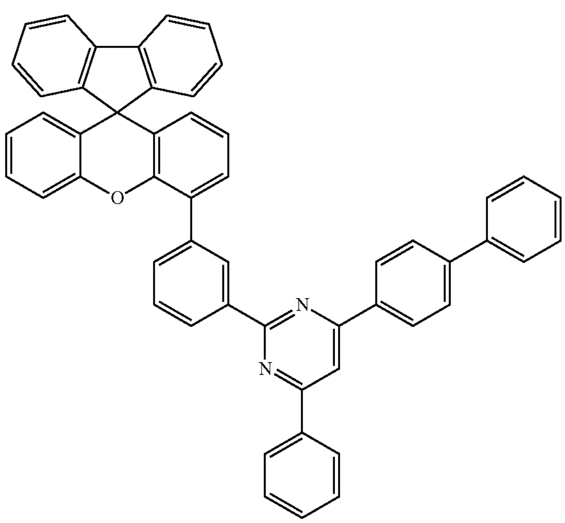
-continued
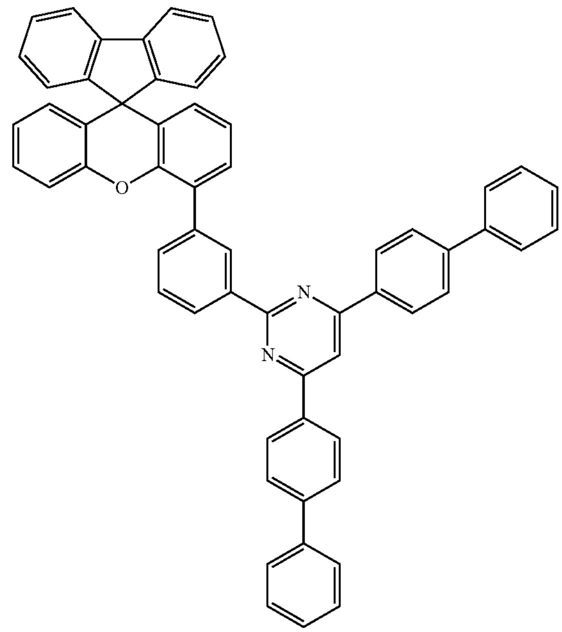
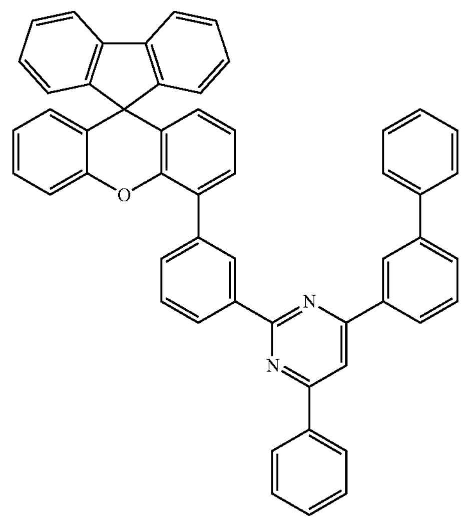
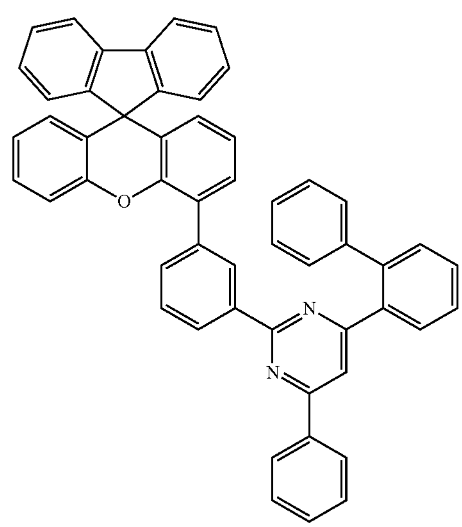

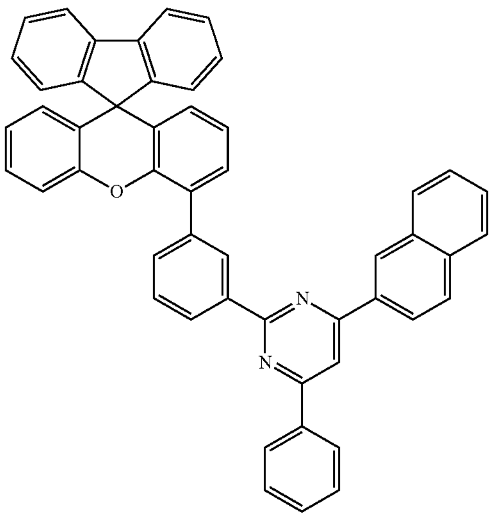
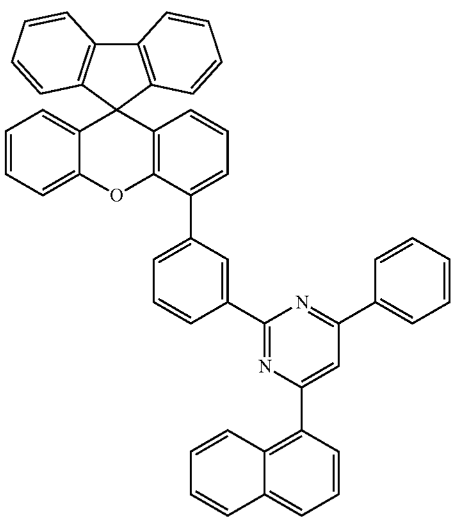
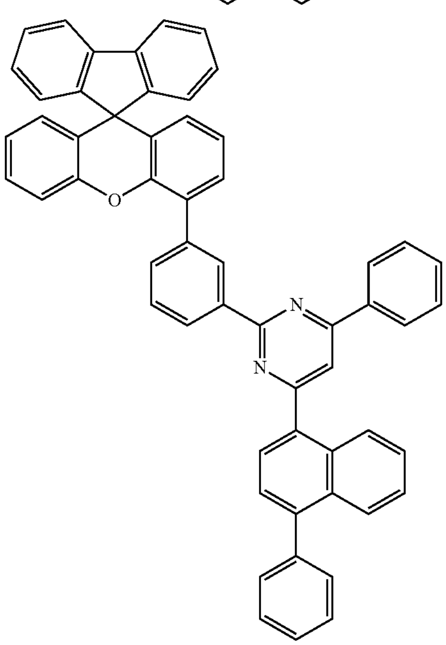
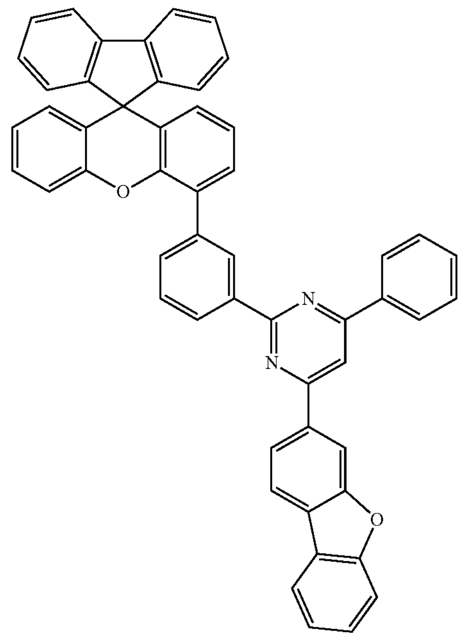
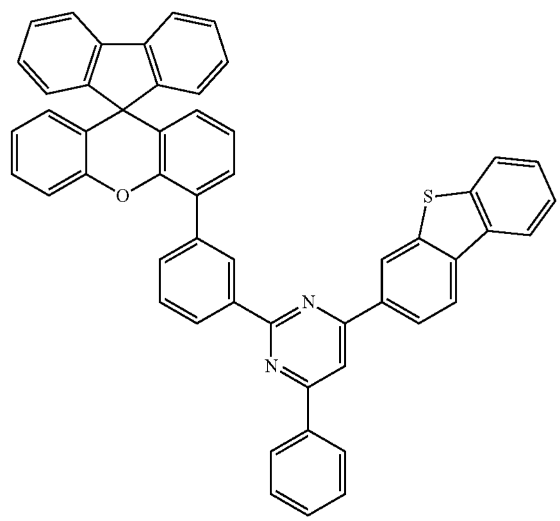
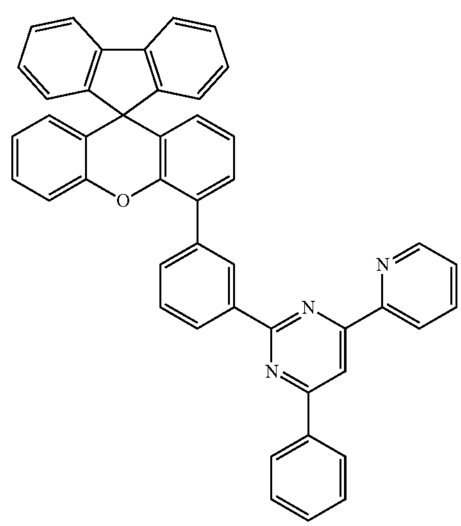

-continued
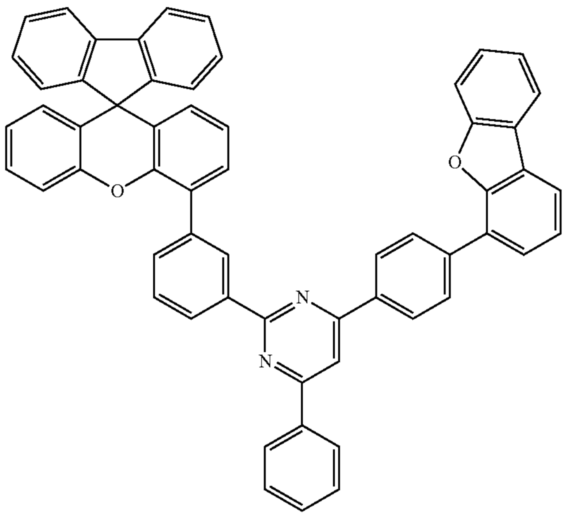
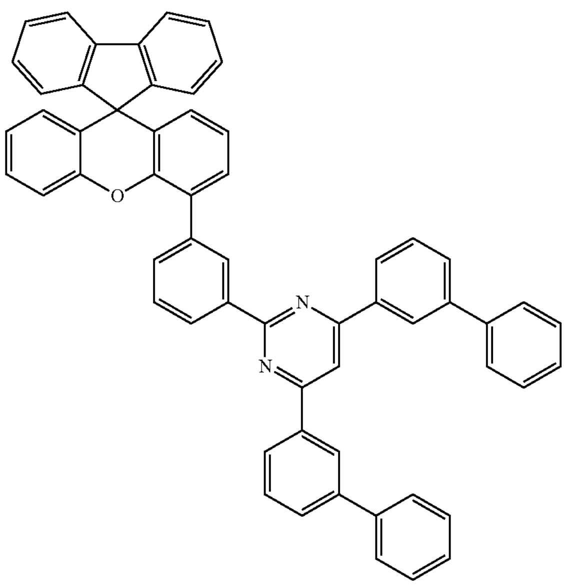
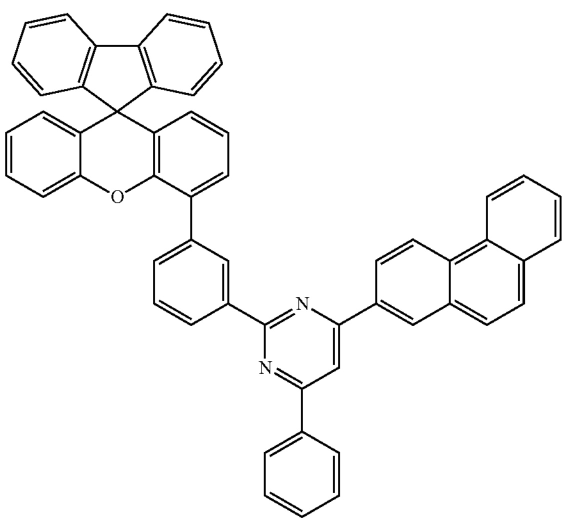
-continued
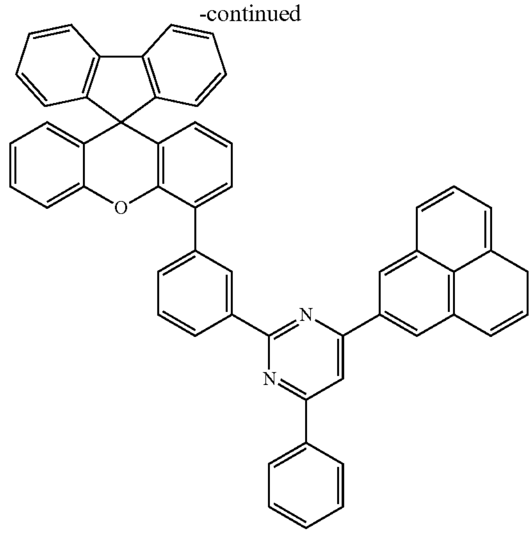
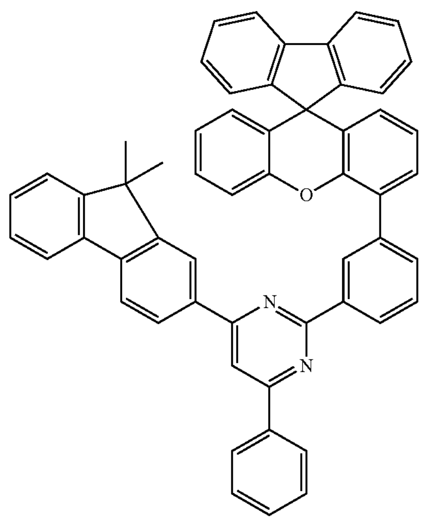
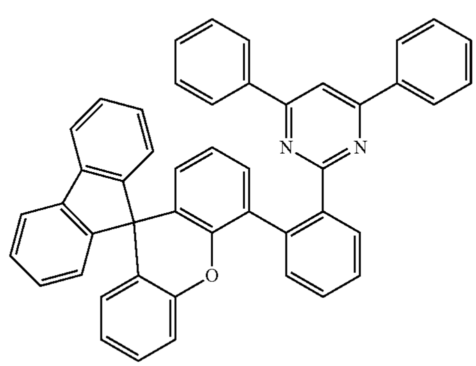

-continued
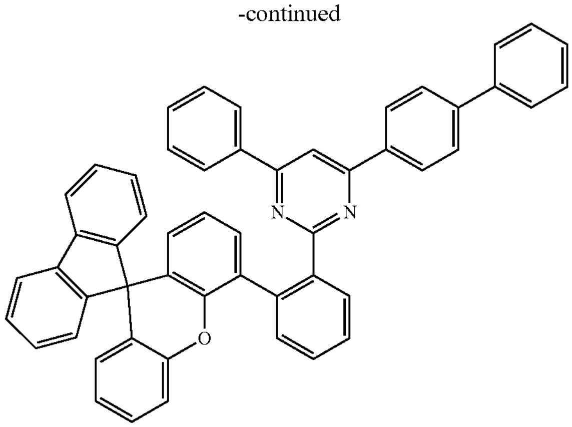
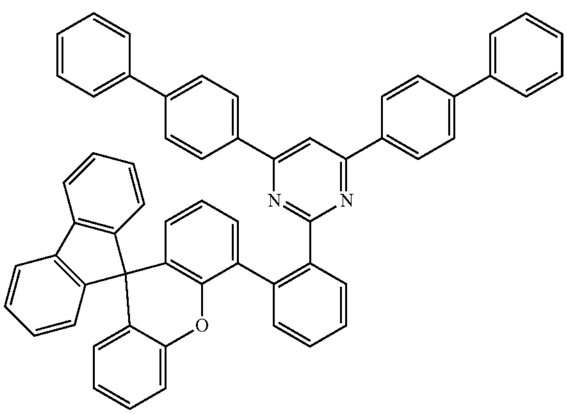
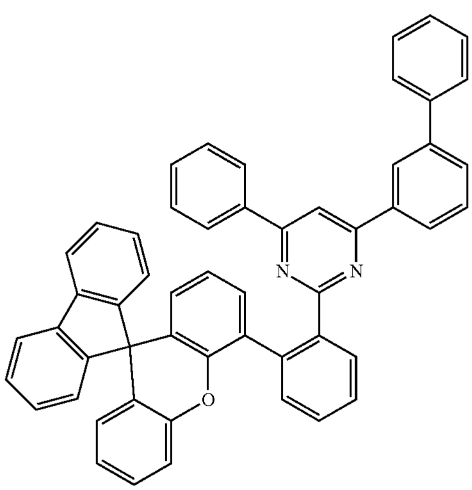
-continued
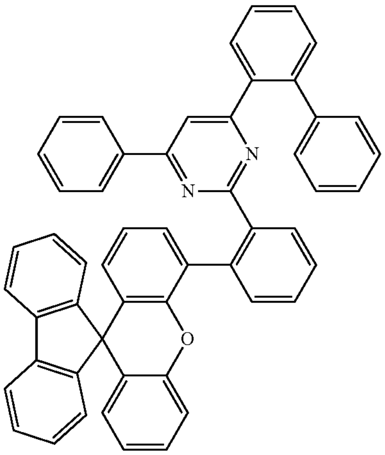
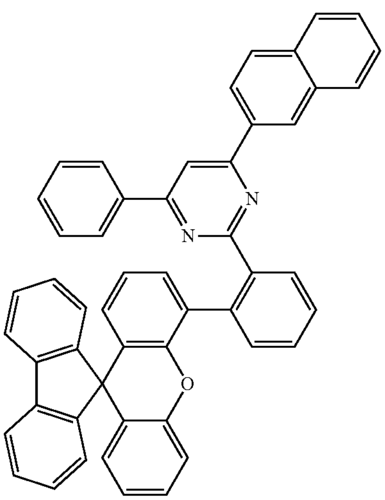
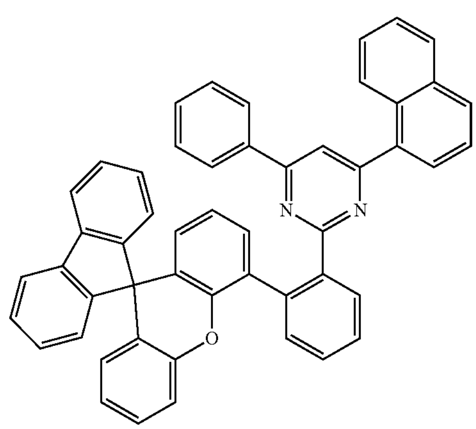

-continued
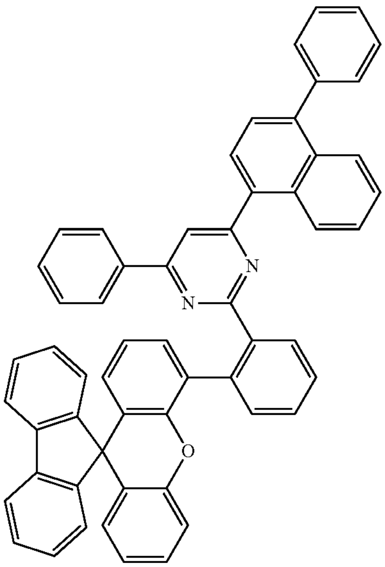
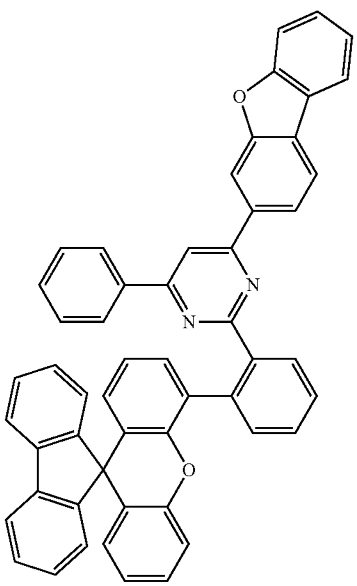
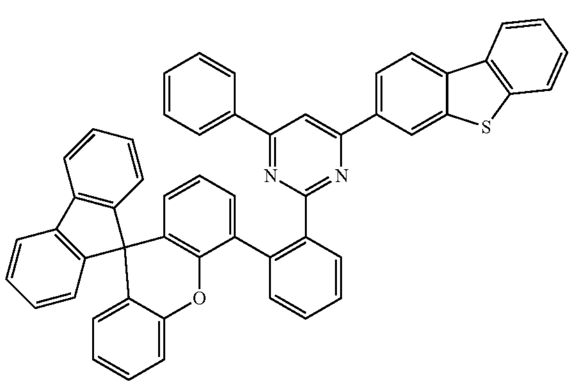
-continued
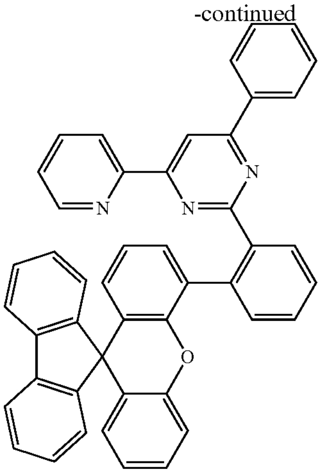
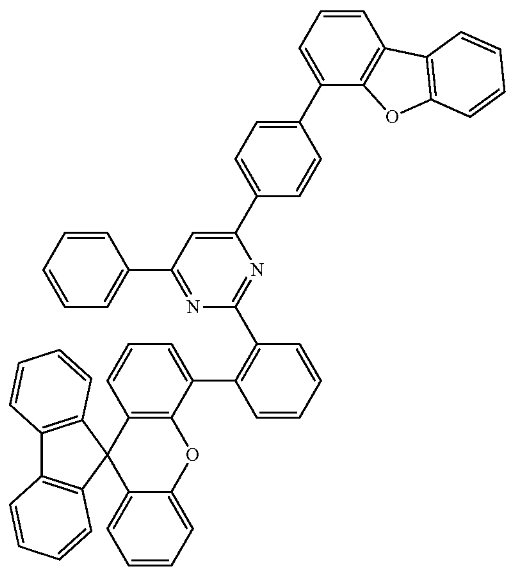
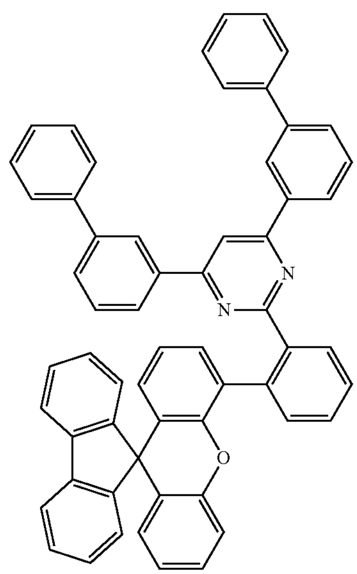

-continued
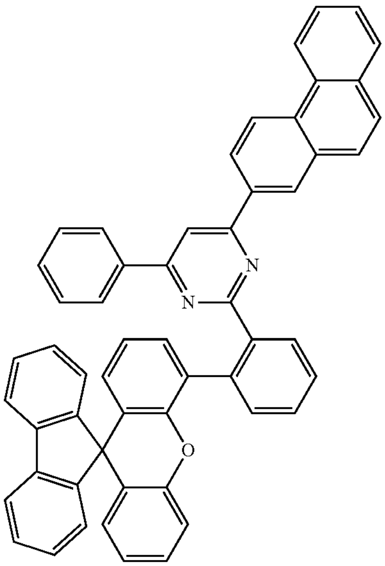
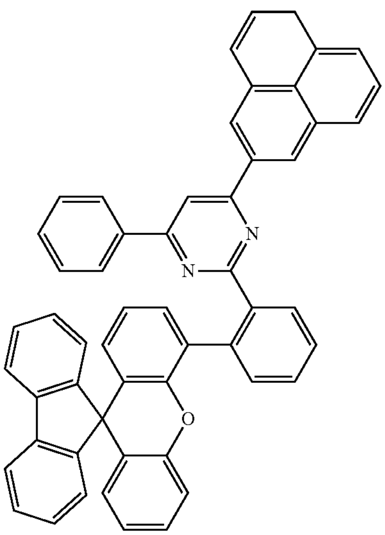
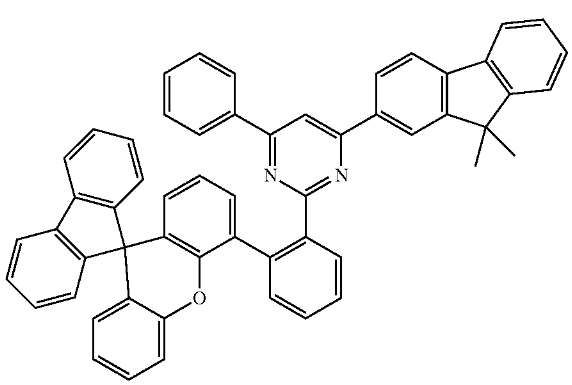
-continued
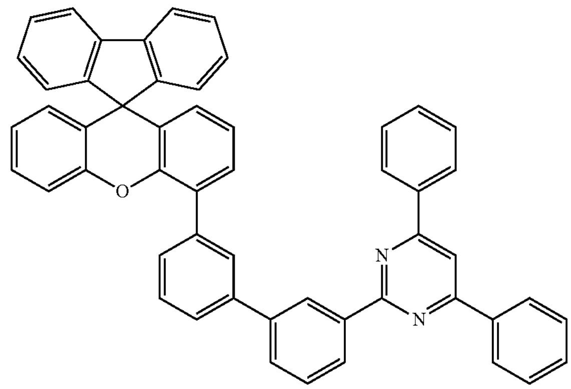
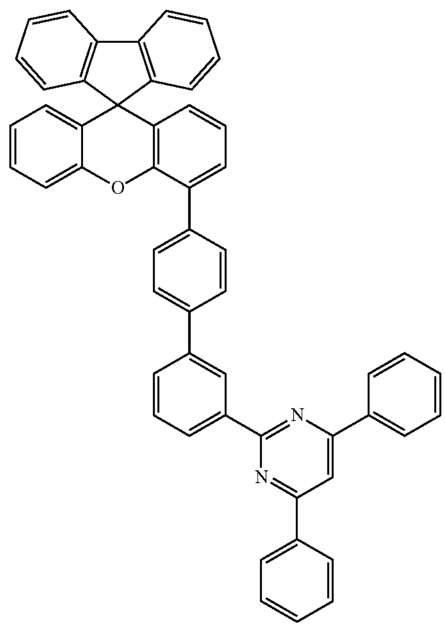
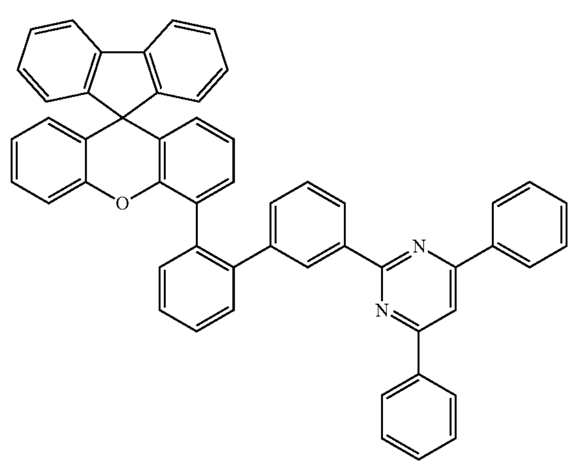

-continued
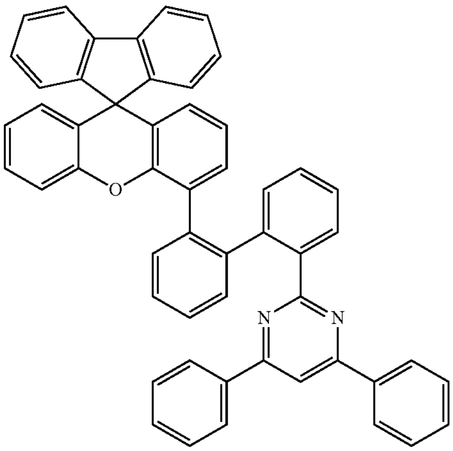
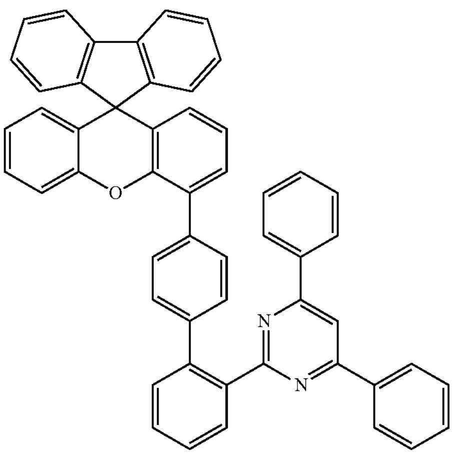
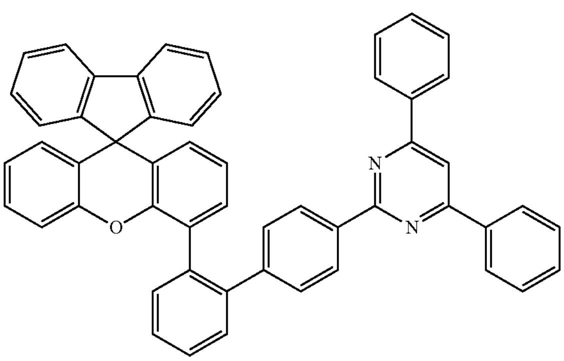
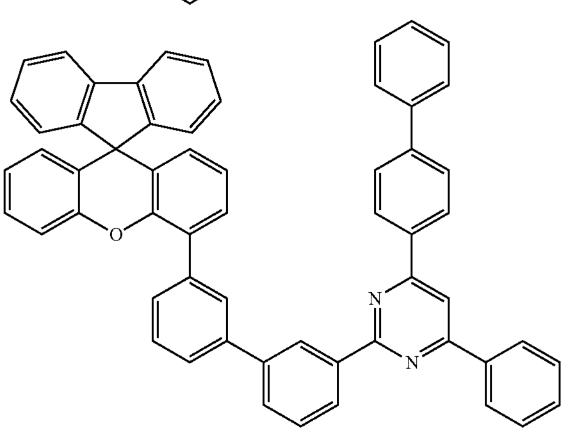
-continued
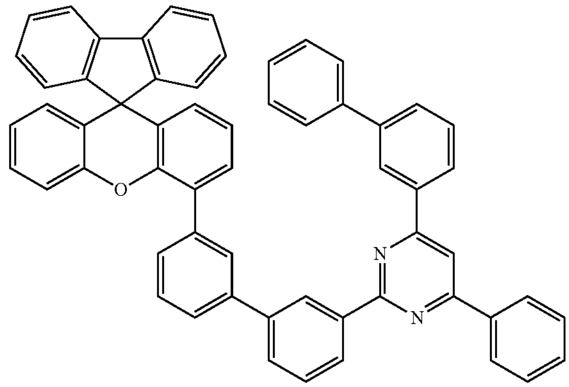
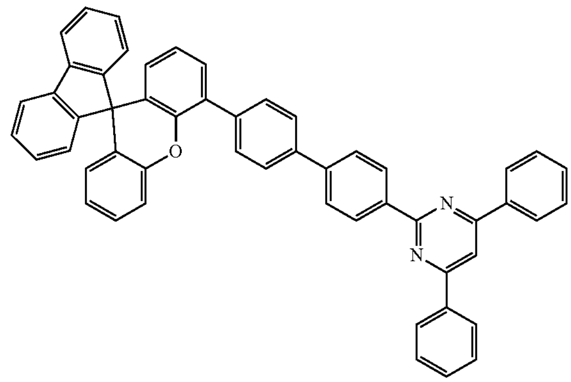
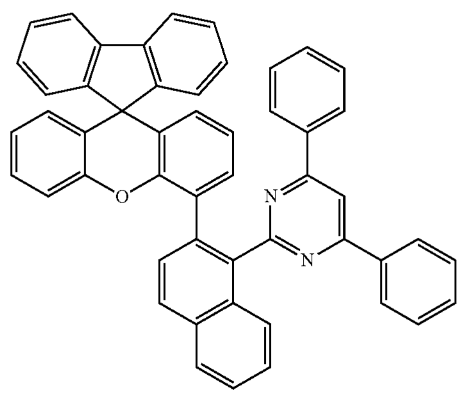
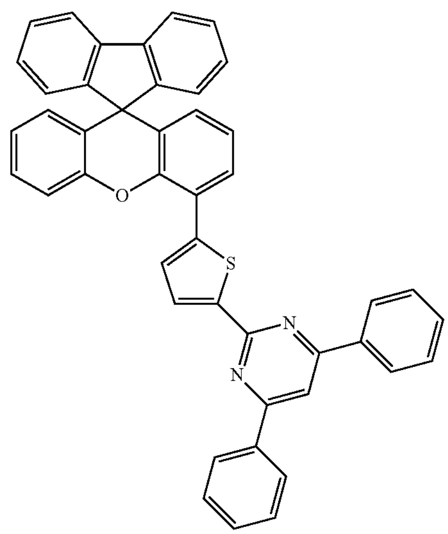

-continued
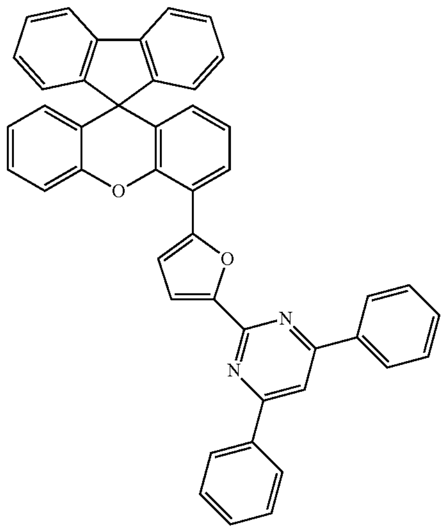
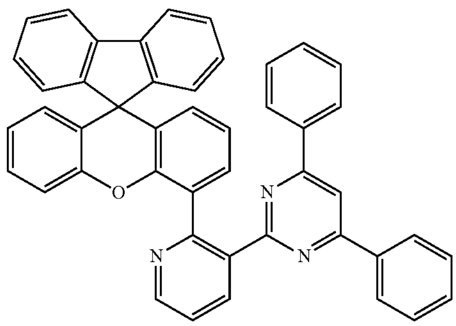
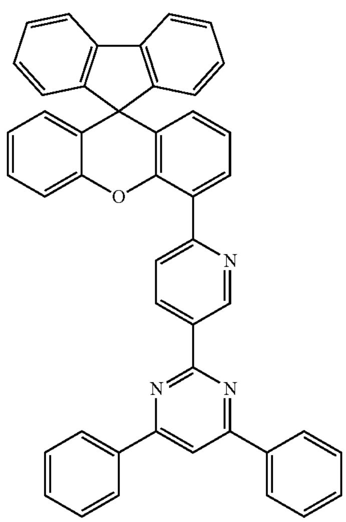
-continued
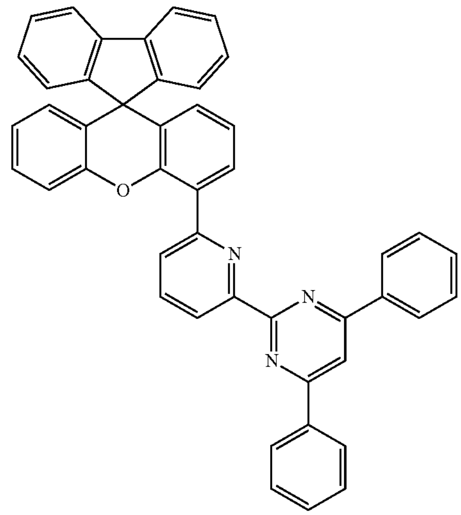
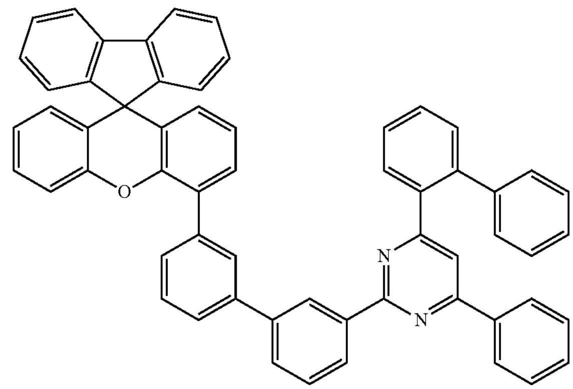
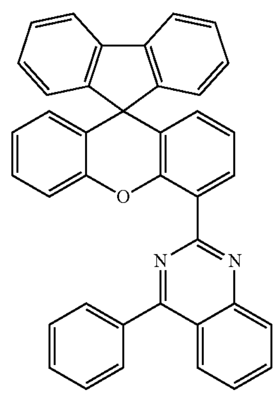
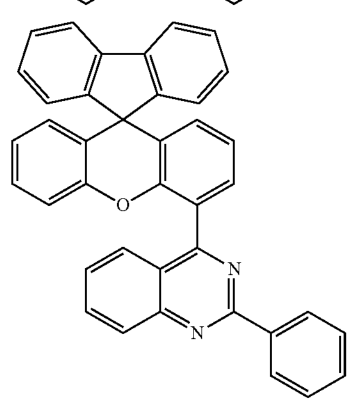

-continued
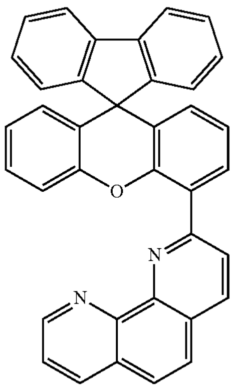
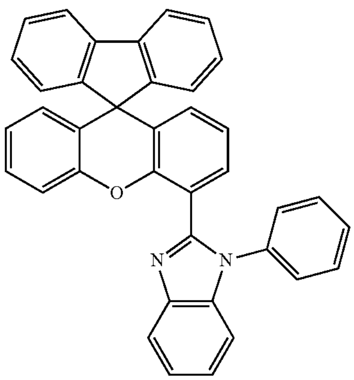
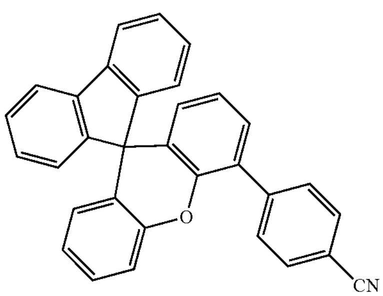
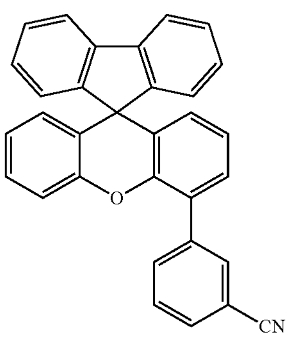
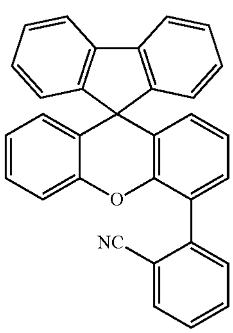
-continued
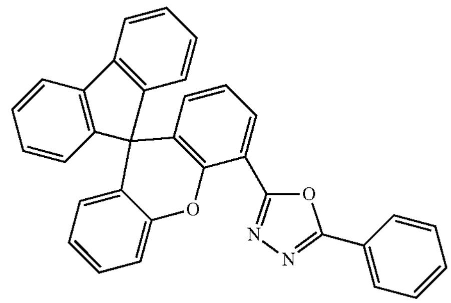
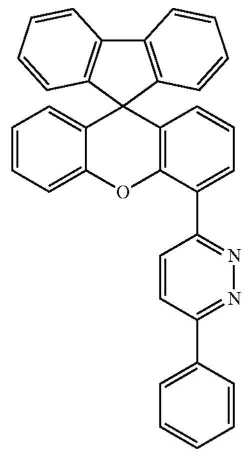
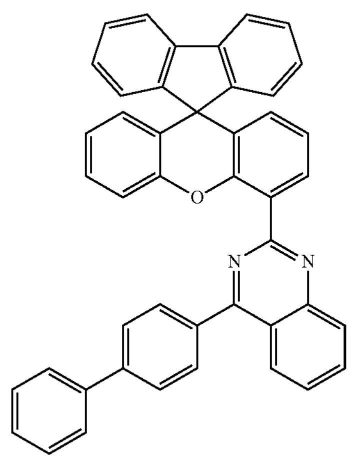
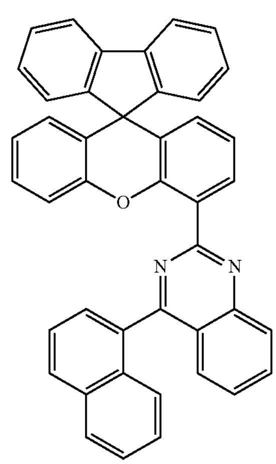
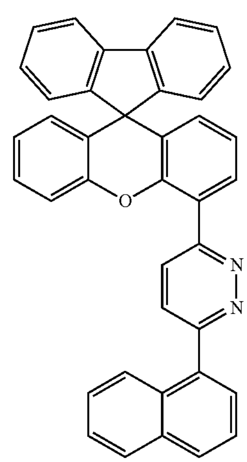

-continued
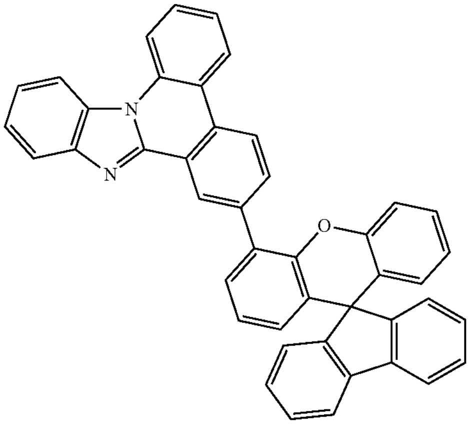
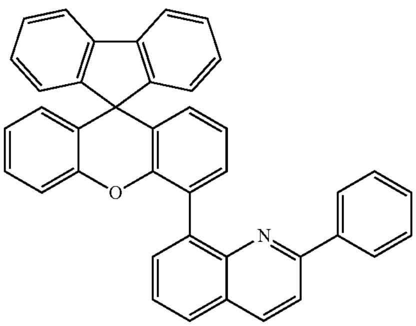
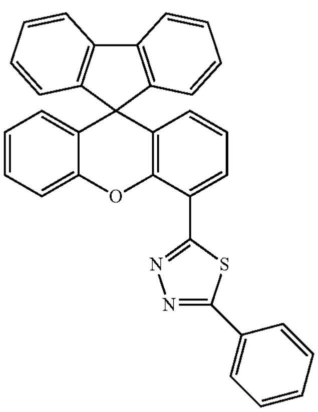
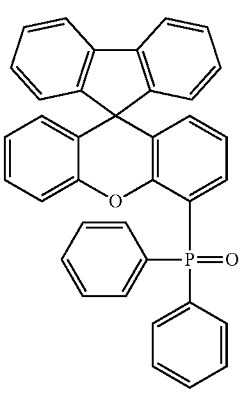
-continued
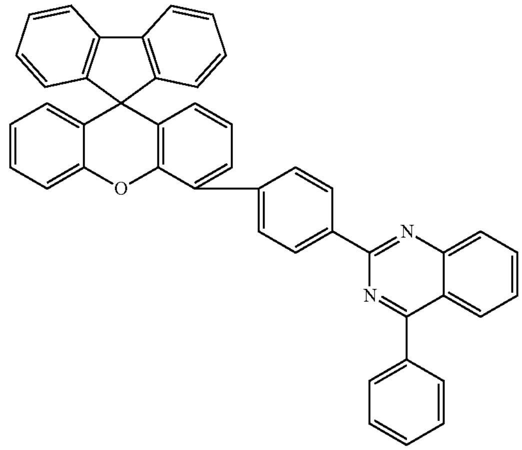
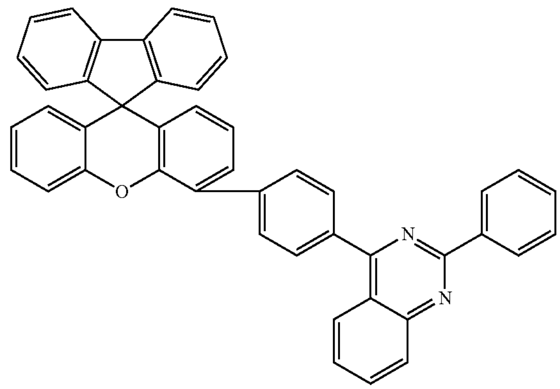
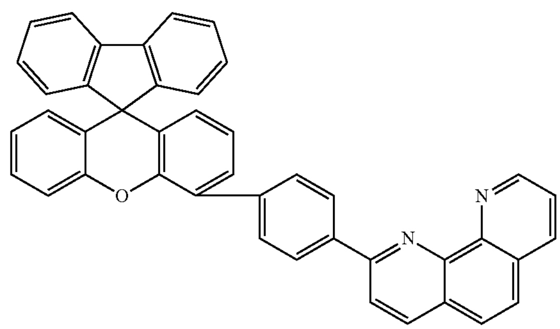
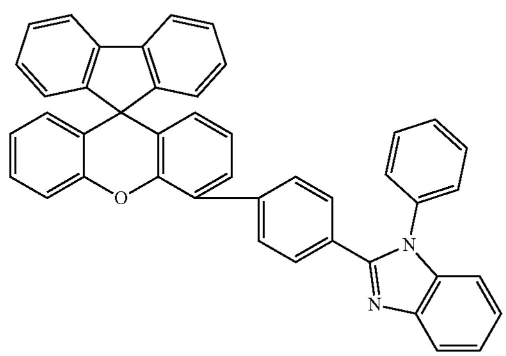

-continued
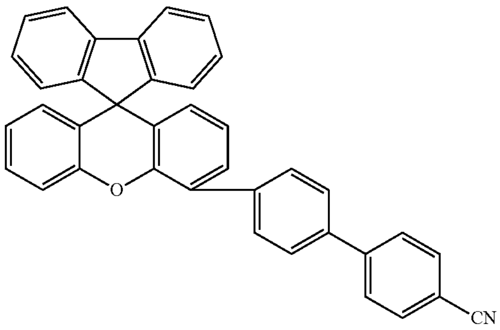
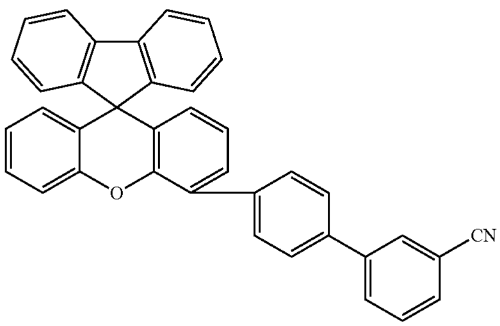
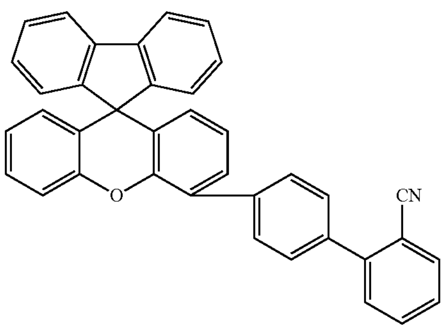
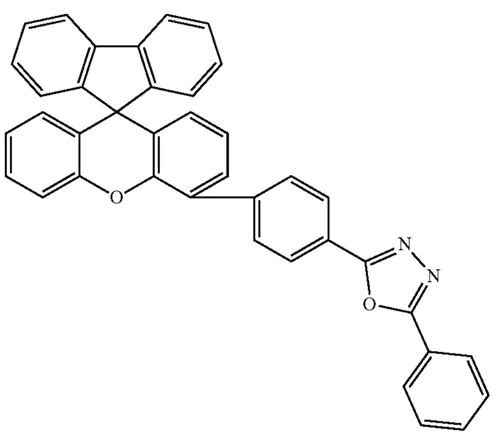
-continued
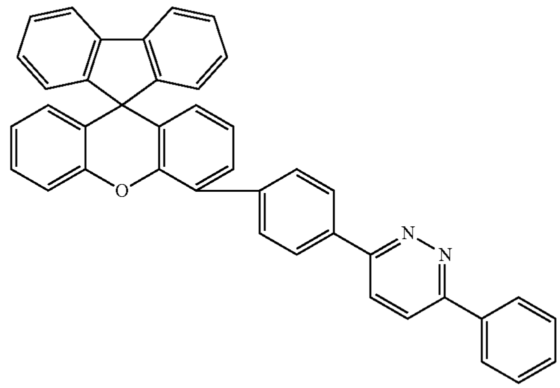
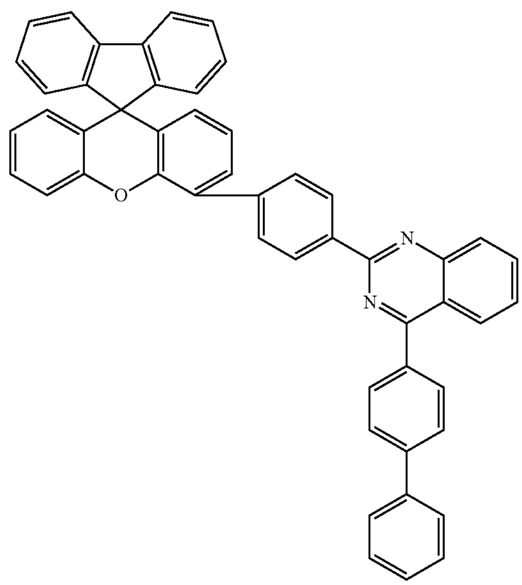
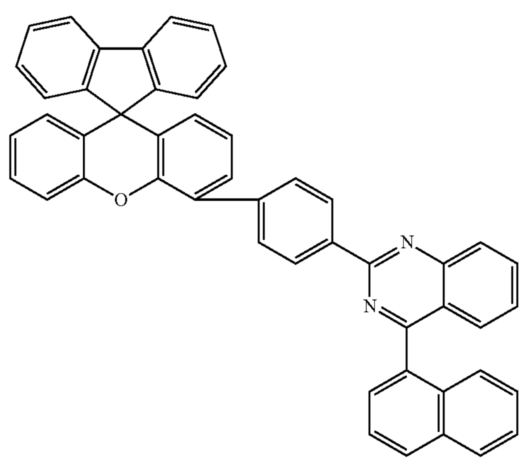

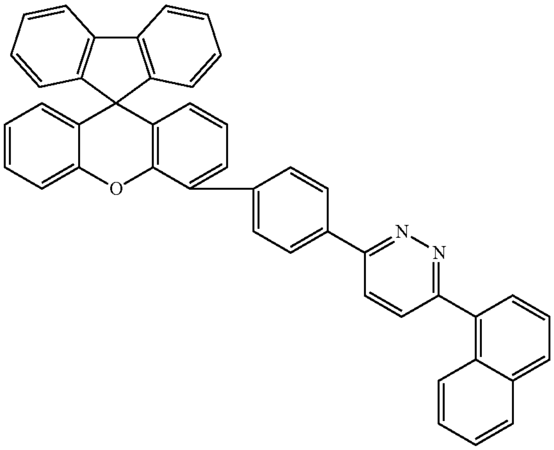
O
N
N
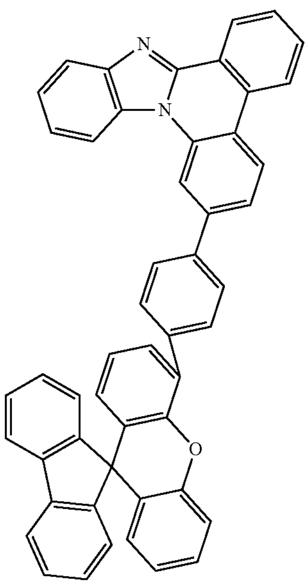
N
N
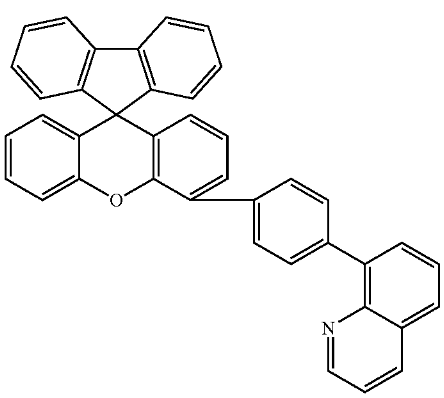
O
N
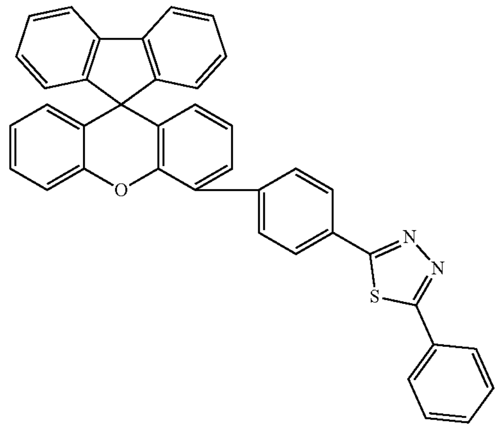
O
N
N
S
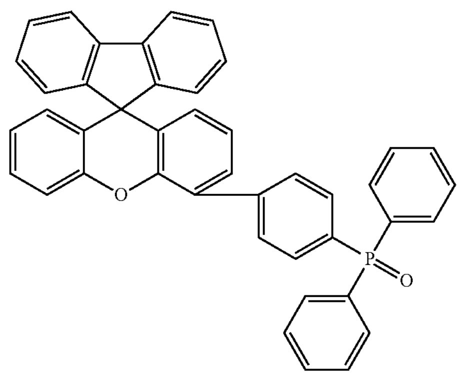
O
P
O
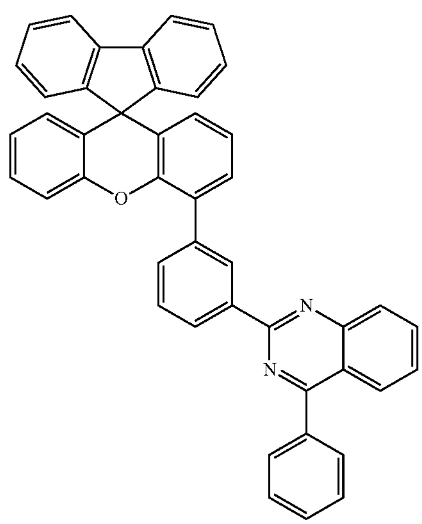
O
N
N

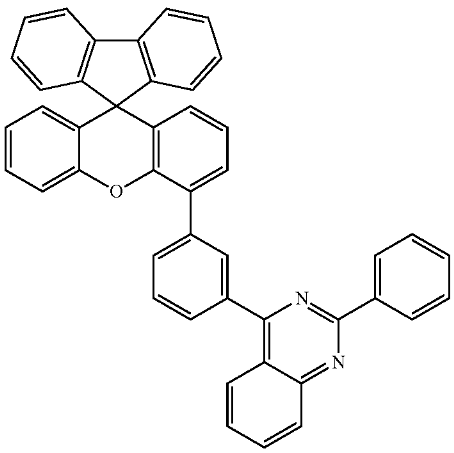
O
N
N
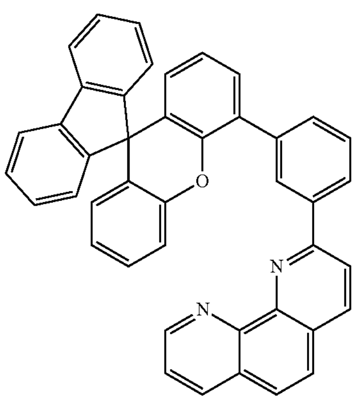
O
N
N
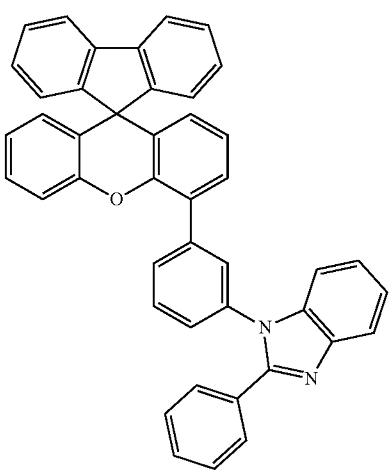
O
N
N
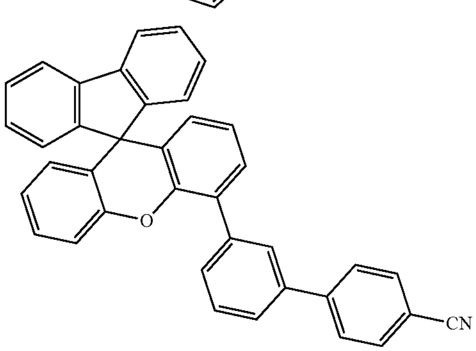
O
CN
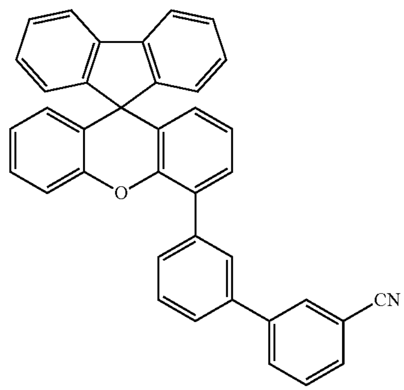
O
CN
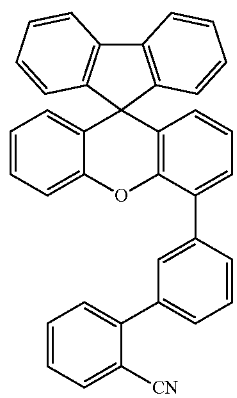
O
CN
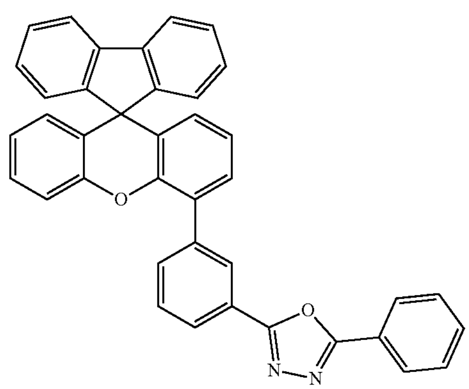
O
O
N
N
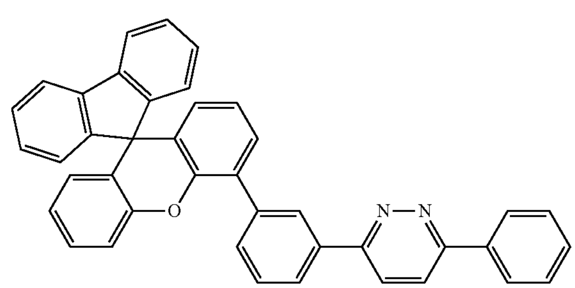
O
N
N -continued
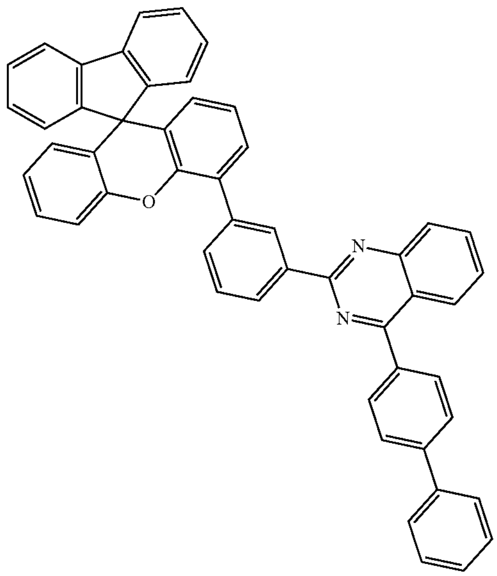
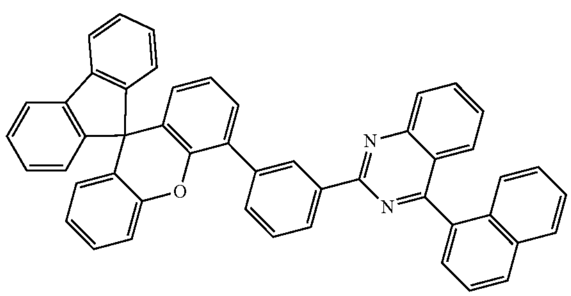
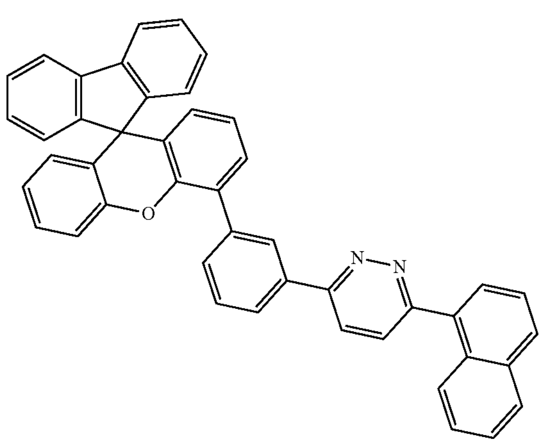
-continued
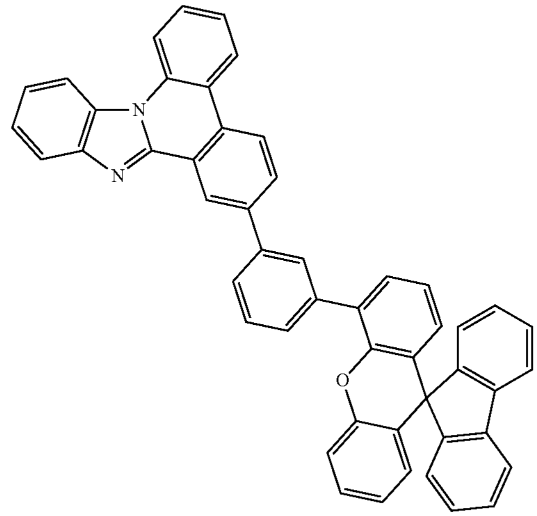
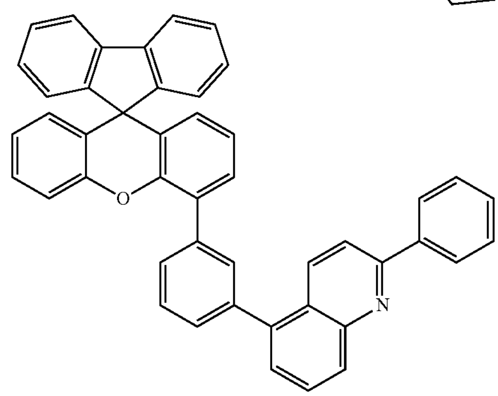
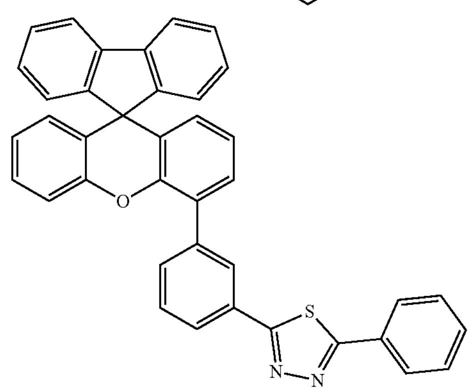
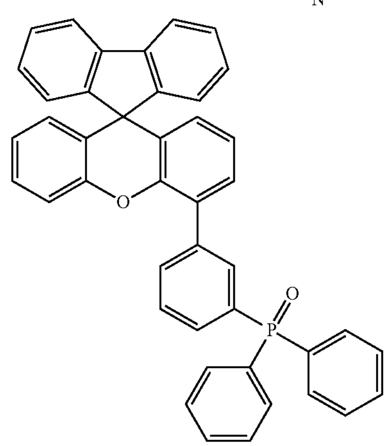

-continued
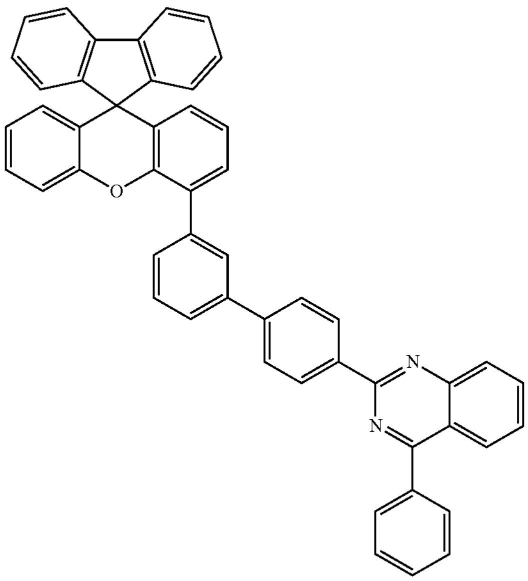
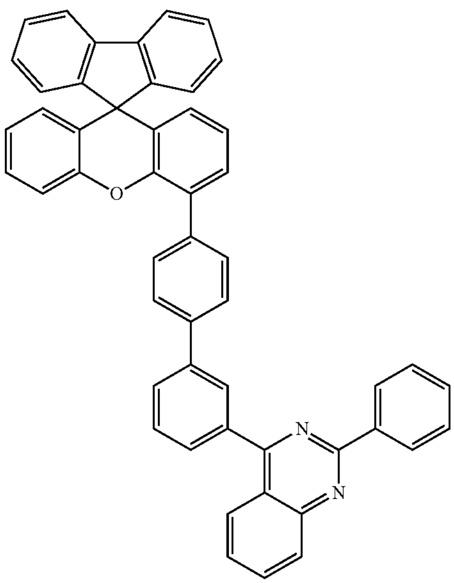
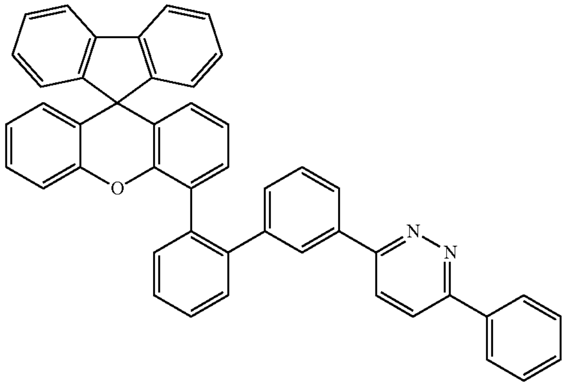
-continued
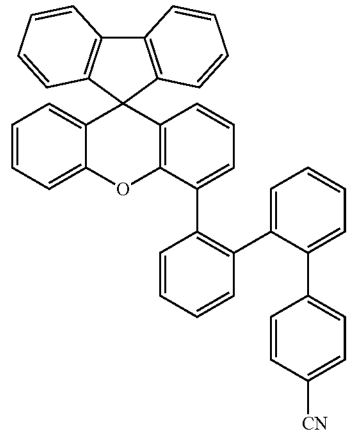
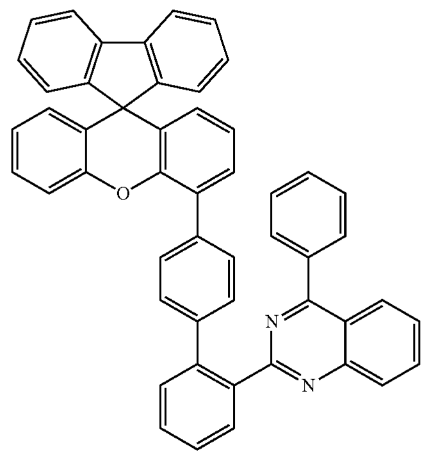
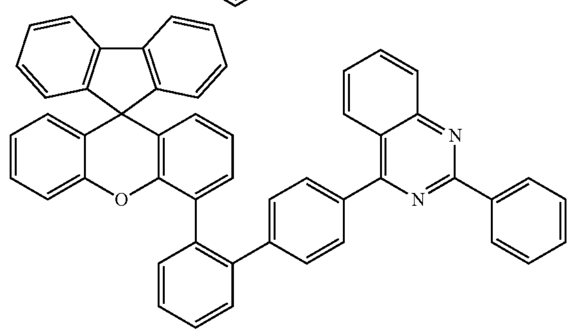
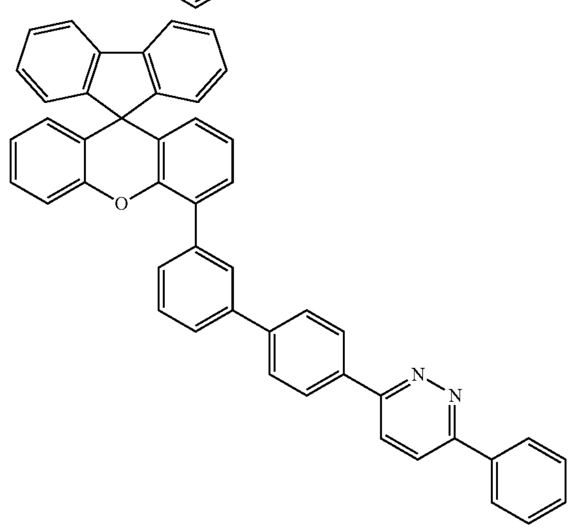

-continued
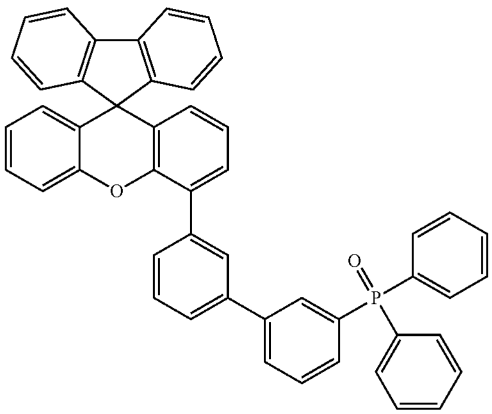
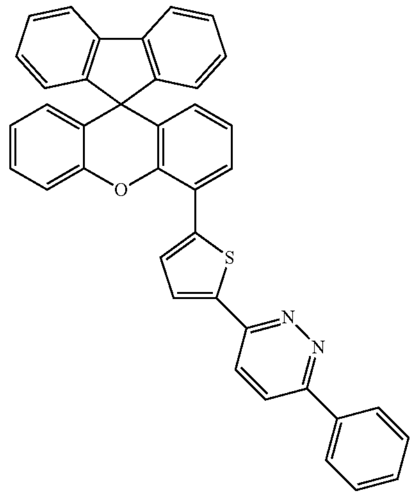
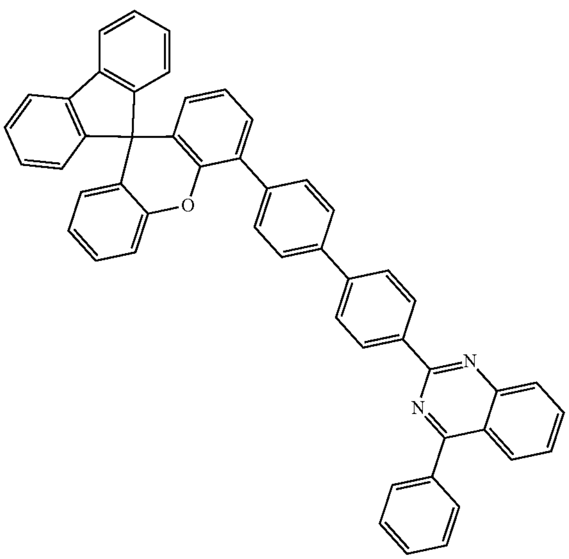
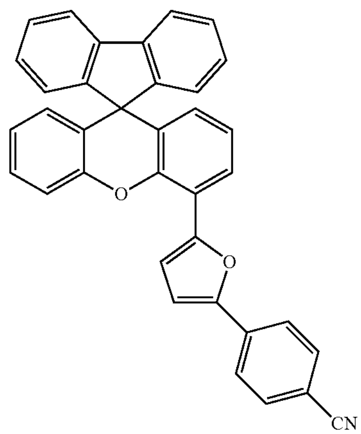
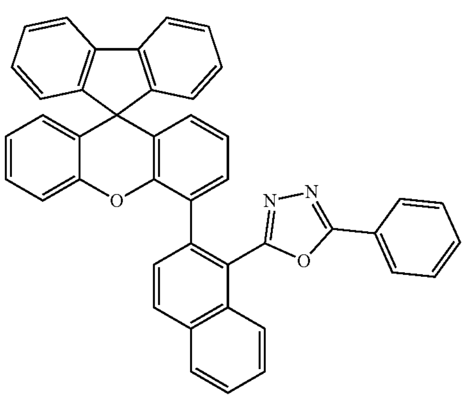
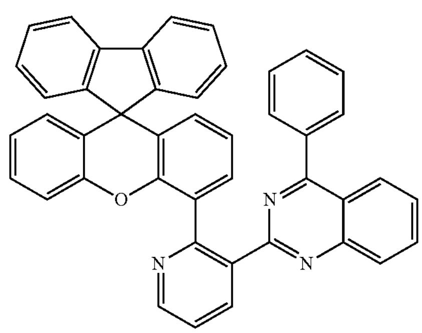
-continued -continued
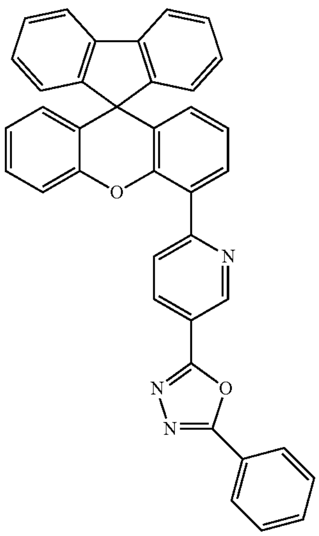
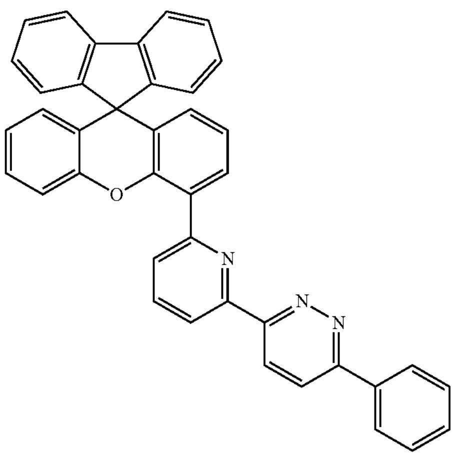
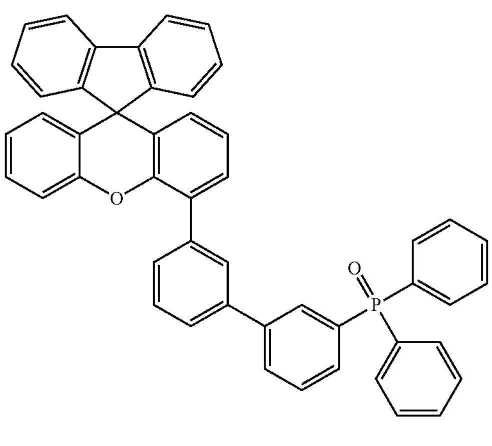
-continued
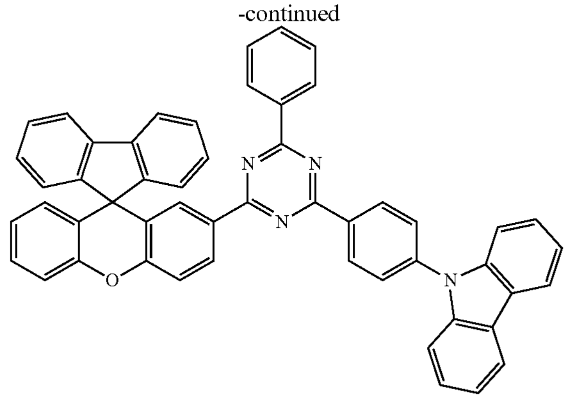
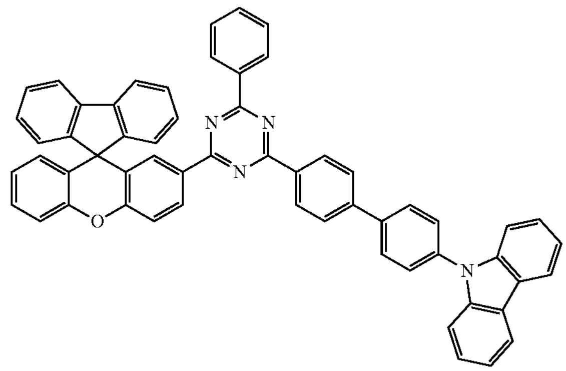
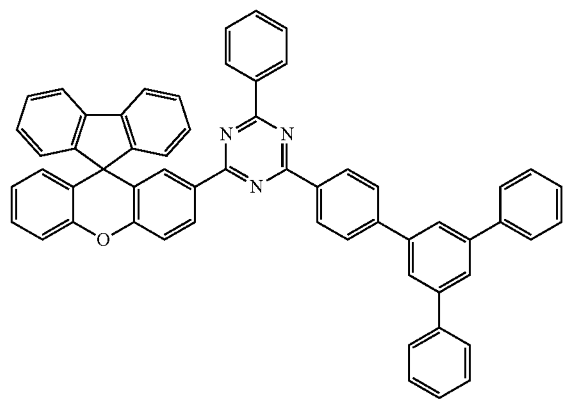
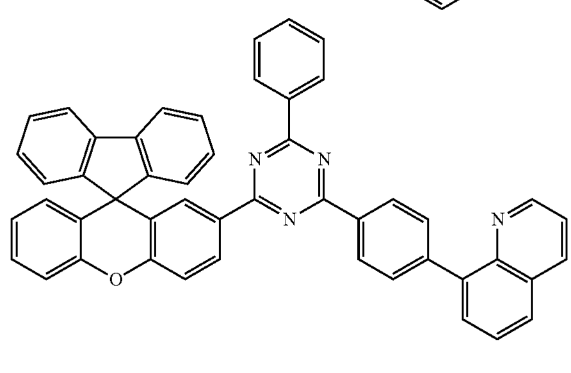

-continued
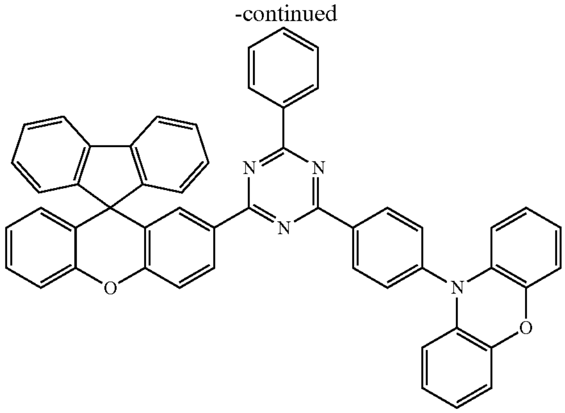
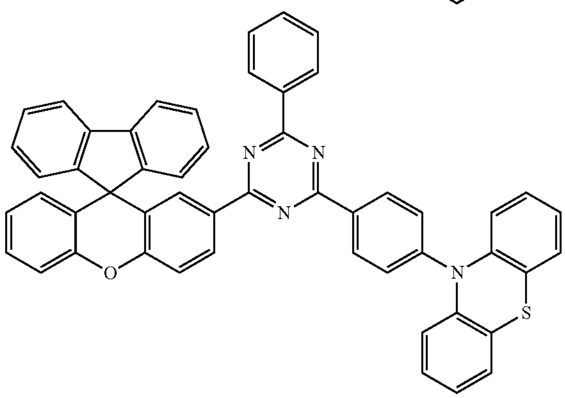
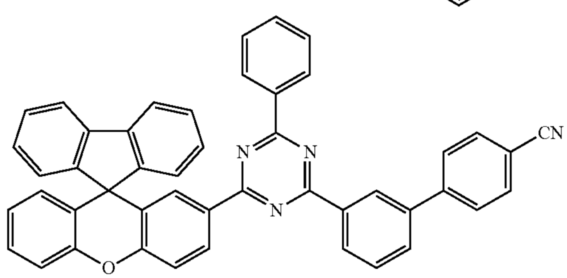
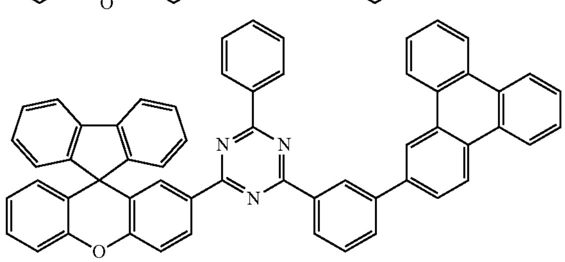
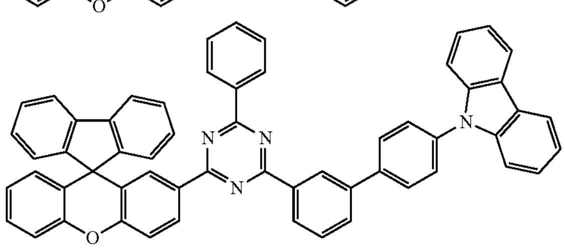
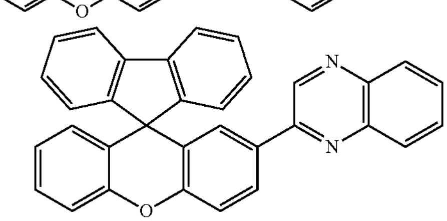
-continued
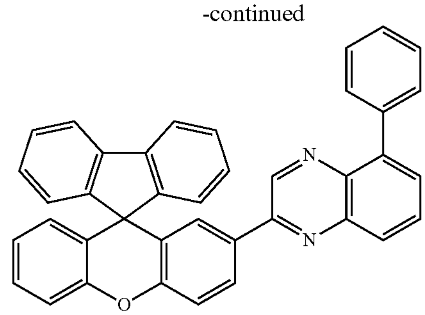
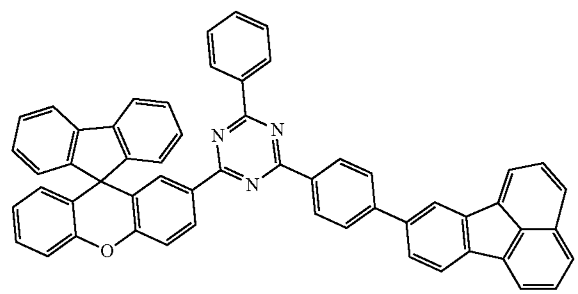
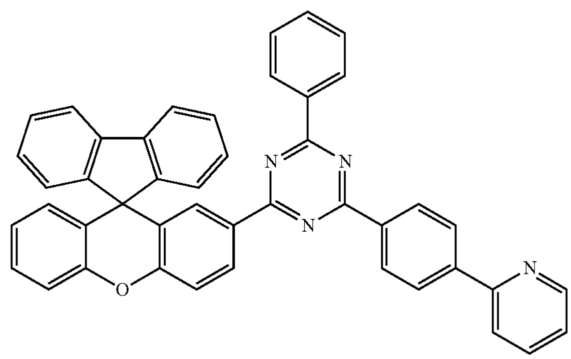
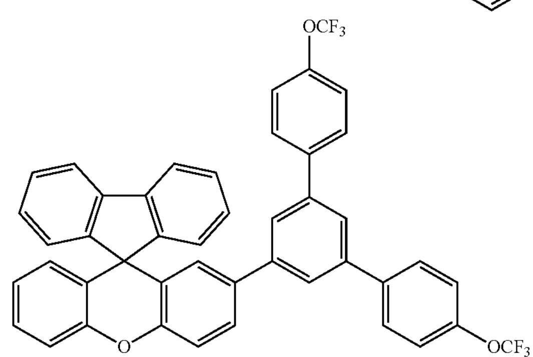
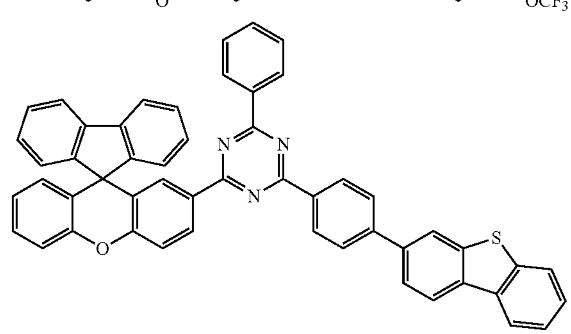

-continued
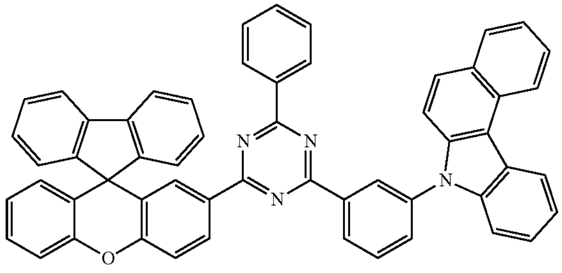
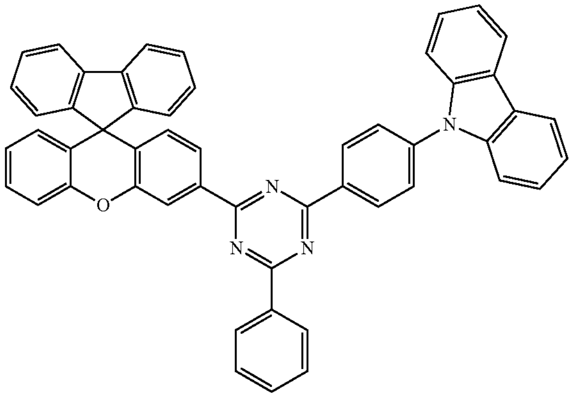
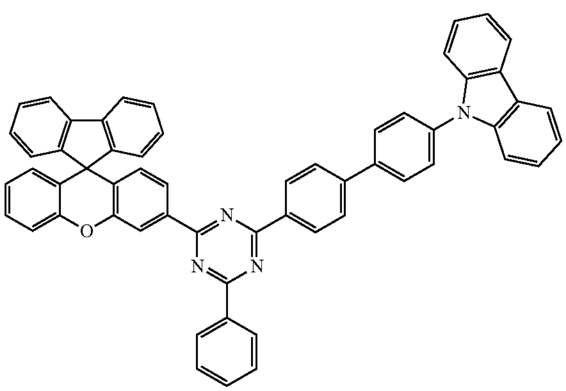
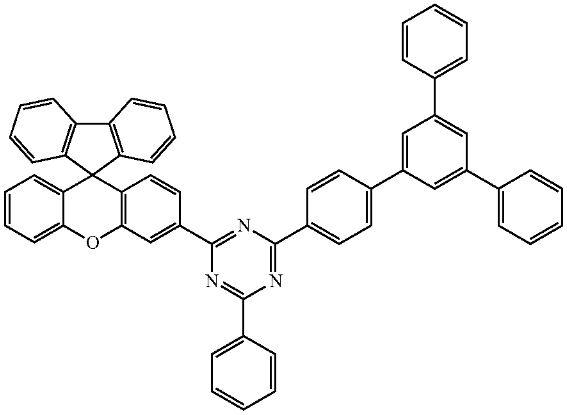
-continued
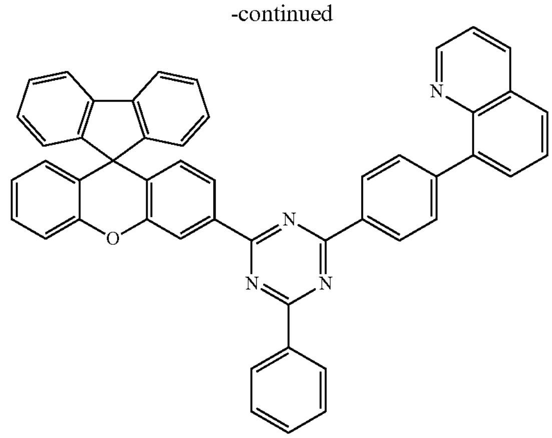
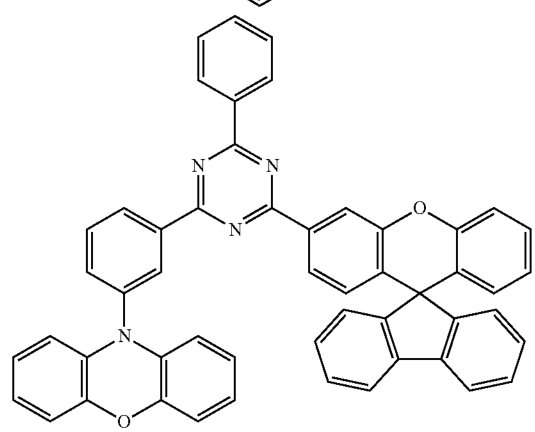
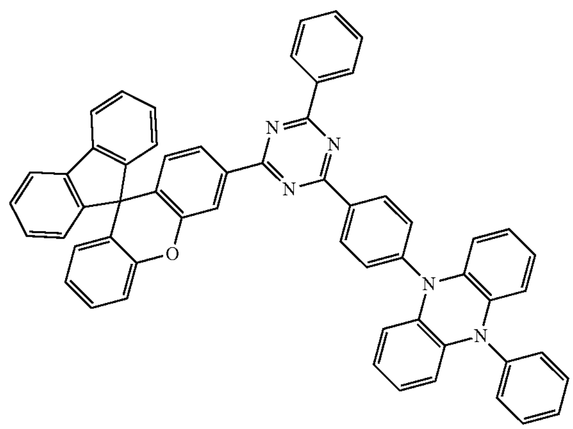
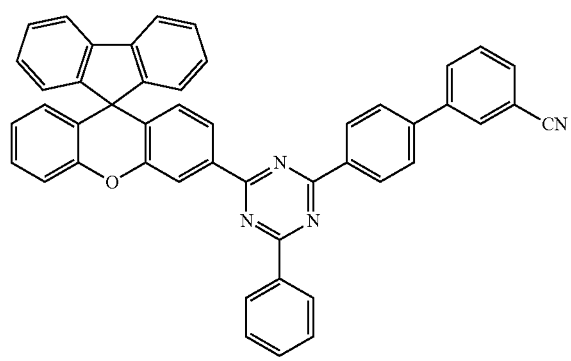

-continued
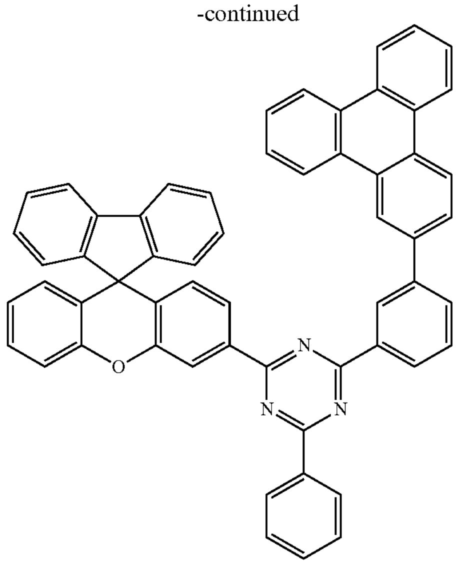
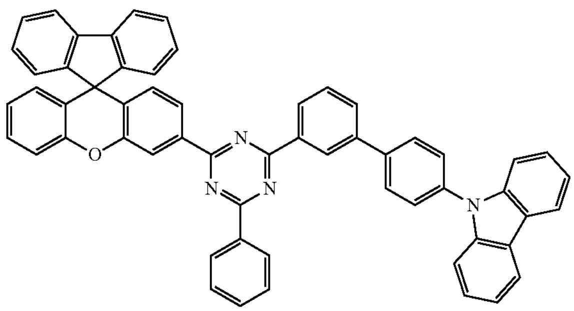
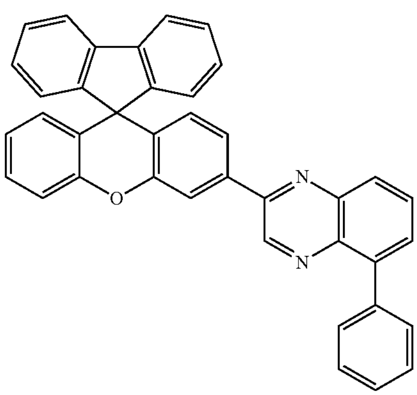
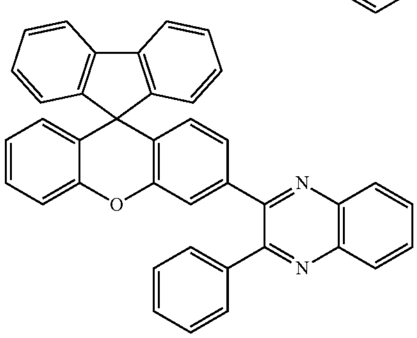
-continued
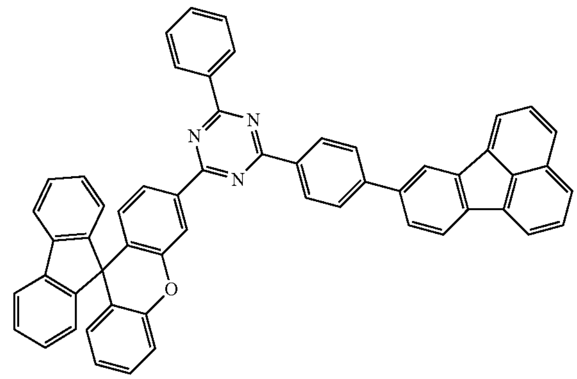
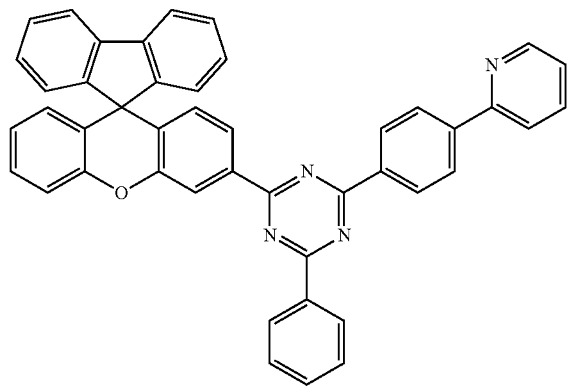
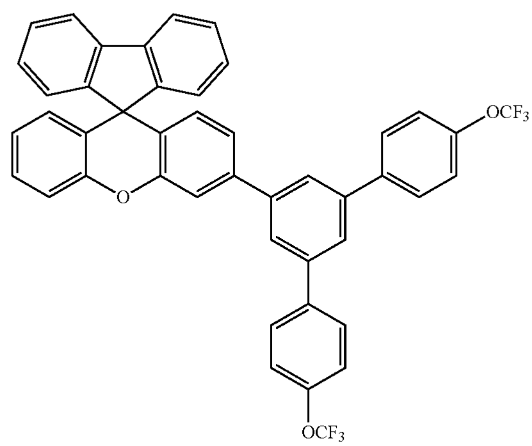
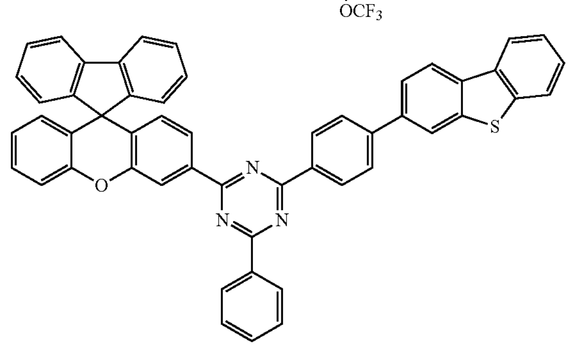

-continued
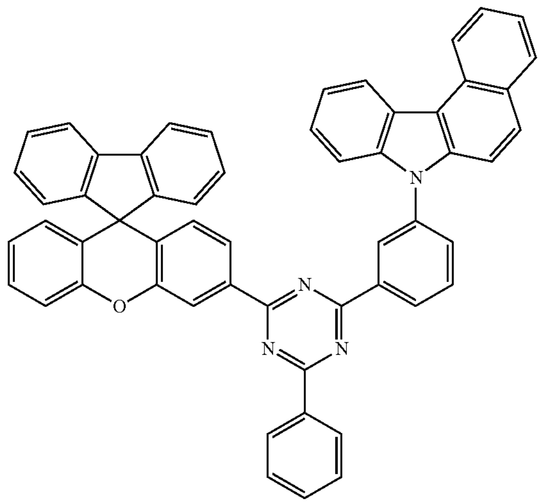
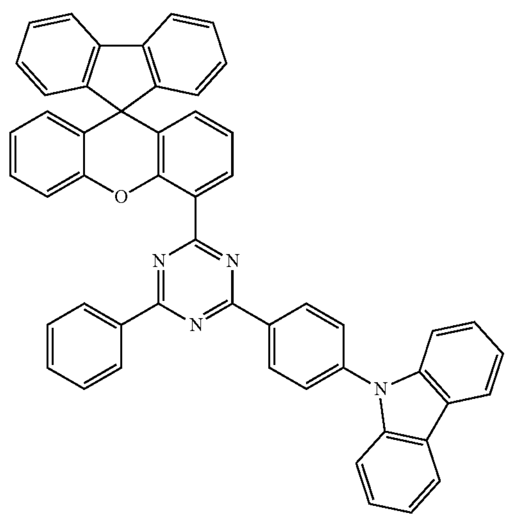
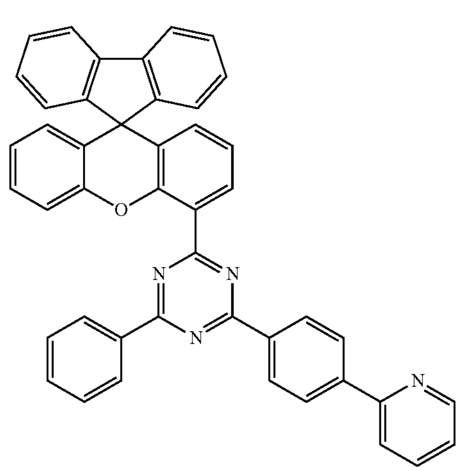
-continued
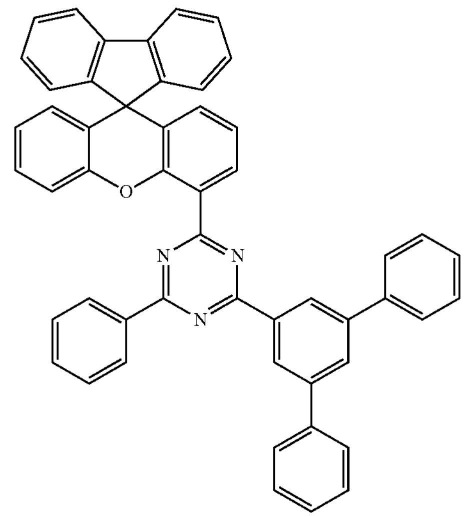
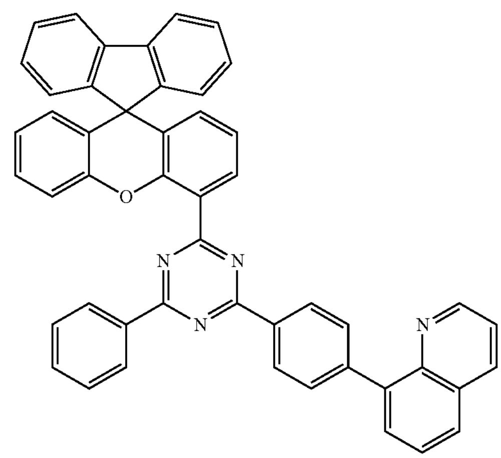
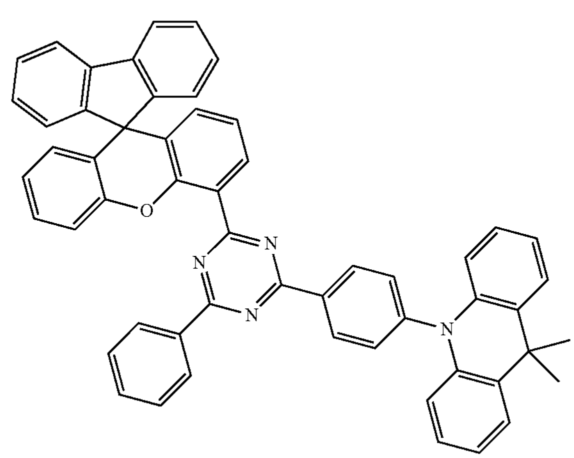

-continued
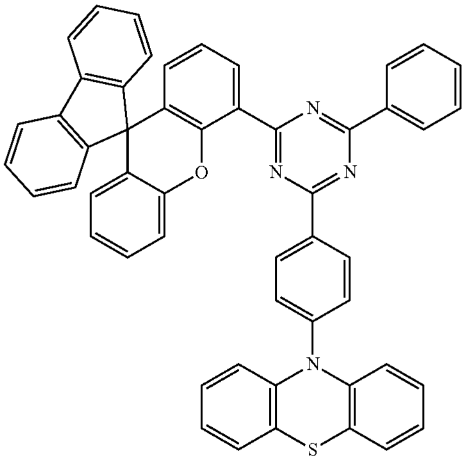
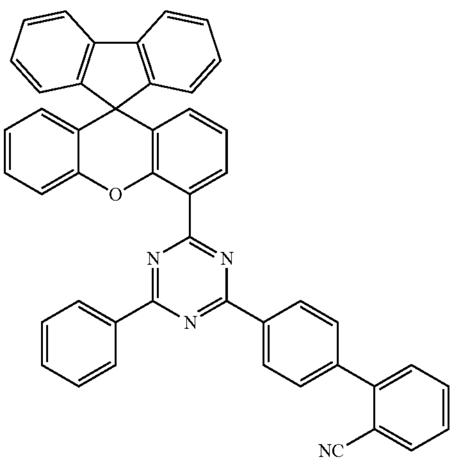
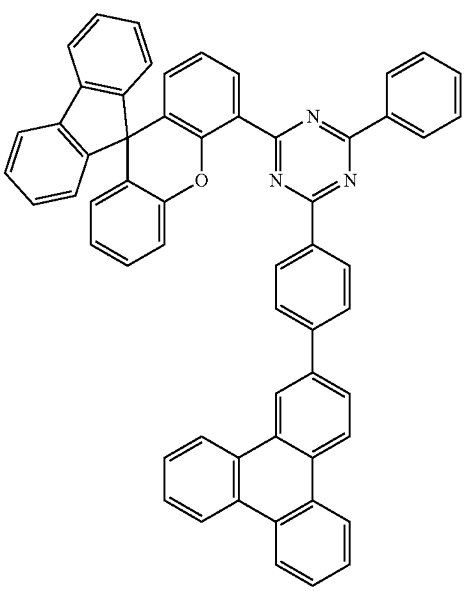
-continued
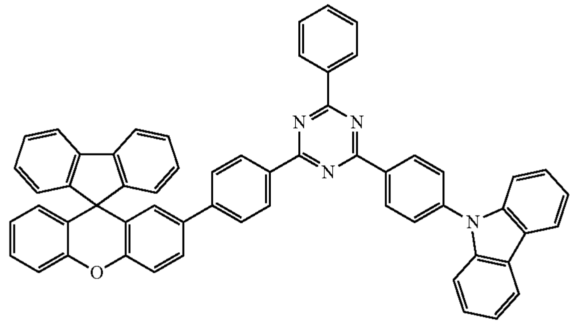
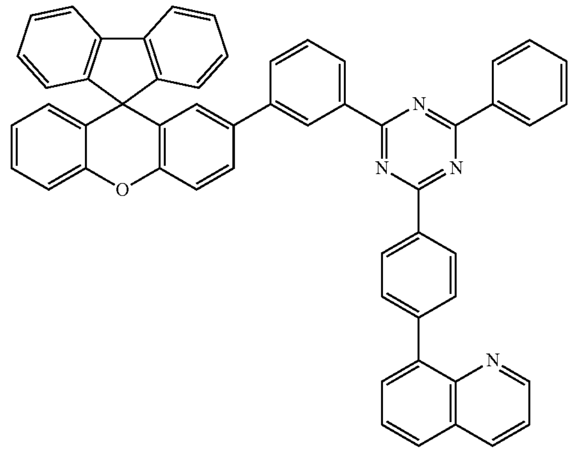
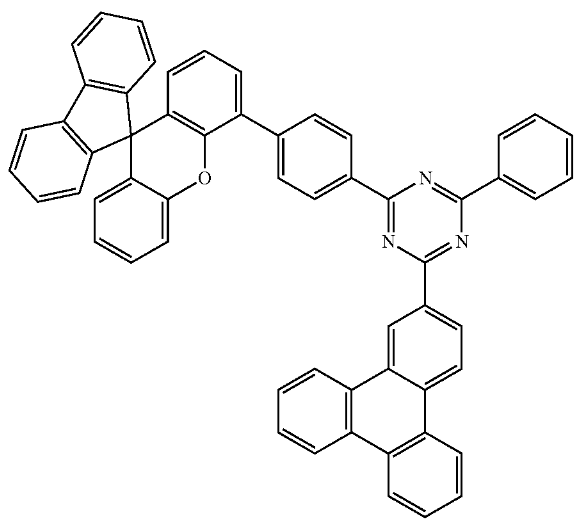
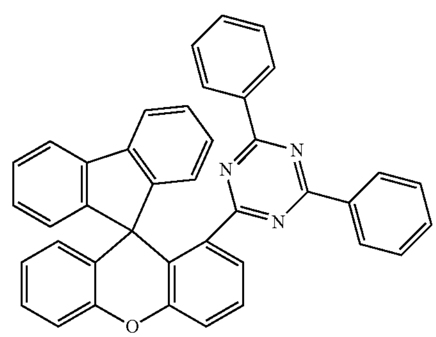

-continued
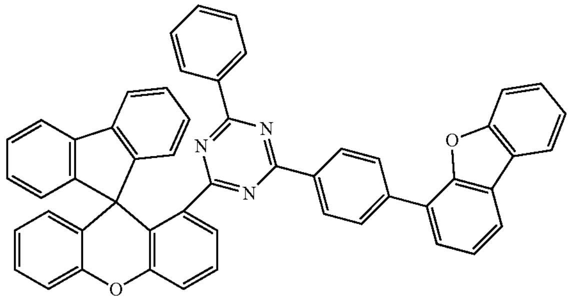
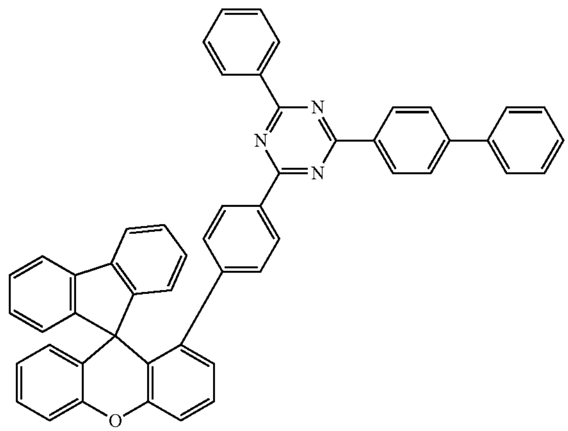
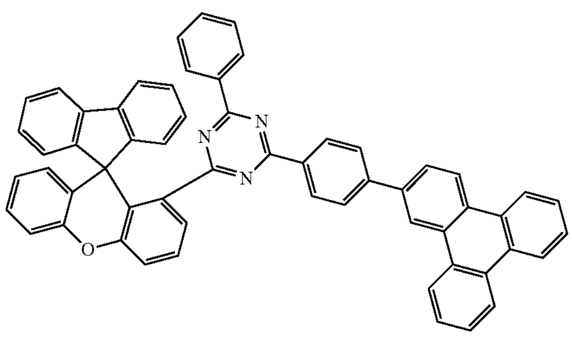
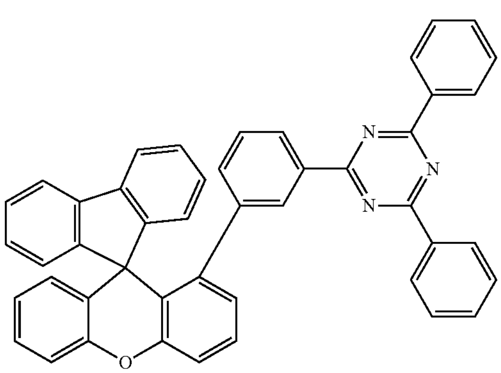
-continued
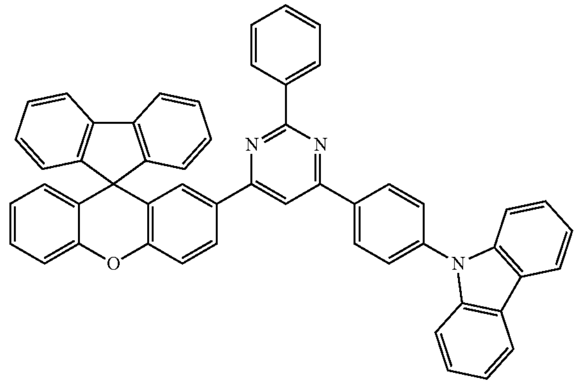
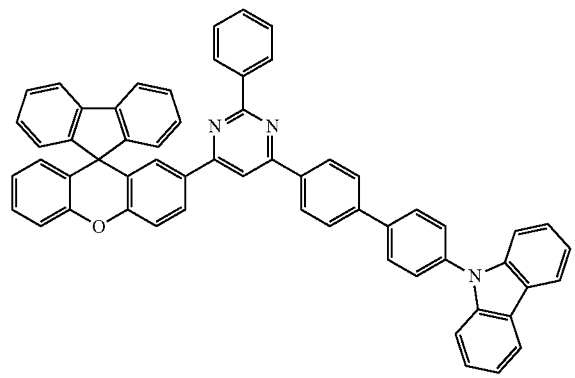
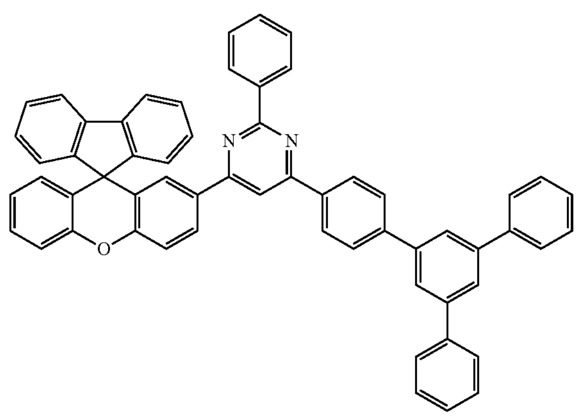
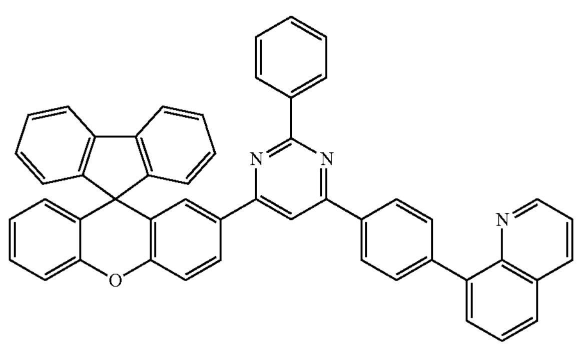

-continued
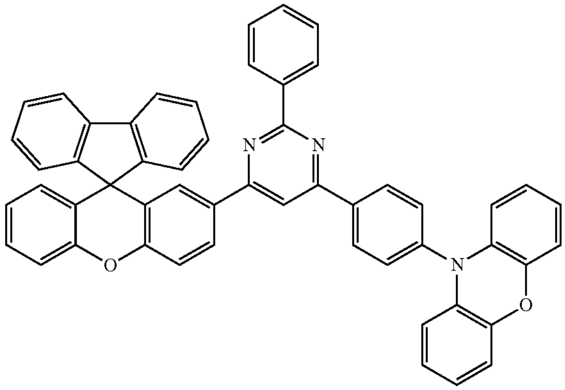
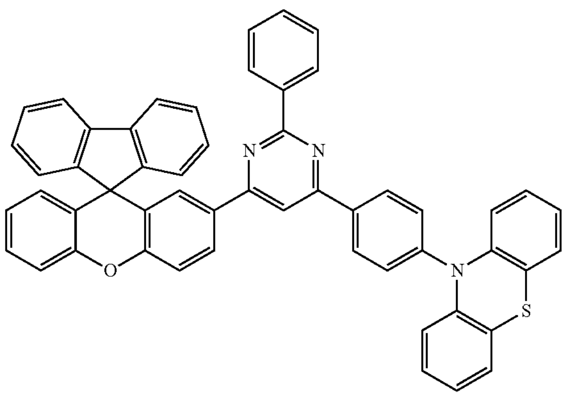
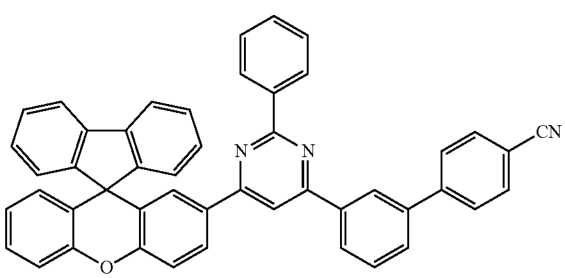
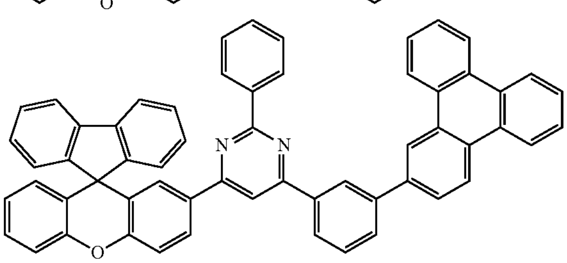
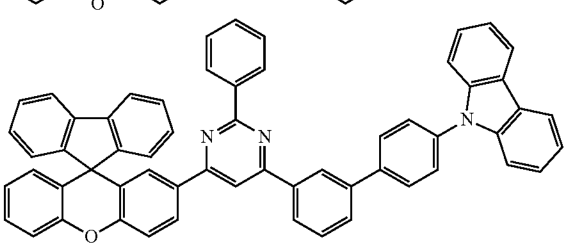
-continued
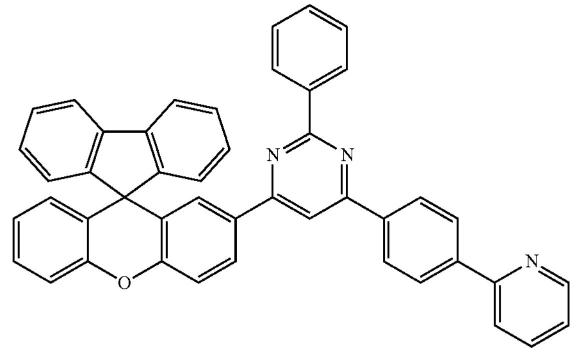
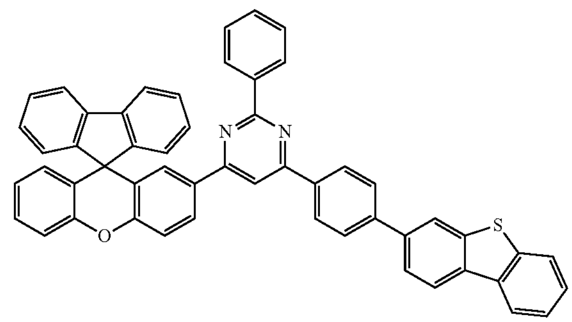
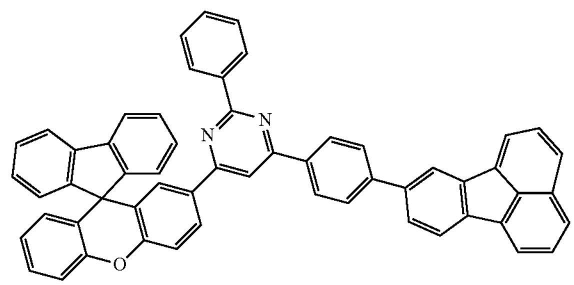
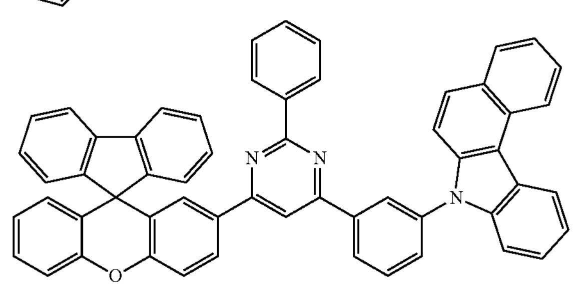
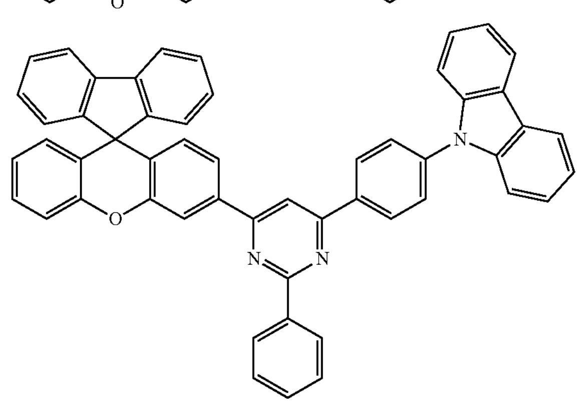

-continued
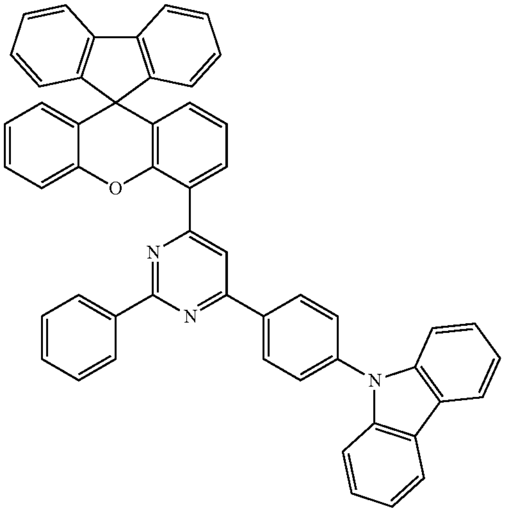
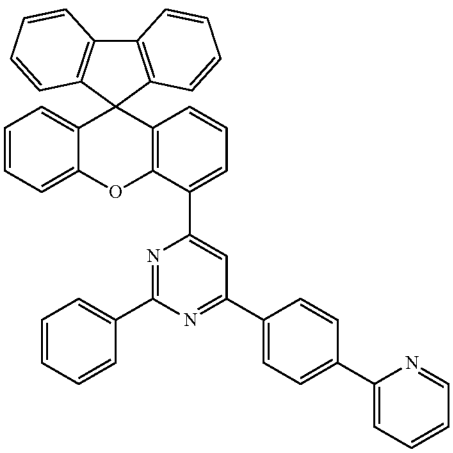
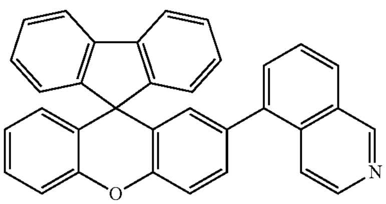
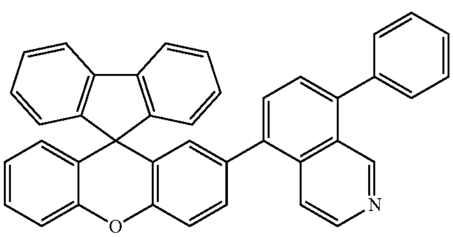
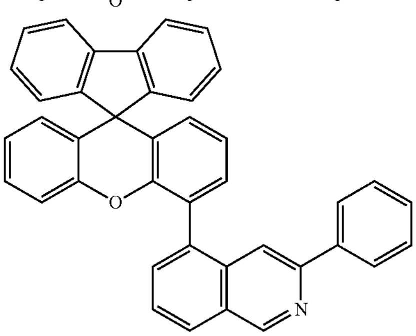
-continued
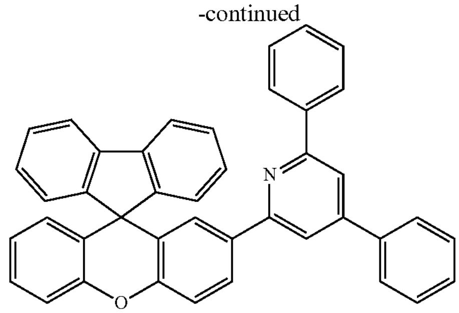
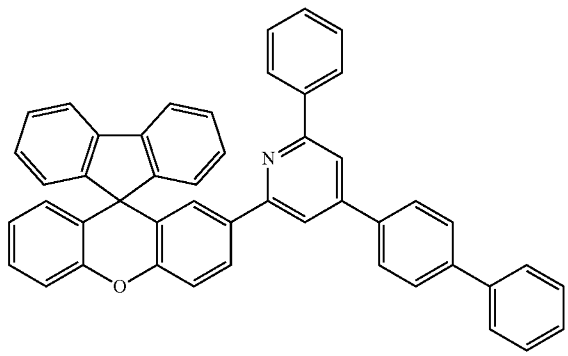
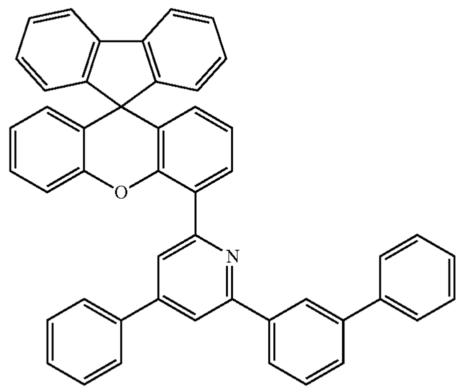
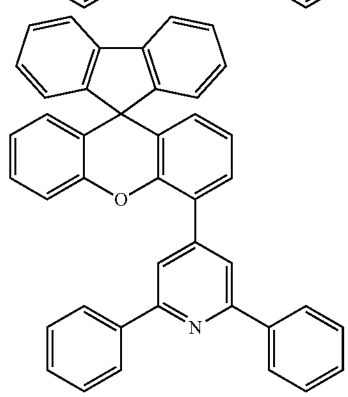
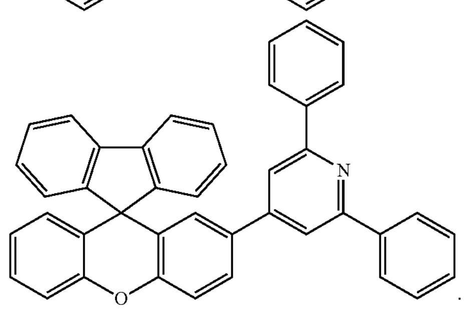

9. The organic light emitting device of claim 1, wherein the compound of Chemical Formula 3 is any one compound selected from among the following compounds:
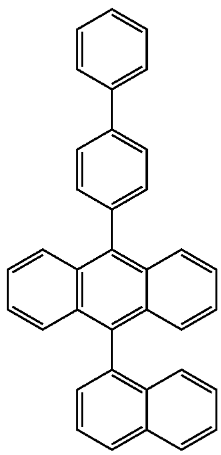
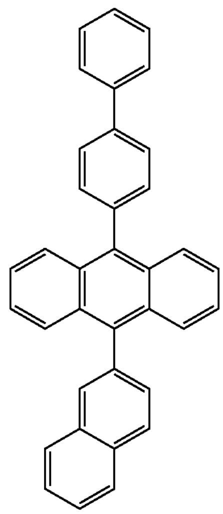
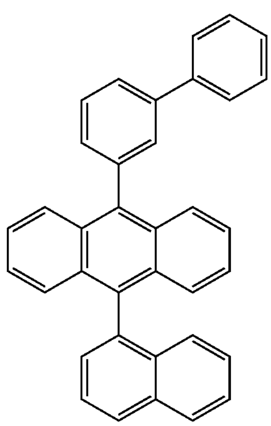
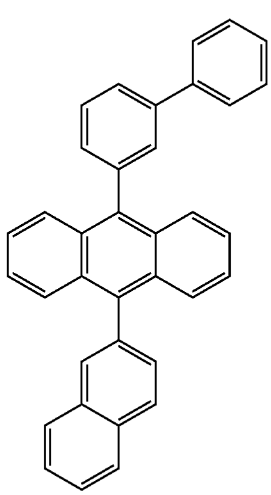
-continued
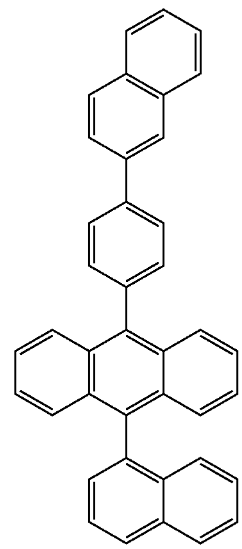
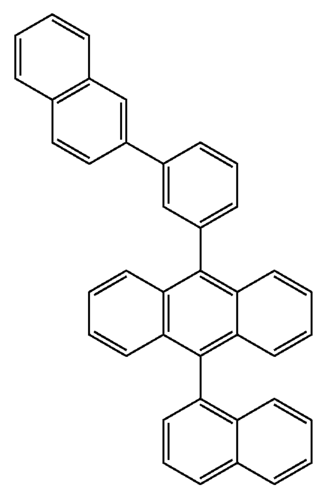
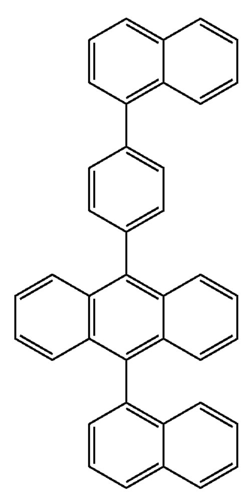

-continued
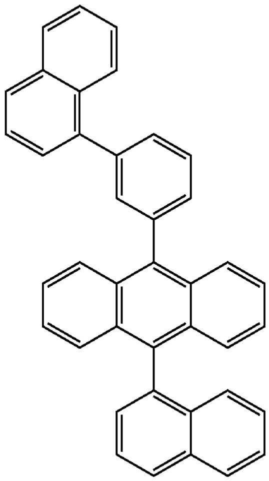
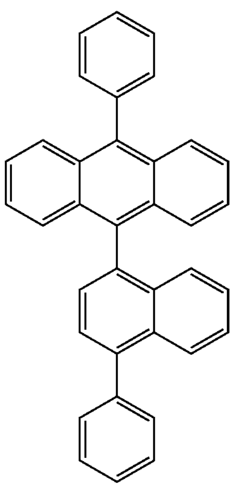
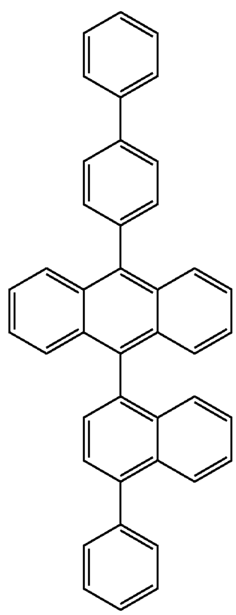
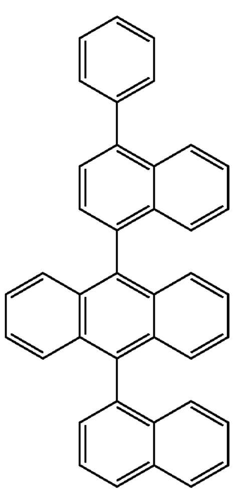
-continued
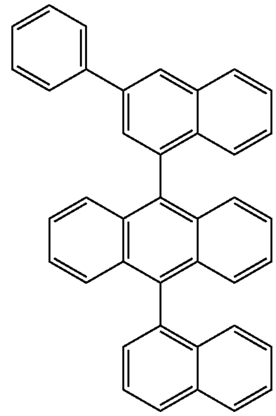
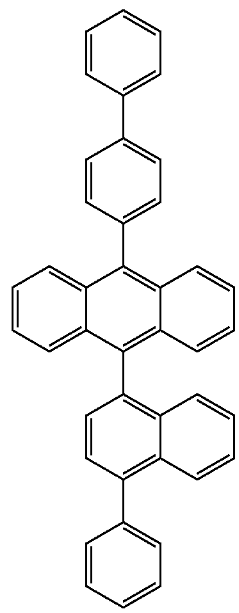
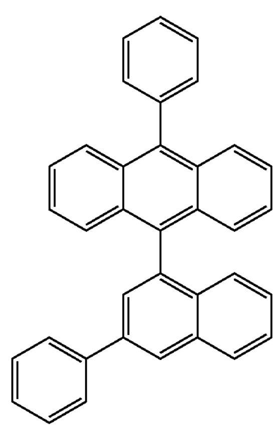

-continued
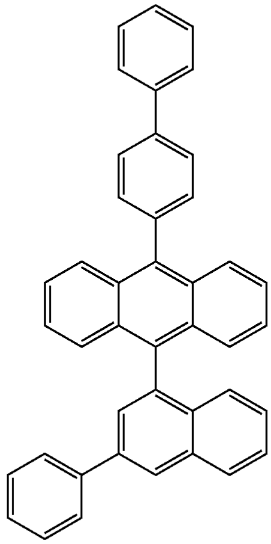
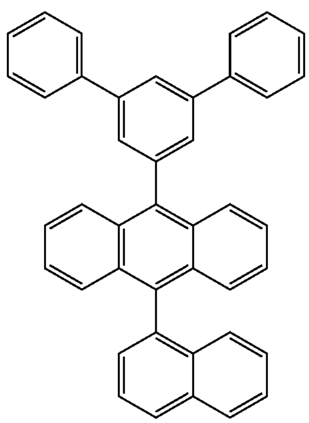
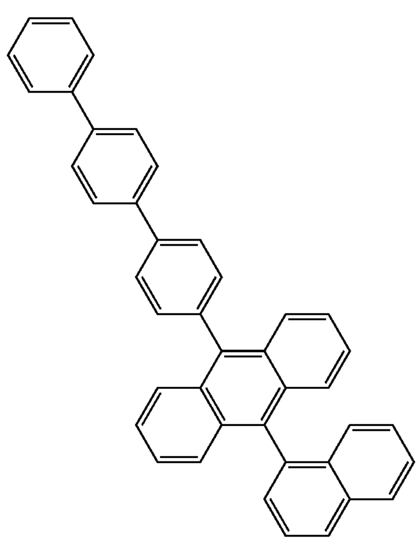
-continued
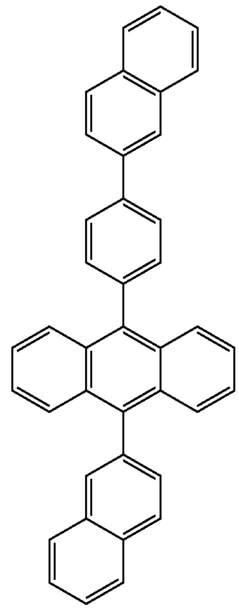
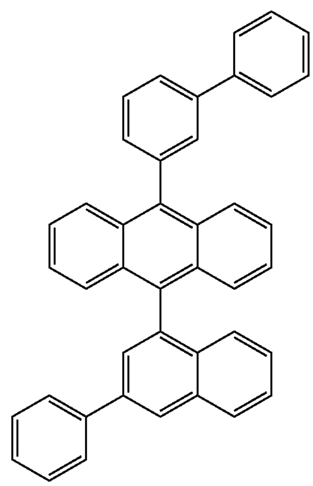
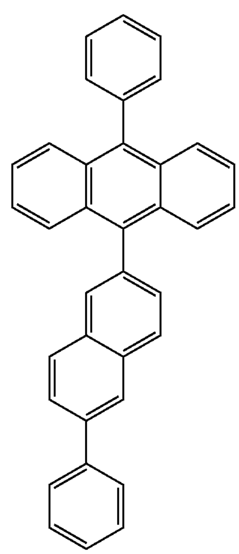

-continued

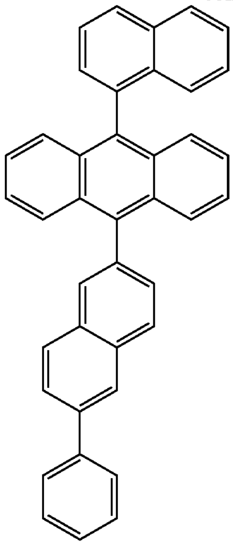

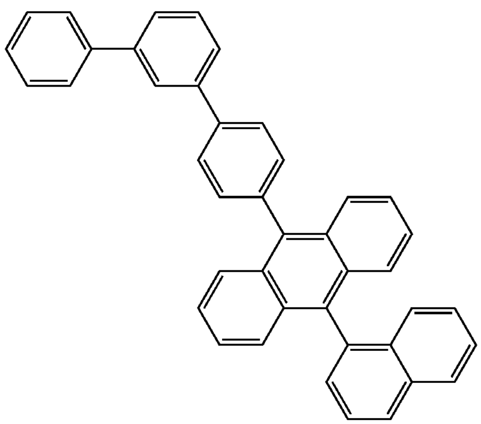

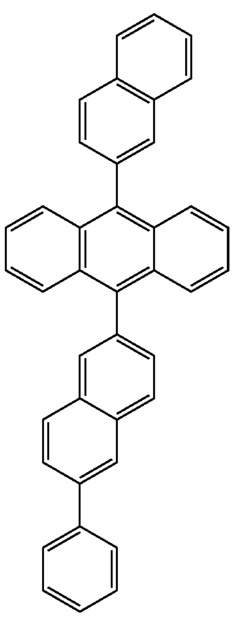

-continued

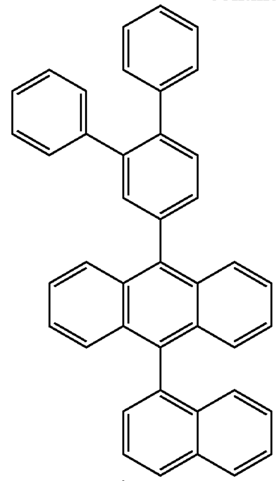

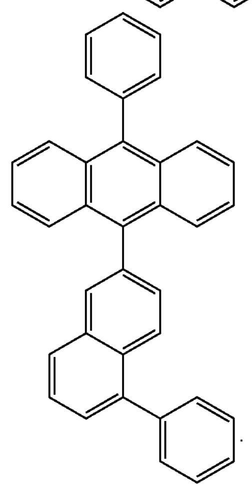

10. The organic light emitting device of claim 1, wherein the compound of Chemical Formula 1 has a HOMO energy level of 6.0 eV or greater, and the compound of Chemical Formula 3 has a HOMO energy level of 5.8 eV or greater.

11. The organic light emitting device of claim 1, wherein the compound of Chemical Formula 1 has a triplet energy level of 2.5 eV or greater.

12. The organic light emitting device of claim 1, wherein the compound of Chemical Formula 1 has a bandgap of 3.0 eV or greater, and the compound of Chemical Formula 3 has a bandgap of 2.9 eV or greater.

13. The organic light emitting device of claim 1, wherein a HOMO energy level ($H_E$) of the compound of Chemical Formula 1 and a HOMO energy level ($H_H$) of the compound of Chemical Formula 3 satisfy the following Equation 1:

$$H_E - H_H > 0.2 \text{ eV}, \quad \text{Equation 1:}$$

14. The organic light emitting device of claim 1, wherein a LUMO energy level ($L_E$) of the compound of Chemical Formula 1 and a LUMO energy level ($L_H$) of the compound of Chemical Formula 3 satisfy the following Equation 2:

$$-0.3 \text{ eV} < L_E - L_H < 0.3 \text{ eV}, \quad \text{Equation 2:}$$

15. The organic light emitting device of claim 1, wherein a triplet energy ($T_E$) of the compound of Chemical Formula 1 and a triplet energy ($T_H$) of the compound of Chemical Formula 3 satisfy the following Equation 3:

$$T_E - T_H > 0.5 \text{ eV}, \quad \text{Equation 3:}$$

16. The organic light emitting device of claim 1, wherein the organic material layer includes an electron control layer, and the electron control layer includes the compound of Chemical Formula 1.

17. The organic light emitting device of claim 1, wherein the light emitting layer is a blue fluorescent light emitting layer.

18. The organic light emitting device of claim 1, wherein the organic material layer further includes one or more organic material layers selected from among an electron injection layer, an electron transfer layer, or an electron transfer and injection layer.

* * * * *

UNITED STATES PATENT AND TRADEMARK OFFICE
CERTIFICATE OF CORRECTION

PATENT NO. : 11,462,695 B2
APPLICATION NO. : 16/495087
DATED : October 4, 2022
INVENTOR(S) : Dong Uk Heo et al.

It is certified that error appears in the above-identified patent and that said Letters Patent is hereby corrected as shown below:

In the Specification

In Preparation Example 1-3 Synthesis of Compound E3, please replace the Chemical Structure appearing at Column 340, Lines 35-45 with:

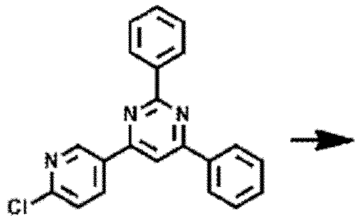

In Preparation Example 1-13 Synthesis of Compound E13, please replace the Chemical Structure appearing at Column 350, Lines 1-20 with:

E13

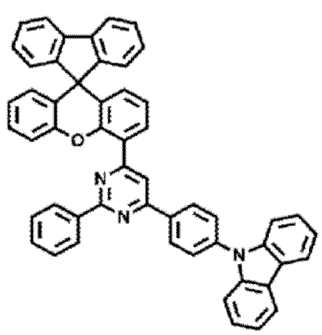

Signed and Sealed this
Eighth Day of November, 2022

Katherine Kelly Vidal
*Director of the United States Patent and Trademark Office*